US012805184B2

(12) United States Patent
Saito et al.

(10) Patent No.: US 12,805,184 B2
(45) Date of Patent: Nov. 17, 2026

(54) ORGANIC ELECTROLUMINESCENCE DEVICE AND ELECTRONIC APPARATUS USING THE SAME

(71) Applicant: IDEMITSU KOSAN CO.,LTD., Tokyo (JP)

(72) Inventors: Masatoshi Saito, Sodegaura (JP); Tasuku Haketa, Sodegaura (JP); Yuki Nakano, Sodegaura (JP); Satomi Tasaki, Sodegaura (JP); Kazuki Nishimura, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 1436 days.

(21) Appl. No.: 17/291,188

(22) PCT Filed: Nov. 7, 2019

(86) PCT No.: PCT/JP2019/043754

§ 371 (c)(1),
(2) Date: Apr. 20, 2022

(87) PCT Pub. No.: WO2020/096012

PCT Pub. Date: May 14, 2020

(65) Prior Publication Data

US 2022/0263032 A1 Aug. 18, 2022

(30) Foreign Application Priority Data

Nov. 7, 2018 (JP) ................................. 2018-210115

(51) Int. Cl.

| | |
|---|---|
| ***H10K 85/60*** | (2023.01) |
| ***H10K 50/11*** | (2023.01) |
| ***H10K 50/15*** | (2023.01) |
| ***H10K 50/16*** | (2023.01) |
| ***H10K 101/10*** | (2023.01) |
| ***H10K 101/30*** | (2023.01) |

(52) U.S. Cl.

CPC ......... *H10K 85/623* (2023.02); *H10K 85/615* (2023.02); *H10K 85/622* (2023.02); *H10K 85/626* (2023.02); *H10K 85/631* (2023.02); *H10K 85/633* (2023.02); *H10K 85/636* (2023.02); *H10K 85/654* (2023.02); *H10K 85/657* (2023.02); *H10K 85/6572* (2023.02); *H10K 85/6574* (2023.02); *H10K 85/6576* (2023.02); *H10K 85/658* (2023.02); *H10K 50/11* (2023.02); *H10K 50/15* (2023.02); *H10K 50/166* (2023.02); *H10K 85/624* (2023.02); *H10K 2101/10* (2023.02); *H10K 2101/30* (2023.02)

(58) Field of Classification Search

None

See application file for complete search history.

(56) References Cited

U.S. PATENT DOCUMENTS

| | | | |
|---|---|---|---|
| 8,614,334 B2 | 12/2013 | Osaka et al. | |
| 9,040,720 B2 | 5/2015 | Osaka et al. | |
| 9,590,186 B2 | 3/2017 | Itoi et al. | |
| 9,614,164 B2 | 4/2017 | Osaka et al. | |
| 10,263,195 B2 | 4/2019 | Osaka et al. | |
| 10,497,880 B2 | 12/2019 | Osaka et al. | |
| 11,050,025 B2 | 6/2021 | Itoi et al. | |
| 2002/0182441 A1* | 12/2002 | Lamansky .......... | C07F 15/0033 428/917 |
| 2008/0014464 A1 | 1/2008 | Kawamura et al. | |
| 2012/0077987 A1 | 3/2012 | Osaka et al. | |
| 2014/0066633 A1 | 3/2014 | Osaka et al. | |
| 2014/0252327 A1* | 9/2014 | Cho ..................... | H10K 85/633 548/440 |
| 2015/0221875 A1 | 8/2015 | Osaka et al. | |

(Continued)

FOREIGN PATENT DOCUMENTS

| | | |
|---|---|---|
| CN | 107501311 A | 12/2017 |
| EP | 3 109 253 A1 | 12/2016 |

(Continued)

OTHER PUBLICATIONS

Hatakeyama et al., "Ultrapure Blue Thermally Activated Delayed Fluorescence Molecules: Efficient HOMO-LUMO Separation by the Multiple Resonance Effect" Advanced Materials (2016) vol. 28, pp. 2777-2781. (Year: 2016).*

(Continued)

*Primary Examiner* — Dylan C Kershner

(74) *Attorney, Agent, or Firm* — Foley & Lardner LLP

(57) ABSTRACT

An organic electroluminescence device includes: a cathode, an anode, and an organic layer disposed between the cathode and the anode. The organic layer includes an emitting layer and an electron-transporting layer, the electron-transporting layer is disposed between the cathode and the emitting layer. The emitting layer includes a first compound represented by any one of the formulas (21), (41), and (51). The electron-transporting layer includes a second compound represented by the following formula (B1):

(B1)

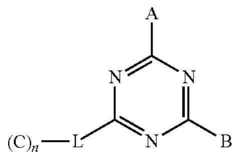

11 Claims, 1 Drawing Sheet

(56) References Cited

U.S. PATENT DOCUMENTS

| | | | | |
|---|---|---|---|---|
| 2015/0236274 | A1 | 8/2015 | Hatakeyama et al. | |
| 2016/0079542 | A1 | 3/2016 | Itoi | |
| 2016/0118597 | A1 | 4/2016 | Itoi et al. | |
| 2016/0197283 | A1 | 7/2016 | Itoi et al. | |
| 2016/0293852 | A1 | 10/2016 | Huh et al. | |
| 2016/0293853 | A1* | 10/2016 | Zeng | H10K 85/654 |
| 2017/0098777 | A1 | 4/2017 | Huh et al. | |
| 2017/0162798 | A1 | 6/2017 | Osaka et al. | |
| 2017/0244043 | A1 | 8/2017 | Kim et al. | |
| 2017/0324045 | A1 | 11/2017 | Takahashi et al. | |
| 2018/0198076 | A1 | 7/2018 | Takahashi et al. | |
| 2018/0301629 | A1 | 10/2018 | Hatakeyama et al. | |
| 2019/0027694 | A1 | 1/2019 | Hatakeyama et al. | |
| 2019/0058124 | A1 | 2/2019 | Hatakeyama et al. | |
| 2019/0074450 | A1 | 3/2019 | Osaka et al. | |
| 2019/0097142 | A1 | 3/2019 | Takahashi et al. | |
| 2019/0207112 | A1 | 7/2019 | Hatakeyama et al. | |
| 2019/0393420 | A1 | 12/2019 | Takeda et al. | |
| 2019/0393426 | A1 | 12/2019 | Masuda et al. | |
| 2020/0035922 | A1 | 1/2020 | Ogiwara et al. | |

FOREIGN PATENT DOCUMENTS

| | | | | |
|---|---|---|---|---|
| JP | 2007-220721 | A | 8/2007 | |
| JP | 2012-092087 | A | 5/2012 | |
| JP | 2016-086155 | A | 5/2016 | |
| JP | 2017-141167 | A | 8/2017 | |
| JP | 2018-157209 | A | 10/2018 | |
| JP | 2019-068068 | A | 4/2019 | |
| KR | 1020180012203 | A | 2/2018 | |
| KR | 1020180040100 | A | 4/2018 | |
| WO | WO-2011/059099 | A1 | 5/2011 | |
| WO | WO-2015/102118 | A1 | 7/2015 | |
| WO | WO-2016/152544 | A1 | 9/2016 | |
| WO | WO-2017/126443 | A1 | 7/2017 | |
| WO | WO-2017/138526 | A1 | 8/2017 | |
| WO | WO-2017/158475 | A1 | 9/2017 | |
| WO | WO-2017/188111 | A1 | 11/2017 | |
| WO | WO-2018/139662 | A1 | 8/2018 | |
| WO | WO-2018/151065 | A1 | 8/2018 | |
| WO | WO-2018/181188 | A1 | 10/2018 | |
| WO | WO-2019121664 | A1 * | 6/2019 | H10K 85/654 |
| WO | WO-2019/218969 | A1 | 11/2019 | |

OTHER PUBLICATIONS

U.S. Final Office Action on U.S. Appl. No. 17/291,200 dated Aug. 7, 2024 (18 pages).

International Searching Authority, "International Search Report", issued in connection with PCT/JP2019/043772 dated Feb. 4, 2020 (4 pages).

Jeong-A Seo et al., "Unconventional Molecular Design Approach of High-Efficiency Deep Blue Thermally Activated Delayed Fluorescent Emitters Using Indolocarbazole as an acceptor," ACS Applied Materials & Interfaces, vol. 9, pp. 37864-37872 (Oct. 5, 2017).

Non-Final Office Action on U.S. Appl. No. 17/291,200 DTD May 9, 2024.

Paul Kautny et al., "Oxadiazole based bipolar host materials employing-planarized triarylamine donors for RGB PHOLEDs with low efficiency roll-off" Journal of Materials Chemistry C, vol. 2, No. 11, pp. 2069-2081 (Mar. 21, 2014).

PCT International Preliminary Report on Patentability, dated May 20, 2021, which includes a Translation of International Searching Authority, "Written Opinion," issued in connection with International Patent Application No. PCT/JP2019/043772, dated Feb. 4, 2020.

International Preliminary Report on Patentability and Written Opinion on PCT/JP2019/04375 dated May 11, 2021.

International Search Report on PCT/JP2019/04375 dated Feb. 10, 2020.

* cited by examiner

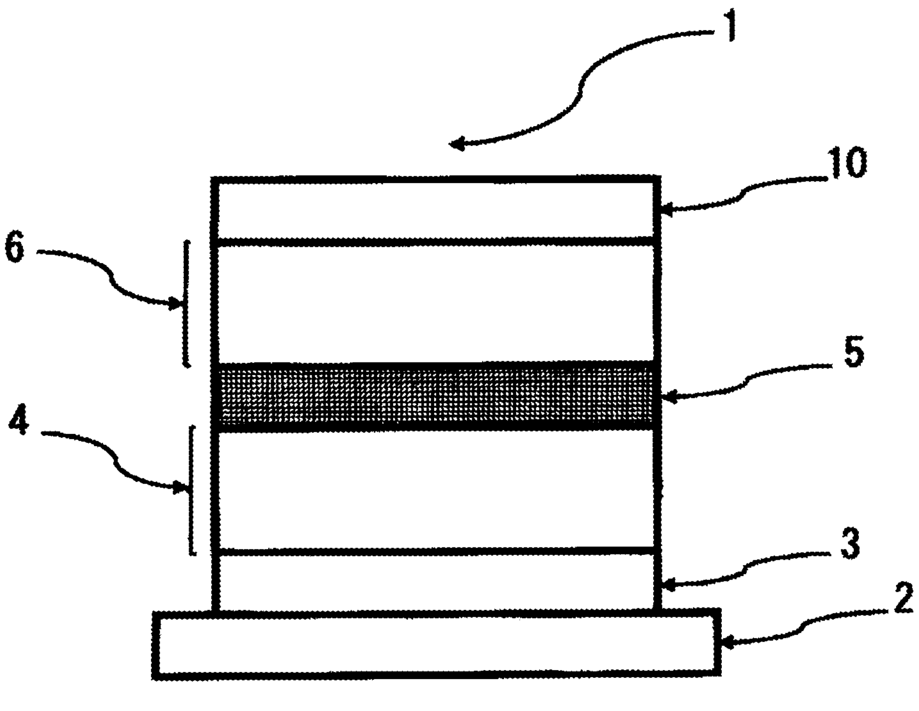
1
10
6
5
4
3
2

ORGANIC ELECTROLUMINESCENCE DEVICE AND ELECTRONIC APPARATUS USING THE SAME

CROSS-REFERENCE TO RELATED APPLICATIONS

The present application claims priority under 37 U.S.C. § 371 to International Patent Application No. PCT/JP2019/043754, filed Nov. 7, 2019, which claims priority to and the benefit of Japanese Patent Application No. 2018-210115, filed on Nov. 7, 2018. The contents of these applications are hereby incorporated by reference in their entireties.

TECHNICAL FIELD

The invention relates to an organic electroluminescence device and an electronic apparatus using the same.

BACKGROUND ART

When voltage is applied to an organic electroluminescence device (hereinafter, referred to as an organic EL device in several cases), holes and electrons are injected into an emitting layer from an anode and a cathode, respectively. Then, thus injected holes and electrons are recombined in the emitting layer, and excitons are formed therein.

Patent Documents 1 to 4 disclose that compounds having a specific fused ring structure are used as a material for an emitting layer of an organic EL device.

RELATED ART DOCUMENTS

Patent Documents

[Patent Document 1] WD 2015/102118 A1
[Patent Document 2] WD 2016/152544 A1
[Patent Document 3] WD 2017/126443 A1
[Patent Document 4] WD 2017/188111 A1

SUMMARY OF THE INVENTION

However, the organic EL devices disclosed in Patent Documents 1 to 4 do not have sufficient lifetime, and there is room for improvement.

It is an object of the invention to provide an organic EL device having a long lifetime and an electronic apparatus using the organic EL device.

As a result of intensive studies by the inventors, it has been found that an organic EL device having a long lifetime can be obtained by using a compound having a specific structure represented by any one of the formulas (21), (41), and (51) for an emitting layer and a compound having a specific structure represented by the formula (B1) for an electron-transporting layer in combination, thereby completing the invention.

According to the invention, the following organic EL device and electronic apparatus are provided.

1. An organic electroluminescence device comprising:
   a cathode,
   an anode, and
   an organic layer disposed between the cathode and the anode,
   wherein the organic layer comprises an emitting layer and an electron-transporting layer,
   the electron-transporting layer is disposed between the cathode and the emitting layer,
   the emitting layer comprises a first compound represented by any one of the following formulas (21), (41), and (51), and
   the electron-transporting layer comprises a second compound represented by the following formula (B1):

(21)

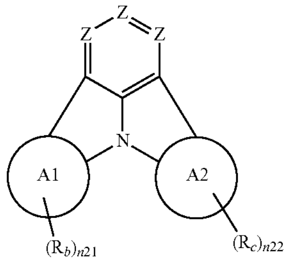

wherein in the formula (21),

Z's are independently a $CR_a$ or a nitrogen atom;

a ring A1 and a ring A2 are independently a substituted or unsubstituted aromatic hydrocarbon ring including 6 to 50 ring carbon atoms, or a substituted or unsubstituted heterocyclic ring including 5 to 50 ring atoms;

when a plurality of $R_a$'s are present, one or more sets of adjacent two or more among the plurality of $R_a$'s form a substituted or unsubstituted, saturated or unsaturated ring by bonding with each other, or do not form a substituted or unsubstituted, saturated or unsaturated ring;

when a plurality of $R_b$'s are present, one or more sets of adjacent two or more among the plurality of $R_b$'s form a substituted or unsubstituted, saturated or unsaturated ring by bonding with each other, or do not form a substituted or unsubstituted, saturated or unsaturated ring;

when a plurality of $R_c$'s are present, one or more sets of adjacent two or more among the plurality of $R_c$'s form a substituted or unsubstituted, saturated or unsaturated ring by bonding with each other, or do not form a substituted or unsubstituted, saturated or unsaturated ring;

n21 and n22 are independently an integer of 0 to 4;

$R_a$ to $R_c$ which do not form the substituted or unsubstituted, saturated or unsaturated ring are independently a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
$—Si(R_{901})(R_{902})(R_{903})$,
$—O—(R_{904})$,
$—S—(R_{905})$,
$—N(R_{908})(R_{907})$,
a halogen atom, a cyano group, a nitro group,
a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; and when one or more of $R_{901}$ to $R_{907}$ are present in two or more, each of the two or more $R_{901}$ to $R_{907}$ are the same or different;

(41)

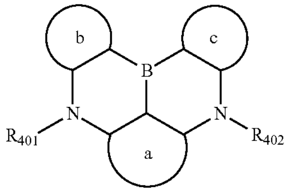

wherein in the formula (41), a ring a, a ring b, and a ring c are independently a substituted or unsubstituted aromatic hydrocarbon ring including 6 to 50 ring carbon atoms, or a substituted or unsubstituted heterocyclic ring including 5 to 50 ring atoms;

$R_{401}$ and $R_{402}$ independently form a substituted or unsubstituted heterocyclic ring by bonding with the ring a, the ring b, or the ring c, or do not form a substituted or unsubstituted heterocyclic ring; and $R_{401}$ and $R_{402}$ which do not form the substituted or unsubstituted heterocylic ring are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

(51)

p-q-r-s-t (52)

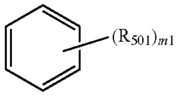

(53)

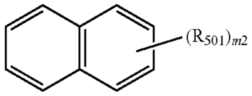

(54)

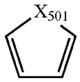

-continued (55)

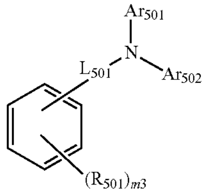

(56)

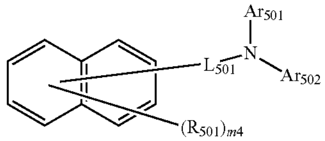

wherein in the formula (51), a ring r is a ring represented by the formula (52) or formula (53) which is fused with an adjacent ring at an arbitrary position;

a ring q and a ring s are independently a ring represented by the formula (54) which is fused with an adjacent ring at an arbitrary position;

a ring p and a ring t are independently a structure represented by the formula (55) or the formula (56) which is fused with an adjacent ring at an arbitrary position;

when a plurality of $R_{501}$'s are present, the plurality of adjacent $R_{501}$'s form a substituted or unsubstituted, saturated or unsaturated ring by bonding with each other, or do not form a substituted or unsubstituted, saturated or unsaturated ring;

$X_{501}$ is an oxygen atom, a sulfur atom, or $NR_{502}$;

$R_{502}$, and $R_{501}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{905})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{900}$ are as defined in the formula (21);

$Ar_{501}$ and $Ar_{502}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

$L_{501}$ is a single bond, a substituted or unsubstituted alkylene group including 1 to 50 carbon atoms, a substituted or unsubstituted alkenylene group including 2 to 50 carbon atoms, a substituted or unsubstituted alkynylene group including 2 to 50 carbon atoms, a substituted or unsubstituted cycloalkylene group including 3 to 50 ring carbon atoms, a substituted or unsubstituted arylene group including 6 to 50 ring carbon atoms, or a substituted or unsubstituted divalent heterocyclic group including 5 to 50 ring atoms;

m1 is an integer of 0 to 2, m2 is an integer of 0 to 4, m3 is an integer of 0 to 3, and m4 is an integer of 0 to 5; and when a plurality of $R_{501}$'s are present, the plurality of $R_{501}$'s may be the same as or different from each other;

(B1)

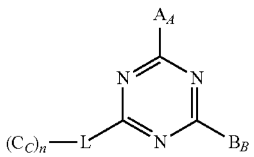

wherein in the formula (B1), $A_A$ is a substituted or unsubstituted aryl group including 6 to 18 ring carbon atoms, or a substituted or unsubstituted monovalent heterocylic group including 5 to 13 ring atoms;

$B_B$ is a substituted or unsubstituted aryl group including 6 to 18 ring carbon atoms, or a substituted or unsubstituted monovalent heterocylic group including 5 to 13 ring atoms;

L is a single bond, a substituted or unsubstituted (n+1)-valent aromatic hydrocarbon ring group including 6 to 18 ring carbon atoms, or a substituted or unsubstituted (n+1)-valent heterocyclic group including 5 to 13 ring atoms;

$C_C$'s are independently a substituted or unsubstituted aryl group including 6 to 30 ring carbon atoms, or a substituted or unsubstituted monovalent heterocylic group including 5 to 60 ring atoms; and n is an integer of 1 to 3.

2. An electronic apparatus, equipped with the organic electroluminescence device according to any one of 1.

According to the invention, an organic EL device having a long lifetime and an electronic apparatus using the organic EL device can be provided.

BRIEF DESCRIPTION OF THE DRAWINGS

The FIGURE is a diagram showing a schematic configuration of an organic EL device according to an aspect of the invention.

MODE FOR CARRYING OUT THE INVENTION

Definition

In this specification, a hydrogen atom means an atom including isotopes different in the number of neutrons, namely, a protium, a deuterium and a tritium.

In this specification, to a bondable position in which a symbol such as “R”, or “D” representing a deuterium atom is not specified in a chemical formula, a hydrogen atom, that is, a light hydrogen atom, a deuterium atom, or a tritium atom is bonded thereto.

In this specification, a term “ring carbon atoms” represents the number of carbon atoms among atoms forming a subject ring itself of a compound having a structure in which atoms are bonded in a ring form (for example, a monocylic compound, a fused ring compound, a cross-linked compound, a carbocyclic compound or a heterocylic compound). When the subject ring is substituted by a substituent, the carbon contained in the substituent is not included in the number of ring carbon atoms. The same shall apply to the “ring carbon atoms” described below, unless otherwise noted. For example, a benzene ring has 6 ring carbon atoms, a naphthalene ring has 10 ring carbon atoms, a pyridine ring has 5 ring carbon atoms, and a furan ring has 4 ring carbon atoms. Further, for example, a 9,9-diphenylfluorenyl group has 13 ring carbon atoms, and a 9,9'-spirobifluorenyl group has 25 ring carbon atoms.

Further, when the benzene ring or the naphthalene ring is substituted by an alkyl group as a substituent, for example, the number of carbon atoms of the alkyl group is not included in the ring carbon atoms.

In this specification, a term “ring atoms” represents the number of atoms forming a subject ring itself of a compound having a structure in which atoms are bonded in a ring form (for example, a monocycle, a fused ring and a ring assembly) (for example, a monocylic compound, a fused ring compound, a cross-linked compound, a carbocylic compound or a heterocylic compound). The term “ring atoms” does not include atoms which do not form the ring (for example, a hydrogen atom which terminates a bond of the atoms forming the ring) or atoms contained in a substituent when the ring is substituted by the substituent. The same shall apply to the “ring atoms” described below, unless otherwise noted. For example, a pyridine ring has 6 ring atoms, a quinazoline ring has 10 ring atoms, and a furan ring has 5 ring atoms. A hydrogen atom bonded with a carbon atom of the pyridine ring or the quinazoline ring or an atom forming the substituent is not included in the number of the ring atoms.

In this specification, a term “XX to YY carbon atoms” in an expression of “substituted or unsubstituted ZZ group including XX to YY carbon atoms” represents the number of carbon atoms when the ZZ group is unsubstituted. The number of carbon atoms of a substituent when the ZZ group is substituted is not included. Here, “YY” is larger than “XX”, and “XX” and “YY” each mean an integer of 1 or more.

In this specification, a term “XX to YY atoms” in an expression of “substituted or unsubstituted ZZ group including XX to YY atoms” represents the number of atoms when the ZZ group is unsubstituted. The number of atoms of a substituent when the group is substituted is not included. Here, “YY” is larger than “XX”, and “XX” and “YY” each mean an integer of 1 or more.

A term “unsubstituted” in the case of “substituted or unsubstituted ZZ group” means that the ZZ group is not substituted by a substituent, and a hydrogen atom is bonded therewith. Alternatively, a term “substituted” in the case of “substituted or unsubstituted ZZ group” means that one or more hydrogen atoms in the ZZ group are substituted by a substituent. Similarly, a term “substituted” in the case of "BB group substituted by an AA group" means that one or more hydrogen atoms in the BB group are substituted by the AA group.

Hereinafter, the substituent described in this specification will be described.

The number of the ring carbon atoms of the "unsubstituted aryl group" described in this specification is 6 to 50, preferably 6 to 30, and more preferably 6 to 18, unless otherwise specified.

The number of the ring carbon atoms of the "unsubstituted heterocyclic group" described in this specification is 5 to 50, preferably 5 to 30, and more preferably 5 to 18, unless otherwise specified.

The number of the carbon atoms of the "unsubstituted alkyl group" described in this specification is 1 to 50, preferably 1 to 20, and more preferably 1 to 6, unless otherwise specified.

The number of the carbon atoms of the "unsubstituted alkenyl group" described in this specification is 2 to 50, preferably 2 to 20, and more preferably 2 to 6, unless otherwise specified.

The number of the carbon atoms of the "unsubstituted alkynyl group" described in this specification is 2 to 50, preferably 2 to 20, and more preferably 2 to 6, unless otherwise specified.

The number of the ring carbon atoms of the "unsubstituted cycloalkyl group" described in this specification is 3 to 50, preferably 3 to 20, and more preferably 3 to 6, unless otherwise specified.

The number of the ring carbon atoms of the "unsubstituted arylene group" described in this specification is 6 to 50, preferably 6 to 30, and more preferably 6 to 18, unless otherwise specified.

The number of the ring atoms of the "unsubstituted divalent heterocylic group" described in this specification is 5 to 50, preferably 5 to 30, and more preferably 5 to 18, unless otherwise specified.

The number of the carbon atoms of the "unsubstituted alkylene group" described in this specification is 1 to 50, preferably 1 to 20, and more preferably 1 to 6, unless otherwise specified.

Specific examples (specific example group G1) of the "substituted or unsubstituted aryl group" described in this specification include an unsubstituted aryl group and a substituted aryl group described below. (Here, a term "unsubstituted aryl group" refers to a case where the "substituted or unsubstituted aryl group" is the "unsubstituted aryl group," and a term "substituted aryl group" refers to a case where the "substituted or unsubstituted aryl group" is the "substituted aryl group". Hereinafter, a case of merely "aryl group" includes both the "unsubstituted aryl group" and the "substituted aryl group".

The "substituted aryl group" refers to a case where the "unsubstituted aryl group" has a substituent, and specific examples thereof include a group in which the "unsubstituted aryl group" has the substituent, and a substituted aryl group described below. It should be noted that examples of the "unsubstituted aryl group" and examples of the "substituted aryl group" listed in this specification are only one example, and the "substituted aryl group" described in this specification also includes a group in which a group in which "unsubstituted aryl group" has a substituent further has a substituent, and a group in which "substituted aryl group" further has a substituent, and the like.

An unsubstituted aryl group:

a phenyl group,
a p-biphenyl group,
a m-biphenyl group,
an o-biphenyl group,
a p-terphenyl-4-yl group,
a p-terphenyl-3-yl group,
a p-terphenyl-2-yl group,
a m-terphenyl-4-yl group,
a m-terphenyl-3-yl group,
a m-terphenyl-2-yl group,
an o-terphenyl-4-yl group,
an o-terphenyl-3-yl group,
an o-terphenyl-2-yl group,
a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranthenyl group,
a benzofluoranthenyl group, and
a perylenyl group.

A substituted aryl group:

an o-tolyl group,
a m-tolyl group,
a p-tolyl group,
a p-xylyl group,
a m-xylyl group,
an o-xylyl group,
a p-isopropyl phenyl group,
a m-isopropyl phenyl group,
an o-isopropyl phenyl group,
a p-t-butylphenyl group,
a m-t-butylphenyl group,
an o-t-butylphenyl group,
a 3,4,5-trimethylphenyl group,
a 9,9-dimethylfluorenyl group,
a 9,9-diphenylfluorenyl group
a 9,9-di(4-methylphenyl)fluorenyl group,
a 9,9-di(4-isopropylphenyl)fluorenyl group,
a 9,9-di(4-t-butylphenyl)fluorenyl group,
a cyanophenyl group,
a triphenylsilylphenyl group,
a trimethylsilylphenyl group,
a phenylnaphthyl group, and
a naphthylphenyl group.

The "heterocyclic group" described in this specification is a ring group including at least one hetero atom in the ring atom. Specific examples of the hetero atom include a nitrogen atom, an oxygen atom, a sulfur atom, a silicon atom, a phosphorus atom and a boron atom.

The "heterocyclic group" described in this specification may be a monocyclic group, or a fused ring group.

The "heterocyclic group" described in this specification may be an aromatic heterocyclic group, or an aliphatic heterocyclic group.

Specific examples (specific example group G2) of the "substituted or unsubstituted heterocyclic group" include an unsubstituted heterocyclic group and a substituted heterocyclic group described below. (Here, the unsubstituted heterocyclic group refers to a case where the "substituted or unsubstituted heterocyclic group" is the "unsubstituted heterocyclic group," and the substituted heterocyclic group refers to a case where the "substituted or unsubstituted heterocyclic group" is the "substituted heterocyclic group". Hereinafter, the case of merely "heterocyclic group" includes both the "unsubstituted heterocyclic group" and the "substituted heterocyclic group".

The "substituted heterocyclic group" refers to a case where the "unsubstituted heterocyclic group" has a substituent, and specific examples thereof include a group in which the "unsubstituted heterocyclic group" has a substituent, and a substituted heterocyclic group described below. It should be noted that examples of the "unsubstituted heterocyclic group" and examples of the "substituted heterocyclic group" listed in this specification are merely one example, and the "substituted heterocyclic group" described in this specification also includes a group in which "unsubstituted heterocyclic group" which has a substituent further has a substituent, and a group in which "substituted heterocyclic group" further has a substituent, and the like.

An unsubstituted heterocyclic group including a nitrogen atom:

a pyrrolyl group,
an imidazolyl group,
a pyrazolyl group,
a triazolyl group,
a tetrazolyl group,
an oxazolyl group,
an isoxazolyl group,
an oxadiazolyl group,
a thiazolyl group,
an isothiazolyl group,
a thiadiazolyl group,
a pyridyl group,
a pyridazinyl group,
a pyrimidinyl group,
a pyrazinyl group,
a triazinyl group,
an indolyl group,
an isoindolyl group,
an indolizinyl group,
a quinolizinyl group,
a quinolyl group,
an isoquinolyl group,
a cinnolyl group,
a phthalazinyl group,
a quinazolinyl group,
a quinoxalinyl group,
a benzimidazolyl group,
an indazolyl group,
a phenanthrolinyl group,
a phenanthridinyl group
an acridinyl group,
a phenazinyl group,
a carbazolyl group,
a benzocarbazolyl group,
a morpholino group,
a phenoxazinyl group,
a phenothiazinyl group,
an azacarbazolyl group, and
a diazacarbazolyl group.

An unsubstituted heterocyclic group including an oxygen atom:

a furyl group,
an oxazolyl group,
an isoxazolyl group,
an oxadiazolyl group,
a xanthenyl group,
a benzofuranyl group,
an isobenzofuranyl group,
a dibenzofuranyl group,
a naphthobenzofuranyl group,
a benzoxazolyl group,
a benzisoxazolyl group,
a phenoxazinyl group,
a morpholino group,
a dinaphthofuranyl group,
an azadibenzofuranyl group,
a diazadibenzofuranyl group,
an azanaphthobenzofuranyl group, and
a diazanaphthobenzofuranyl group.

An unsubstituted heterocyclic group including a sulfur atom:

a thienyl group,
a thiazolyl group,
an isothiazolyl group,
a thiadiazolyl group,
a benzothiophenyl group,
an isobenzothiophenyl group,
a dibenzothiophenyl group,
a naphthobenzothiophenyl group,
a benzothiazolyl group,
a benzisothiazolyl group,
a phenothiazinyl group,
a dinaphthothiophenyl group,
an azadibenzothiophenyl group,
a diazadibenzothiophenyl group,
an azanaphthobenzothiophenyl group, and
a diazanaphthobenzothiophenyl group.

A substituted heterocyclic group including a nitrogen atom:

a (9-phenyl)carbazolyl group,
a (9-biphenylyl)carbazolyl group,
a (9-phenyl)phenylcarbazolyl group,
a (9-naphthyl)carbazolyl group,
a diphenylcarbazol-9-yl group,
a phenylcarbazol-9-yl group,
a methylbenzimidazolyl group,
an ethylbenzimidazolyl group,
a phenyltriazinyl group,
a biphenylyltriazinyl group,
a diphenyltriazinyl group,
a phenylquinazolinyl group, and
a biphenylylquinazolinyl group.

A substituted heterocyclic group including an oxygen atom:

a phenyldibenzofuranyl group,
a methyldibenzofuranyl group,
a t-butyldibenzofuranyl group, and
a monovalent residue of spiro[9H-xanthene-9,9'-[9H]fluorene].

A substituted heterocyclic group including a sulfur atom:

a phenyldibenzothiophenyl group,
a methyldibenzothiophenyl group,
a t-butyldibenzothiophenyl group, and
a monovalent residue of spiro[9H-thioxantene-9,9'-[9H]fluorene].

A monovalent group derived from the following unsubstituted heterocyclic ring containing at least one of a nitrogen atom, an oxygen atom and a sulfur atom by removal of one hydrogen atom bonded to the ring atoms thereof, and a monovalent group in which a monovalent group derived from the following unsubstituted heterocyclic ring has a substituent by removal of one hydrogen atom bonded to the ring atoms thereof:

(XY-1)

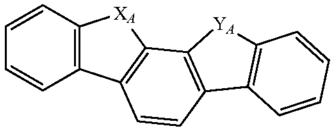

(XY-2)

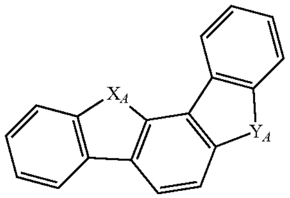

(XY-3)

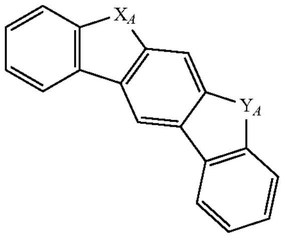

(XY-4)

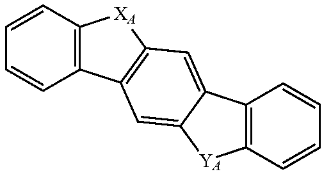

(XY-5)

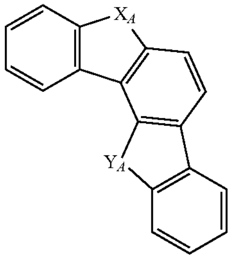

(XY-6)

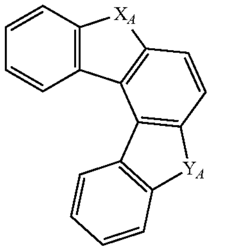

-continued (XY-7)

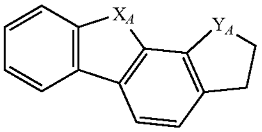

(XY-8)

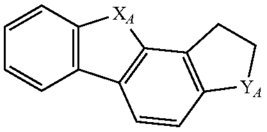

(XY-9)

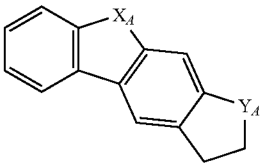

(XY-10)

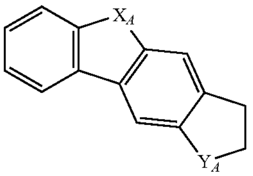

(XY-11)

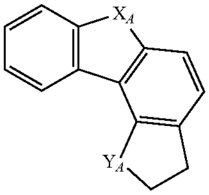

(XY-12)

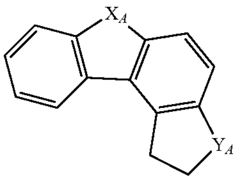

(XY-13)

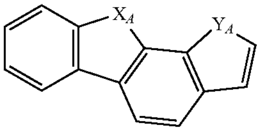

(XY-14)

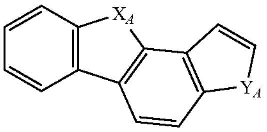

(XY-15)

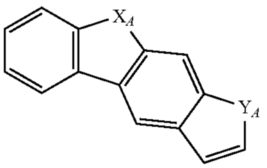

-continued (XY-16)

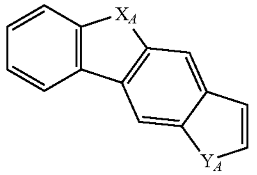

(XY-17)

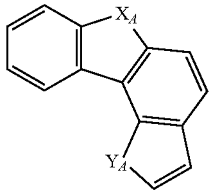

(XY-18)

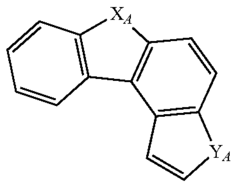

In the formulas (XY-1) to (XY-18), XA and YA are independently an oxygen atom, a sulfur atom, NH or $CH_2$. However, at least one of XA and YA is an oxygen atom, a sulfur atom or NH.

The heterocyclic ring represented by the formulas (XY-1) to (XY-18) becomes a monovalent heterocyclic group including a bond at an arbitrary position.

An expression "the monovalent group derived from the unsubstituted heterocyclic ring represented by the formulas (XY-1) to (XY-18) has a substituent" refers to a case where the hydrogen atom bonded with the carbon atom which constitutes a skeleton of the formulas is substituted by a substituent, or a state in which XA or YA is NH or $CH_2$, and the hydrogen atom in the NH or $CH_2$ is replaced with a substituent.

Specific examples (specific example group G3) of the "substituted or unsubstituted alkyl group" include an unsubstituted alkyl group and a substituted alkyl group described below. (Here, the unsubstituted alkyl group refers to a case where the "substituted or unsubstituted alkyl group" is the "unsubstituted alkyl group," and the substituted alkyl group refers to a case where the "substituted or unsubstituted alkyl group" is the "substituted alkyl group"). Hereinafter, the case of merely "alkyl group" includes both the "unsubstituted alkyl group" and the "substituted alkyl group".

The "substituted alkyl group" refers to a case where the "unsubstituted alkyl group" has a substituent, and specific examples thereof include a group in which the "unsubstituted alkyl group" has a substituent, and a substituted alkyl group described below. It should be noted that examples of the "unsubstituted alkyl group" and examples of the "substituted alkyl group" listed in this specification are merely one example, and the "substituted alkyl group" described in this specification also includes a group in which "unsubstituted alkyl group" has a substituent further has a substituent, a group in which "substituted alkyl group" further has a substituent, and the like.

An unsubstituted alkyl group:

a methyl group,
an ethyl group,
a n-propyl group,
an isopropyl group,
a n-butyl group,
an isobutyl group,
a s-butyl group, and
a t-butyl group.

A substituted alkyl group:

a heptafluoropropyl group (including an isomer),
a pentafluoroethyl group,
a 2,2,2-trifluoroethyl group, and
a trifluoromethyl group.

Specific examples (specific example group G4) of the "substituted or unsubstituted alkenyl group" include an unsubstituted alkenyl group and a substituted alkenyl group described below. (Here, the unsubstituted alkenyl group refers to a case where the "substituted or unsubstituted alkenyl group" is the "unsubstituted alkenyl group," and the substituted alkenyl group refers to a case where the "substituted or unsubstituted alkenyl group" is the "substituted alkenyl group"). Hereinafter, the case of merely "alkenyl group" includes both the "unsubstituted alkenyl group" and the "substituted alkenyl group".

The "substituted alkenyl group" refers to a case where the "unsubstituted alkenyl group" has a substituent, and specific examples thereof include a group in which the "unsubstituted alkenyl group" has a substituent, and a substituted alkenyl group described below. It should be noted that examples of the "unsubstituted alkenyl group" and examples of the "substituted alkenyl group" listed in this specification are merely one example, and the "substituted alkenyl group" described in this specification also includes a group in which "unsubstituted alkenyl group" has a substituent further has a substituent, a group in which "substituted alkenyl group" further has a substituent, and the like.

An unsubstituted alkenyl group and a substituted alkenyl group:

a vinyl group,
an allyl group,
a 1-butenyl group,
a 2-butenyl group,
a 3-butenyl group,
a 1,3-butanedienyl group,
a 1-methylvinyl group,
a 1-methylallyl group,
a 1,1-dimethylallyl group,
a 2-methylallyl group, and
a 1,2-dimethylallyl group.

Specific examples (specific example group G5) of the "substituted or unsubstituted alkynyl group" include an unsubstituted alkynyl group described below. (Here, the unsubstituted alkynyl group refers to a case where the "substituted or unsubstituted alkynyl group" is the "unsubstituted alkynyl group"). Hereinafter, a case of merely "alkynyl group" includes both the "unsubstituted alkynyl group" and the "substituted alkynyl group".

The "substituted alkynyl group" refers to a case where the "unsubstituted alkynyl group" has a substituent, and specific examples thereof include a group in which the "unsubstituted alkynyl group" described below has a substituent.

An unsubstituted alkynyl group:

an ethynyl group.

Specific examples (specific example group G6) of the "substituted or unsubstituted cycloalkyl group" described in this specification include an unsubstituted cycloalkyl group and a substituted cycloalkyl group described below. (Here, the unsubstituted cycloalkyl group refers to a case where the "substituted or unsubstituted cycloalkyl group" is the "unsubstituted cycloalkyl group," and the substituted cycloalkyl group refers to a case where the "substituted or unsubstituted cycloalkyl group" is the "substituted cycloalkyl group"). Hereinafter, a case of merely "cycloalkyl group" includes both the "unsubstituted cycloalkyl group" and the "substituted cycloalkyl group".

The "substituted cycloalkyl group" refers to a case where the "unsubstituted cycloalkyl group" a the substituent, and specific examples thereof include a group in which the "unsubstituted cycloalkyl group" has a substituent, and a substituted cycloalkyl group described below. It should be noted that examples of the "unsubstituted cycloalkyl group" and examples of the "substituted cycloalkyl group" listed in this specification are merely one example, and the "substituted cycloalkyl group" described in this specification also includes a group in which "unsubstituted cycloalkyl group" has a substituent further has a substituent, a group in which "substituted cycloalkyl group" further has a substituent, and the like.

An unsubstituted aliphatic ring group:
a cyclopropyl group,
a cyclobutyl group,
a cyclopentyl group,
a cyclohexyl group,
a 1-adamantyl group,
a 2-adamantyl group,
a 1-norbornyl group, and
a 2-norbornyl group.

A substituted cycloalkyl group:
a 4-methylcyclohexyl group.

Specific examples (specific example group G7) of the group represented by —Si($R_{901}$)($R_{902}$)($R_{903}$) described in this specification include
—Si(G1)(G1)(G1),
—Si(G1)(G2)(G2),
—Si(G1)(G1)(G2),
—Si(G2)(G2)(G2),
—Si(G3)(G3)(G3),
—Si(G5)(G5)(G5) and
—Si(G6)(G6)(G6).

In which,
G1 is the "aryl group" described in the specific example group G1.
G2 is the "heterocyclic group" described in the specific example group G2.
G3 is the "alkyl group" described in the specific example group G3.
G5 is the "alkynyl group" described in the specific example group G5.
G6 is the "cycloalkyl group" described in the specific example group G6.

Specific examples (specific example group G8) of the group represented by —O—($R_{904}$) described in this specification include
—O(G1),
—O(G2),
—O(G3) and
—O(G6).

In which,
G1 is the "aryl group" described in the specific example group G1.
G2 is the "heterocyclic group" described in the specific example group G2.
G3 is the "alkyl group" described in the specific example group G3.
G6 is the "cycloalkyl group" described in the specific example group G6.

Specific examples (specific example group G9) of the group represented by —S—($R_{905}$) described in this specification include
—S(G1),
—S(G2),
—S(G3) and
—S(G6).

In which,
G1 is the "aryl group" described in the specific example group G1.
G2 is the "heterocyle group" described in the specific example group G2.
G3 is the "alkyl group" described in the specific example group G3.
G6 is the "cycloalkyl group" described in the specific example group G6.

Specific examples (specific example group G10) of the group represented by —N($R_{906}$)($R_{907}$) described in this specification include
—N(G1)(G1),
—N(G2)(G2),
—N(G1)(G2),
—N(G3)(G3) and
—N(G6) (G6).

In which,
G1 is the "aryl group" described in the specific example group G1.
G2 is the "heterocycle group" described in the specific example group G2.
G3 is the "alkyl group" described in the specific example group G3.
G6 is the "cycloalkyl group" described in the specific example group G6.

Specific examples (specific example group G11) of the "halogen atom" described in this specification include a fluorine atom, a chlorine atom, a bromine atom and an iodine atom.

Specific examples of the "alkoxy group" described in this specification include a group represented by —O(G3), where G3 is the "alkyl group" described in the specific example group G3. The number of carbon atoms of the "unsubstituted alkoxy group" are 1 to 50, preferably 1 to 30, and more preferably 1 to 18, unless otherwise specified.

Specific examples of the "alkylthio group" described in this specification include a group represented by —S(G3), where G3 is the "alkyl group" described in the specific example group G3. The number of carbon atoms of the "unsubstituted alkylthio group" are 1 to 50, preferably 1 to 30, and more preferably 1 to 18, unless otherwise specified.

Specific examples of the "aryloxy group" described in this specification include a group represented by —O(G1), where G1 is the "aryl group" described in the specific example group G1. The number of ring carbon atoms of the "unsubstituted aryloxy group" are 6 to 50, preferably 6 to 30, and more preferably 6 to 18, unless otherwise specified.

Specific examples of the "arylthio group" described in this specification include a group represented by —S(G1), where G1 is the "aryl group" described in the specific example group G1. The number of ring carbon atoms of the "unsubstituted arylthio group" are 6 to 50, preferably 6 to 30, and more preferably 6 to 18, unless otherwise specified.

Specific examples of the "aralkyl group" described in this specification include a group represented by -(G3)-(G1), where G3 is the "alkyl group" described in the specific example group G3, and G1 is the "aryl group" described in the specific example group G1. Accordingly, the "aralkyl group" is one embodiment of the "substituted alkyl group"

substituted by the "aryl group". The number of carbon atoms of the "unsubstituted aralkyl group," which is the "unsubstituted alkyl group" substituted by the "unsubstituted aryl group," are 7 to 50, preferably 7 to 30, and more preferably 7 to 18, unless otherwise specified.

Specific example of the "aralkyl group" include a benzyl group, a 1-phenylethyl group, a 2-phenylethyl group, a 1-phenylisopropyl group, a 2-phenylisopropyl group, a phenyl-t-butyl group, an a-naphthylmethyl group, a 1-a-naphthylethyl group, a 2-a-naphthylethyl group, a 1-a-naphthylisopropyl group, a 2-a-naphthylisopropyl group, a p-naphthylmethyl group, a 1-p-naphthylethyl group, a 2-p-naphthylethyl group, a 1-p-naphthylisopropyl group, and a 2-p-naphthylisopropyl group.

The substituted or unsubstituted aryl group described in this specification is, unless otherwise specified, preferably a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, a 9,9-diphenylfluorenyl group, or the like.

The substituted or unsubstituted heterocyclic group described in this specification is, unless otherwise specified, preferably a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group (a (9-phenyl)carbazol-1-yl group, a (9-phenyl)carbazol-2-yl group, a (9-phenyl)carbazol-3-yl group, or a (9-phenyl)carbazol-4-yl group), a (9-biphenylyl) carbazolyl group, a (9-phenyl)phenylcarbazolyl group, a diphenylcarbazole-9-yl group, a phenylcarbazol-9-yl group, a phenyltriazinyl group, a biphenylyltriazinyl group, diphenyltriazinyl group, a phenyldibenzofuranyl group, a phenyldibenzothiophenyl group, an indrocarbazolyl group, a pyrazinyl group, a pyridazinyl group, a quinazolinyl group, a cinnolinyl group, a phthalazinyl group, a quinoxalinyl group, a pyrrolyl group, an indolyl group, a pyrrolo[3,2,1-jk]carbazolyl group, a furanyl group, a benzofuranyl group, a thiophenyl group, a benzothiophenyl group, a pyrazolyl group, an imidazolyl group, a benzimidazolyl group, a triazolyl group, an oxazolyl group, a benzoxazolyl group, a thiazolyl group, a benzothiazolyl group, an isothiazolyl group, a benzisothiazolyl group, a thiadiazolyl group, an isoxazolyl group, a benzisoxazolyl group, a pyrrolidinyl group, a piperidinyl group, a piperazinyl group, an imidazolidinyl group, an indro[3,2,1-jk]carbazolyl group, a dibenzothiophenyl group, or the like.

The dibenzofuranyl group and the dibenzothiophenyl group as described above are specifically any group described below, unless otherwise specified.

(XY-76)

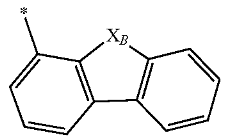

(XY-77)

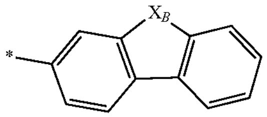

(XY-78)

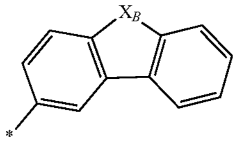

(XY-79)

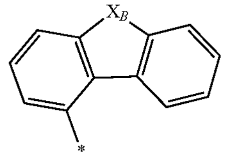

In the formulas (XY-76) to (XY-79), $X_B$ is an oxygen atom or a sulfur atom.

The substituted or unsubstituted alkyl group described in this specification is, unless otherwise specified, preferably a methyl group, an ethyl group, a propyl group, an isopropyl group, a n-butyl group, an isobutyl group, a t-butyl group, or the like.

The "substituted or unsubstituted arylene group" descried in this specification refers to a group in which the above-described "aryl group" is converted into divalence, unless otherwise specified. Specific examples (specific example group G12) of the "substituted or unsubstituted arylene group" include a group in which the "aryl group" described in the specific example group G1 is converted into divalence. Namely, specific examples (specific example group G12) of the "substituted or unsubstituted arylene group" refer to a group derived from the "aryl group" described in specific example group G1 by removal of one hydrogen atom bonded to the ring carbon atoms thereof.

Specific examples (specific example group G13) of the "substituted or unsubstituted divalent heterocyclic group" include a group in which the "heterocyclic group" described in the specific example group G2 is converted into divalence. Namely, specific examples (specific example group G13) of the "substituted or unsubstituted divalent heterocyclic group" refer to a group derived from the "heterocyclic group" described in specific example group G2 by removal of one hydrogen atom bonded to the ring atoms thereof.

Specific examples (specific example group G14) of the "substituted or unsubstituted alkylene group" include a group in which the "alkyl group" described in the specific example group G3 is converted into divalence. Namely, specific examples (specific example group G14) of the "substituted or unsubstituted alkylene group" refer to a group derived from the "alkyl group" described in specific example group G3 by removal of one hydrogen atom bonded to the carbon atoms constituting the alkane structure thereof.

The substituted or unsubstituted arylene group described in this specification is any group described below, unless otherwise specified.

(XY-20)
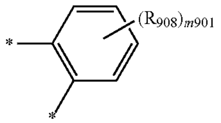
(XY-21)
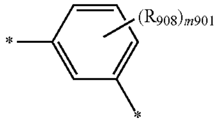
(XY-22)
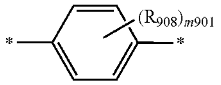
(XY-23)
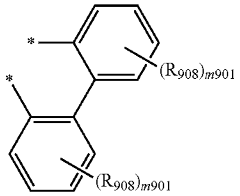
(XY-24)
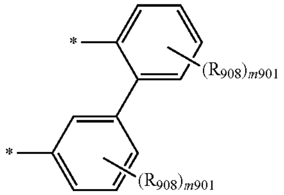
(XY-25)
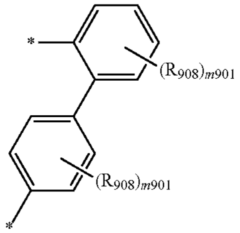
(XY-26)
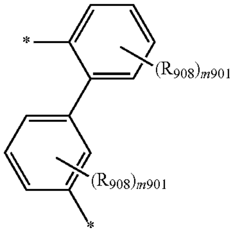
(XY-27)
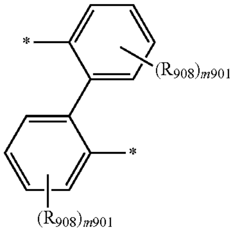
-continued
(XY-28)
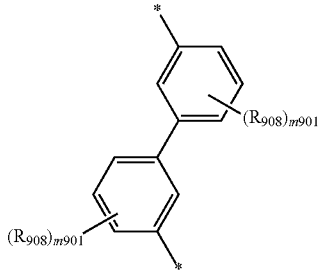
(XY-29)
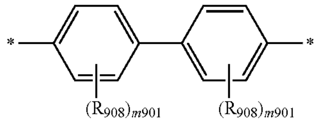
(XY-83)
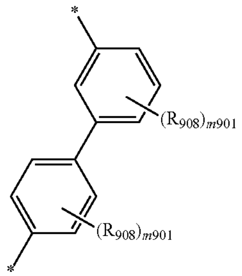
(XY-84)
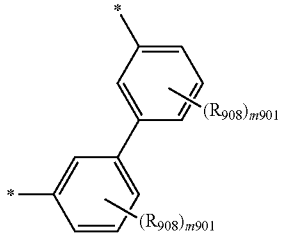
In the formulas (XY-20) to (XY-29), (XY-83) and (XY-84), $R_{908}$ is a substituent.
Then, m901 is an integer of 0 to 4, and when m901 is 2 or more, a plurality of $R_{908}$ may be the same with or different from each other.
(XY-30)
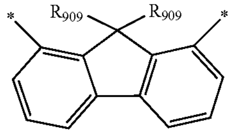
(XY-31)
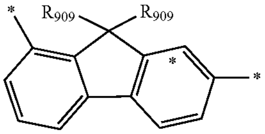
(XY-32)
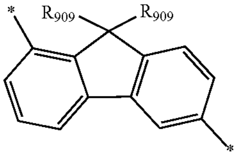

-continued (XY-33)

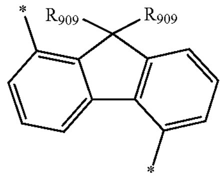

(XY-34)

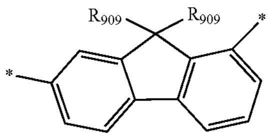

(XY-35)

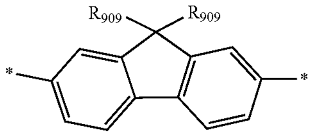

(XY-36)

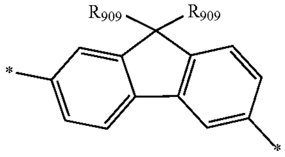

(XY-37)

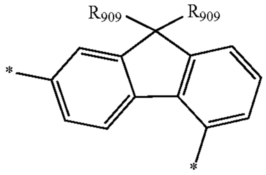

(XY-38)

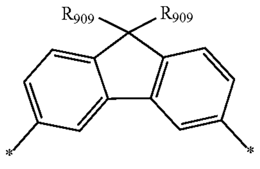

(XY-39)

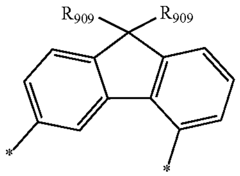

(XY-40)

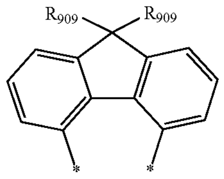

In the formulas (XY-30) to (XY-40), $R_{909}$ is independently a hydrogen atom or a substituent. Two of $R_{909}$ may form a ring by bonding with each other through a single bond.

(XY-41)

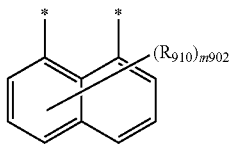

(XY-42)

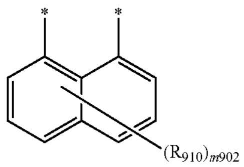

(XY-43)

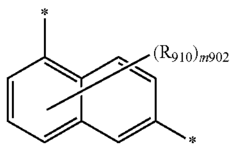

(XY-44)

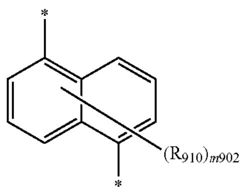

(XY-45)

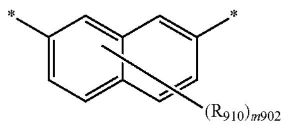

(XY-46)

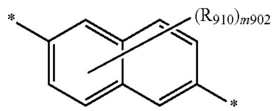

In the formulas (XY-41) to (XY-46), $R_{910}$ is a substituent.

Then, m902 is an integer of 0 to 6. When m902 is 2 or more, a plurality of $R_{910}$ may be the same with or different from each other.

The substituted or unsubstituted divalent heterocyclic group described in this specification is preferably any group described below, unless otherwise specified.

(XY-50)

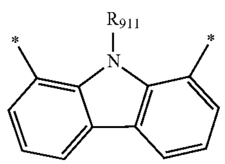

(XY-51)

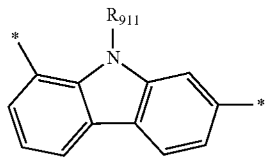

-continued
(XY-52)
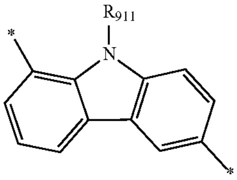
(XY-53)
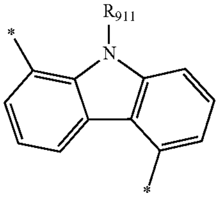
(XY-54)
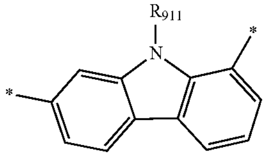
(XY-55)
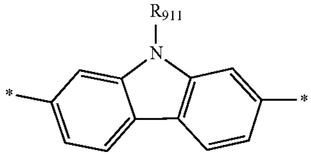
(XY-56)
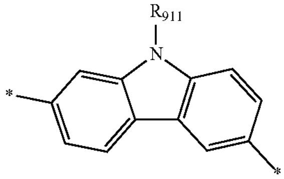
(XY-57)
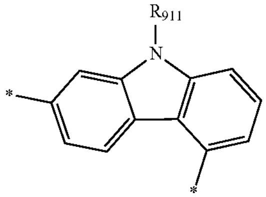
(XY-58)
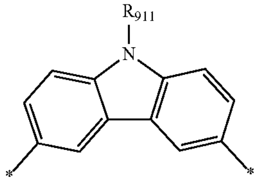
(XY-59)
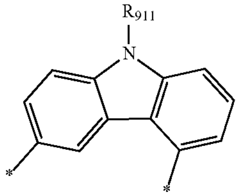
-continued
(XY-60)
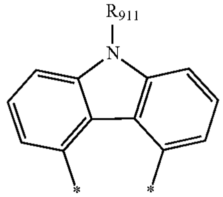
(XY-61)
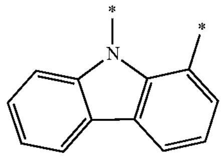
(XY-62)
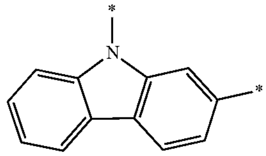
(XY-63)
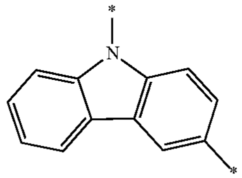
(XY-64)
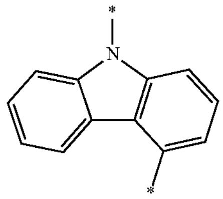
In the formulas (XY-50) to (XY-60), $R_{911}$ is a hydrogen atom or a substituent.
(XY-65)
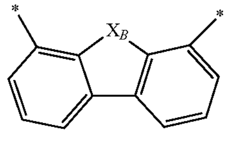
(XY-66)
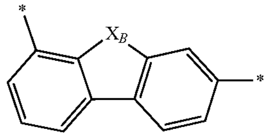
(XY-67)
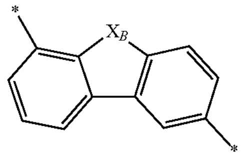

-continued (XY-68)

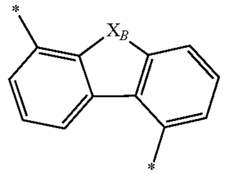

(XY-69)

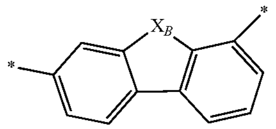

(XY-70)

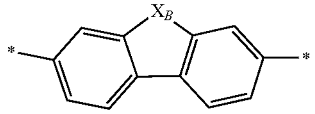

(XY-71)

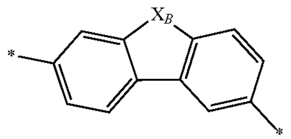

(XY-72)

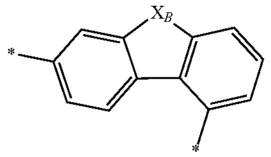

(XY-73)

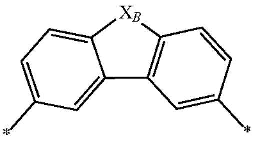

(XY-74)

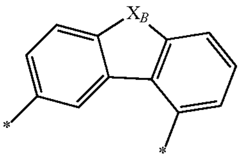

(XY-75)

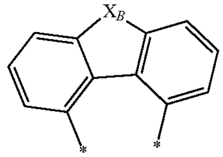

In the formulas (XY-65) to (XY-74), $X_B$ is an oxygen atom or a sulfur atom.

In this specification, a case where "one or more sets of two or more groups adjacent to each other form a substituted or unsubstituted and saturated or unsaturated ring by bonding with each other" will be described by taking, as an example, a case of an anthracene compound represented by the following formula (XY-80) in which a mother skeleton is an anthracene ring.

(XY-80)

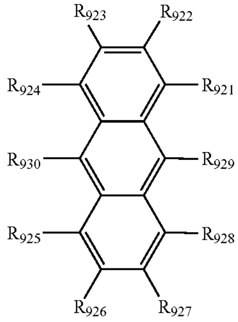

For example, two adjacent to each other into one set when "one or more sets of two or more groups adjacent to each other form the ring by bonding with each other" among $R_{921}$ to $R_{930}$ include $R_{921}$ and $R_{922}$, $R_{922}$ and $R_{923}$, $R_{923}$ and $R_{924}$, $R_{924}$ and $R_{930}$, $R_{930}$ and $R_{925}$, $R_{925}$ and $R_{926}$, $R_{926}$ and $R_{927}$, $R_{927}$ and $R_{928}$, $R_{928}$ and $R_{929}$, and $R_{929}$ and $R_{921}$.

The above-described "one or more sets" means that two or more sets of two groups adjacent to each other may simultaneously form the ring. For example, a case where $R_{921}$ and $R_{922}$ form a ring A by bonding with each other, and simultaneously $R_{925}$ and $R_{926}$ form a ring B by bonding with each other is represented by the following formula (XY-81).

(XY-81)

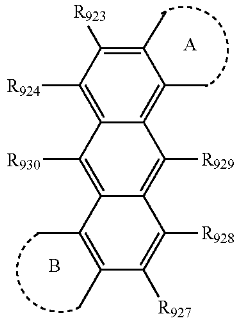

A case where "two or more groups adjacent to each other" form a ring means that, for example, $R_{921}$ and $R_{922}$ forma ring A by bonding with each other, and $R_{922}$ and $R_{923}$ forma ring C by bonding with each other. A case where the ring A and ring C sharing $R_{922}$ are formed, in which the ring A and the ring Care fused to the anthracene mother skeleton by three of $R_{921}$ to $R_{923}$ adjacent to each other, is represented by the following (XY-82).

(XY-82)

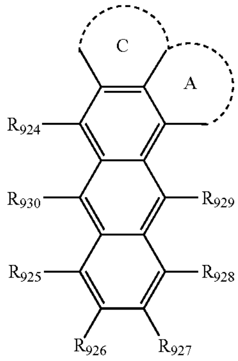

The rings A to C formed in the formulas (XY-81) and (XY-82) are a saturated or unsaturated ring.

A term "unsaturated ring" means an aromatic hydrocarbon ring or an aromatic heterocyclic ring. A term "saturated ring" means an aliphatic hydrocarbon ring or an aliphatic heterocyclic ring.

For example, the ring A formed by $R_{921}$ and $R_{922}$ being bonded with each other, represented by the formula (XY-81), means a ring formed by a carbon atom of the anthracene skeleton bonded with $R_{921}$, a carbon atom of the anthracene skeleton bonded with $R_{922}$, and one or more arbitrary elements. Specific examples include, when the ring A is formed by $R_{921}$ and $R_{922}$, a case where an unsaturated ring is formed of a carbon atom of an anthracene skeleton bonded with $R_{921}$, a carbon atom of the anthracene skeleton bonded with $R_{922}$, and four carbon atoms, in which a ring formed by $R_{921}$ and $R_{922}$ is formed into a benzene ring. Further, when a saturated ring is formed, the ring is formed into a cyclohexane ring.

Here, "arbitrary elements" are preferably a C element, a N element, an O element and a S element. In the arbitrary elements (for example, a case of the C element or the N element), the bond(s) that is(are) not involved in the formation of the ring may be terminated by a hydrogen atom, or may be substituted by an arbitrary substituent. When the ring contains the arbitrary elements other than the C element, the ring to be formed is a heterocyclic ring.

The number of "one or more arbitrary elements" forming the saturated or unsaturated ring is preferably 2 or more and 15 or less, more preferably 3 or more and 12 or less, and further preferably 3 or more and 5 or less.

As specific examples of the aromatic hydrocarbon ring, a structure in which the aryl group described in specific example group G1 is terminated with a hydrogen atom may be mentioned.

As specific examples of the aromatic heterocyclic ring, a structure in which the aromatic heterocyclic group described in specific example group G2 is terminated with a hydrogen atom may be mentioned.

As specific examples of the aliphatic hydrocarbon ring, a structure in which the cycloalkyl group described in specific example group G6 is terminated with a hydrogen atom may be mentioned.

When the above-described "saturated or unsaturated ring" has a substituent, the substituent is an "arbitrary substituent" as described below, for example. When the above-mentioned "saturated or unsaturated ring" has a substituent, specific examples of the substituent refer to the substituents described in above-mentioned "the substituent described herein".

In one embodiment of this specification, the substituent (hereinafter, referred to as an "arbitrary substituent" in several cases) in the case of the "substituted or unsubstituted" is a group selected from the group consisting of

- an unsubstituted alkyl group including 1 to 50 carbon atoms,
- an unsubstituted alkenyl group including 2 to 50 carbon atoms,
- an unsubstituted alkynyl group including 2 to 50 carbon atoms,
- an unsubstituted cycloalkyl group including 3 to 50 ring carbon atoms,
- $—Si(R_{901})(R_{902})(R_{903})$,
- $—O—(R_{904})$,
- $—S—(R_{905})$
- $—N(R_{905})(R_{907})$ wherein, $R_{501}$ to $R_{907}$ are independently

- a hydrogen atom,
- a substituted or unsubstituted alkyl group including 1 to 50 carbon atoms,
- a substituted or unsubstituted cycloalkyl group including 3 to 50 ring carbon atoms,
- a substituted or unsubstituted aryl group including 6 to 50 ring carbon atoms, or
- a substituted or unsubstituted monovalent heterocyclic group including 5 to 50 ring atoms; and when two or more of $R_{901}$ to $R_{907}$ exist, two or more of $R_{901}$ to $R_{907}$ may be the same with or different from each other, a halogen atom, a cyano group, a nitro group,
- an unsubstituted aryl group including 6 to 50 ring carbon atoms, and
- an unsubstituted monovalent heterocyclic group including 5 to 50 ring atoms.

In one embodiment, the substituent in the case of "substituted or unsubstituted" is a group selected from the group consisting of

- an alkyl group including 1 to 50 carbon atoms,
- an aryl group including 6 to 50 ring carbon atoms, and
- a monovalent heterocyclic group including 5 to 50 ring atoms.

In one embodiment, the substituent in the case of "substituted or unsubstituted" is a group selected from the group consisting of

- an alkyl group including 1 to 18 carbon atoms,
- an aryl group including 6 to 18 ring carbon atoms, and
- a monovalent heterocyclic group including 5 to 18 ring atoms.

Specific examples of each group of the arbitrary substituent described above are as described above.

In this specification, unless otherwise specified, the saturated or unsaturated ring (preferably substituted or unsubstituted and saturated or unsaturated five-membered or six-membered ring, more preferably a benzene ring) may be formed by the arbitrary substituents adjacent to each other.

In this specification, unless otherwise specified, the arbitrary substituent may further have the substituent. Specific examples of the substituent that the arbitrary substituent further has include to the ones same as the arbitrary substituent described above.

[Organic EL Device]

The organic electroluminescence device according to an aspect of the invention includes:

- a cathode,
- an anode, and
- an organic layer disposed between the cathode and the anode,
- wherein the organic layer includes an emitting layer and an electron-transporting layer,
- the electron-transporting layer is disposed between the cathode and the emitting layer,
- the emitting layer contains a first compound represented by any one of the formulas (21), (41), and (51), and
- the electron-transporting layer contains a second compound represented by the formula (B1).

Each compound will be described later.

Schematic configuration of an organic EL device according to an aspect of the invention will be explained referring to the FIGURE.

The organic EL device 1 according to an aspect of the invention includes a substrate 2, an anode 3, an emitting layer 5 as an organic layer, a cathode 10, an organic layer 4 between the anode 3 and the emitting layer 5, and an organic layer 6 between the emitting layer 5 and the cathode 10.

Each of the organic layer 4 and the organic layer 6 may be a single layer or may consist of a plurality of layers.

The electron-transporting layer is disposed between the cathode 10 and the emitting layer 5, i.e. in the organic layer 6. When the organic layer 6 includes a plurality of layers, the electron-transporting layer maybe any of the plurality of layers. In addition, the organic layer 6 may include a plurality of the electron-transporting layer.

A first compound represented by any of the formulas (21), (41), and (51) is contained in the emitting layer 5, which is between the anode 3 and the cathode 10.

A second compound represented by the formula (B1) is contained in the electron-transporting layer disposed between the cathode 10 and the emitting layer 5. When a plurality of electron-transporting layers are present, any one or more electron-transporting layer contains the second compound represented by the formula (B1).

In one embodiment, the electron-transporting layer may be directly adjacent to the emitting layer 5 or may not be directly adjacent to the emitting layer 5.

In one embodiment, the organic EL device further includes a hole-transporting layer, wherein the hole-transporting layer is disposed between the anode 3 and the emitting layer 5, i.e. in the organic layer 4, and the hole-transporting layer is directly adjacent to the emitting layer 5.

In one embodiment, a third compound is contained in a hole-transporting layer disposed between the anode 3 and the emitting layer 5 and directly adjacent to the emitting layer 5. Provided that the organic layer 4 may include a hole-transporting layer in addition to the hole-transporting layer directly adjacent to the emitting layer 5. When a plurality of hole-transporting layers are included, the hole-transporting layer directly adjacent to the emitting layer 5 may be referred to as an electrons barrier layer.

(First Compound)

The first compound contained in the emitting layer will be described.

(Compound Represented by the Formula (21))

A compound represented by the formula (21) will be described.

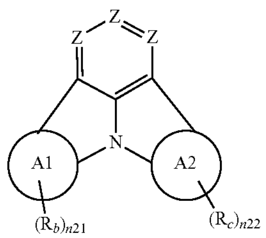

(21)

In the formula (21),

Z's are independently $CR_a$ or a nitrogen atom.

A ring A1 and A ring A2 are independently a substituted or unsubstituted aromatic hydrocarbon ring including 6 to 50 ring carbon atoms, or a substituted or unsubstituted heterocyclic ring including 5 to 50 ring atoms.

When a plurality of $R_a$'s are present, one or more sets of adjacent two or more of the plurality of $R_a$'s form a substituted or unsubstituted, saturated or unsaturated ring by bonding with each other, or do not form a substituted or unsubstituted, saturated or unsaturated ring.

When a plurality of $R_b$'s are present, one or more sets of adjacent two or more of the plurality of $R_b$'s form a substituted or unsubstituted, saturated or unsaturated ring by bonding with each other, or do not form a substituted or unsubstituted, saturated or unsaturated ring.

When a plurality of $R_c$'s are present, one or more sets of adjacent two or more of the plurality of $R_c$'s form a substituted or unsubstituted, saturated or unsaturated ring by bonding with each other, or do not form a substituted or unsubstituted, saturated or unsaturated ring.

n21 and n22 are independently an integer of 0 to 4.

$R_a$ to $R_c$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{501}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; and when one or more of $R_{901}$ to $R_{907}$ are present in two or more, each of the two or more $R_{501}$ to $R_{907}$ are the same or different.

The "aromatic hydrocarbon ring" for the ring A1 and the ring A2 has the same structure as the compound in which a hydrogen atom is introduced into the "aryl group" described above. The "aromatic hydrocarbon ring" for the ring A1 and the ring A2 contains two carbon atoms on the central fused bicyclic structure of the formula (21) as ring atoms thereof. Specific examples of the "substituted or unsubstituted aromatic hydrocarbon ring including 6 to 50 ring carbon atoms" include compounds in which a hydrogen atom is introduced into the "aryl group" described in the specific example group G1, and the like.

The "heterocyclic ring" for the ring A1 and the ring A2 has the same structure as the compound in which a hydrogen atom is introduced into the "heterocyclic group" described above. The "heterocyclic ring" for the ring A1 and the ring A2 contains two carbon atoms on the central fused bicyclic structure of the formula (21) as ring atoms thereof. Specific examples of the "substituted or unsubstituted heterocyclic ring including 5 to 50 ring atoms" include compounds in which a hydrogen atom is introduced into the "heterocyclic group" described in the specific example group G2, and the like.

$R_b$ bonds with either carbon atom, which forms the aromatic hydrocarbon ring for the ring A1, or with either atom, which forms the heterocyclic ring for the ring A1.

$R_c$ is bonded with either carbon atom, which forms the aromatic hydrocarbon ring for the ring A2, or with either atom, which forms the heterocyclic ring for the ring A2.

It is preferable that at least one (preferably two) of $R_a$ to $R_c$ be a group represented by the following formula (21a).

$$-L_{201}-Ar_{201} \quad (21a)$$

In the formula (21a), $L_{201}$ is a single bond, a substituted or unsubstituted arylene group including 6 to 30 ring carbon atoms, or a substituted or unsubstituted divalent heterocyclic group including 5 to 30 ring atoms.

$Ar_{201}$ is a substituted or unsubstituted aryl group including 6 to 50 ring carbon atoms, a substituted or unsubstituted monovalent heterocyclic group including 5 to 50 ring atoms, or a group represented by the following formula (21b).

(21b)

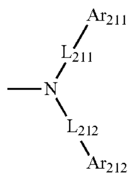

In the formula (21b), $L_{211}$ and $L_{212}$ are independently a single bond, a substituted or unsubstituted arylene group including 6 to 30 ring carbon atoms, or a substituted or unsubstituted divalent heterocyclic group including 5 to 30 ring atoms.

$Ar_{211}$ and $Ar_{212}$ form a substituted or unsubstituted, saturated or unsaturated ring by bonding with each other, or do not form a substituted or unsubstituted, saturated or unsaturated ring.

$Ar_{211}$ and $Ar_{212}$ which do not form a substituted or unsubstituted, saturated or unsaturated ring are independently a substituted or unsubstituted aryl group including 6 to 50 ring carbon atoms, or a substituted or unsubstituted monovalent heterocyclic group including 5 to 50 ring atoms.

In one embodiment, the compound represented by the formula (21) is a compound represented by the following formula (22).

(22)

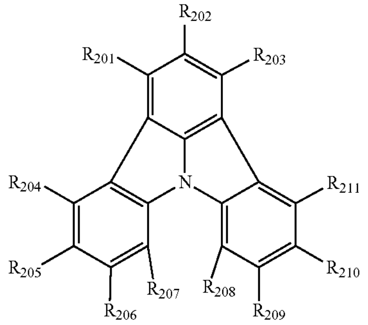

In the formula (22), one or more sets of adjacent two or more of $R_{201}$ to $R_{211}$ form a substituted or unsubstituted, saturated or unsaturated ring by bonding with each other, or do not form a substituted or unsubstituted, saturated or unsaturated ring.

$R_{201}$ to $R_{211}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (21).

It is preferable that at least one (preferably two) of $R_{201}$ to $R_{211}$ be a group represented by the formula (21a). Preferably, $R_{204}$ and $R_{211}$ are groups represented by the formula (21a).

In one embodiment, the compound represented by the formula (21) is a compound in which a structure represented by the following formula (21-2) is bonded with the ring A1. In one embodiment, the compound represented by the formula (22) is a compound in which a structure represented by the following formula (21-2) is bonded with a ring with which $R_{204}$ to $R_{207}$ are bonded.

(21-2)

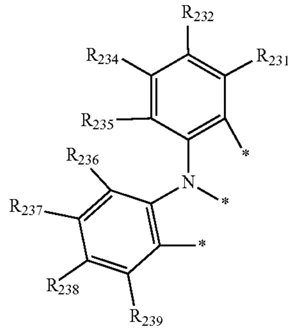

The three *'s in the formula (21-2) respectively bond with the ring carbon atoms of the aromatic hydrocarbon ring or the ring atoms of the heterocyclic ring for the ring A1 in the formula (22), or either $R_{204}$ to $R_{207}$ in the formula (22).

One or more sets of adjacent two or more of $R_{231}$ to $R_{239}$ form a substituted or unsubstituted, saturated or unsaturated ring by bonding with each other, or do not form a substituted or unsubstituted, saturated or unsaturated ring.

$R_{231}$ to $R_{239}$ which do not form a substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (21).

In one embodiment, in the compound represented by the formula (22), one or more sets of adjacent two or more of $R_{201}$ to $R_{211}$ form a substituted or unsubstituted, saturated or unsaturated ring by bonding with each other. This embodiment will be described in detail below as the formula (25).

(Compound Represented by the Formula (25))

A compound represented by the formula (25) will be described.

(25)

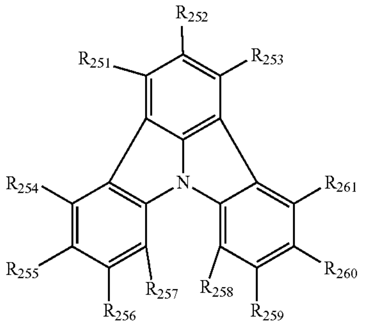

In the formula (25), two or more of the sets selected from the group consisting of $R_{251}$ and $R_{252}$, $R_{252}$ and $R_{253}$, $R_{254}$ and $R_{255}$, $R_{255}$ and $R_{256}$, $R_{256}$ and $R_{257}$, $R_{258}$ and $R_{259}$, $R_{259}$ and $R_{260}$, and $R_{260}$ and $R_{261}$ form a substituted or unsubstituted, saturated or unsaturated ring by bonding with each other;

provided that a set of $R_{251}$ and $R_{252}$ and a set of $R_{252}$ and $R_{253}$; a set of $R_{254}$ and $R_{255}$ and a set of $R_{255}$ and $R_{256}$; a set of $R_{255}$ and $R_{256}$ and a set of $R_{256}$ and $R_{257}$; a set of $R_{258}$ and $R_{259}$ and a set of $R_{259}$ and $R_{260}$; and a set of $R_{259}$ and $R_{260}$ and a set of $R_{260}$ and $R_{261}$ do not form rings at the same time.

The two or more rings formed by $R_{251}$ to $R_{261}$ may be the same as or different.

$R_{251}$ to $R_{261}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (21).

In the formula (25), $R_n$ and $R_{n+1}$ (n represents a number selected from 251, 252, 254 to 256, and 258 to 260) form a substituted or unsubstituted, saturated or unsaturated ring, together with two ring carbon atoms with which $R_n$ and $R_{n+1}$ are bonded, by bonding with each other. The ring is preferably composed of atoms selected from a carbon atom, an oxygen atom, a sulfur atom, and a nitrogen atom, and the number of ring atoms is preferably 3 to 7, more preferably 5 or 6.

The number of the ring structures described above in the compound represented by the formula (25) is, for example, 2, 3, or 4. The two or more ring structures maybe fused to the same benzene ring constituting the mother skeleton of the formula (25), respectively, or may be fused to the different benzene rings. For example, when the compound has three ring structures, a ring structure may be fused to each of the three benzene rings of the formula (25) one by one.

Examples of the above-mentioned ring structure in the compound represented by the formula (25) include structures represented by each of the following formulas (251) to (260), and the like.

(251)

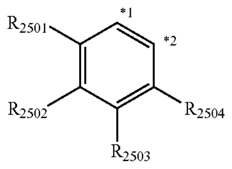

(252)

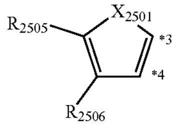

(253)

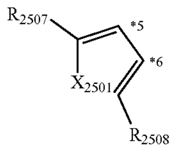

(254)

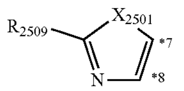

(255)

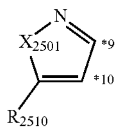

-continued (256)

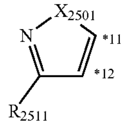

(257)

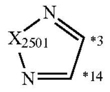

In the formula (251) to (257), each of *1 and *2, *3 and *4, *5 and *6, *7 and *8, *9 and *10, *11 and *12, and *13 and *14 represents the two ring carbon atoms with which $R_n$ and $R_{n+1}$ are bound, and ring carbon atoms with which $R_n$ is bonded may be any of the two ring carbon atoms represented by *1 and *2, *3 and *4, *5 and *6, *7 and *8, *9 and *10, *11 and *12, and *13 and *14.

$X_{2501}$ is $C(R_{2512})$ $(R_{2513})$, $NR_{2514}$, O, or S.

One or more sets of adjacent two or more of $R_{2501}$ to $R_{2506}$ and $R_{2512}$ to $R_{2513}$ form a substituted or unsubstituted, saturated or unsaturated ring by bonding with each other, or do not form a substituted or unsubstituted, saturated or unsaturated ring.

$R_{2501}$ to $R_{2514}$ which do not form the substituted or unsubstituted, saturated or unsaturated ring are the same as $R_{251}$ to $R_{261}$.

(258)

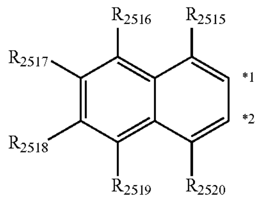

(259)

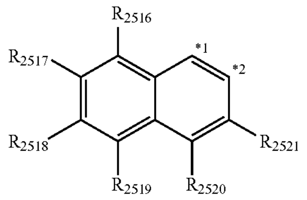

(260)

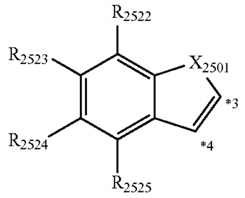

In the formulas (258) to (260), *1 and *2, and *3 and *4 each represent the two ring carbon atoms with which $R_n$ and $R_{n+1}$ are bonded, and ring carbon atoms with which $R_n$ is bonded may be either two ring carbon atoms represented by *1 and *2, or *3 and *4.

$X_{2501}$ is $C(R_{2512})$ $(R_{2513})$, $NR_{2514}$, O, or S.

One or more sets of adjacent two or more of $R_{2515}$ to $R_{2525}$ form a substituted or unsubstituted, saturated or unsaturated ring by bonding with each other, or do not form a substituted or unsubstituted, saturated or unsaturated ring.

$R_{2515}$ to $R_{2521}$ and $R_{2522}$ to $R_{2525}$ which do not form a substituted or unsubstituted, saturated or unsaturated ring are the same as $R_{251}$ to $R_{261}$.

In the formula (25), at least one of $R_{252}$, $R_{254}$, $R_{255}$, $R_{260}$, and $R_{261}$ (preferably at least one of $R_{252}$, $R_{255}$, and $R_{260}$, more preferably $R_{252}$) is preferably a group which does not form a ring structure.

(i) The substituent when the ring structure formed by $R_n$ and $R_{n+1}$ in the formula (25) has a substituent, (ii) $R_{251}$ to $R_{261}$ which do not form a ring structure in the formula (25), and (iii) $R_{2501}$ to $R_{2514}$ and $R_{2515}$ to $R_{2525}$ in the formulas (251) to (260) are preferably independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms,

—$N(R_{906})(R_{907})$, a substituted or unsubstituted aryl group including 6 to 50 ring carbon atoms, a substituted or unsubstituted monovalent heterocyclic group including 5 to 50 ring atoms, or any of the groups selected from the following groups.

(261)

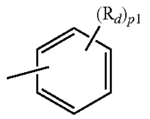

(262)

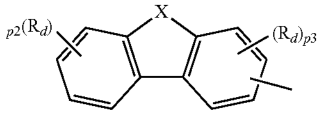

(263)

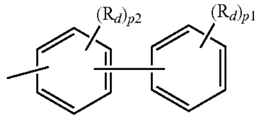

(264)

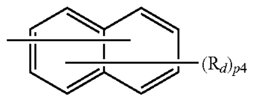

In the formulas (261) to (264), Rd'S are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{908})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

X is $C(R_{901})(R_{902})$, $NR_{903}$, O, or S.

$R_{901}$ to $R_{907}$ are as defined in the formula (21).

p1 is an integer of 0 to 5, p2 is an integer of 0 to 4, p3 is an integer of 0 to 3, p4 is an integer of 0 to 7.

In one embodiment, the compound represented by the formula (25) is a compound represented by any of the following formulas (25-1) to (25-6).

(25-1)

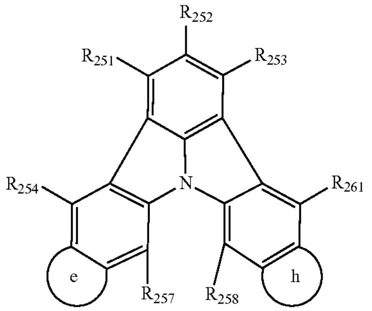

(25-2)

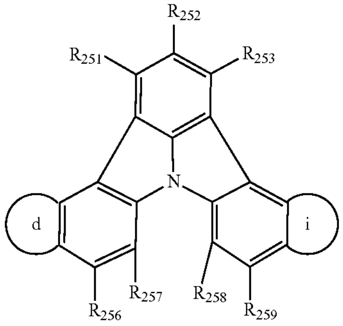

(25-3)

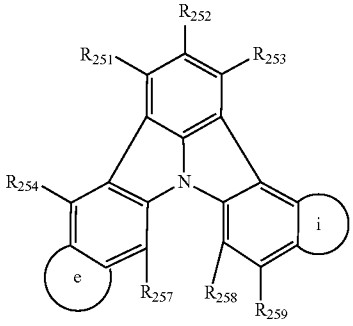

(25-4)

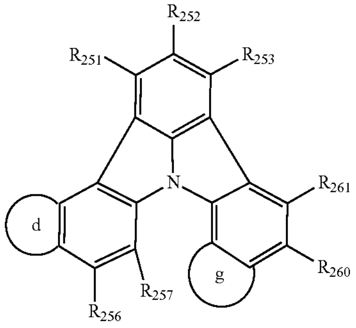

-continued (25-5)

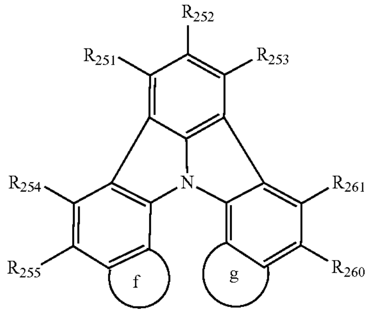

(25-6)

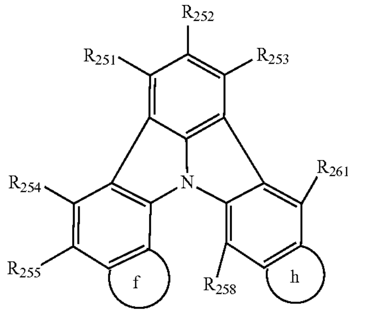

In the formulas (25-1) to (25-6), rings d to i are independently a substituted or unsubstituted, saturated or unsaturated ring; and $R_{251}$ to $R_{261}$ are as defined in the formula (25).

In one embodiment, the compound represented by the formula (25) is a compound represented by any of the following formulas (25-7) to (25-12).

(25-7)

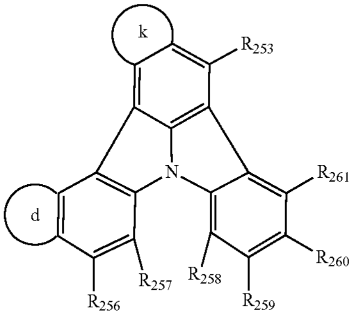

(25-8)

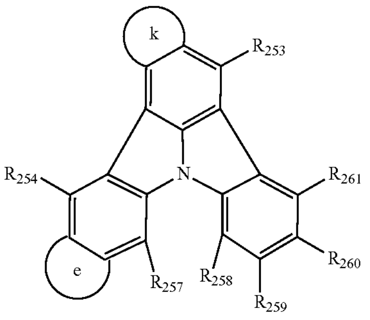

-continued
(25-9)
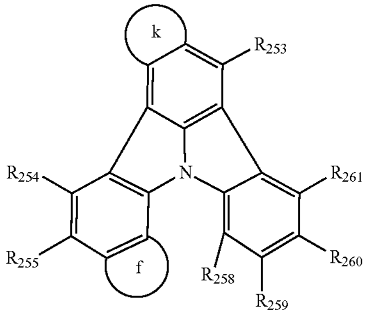
(25-10)
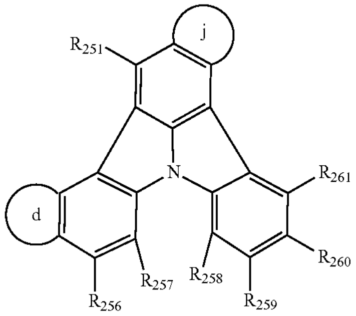
(25-11)
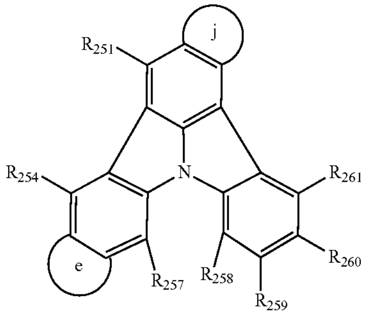
(25-12)
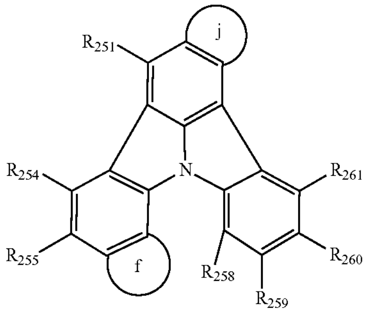
In the formulas (25-7) to (25-12), rings d to f, k, and j are independently a substituted or unsubstituted, saturated or unsaturated ring; $R_{251}$ to $R_{261}$ are as defined in the formula (25).
In one embodiment, the compound represented by the formula (25) is a compound represented by any of the following formulas (25-13) to (25-21).
(25-13)
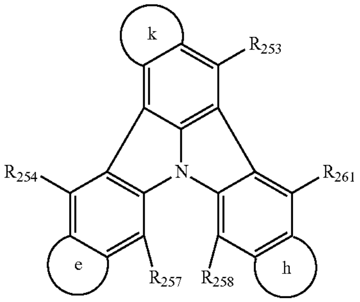
(25-14)
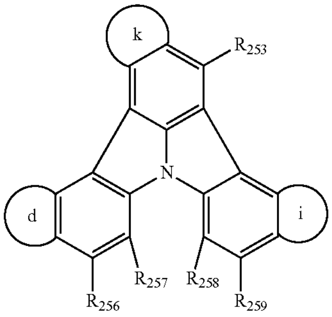
(25-15)
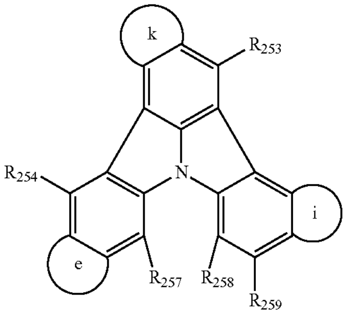
(25-16)
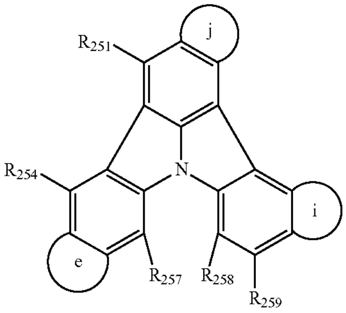
(25-17)
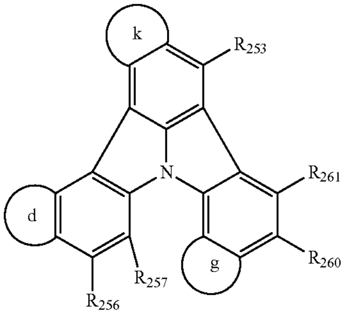

-continued (25-18)

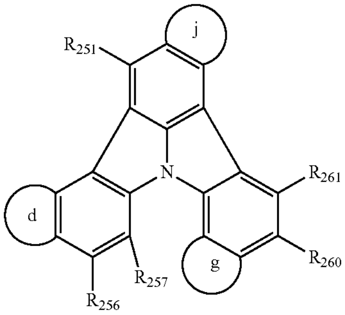

(25-19)

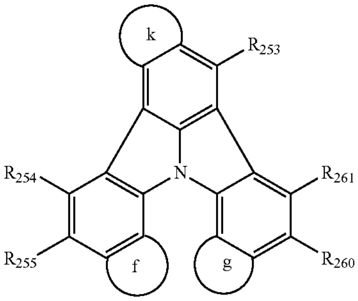

(25-20)

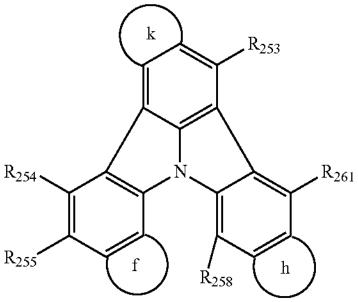

(25-21)

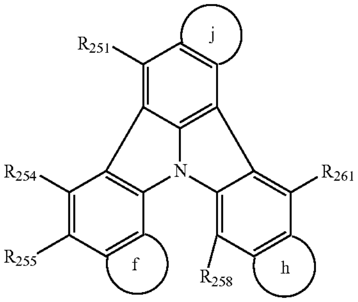

In the formulas (25-13) to (25-21), rings d to k are independently a substituted or unsubstituted, saturated or unsaturated ring; and $R_{251}$ to $R_{261}$ are as defined in the formula (25).

Examples of the substituent when the ring g or h further has a substituent include, for example, a substituted or unsubstituted alkyl group including 1 to 50 carbon atoms, a substituted or unsubstituted aryl group including 6 to 50 ring carbon atoms, or the group represented by the formula (261), (263), or (264).

In one embodiment, the compound represented by the formula (25) is a compound represented by any of the following formulas (25-22) to (25-25).

(25-22)

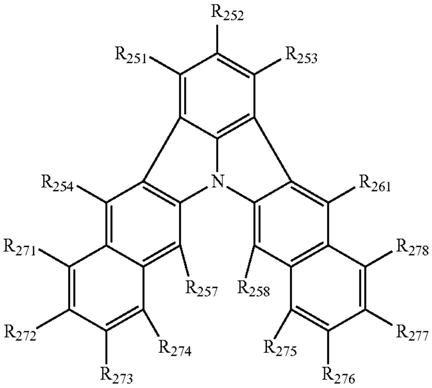

(25-23)

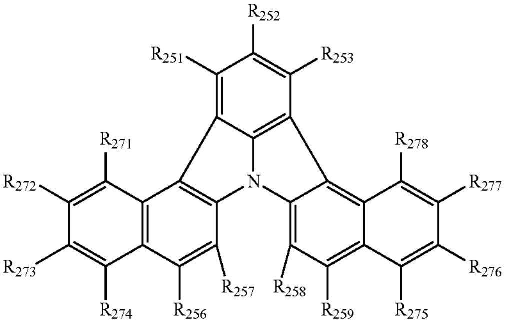

(25-24)

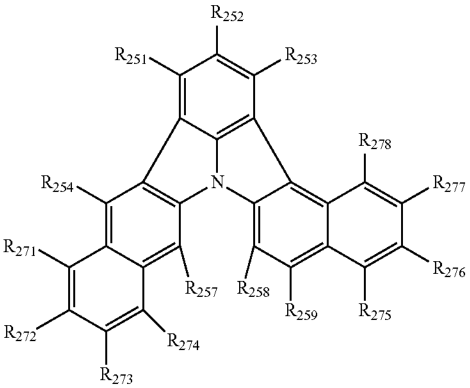

(25-25)

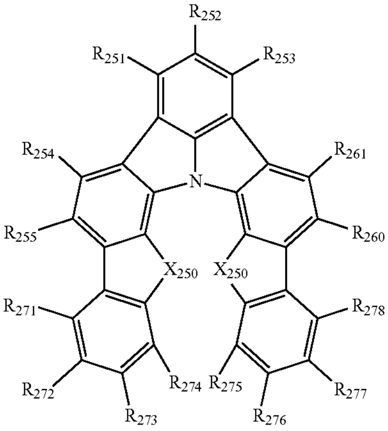

In the formulas (25-22) to (25-25), $X_{250}$ is $C(R_{901})(R_{902})$, $NR_{903}$, O, or S. $R_{251}$ to $R_{261}$, $R_{271}$ to $R_{278}$ are the same as $R_{251}$ to $R_{261}$ in the formula (25). $R_{901}$ to $R_{903}$ are as defined in the formula (21).

In one embodiment, the compound represented by the formula (25) is a compound represented by the following formula (25-26).

(25-26)

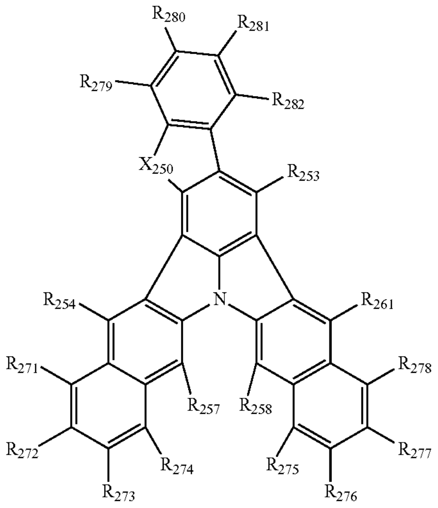

In the formula (25-26), $X_{250}$ is $C(R_{901})$ $(R_{902})$, $NR_{903}$, O, or S. $R_{253}$, $R_{254}$, $R_{257}$, $R_{258}$, $R_{261}$, and $R_{271}$ to $R_{282}$ are the same as $R_{251}$ to $R_{261}$ in the formula (25). $R_{901}$ to $R_{903}$ are as defined in the formula (21).

Examples of the compound represented by the formula (21) include, for example, compounds shown below as specific examples. In the following specific examples, "Ph" represents a phenyl group and "D" represents a deuterium atom.

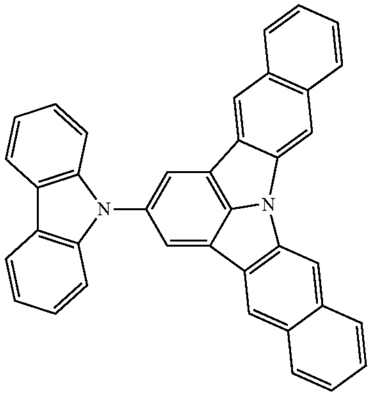

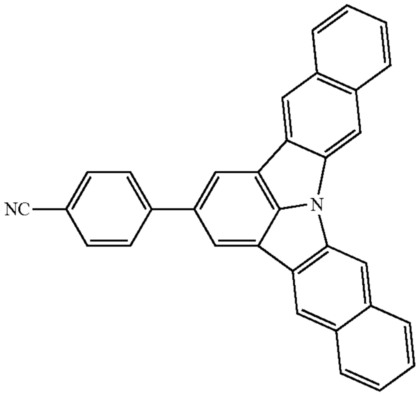

-continued
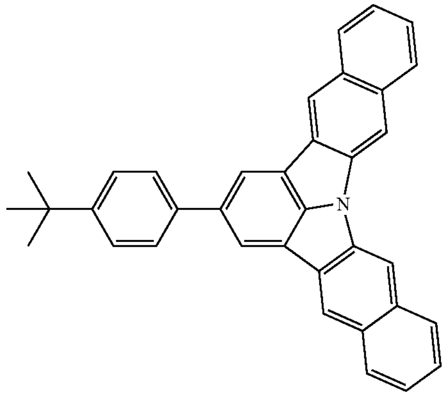
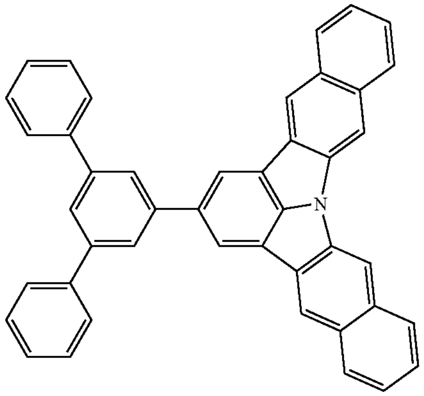
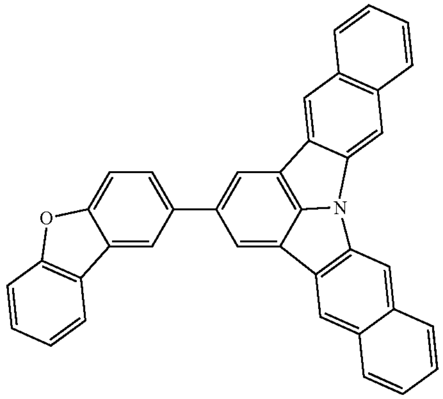
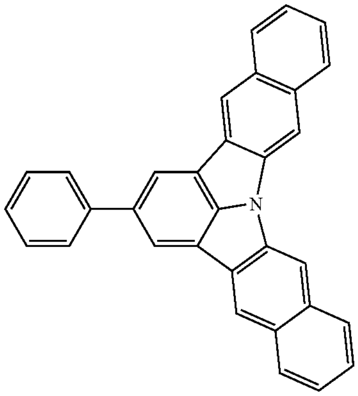
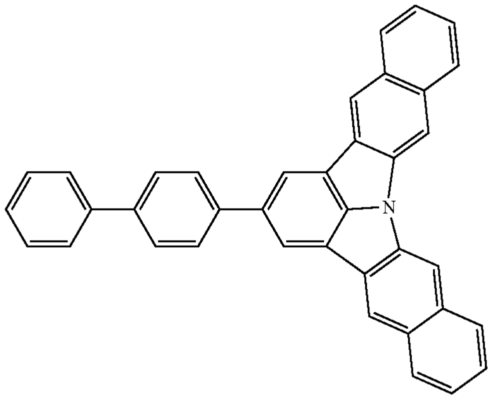
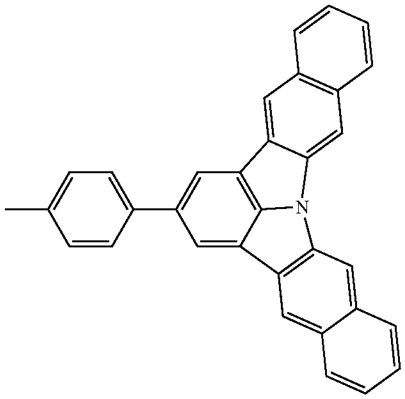
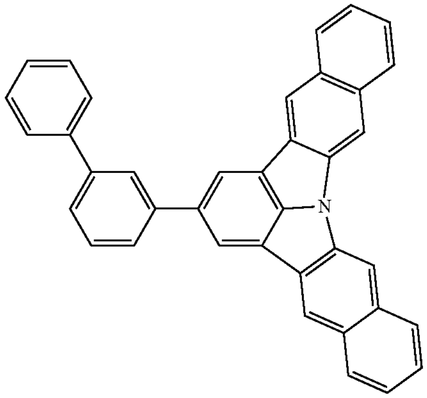
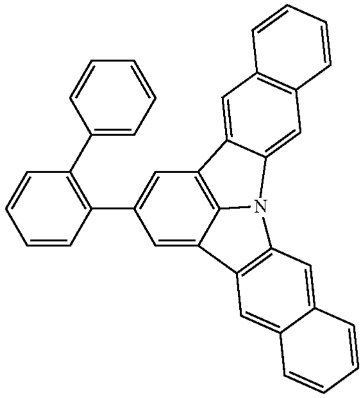

-continued
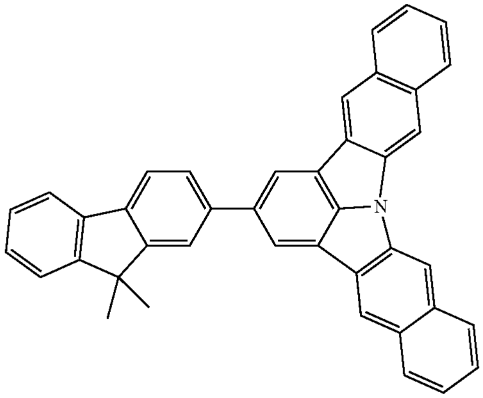
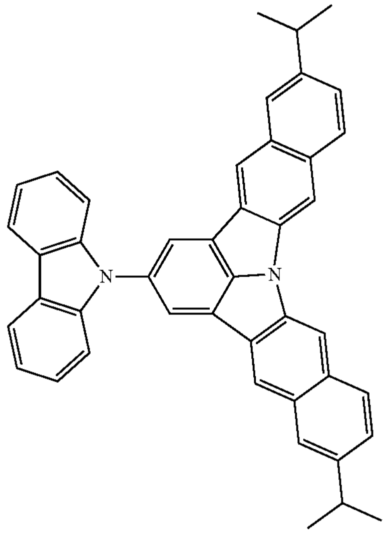
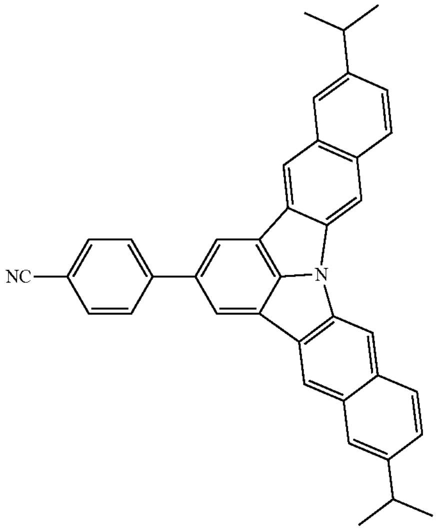
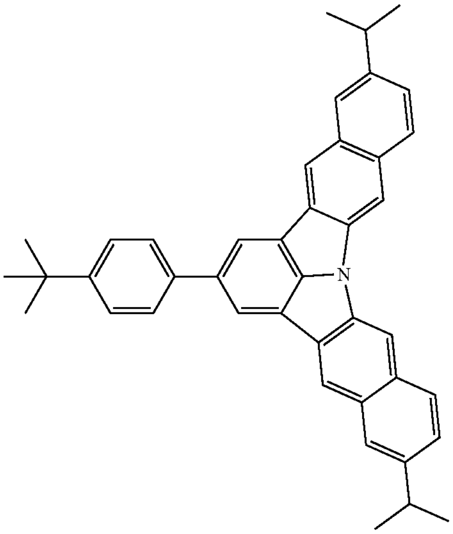
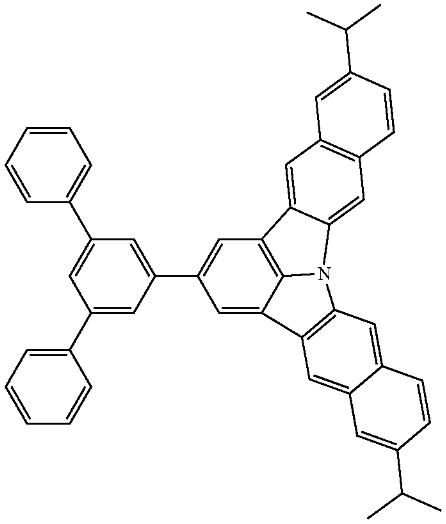
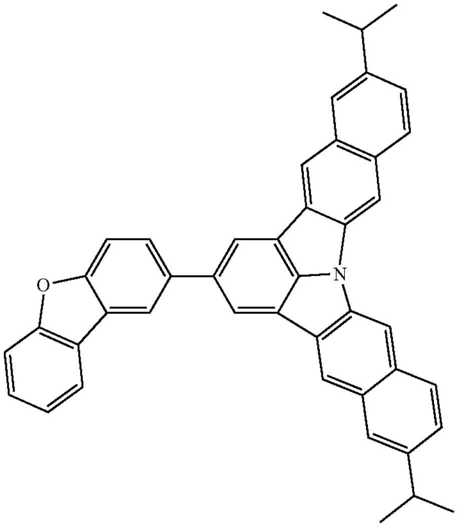

-continued
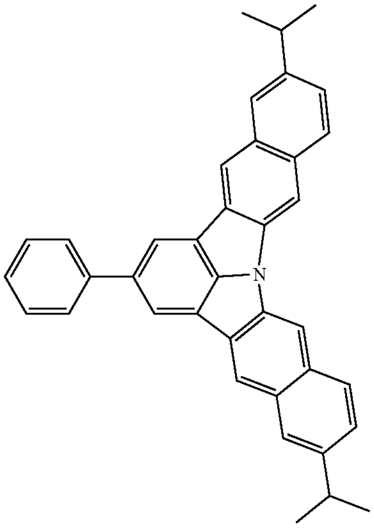
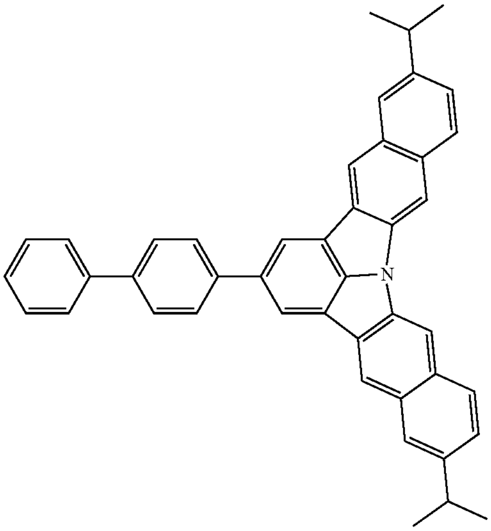
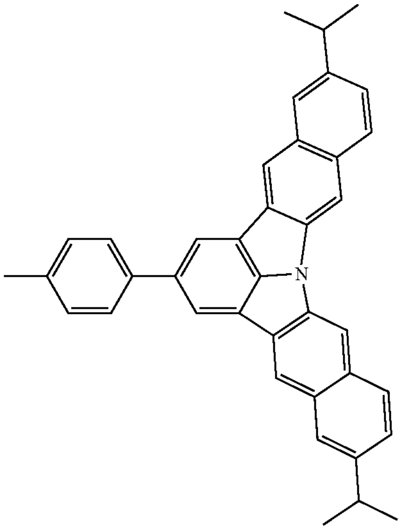
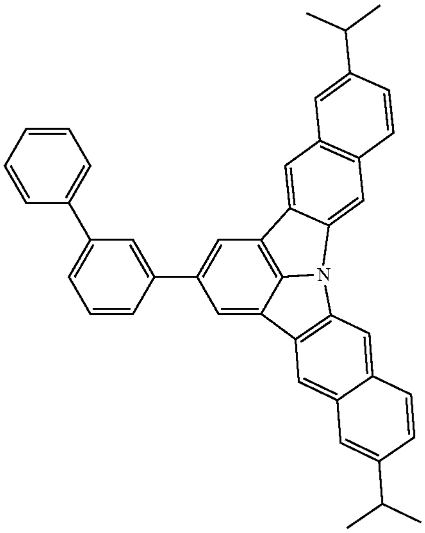
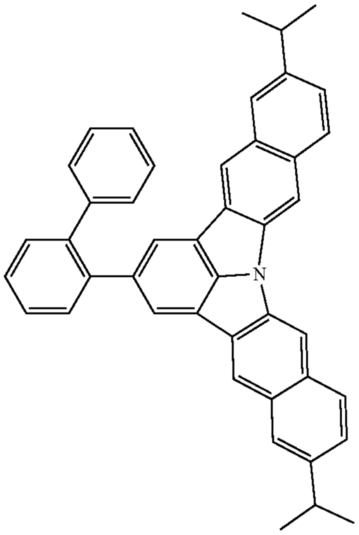
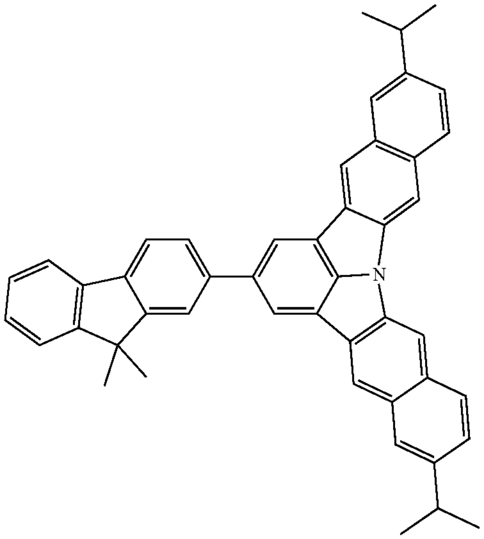

-continued
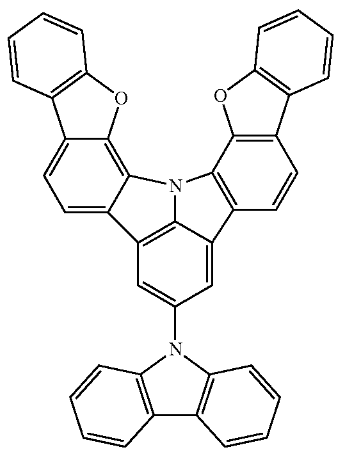
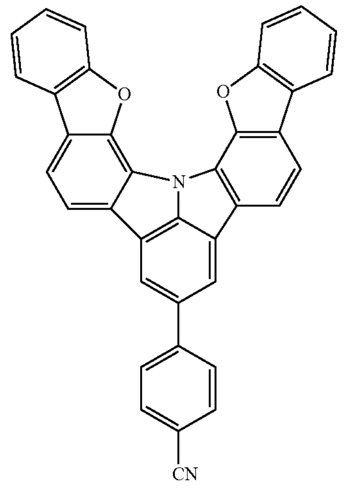
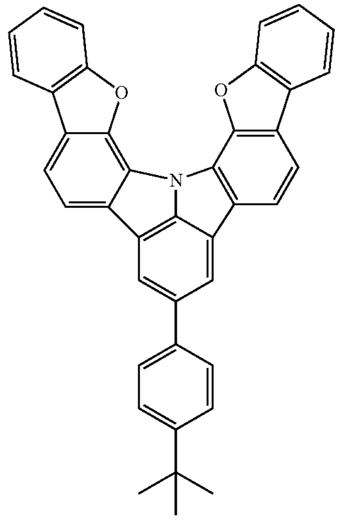
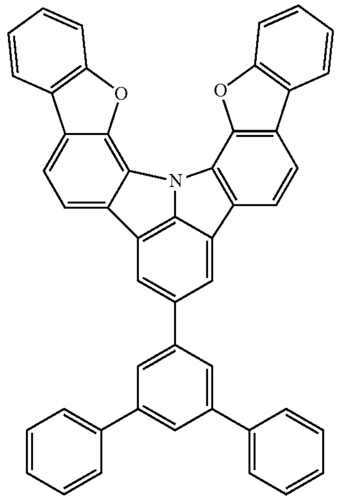
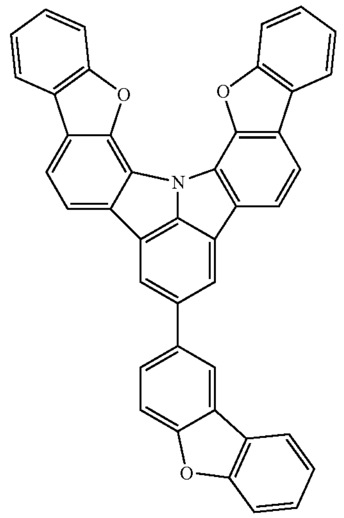
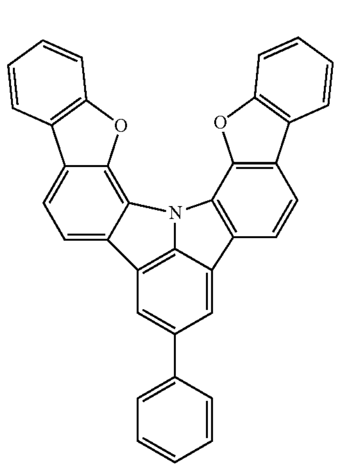
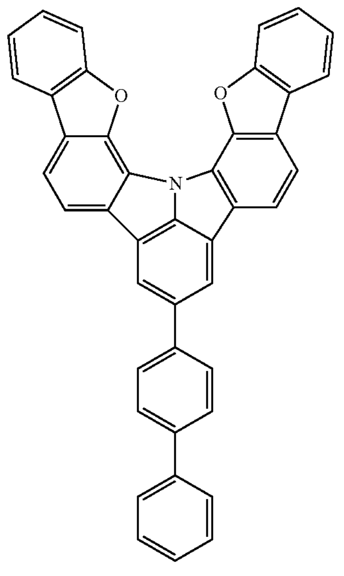
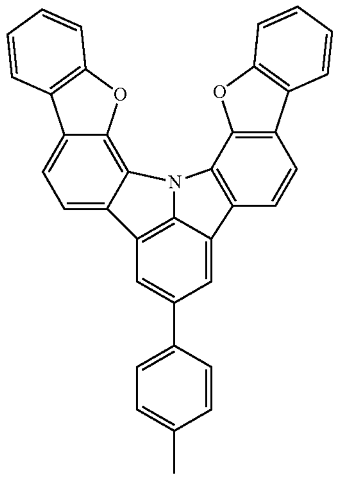
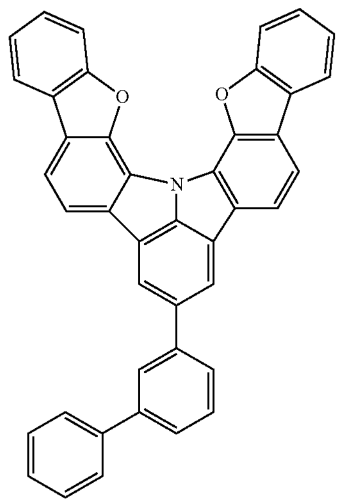

-continued
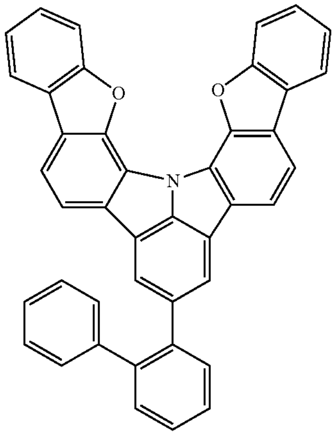
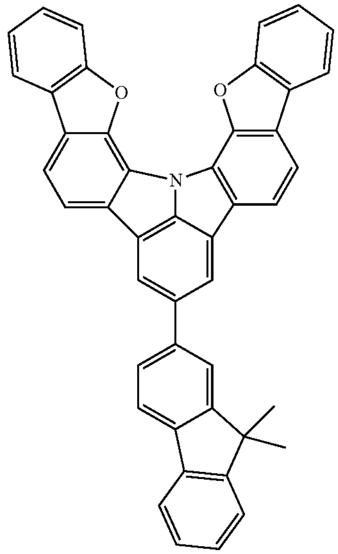
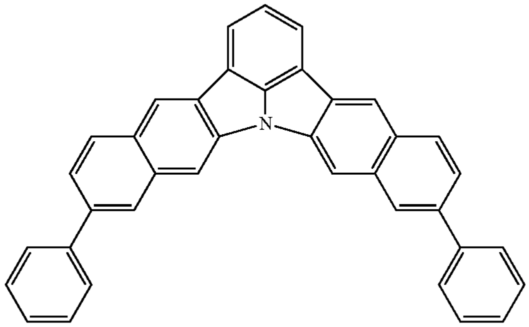
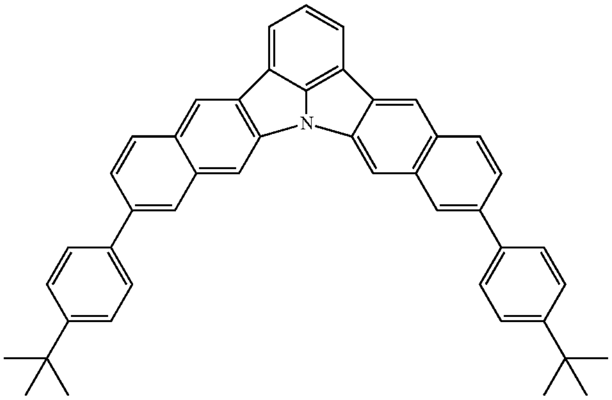
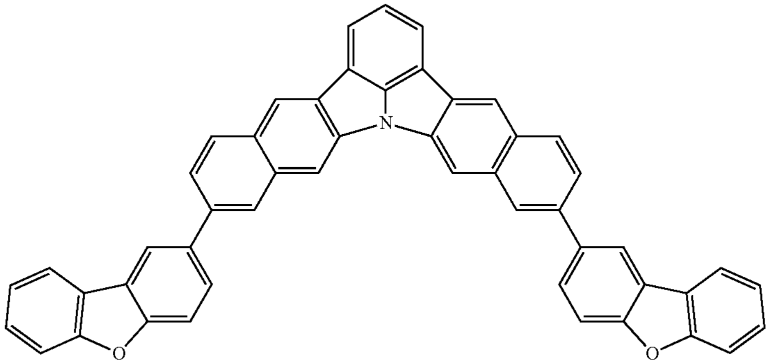
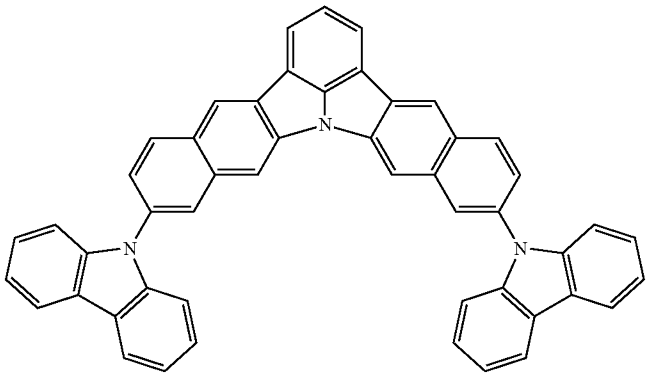

-continued
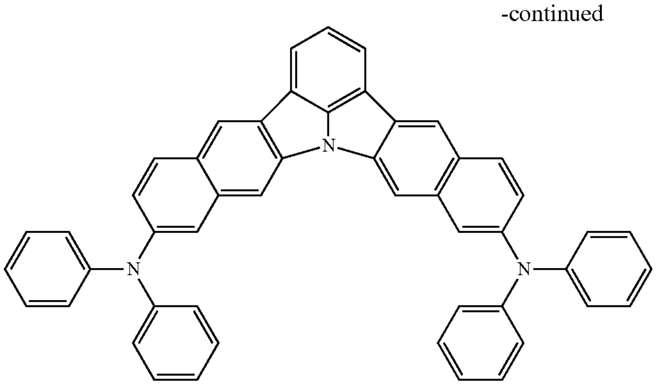
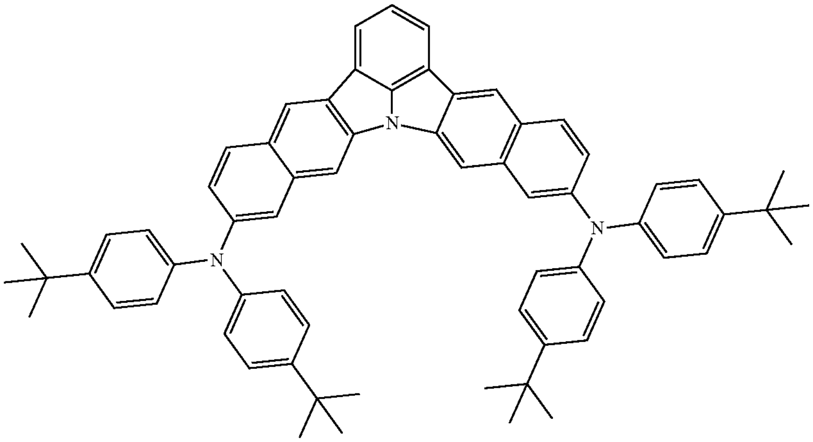
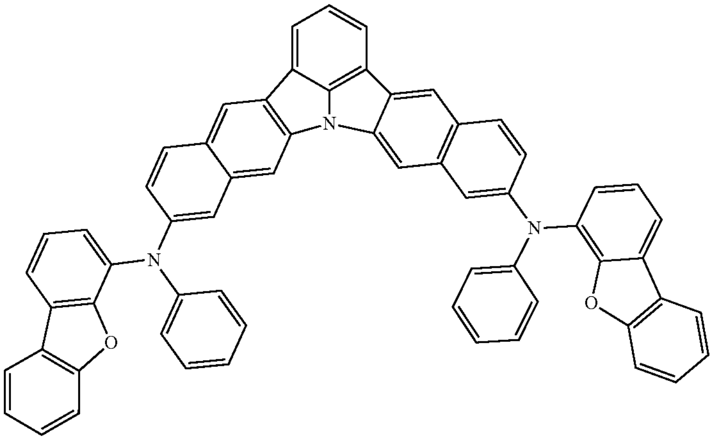
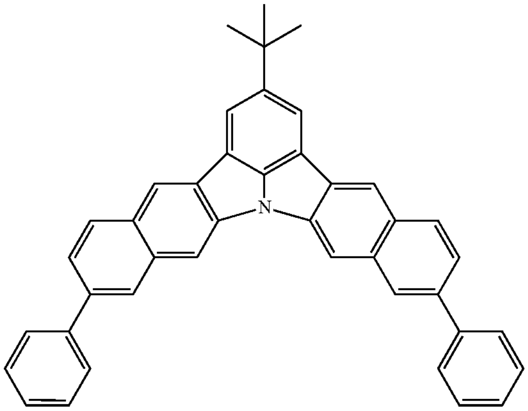
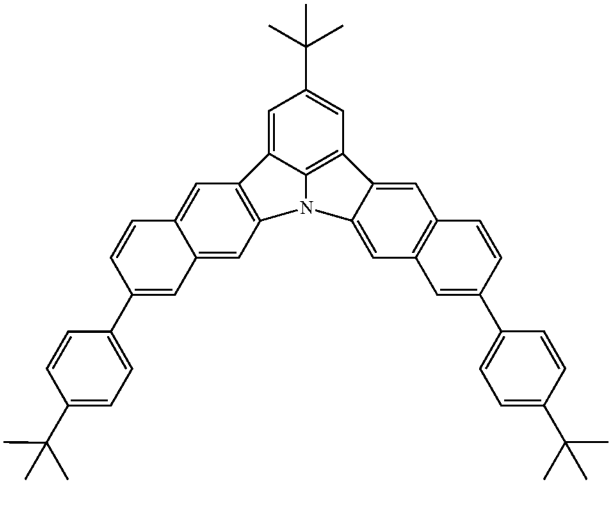

-continued
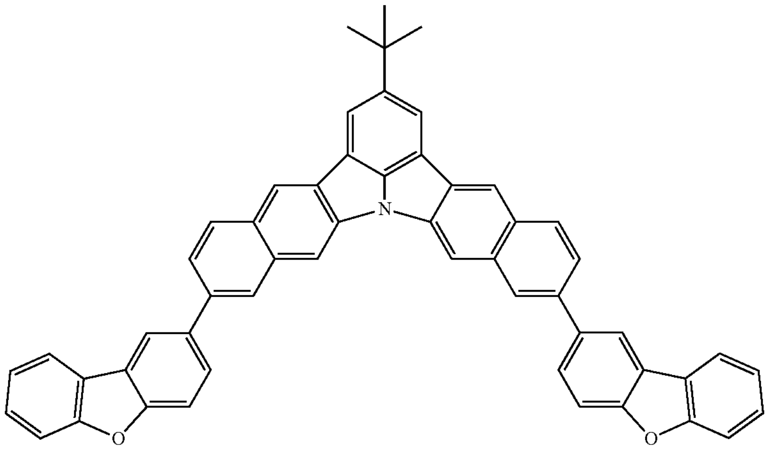
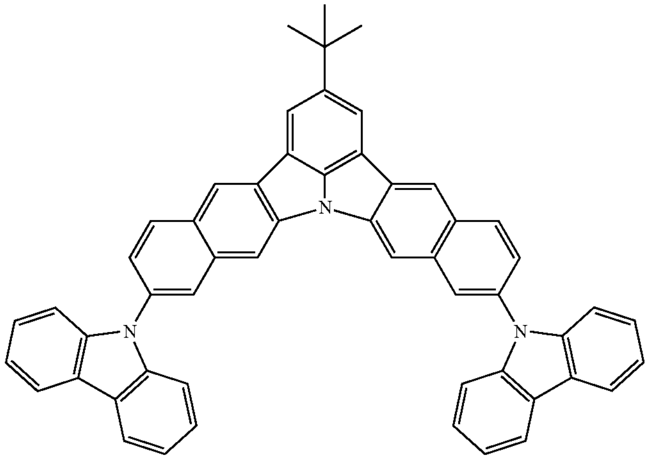
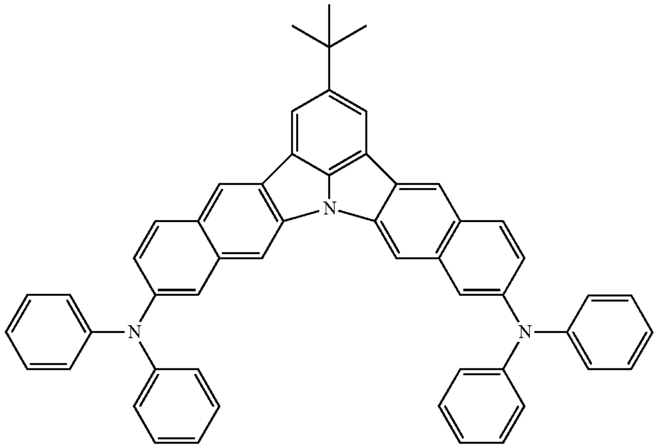

-continued
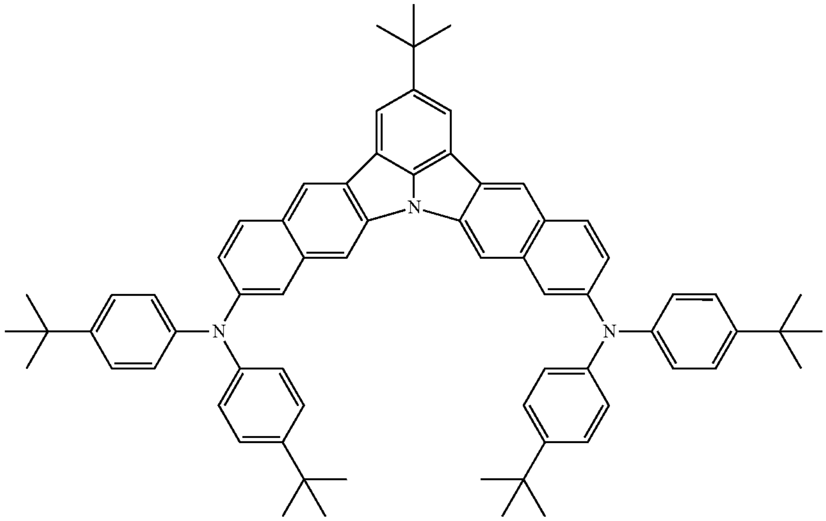
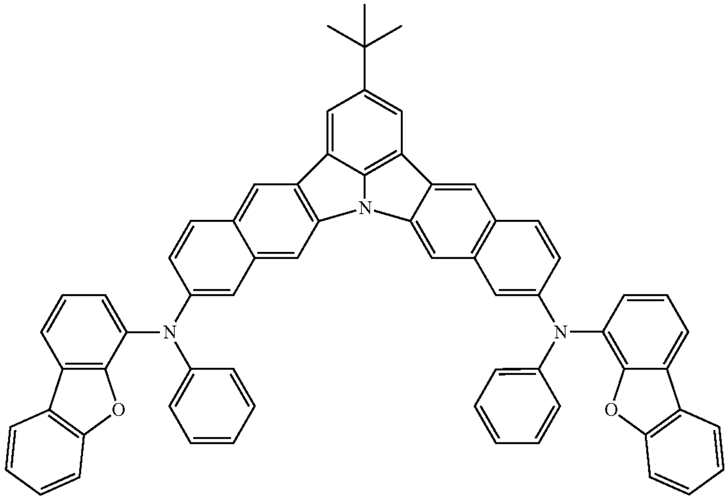
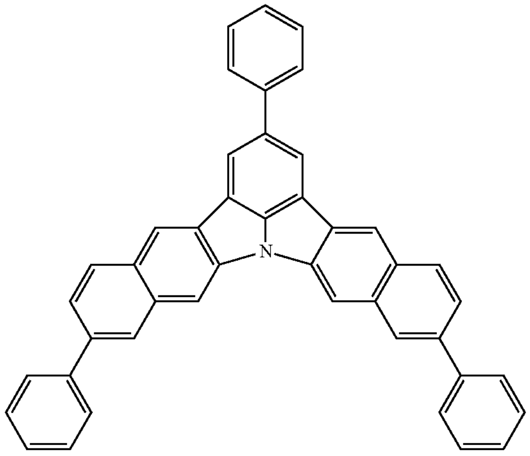
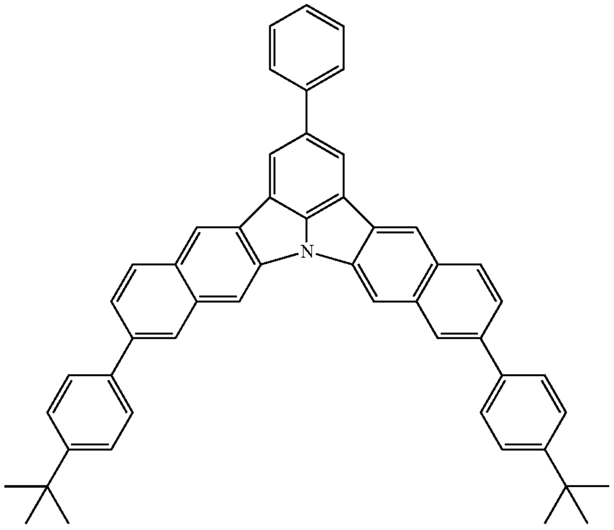

-continued
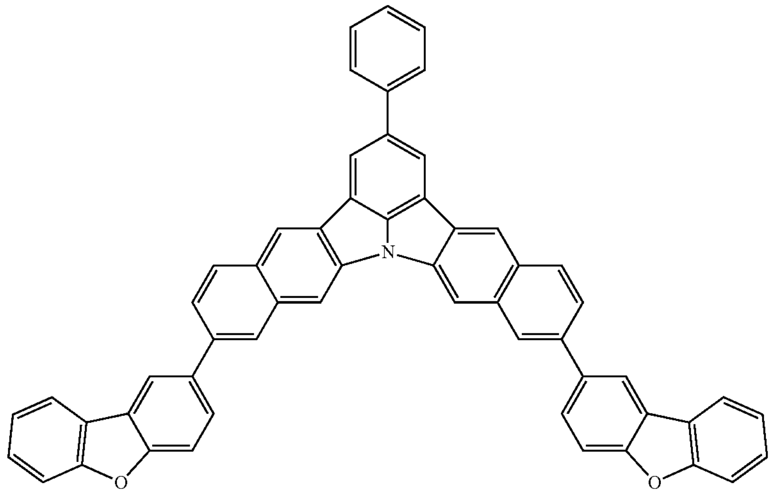
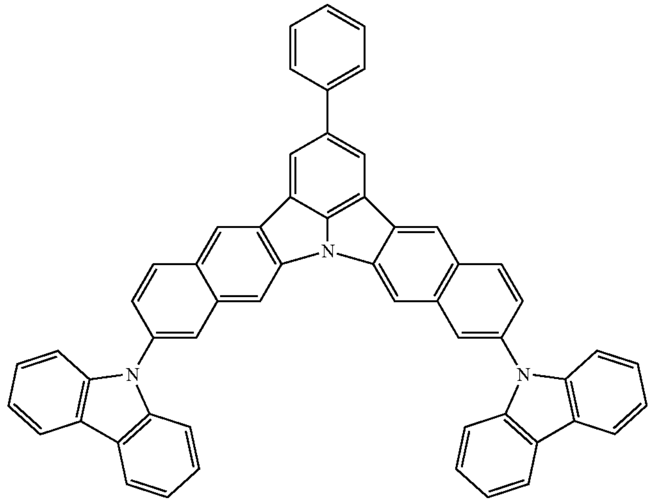
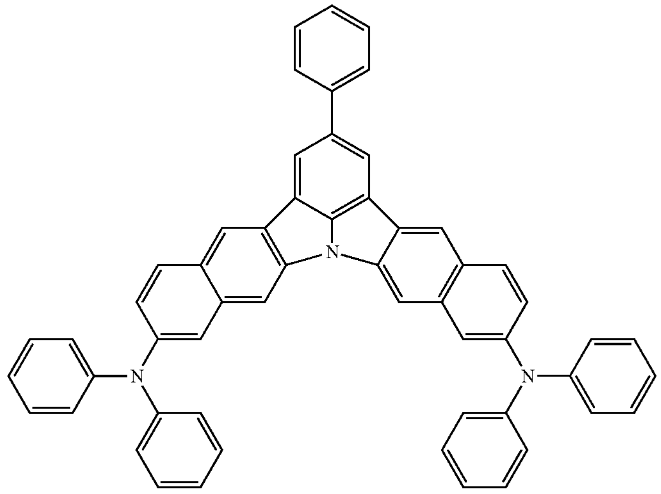

-continued
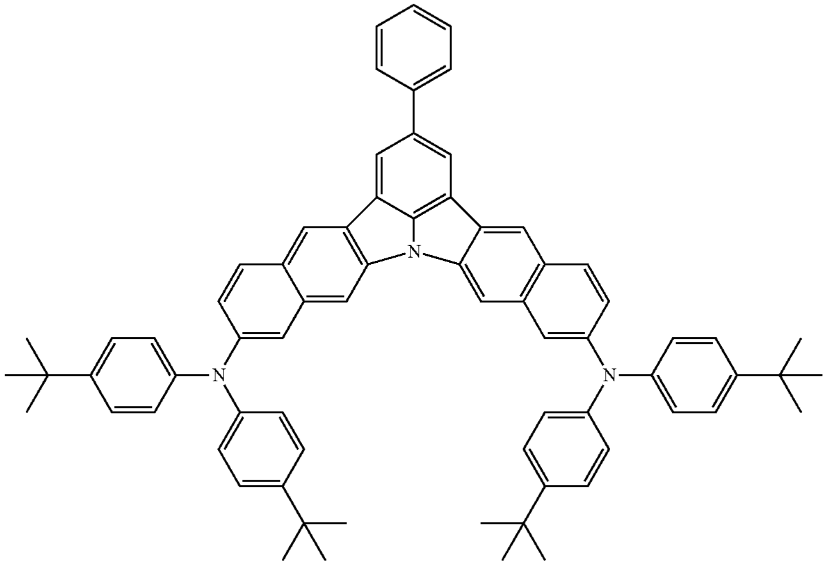
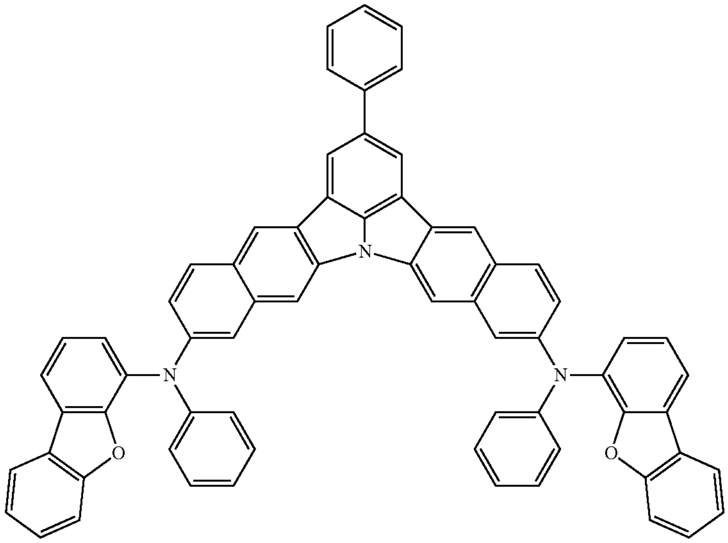
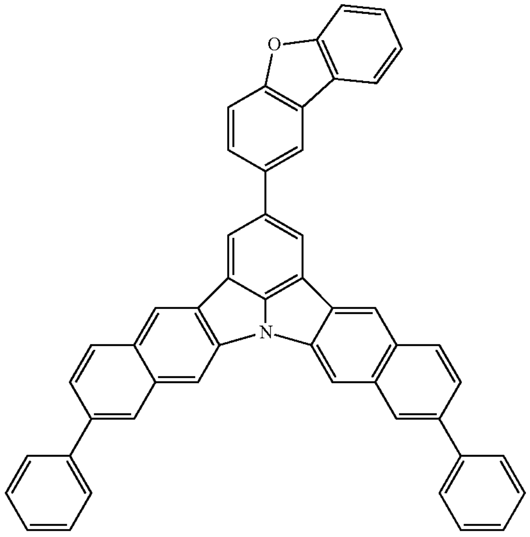
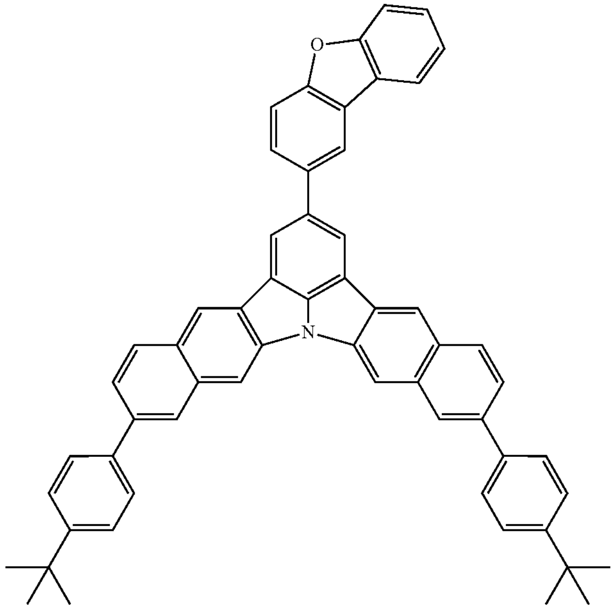

-continued
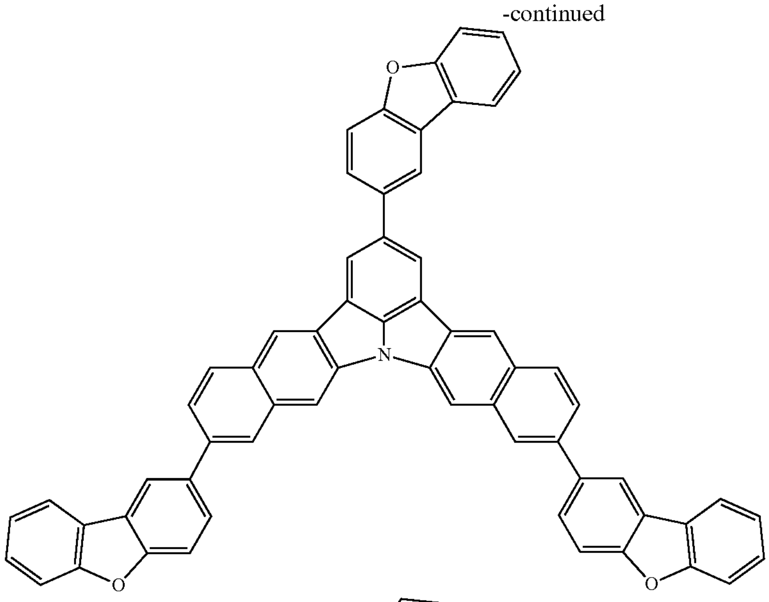
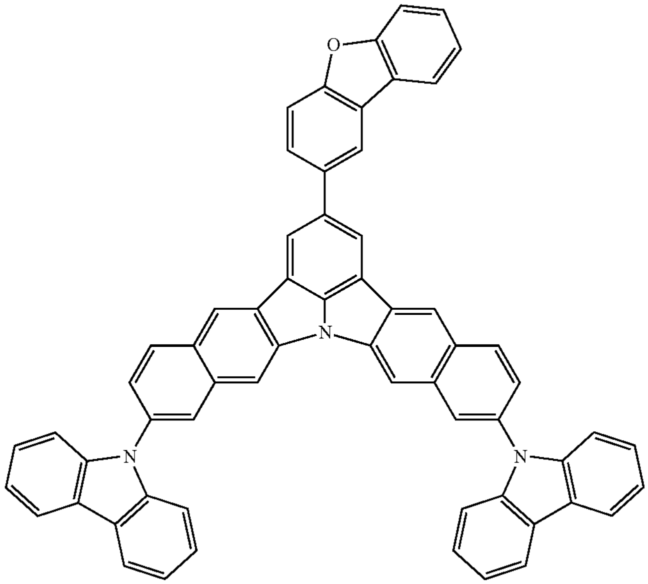
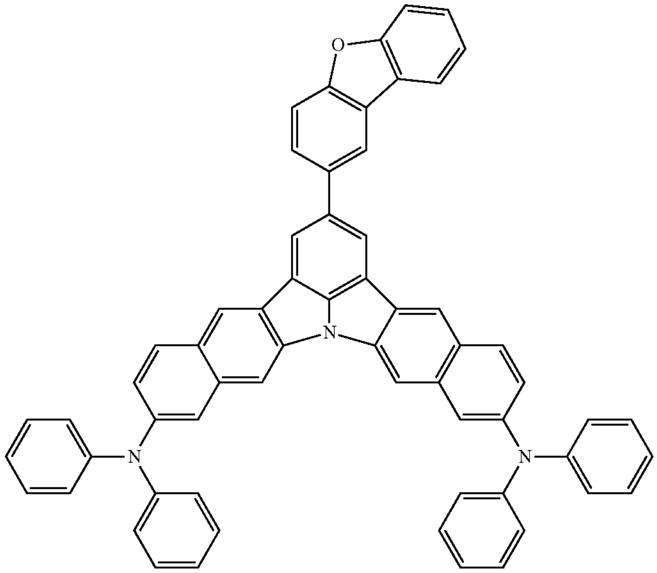

-continued
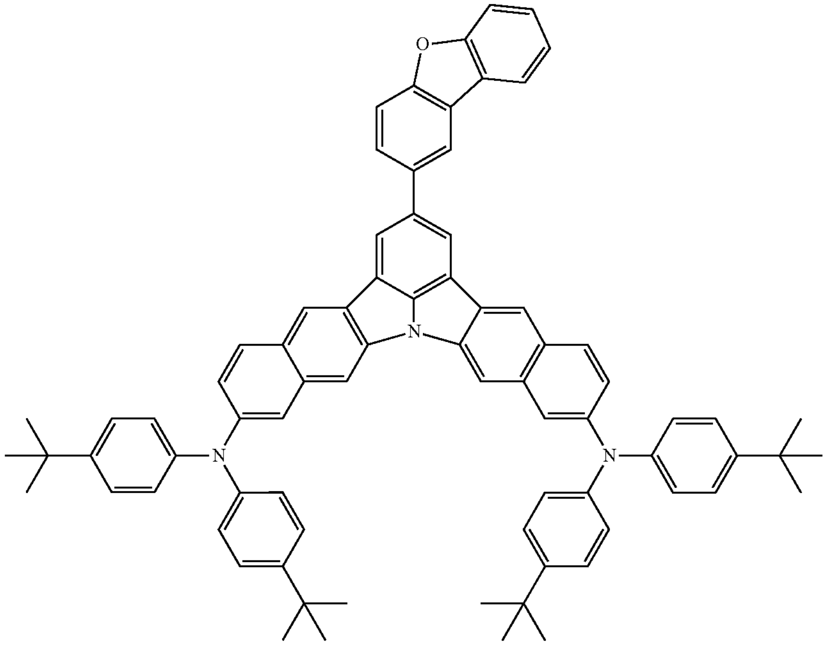
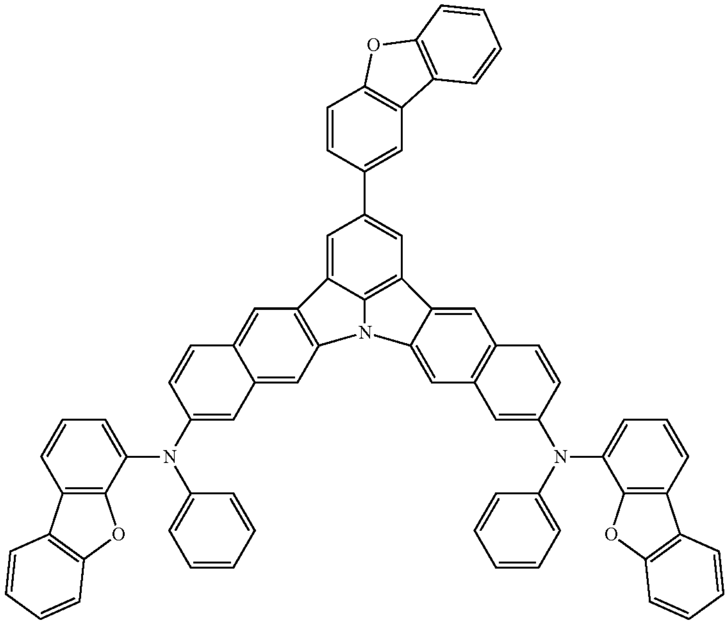

-continued
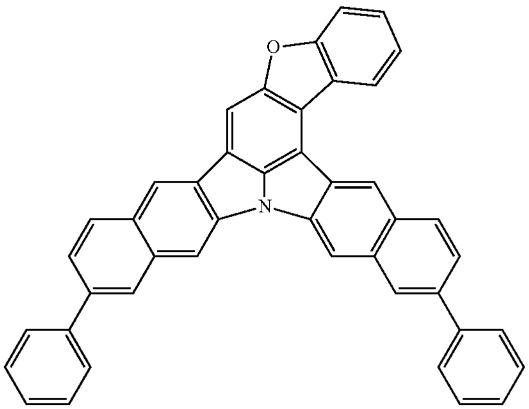
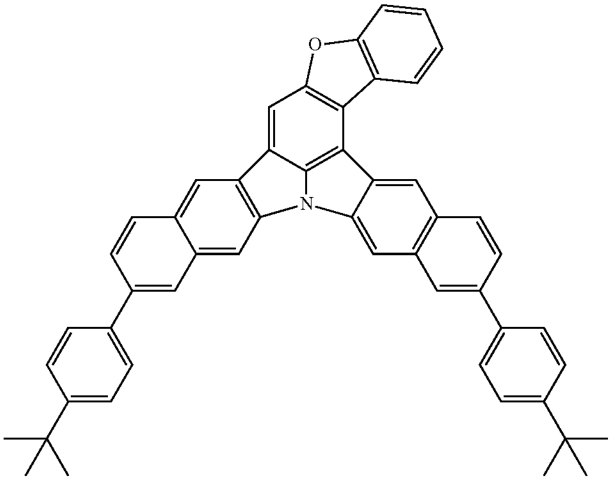
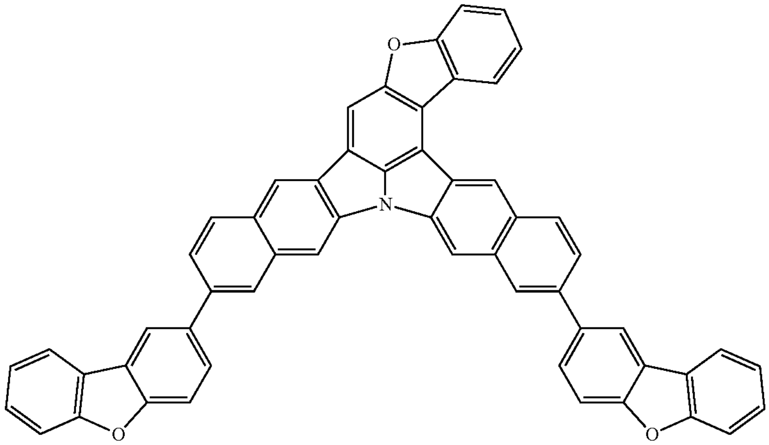
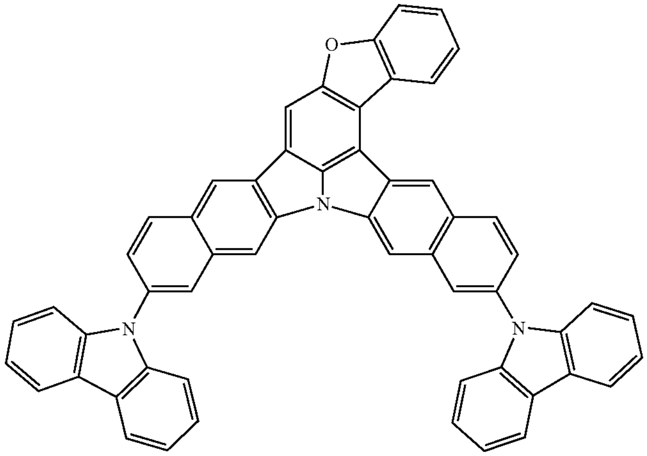

-continued
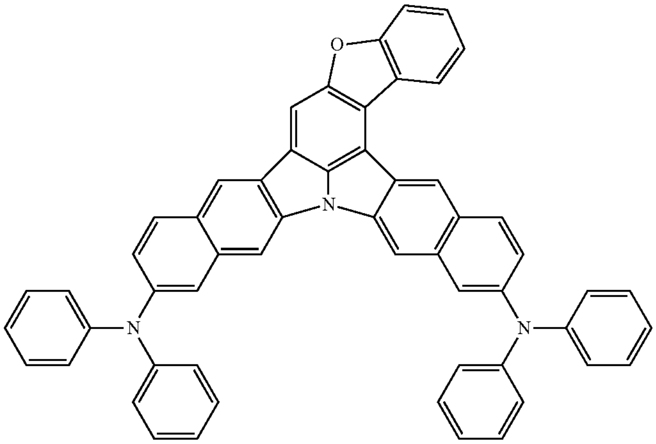
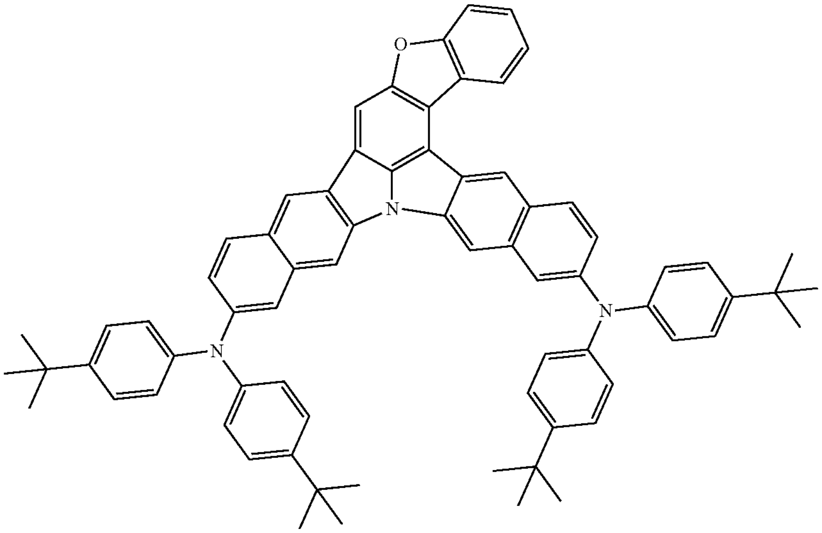
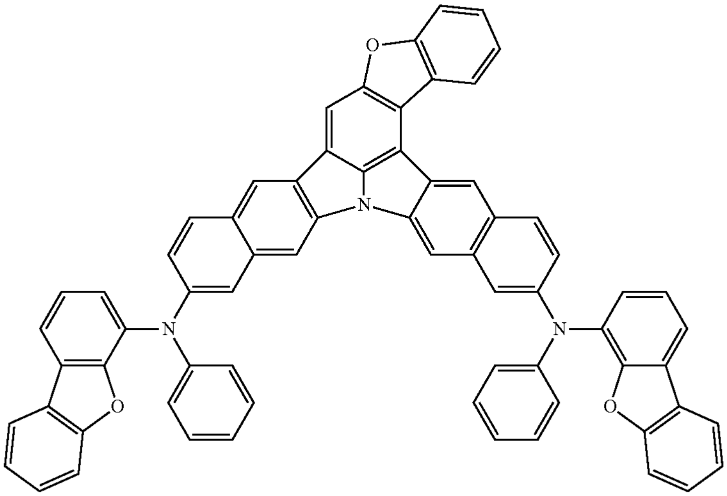

-continued
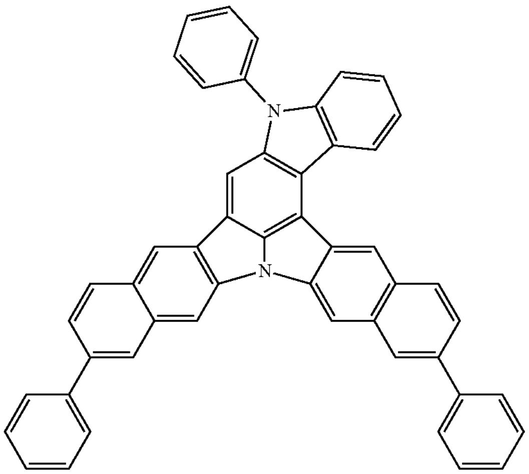
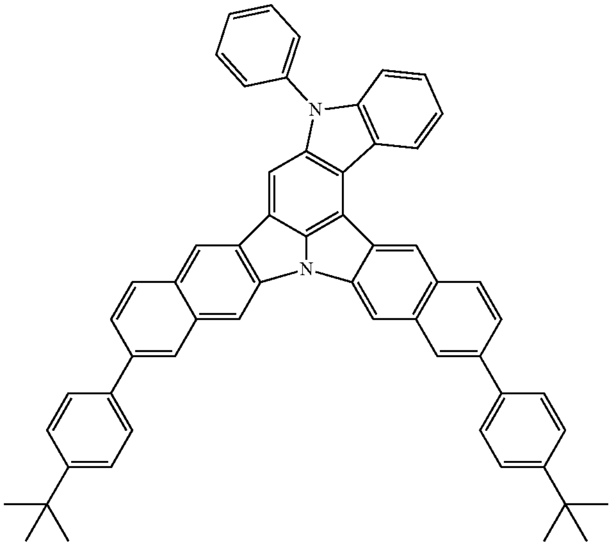
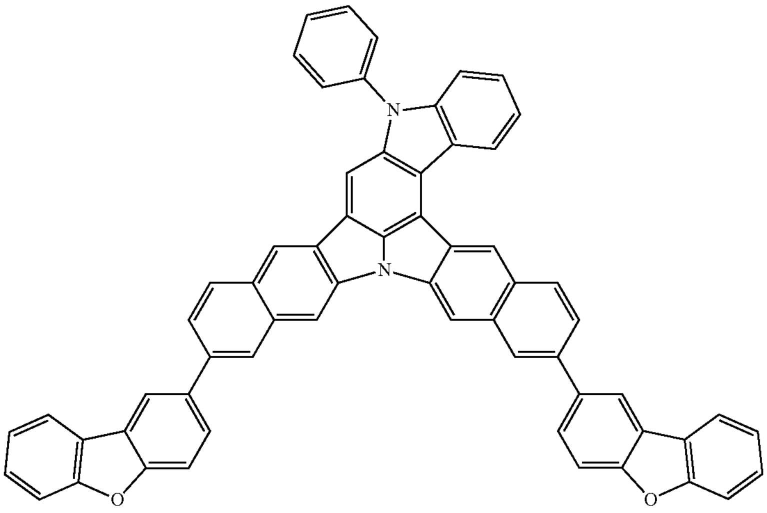
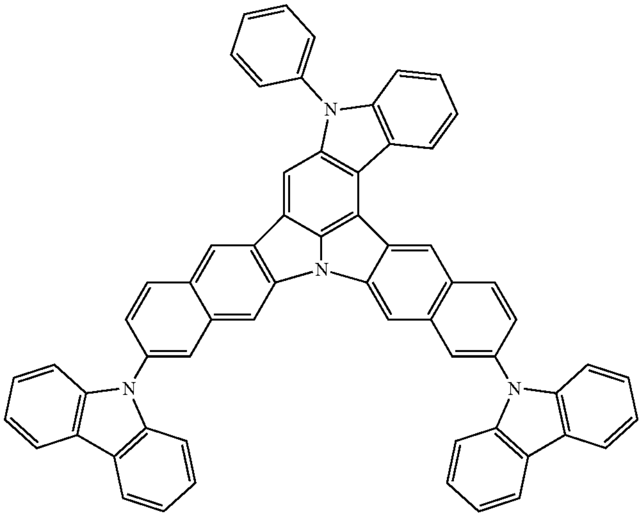

-continued
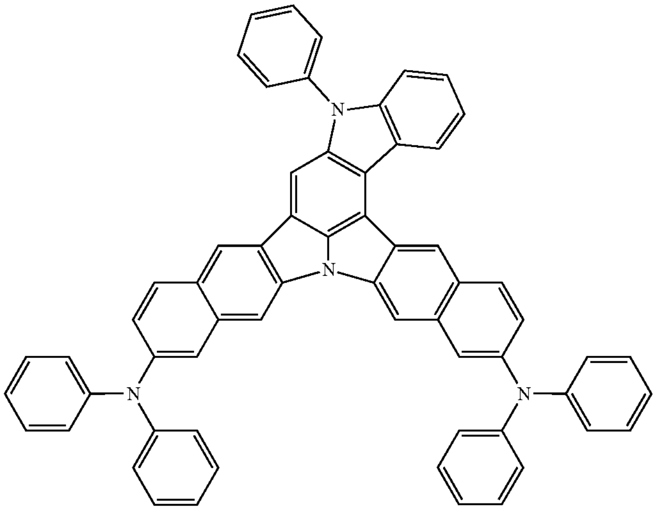
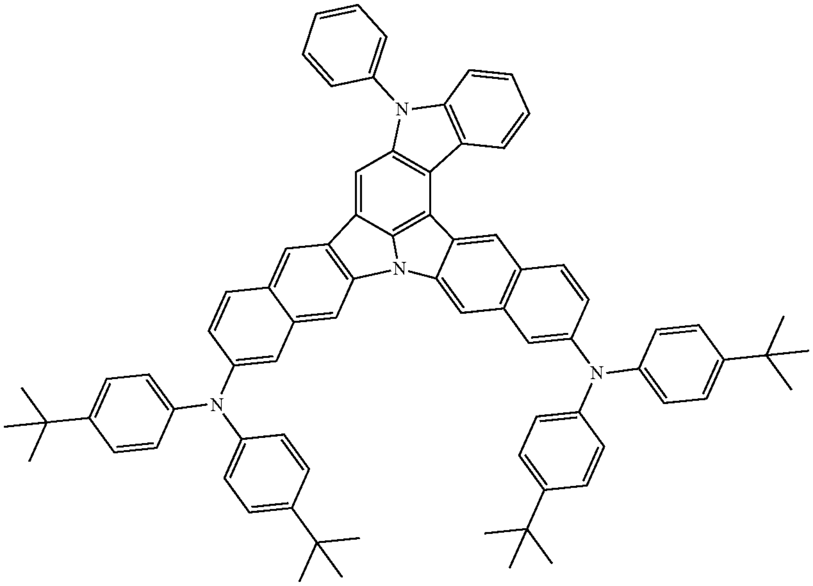
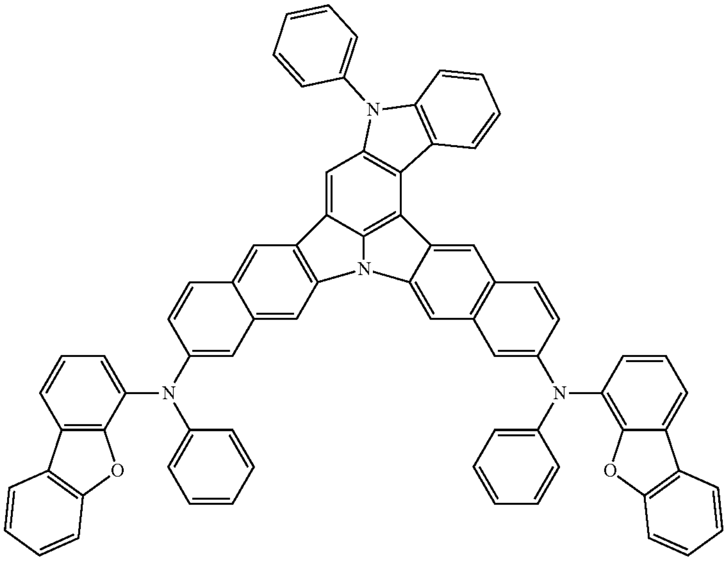

-continued
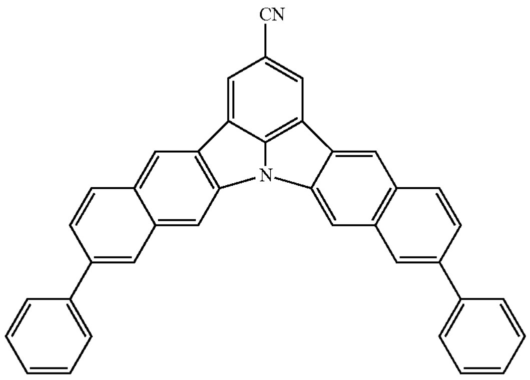
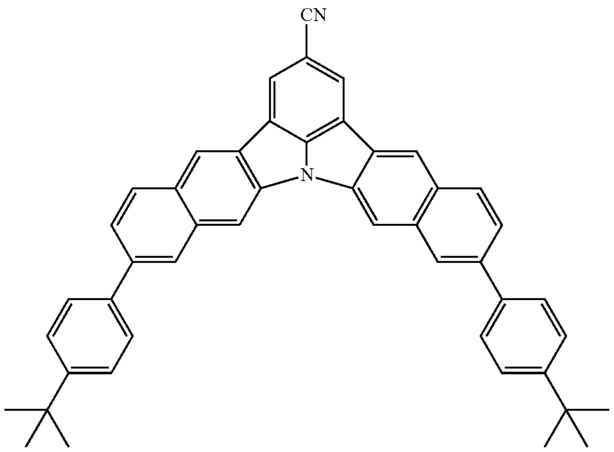
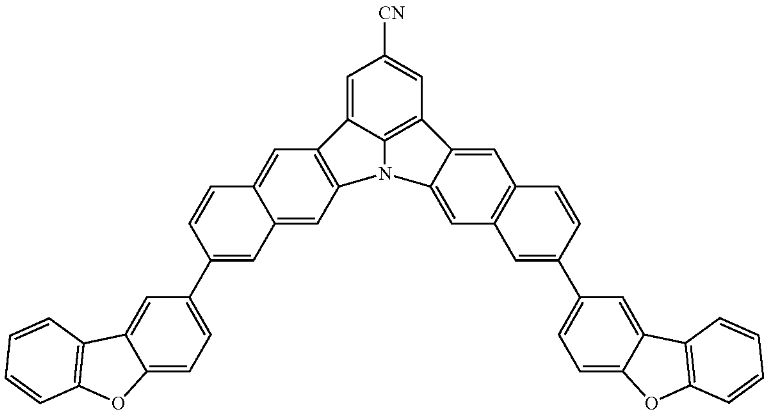
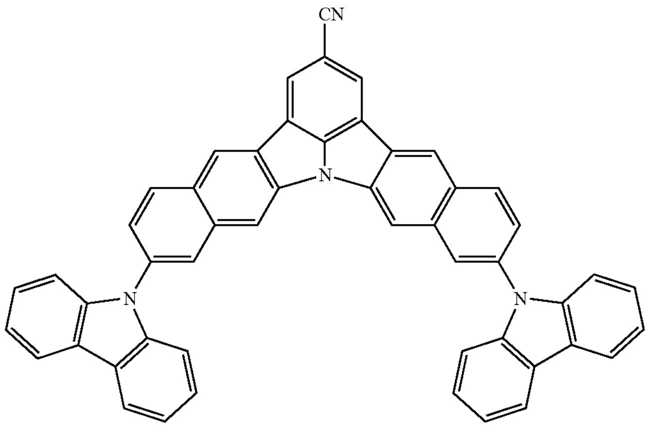
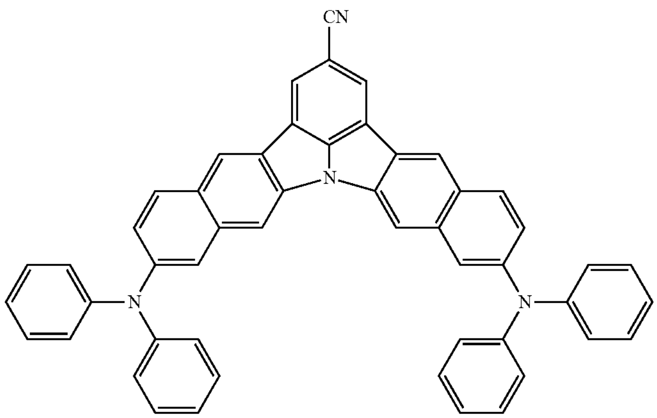

-continued
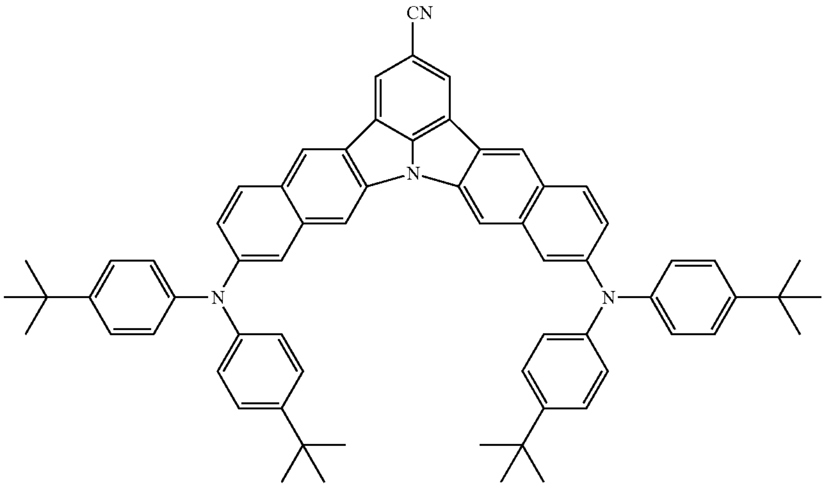
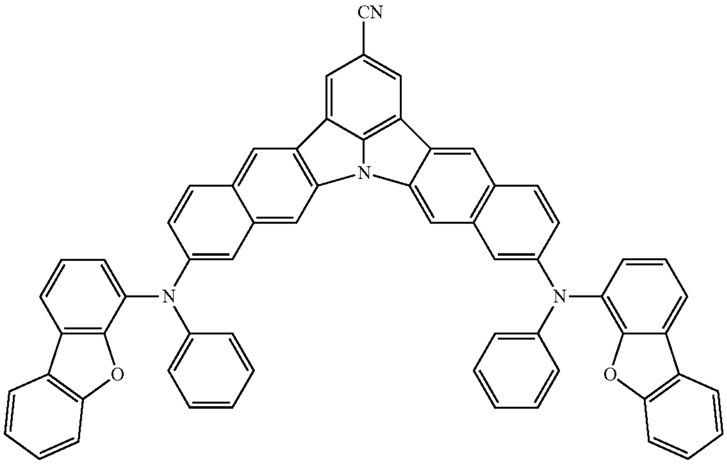
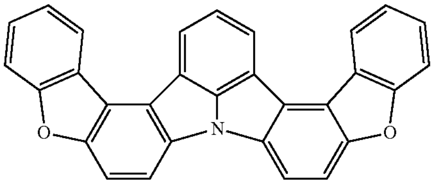
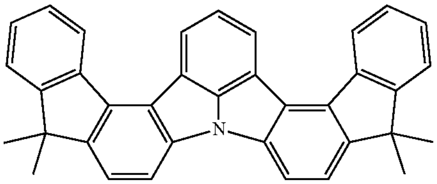
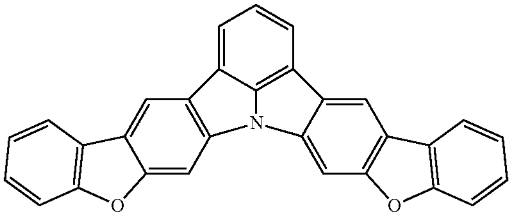
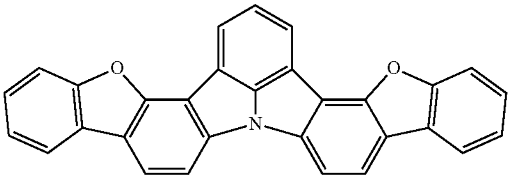
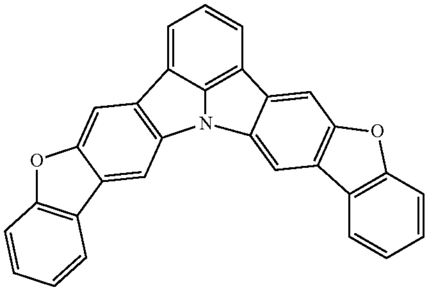
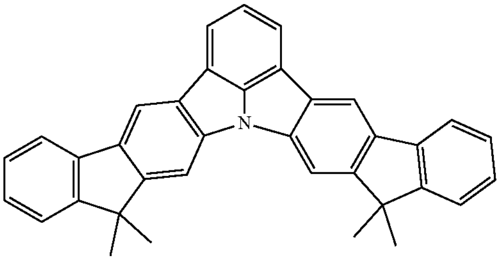

-continued
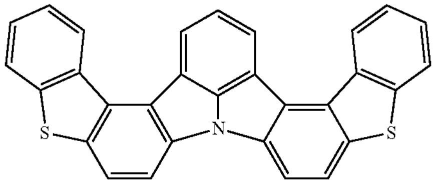
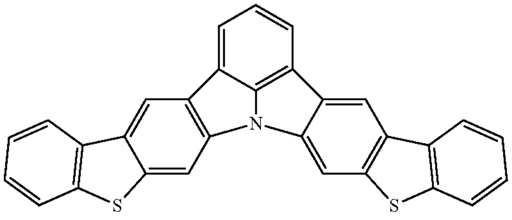
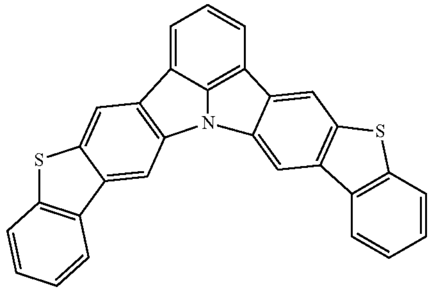
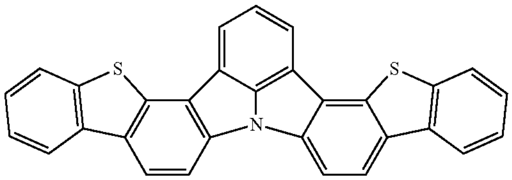
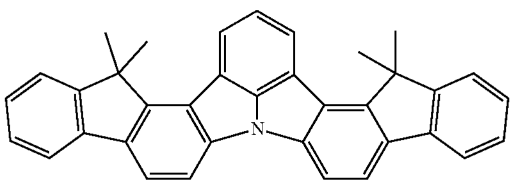
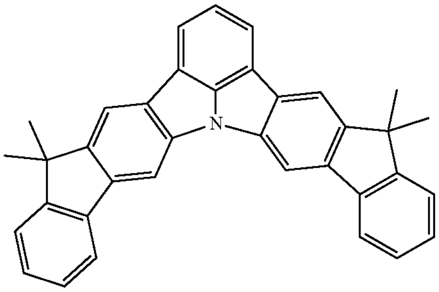
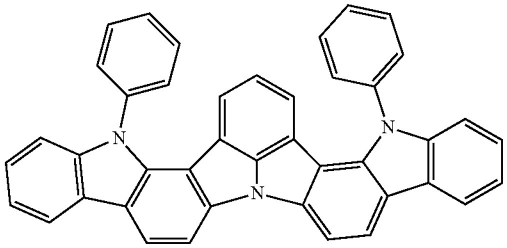
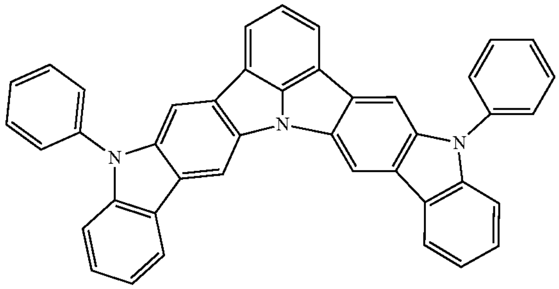
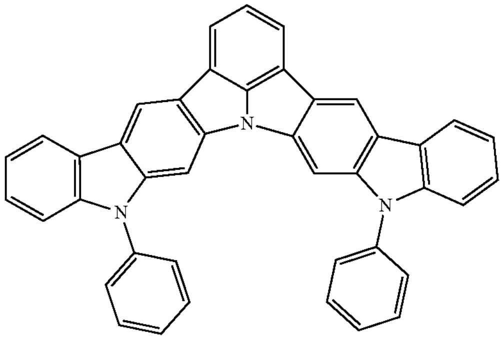
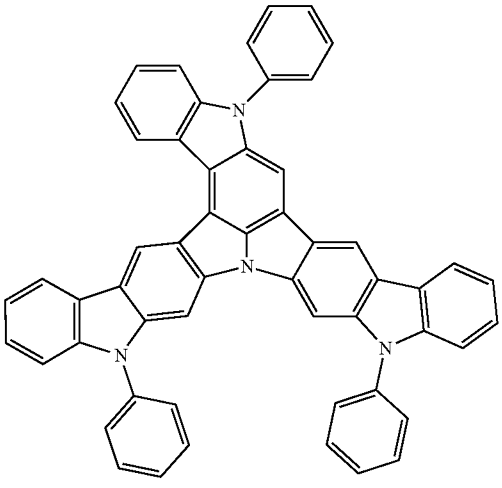

-continued
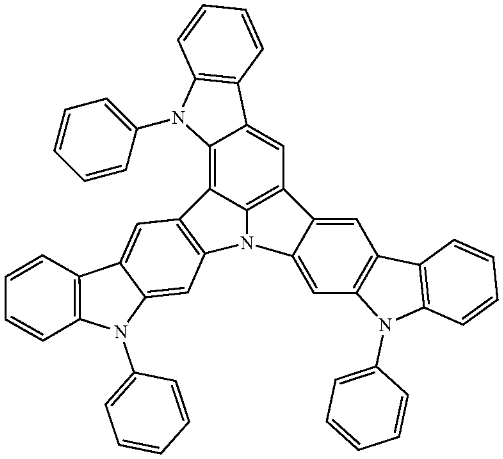
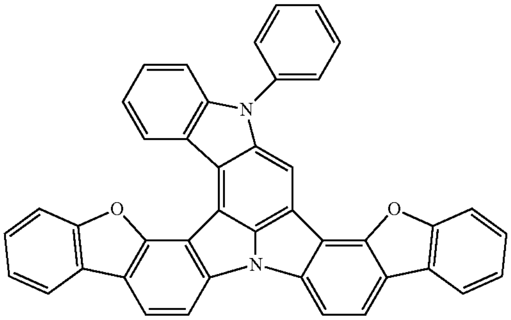
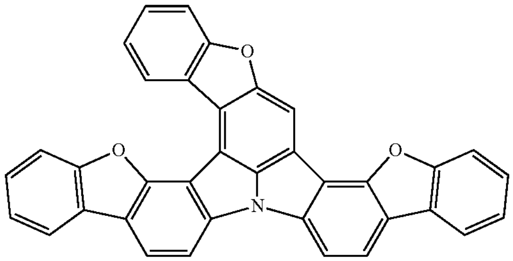
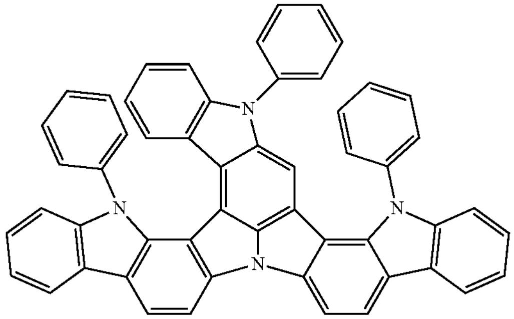
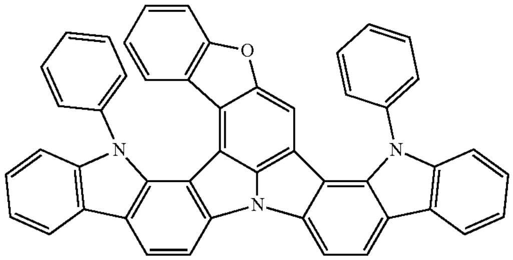
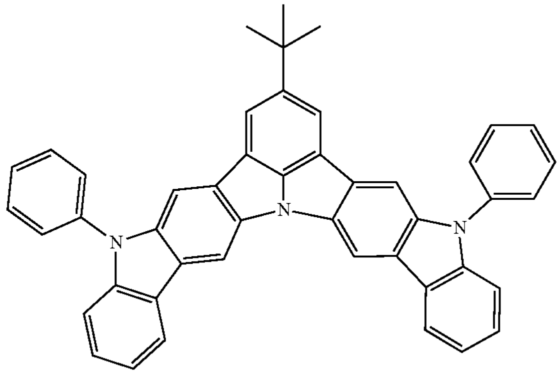
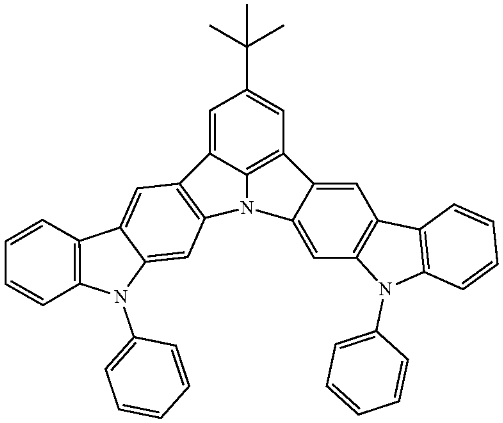

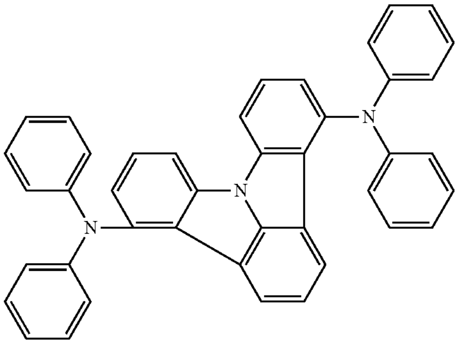
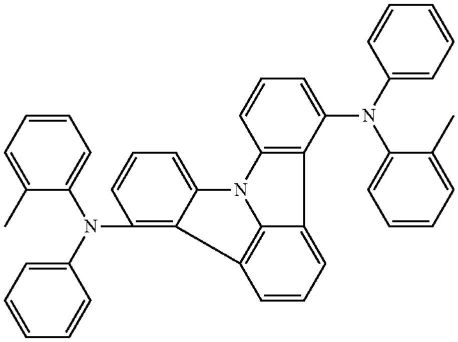
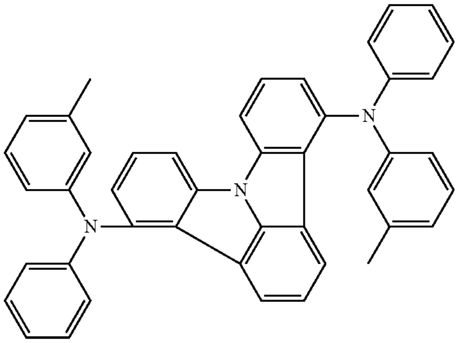
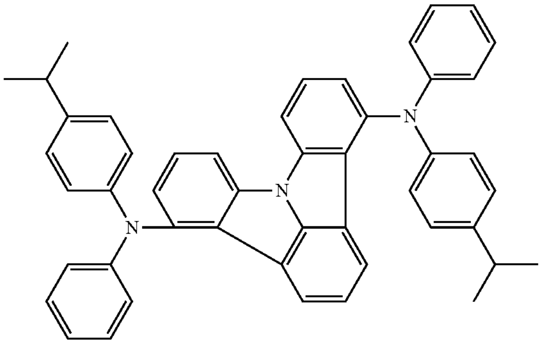
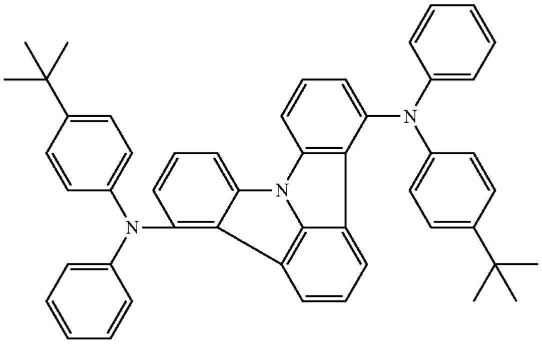
-continued
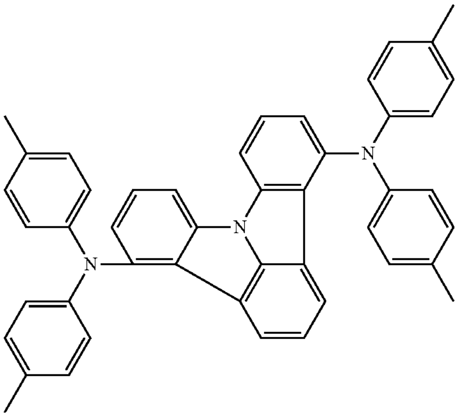
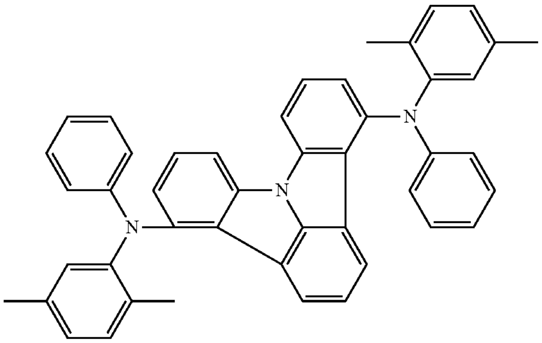
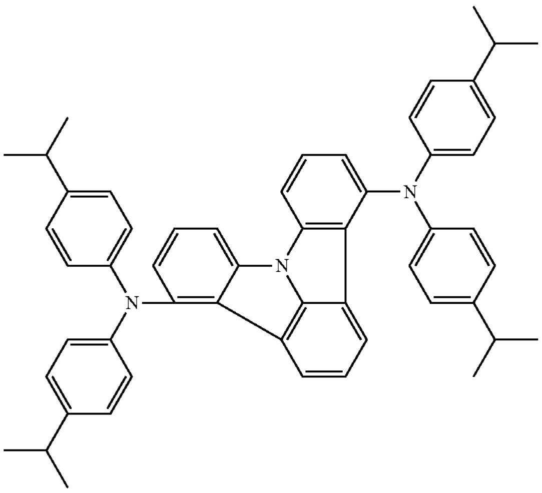

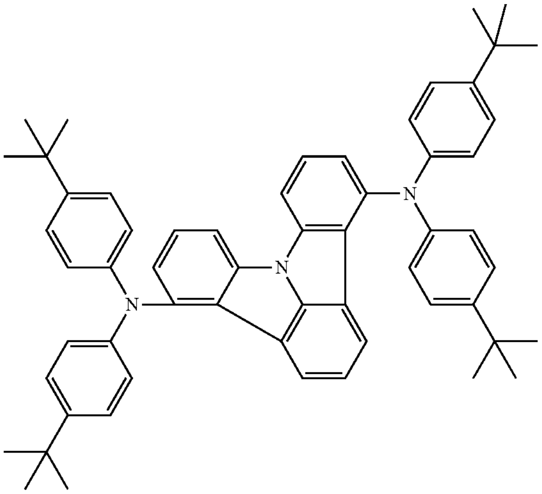
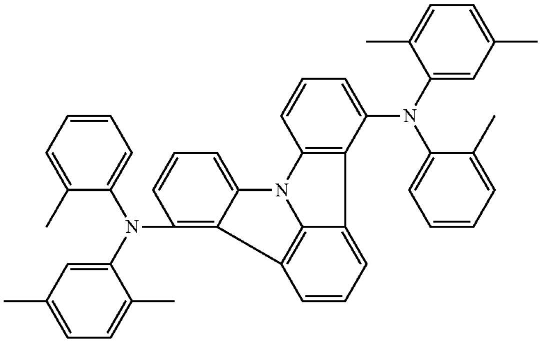
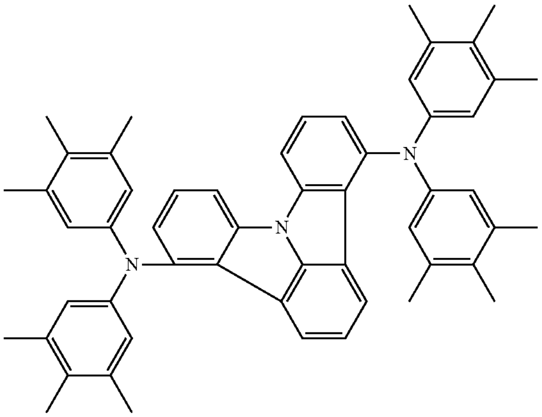
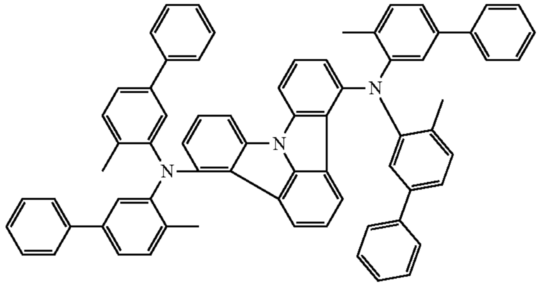
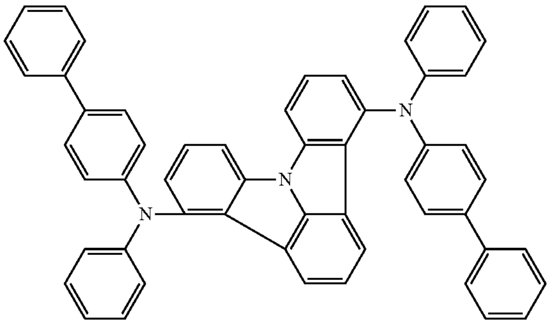
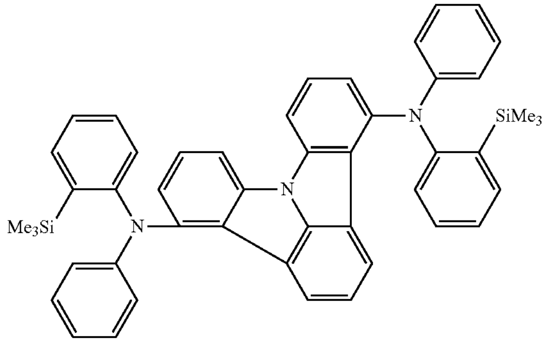
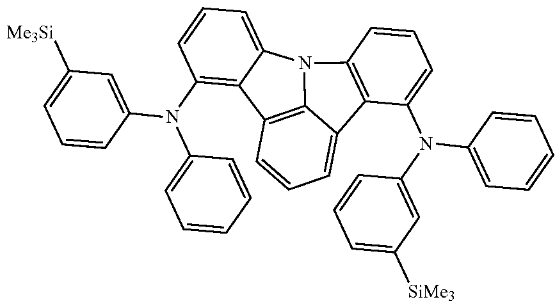
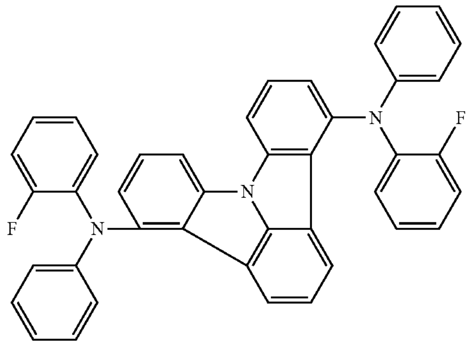
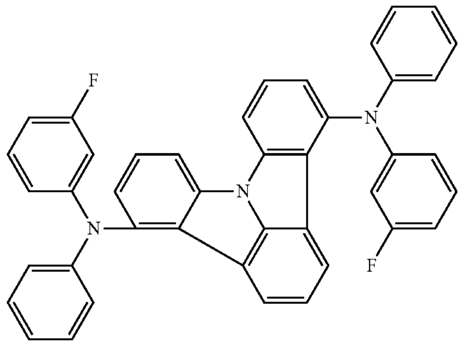

-continued
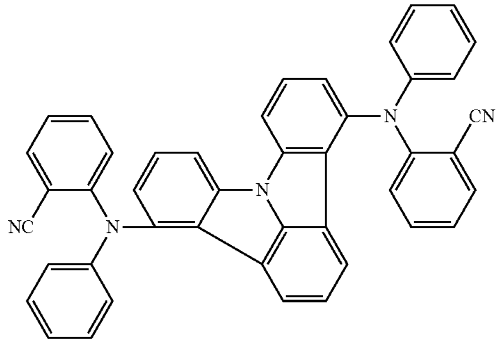
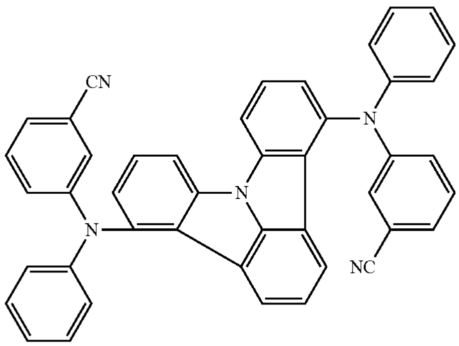
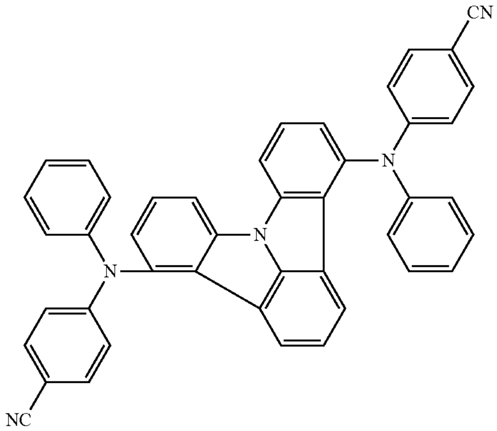
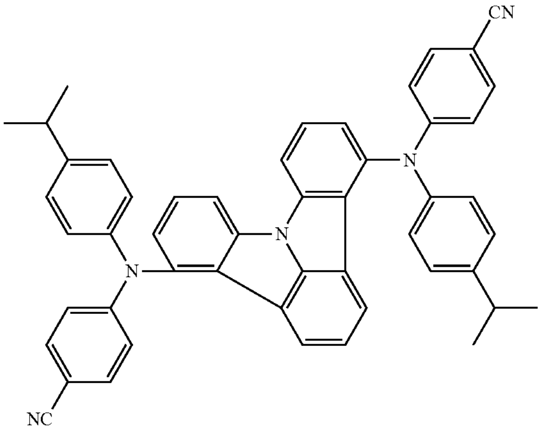
-continued
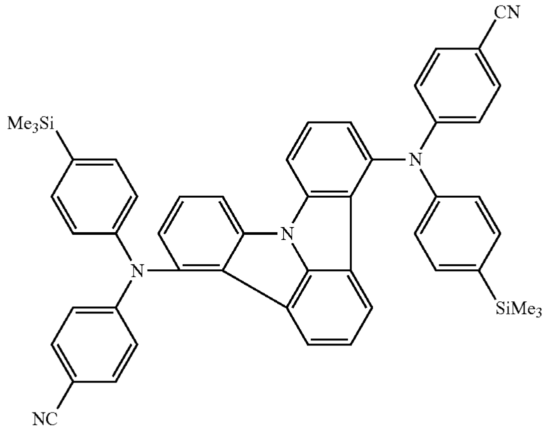
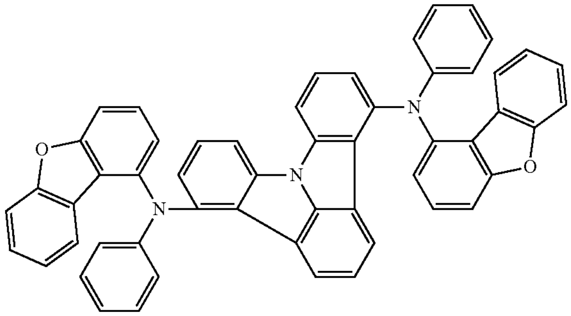
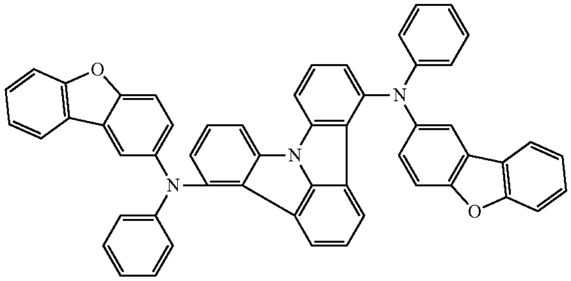
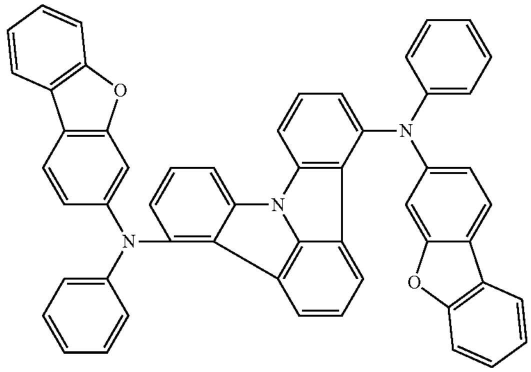

-continued
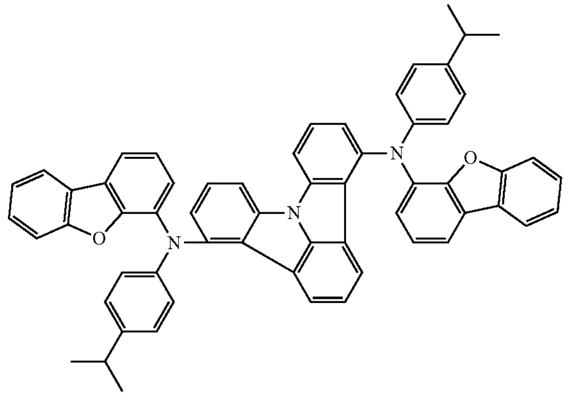
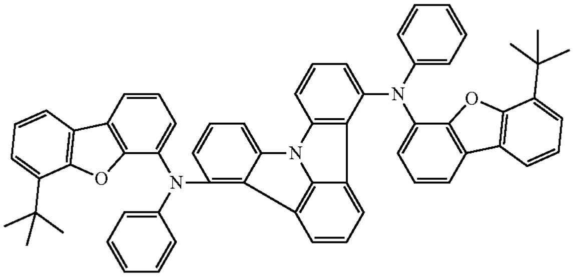
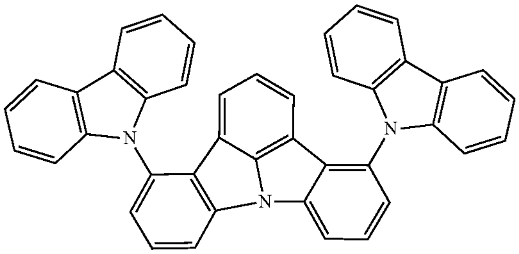
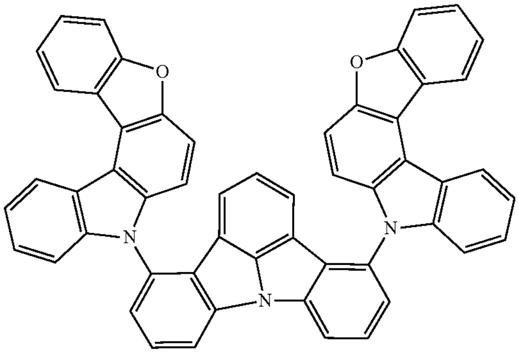
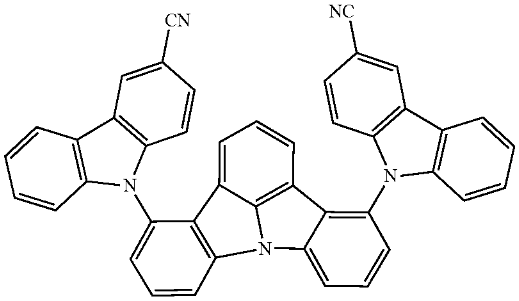
-continued
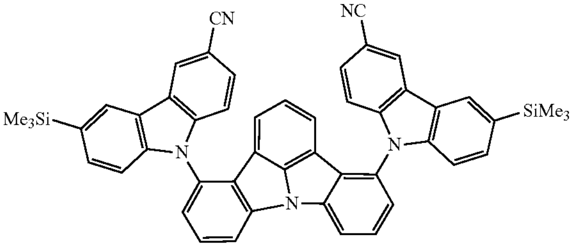
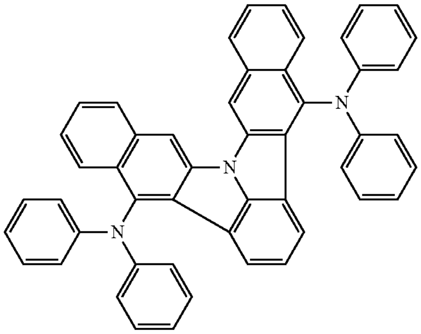
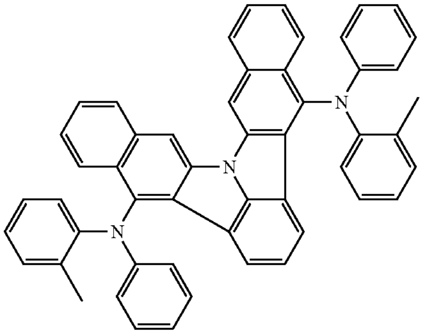
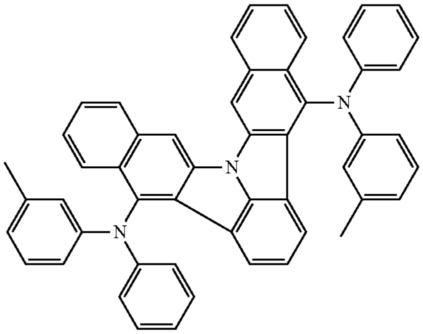
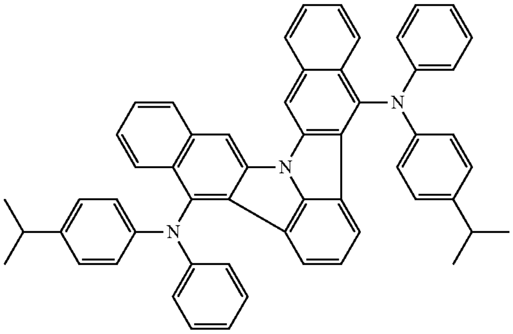

-continued
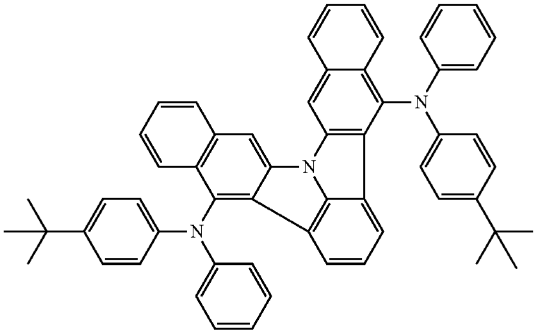
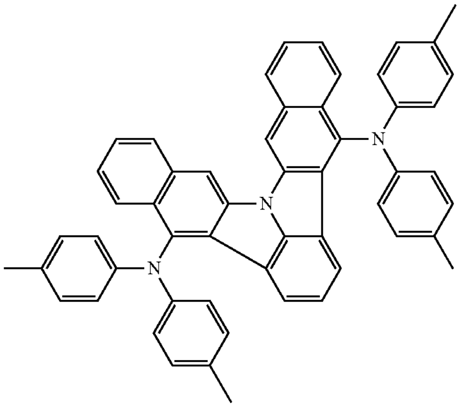
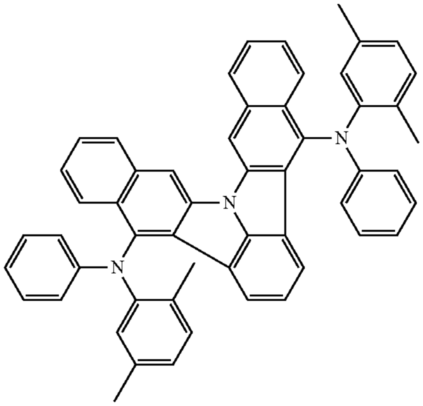
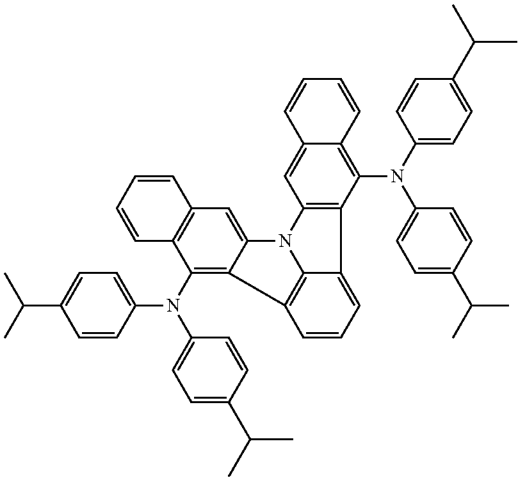
-continued
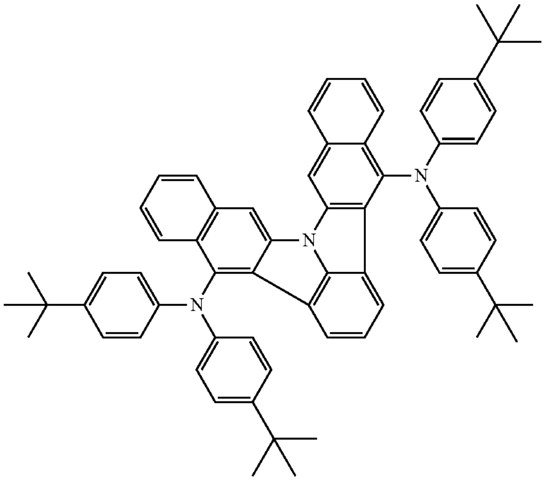
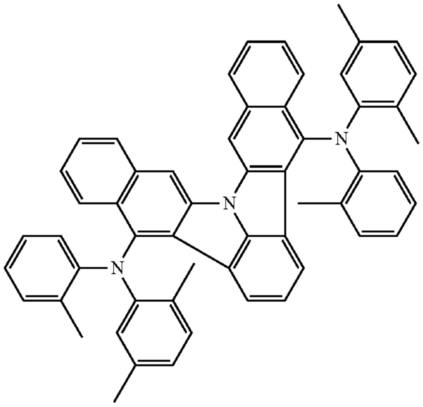
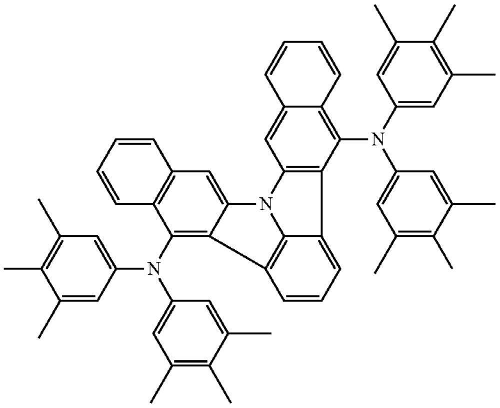

-continued
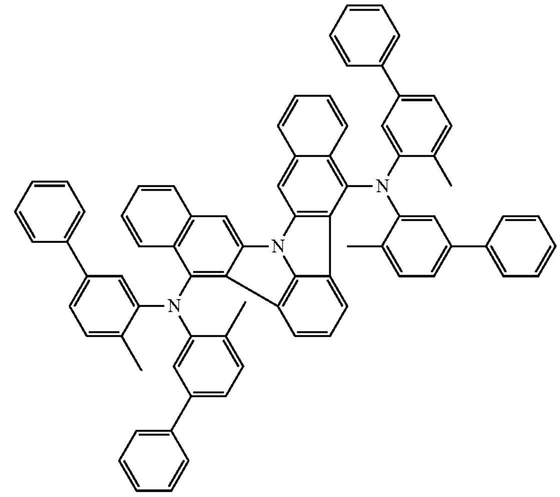
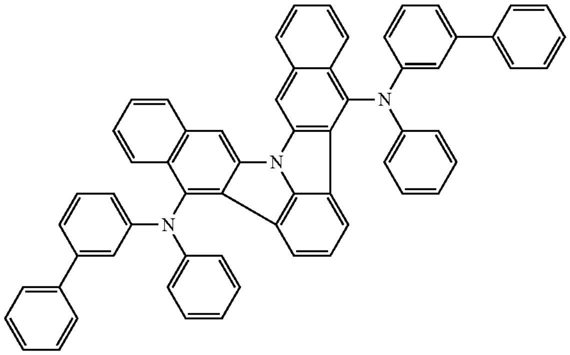
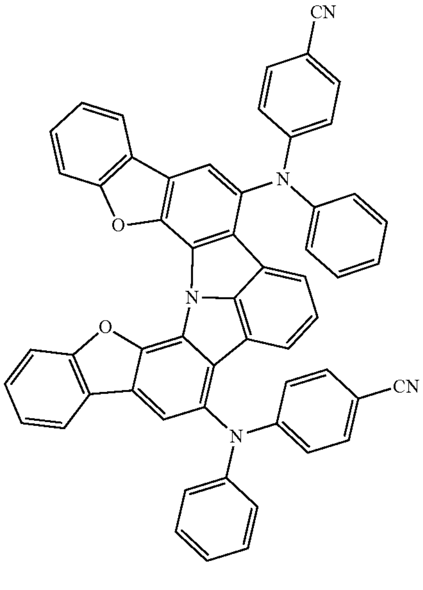
-continued
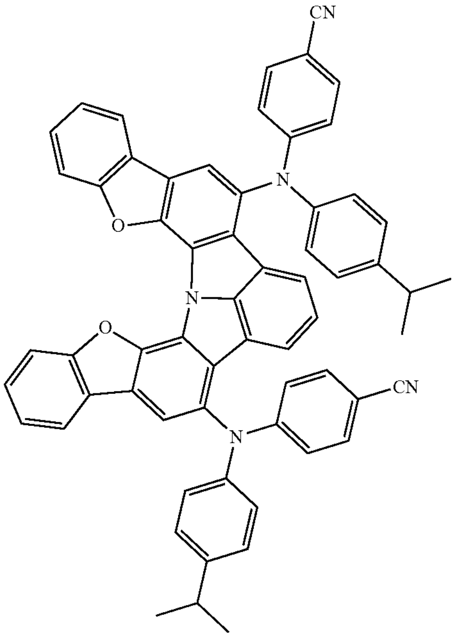
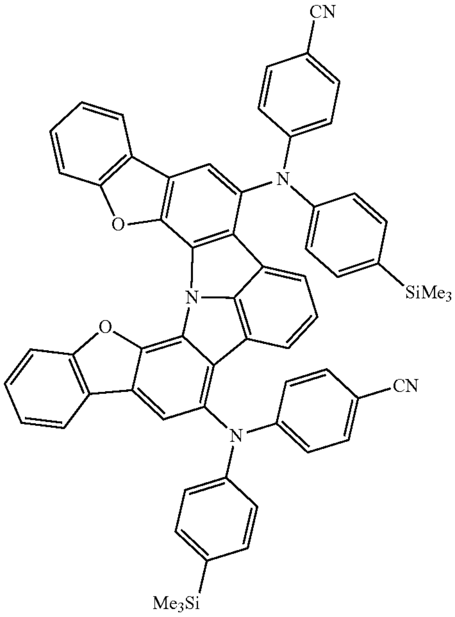

-continued
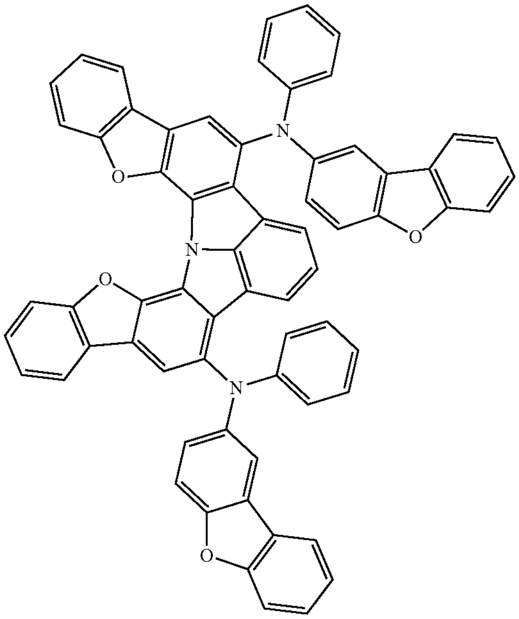
-continued
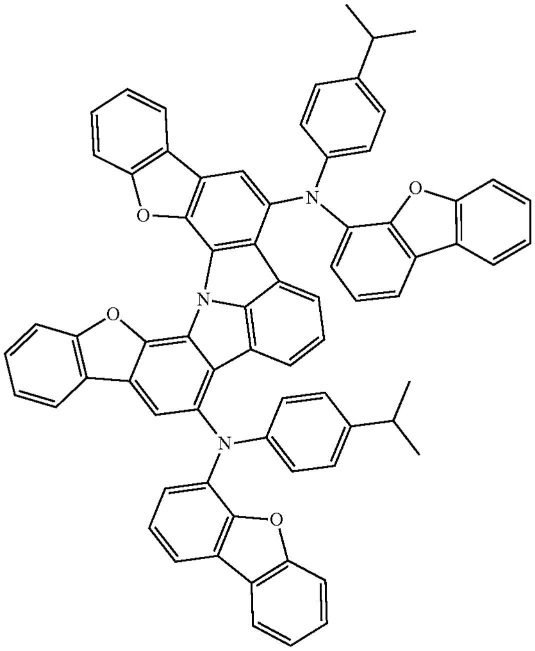
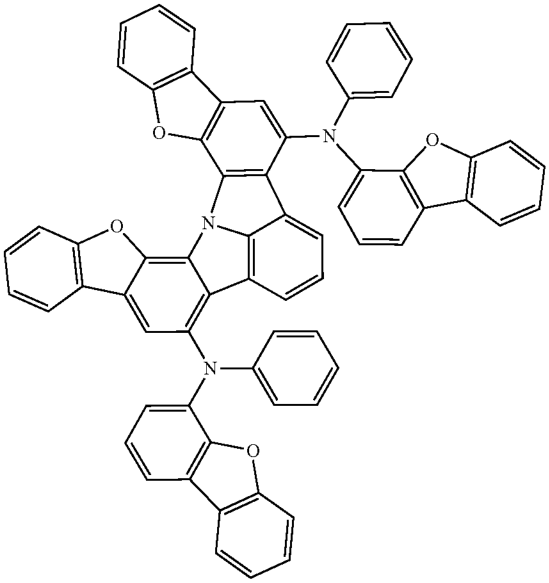
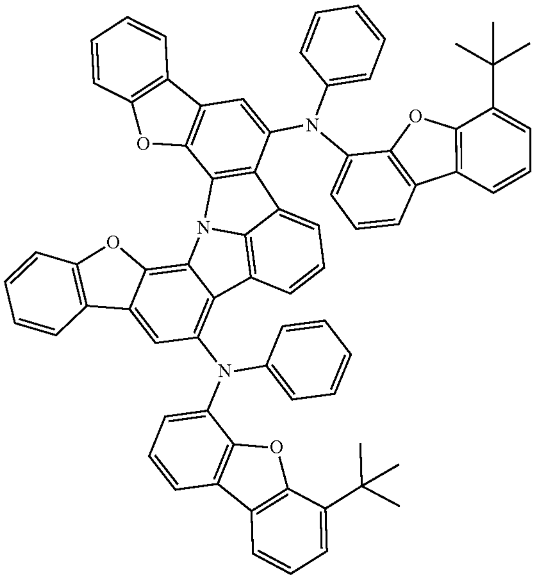

-continued
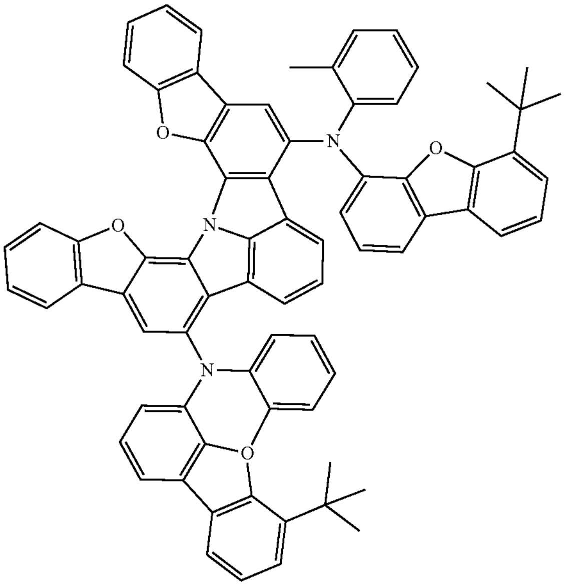
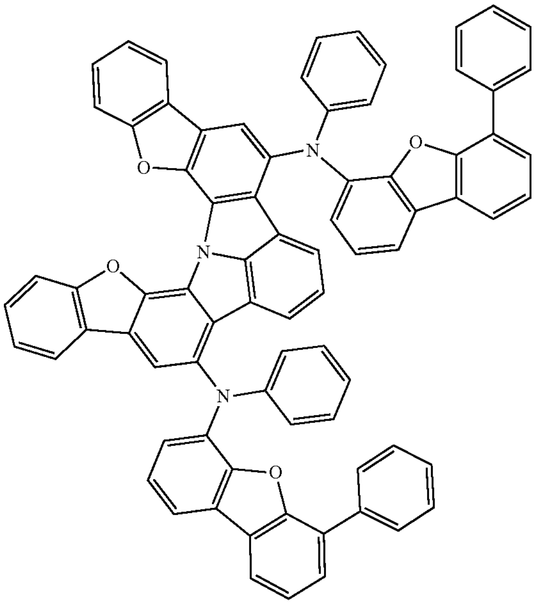
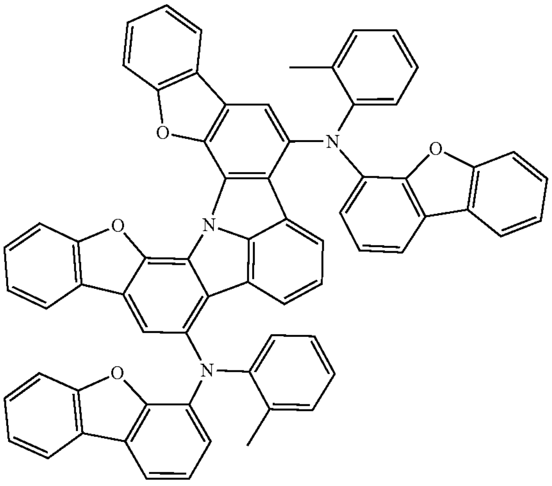
-continued
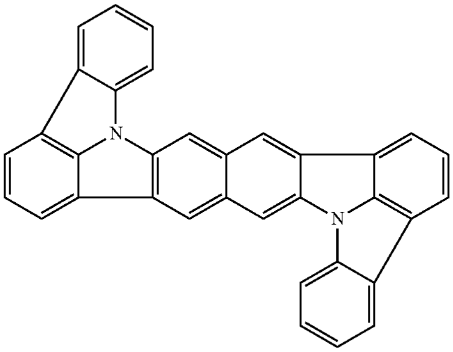
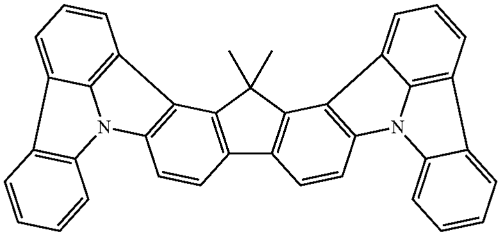
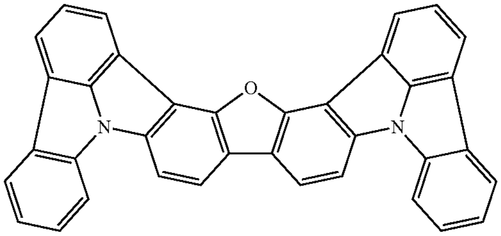
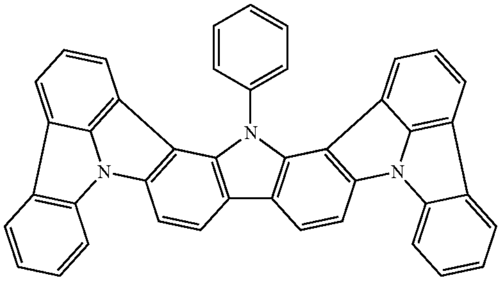
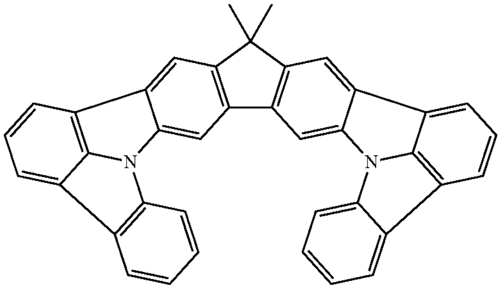
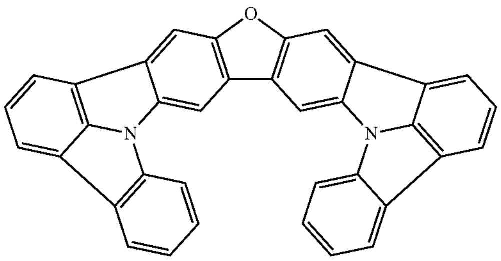

-continued

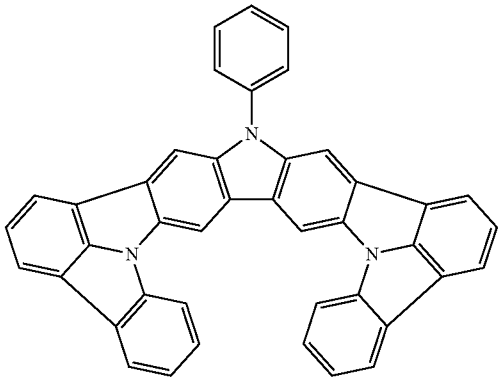

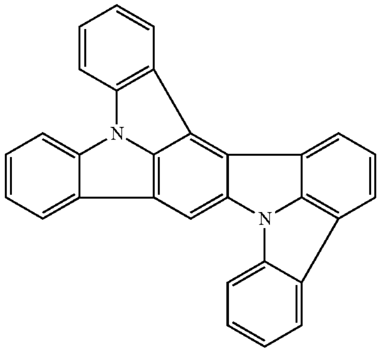

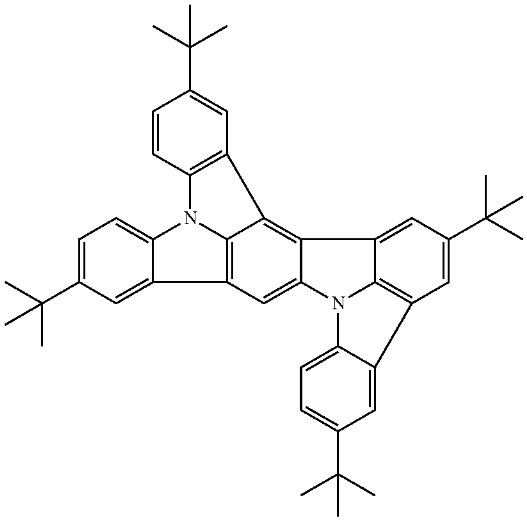

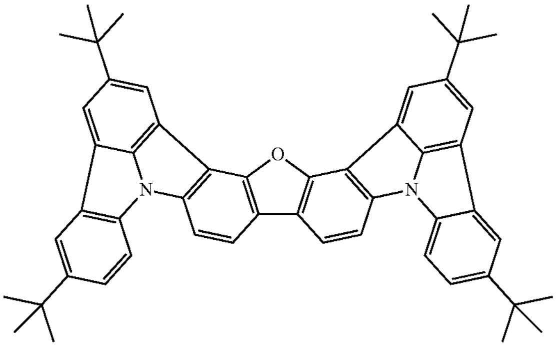

(Compound Represented by the Formula (41))

A compound represented by the formula (41) will be described.

(41)

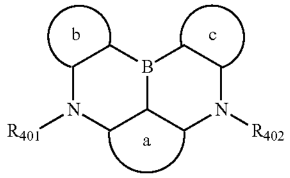

In the formula (41), a ring a, a ring b and a ring c are independently a substituted or unsubstituted aromatic hydrocarbon ring including 6 to 50 ring carbon atoms, or a substituted or unsubstituted heterocyclic ring including 5 to 50 ring atoms.

$R_{401}$ and $R_{402}$ independently form a substituted or unsubstituted heterocyclic ring by bonding with the ring a, the ring b, or the ring c, or do not form a substituted or unsubstituted heterocyclic ring.

$R_{401}$ and $R_{402}$ which do not form the substituted or unsubstituted heterocyclic ring are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

The ring a, the ring b, and the ring c are a ring (a substituted or unsubstituted aromatic hydrocarbon ring including 6 to 50 ring carbon atoms, or a substituted or unsubstituted heterocyclic ring including 5 to 50 ring atoms) fused with a central fused bicyclic structure containing a B atom and two N atoms in the formula (41).

The "aromatic hydrocarbon ring" for the ring a, the ring b, and the ring c has the same structure as the compound in which a hydrogen atom is introduced into the "aryl group" described above. The "aromatic hydrocarbon ring" for the ring a contains three carbon atoms constituting the central fused bicyclic structure in the formula (41) as ring atoms. The "aromatic hydrocarbon ring" for the ring band the ring c contains two carbon atoms constituting the central fused bicyclic structure in the formula (41) as ring atoms. Specific examples of the "substituted or unsubstituted aromatic hydrocarbon ring including 6 to 50 ring carbon atoms" include compounds in which the hydrogen atom is introduced into the "aryl group" described in the specific example group G1, and the like.

The "heterocyclic ring" for the ring a, the ring b, and the ring c has the same structure as the compound in which a hydrogen atom is introduced into the "heterocyclic group" described above. The "heterocyclic ring" for the ring a contains three carbon atoms constituting the central fused bicyclic structure in the formula (41) as ring atoms. The "heterocyclic ring" for the ring band the ring c contains two carbon atoms constituting the central fused bicyclic structure of the formula (41) as ring atoms. Specific examples of the "substituted or unsubstituted heterocyclic ring including 5 to 50 ring atoms" include compounds in which the hydrogen atom is introduced into the "heterocyclic group" described in the specific example group G2, and the like.

$R_{401}$ and $R_{402}$ may independently form a substituted or unsubstituted heterocyclic ring by bonding with the ring a, the ring b, or the ring c. The heterocyclic ring in this case contains the nitrogen atom constituting the central fused bicyclic structure in the formula (41). The heterocyclic ring in this case may contain a hetero atom other than the nitrogen atom. The expression "$R_{401}$ and $R_{402}$ are bonded with the ring a, the ring b, and the ring c" specifically means that the atoms forming the ring a, the ring b, or the ring c are bonded with the atoms forming $R_{401}$ and $R_{402}$. For example, $R_{401}$ maybe bonded with the ring a to forma fused bicyclic (or fused tricyclic or more polycyclic) nitrogen-containing heterocyclic ring in which the ring containing $R_{401}$ is fused with the ring a. Specific examples of the nitrogen-containing heterocyclic ring include a compound corresponding to fused bicyclic or more polycyclic heterocyclic group containing nitrogen among those in the specific example group G2.

The same applies when $R_{401}$ is bonded with the ring b, $R_{402}$ is bonded with the ring a, and $R_{402}$ is bonded with the ring c.

In one embodiment, the ring a, the ring b, and the ring c in the formula (41) are independently a substituted or unsubstituted aromatic hydrocarbon ring including 6 to 50 ring carbon atoms.

In one embodiment, the ring a, the ring b, and the ring c in the formula (41) are independently a substituted or unsubstituted benzene ring or a substituted or unsubstituted naphthalene ring.

In one embodiment, $R_{401}$ and $R_{402}$ in the formula (41) are independently a substituted or unsubstituted aryl group including 6 to 50 ring carbon atoms, or a substituted or unsubstituted monovalent heterocyclic group including 5 to 50 ring atoms, and preferably a substituted or unsubstituted aryl group including 6 to 50 ring carbon atoms.

In one embodiment, the compound represented by the formula (41) is a compound represented by the following formula (42).

(42)

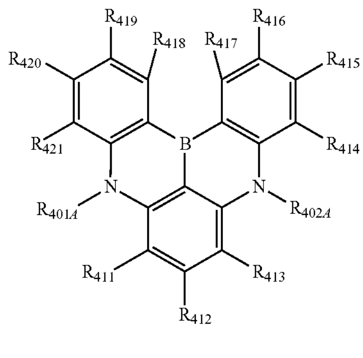

In the formula (42), $R_{401A}$ forms a substituted or unsubstituted heterocyclic ring by bonding with one or more selected from the group consisting of $R_{411}$ and $R_{421}$, or does not forma substituted or unsubstituted heterocyclic ring. $R_{402A}$ forms a substituted or unsubstituted heterocyclic ring by bonding with one or more selected from the group consisting of $R_{413}$ and $R_{414}$, or does not form a substituted or unsubstituted heterocyclic ring.

$R_{401A}$ and $R_{402A}$ which do not form the substituted or unsubstituted heterocyclic ring are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

One or more sets of adjacent two or more of $R_{411}$ to $R_{421}$ form a substituted or unsubstituted, saturated or unsaturated ring by bonding with each other, or do not form a substituted or unsubstituted, saturated or unsaturated ring.

$R_{411}$ to $R_{421}$ which do not form the substituted or unsubstituted heterocyclic ring or the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (21).

$R_{401A}$ and $R_{402A}$ in the formula (42) are groups corresponding to $R_{401}$ and $R_{402}$ in the formula (41).

For example, $R_{401A}$ and $R_{411}$ may be bonded with each other to form a fused bicyclic (or fused tricyclic or more polycyclic) nitrogen-containing heterocyclic ring in which a benzene ring corresponding to the ring a is fused with a ring containing them. Specific examples of the nitrogen-containing heterocyclic ring include a compound corresponding to fused bicyclic or more polycyclic heterocyclic groups containing nitrogen among those in the specific example group G2. The same applies to the case with which $R_{401A}$ and $R_{412}$ are bonded, the case with which $R_{402A}$ and $R_{413}$ are bonded, and the case with which $R_{402A}$ and $R_{414}$ are bonded.

One or more sets of adjacent two or more of $R_{411}$ to $R_{421}$ may form a substituted or unsubstituted, saturated or unsaturated ring by bonding with each other. For example, a structure in which a benzene ring, an indole ring, a pyrrole ring, a benzofuran ring, a benzothiophene ring, and the like are fused with respect to a 6-membered ring with which $R_{411}$ and $R_{412}$ are bonded may be formed, and the formed fused ring is a naphthalene ring, a carbazole ring, an indole ring, a dibenzofuran ring, or a dibenzothiophene ring.

In one embodiment, $R_{411}$ to $R_{421}$ which do not contribute to ring formation are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{411}$ to $R_{421}$ which do not contribute to ring formation are independently a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{411}$ to $R_{421}$ which do not contribute to ring formation are independently a hydrogen atom, or a substituted or unsubstituted alkyl group including 1 to 50 carbon atoms.

In one embodiment, $R_{411}$ to $R_{421}$ which do not contribute to ring formation are independently a hydrogen atom, or a substituted or unsubstituted alkyl group including 1 to 50 carbon atoms, and at least one of $R_{411}$ to $R_{421}$ is a substituted or unsubstituted alkyl group including 1 to 50 carbon atoms.

In one embodiment, the compound represented by the formula (42) is a compound represented by the following formula (43).

(43)

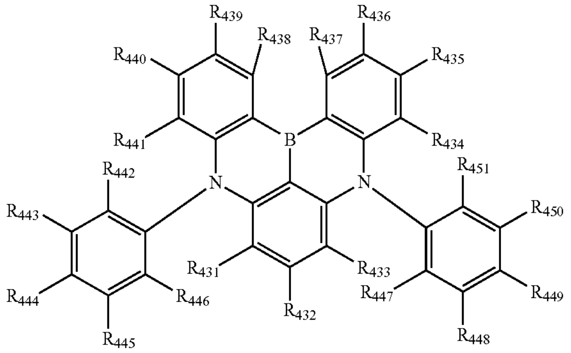

In the formula (43), $R_{431}$ forms a substituted or unsubstituted heterocyclic ring by bonding with $R_{446}$, or does not form a substituted or unsubstituted heterocyclic ring. $R_{433}$ forms a substituted or unsubstituted heterocyclic ring by bonding with $R_{447}$, or does not forma substituted or unsubstituted heterocyclic ring. $R_{434}$ forms a substituted or unsubstituted heterocyclic ring by bonding with $R_{451}$, or does not form a substituted or unsubstituted heterocyclic ring. $R_{441}$ forms a substituted or unsubstituted heterocyclic ring by bonding with $R_{442}$, or does not forma substituted or unsubstituted heterocyclic ring.

One or more sets of adjacent two or more of $R_{431}$ to $R_{451}$ form a substituted or unsubstituted, saturated or unsaturated ring by bonding with each other, or do not form a substituted or unsubstituted, saturated or unsaturated ring.

$R_{431}$ to $R_{451}$ which do not form the substituted or unsubstituted heterocyclic ring or the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (21).

$R_{431}$ may form a substituted or unsubstituted heterocyclic ring by bonding with $R_{446}$. For example, $R_{431}$ and $R_{446}$ may be bonded with each other to form a fused tricyclic or more polycyclic nitrogen-containing heterocyclic ring in which a benzene ring with which $R_{446}$ is bonded, a ring containing N, and a benzene ring corresponding to the ring a are fused. Specific examples of the nitrogen-containing heterocyclic ring include a compound corresponding to a fused tricyclic or more polycyclic heterocyclic group containing nitrogen among those in the specific example group G2. The same applies to the case with which $R_{433}$ and $R_{447}$ are bonded, the case with which $R_{434}$ and $R_{451}$ are bonded, and the case with which $R_{441}$ and $R_{442}$ are bonded.

In one embodiment, $R_{431}$ to $R_{451}$ which do not contribute to ring formation are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{431}$ to $R_{451}$ which do not contribute to ring formation are independently a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{431}$ to $R_{451}$ which do not contribute to ring formation are independently a hydrogen atom, or a substituted or unsubstituted alkyl group including 1 to 50 carbon atoms.

In one embodiment, $R_{431}$ to $R_{451}$ which do not contribute to ring formation are independently a hydrogen atom, or a substituted or unsubstituted alkyl group including 1 to 50 carbon atoms, and at least one of $R_{431}$ to $R_{451}$ is a substituted or unsubstituted alkyl group including 1 to 50 carbon atoms.

In one embodiment, the compound represented by the formula (43) is a compound represented by the following formula (43A).

(43A)

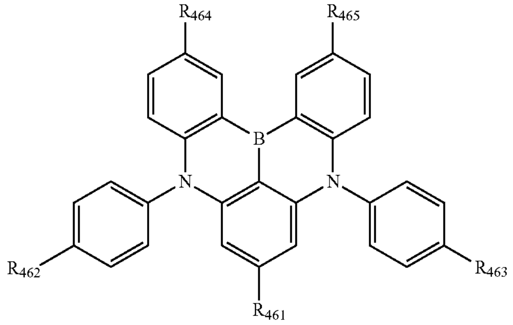

In the formula (43A), $R_{461}$ is a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

$R_{462}$ to $R_{465}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

In one embodiment, $R_{461}$ to $R_{465}$ are independently a substituted or unsubstituted alkyl group including 1 to 50 carbon atoms, or a substituted or unsubstituted aryl group including 6 to 50 ring carbon atoms.

In one embodiment, $R_{461}$ to $R_{465}$ are independently a substituted or unsubstituted alkyl group including 1 to 50 carbon atoms.

In one embodiment, the compound represented by the formula (43) is a compound represented by the following formula (43B).

(43B)

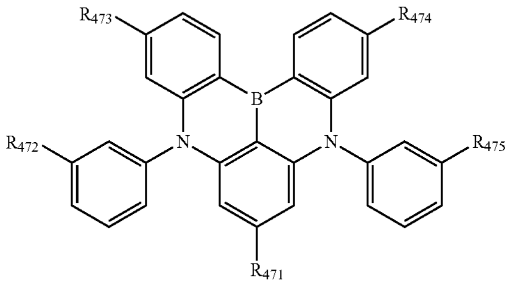

In the formula (43B), $R_{471}$ and $R_{472}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$N(R_{906})(R_{907})$, or a substituted or unsubstituted aryl group including 6 to 50 ring carbon atoms.

$R_{473}$ to $R_{475}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$N(R_{906})(R_{907})$, or a substituted or unsubstituted aryl group including 6 to 50 ring carbon atoms.

$R_{906}$ and $R_{9007}$ are as defined in the formula (21).

In one embodiment, the compound represented by the formula (43) is a compound represented by the following formula (43B').

(43B')

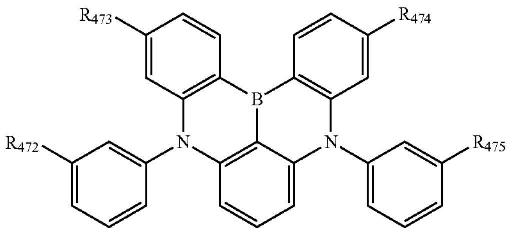

In the formula (43B'), $R_{472}$ to $R_{475}$ are as defined in the formula (43B).

In one embodiment, at least one of $R_{471}$ to $R_{475}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$N(R_{906})(R_{907})$, or a substituted or unsubstituted aryl group including 6 to 50 ring carbon atoms.

In one embodiment, $R_{472}$ is a hydrogen atom, a substituted or unsubstituted alkyl group including 1 to 50 carbon atoms, —$N(R_{906})(R_{907})$, or a substituted or unsubstituted aryl group including 6 to 50 ring carbon atoms.

$R_{471}$ and $R_{473}$ to $R_{475}$ are independently a substituted or unsubstituted alkyl group including 1 to 50 carbon atoms, —$N(R_{906})(R_{907})$, or a substituted or unsubstituted aryl group including 6 to 50 ring carbon atoms.

In one embodiment, the compound represented by the formula (43) is a compound represented by the following formula (43C).

(43C)

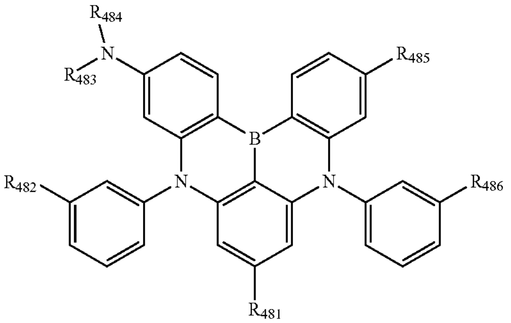

In the formula (43C), $R_{481}$ and $R_{482}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

$R_{483}$ to $R_{486}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

In one embodiment, the compound represented by the formula (43) is a compound represented by the following formula (43C').

(43C')

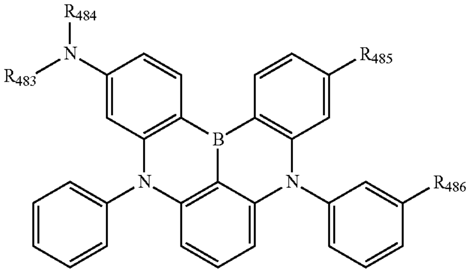

In the formula (43C'), $R_{483}$ to $R_{486}$ are as defined in the formula (43C).

In one embodiment, $R_{481}$ to $R_{486}$ are independently a substituted or unsubstituted alkyl group including 1 to 50 carbon atoms, or a substituted or unsubstituted aryl group including 6 to 50 ring carbon atoms.

In one embodiment, $R_{481}$ to $R_{486}$ are independently a substituted or unsubstituted aryl group including 6 to 50 ring carbon atoms.

The compound represented by the formula (41) can be prepared, for example, by first bonding a ring a, a ring b, and a ring c with linking groups (a group containing N—$R_1$ and a group containing N—$R_2$) (first reaction) to obtain an intermediate, and by bonding the ring a, the ring b, and the ring c with a linking group (a group containing B) (second reaction) to obtain a final product. In the first reaction, an amination reaction such as a Buchwald-Hartwig reaction or the like can be applied. In the second reaction, a tandem hetero-Friedel-Crafts reaction or the like can be applied.

Hereinafter, specific examples of the compound represented by the formula (41) will be described, but are illustrative only, and the compound represented by the formula (41) is not limited to the following specific examples. In the following specific examples, "Me" means a methyl group, and "t-Bu" means a tert-butyl group.

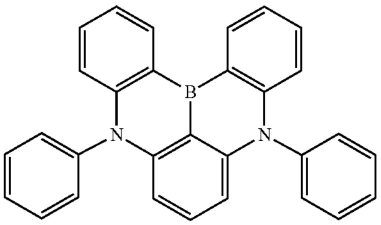

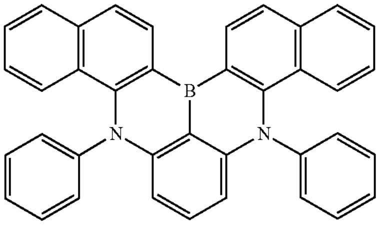

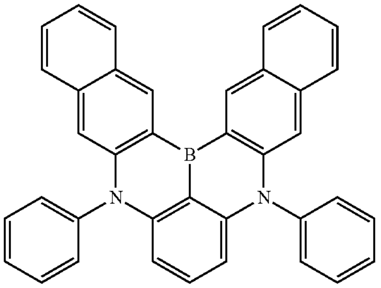

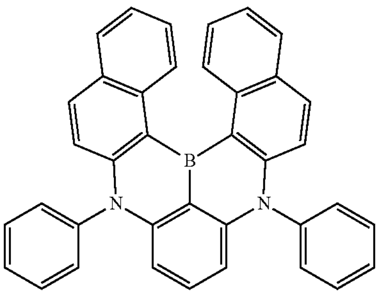

-continued
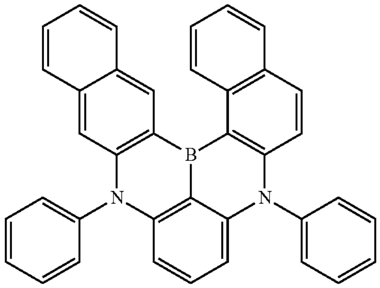
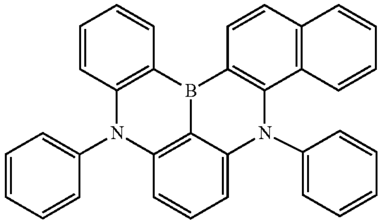
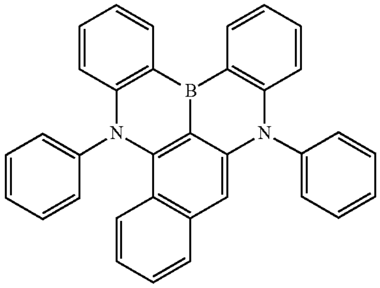
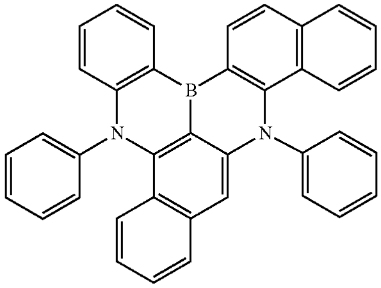
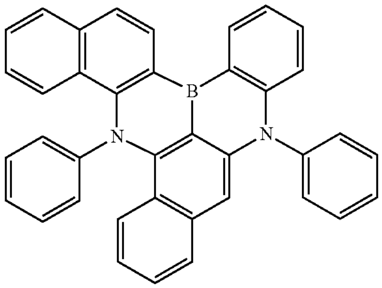
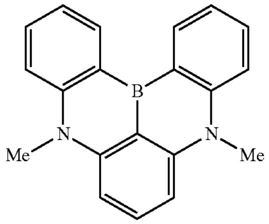
-continued
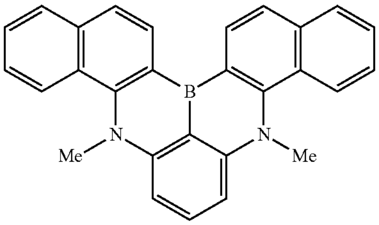
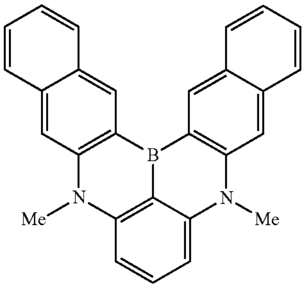
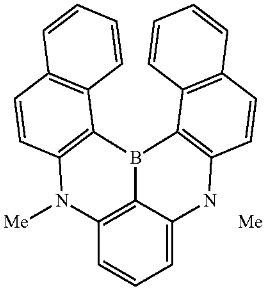
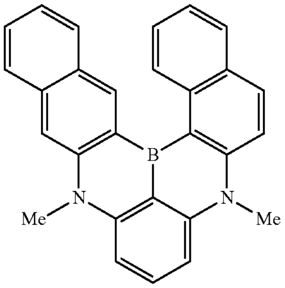
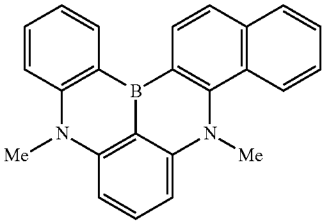
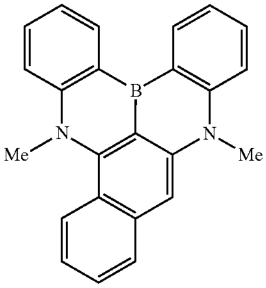

-continued
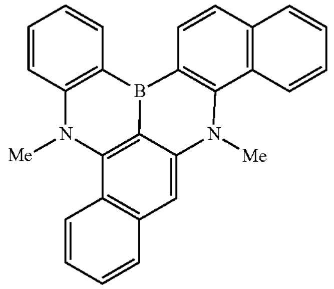
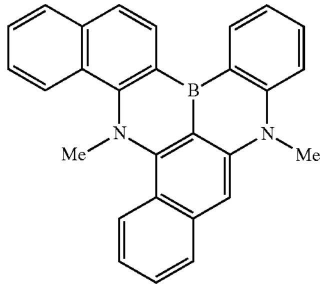
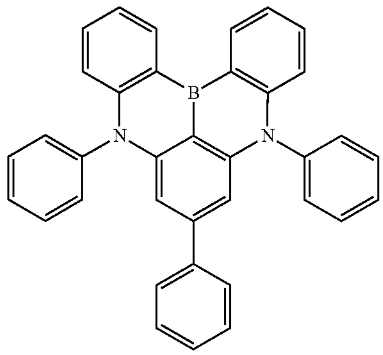
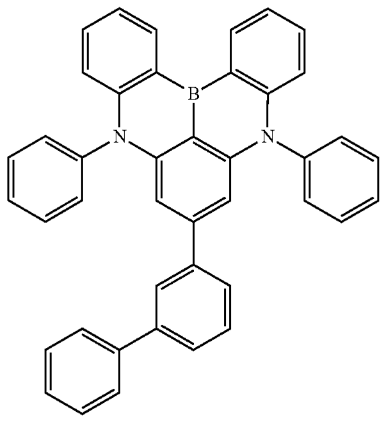
-continued
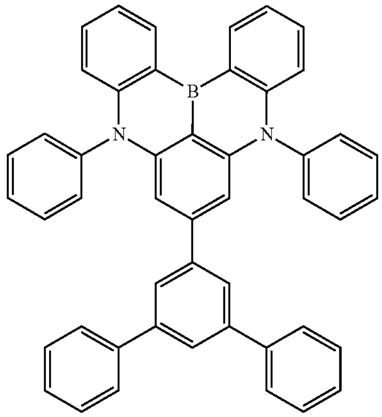
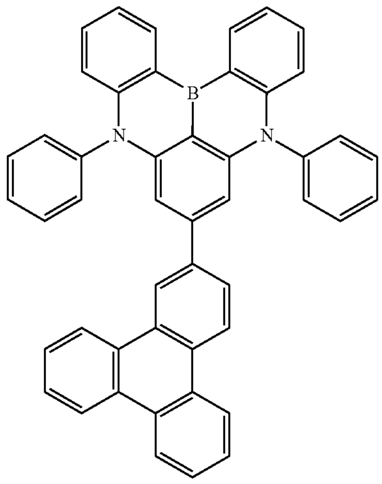
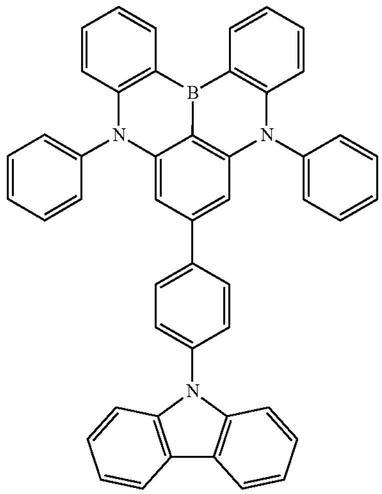

-continued
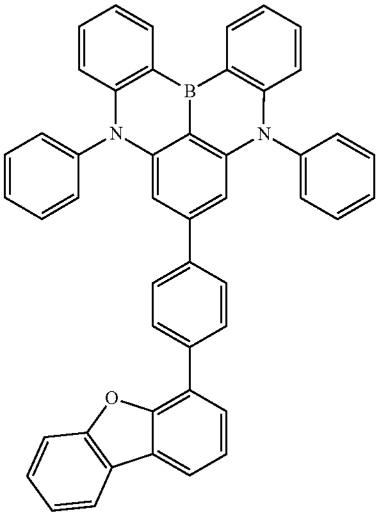
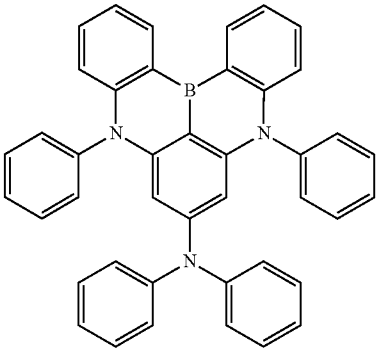
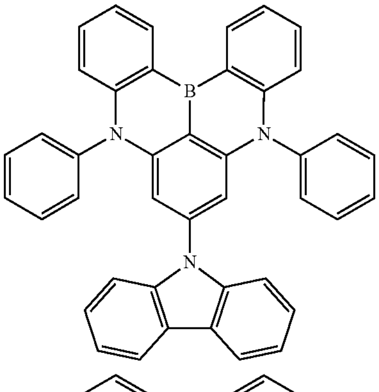
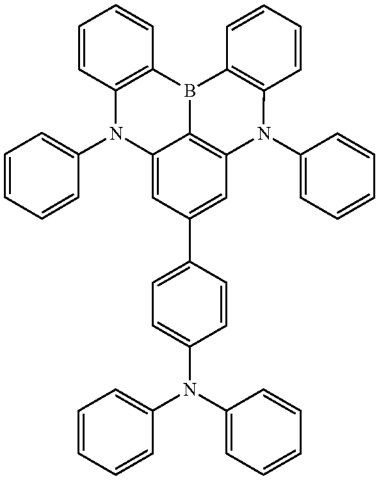
-continued
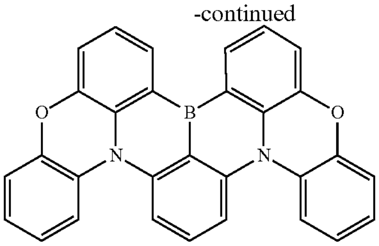
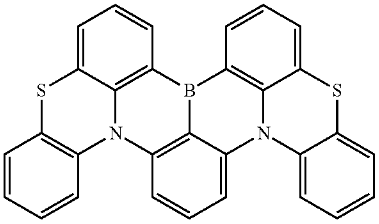
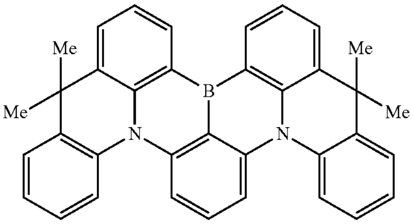
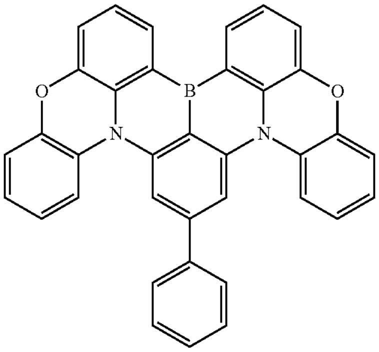
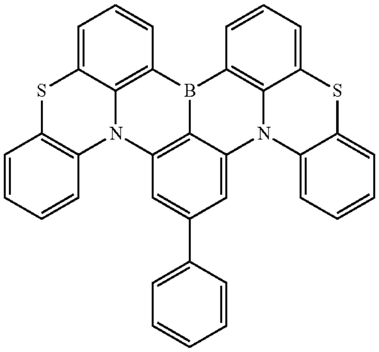
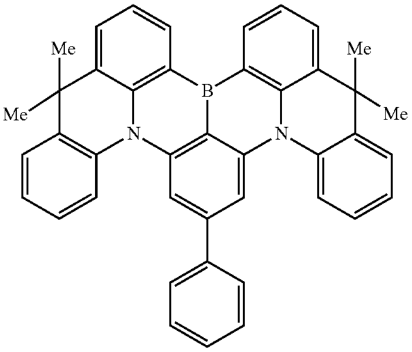

-continued
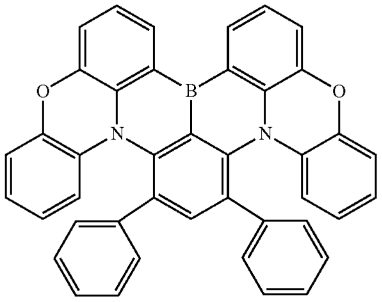
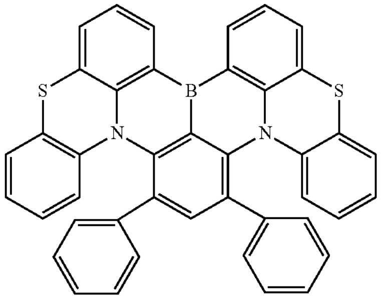
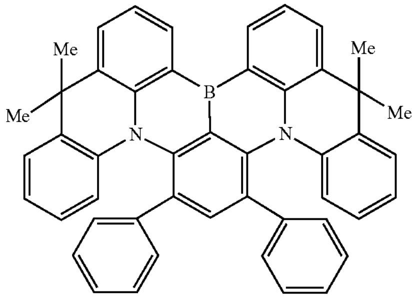
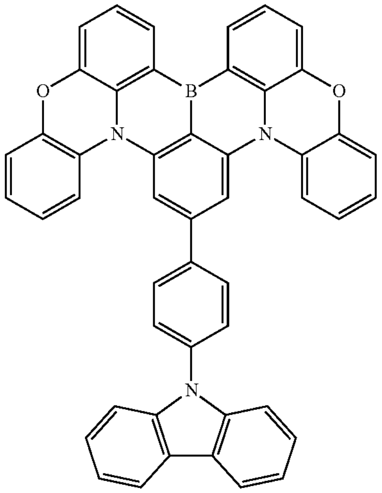
-continued
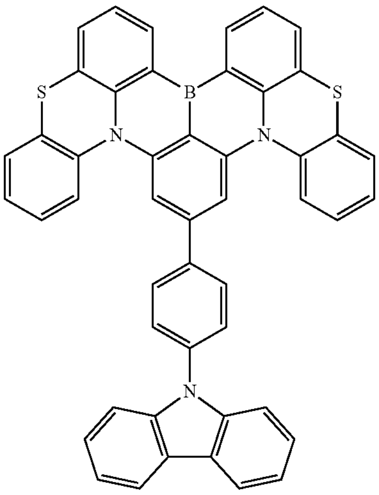
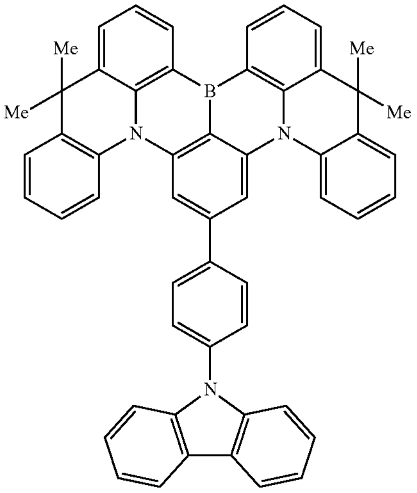
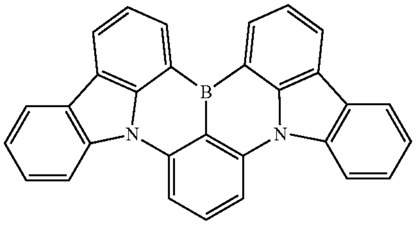
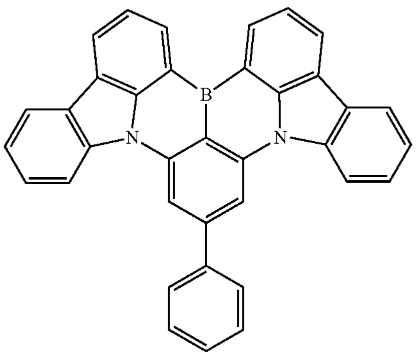

-continued
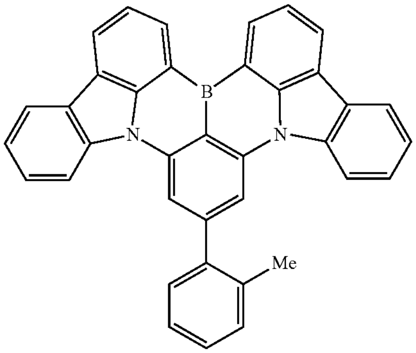
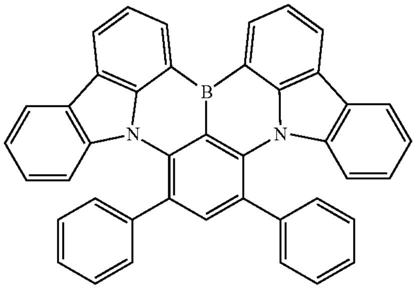
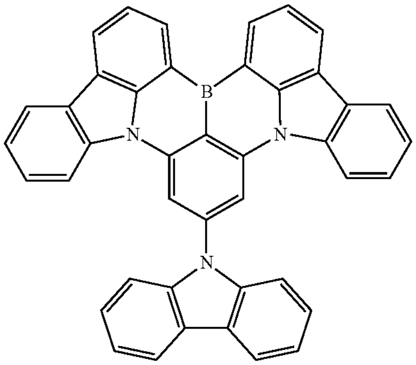
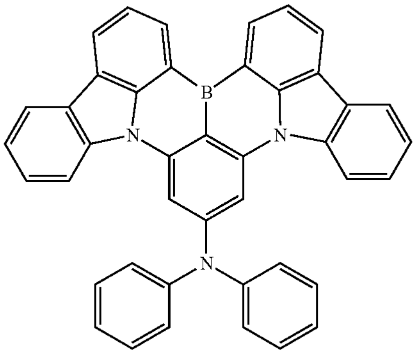
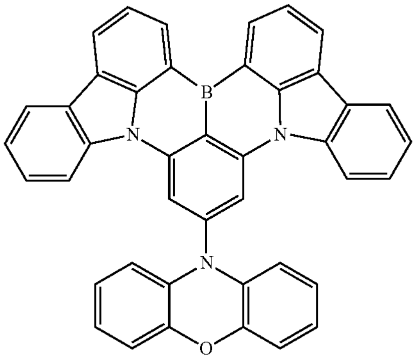
-continued
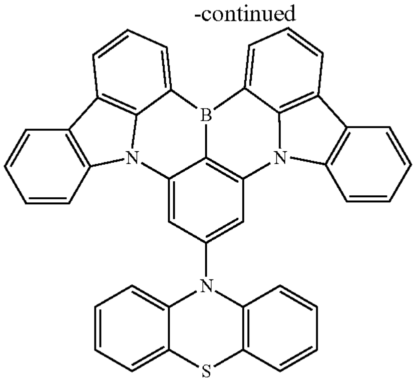
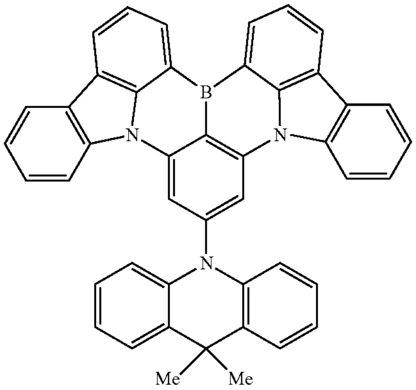
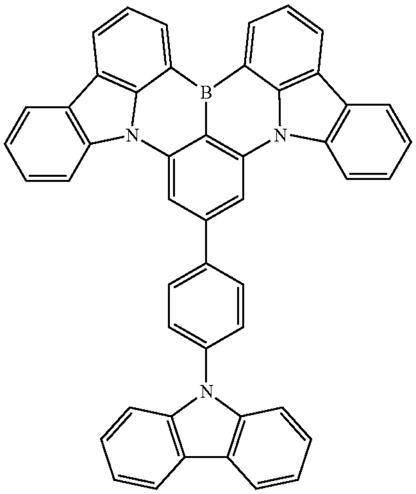
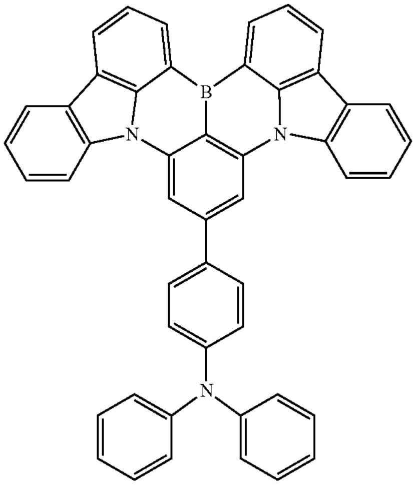

-continued
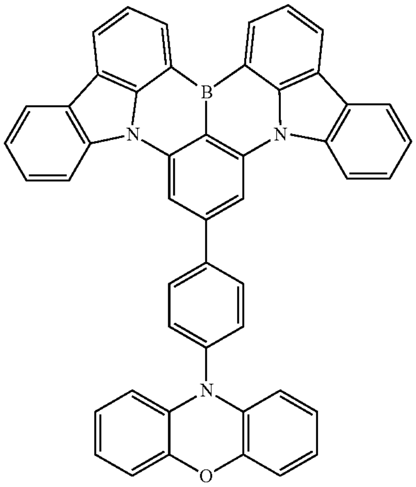
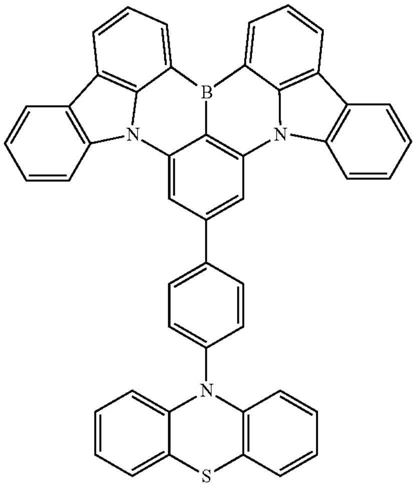
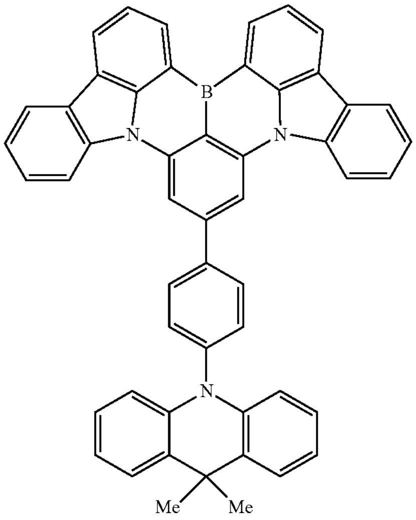
-continued
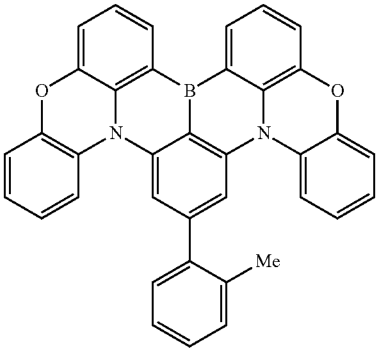
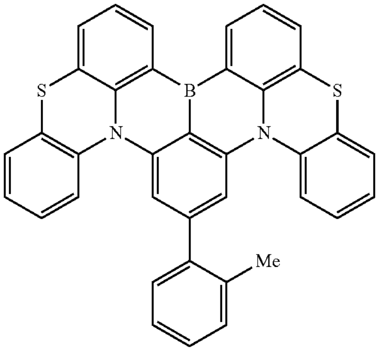
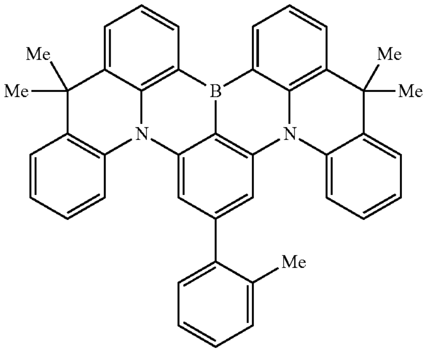
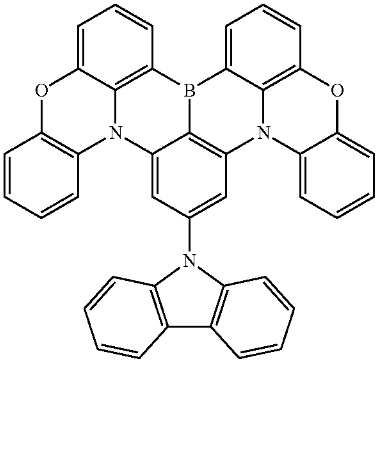

-continued
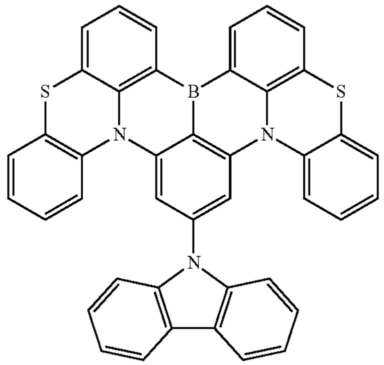
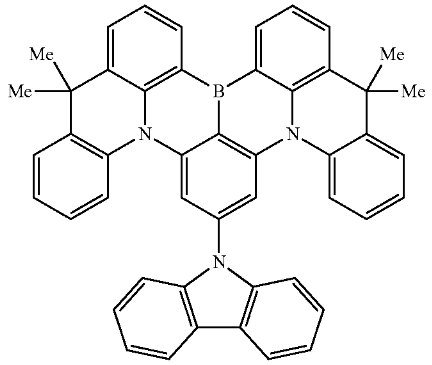
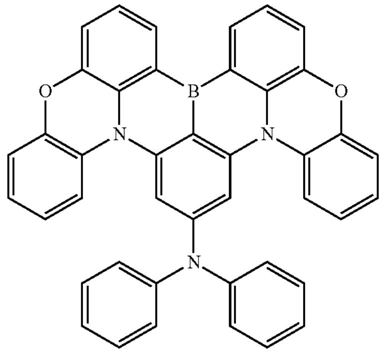
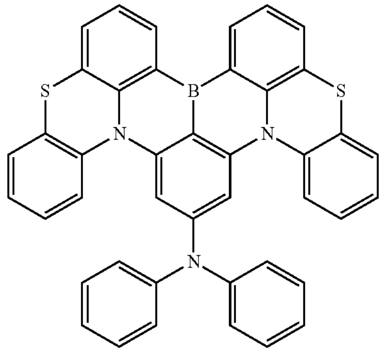
-continued
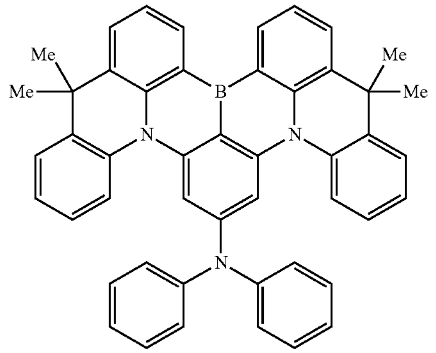
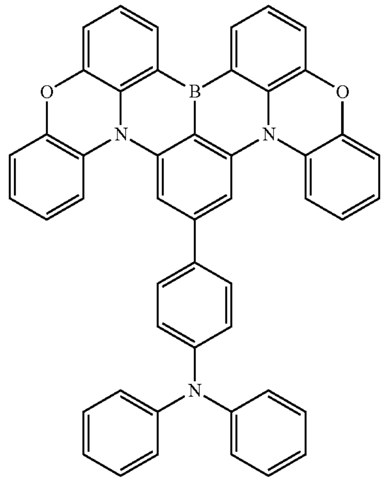
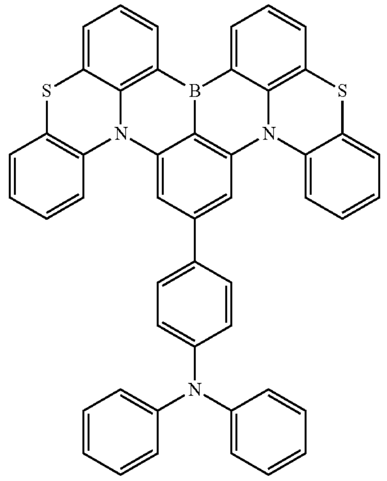

-continued
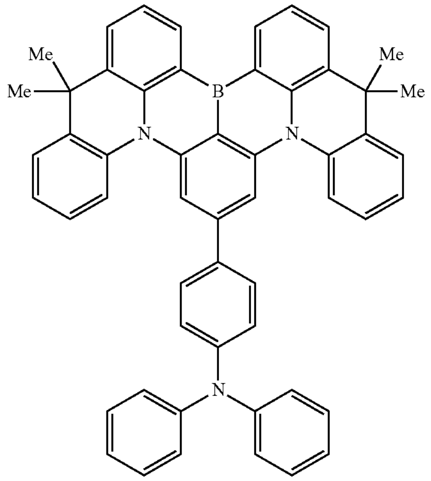
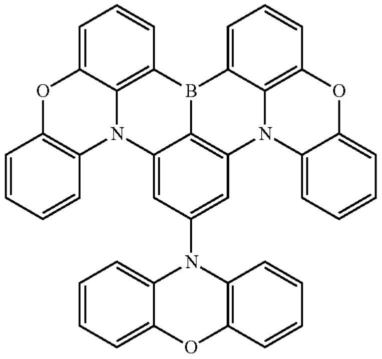
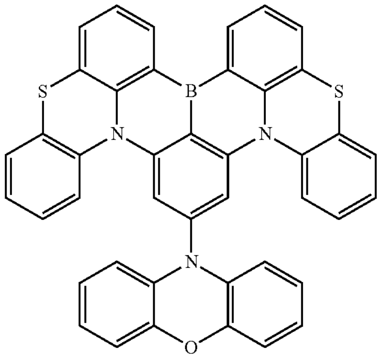
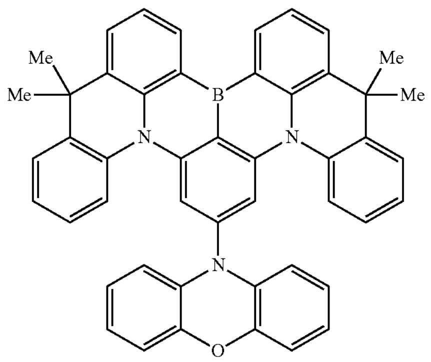
-continued
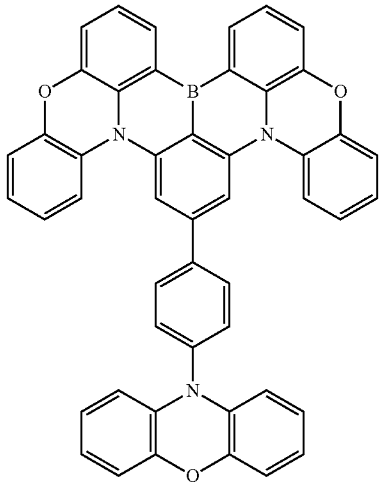
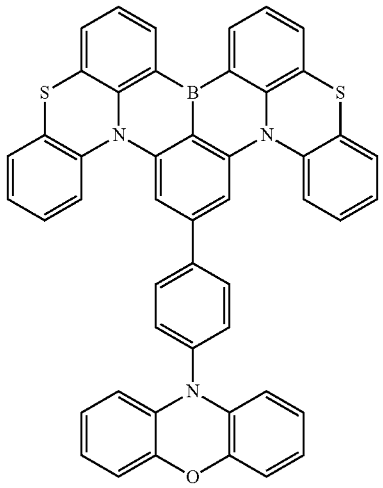
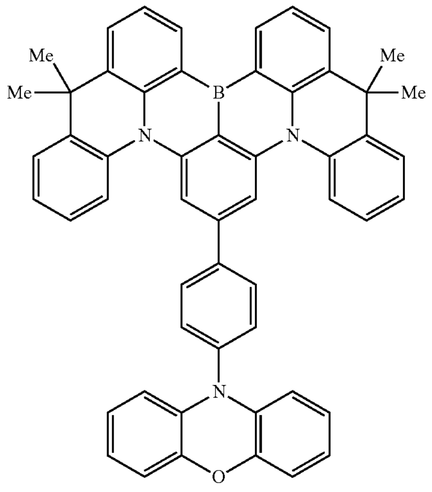

-continued
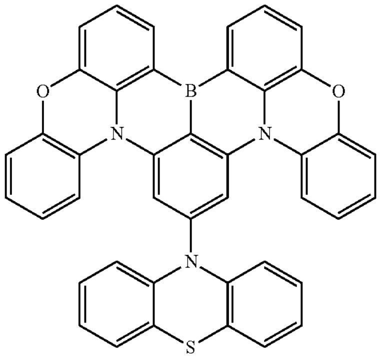
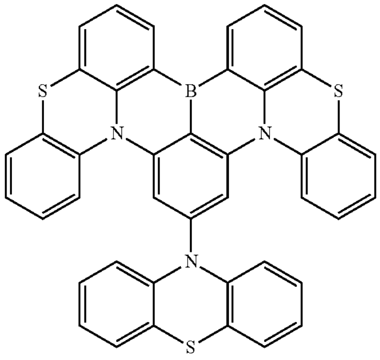
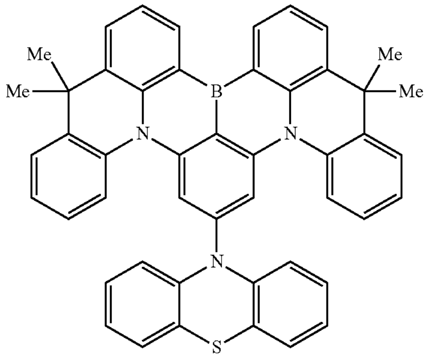
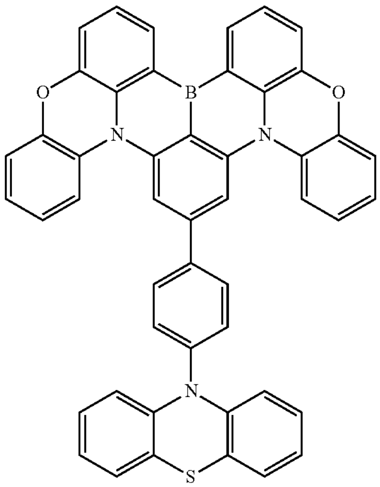
-continued
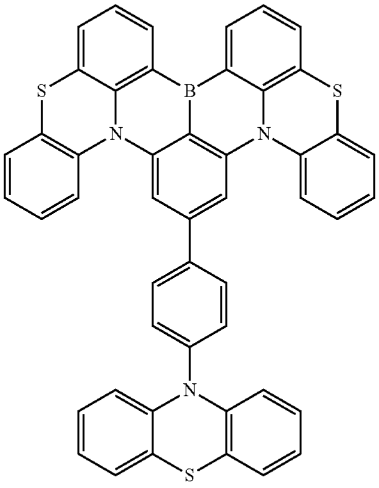
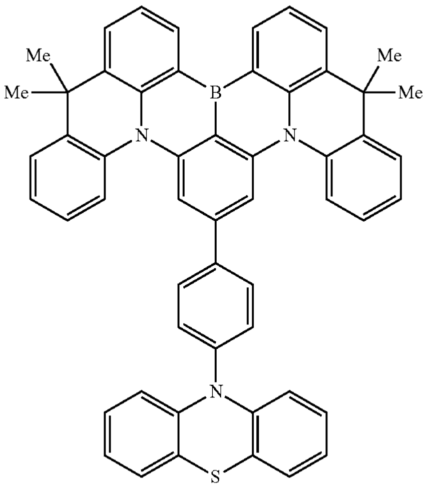
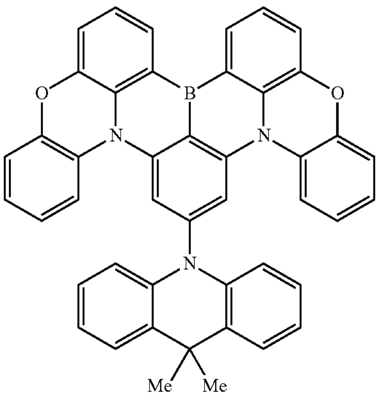

-continued
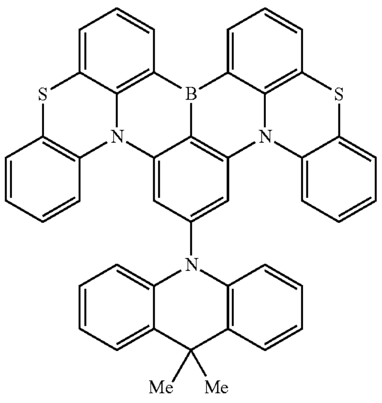
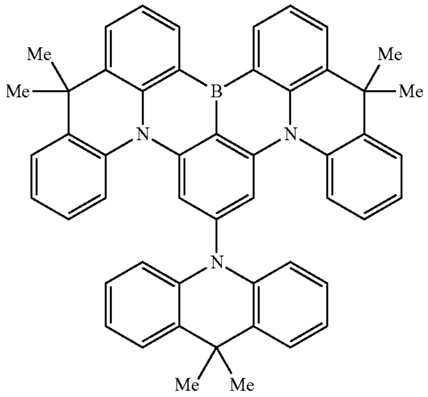
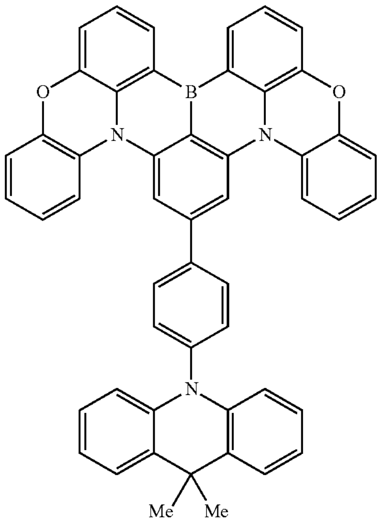
-continued
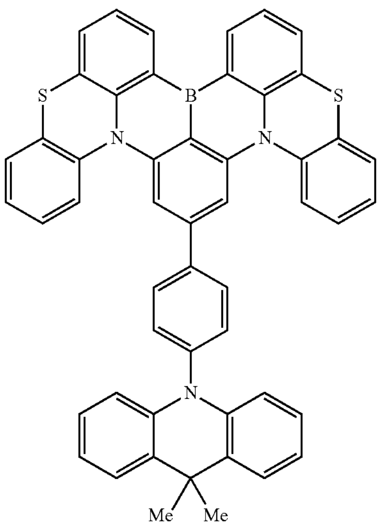
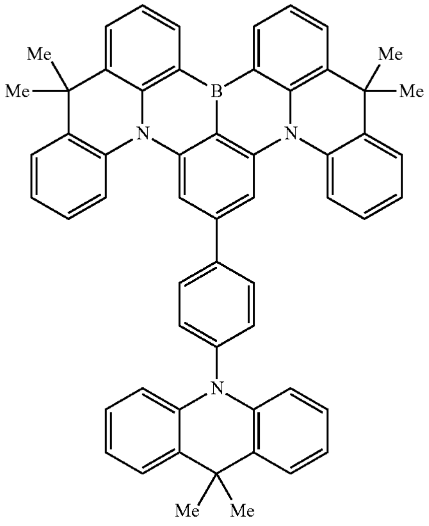 [SMILES: CC1(C)c2ccccc2N(c2ccc(-c3cc4c5c(c3)N3c6ccccc6C(C)(C)c6cccc(c63)B5c3cccc5c3N4c3ccccc3C5(C)C)cc2)c2ccccc21]
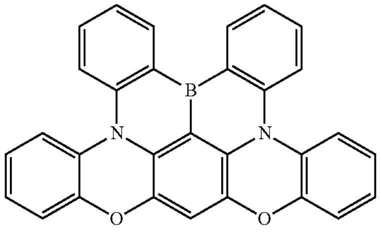
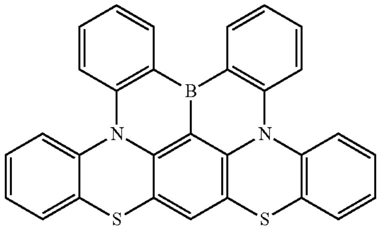

-continued
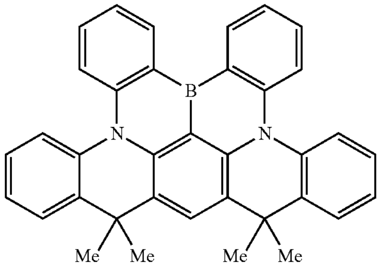
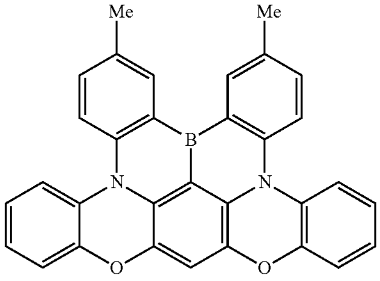
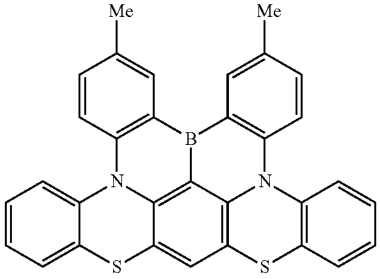
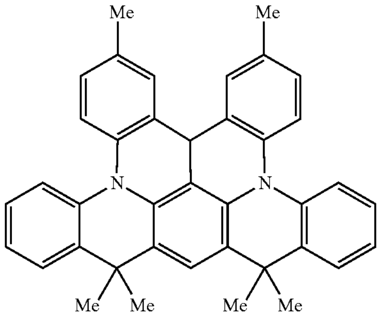
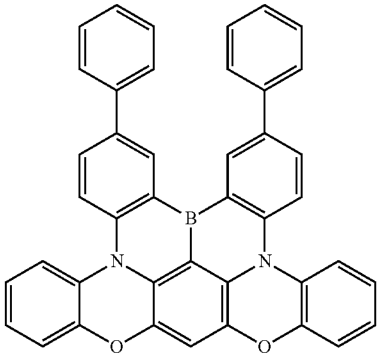
-continued
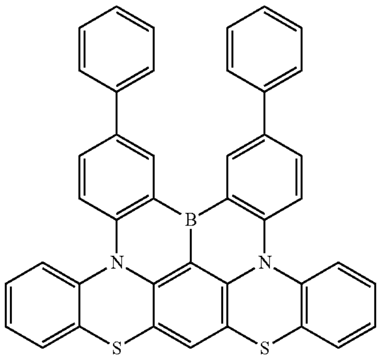
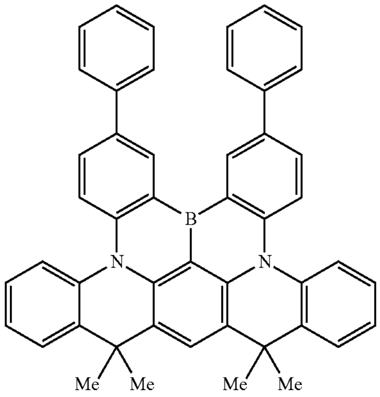
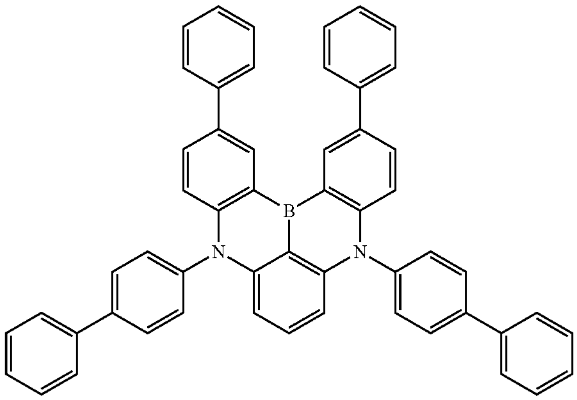
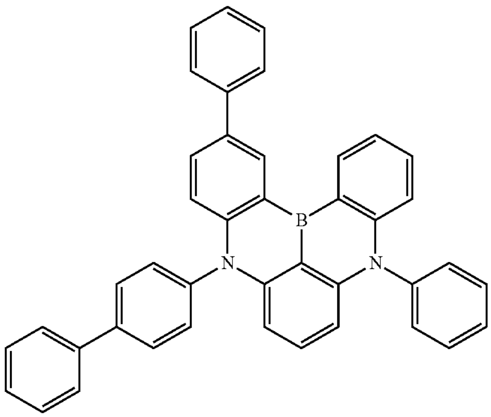

-continued
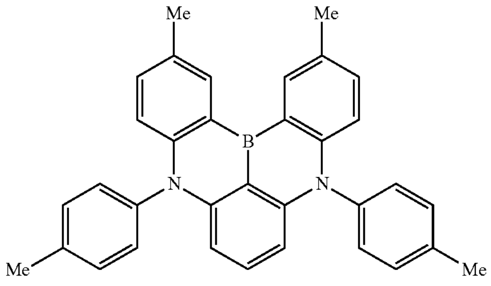
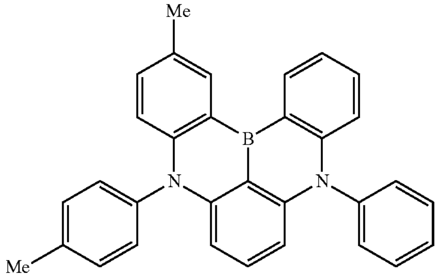
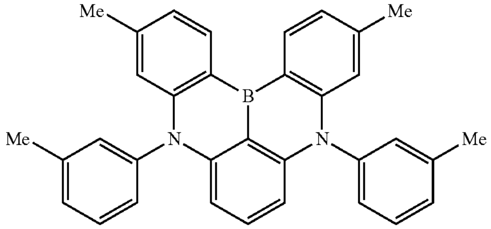
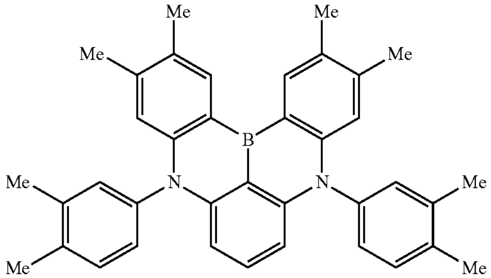
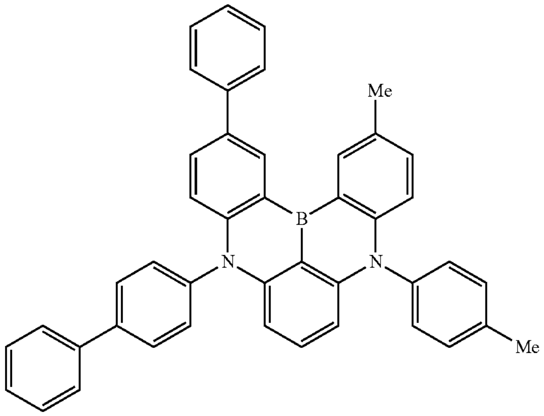
-continued
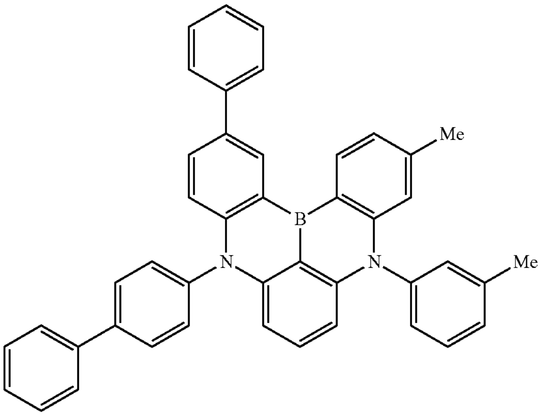
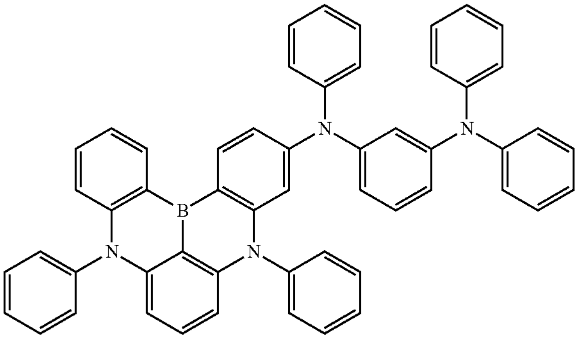
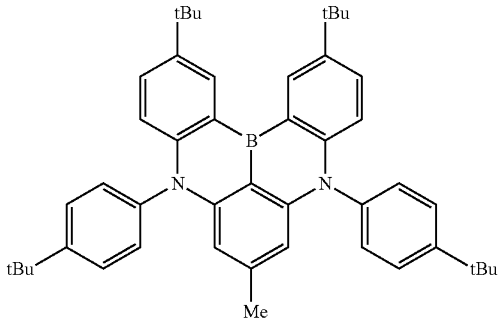
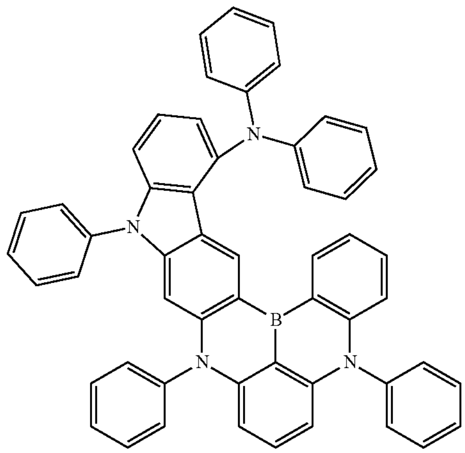

-continued
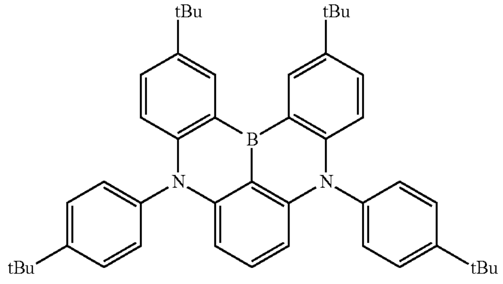
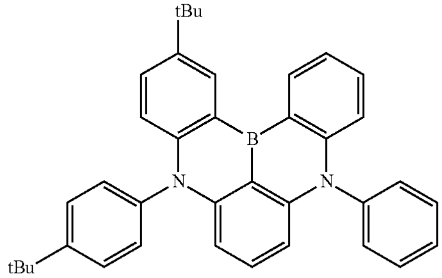
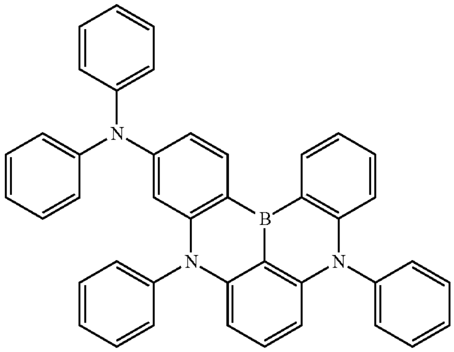
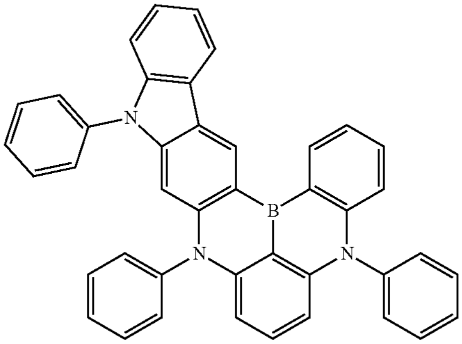
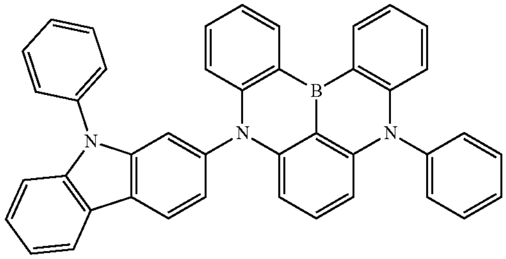
-continued
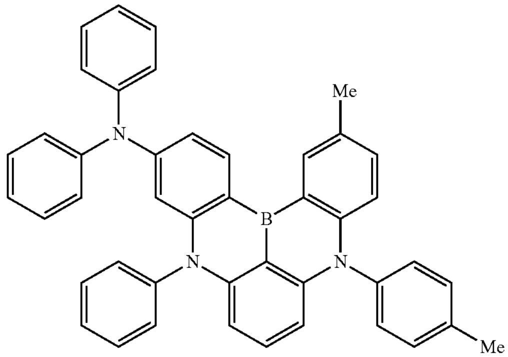
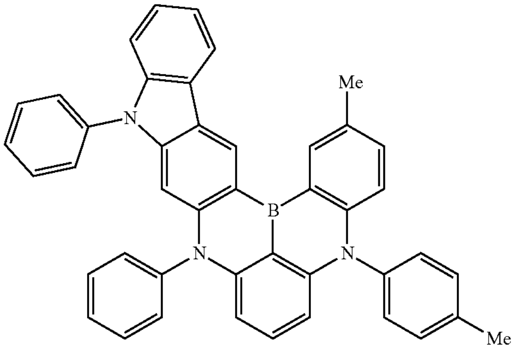
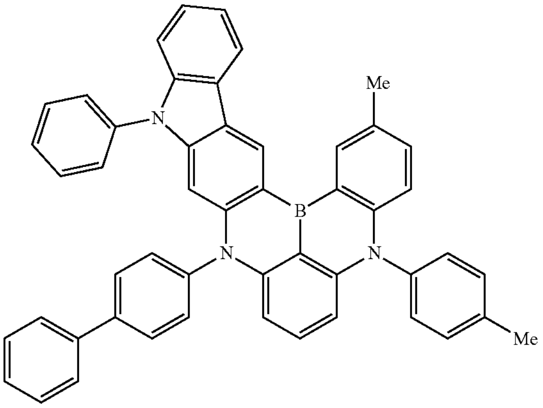
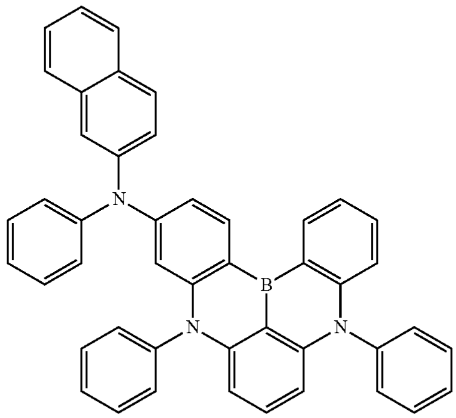

-continued
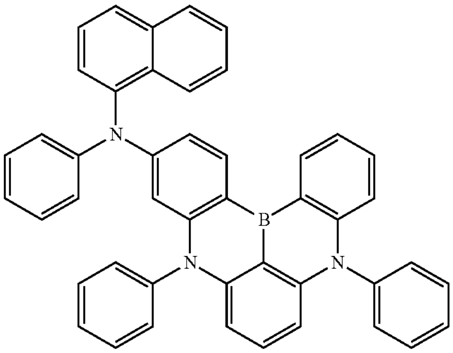
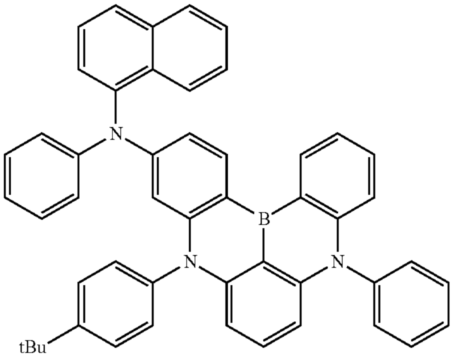
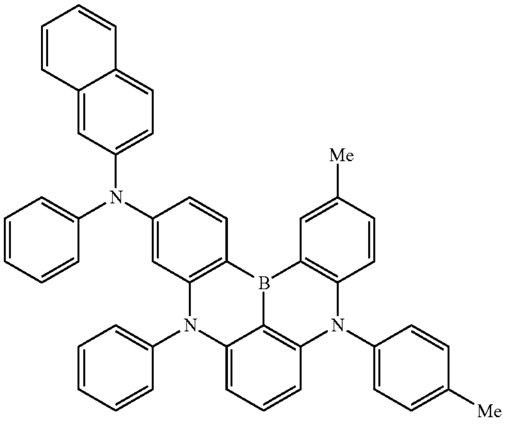
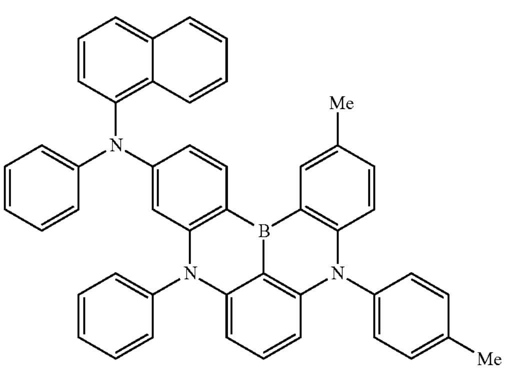
-continued
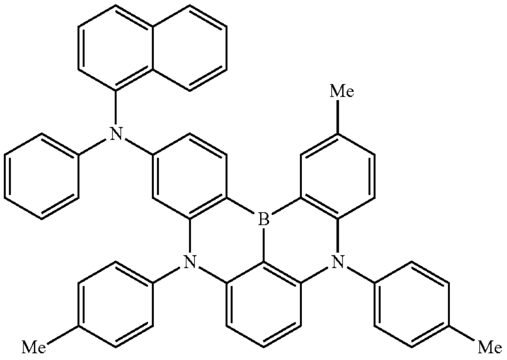
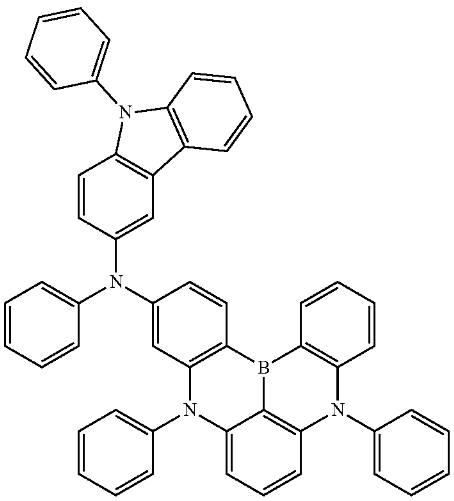
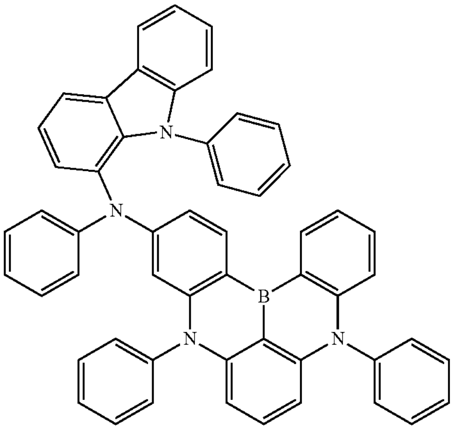

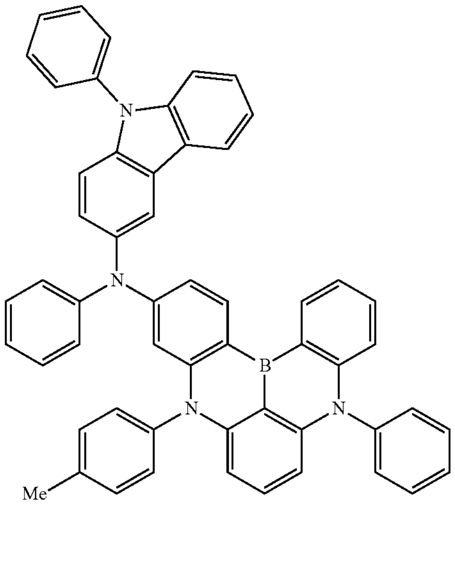
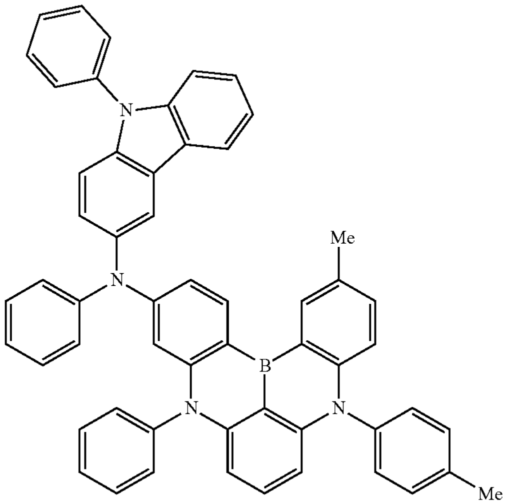
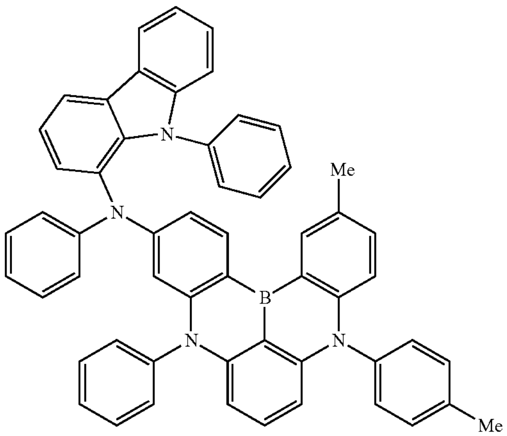
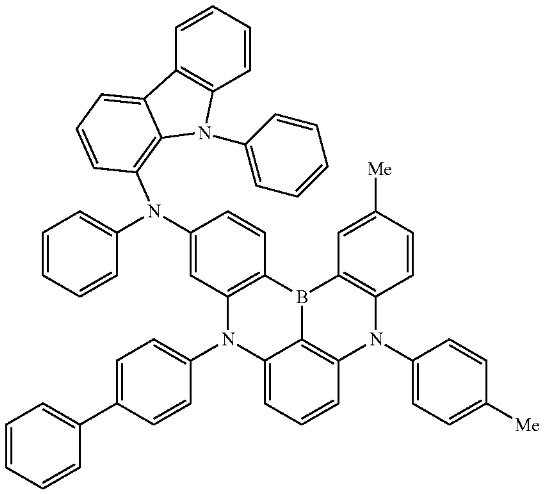
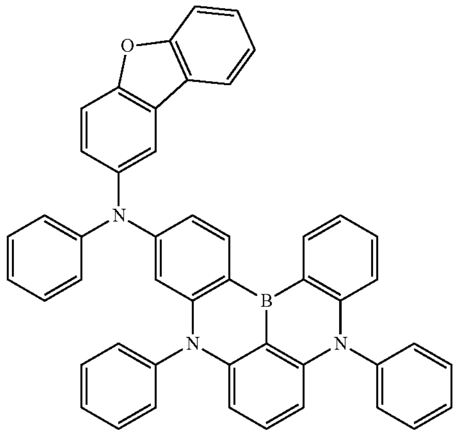
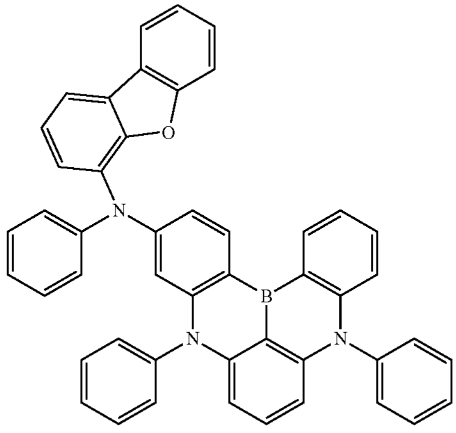

-continued
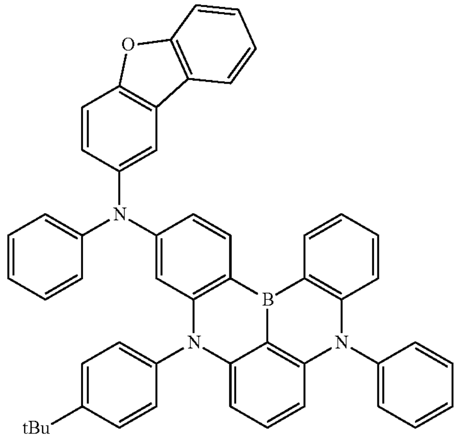
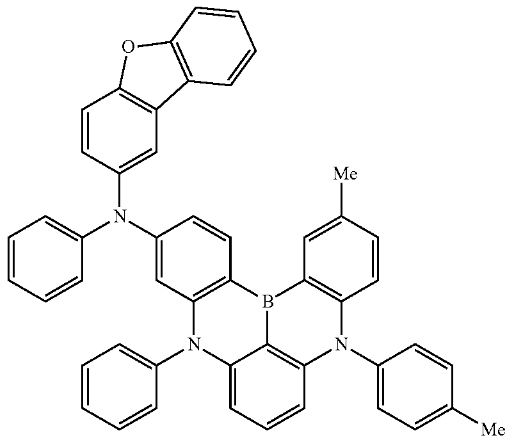
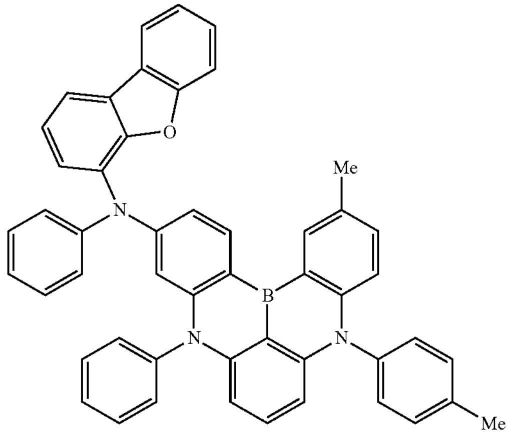
-continued
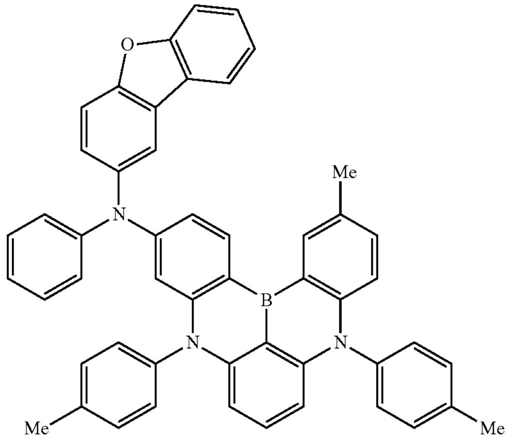
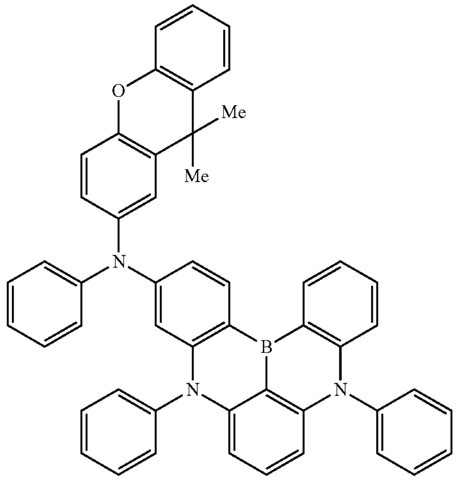
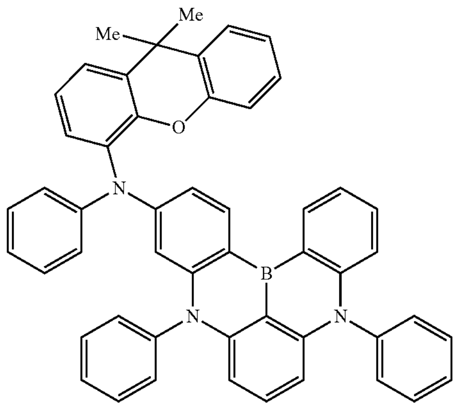

-continued
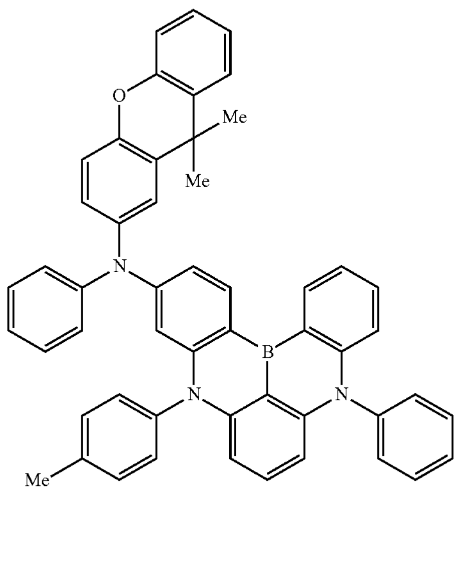
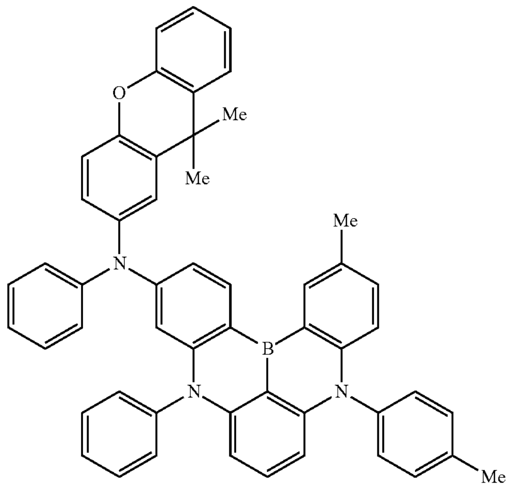
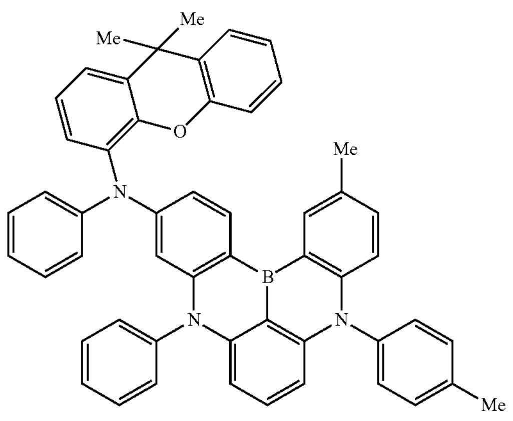
-continued
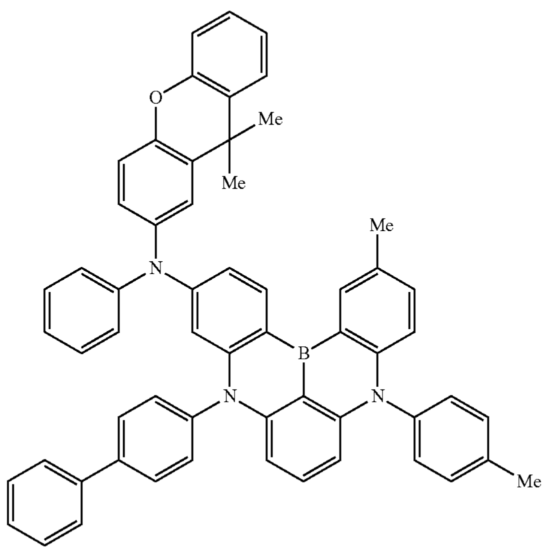
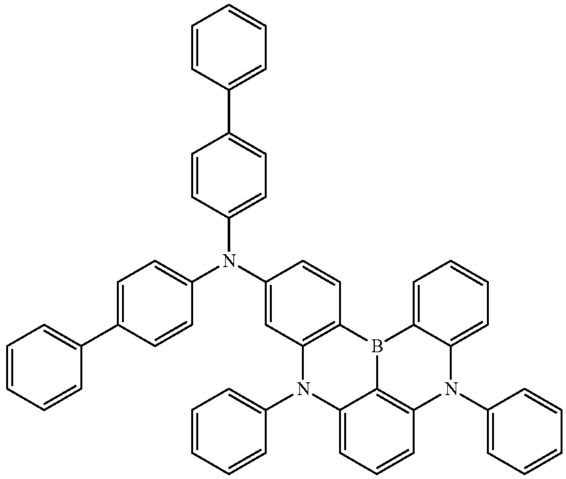
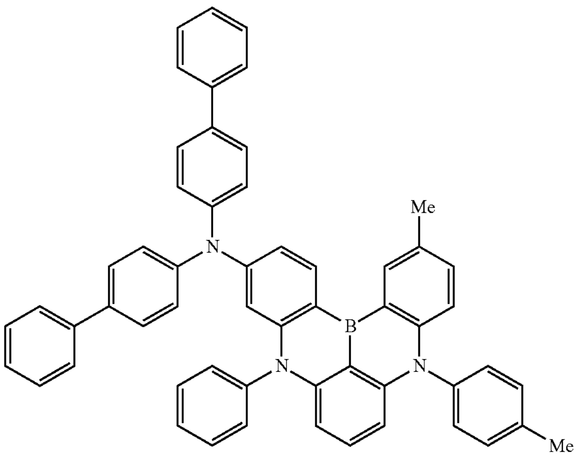

-continued
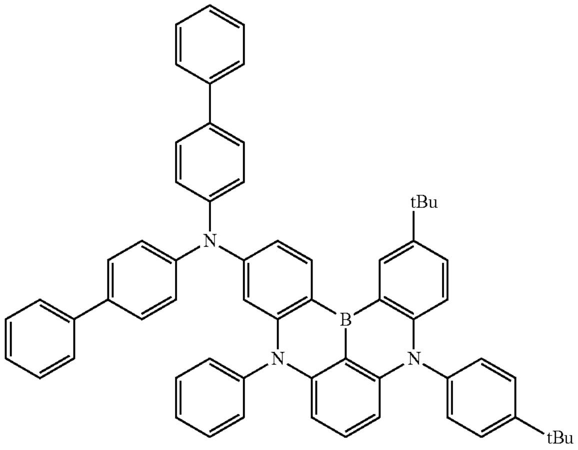
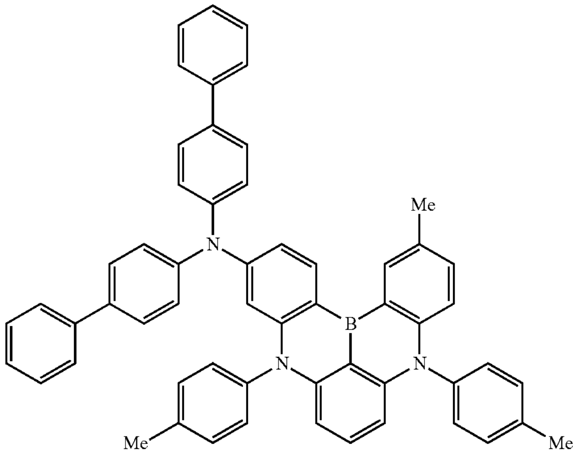
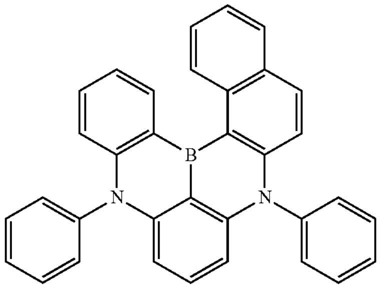
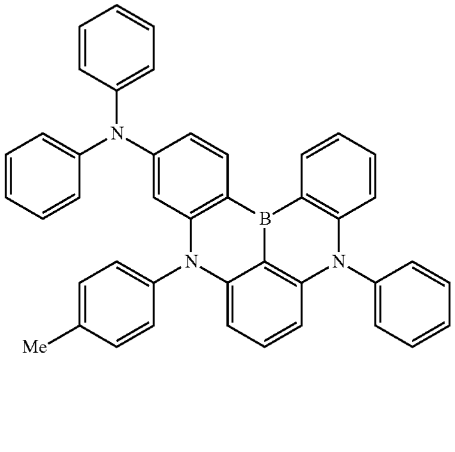
-continued
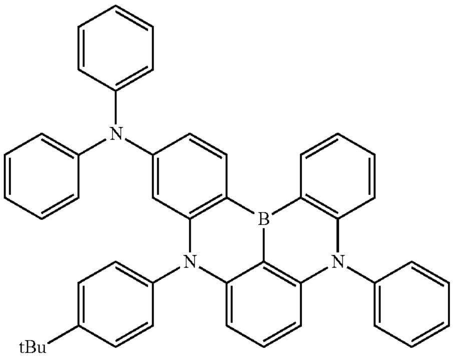
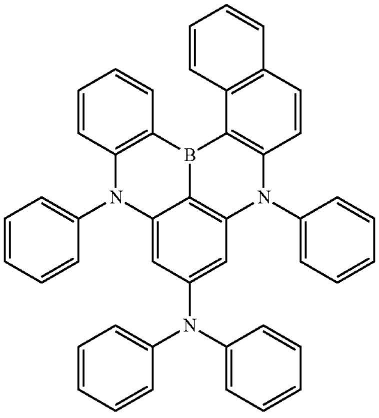
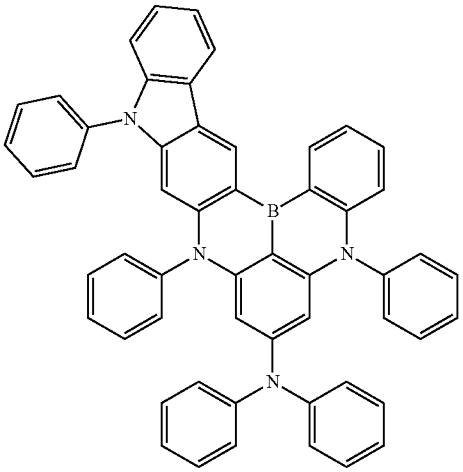
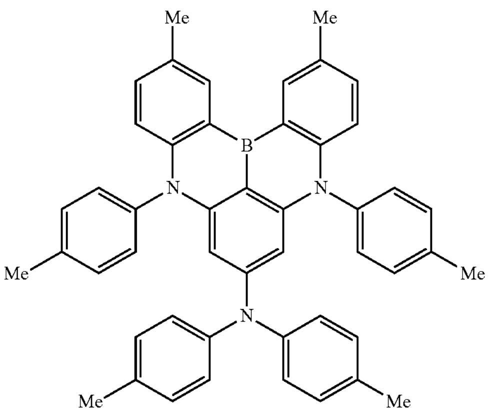

-continued
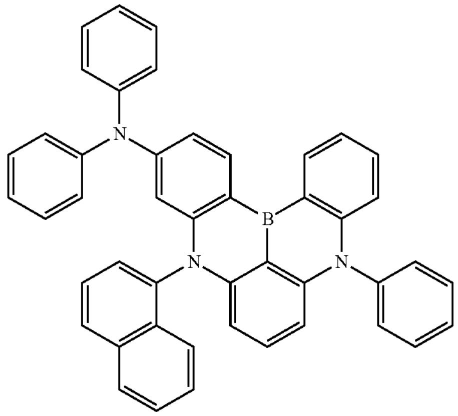
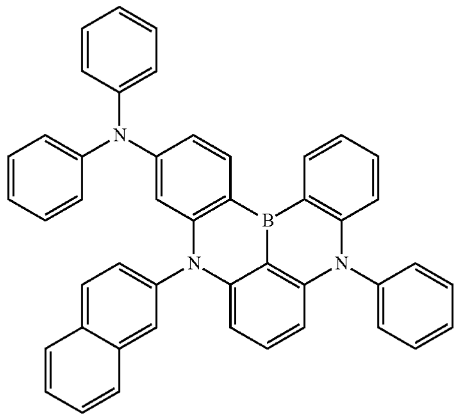
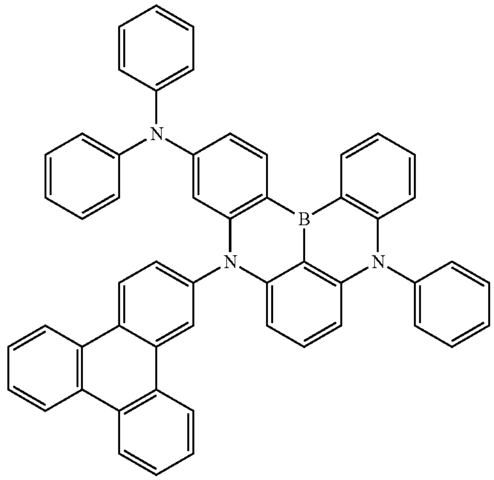
-continued
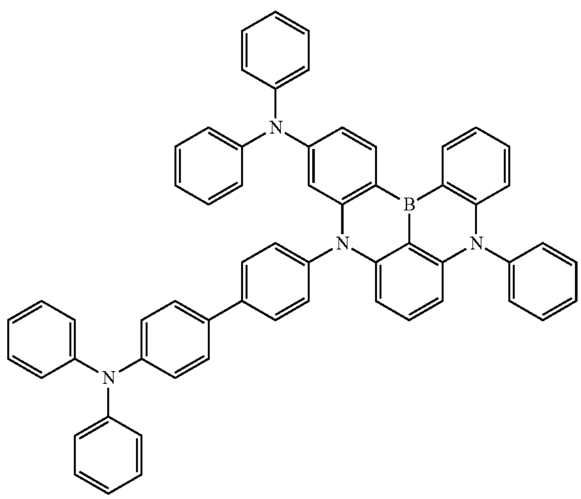
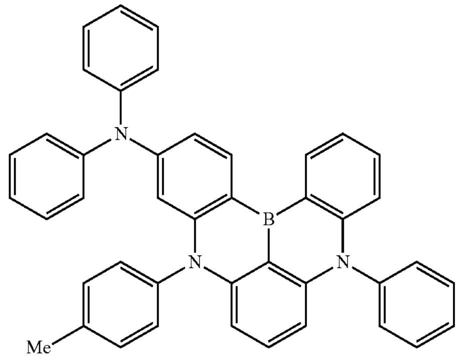
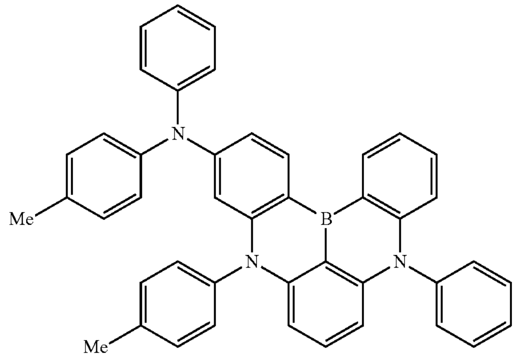
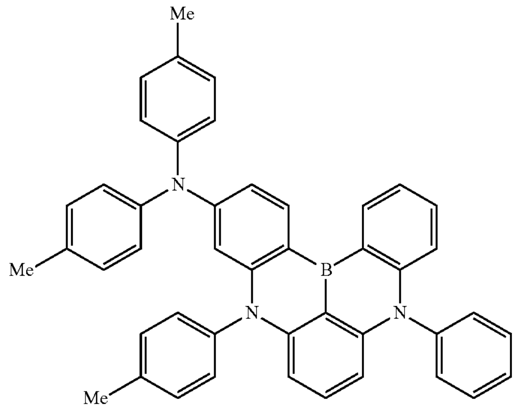

-continued
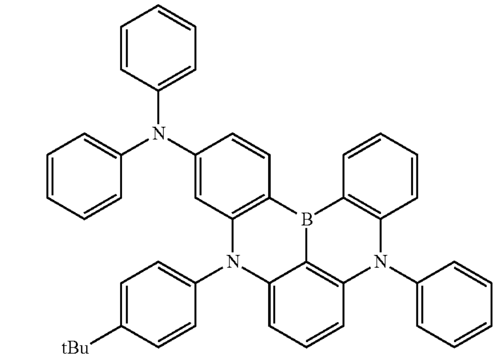
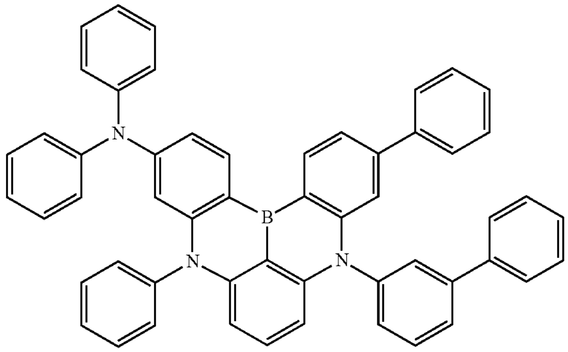
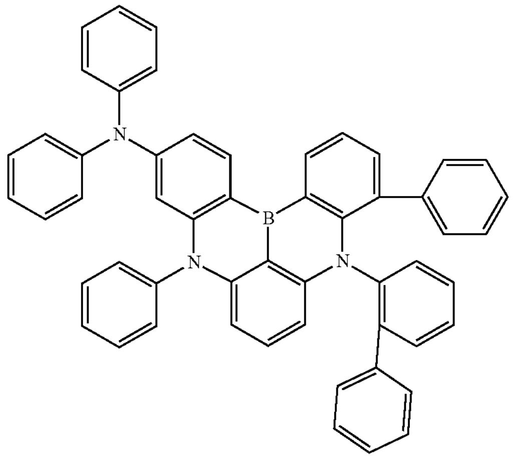
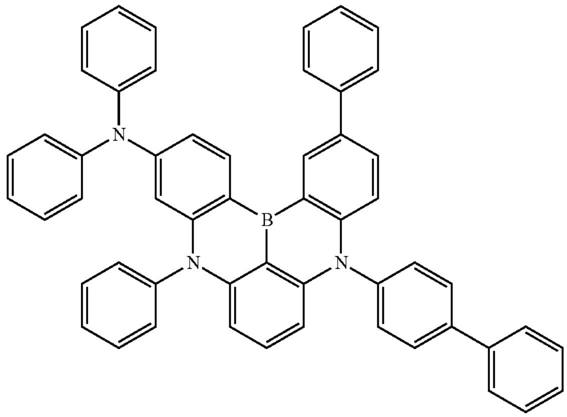
-continued
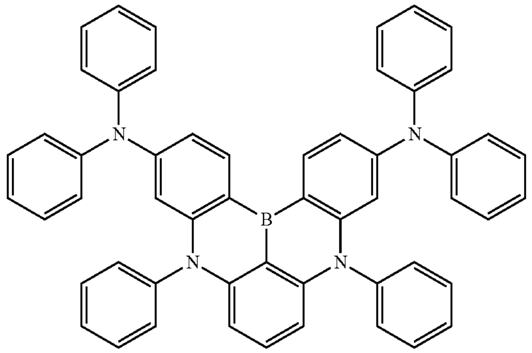
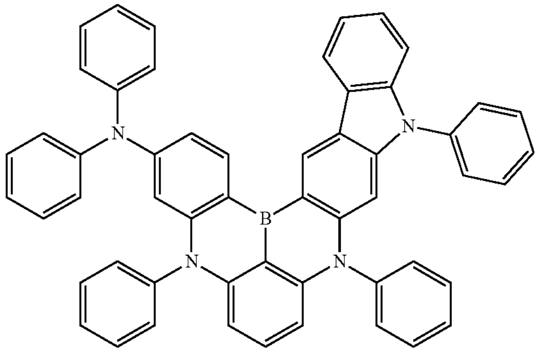
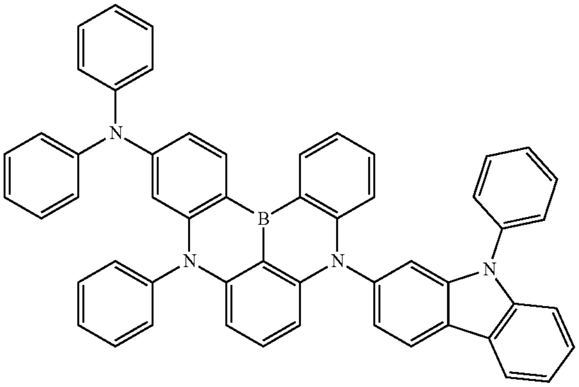
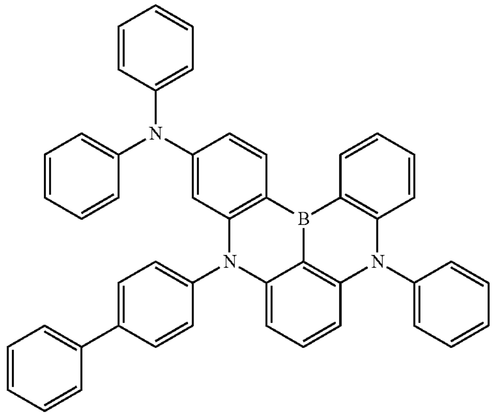

-continued
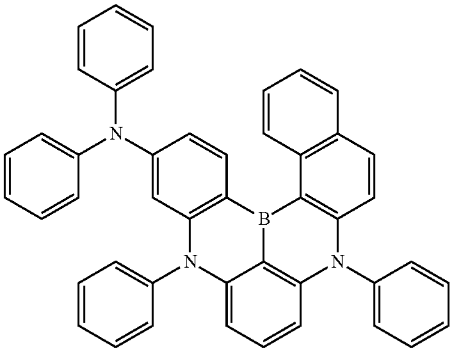
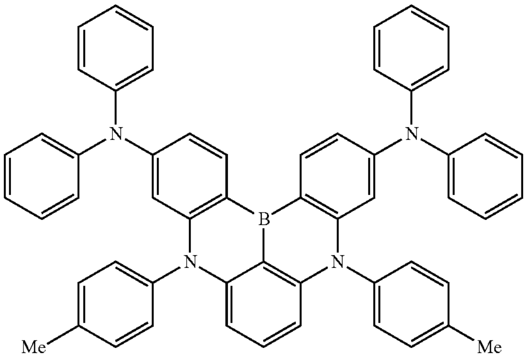
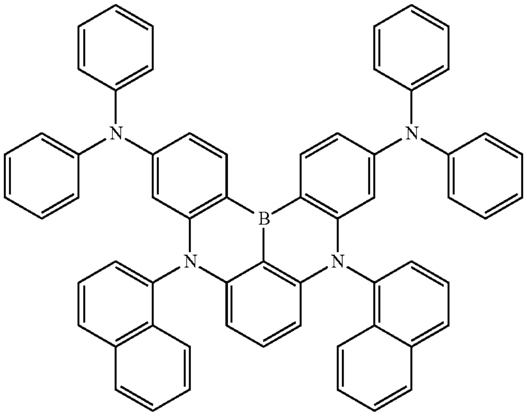
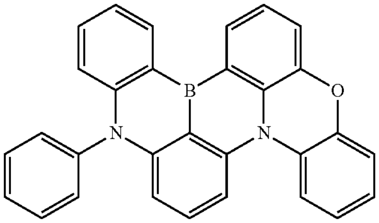
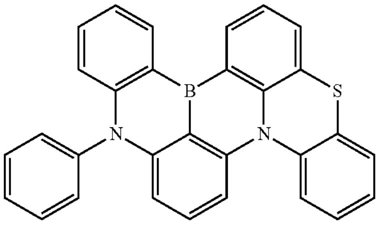
-continued
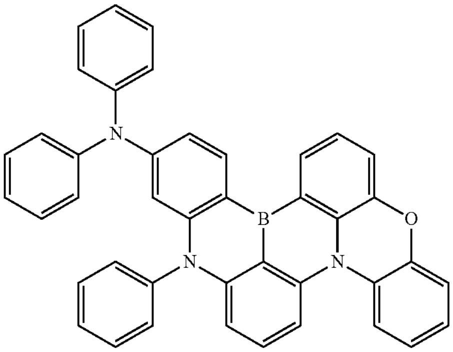
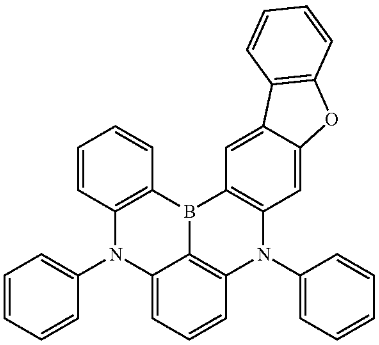
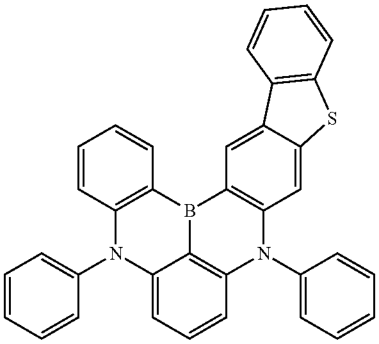
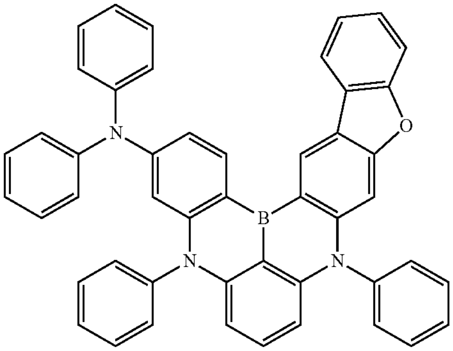
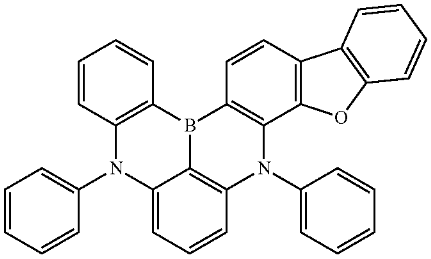

-continued

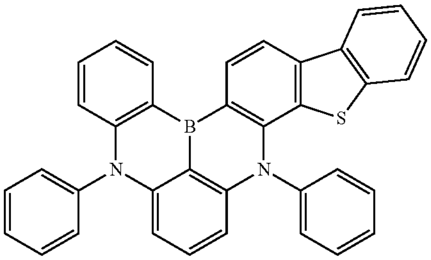

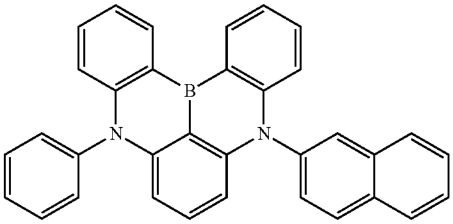

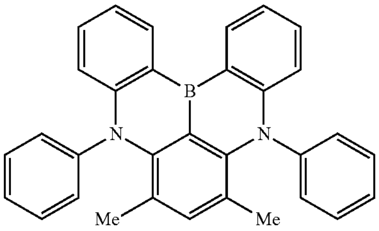

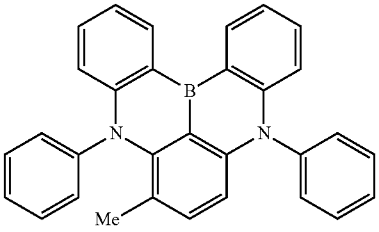

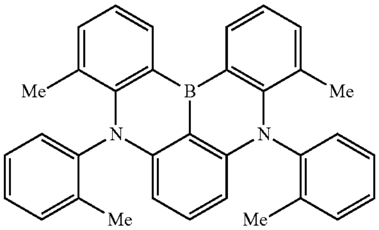

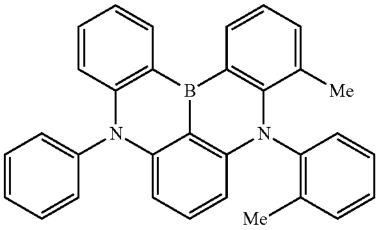

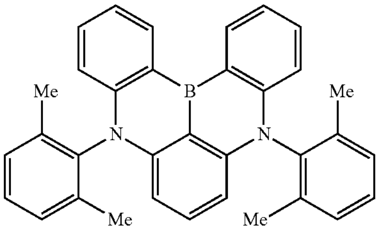

-continued

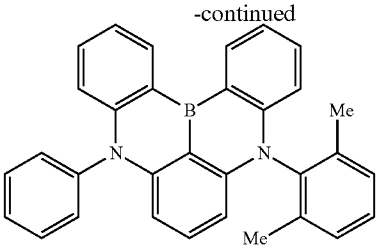

(Compound Represented by the Formula (51))

A compound represented by formula (51) will be described.

p—q—r—s—t (51)

(52)

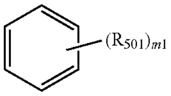

(53)

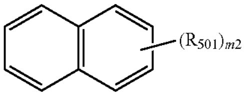

(54)

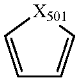

(55)

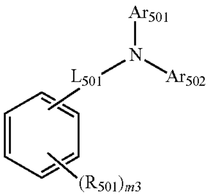

(56)

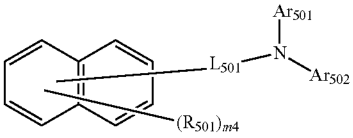

In the formula (51), a ring r is a ring represented by the formula (52) or formula (53) which is fused with an adjacent ring at an arbitrary position.

A ring q and a ring s are independently a ring represented by the formula (54) which is fused with an adjacent ring at an arbitrary position.

A ring p and a ring t are independently a structure represented by the formula (55) or formula (56) which is fused with an adjacent ring at an arbitrary position.

When a plurality of $R_{501}$'s are present, the plurality of adjacent $R_{501}$'s form a substituted or unsubstituted, saturated or unsaturated ring by bonding with each other, or do not form a substituted or unsubstituted saturated or unsaturated ring.

$X_{501}$ is an oxygen atom, a sulfur atom, or $NR_{502}$.

$R_{502}$, and $R_{501}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{905})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are as defined in the formula (1).

$Ar_{501}$ and $Ar_{502}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

$L_{501}$ is a substituted or unsubstituted alkylene group including 1 to 50 carbon atoms, a substituted or unsubstituted alkenylene group including 2 to 50 carbon atoms, a substituted or unsubstituted alkynylene group including 2 to 50 carbon atoms, a substituted or unsubstituted cycloalkylene group including 3 to 50 ring carbon atoms, a substituted or unsubstituted arylene group including 6 to 50 ring carbon atoms, or a substituted or unsubstituted divalent heterocyclic group including 5 to 50 ring atoms.

m1 is an integer of 0 to 2, m2 is an integer of 0 to 4, m3 is an integer of 0 to 3, and m4 is an integer of 0 to 5. When a plurality of $R_{501}$'s are present, the plurality of $R_{501}$'s maybe the same as or different from each other.

In one embodiment, $L_{501}$ in the formula (51) may be a single bond.

In the formula (51), each of the ring p to the ring t is fused with the adjacent ring by sharing two carbon atoms. The position and direction of fusion are not limited, and fusion can be performed in arbitrary position and direction.

In one embodiment, in the formula (52) or formula (53) for the ring r, $R_{501}$ is a hydrogen atom.

In one embodiment, the compound represented by the formula (51) is represented by any one of the following formulas (51-1) to (51-6).

(51-1)

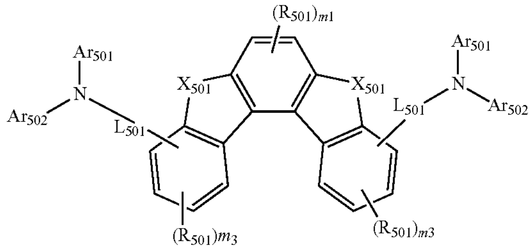

(51-2)

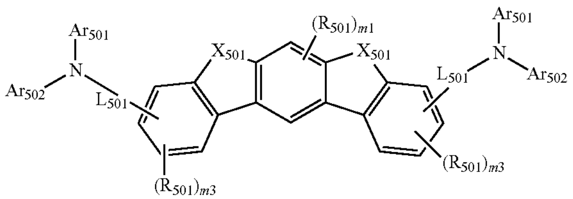

(51-3)

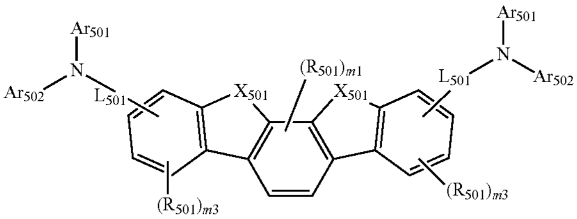

(51-4)

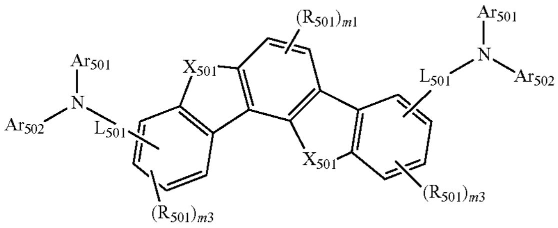

(51-5)

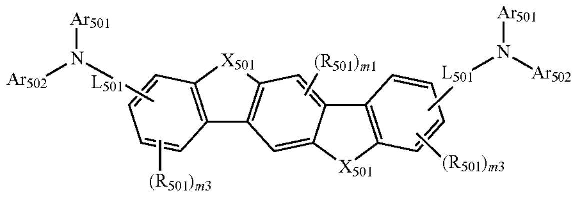

(51-6)

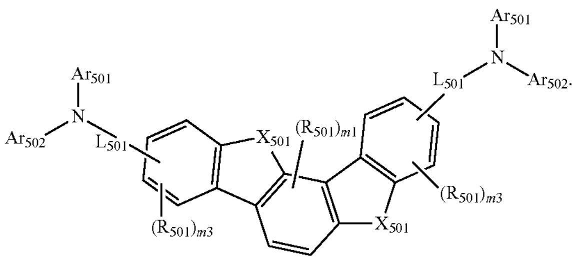

In the formulas (51-1) to (51-6), $R_{501}$, $X_{501}$, $Ar_{501}$, $Ar_{502}$, $L_{501}$, m1, and m3 are as defined in the formula (51).

In one embodiment, the compound represented by the formula (51) is a compound represented by any of the following formulas (51-11) to (51-13).

(51-11)
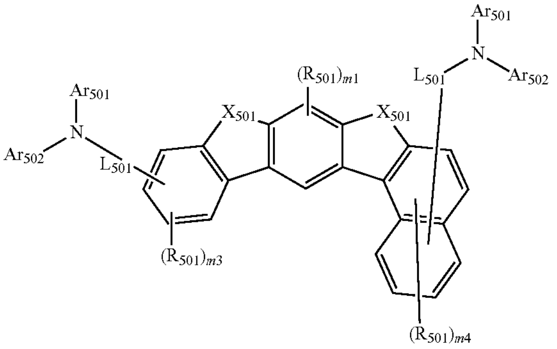
(51-12)
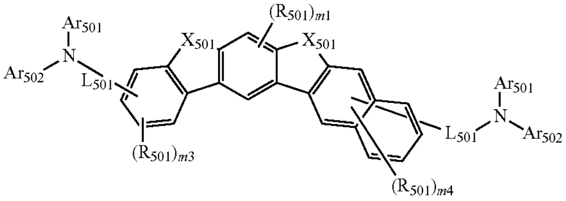
-continued
(51-13)
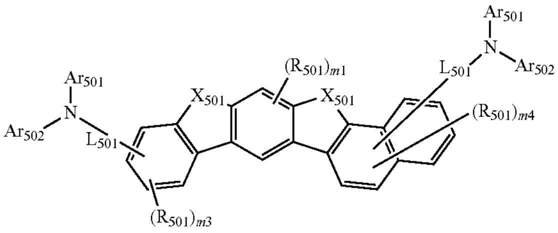
In the formulas (51-11) to (51-13), $R_{501}$, $X_{501}$, $Ar_{501}$, $Ar_{502}$, $L_{501}$, m1, m3, and m4 are as defined in the formula (51).
In one embodiment, the compound represented by the formula (51) is a compound represented by any of the following formulas (51-21) to (51-25).
(51-21)
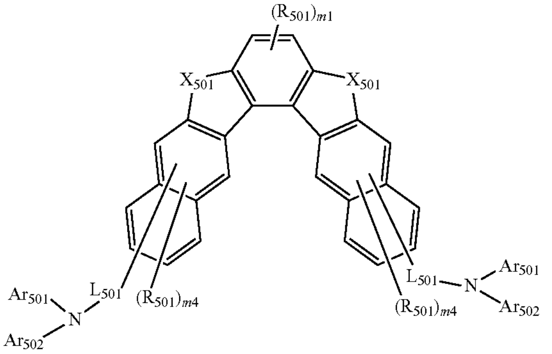
(51-22)
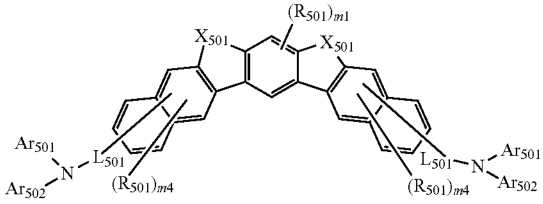
(51-23)
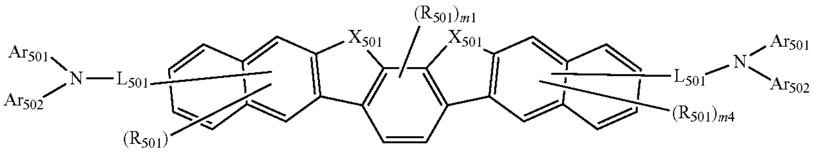
(51-24)
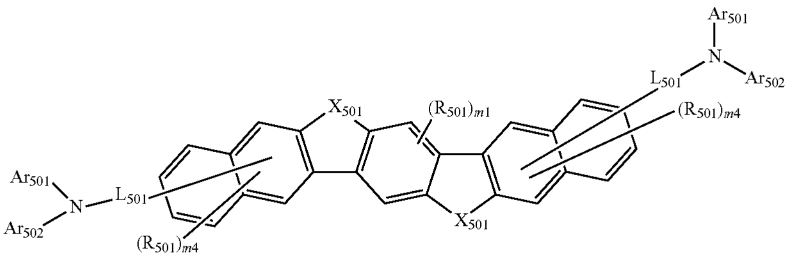

-continued (51-25)

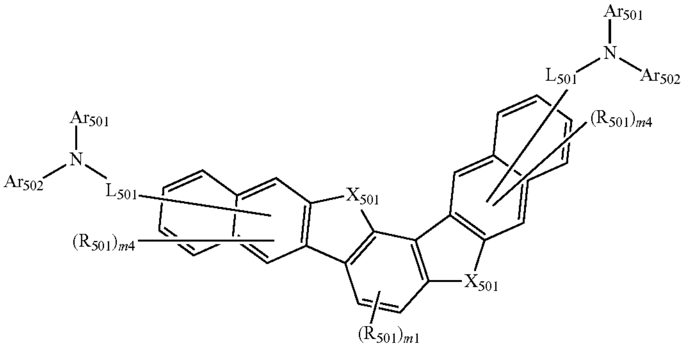

In the formulas (51-21) to (51-25), $R_{501}$, $X_{501}$, $Ar_{501}$, $Ar_{502}$, $L_{501}$, m1, and m4 are as defined in the formula (51).

In one embodiment, the compound represented by the formula (51) is a compound represented by any of the following formulas (51-31) to (51-33).

(51-31)

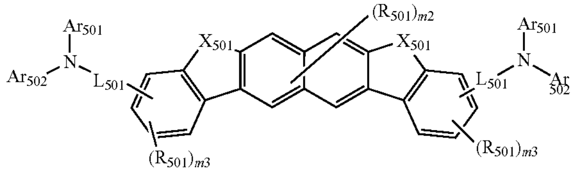

(51-32)

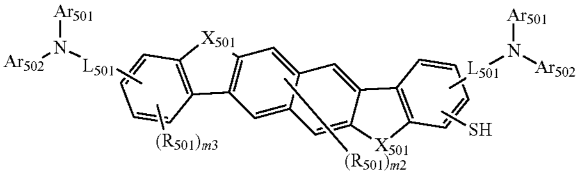

-continued (51-33)

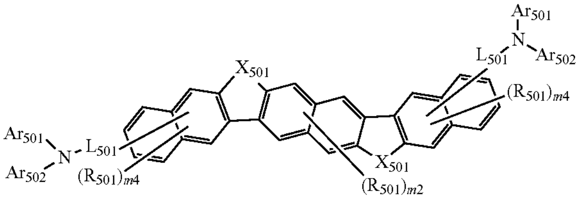

In the formulas (51-31) to (51-33), $R_{501}$, $X_{501}$, $Ar_{501}$, $Ar_{502}$, $L_{501}$, and m1 to m4 are as defined in the formula (51).

In one embodiment, $Ar_{501}$ and $Ar_{502}$ are independently a substituted or unsubstituted aryl group including 6 to 50 ring carbon atoms.

In one embodiment, one of $Ar_{501}$ and $Ar_{502}$ is a substituted or unsubstituted aryl group including 6 to 50 ring carbon atoms and the other is a substituted or unsubstituted monovalent heterocyclic group including 5 to 50 ring atoms.

Specific examples of the compound represented by the formula (51) include the following compounds. In the following specific examples, "Me" means a methyl group.

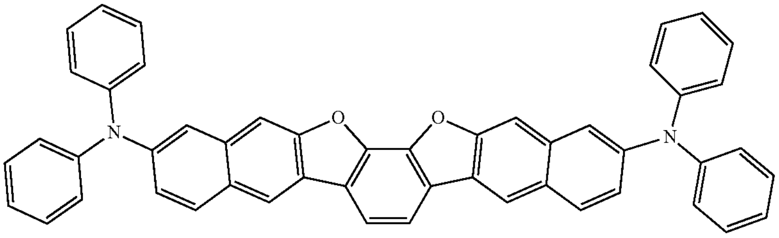

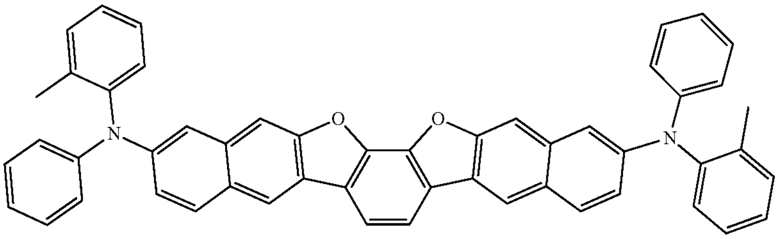

-continued
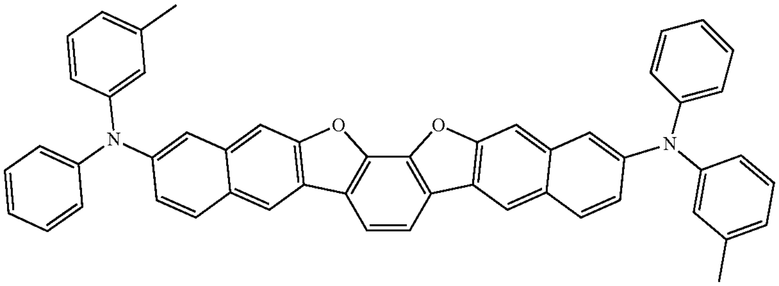
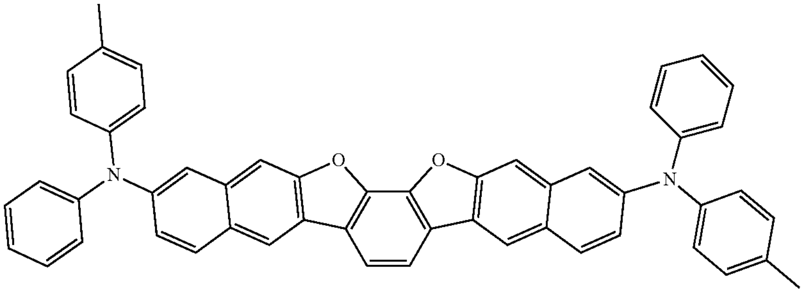
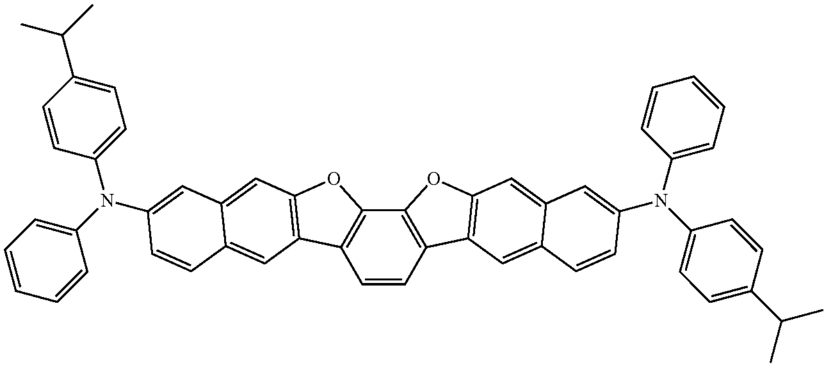
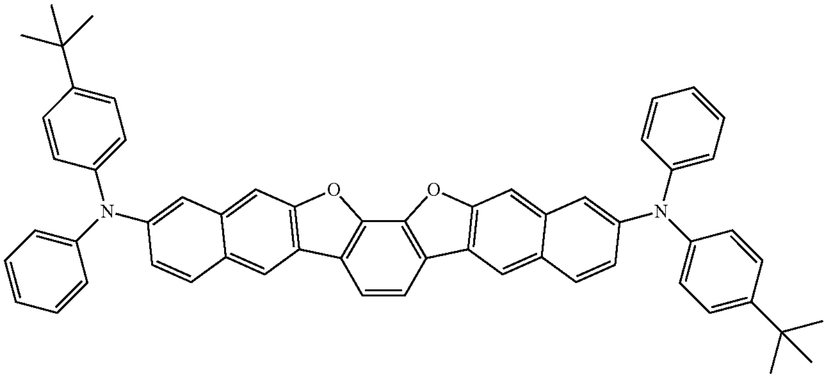
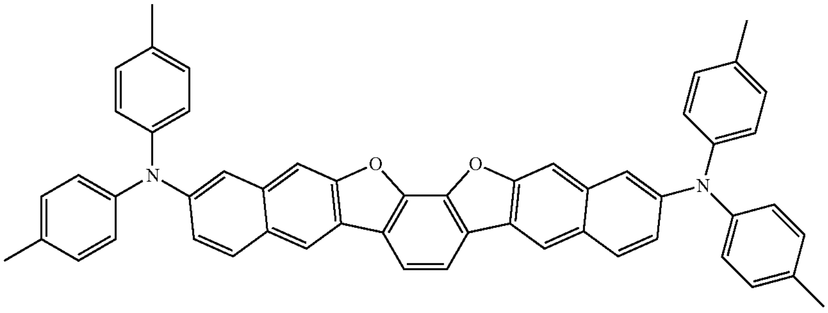

-continued
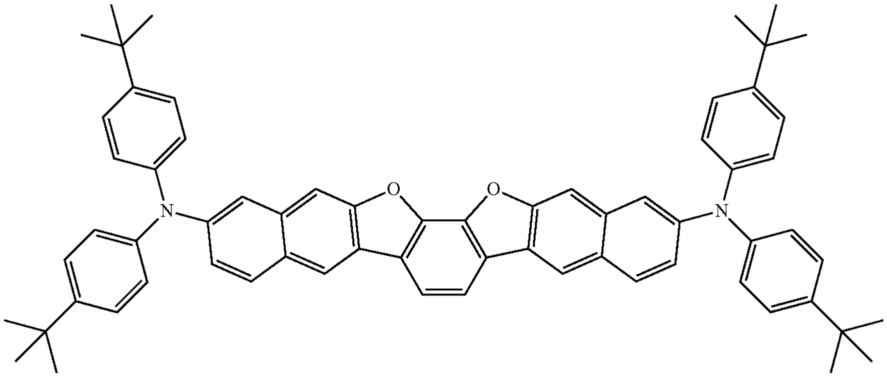
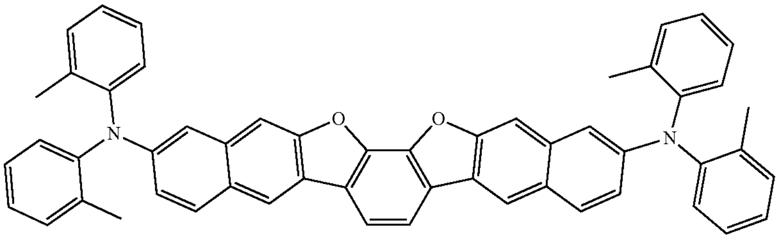
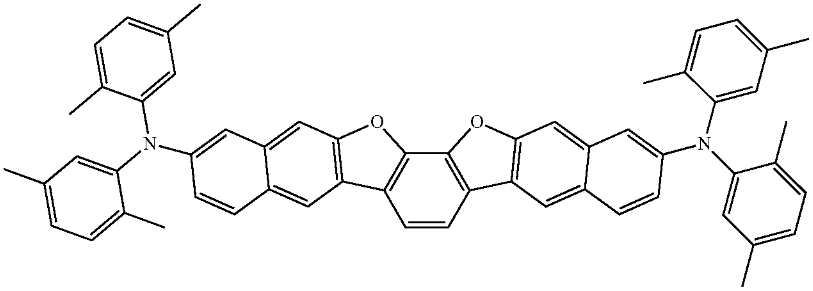
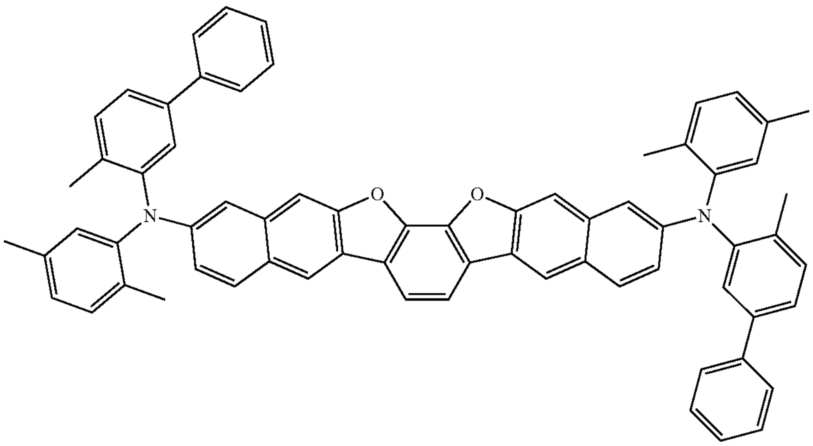

-continued
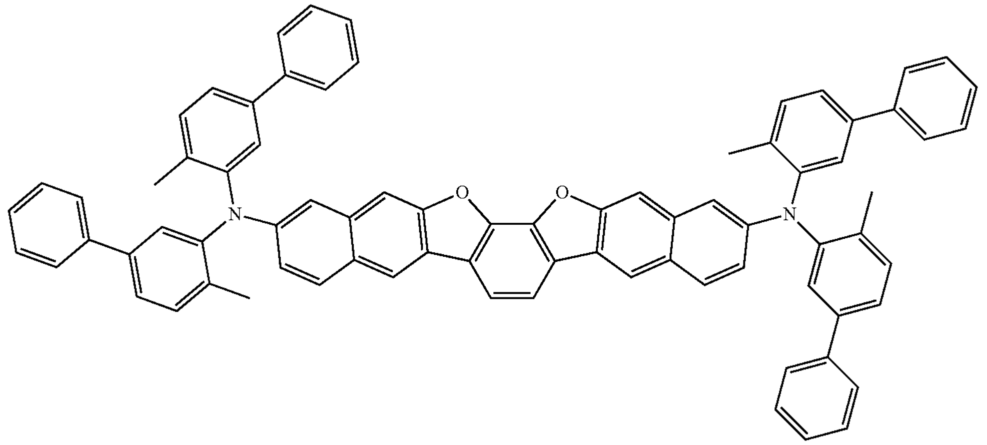
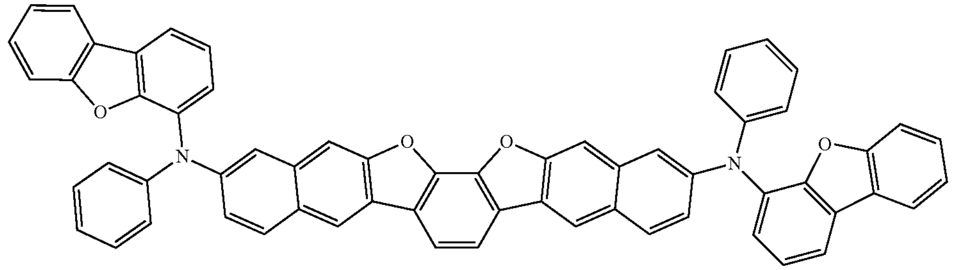
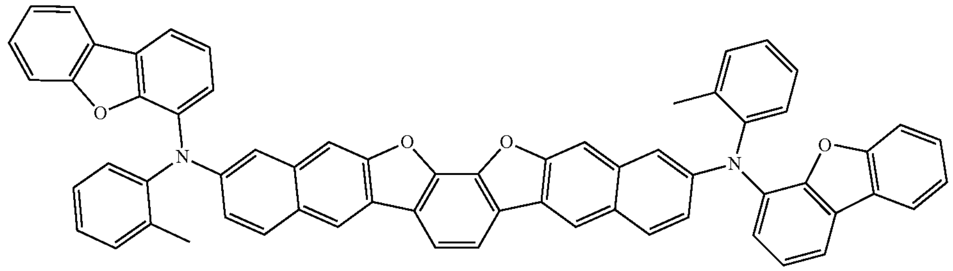
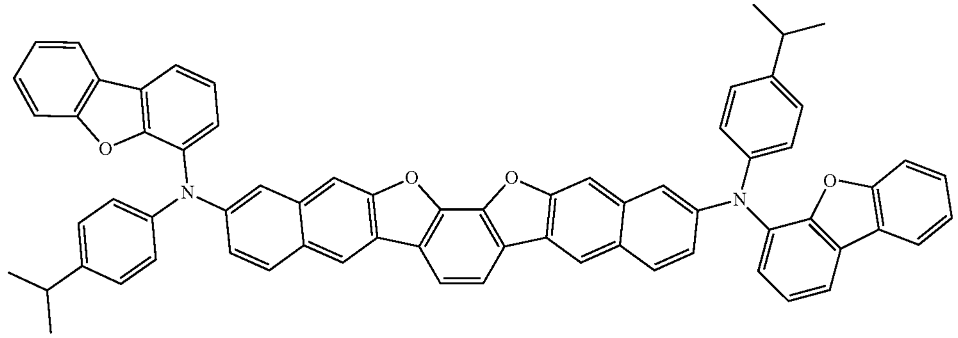
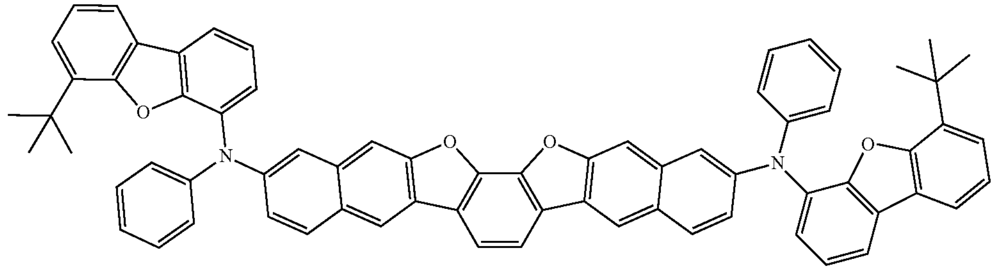

-continued
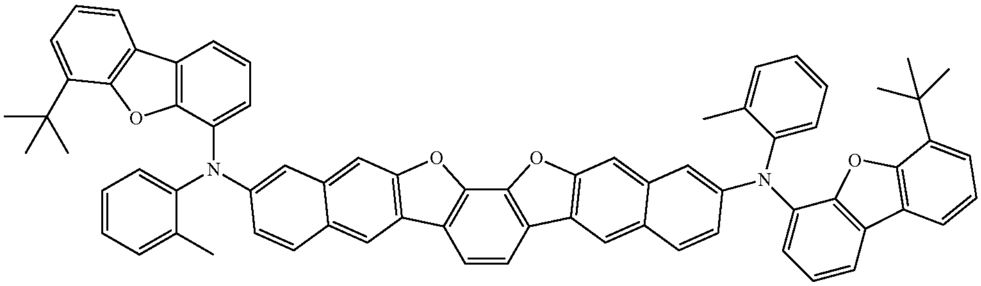
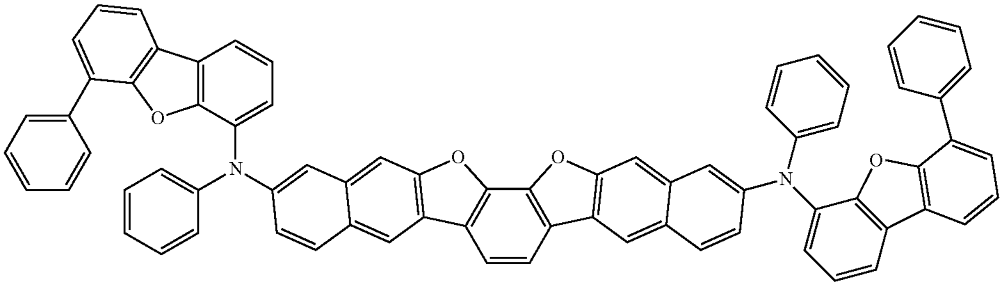
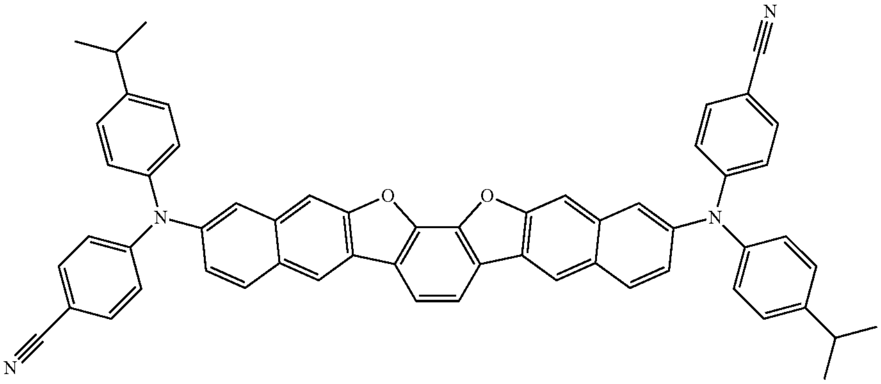
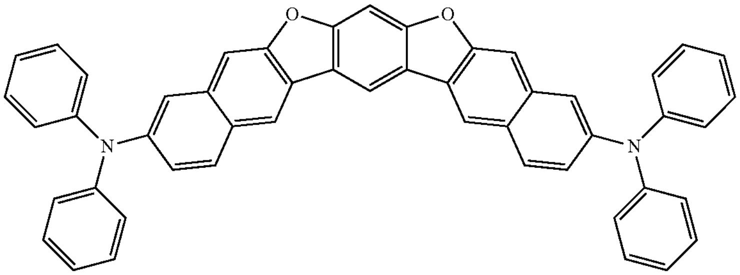
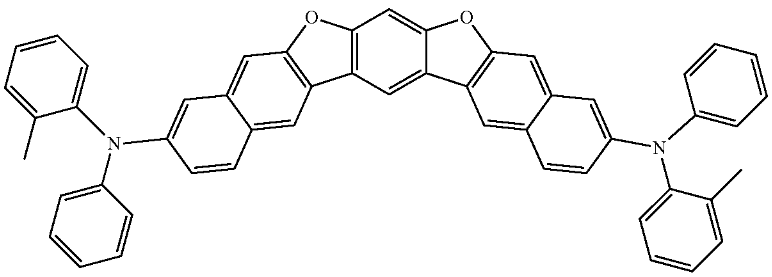

-continued
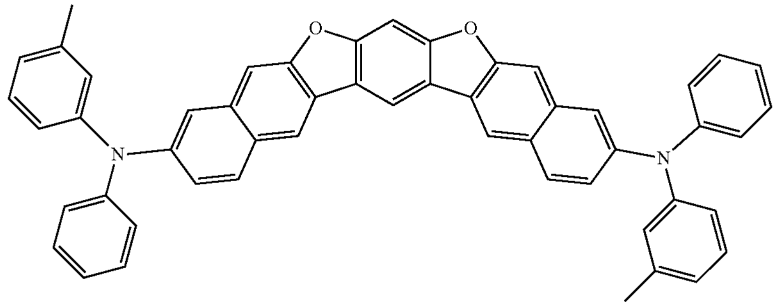
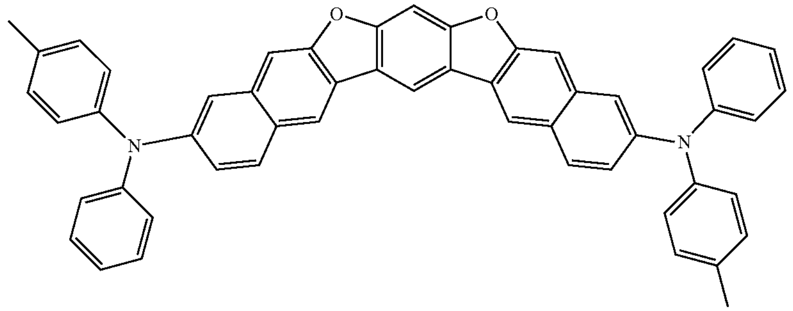
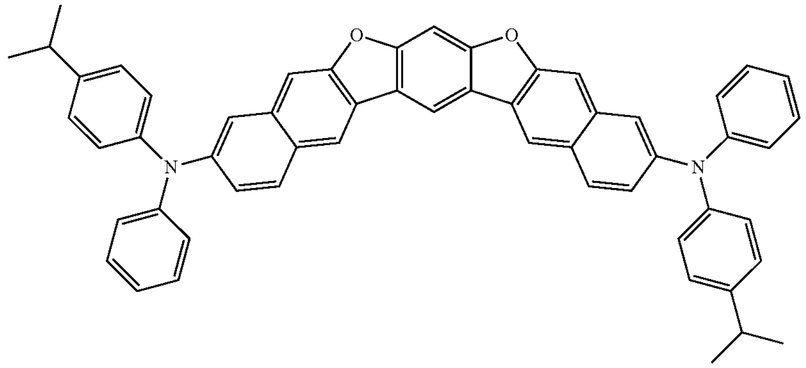
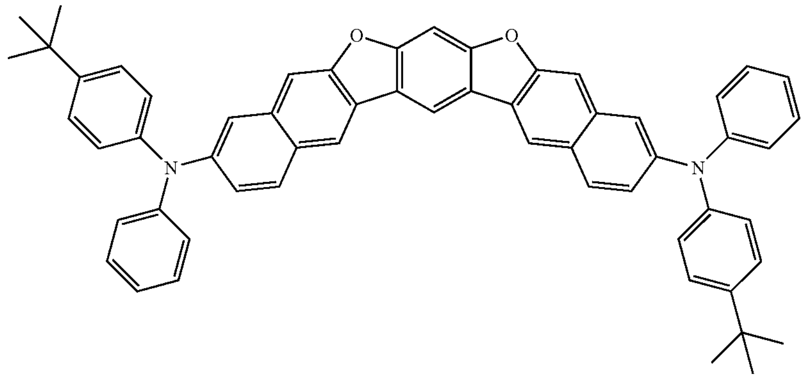
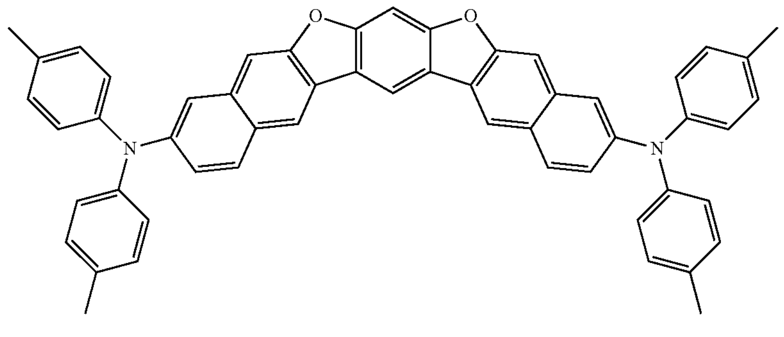

-continued
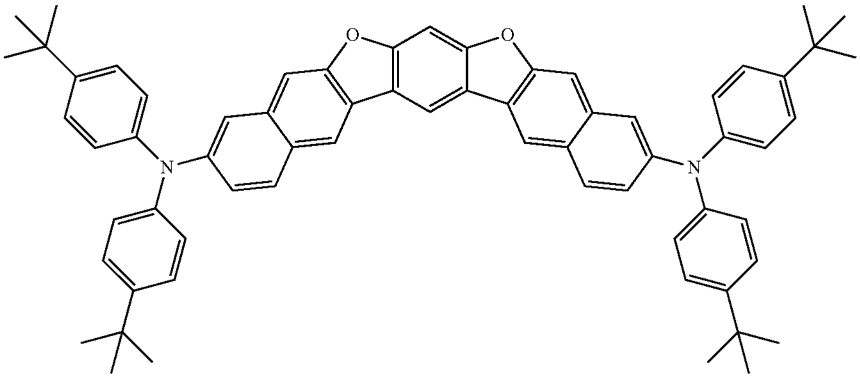
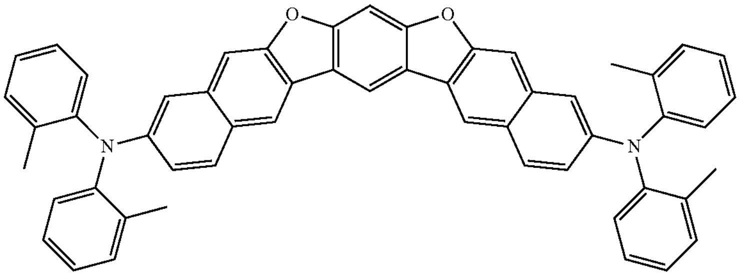
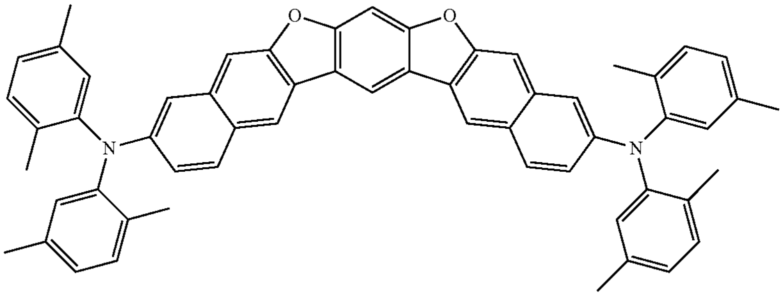
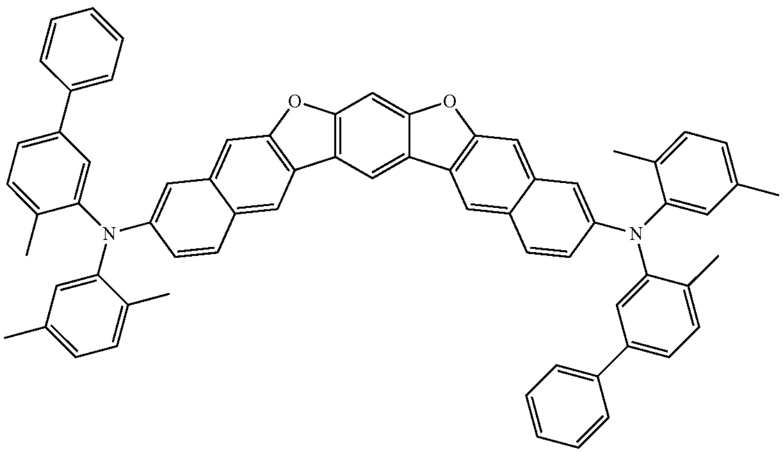

-continued
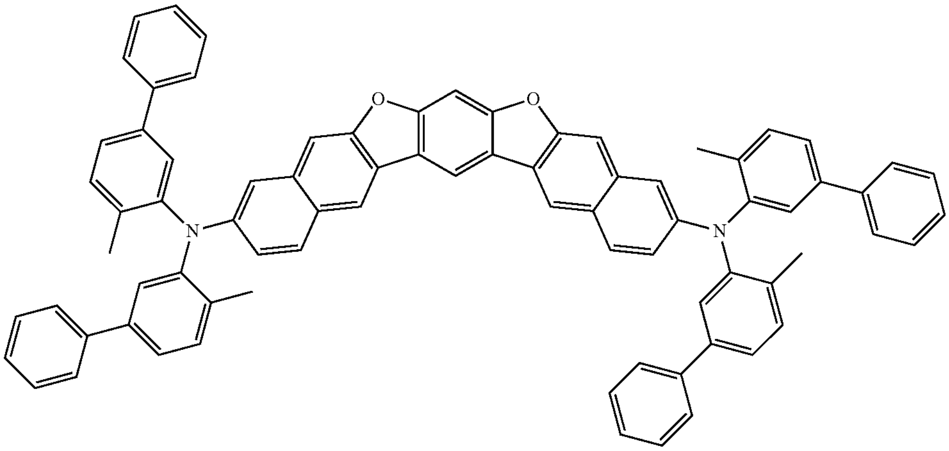
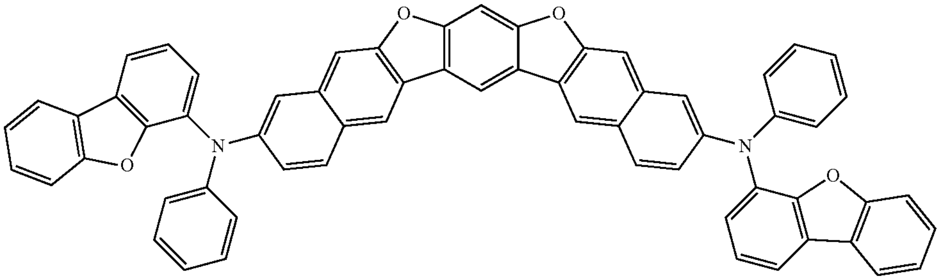
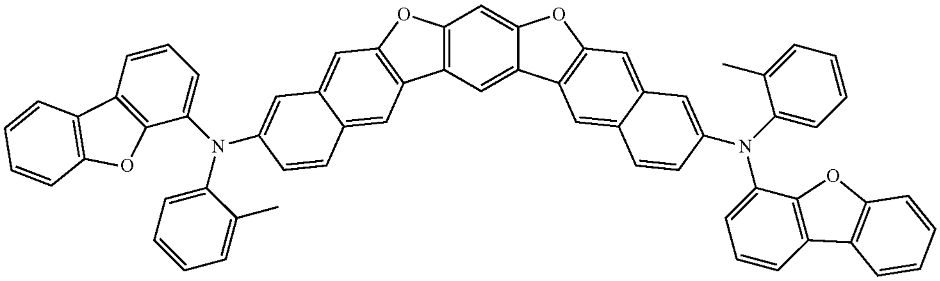
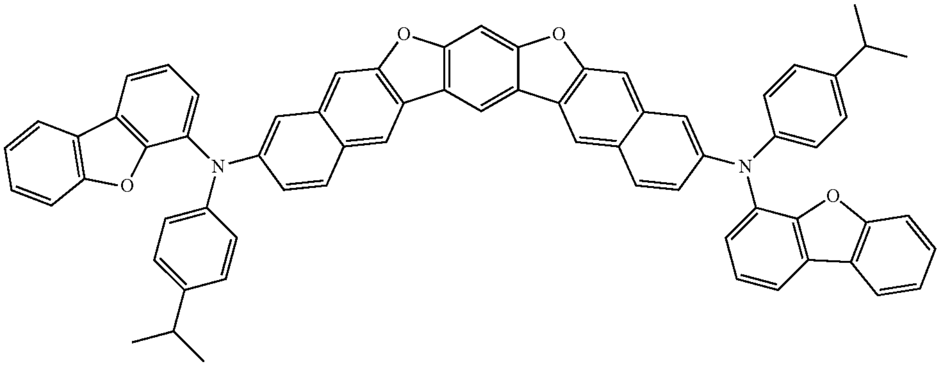
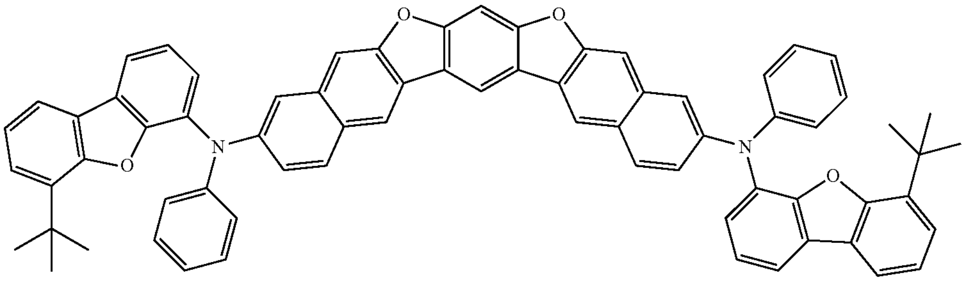

-continued
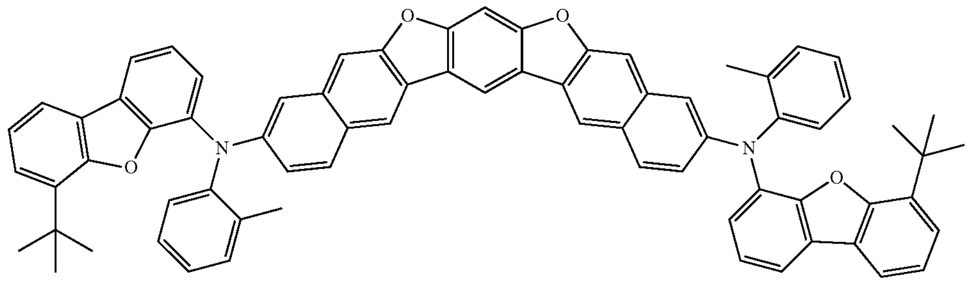
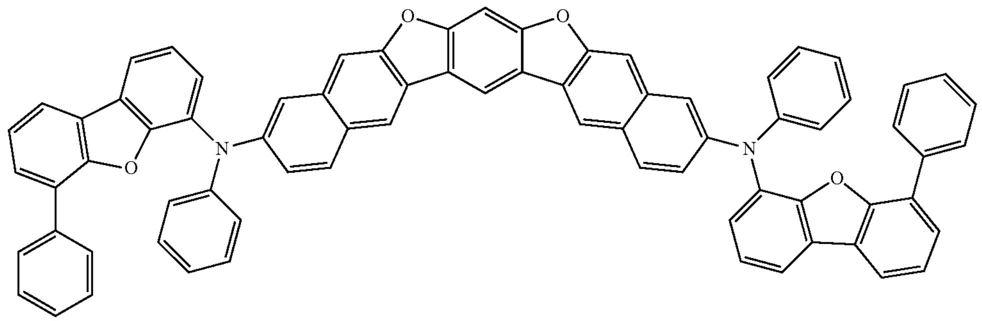
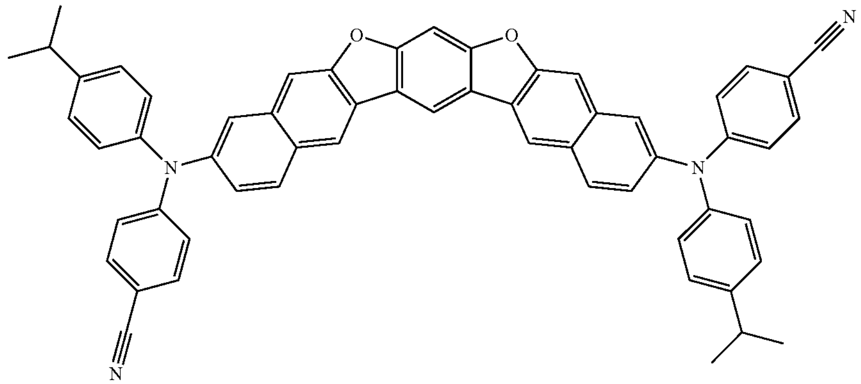
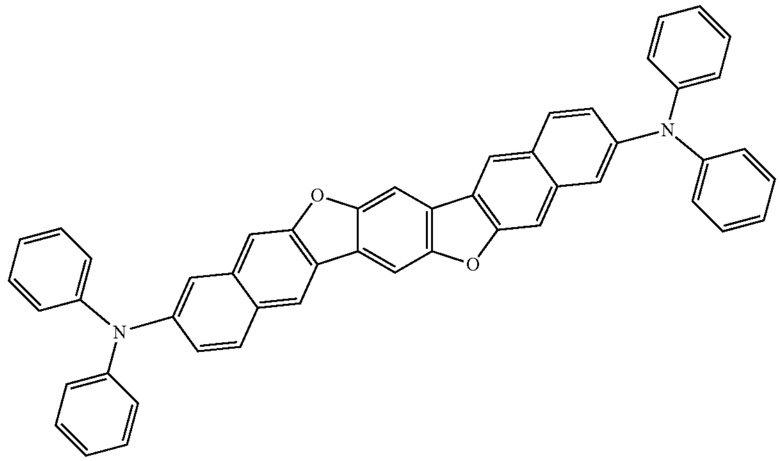

-continued
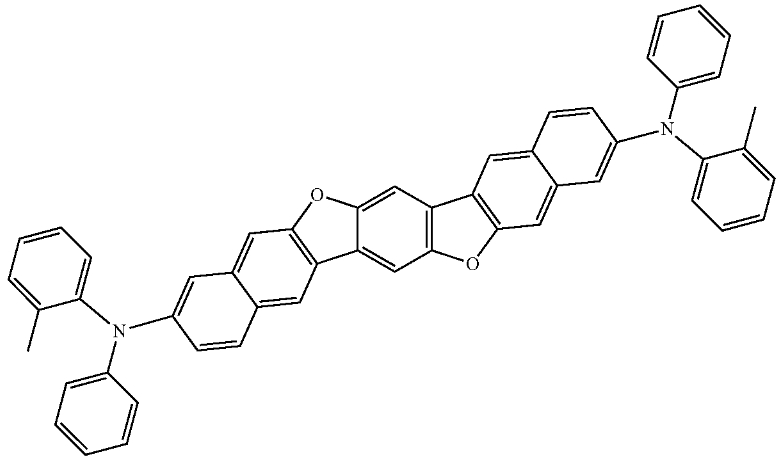
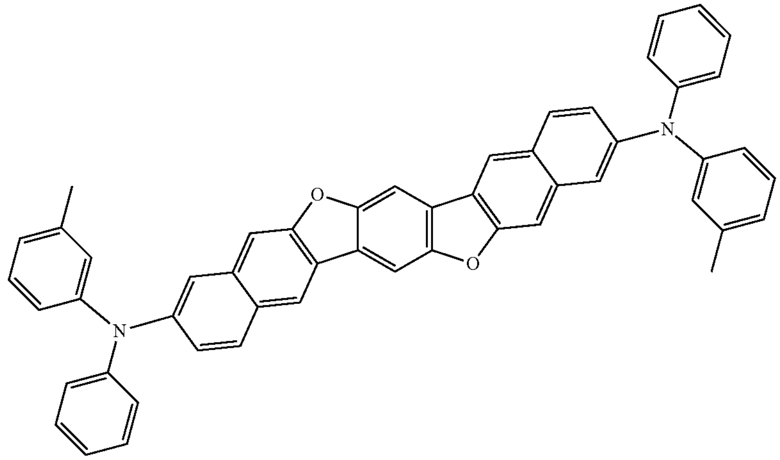
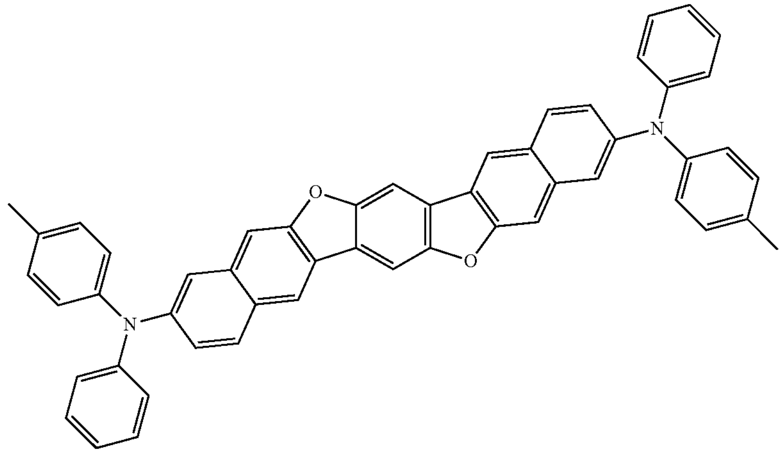

-continued
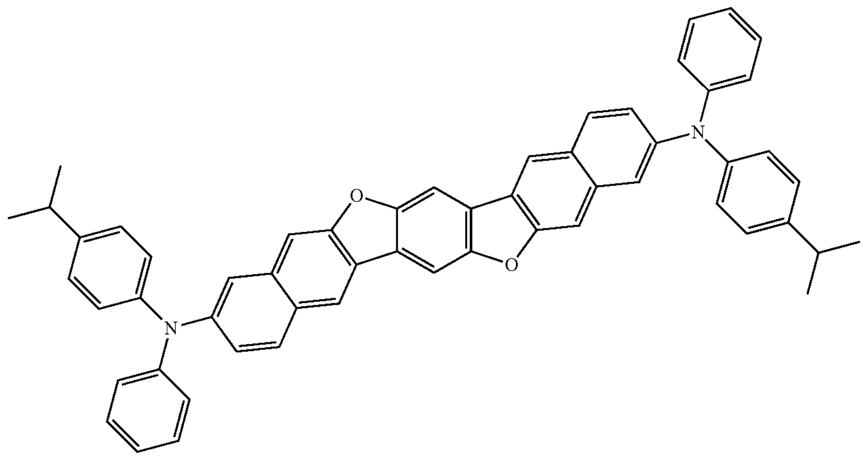
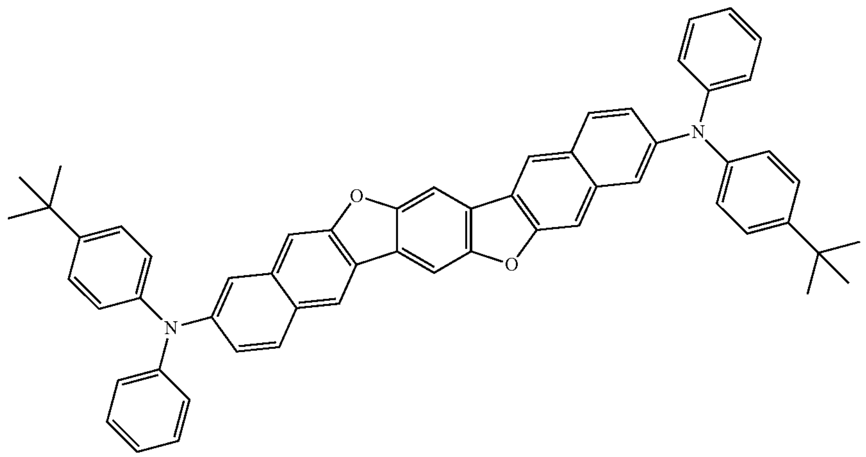
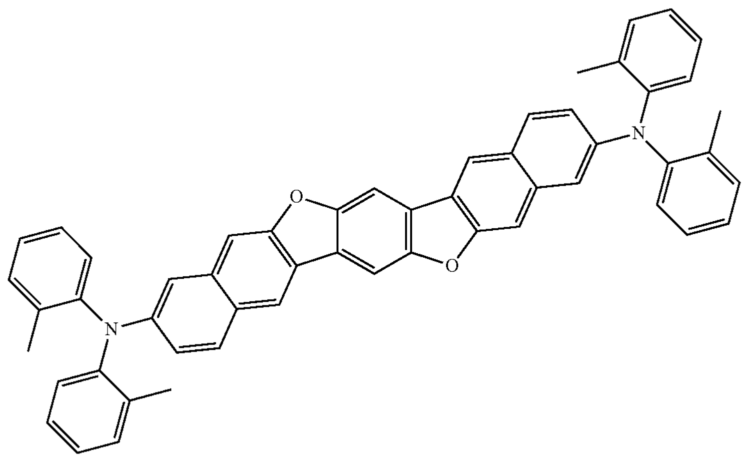

-continued
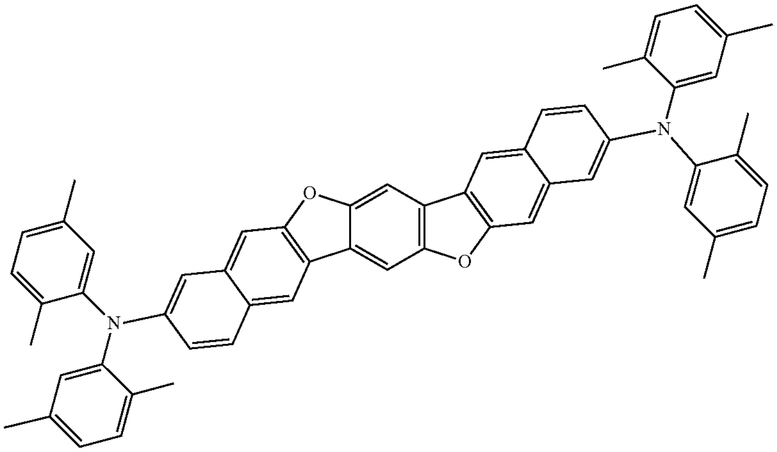
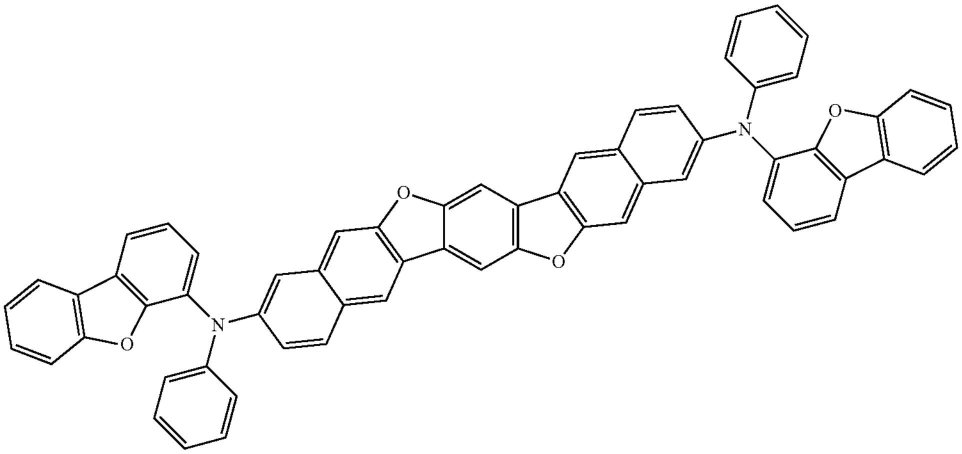
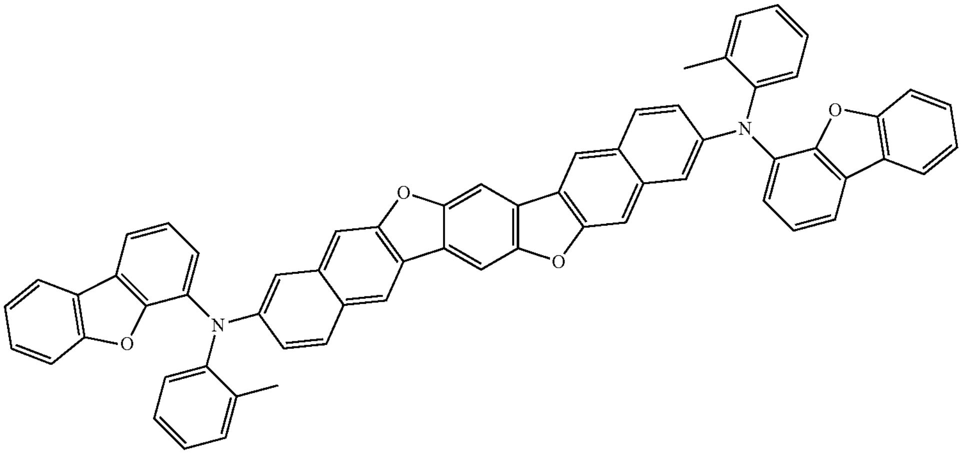

-continued
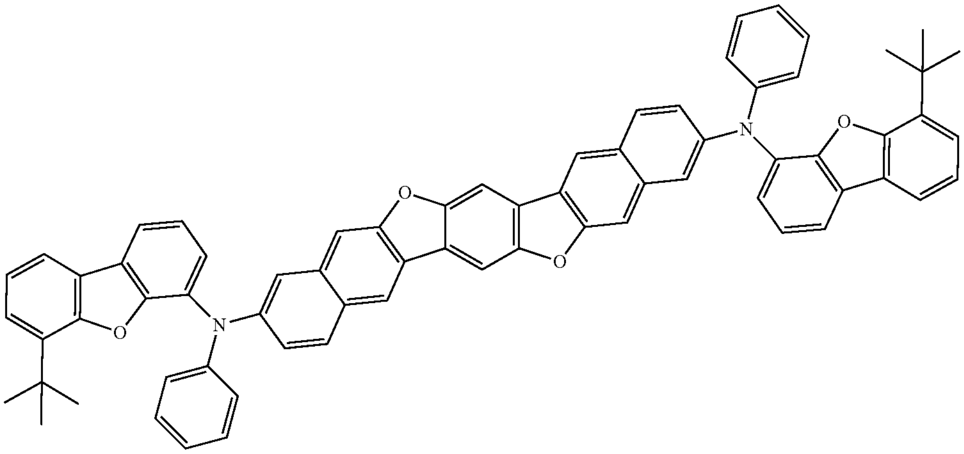
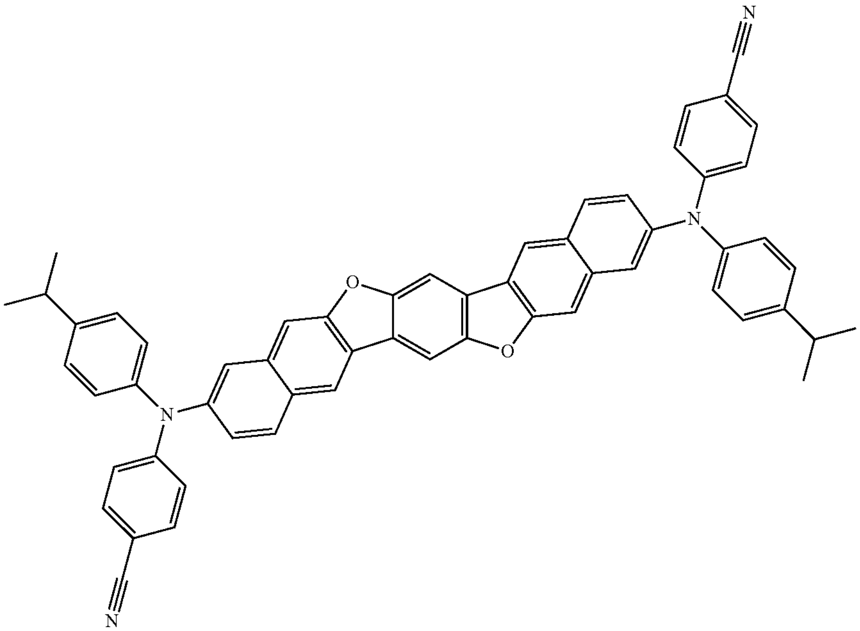
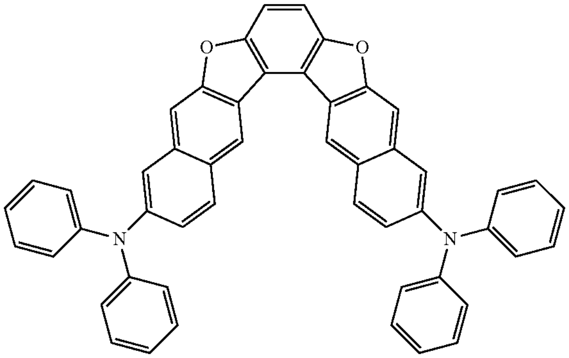
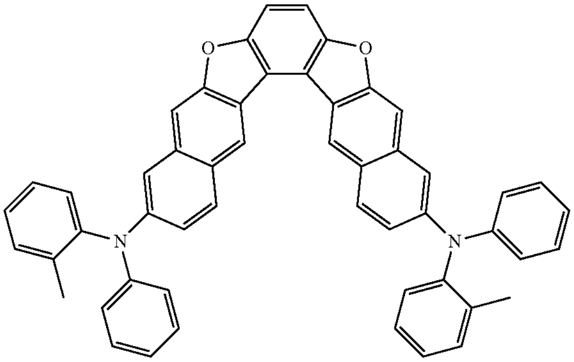

-continued
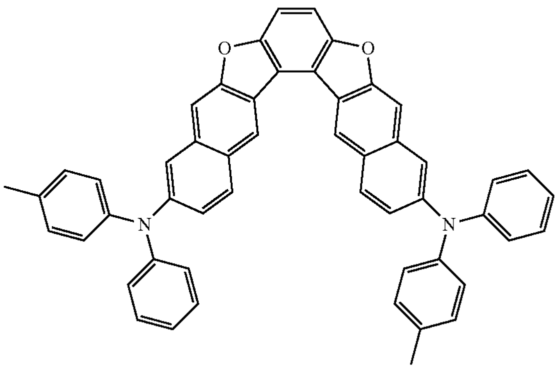
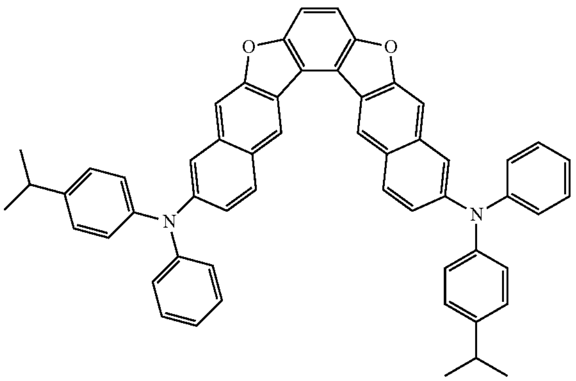
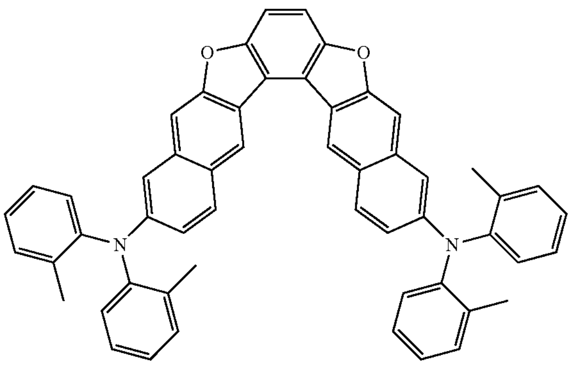
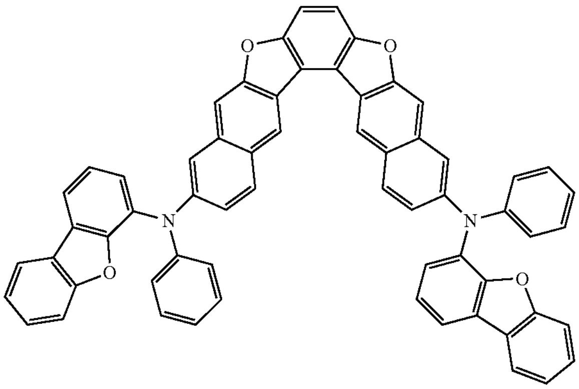
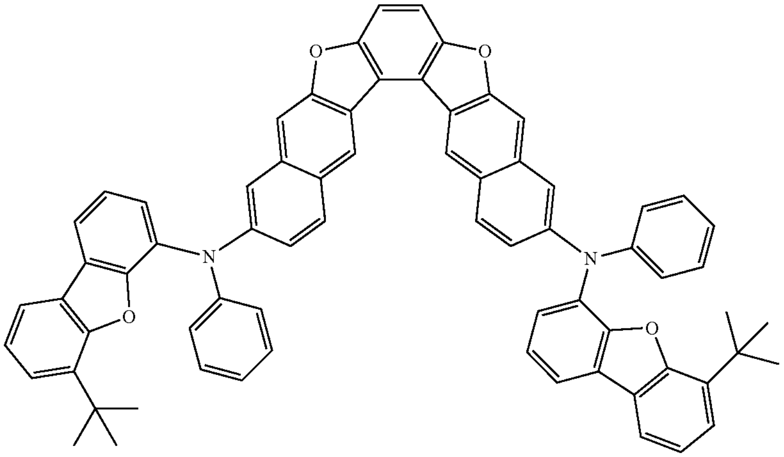
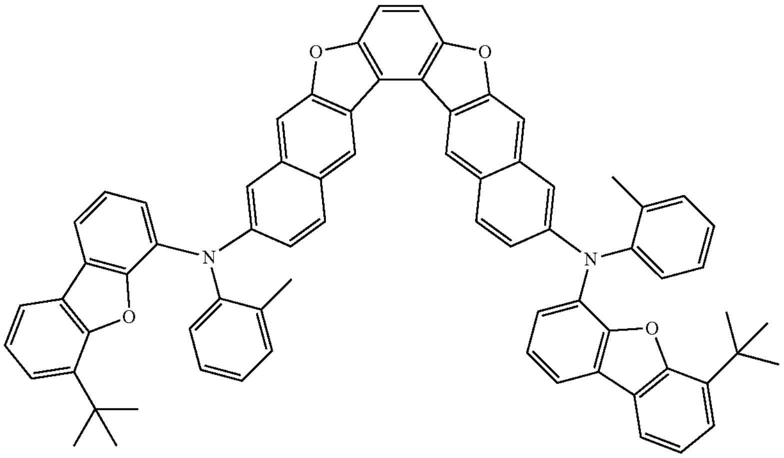

-continued
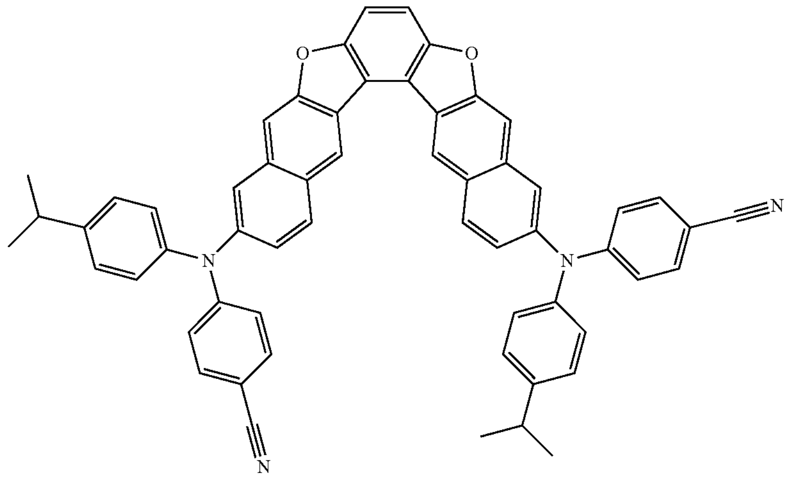
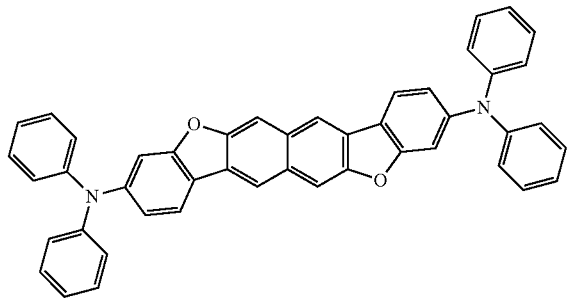
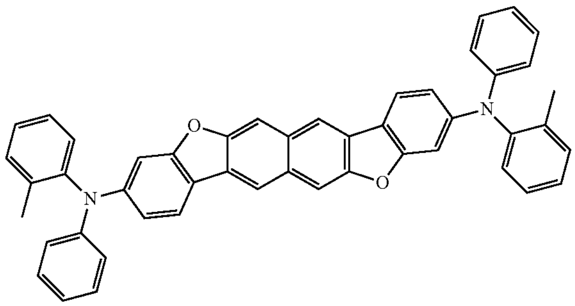
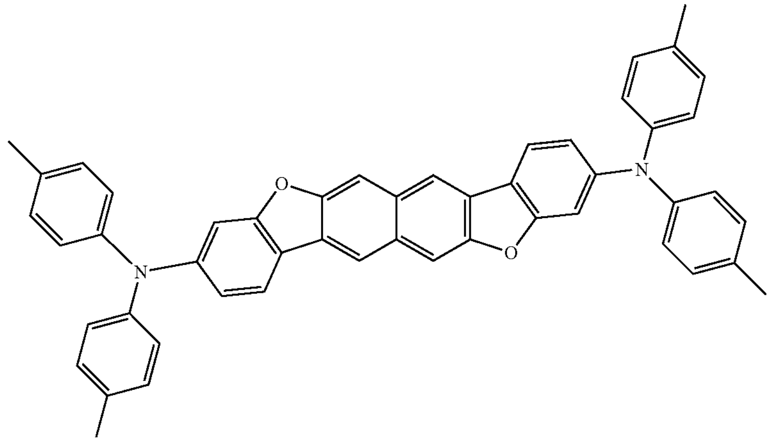
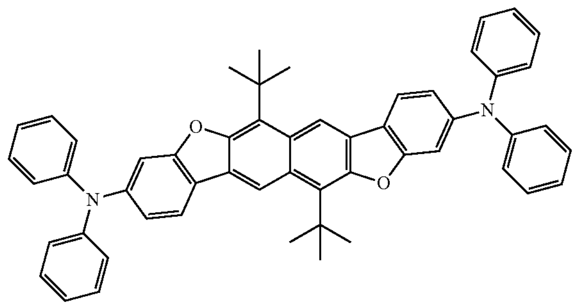
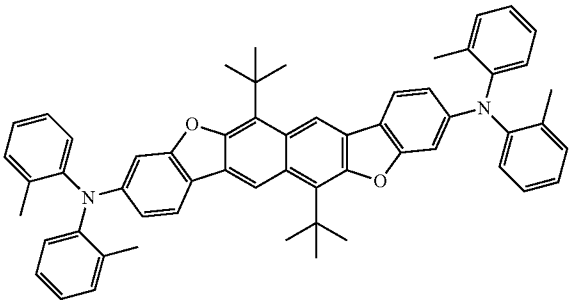

-continued
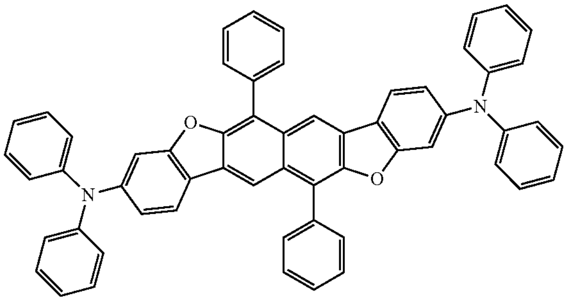
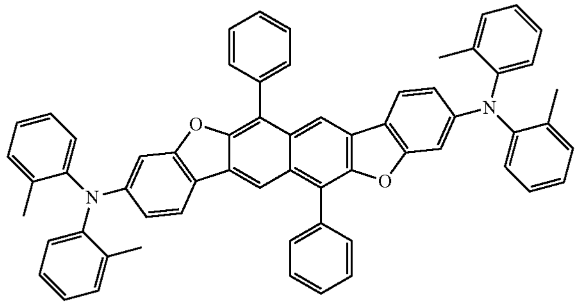
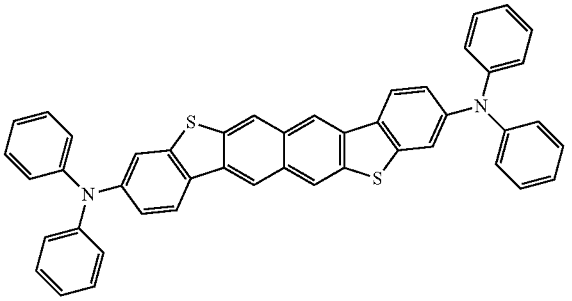
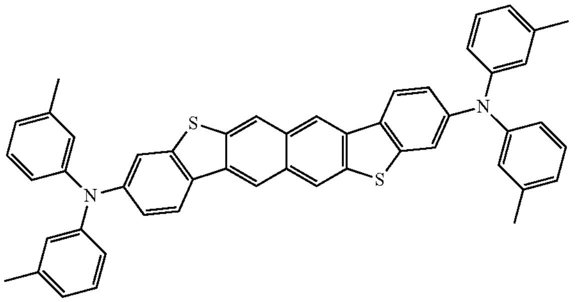
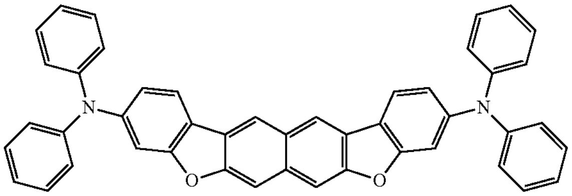
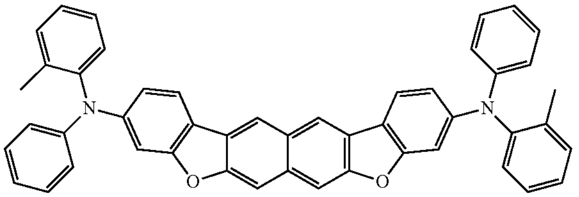
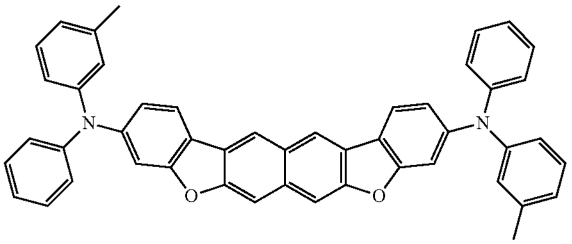
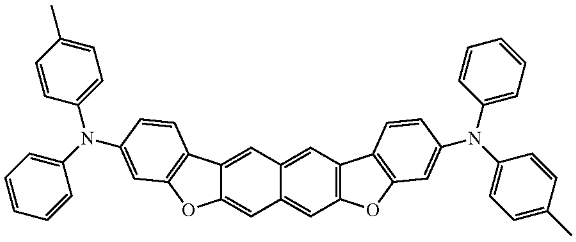
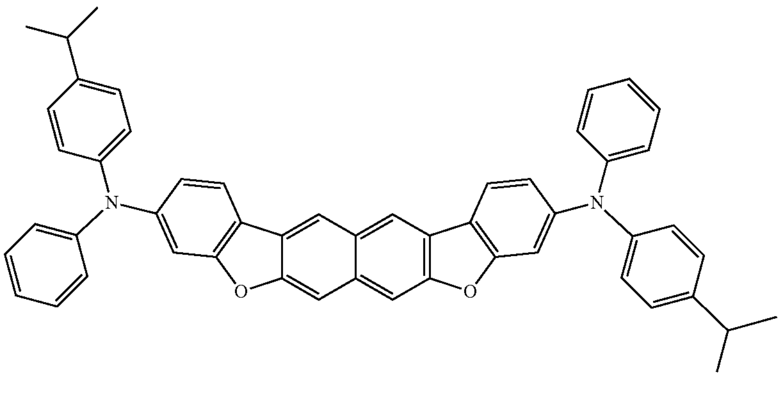

-continued
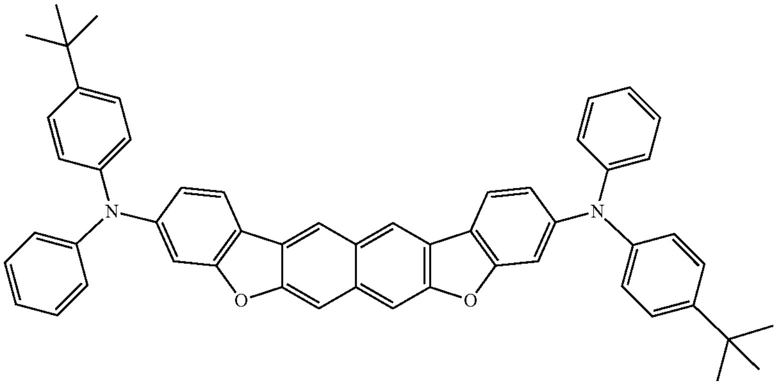
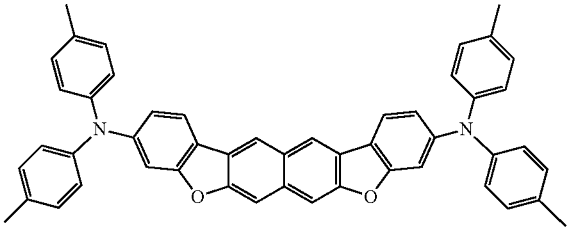
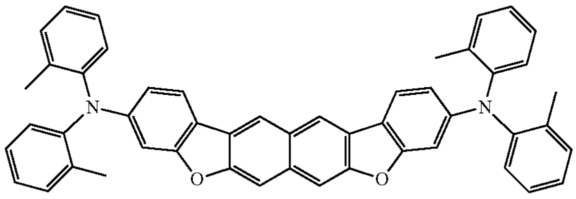
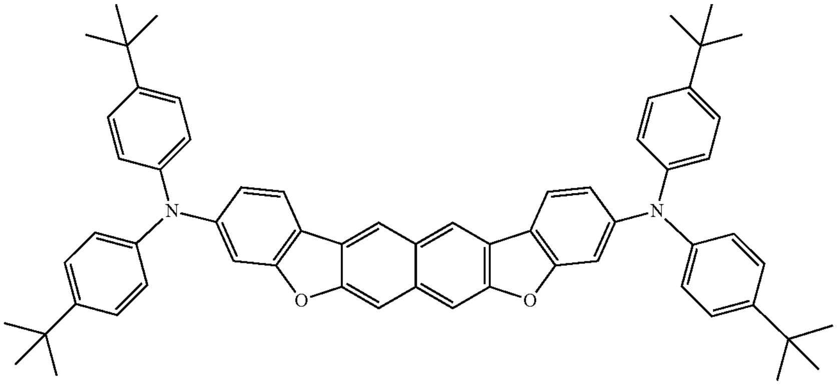
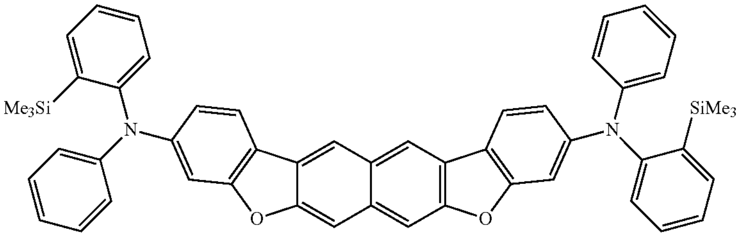
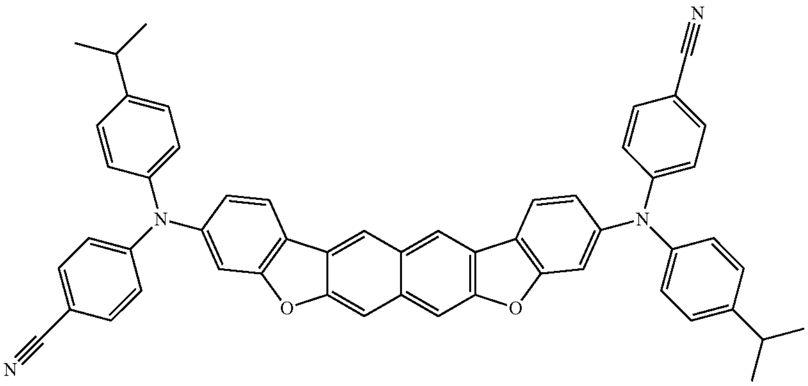

-continued
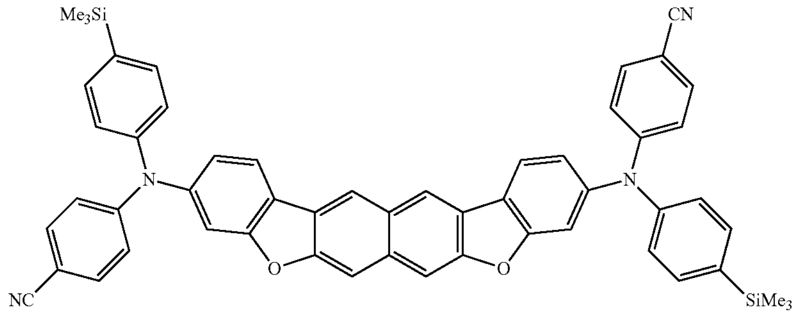
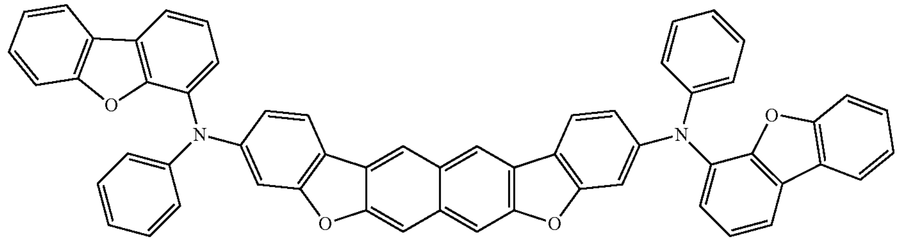
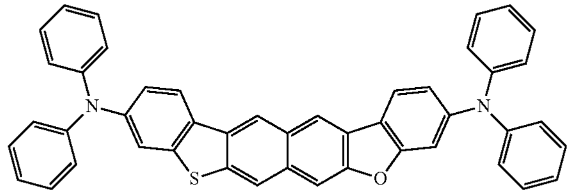
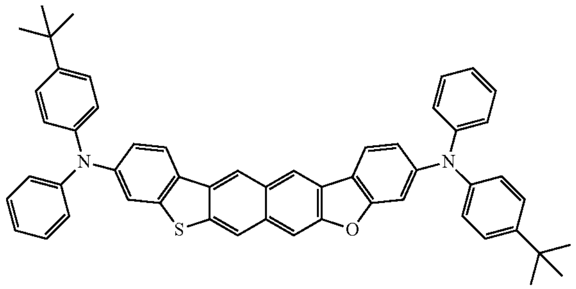
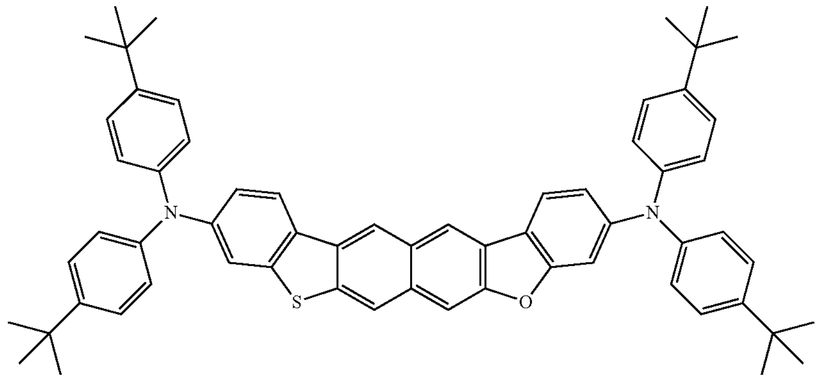
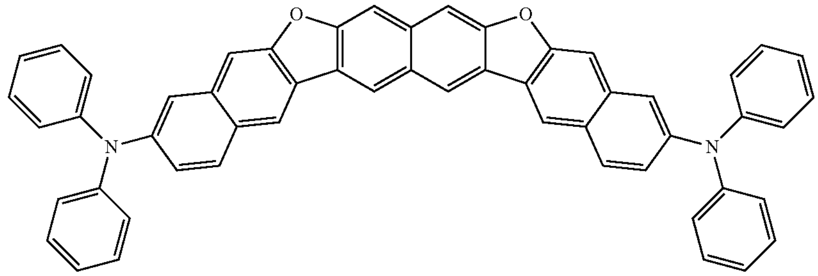

-continued
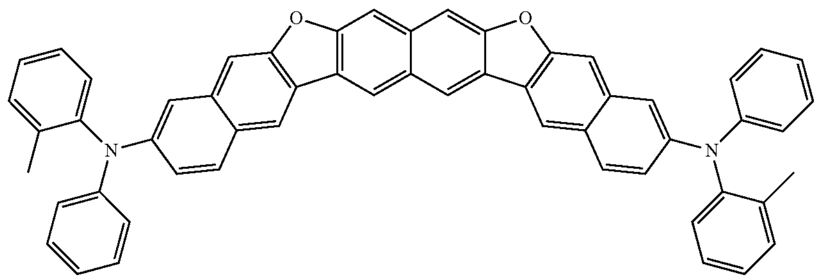
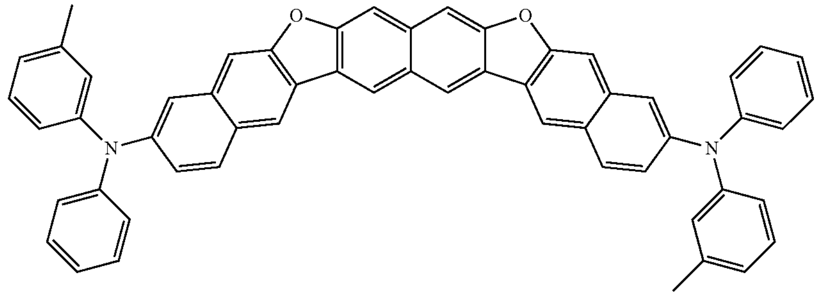
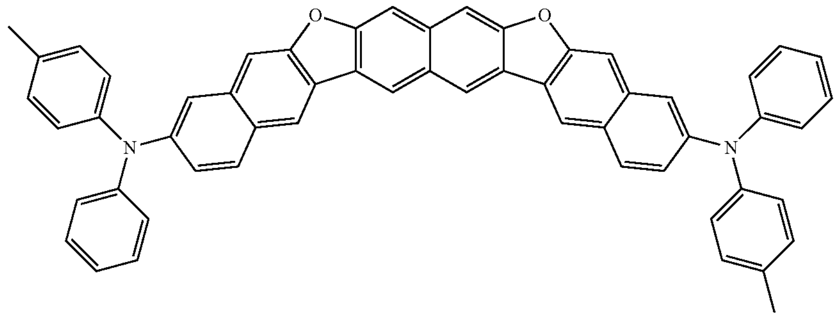
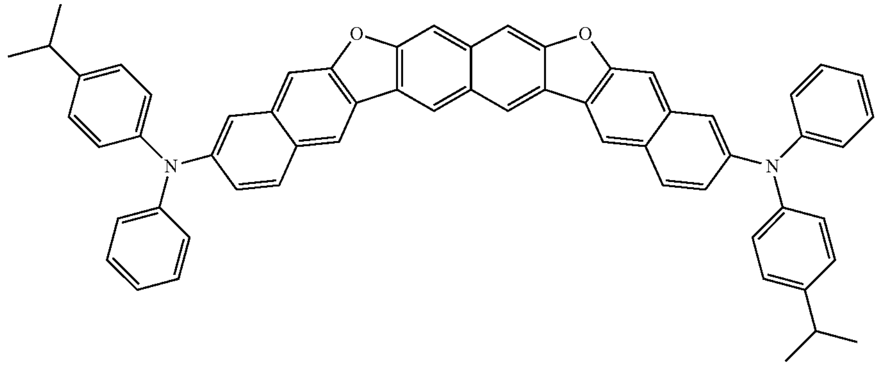
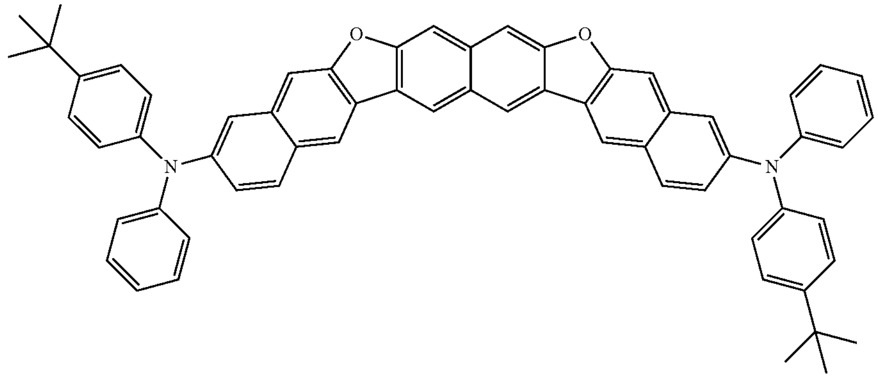

-continued
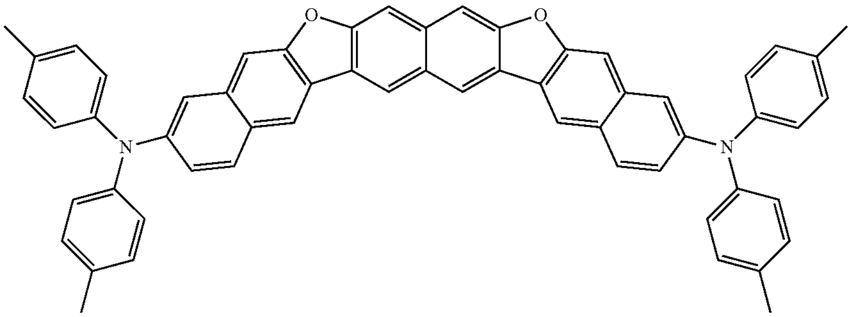
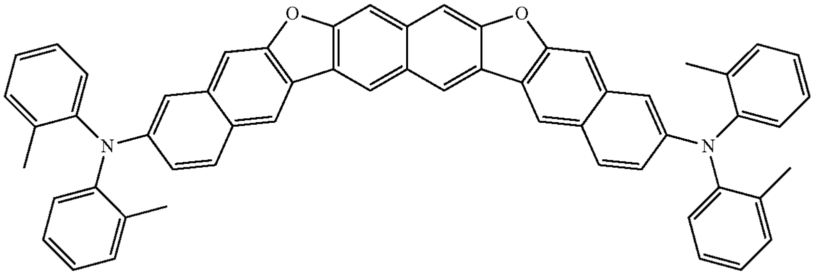
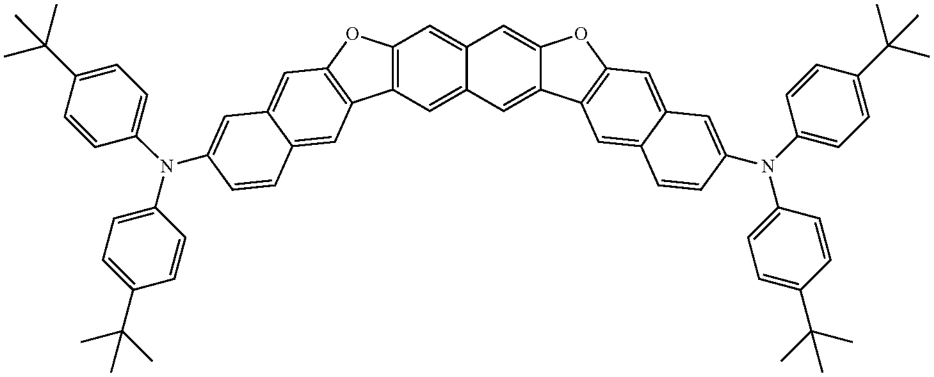
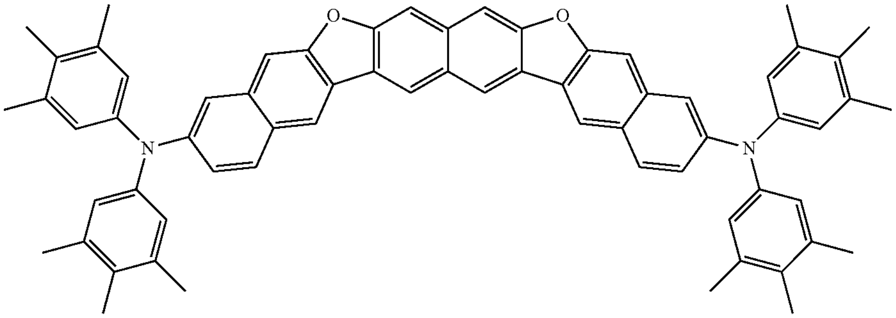
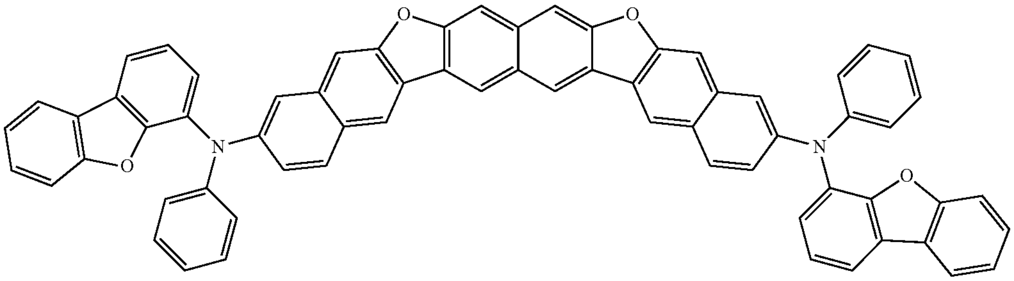

-continued

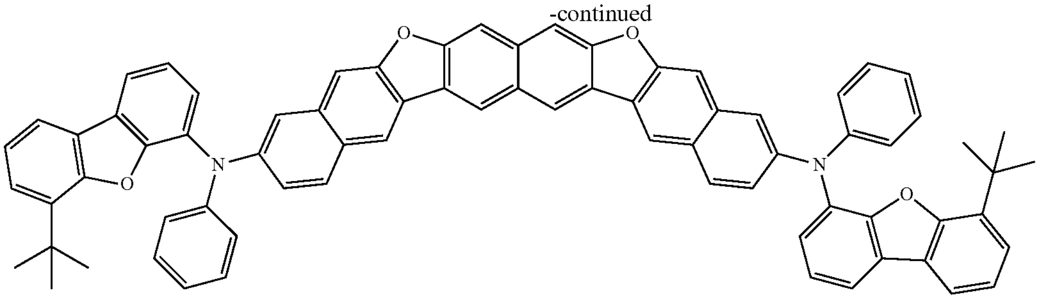

(Second Compound)

The second compound contained in the electron-transporting layer will be described.

(Compound Represented by the Formula (B1))

A compound represented by the formula (B1) will be described.

(B1)

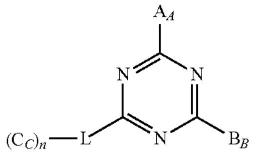

In the formula (B1), $A_A$ is a substituted or unsubstituted aryl group including 6 to 18 ring carbon atoms, or a substituted or unsubstituted monovalent heterocyclic group including 5 to 13 ring atoms.

$B_B$ is a substituted or unsubstituted aryl group including 6 to 18 ring carbon atoms, or a substituted or unsubstituted monovalent heterocyclic group including 5 to 13 ring atoms.

L is a single bond, a substituted or unsubstituted (n+1)-valent aromatic hydrocarbon ring group including 6 to 18 ring carbon atoms, or a substituted or unsubstituted (n+1)-valent heterocyclic group including 5 to 13 ring atoms.

$C_C$'s are independently a substituted or unsubstituted aryl group including 6 to 30 ring carbon atoms, or a substituted or unsubstituted monovalent heterocyclic group including 5 to 60 ring atoms.

n is an integer of 1 to 3.

In the formula (B1) (and formulas (B11), (B12), (B12-1), and (B13) to (B15) described later), it is preferable that $A_A$ be a substituted or unsubstituted aryl group including 6 to 12 ring carbon atoms.

In the formula (B1) (and formulas (B11), (B12), (B12-1), and (B13) to (B15) described later), it is preferable that $A_A$ be a substituted or unsubstituted phenyl group, a substituted or unsubstituted biphenyl group, or a substituted or unsubstituted naphthyl group.

In the formula (B1) (and formulas (B11), (B12), (B12-1), and (B13) to (B15) described later), it is preferable that $A_A$ be a phenyl group, a biphenyl group, or a naphthyl group.

In the formula (B1) (and formulas (B11), (B12), (B12-1), and (B13) to (B15) described later), it is preferable that $B_B$ be a substituted or unsubstituted aryl group including 6 to 12 ring carbon atoms.

In the formula (B1) (and formulas (B11), (B12), (B12-1), and (B13) to (B15) described later), it is preferable that $B_B$ be a substituted or unsubstituted phenyl group, a substituted or unsubstituted biphenyl group, or a substituted or unsubstituted naphthyl group.

In the formula (B1) (and formulas (B11), (B12), (B12-1), and (B13) to (B15) described later), it is preferable that $B_B$ be a phenyl group, a biphenyl group, or a naphthyl group.

In the formula (B1) (and formulas (B11), (B12), (B12-1), and (B13) to (B15) described later), it is preferable that $C_C$ be a substituted or unsubstituted aryl group including 13 to 35 ring carbon atoms.

In the formula (B1) (and formulas (B11), (B12), (B12-1), and (B13) to (B15) described later), it is preferable that $C_C$ be a substituted or unsubstituted aryl group including 14 to 24 ring carbon atoms.

In the formula (B1) (and the formulas (B14) to (B15) described later), it is preferable that L be an aromatic hydrocarbon ring group represented by the following formula (L1) or (L2):

(L1)

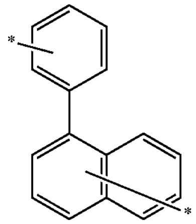

(L2)

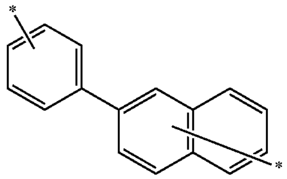

In the formula (L1) or (L2), one of two *'s is bonded with a triazine ring in the formula (B1) and the other is bonded with (C)n in the formula (B1); and when n is an integer of 1 to 3, one to three *'s which are bonded with (C)n are present.

In addition, in the formula (B1) (and formulas (B14) to (B15) described later), it is preferable that L be a single bond or a substituted or unsubstituted (n+1)-valent aromatic hydrocarbon ring group including 6 to 12 ring carbon atoms.

In addition, in the formula (B1) (and formulas (B14) to (B15) described later), it is preferable that L be a single bond.

In one embodiment, the compound represented by the formula (B1) is a compound represented by the following formula (B11) or formula (B12).

(B11)

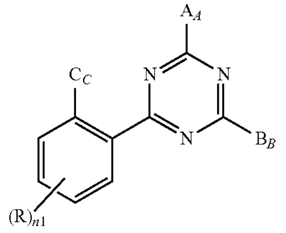

In the formula (B11), $A_A$, $B_B$, and $C_C$ are as defined in the formula (B1).

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$, to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n1 is an integer of 0 to 4.

When a plurality of R's are present, the plurality of R's may be the same as or different from each other.

(B12)

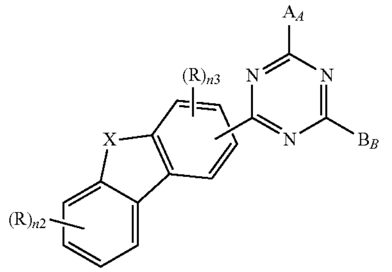

In the formula (B12), $A_A$ and $B_B$ are as defined in the formula (B1).

X is $CR_1R_2$, $NR_3$, an oxygen atom, or a sulfur atom.

When X is $CR_1R_2$, $R_1$ and $R_2$ form a substituted or unsubstituted, saturated or unsaturated ring by bonding with each other, or do not form a substituted or unsubstituted, saturated or unsaturated ring.

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R, $R_1$, and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n2 is an integer of 0 to 4, and n3 is an integer of 0 to 3.

When a plurality of R's are present, the plurality of R's may be the same as or different from each other.

In one embodiment, the compound represented by the formula (B1) is a compound represented by the following formula (B12-1).

(B12-1)

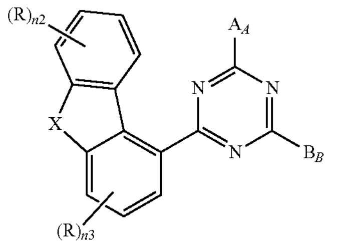

In the formula (B12-1), $A_A$, $B_B$, X, R, $R_1$, $R_2$, $R_3$, n2, and n3 are as defined in the formula (B12).

In one embodiment, the compound represented by the formula (B1) is a compound represented by the following formula (B13).

(B13)

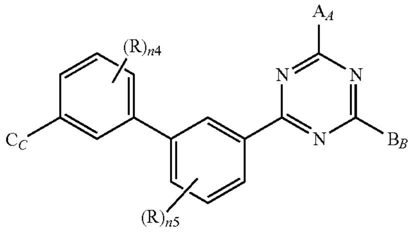

In the formula (B13), $A_A$, $B_B$, and $C_C$ are as defined in the formula (B1).

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n4 and n5 are independently an integer of 0 to 4.

When a plurality of R's are present, the plurality of R's may be the same as or different from each other.

In one embodiment, the compound represented by the formula (B1) is a compound represented by the following formula (B14).

(B14)

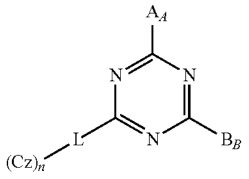

In the formula (B14), $A_A$ and $B_B$ are as defined in the formula (B1).

L is a single bond, a substituted or unsubstituted (n+1)-valent aromatic hydrocarbon ring group including 6 to 18 ring carbon atoms, or a substituted or unsubstituted (n+1)-valent heterocyclic group including 5 to 13 ring atoms.

Cz is a group represented by any one of the following formulas (Cz1), (Cz2), and (Cz3).

n is an integer of 1 to 3.

(Cz1)

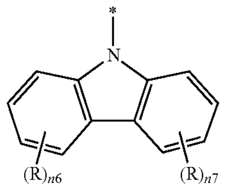

(Cz2)

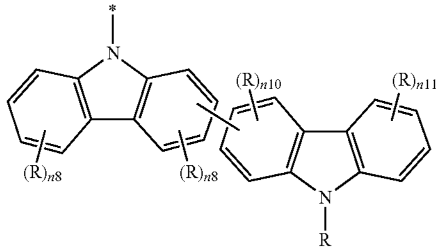

(Cz3)

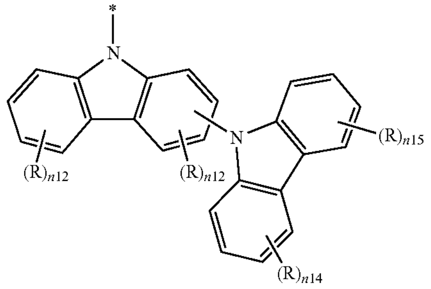

In the formulas (Cz1), (Cz2), and (Cz3), when a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n6 and n7 are independently an integer of 0 to 4;

n8 and n11 are independently an integer of 0 to 4, and n9 and n10 are independently an integer of 0 to 3.

n12, n14, and n15 are independently an integer of 0 to 4, and n13 is an integer of 0 to 3.

When a plurality of R's are present, the plurality of R's may be the same as or different from each other.

* is a single bond which bonds with L.

In one embodiment, the compound represented by the formula (B1) is a compound represented by the following formula (B15).

(B15)

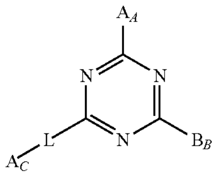

In the formula (B15), $A_A$ and $B_B$ are as defined in the formula (B1).

L is a single bond, a substituted or unsubstituted divalent aromatic hydrocarbon ring group including 6 to 18 ring carbon atoms, or a substituted or unsubstituted divalent heterocyclic group including 5 to 13 ring atoms.

Ac is a group represented by any one of the following formulas (Ac1), (Ac2), and (Ac3).

(Ac1)

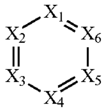

(Ac2)

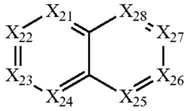

(Ac3)

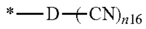

In the formula (Ac1), any one of $X_1$ to $X_6$ is bonded with L, one or more thereof are nitrogen atoms, and the rest which bonded with L nor a nitrogen atom are CR.

R is a hydrogen atom, a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

When a plurality of R's are present, the plurality of R's may be the same as or different from each other.

In the formula (Ac2), one or more of $X_{21}$ to $X_{28}$ are a nitrogen atom, the rest which are not a nitrogen atom are CR, and any one of R's is a single bond which bonds with L.

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R which neither form the substituted or unsubstituted, saturated or unsaturated ring nor is the single bond which bonds with L a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

When a plurality of R's are present, the plurality of R's may be the same as or different from each other.

In the formula (Ac3),

D is an aryl group including 6 to 18 ring carbon atoms substituted by n16 cyano groups, or a heteroaryl group including 5 to 13 ring atoms substituted by n16 cyano groups; provided that D may have a substituent other than a cyano group.

n16 represents the number of cyano groups (CN) substituting D and is an integer of 1 to 9.

* is a single bond which bonds with L.

In the compounds represented by the formulas (B1), (B11), (B12), (B12-1), and (B13) to (B15), all of the "substituted or unsubstituted" groups and rings are preferably "unsubstituted" groups or rings.

Examples of the compound represented by the formula (B1) include, for example, compounds shown below as specific examples.

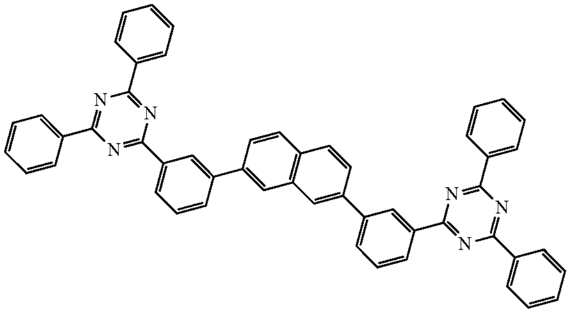
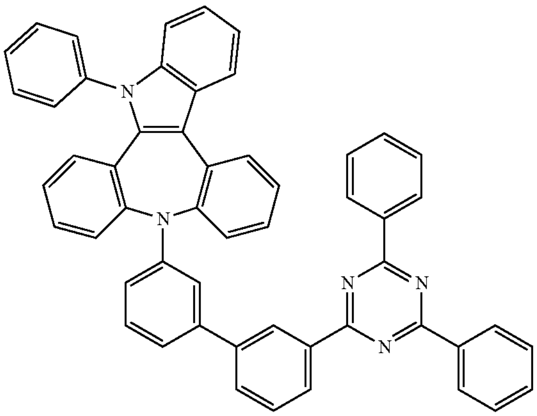
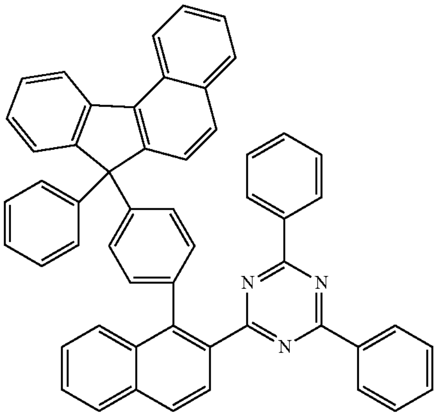
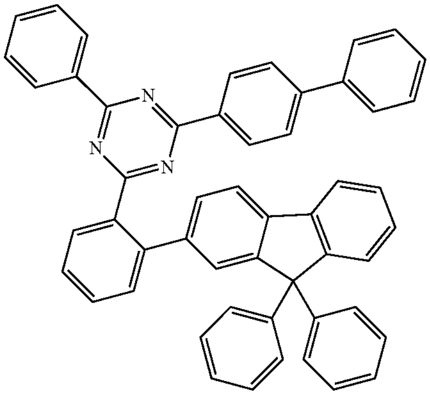
-continued
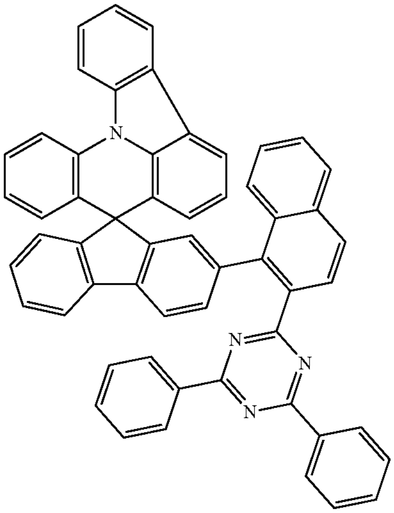
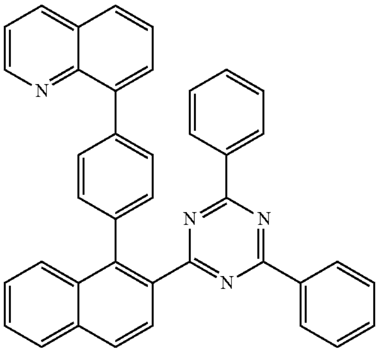
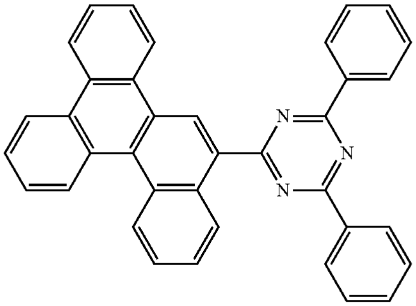
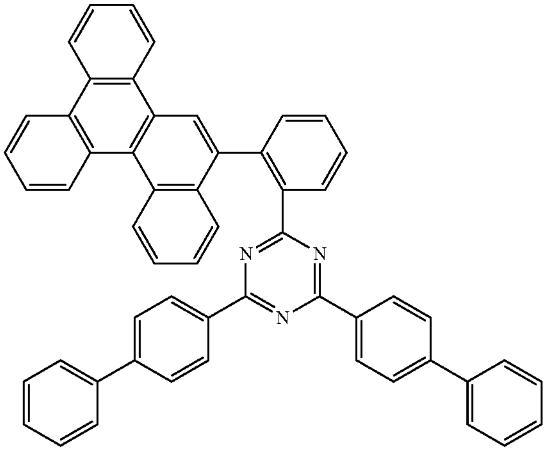

-continued
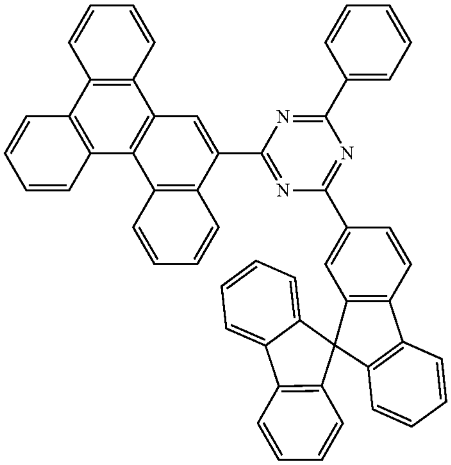
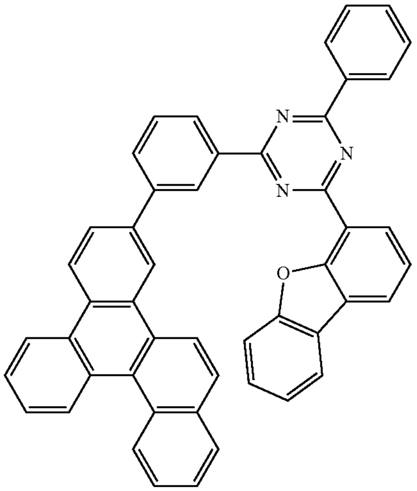
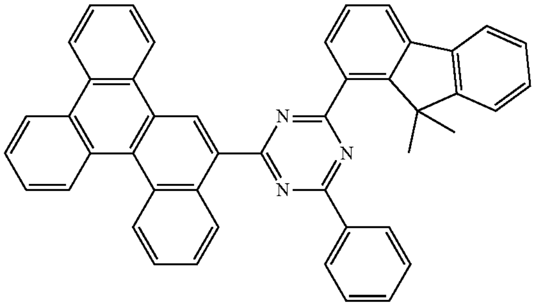
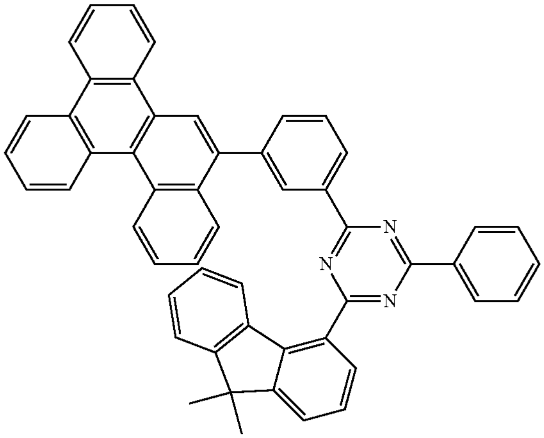
-continued
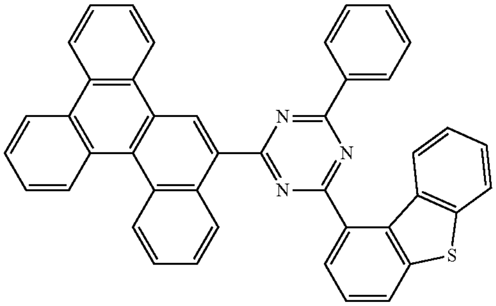
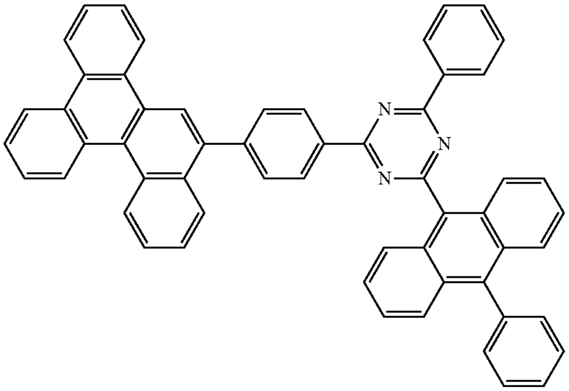
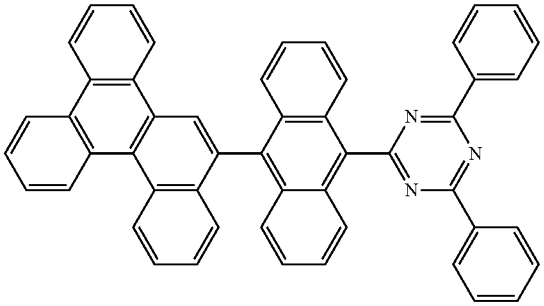
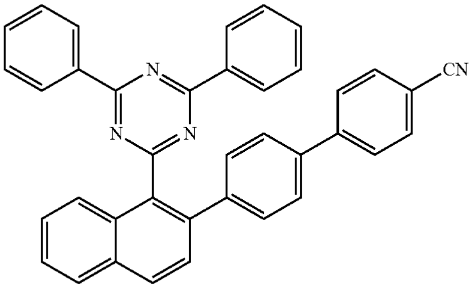
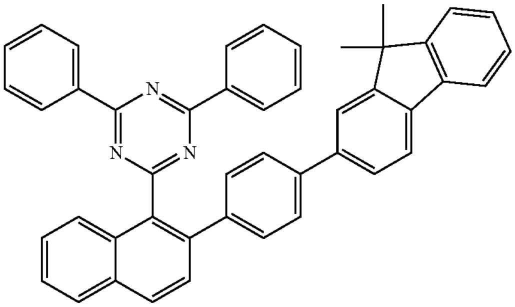

-continued
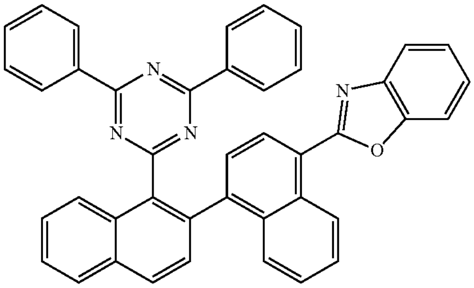
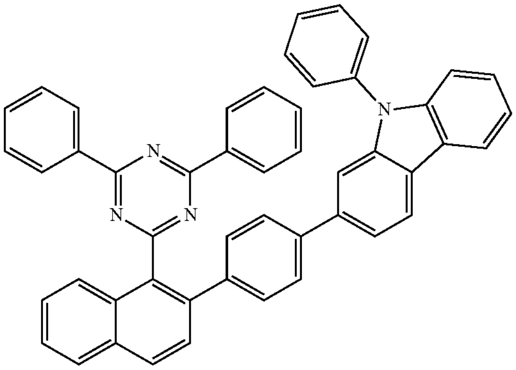
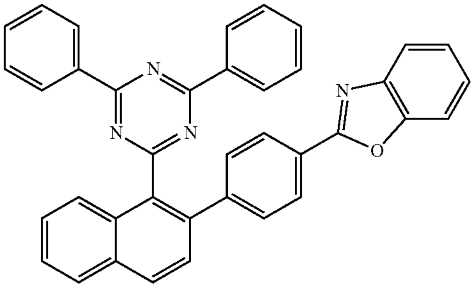
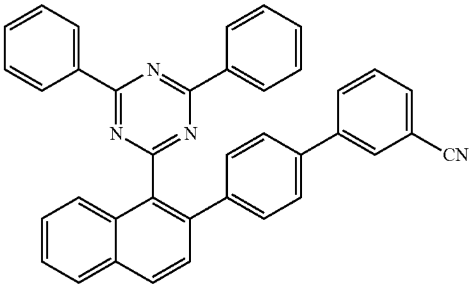
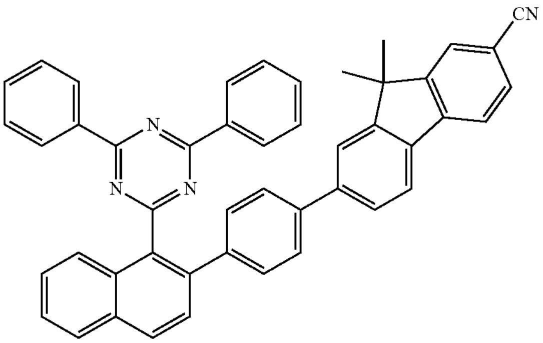
-continued
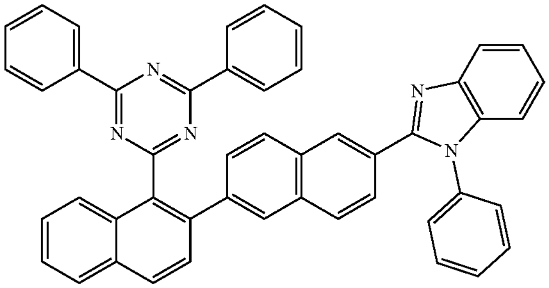
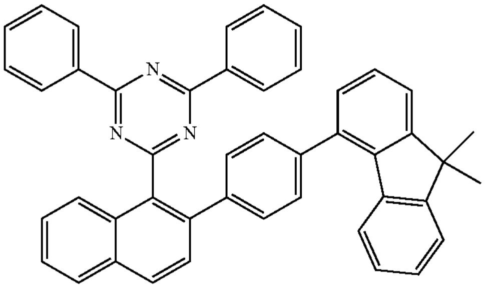
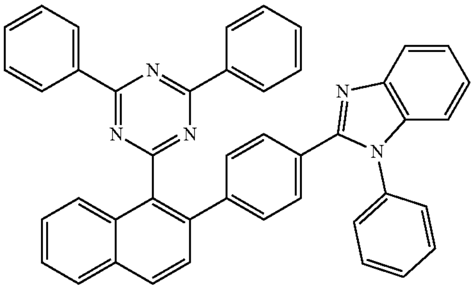
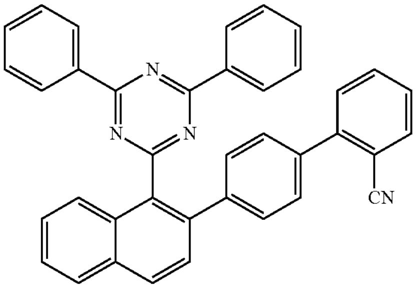
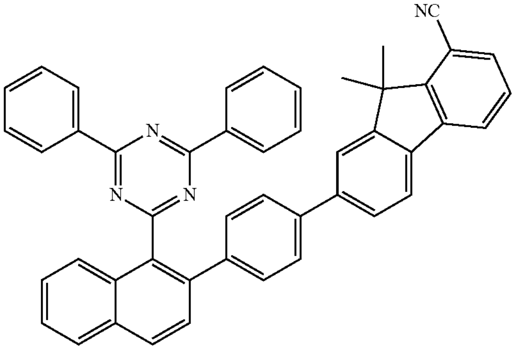

-continued
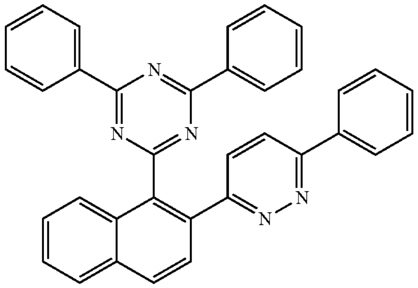
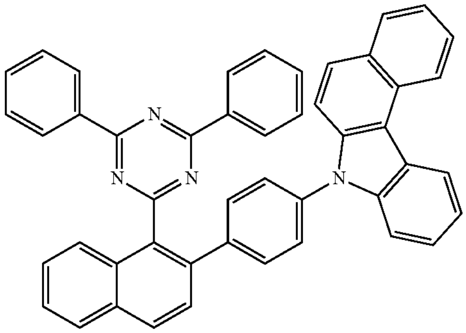
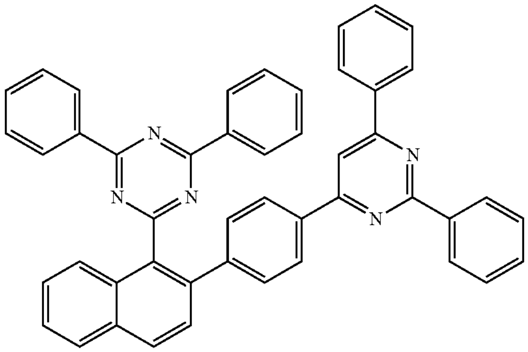
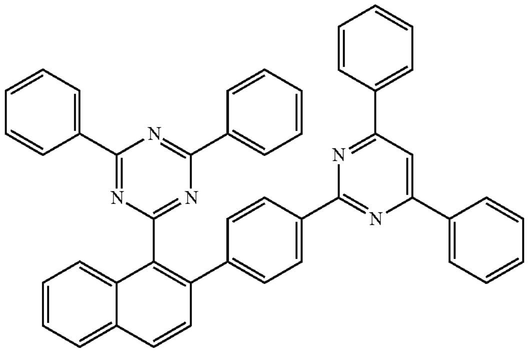
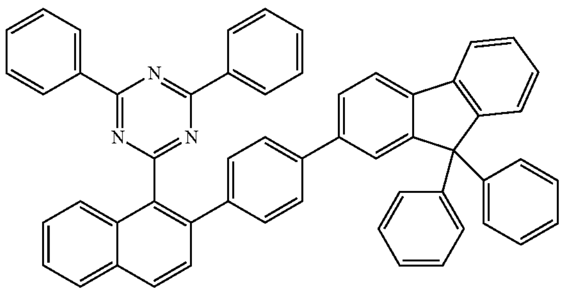
-continued
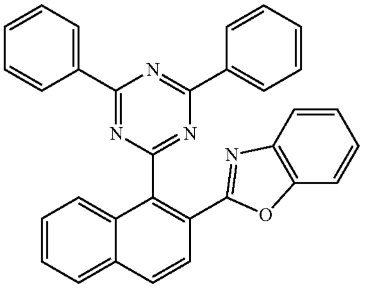
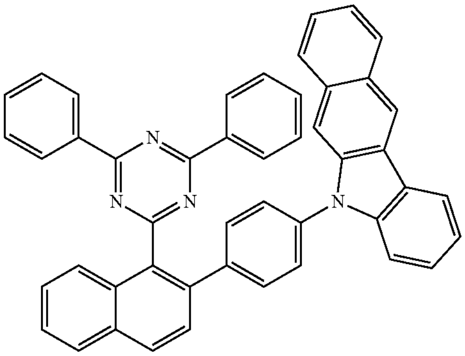
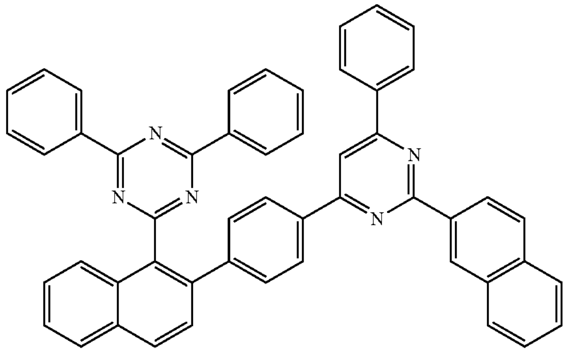
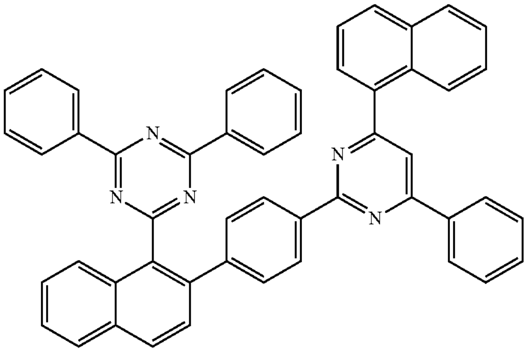
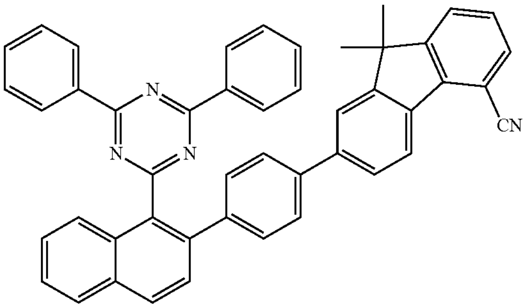

-continued
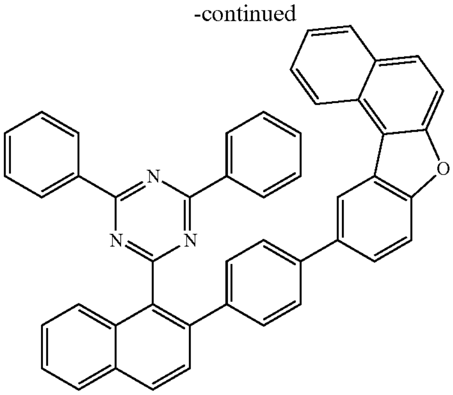
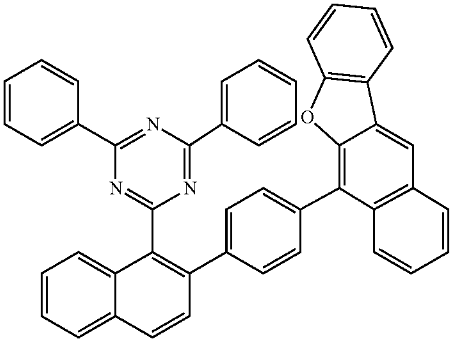
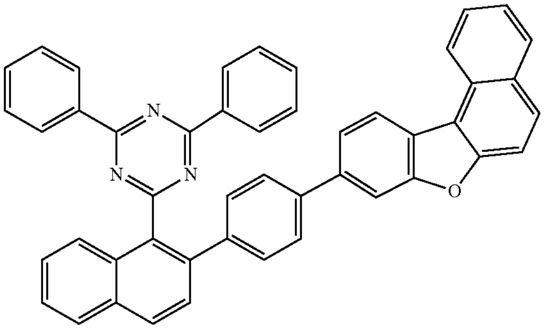
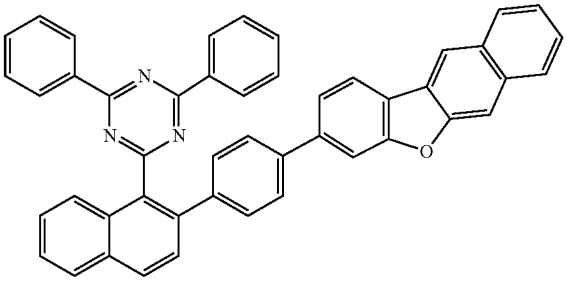
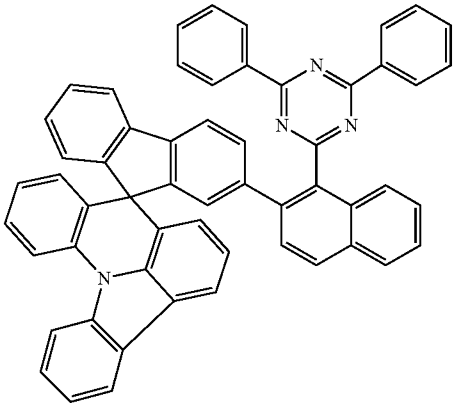
-continued
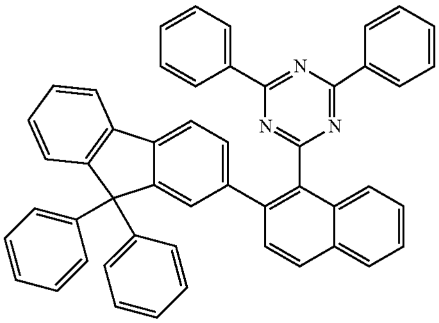
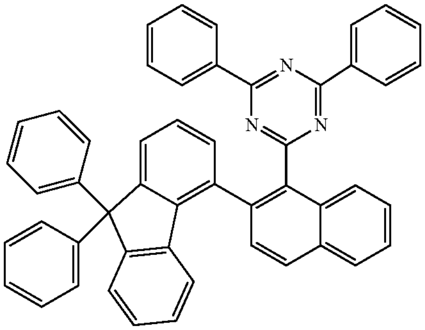
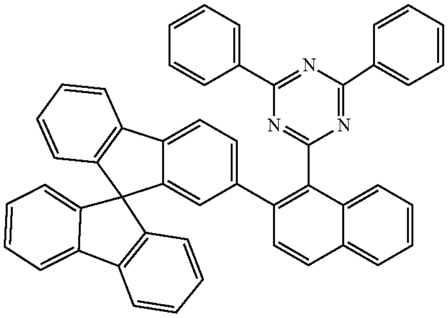
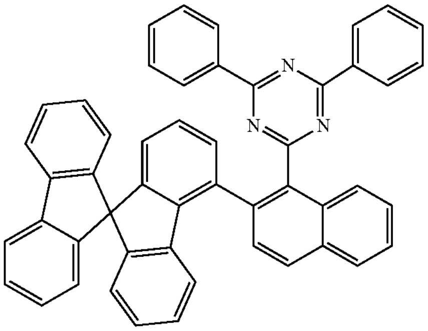
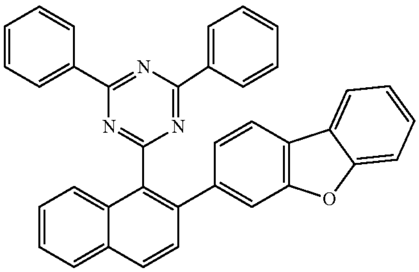

-continued
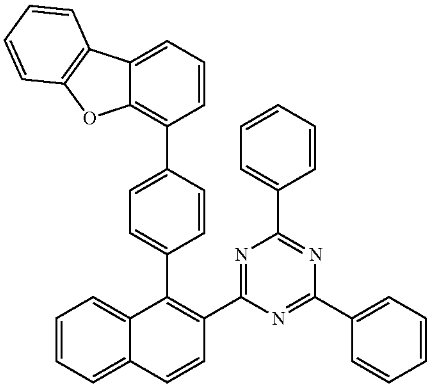
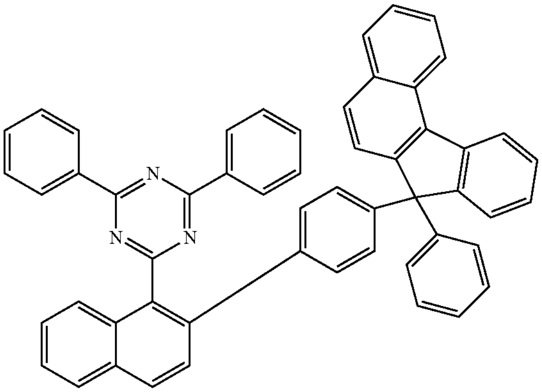
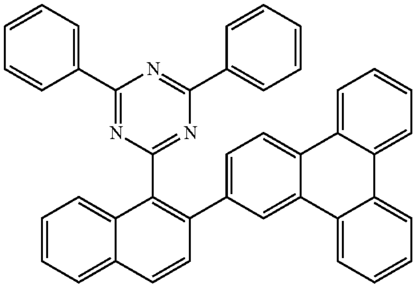
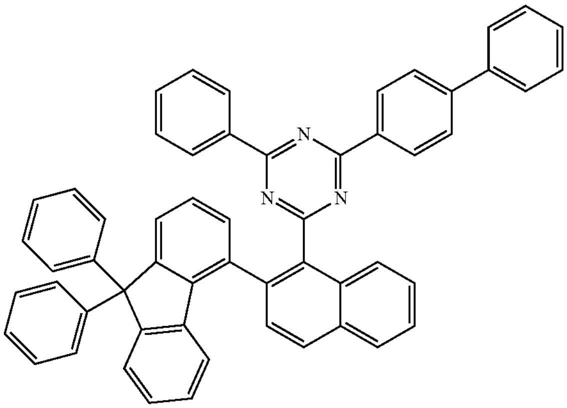
-continued
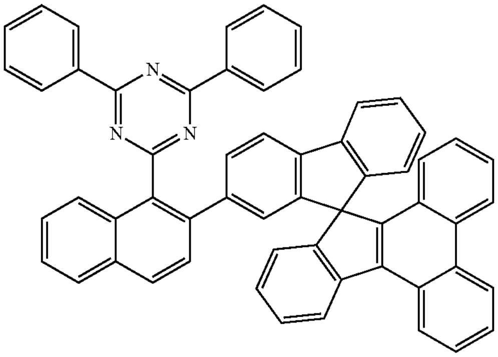
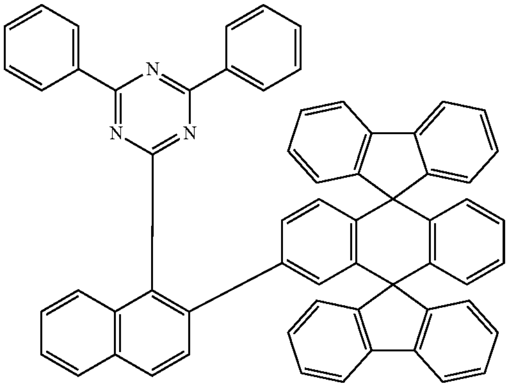
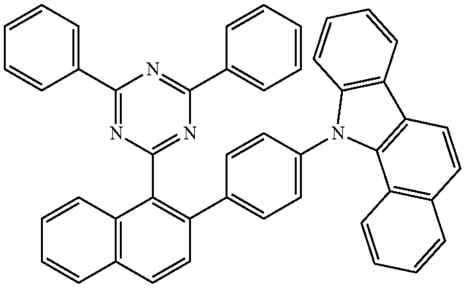
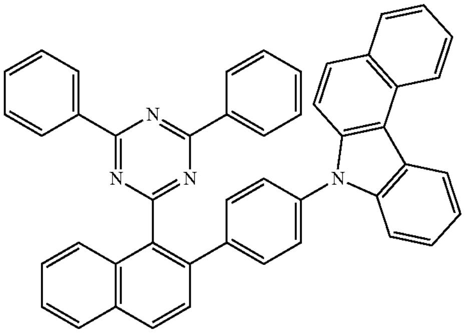
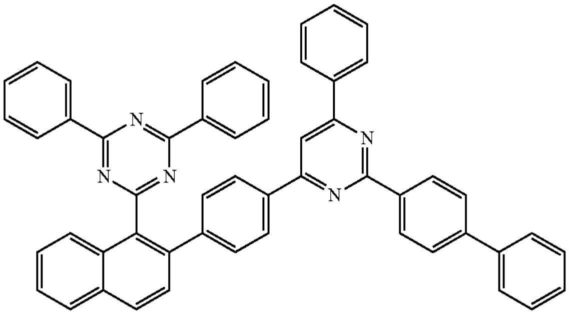

-continued
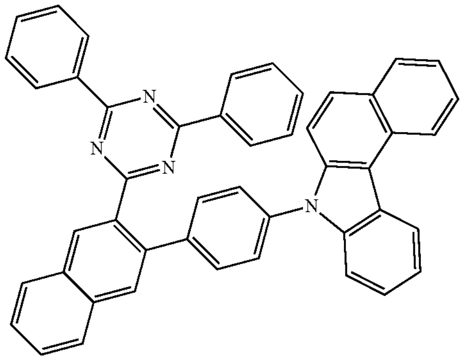
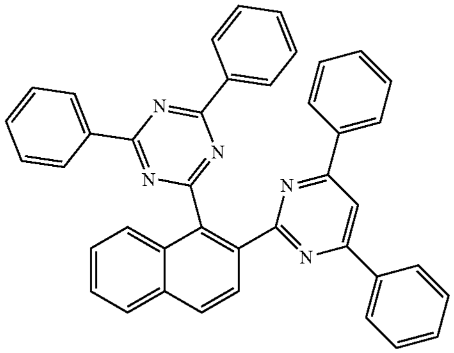
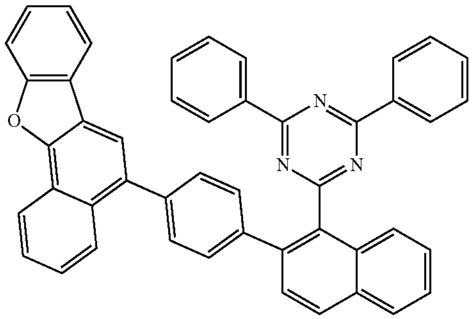
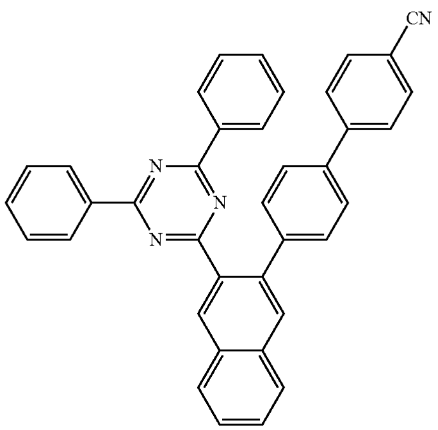
-continued
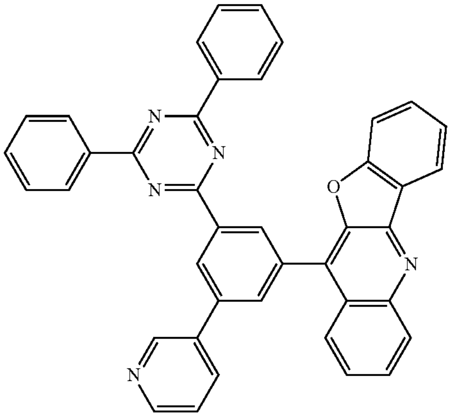
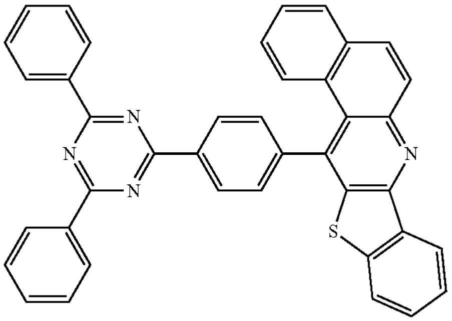
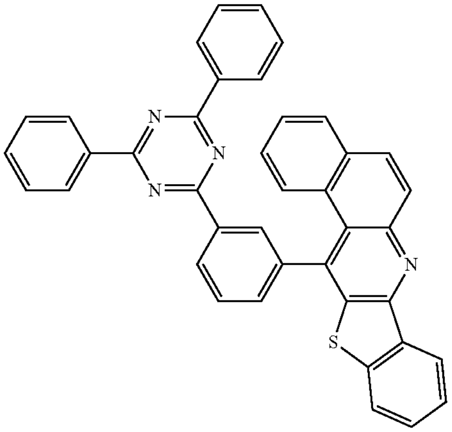
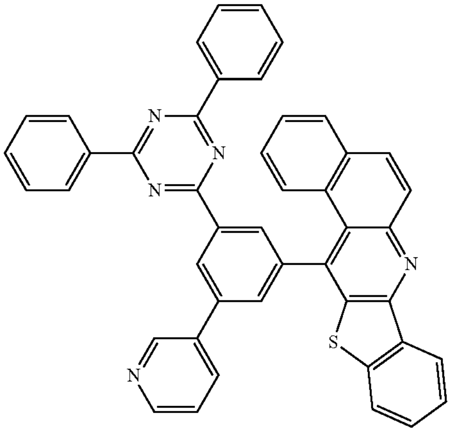

-continued
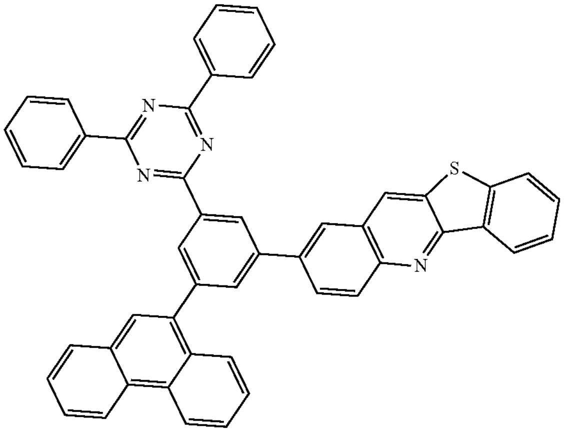
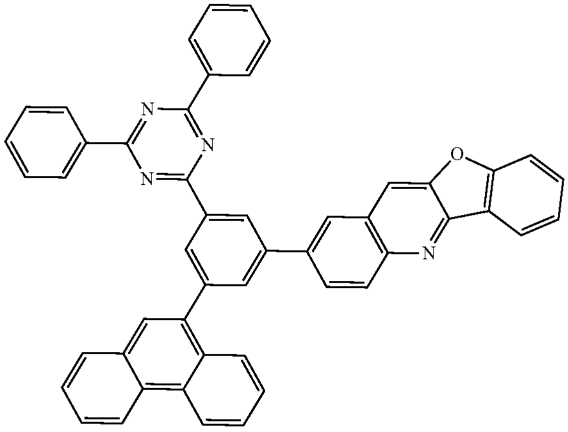
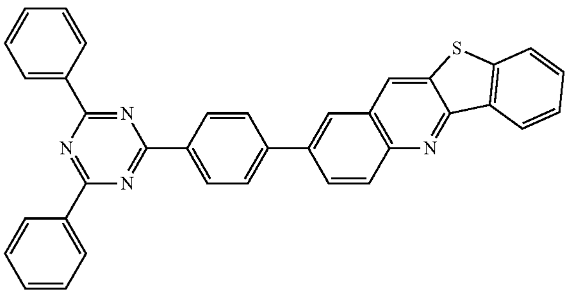
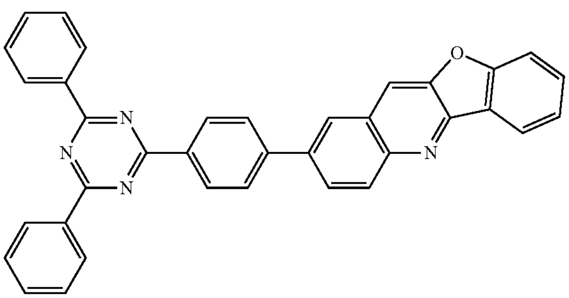
-continued
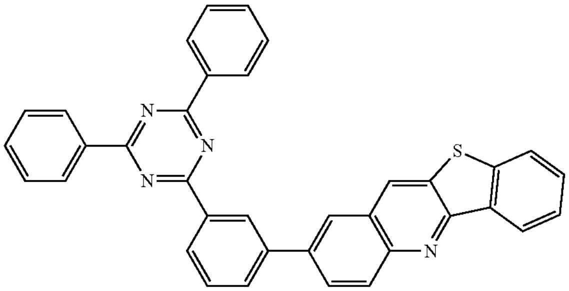
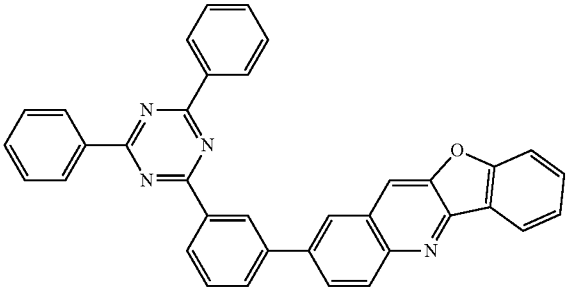
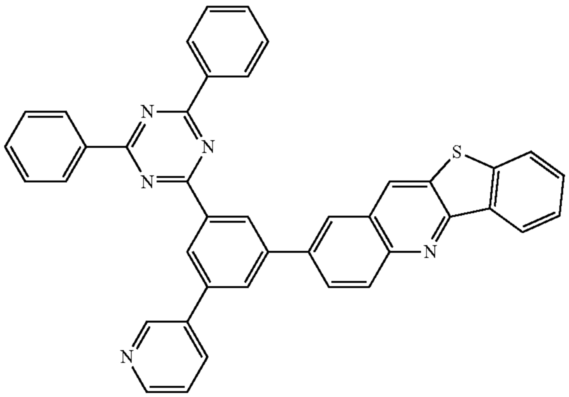
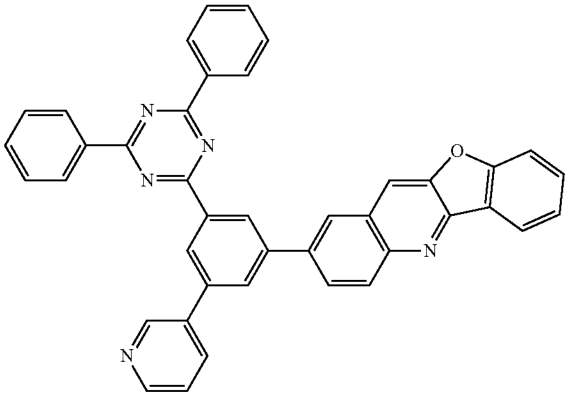

-continued
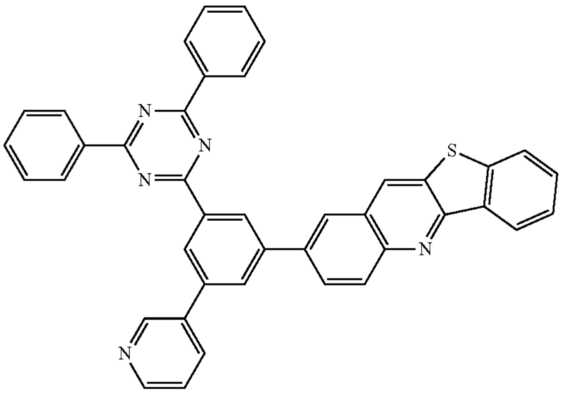
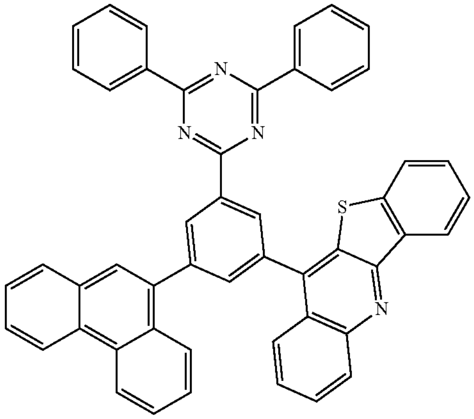
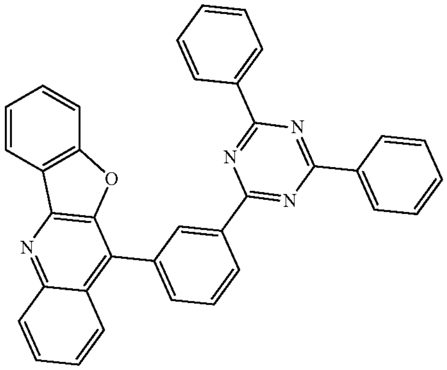
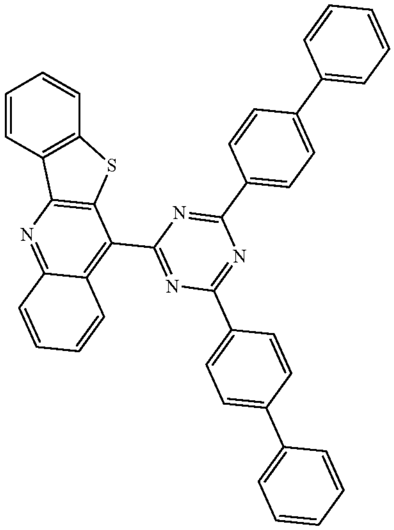
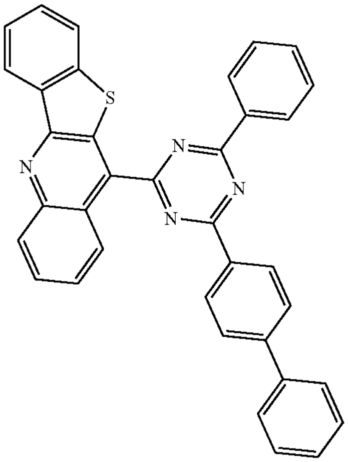
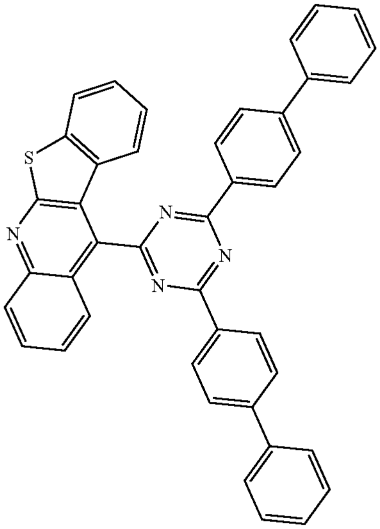
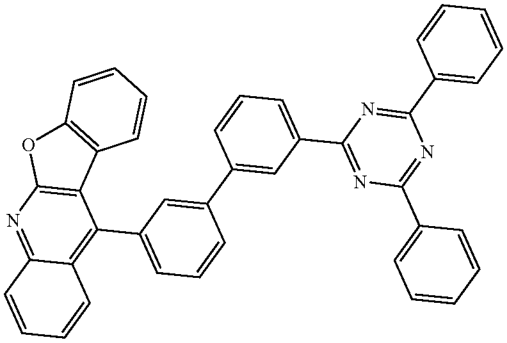
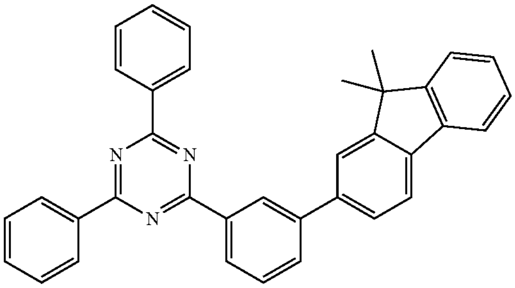

-continued
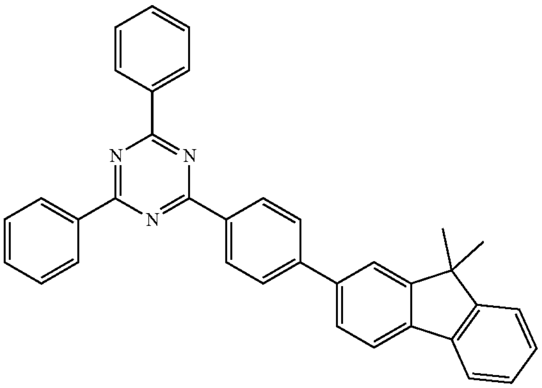
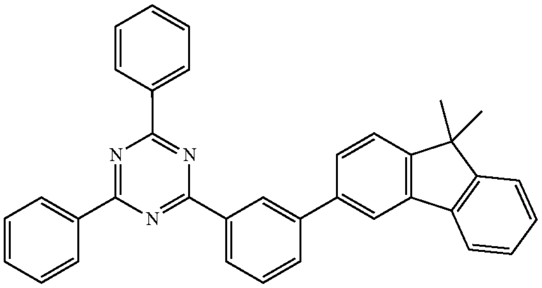
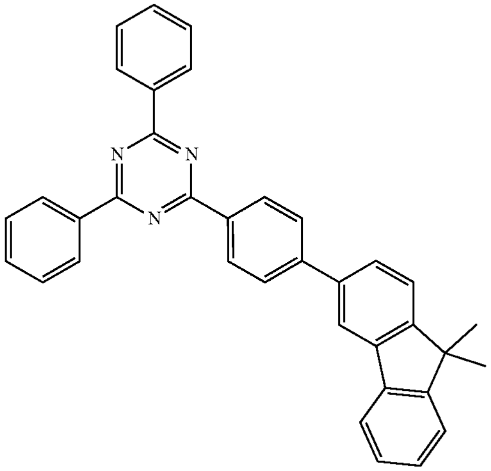
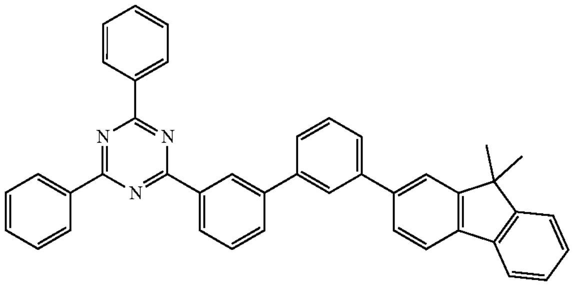
-continued
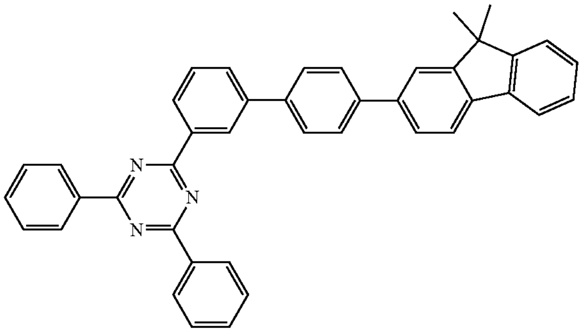
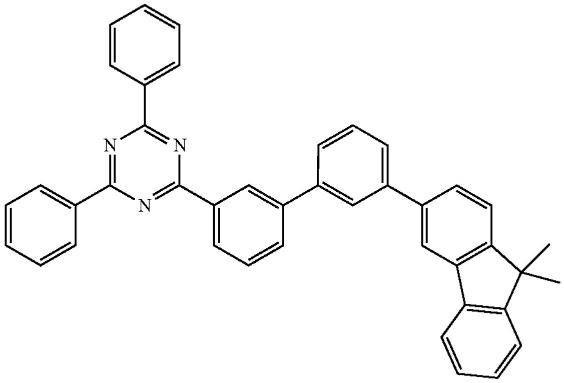
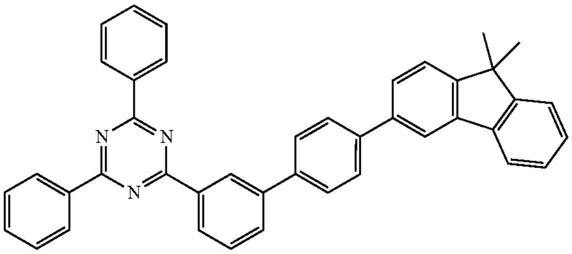
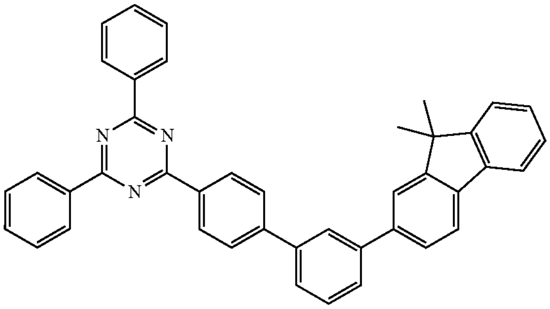
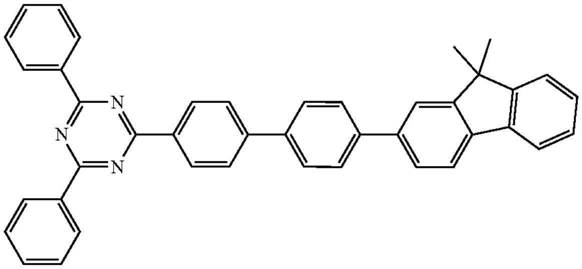

-continued
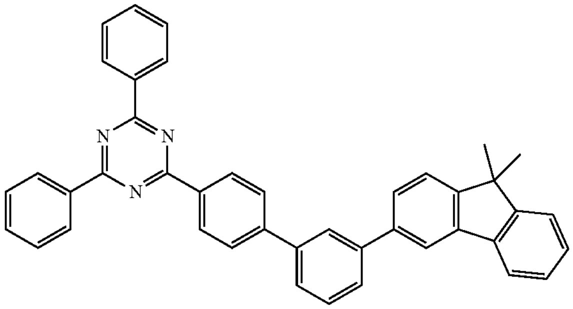
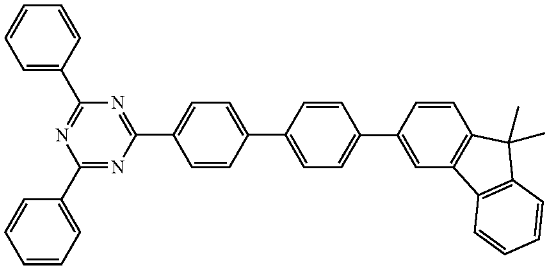
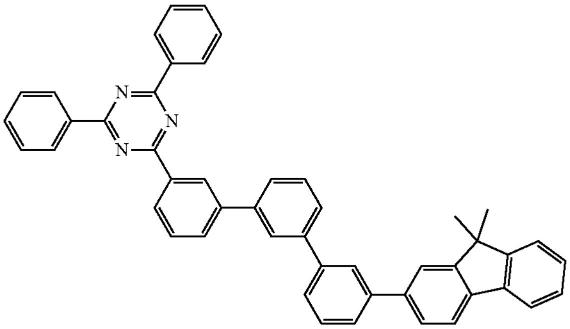
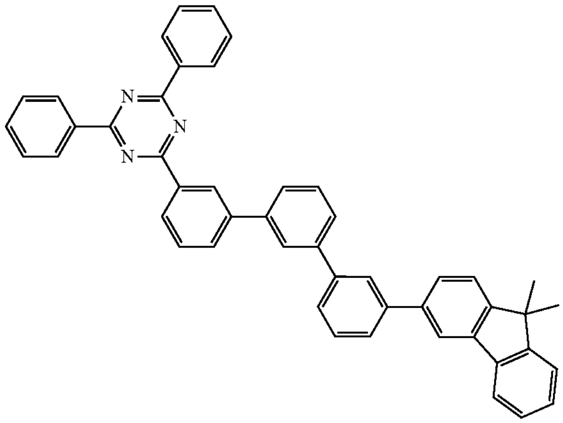
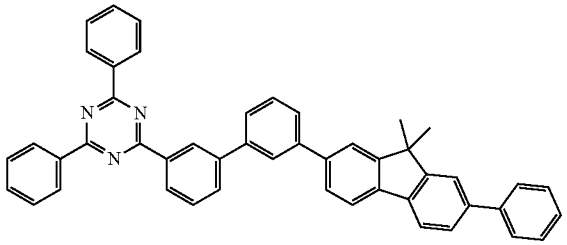
-continued
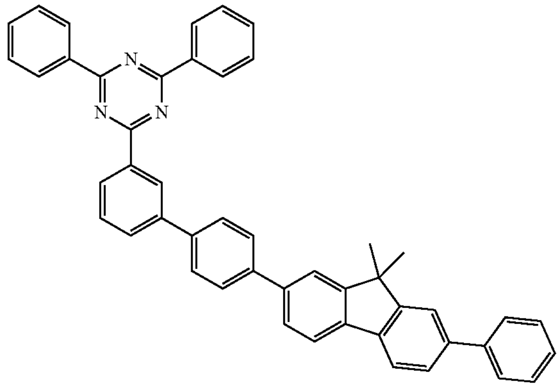
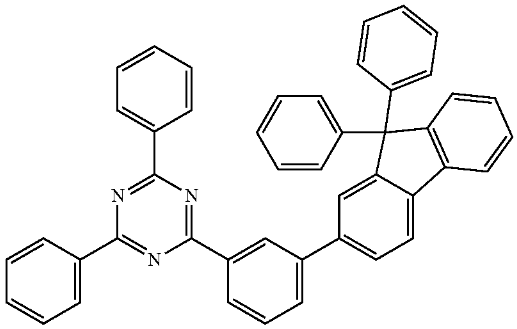
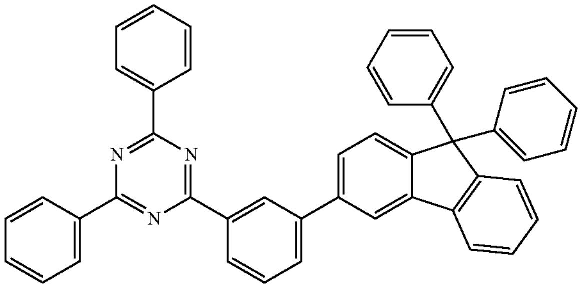
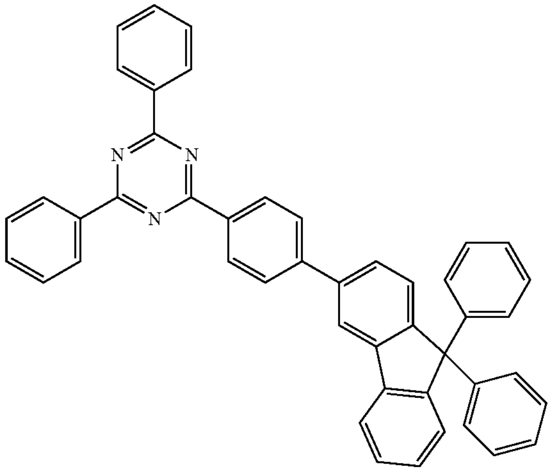

-continued
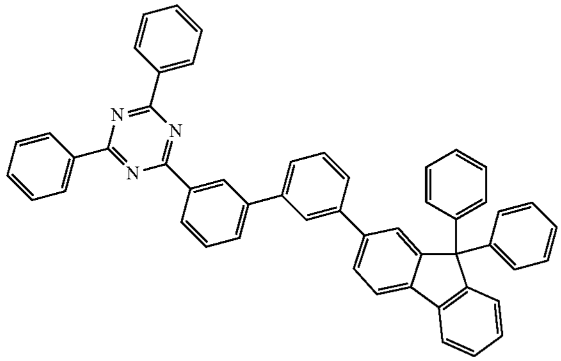
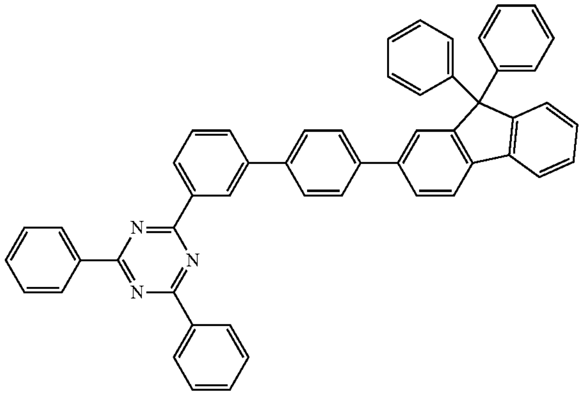
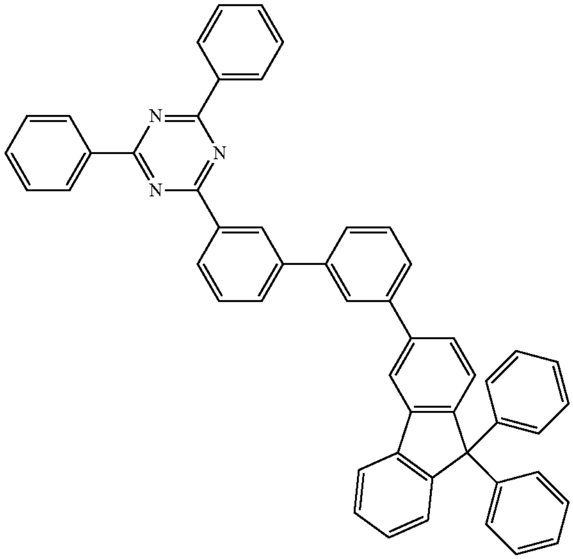
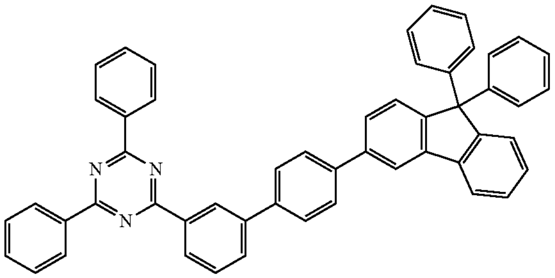
-continued
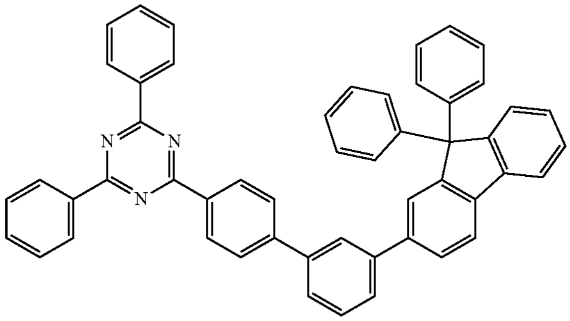
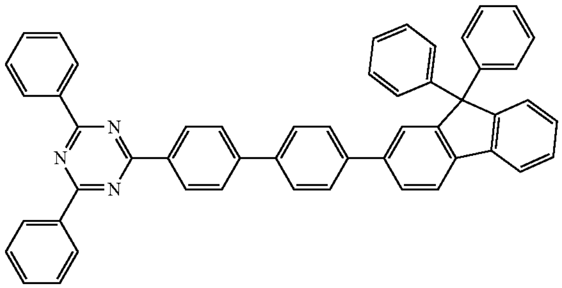
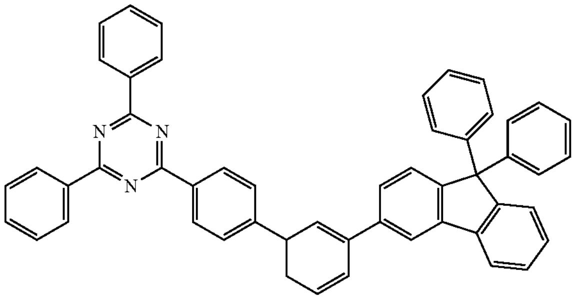
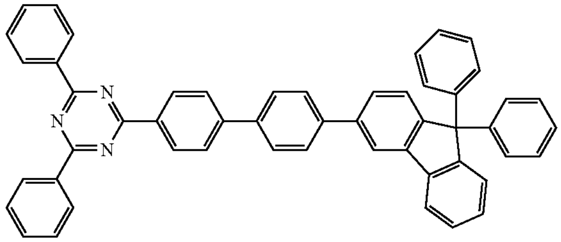
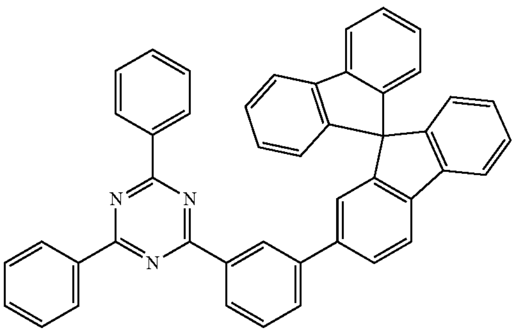

-continued
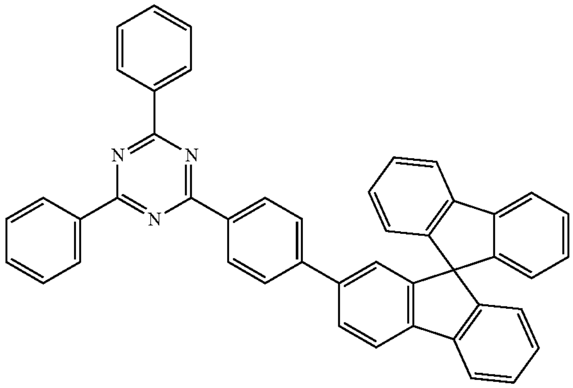
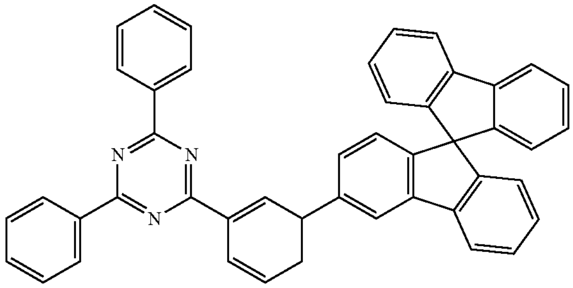
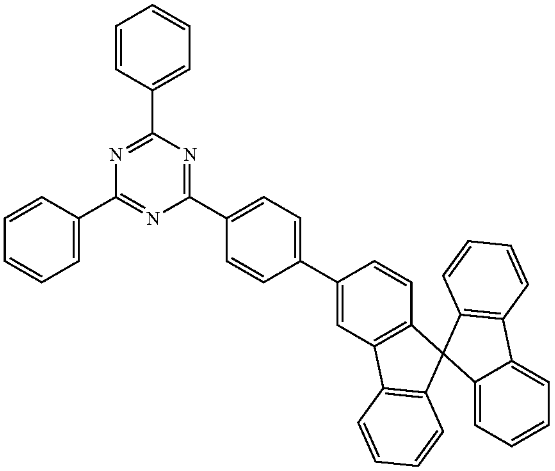
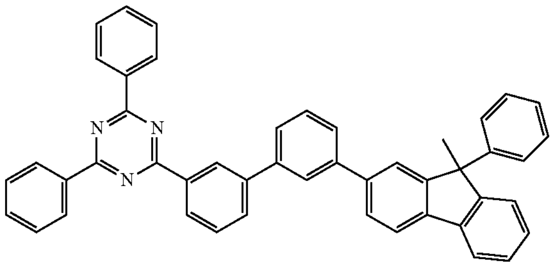
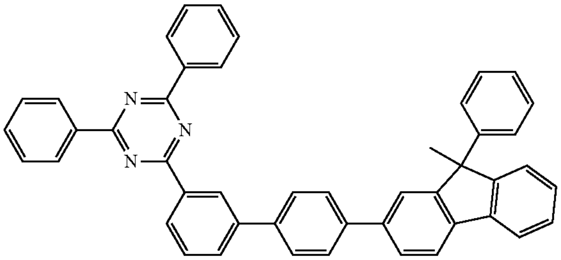
-continued
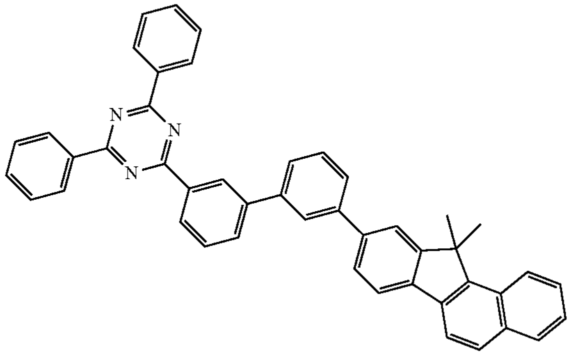
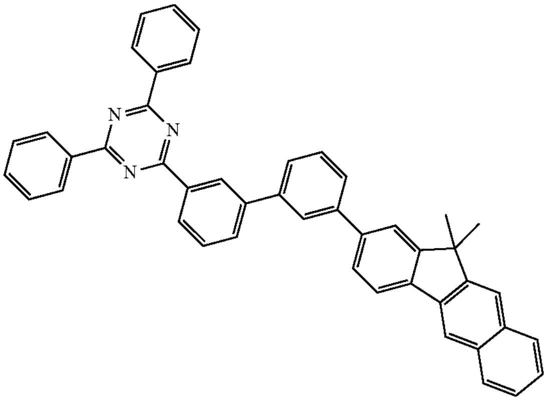
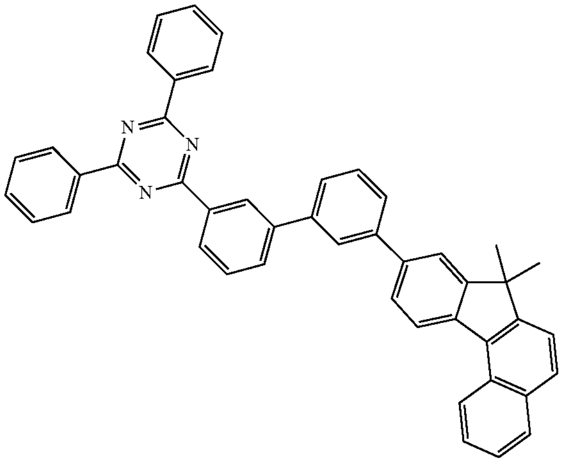
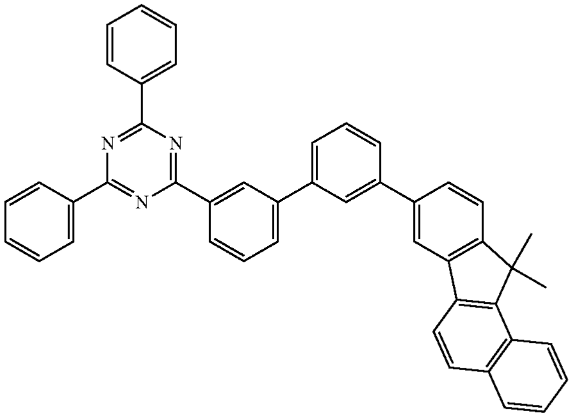

-continued
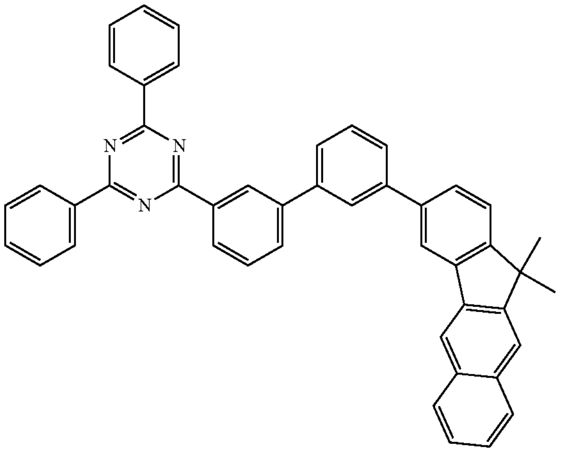
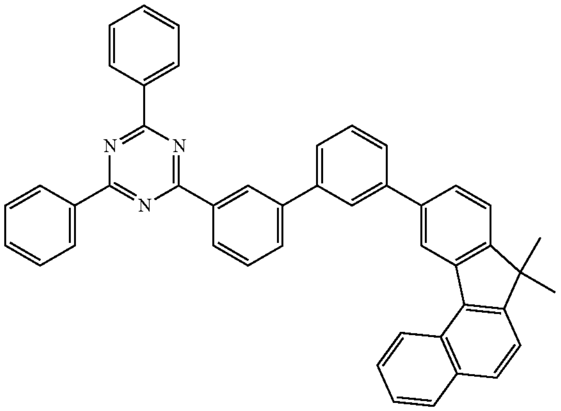
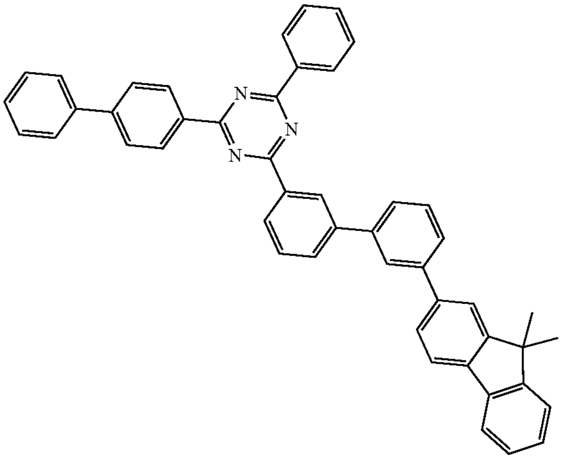
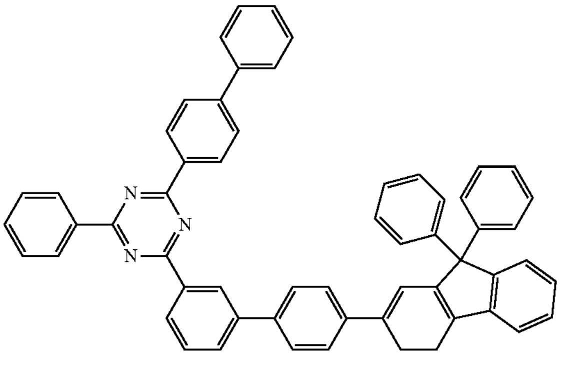
-continued
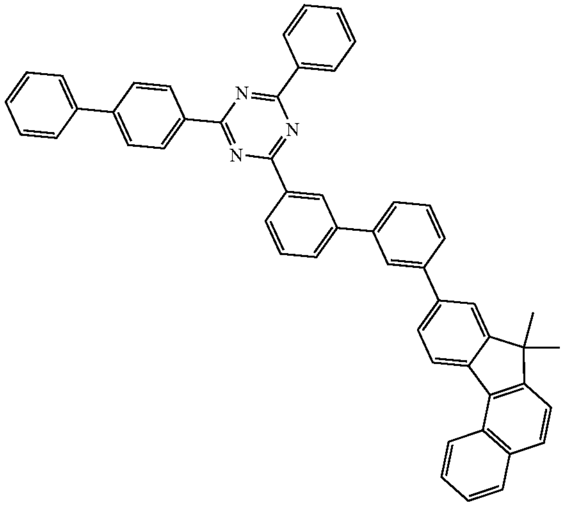
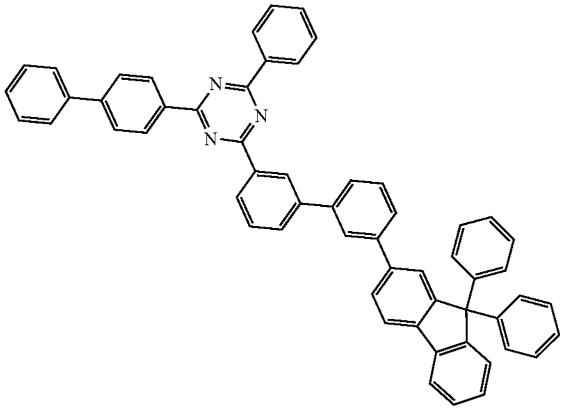
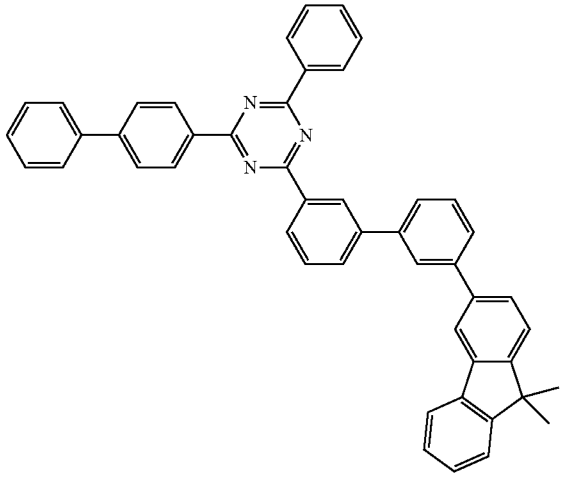

-continued
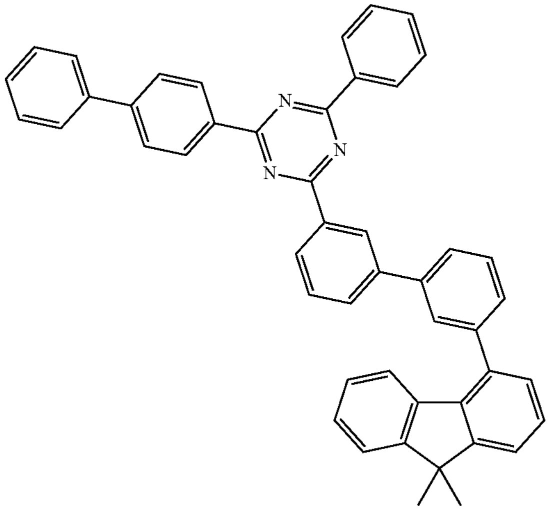
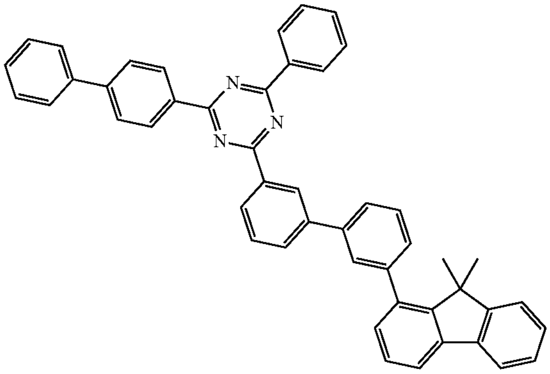
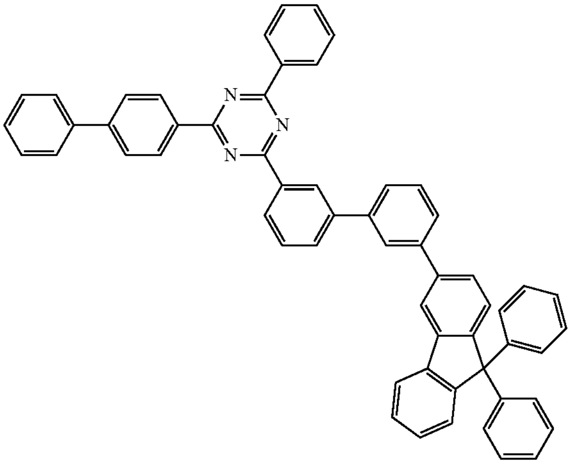
-continued
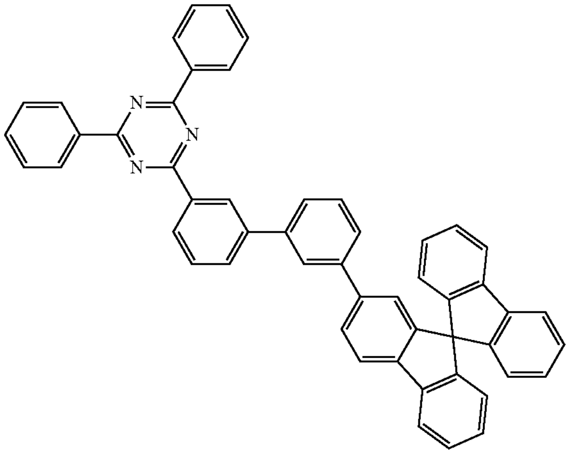
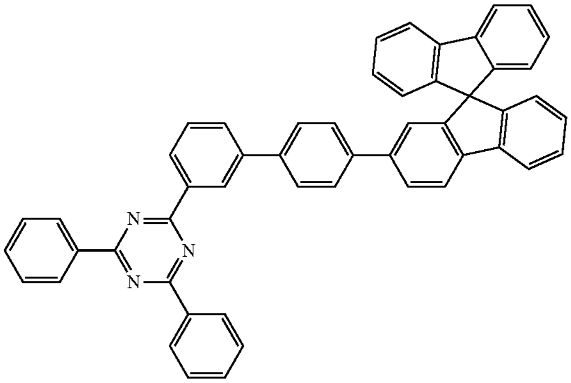
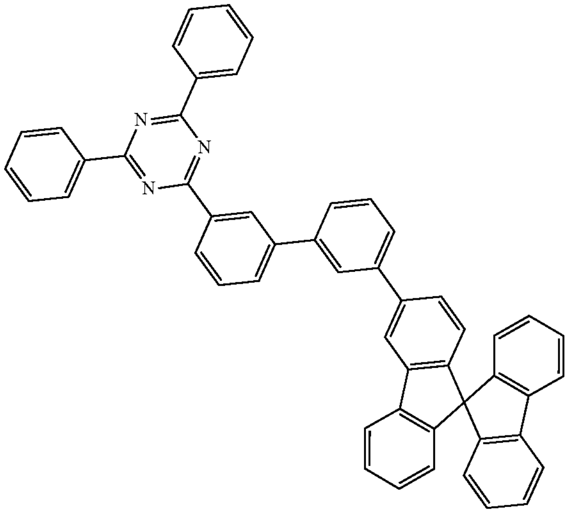
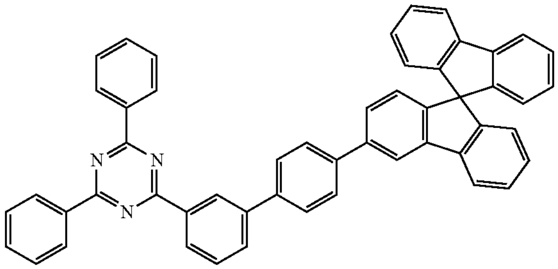

-continued
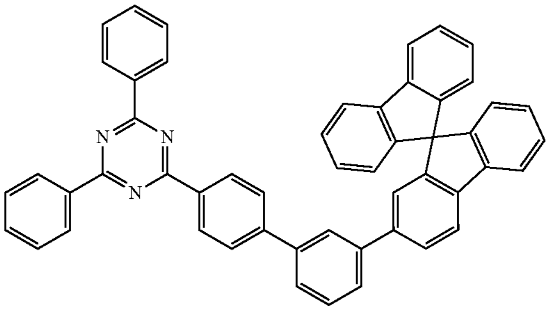
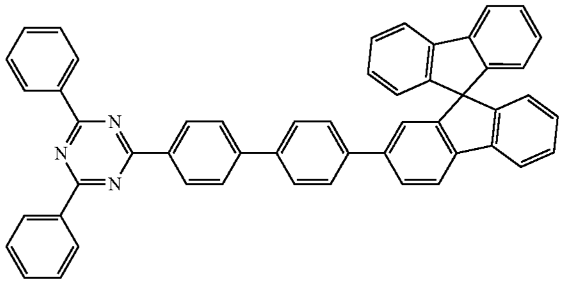
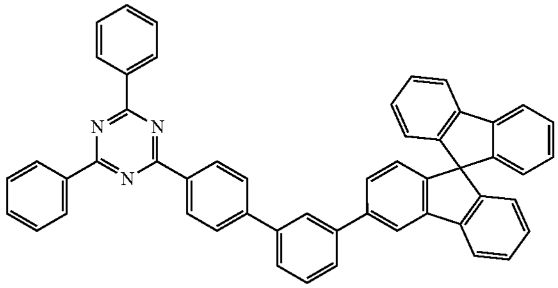
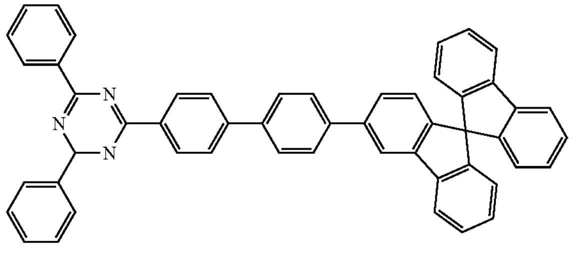
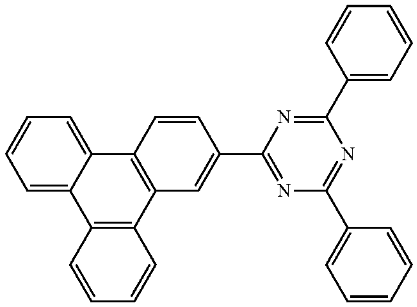
-continued
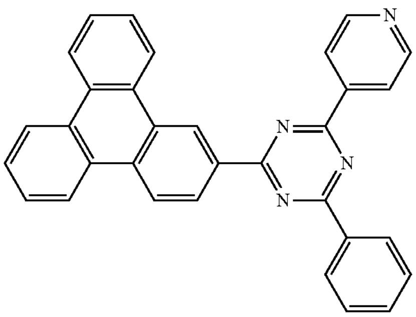
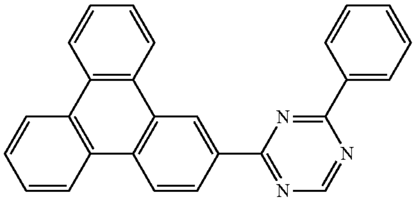
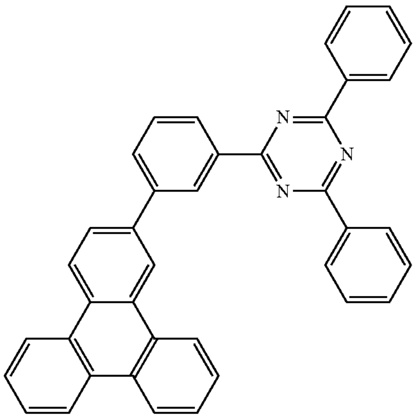
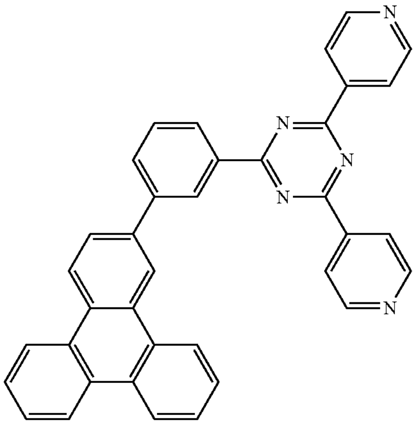

-continued
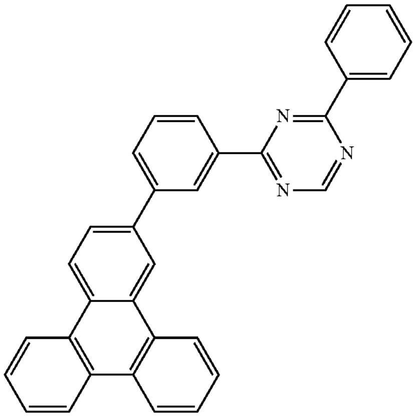
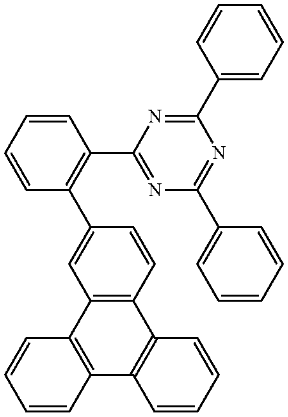
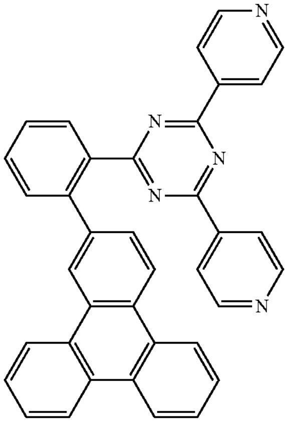
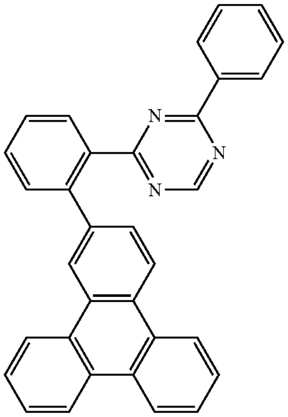
-continued
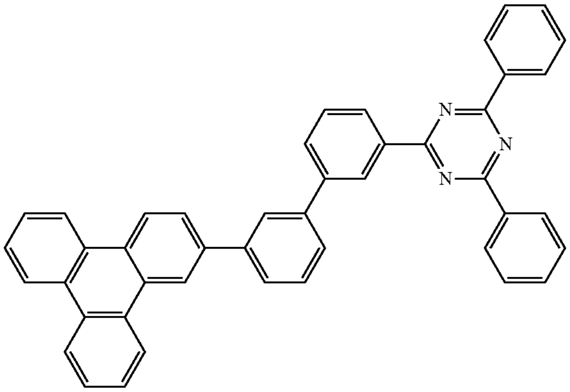
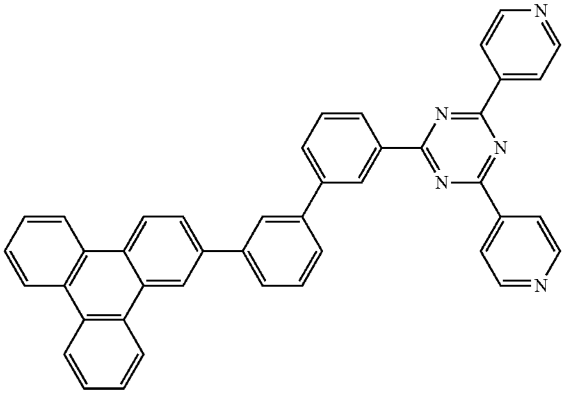
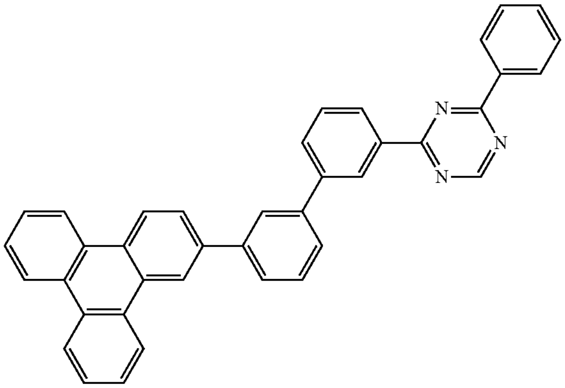
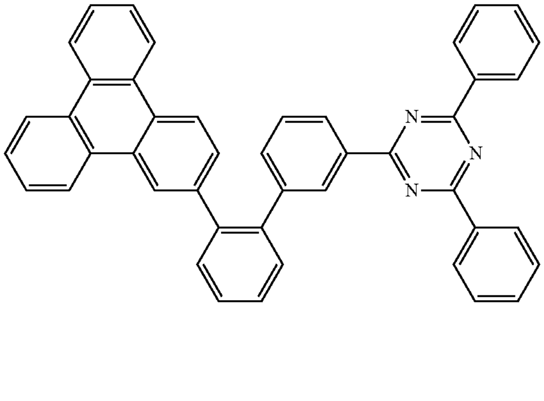

-continued
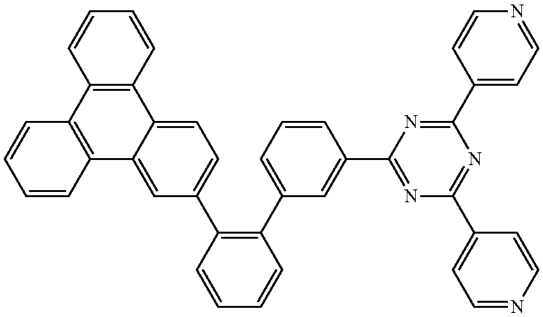
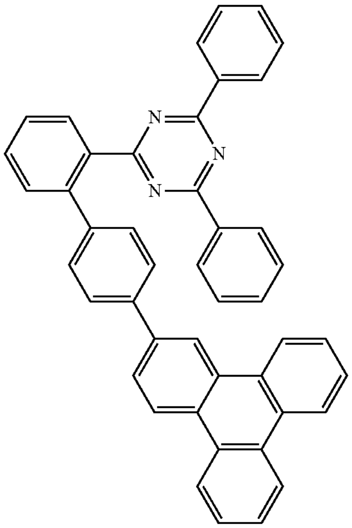
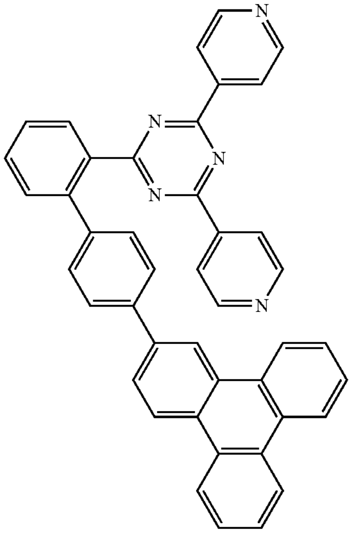
-continued
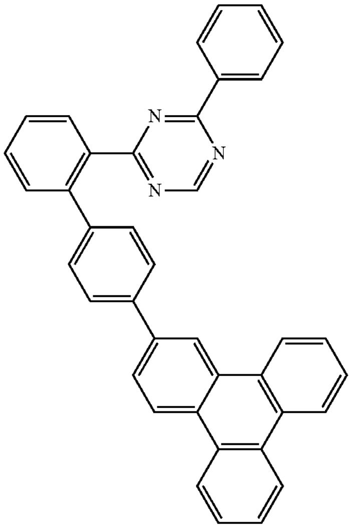
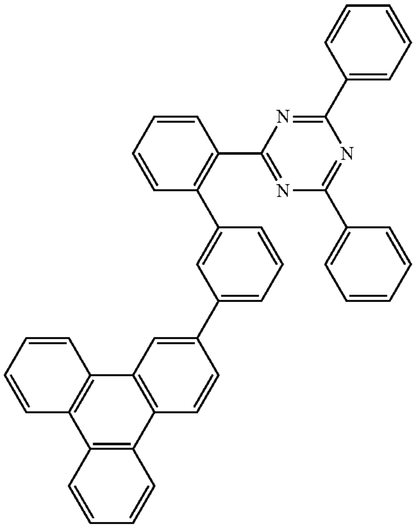
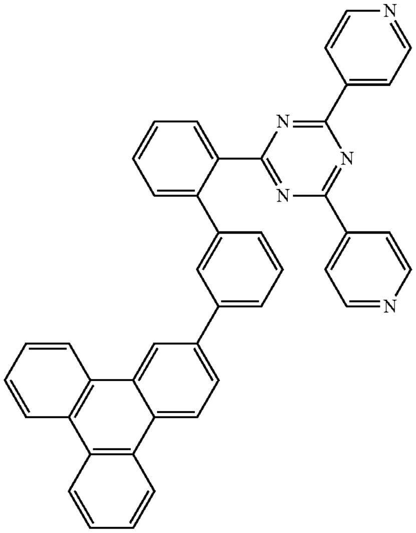

-continued
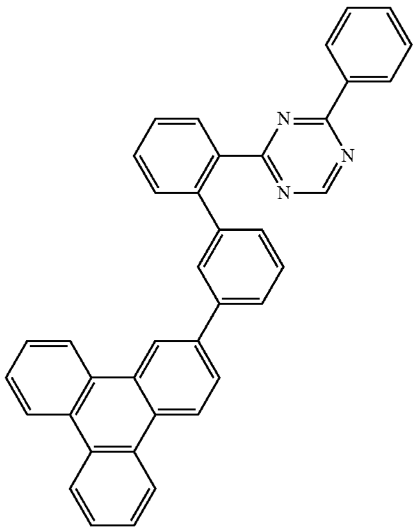
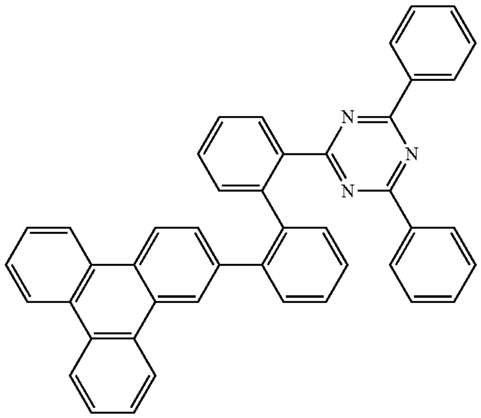
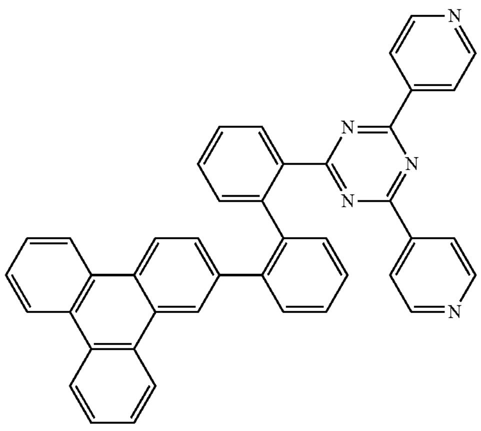
-continued
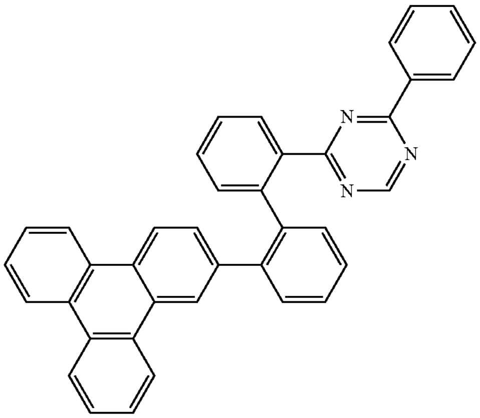
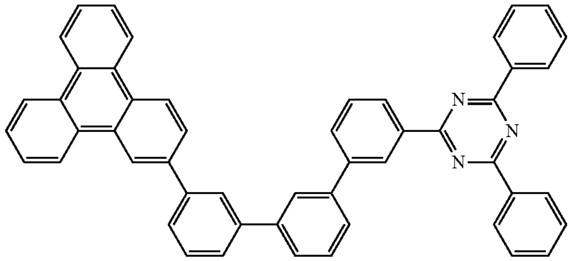
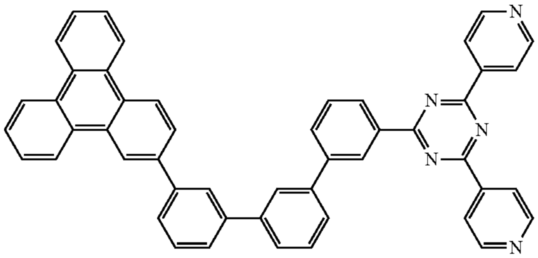
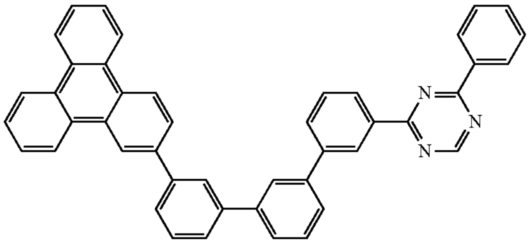
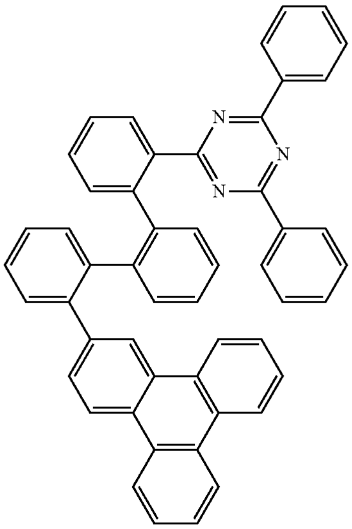

-continued
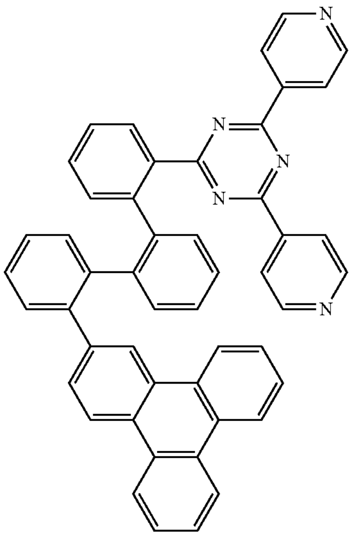
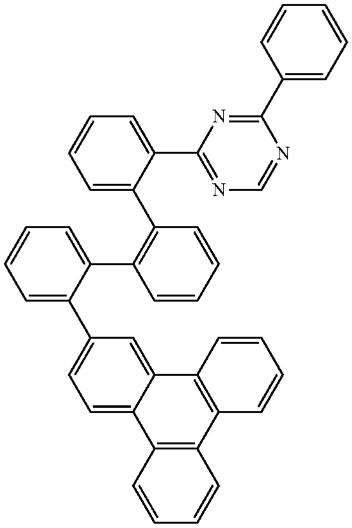
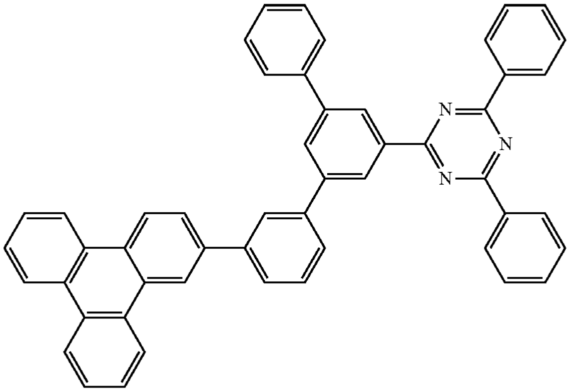
-continued
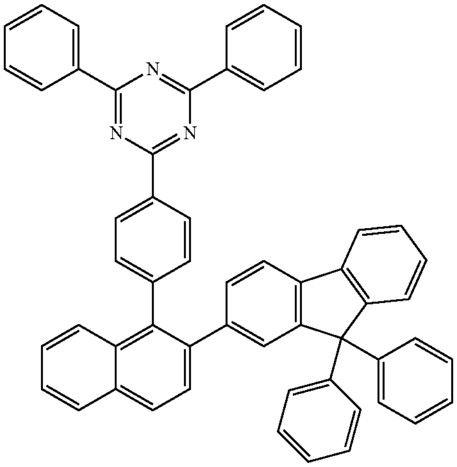
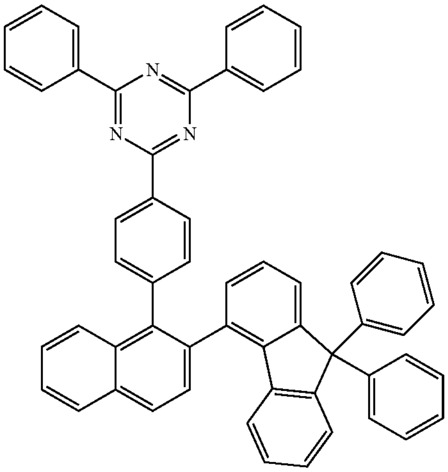
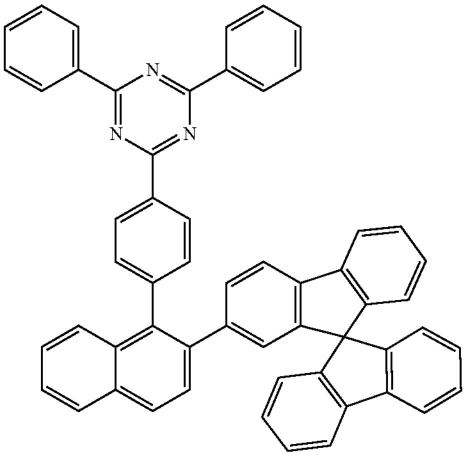

-continued
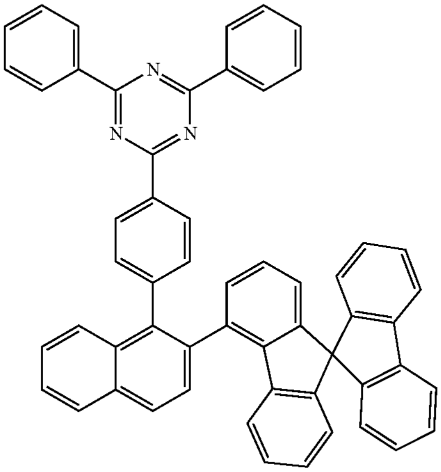
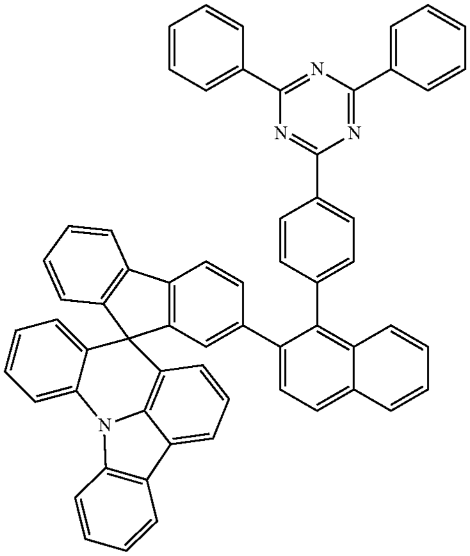
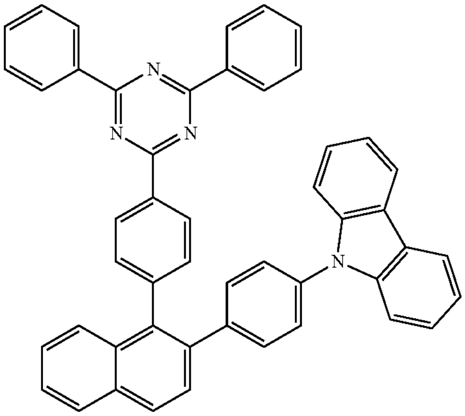
-continued
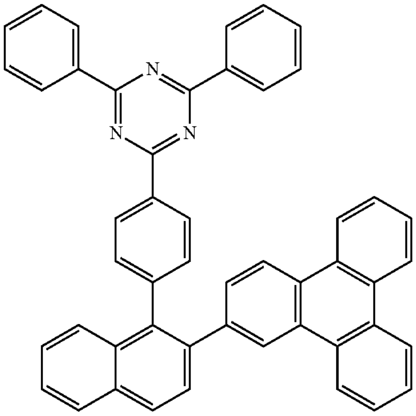
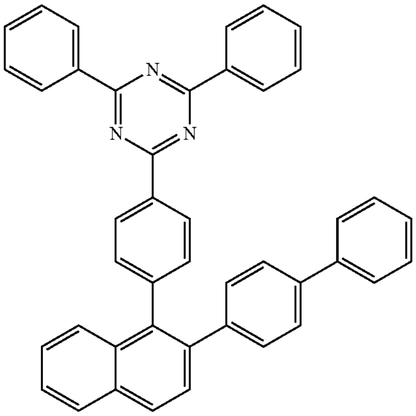
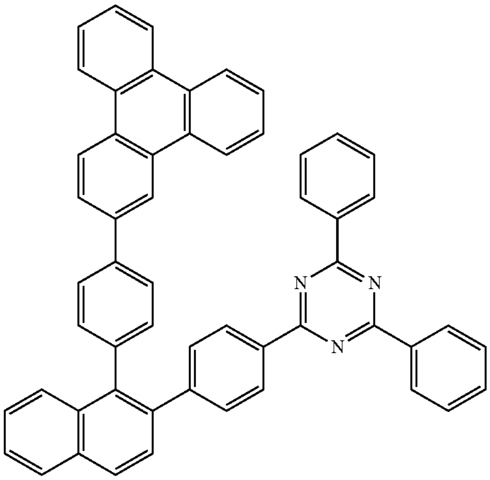
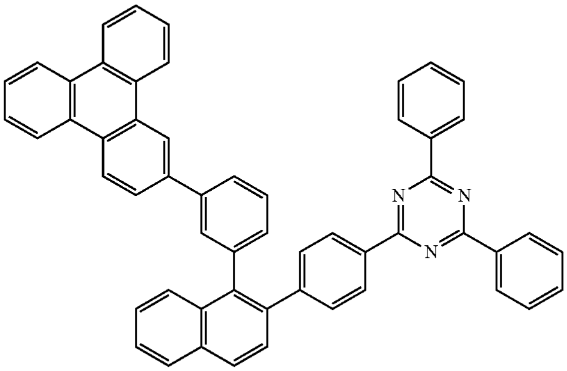

-continued
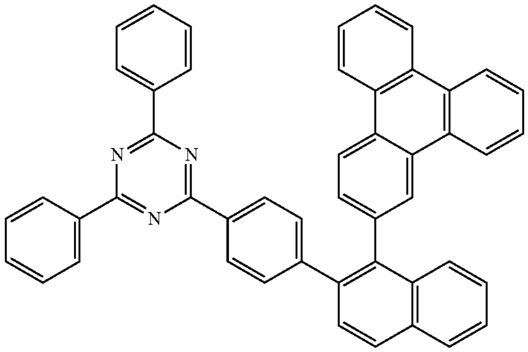
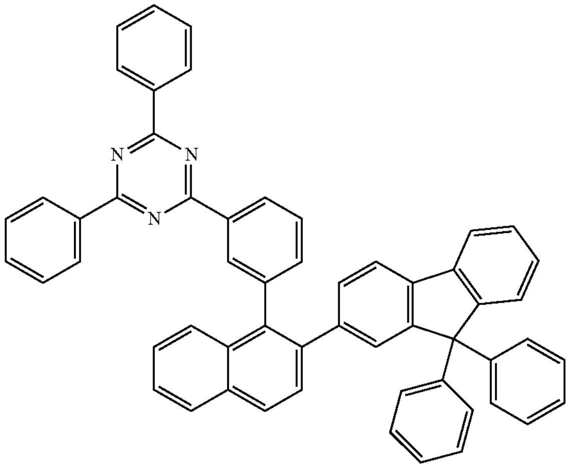
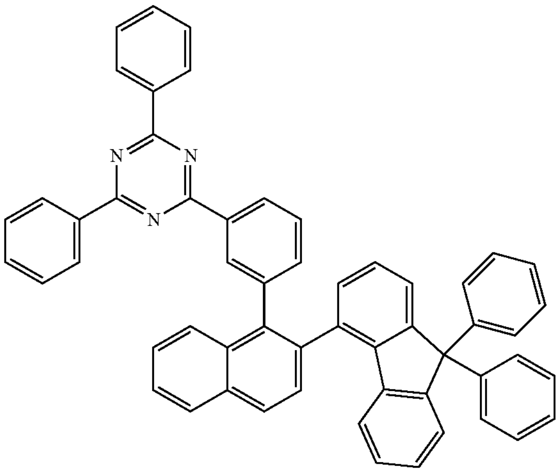
-continued
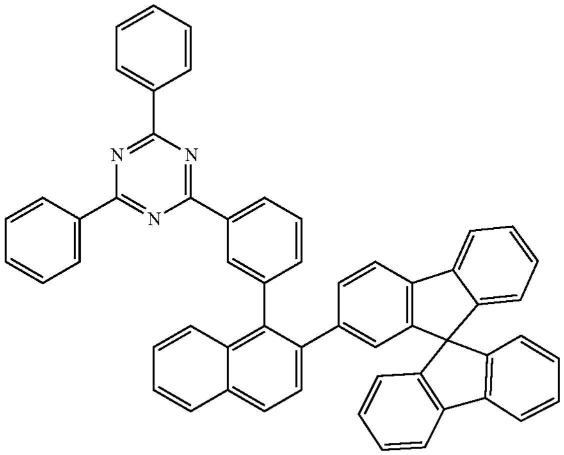
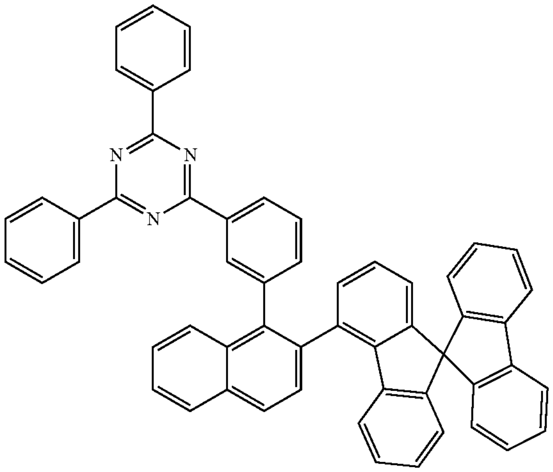
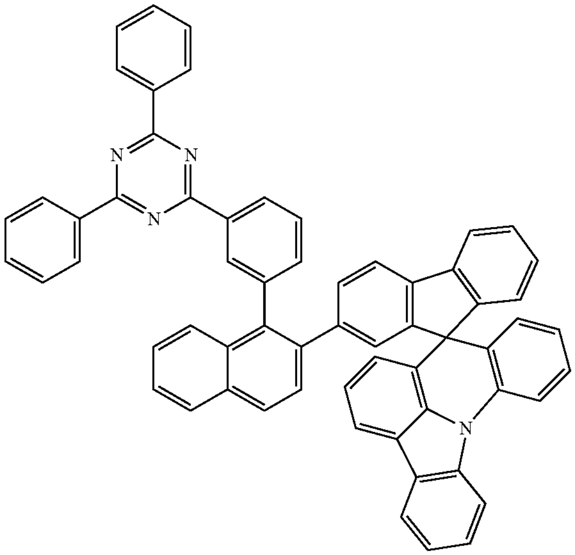

-continued
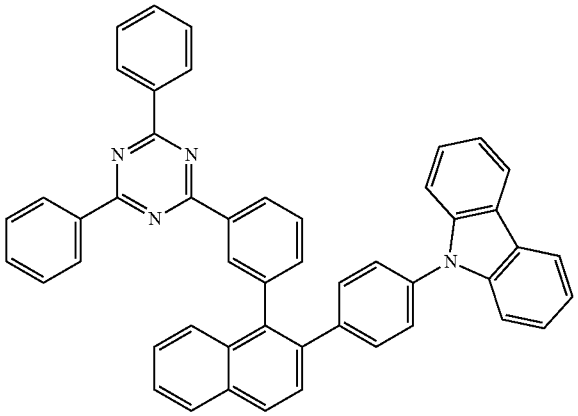
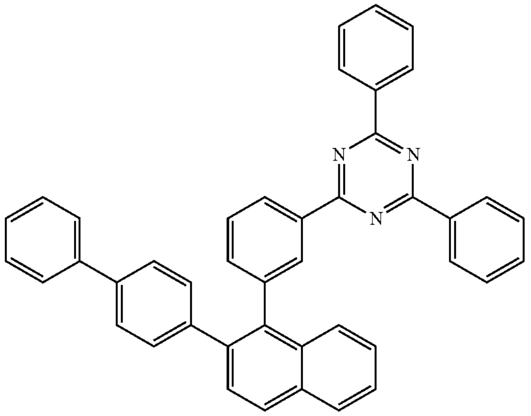
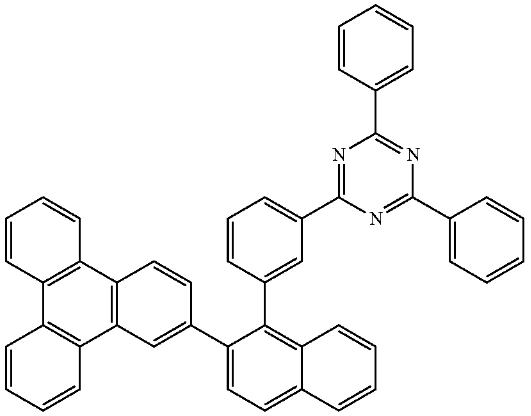
-continued
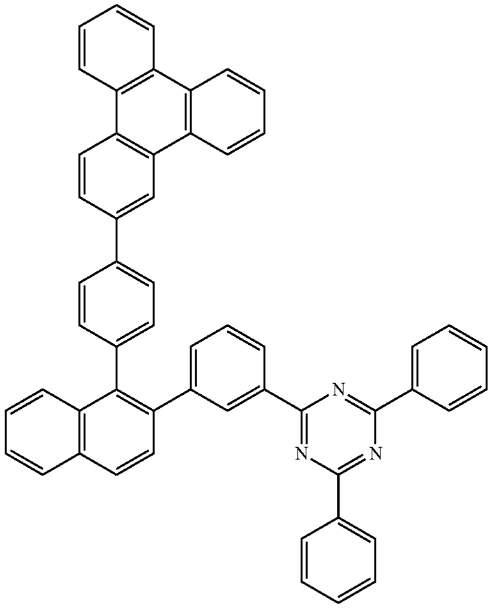
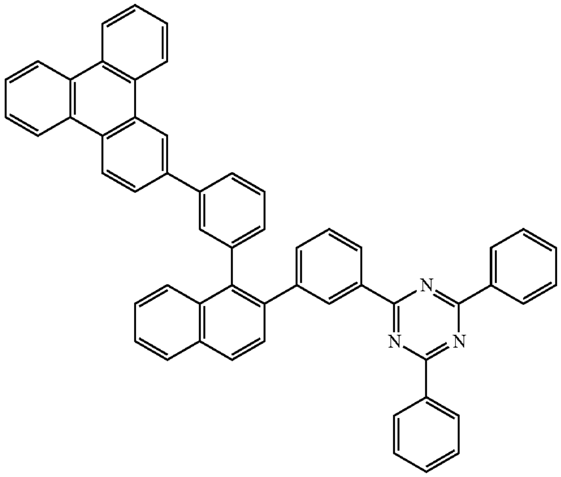
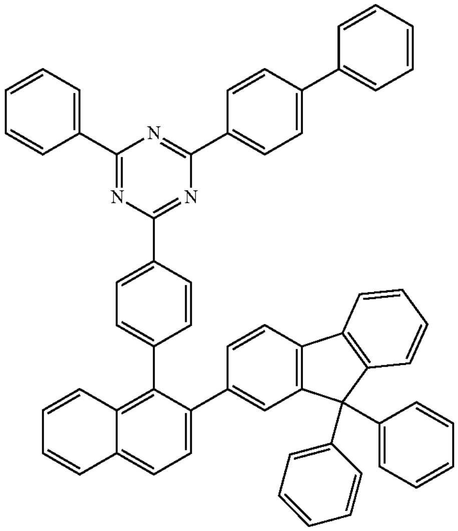

-continued
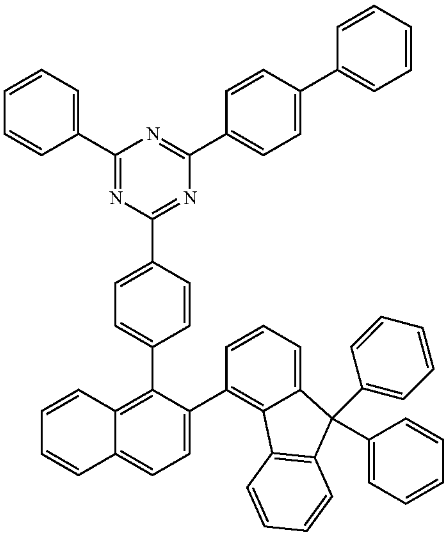
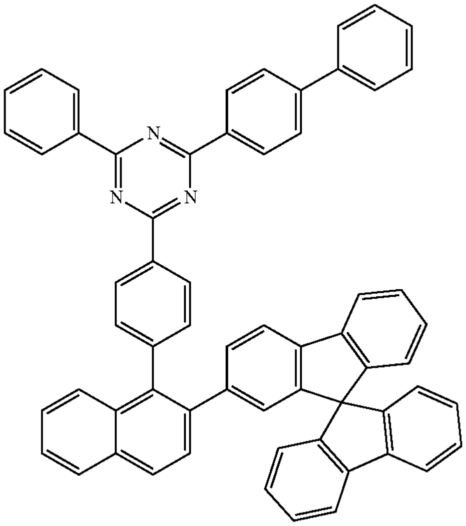
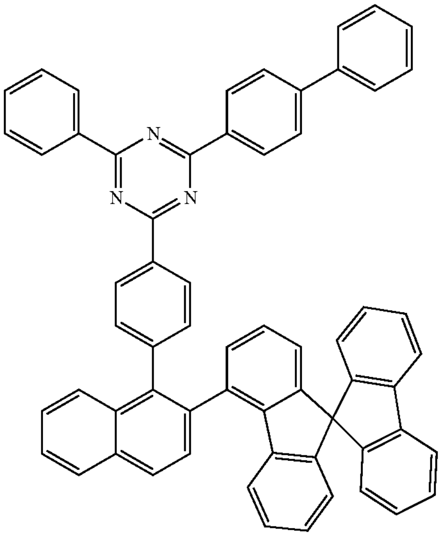
-continued
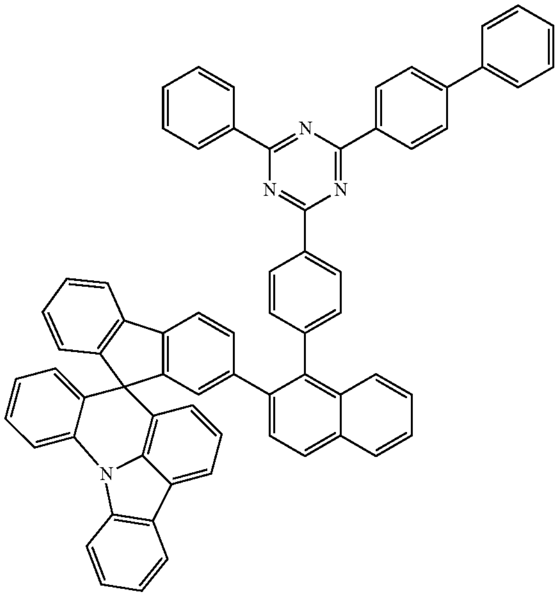
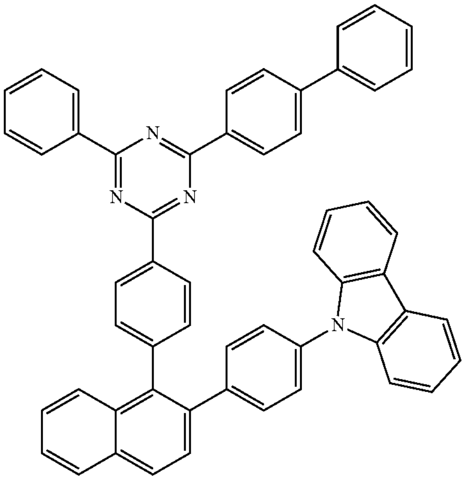
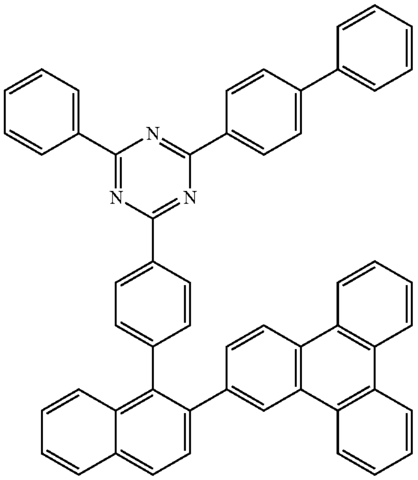

-continued
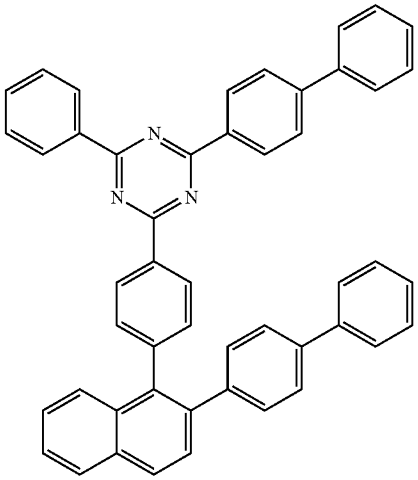
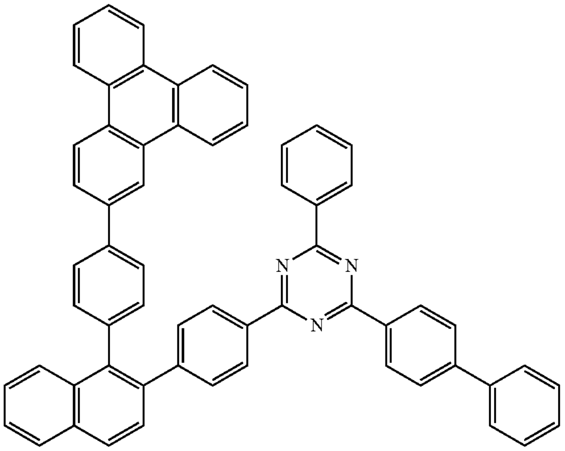
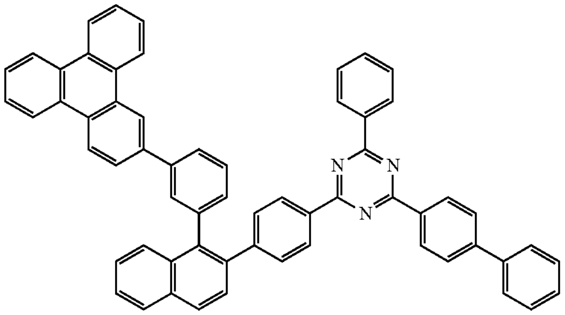
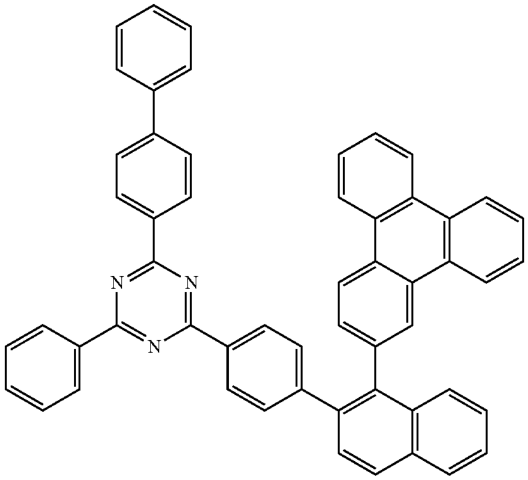
-continued
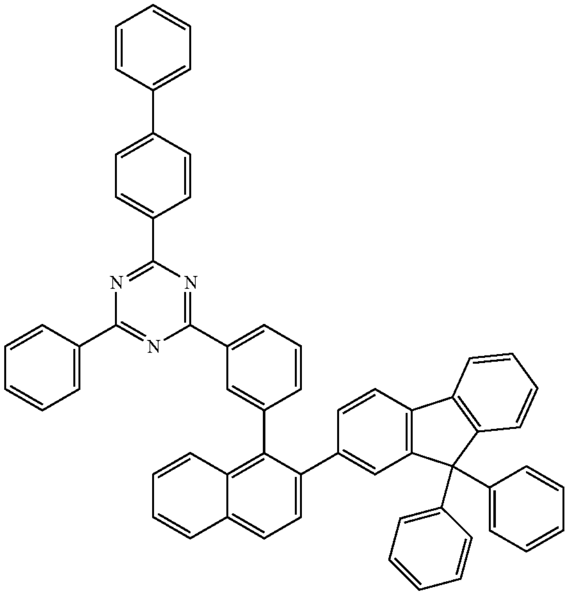
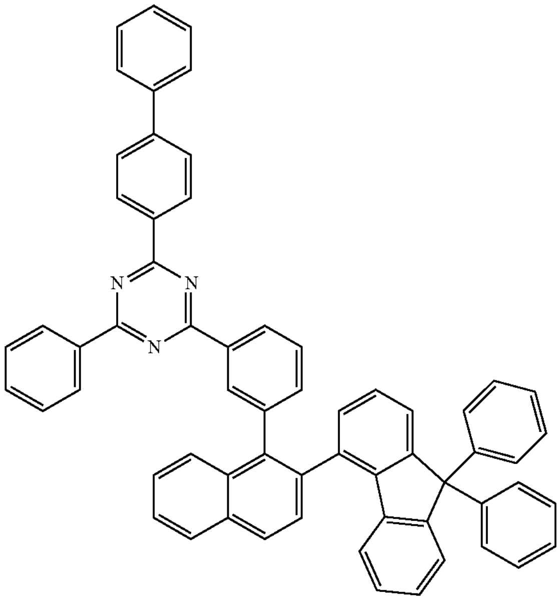

-continued
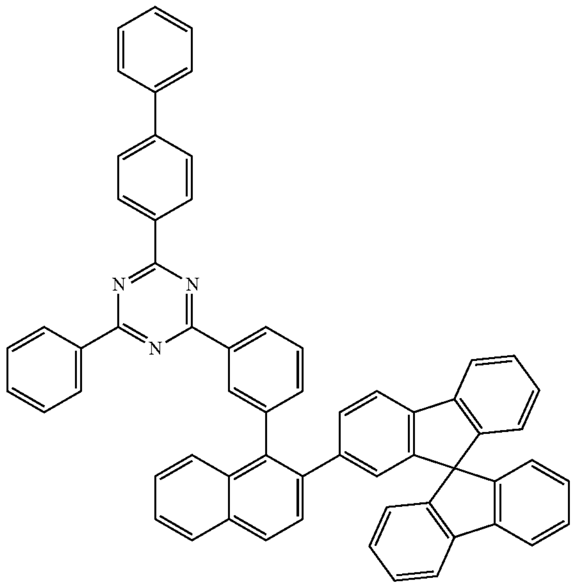
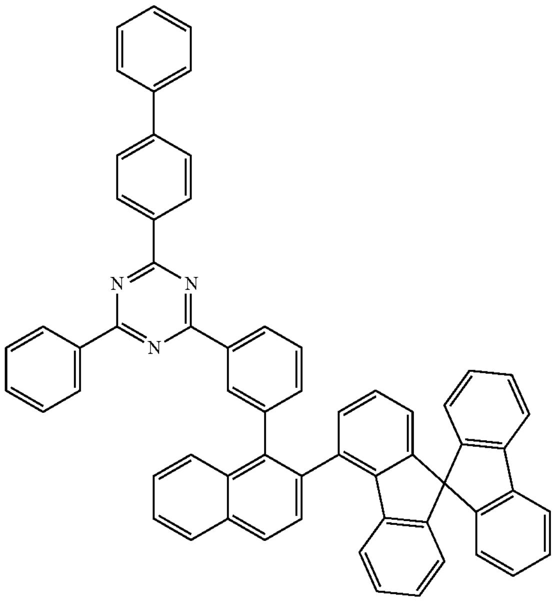
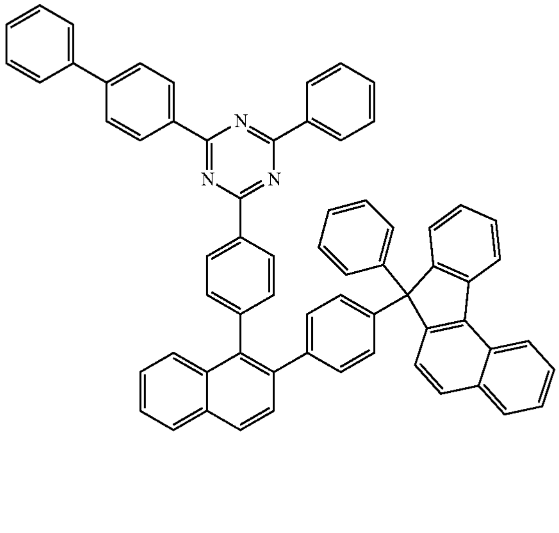
-continued
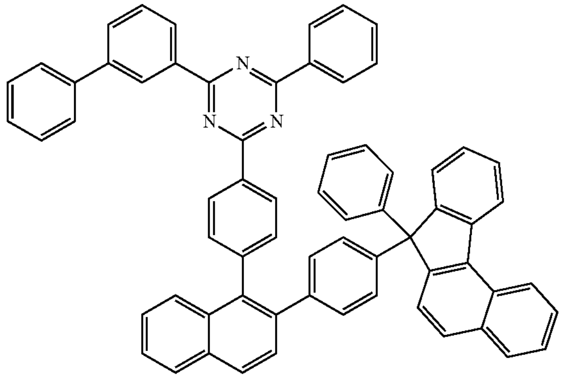
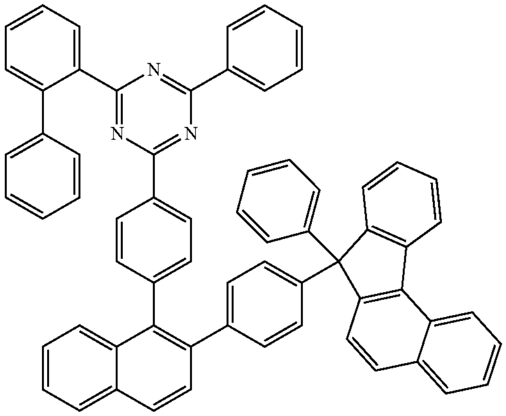
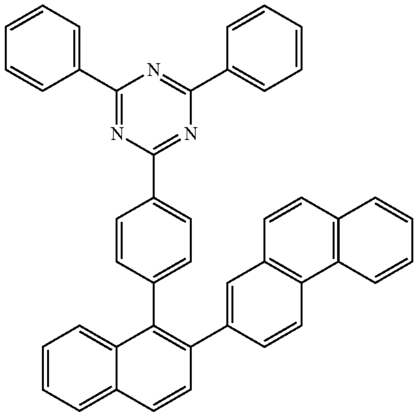
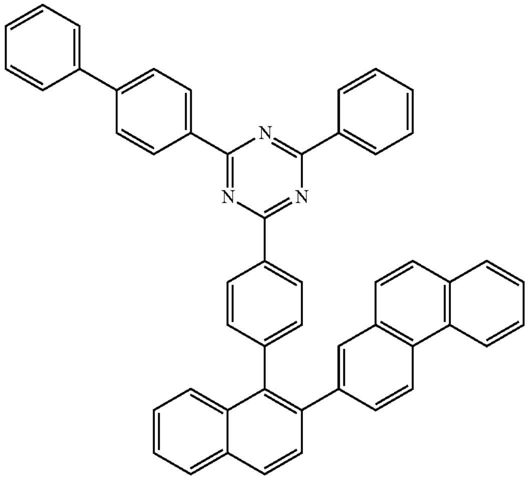

-continued
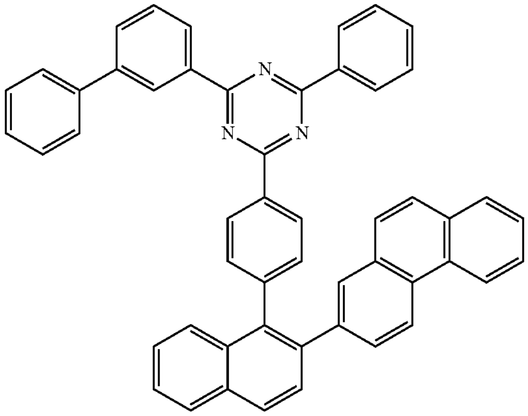
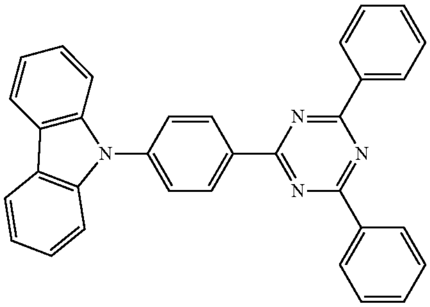
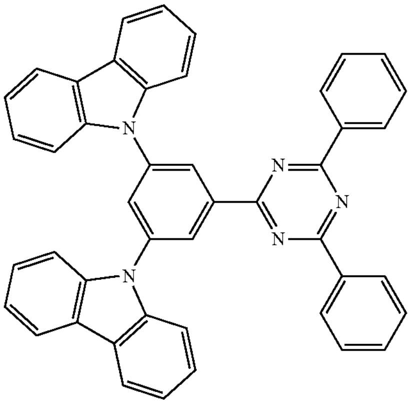
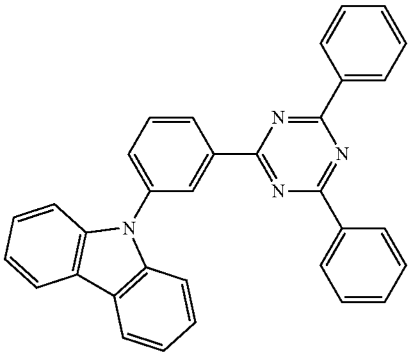
-continued
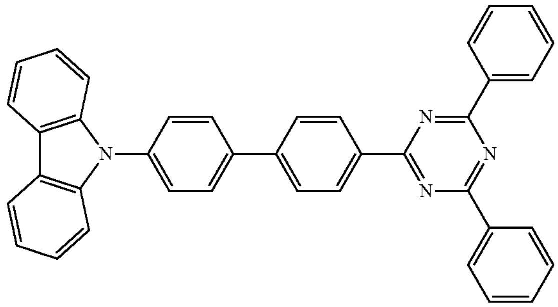
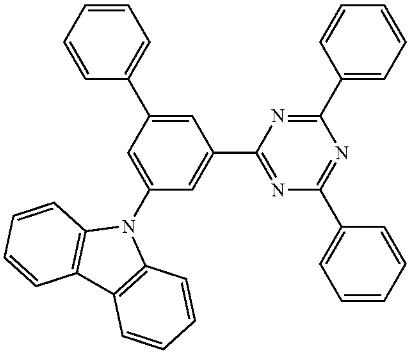
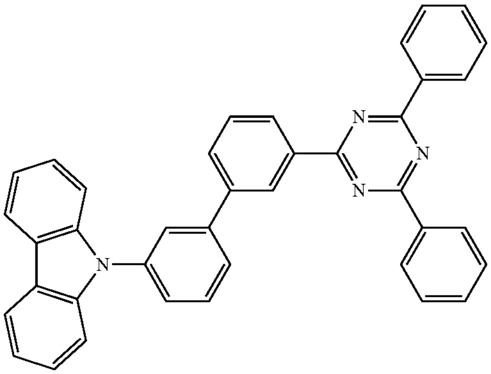
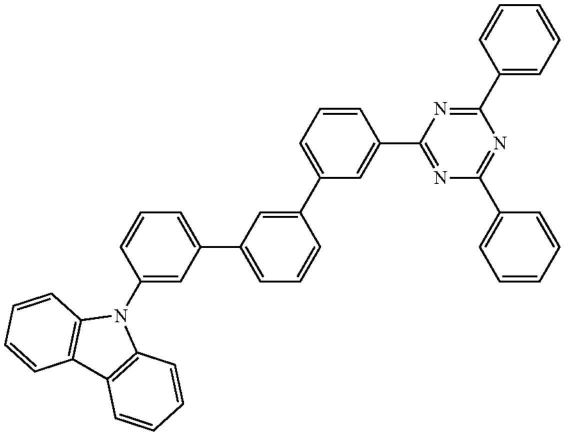

-continued
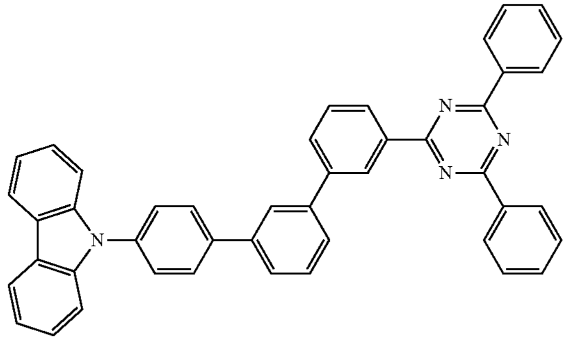
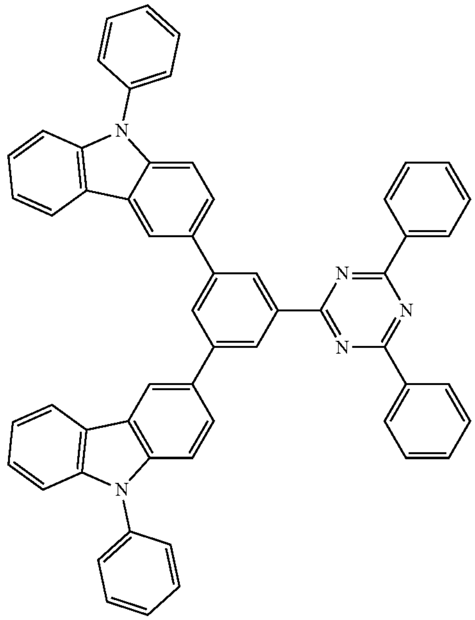
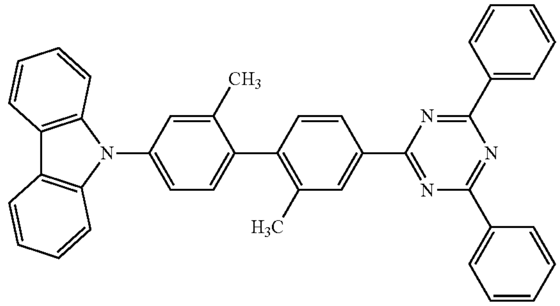
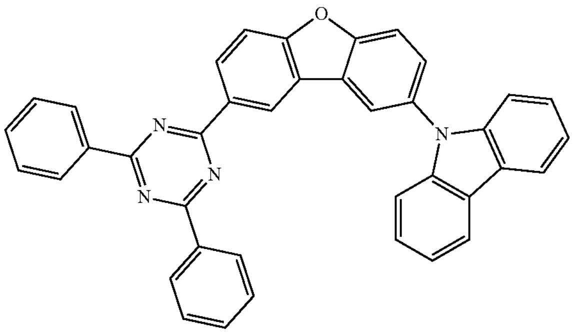
-continued
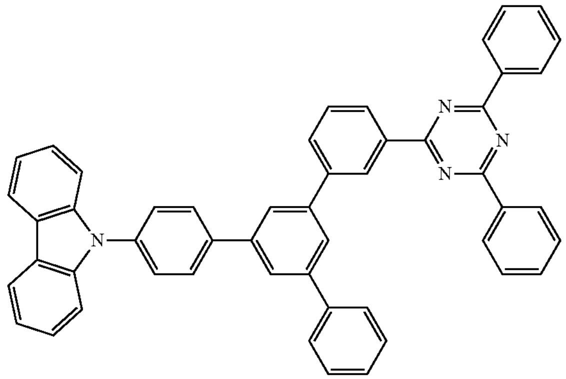
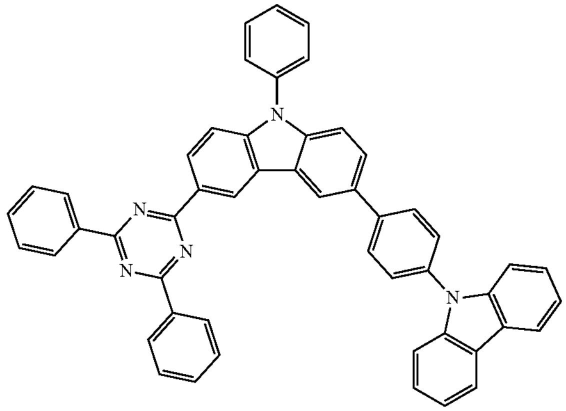
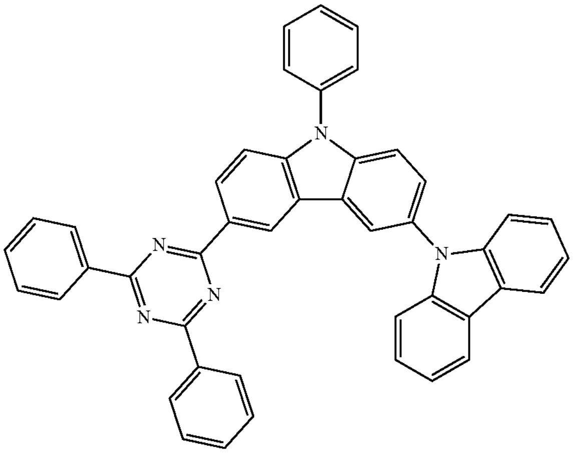

-continued
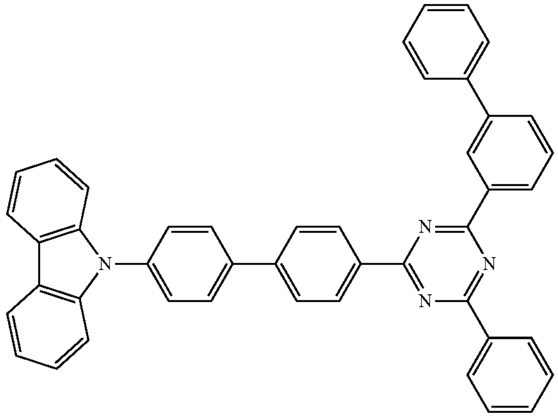
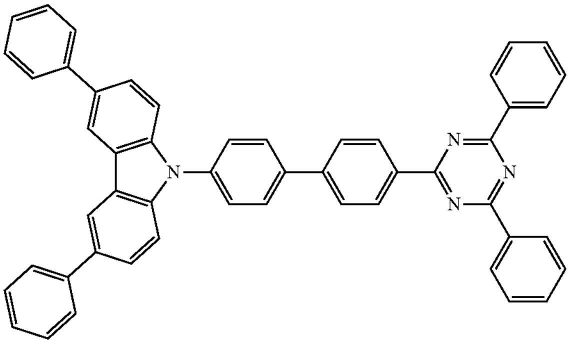
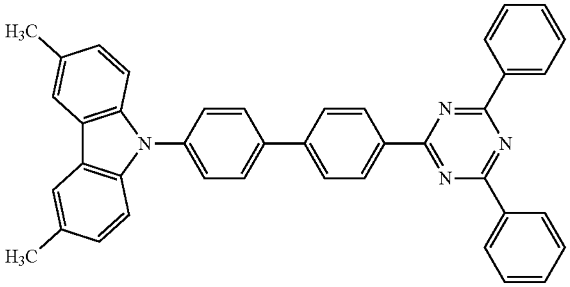
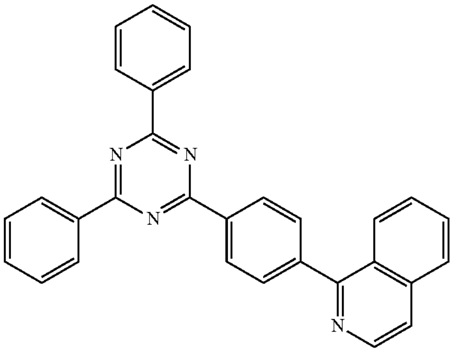
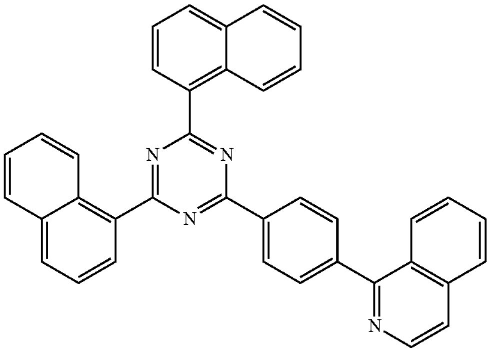
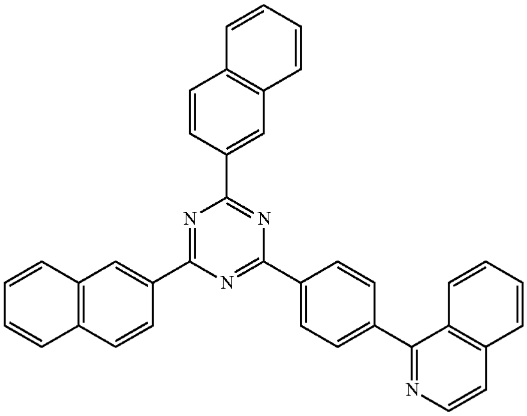
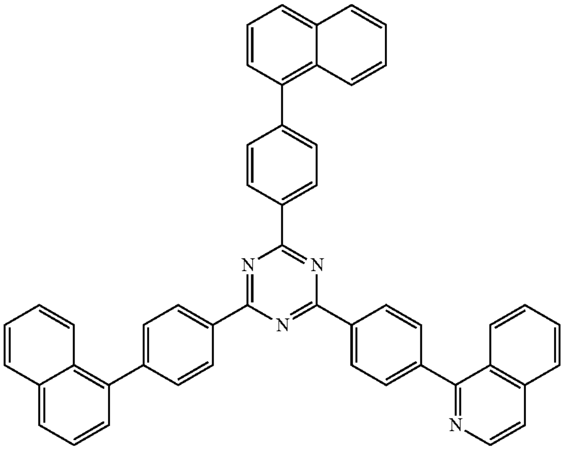
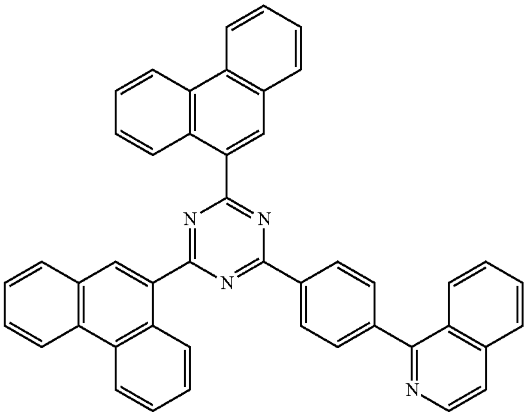

-continued
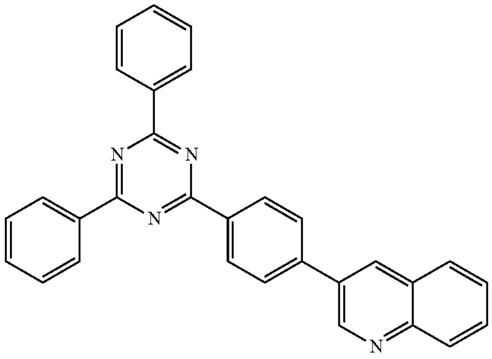
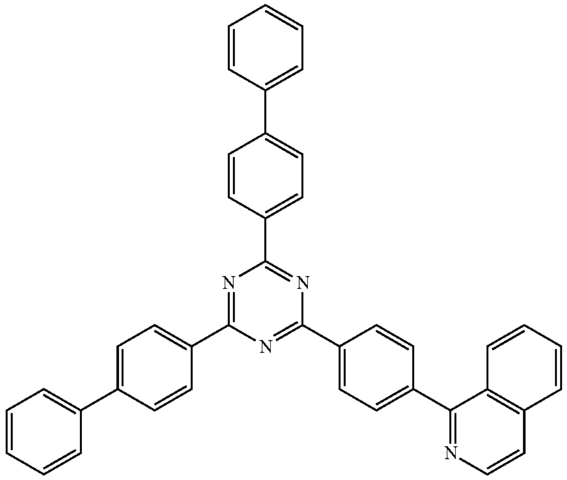
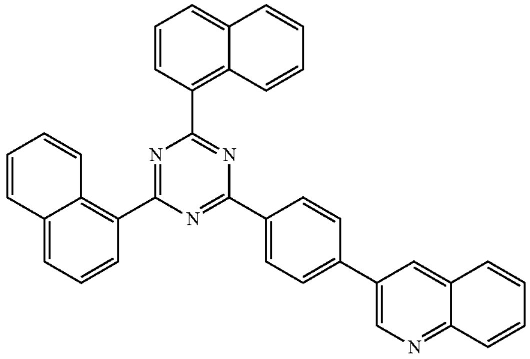
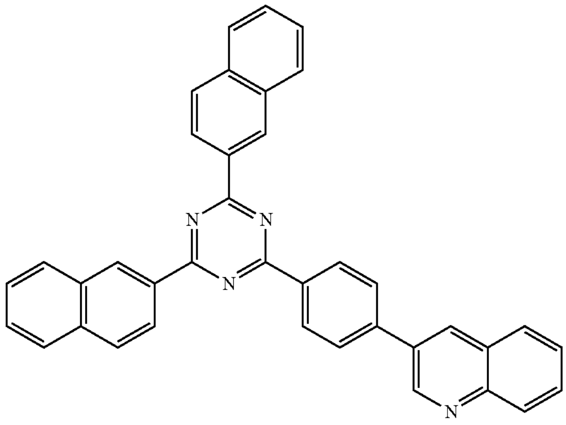
-continued
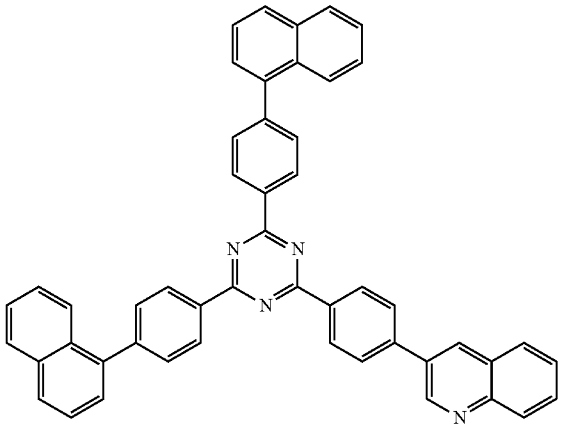
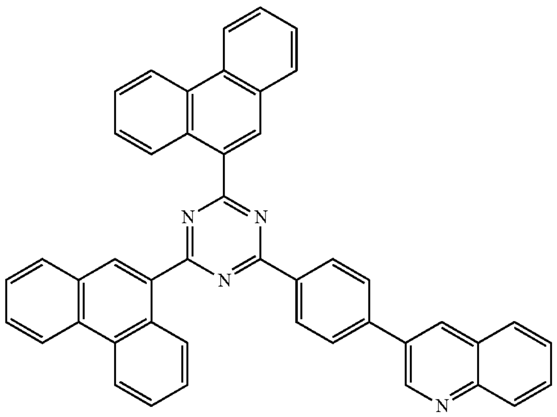
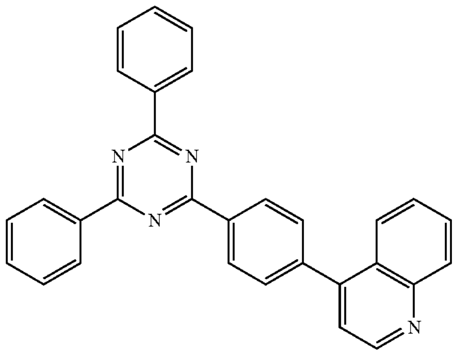
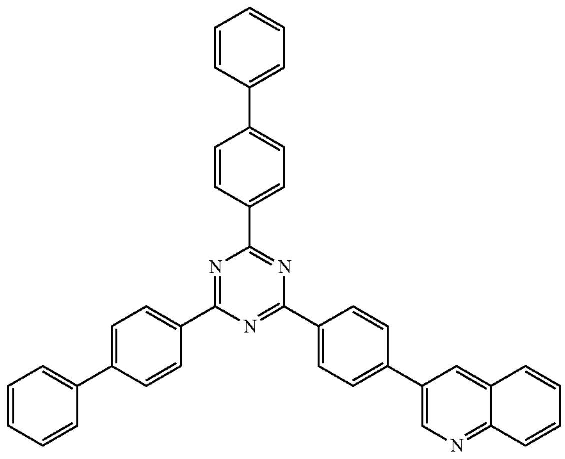

-continued
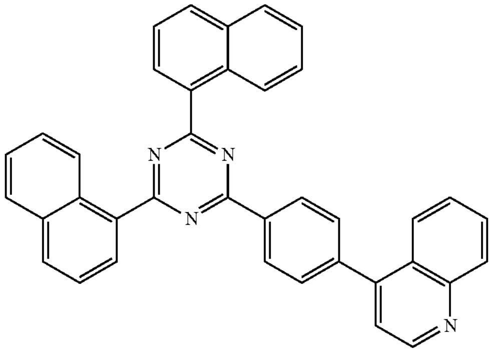
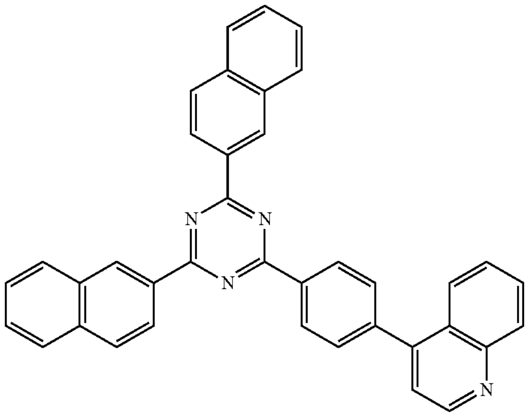
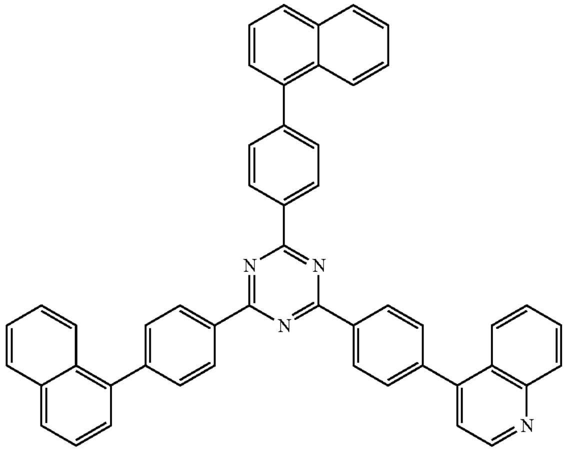
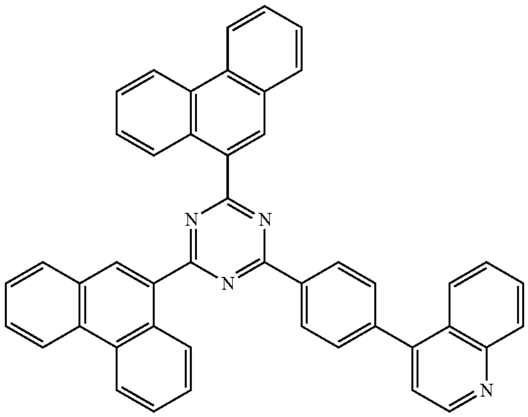
-continued
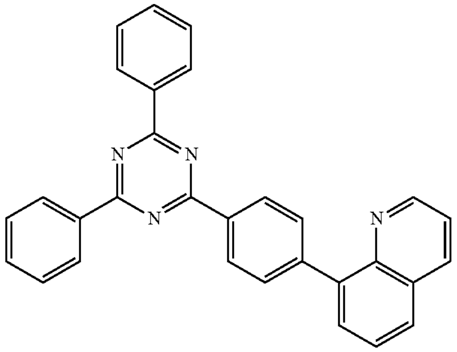
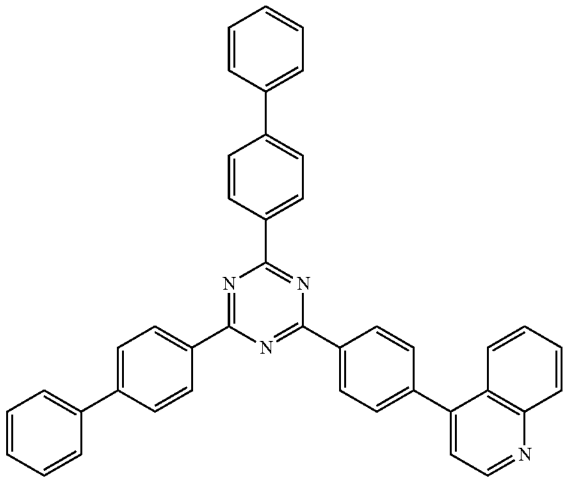
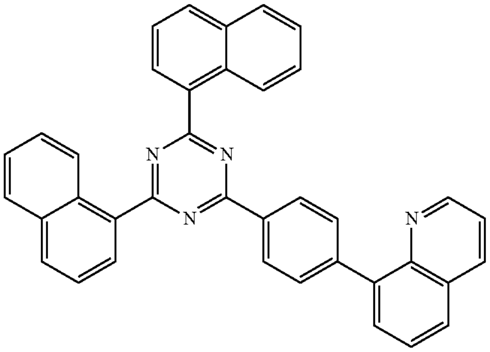
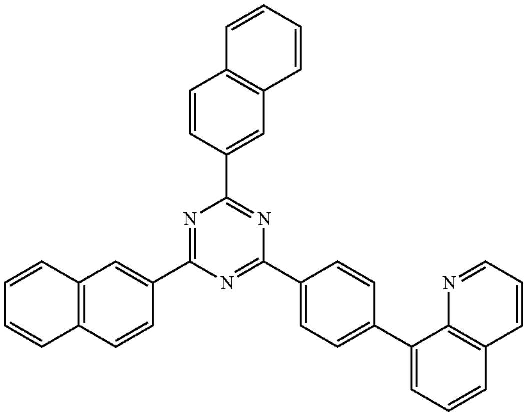

-continued
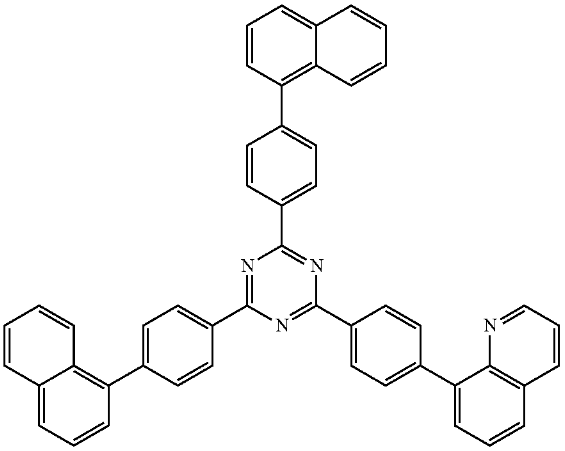
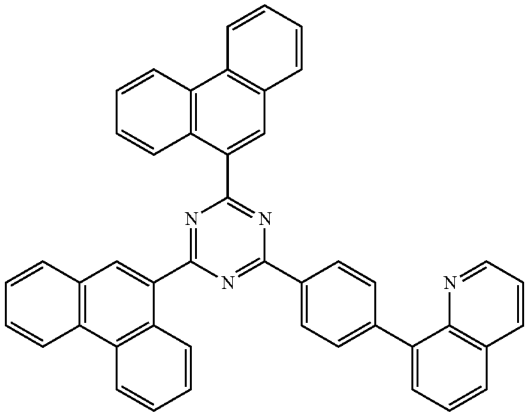
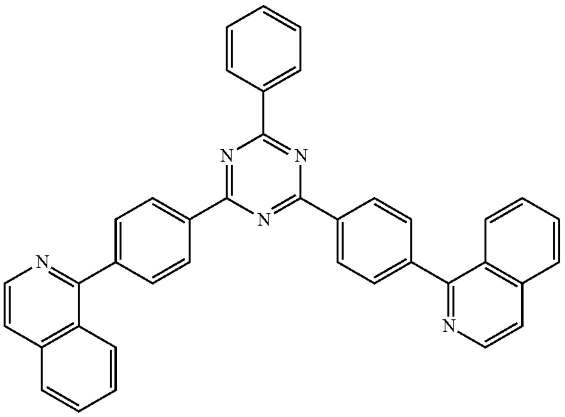
-continued
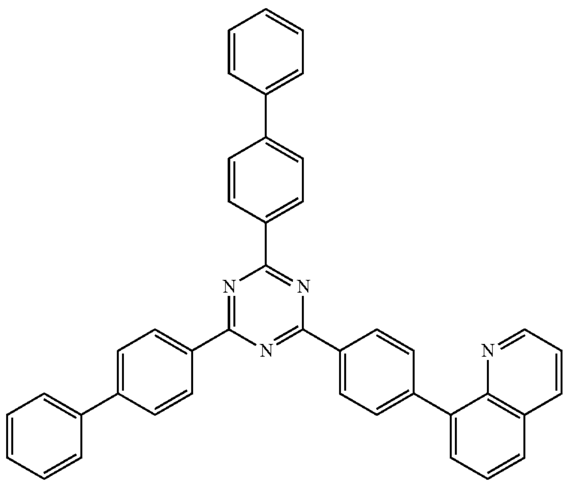
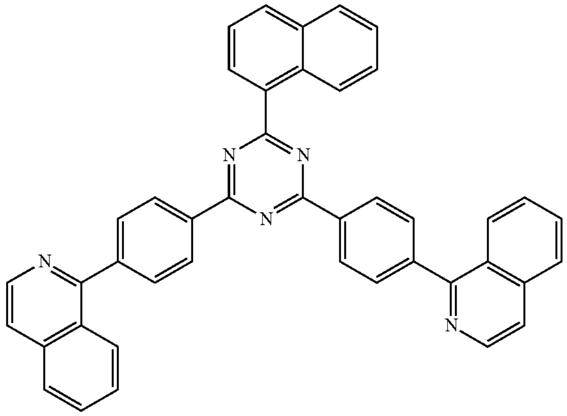
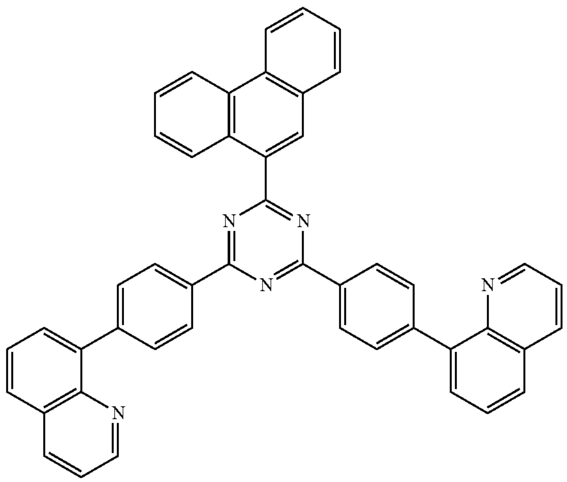

-continued
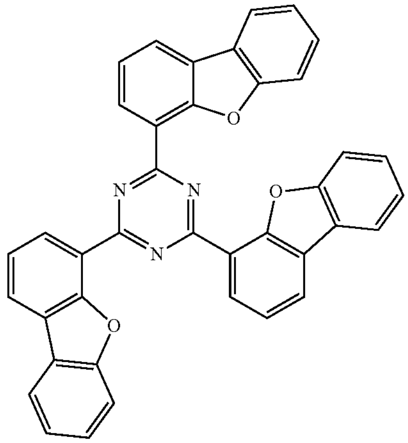
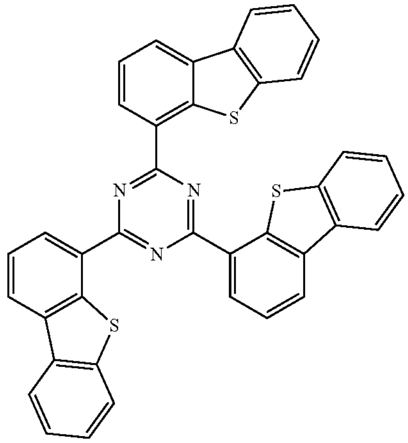
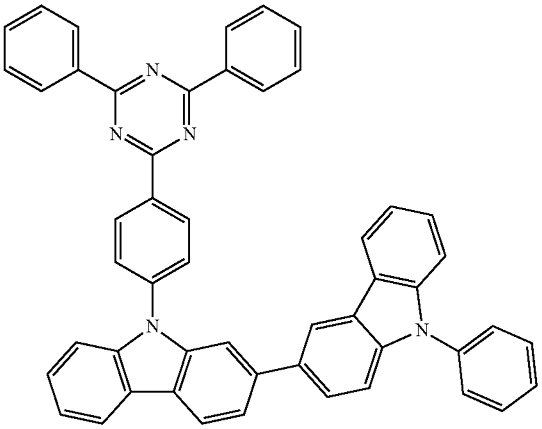
-continued
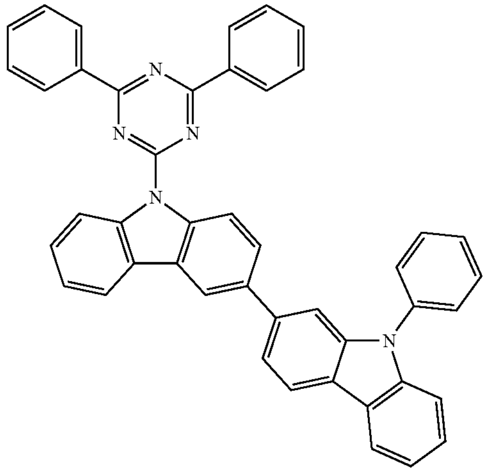
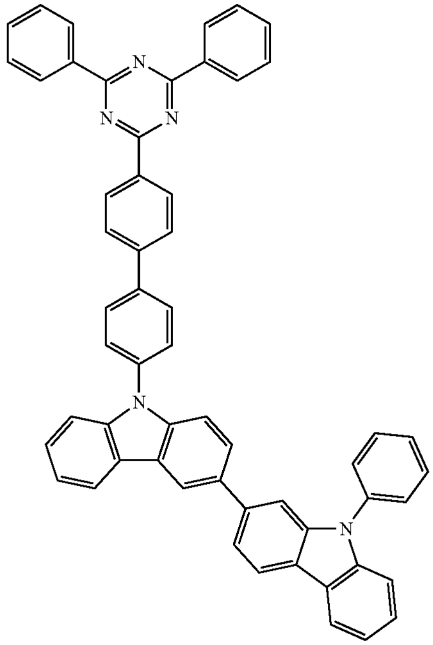

-continued
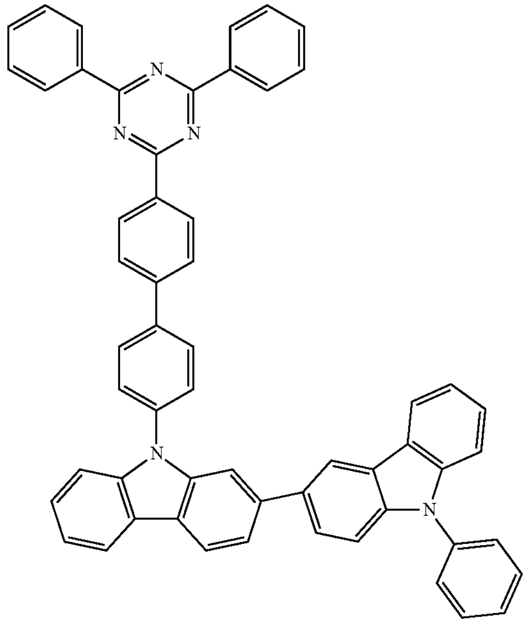
-continued
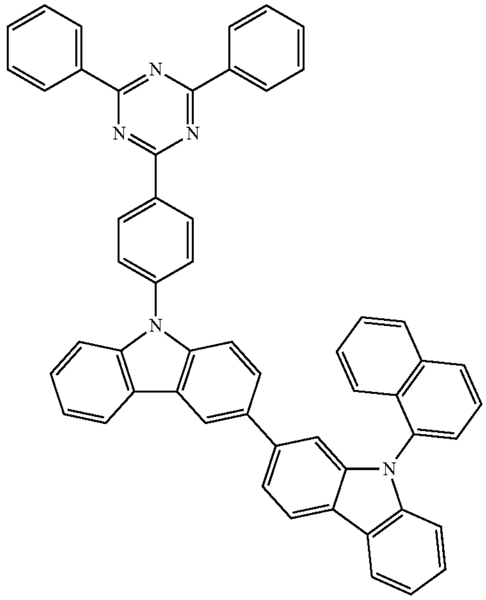
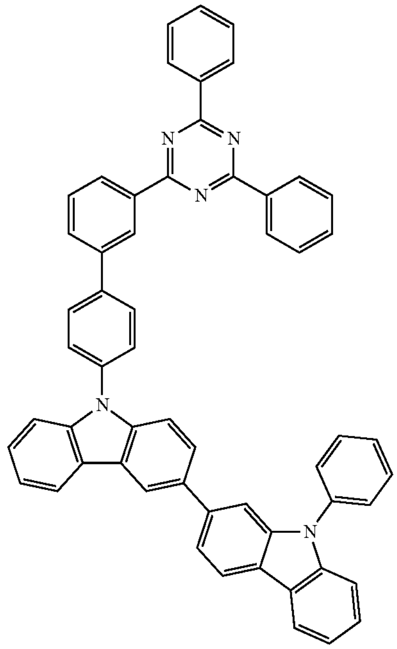
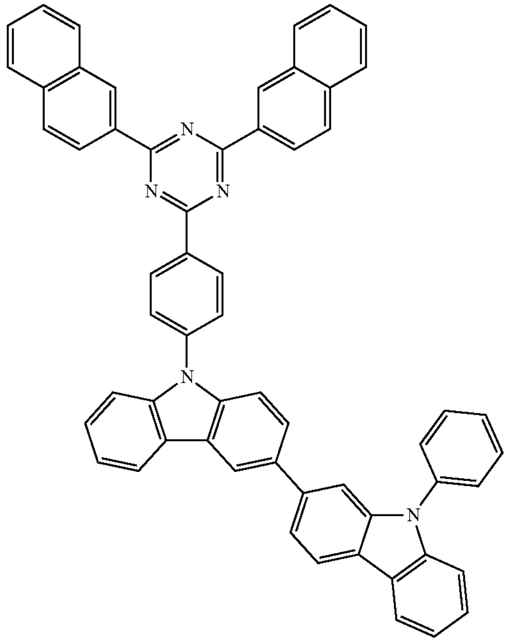

-continued
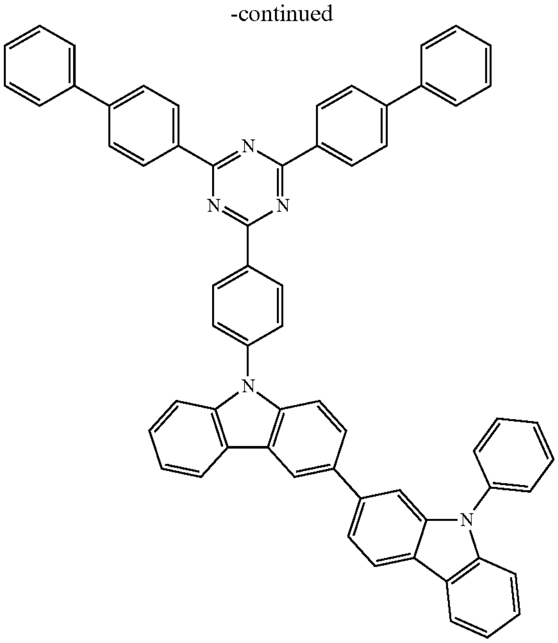
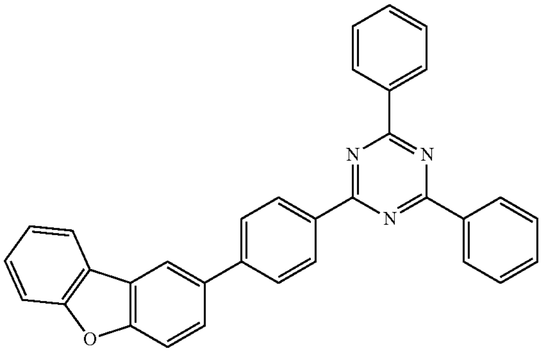
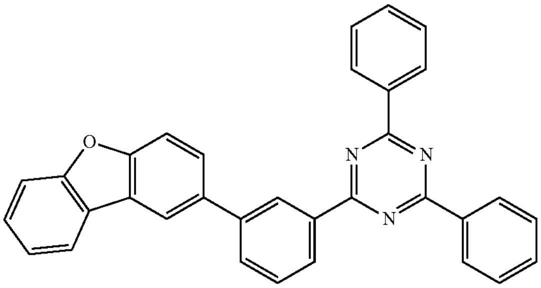
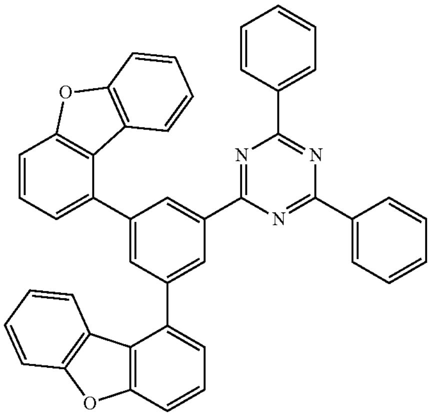
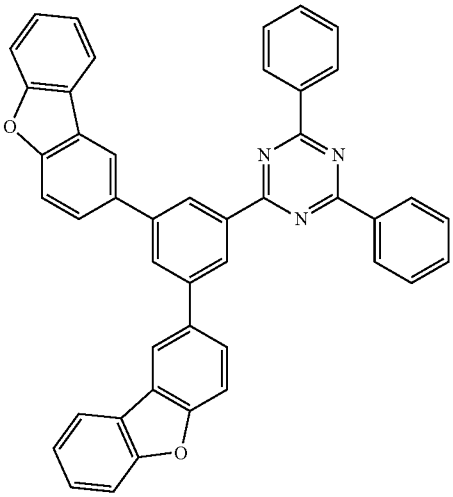

-continued
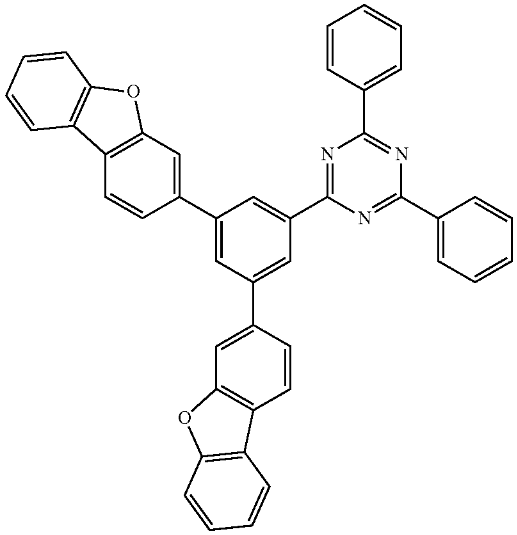
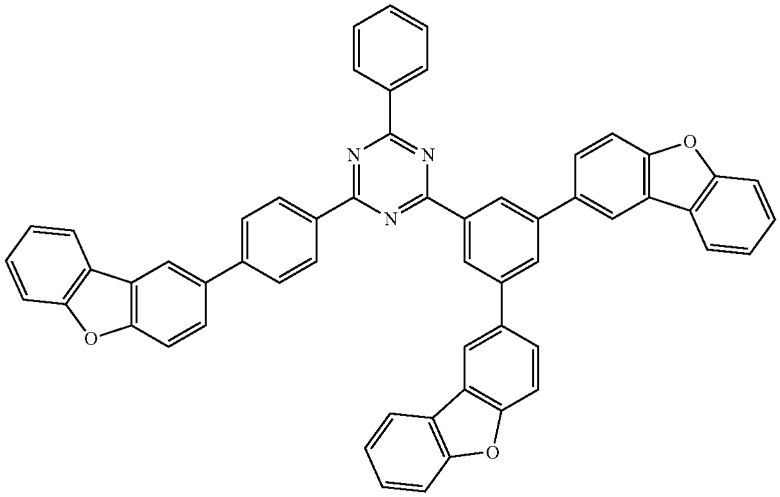
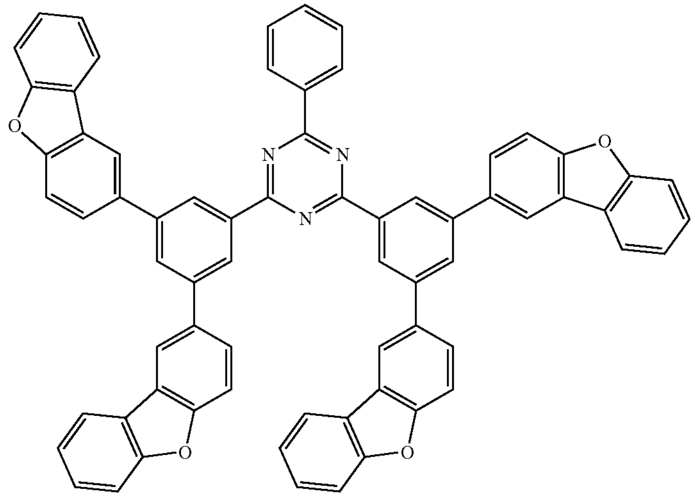

-continued
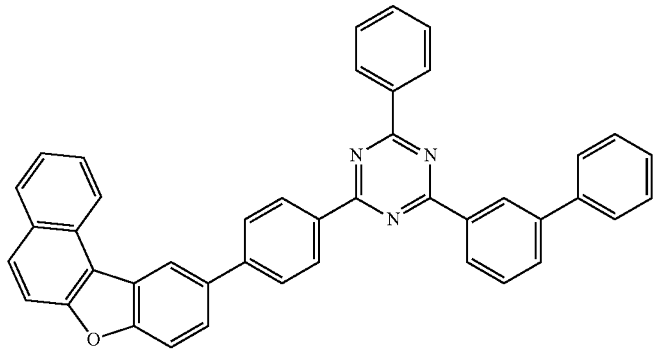
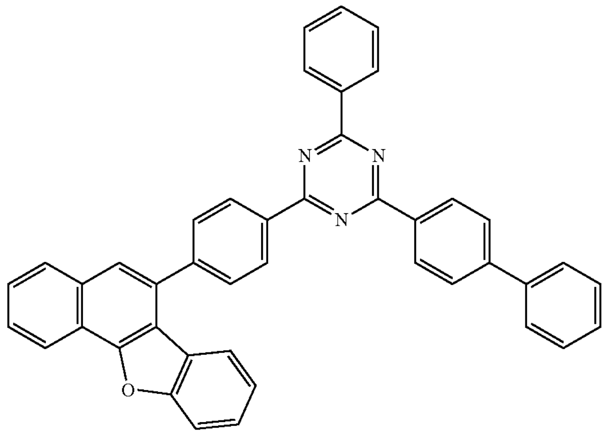
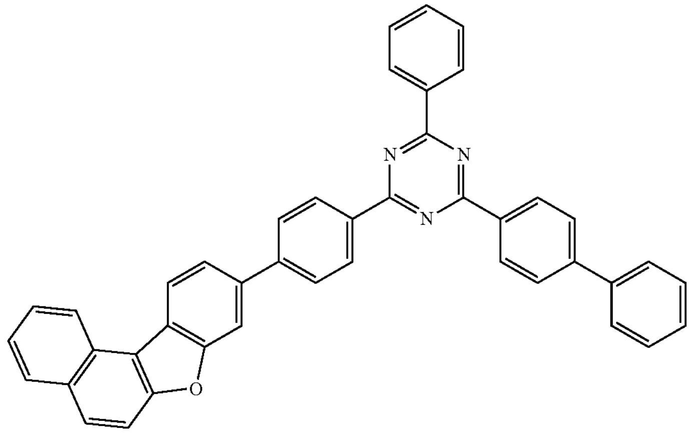
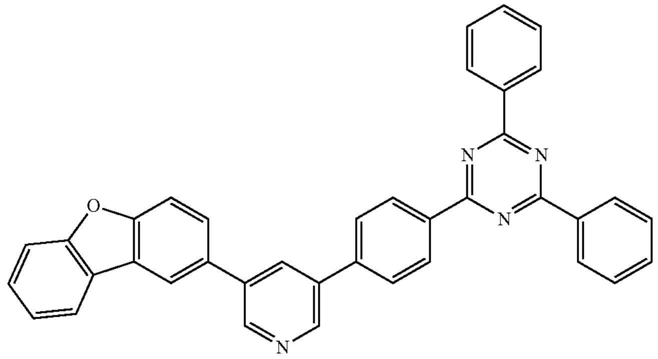

-continued
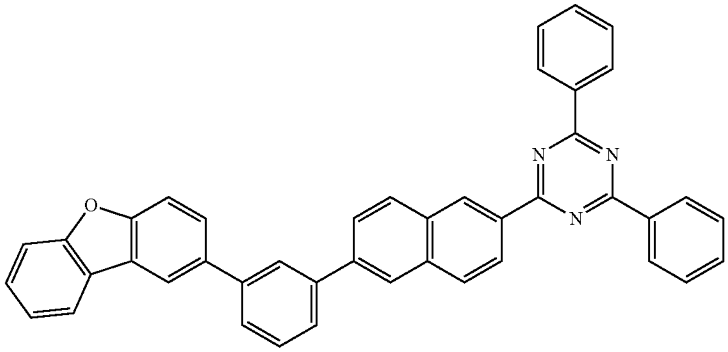
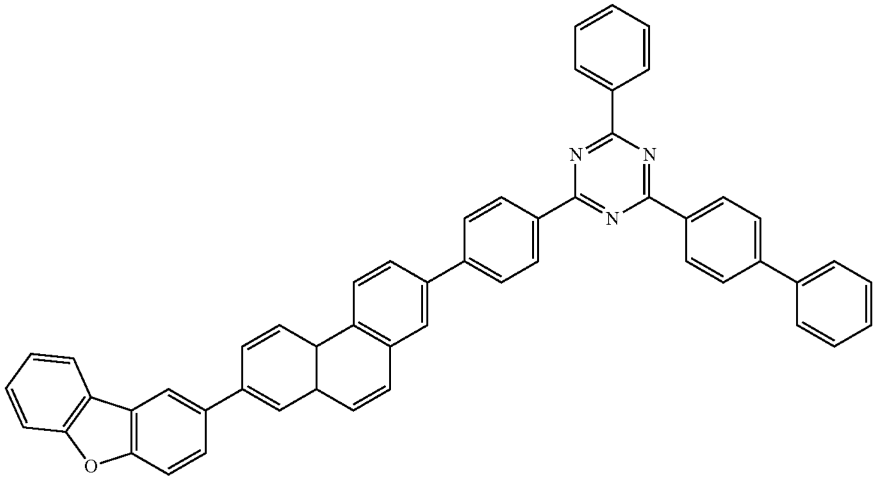
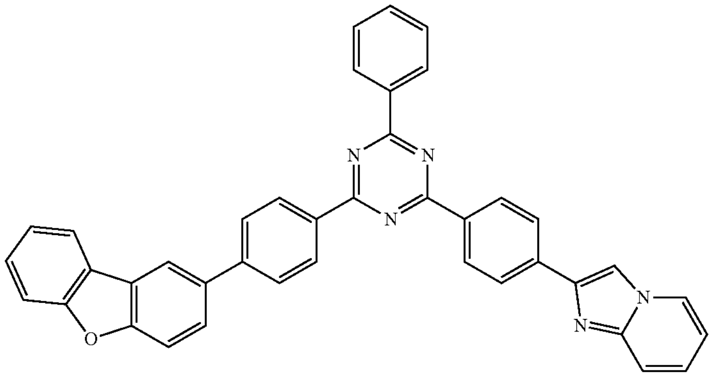
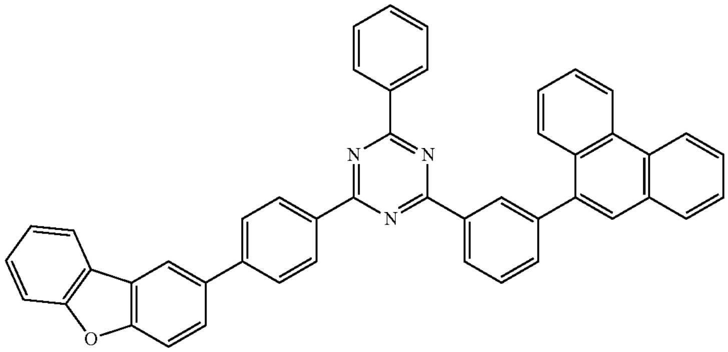

-continued
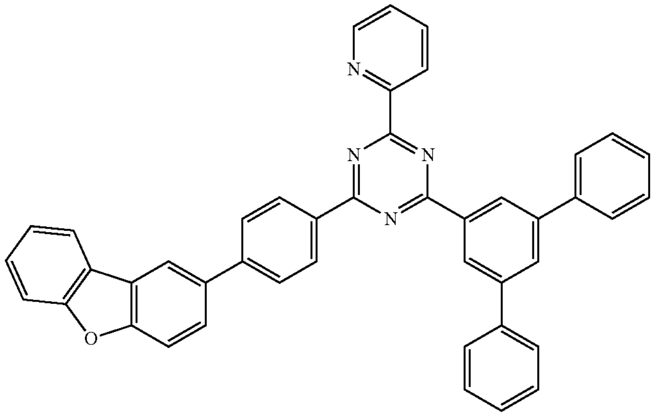
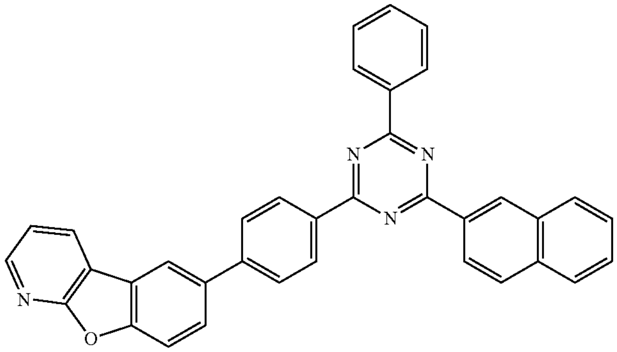
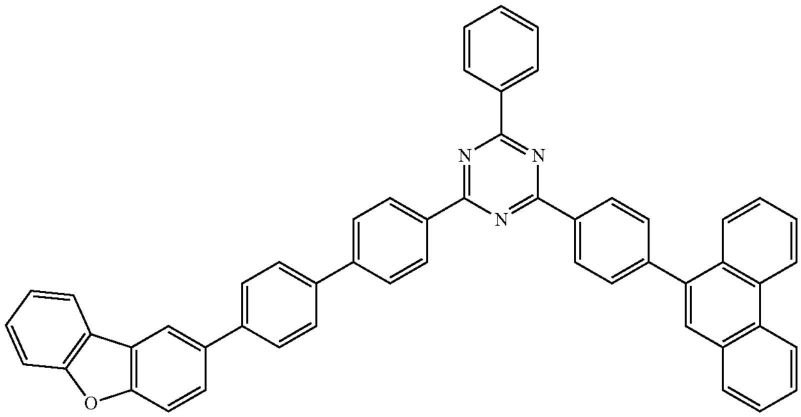
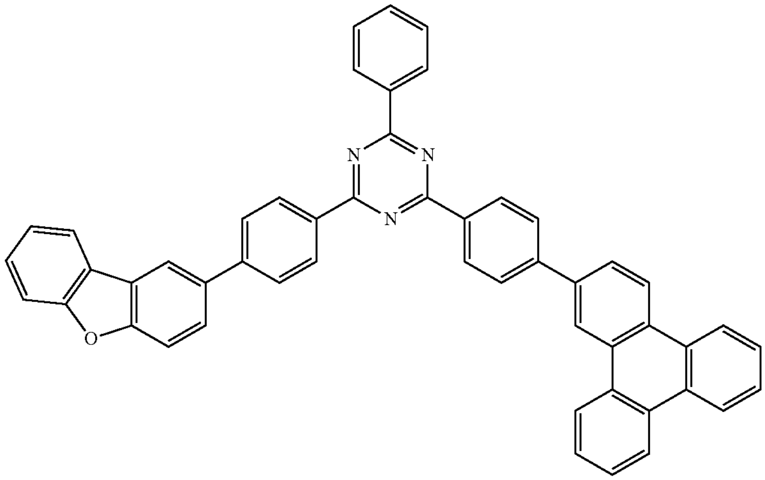

-continued
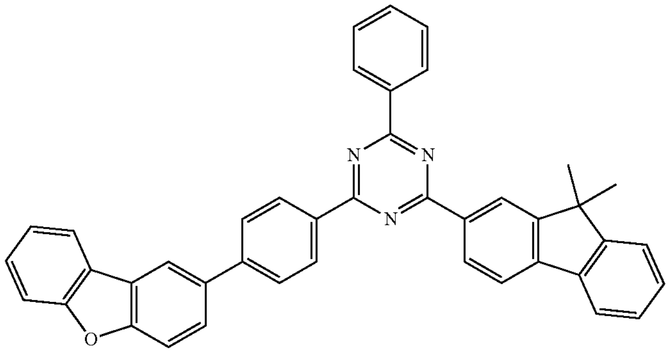
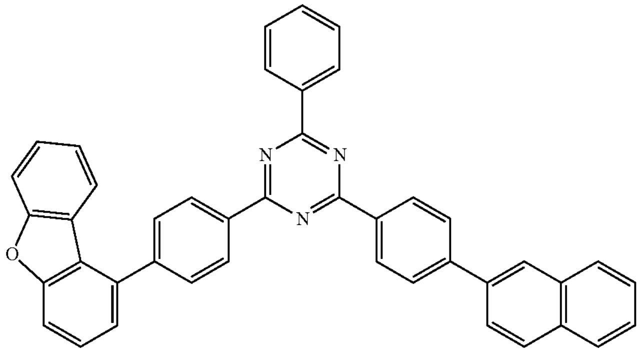
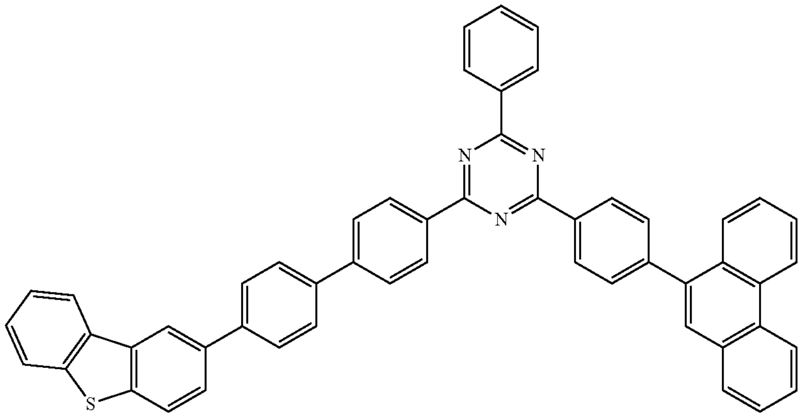
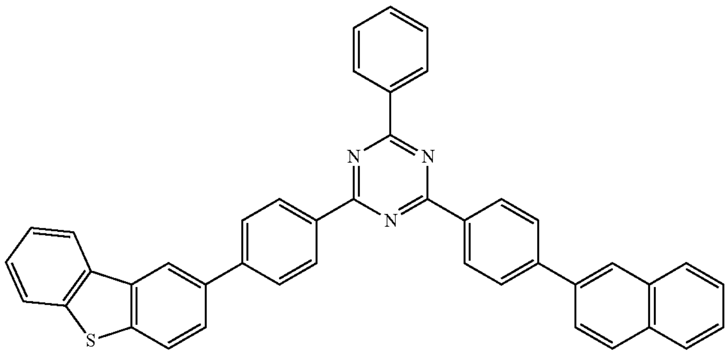

-continued
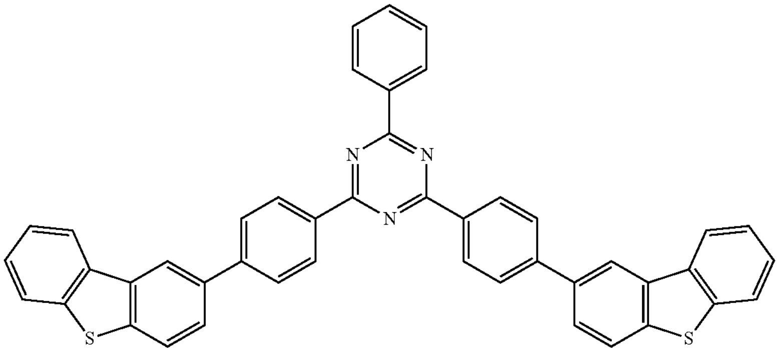
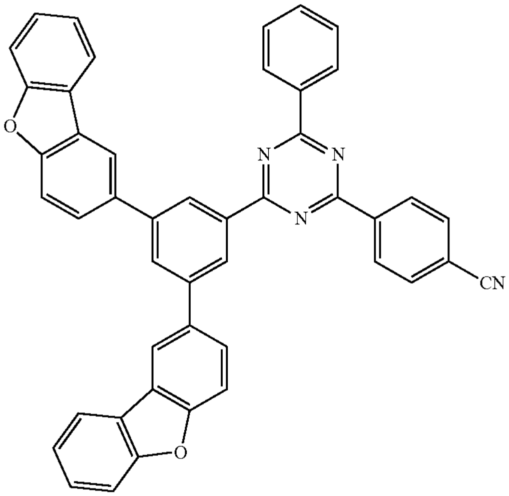
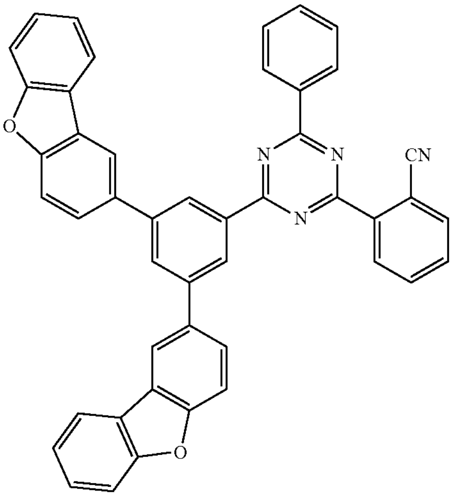
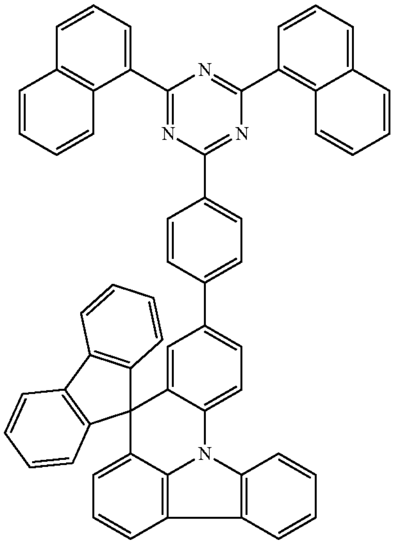
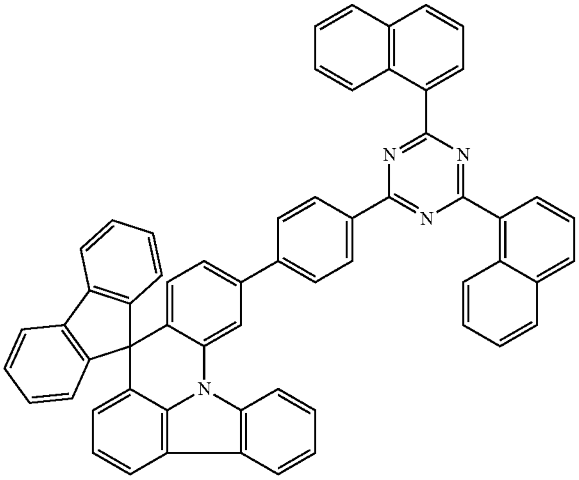

-continued
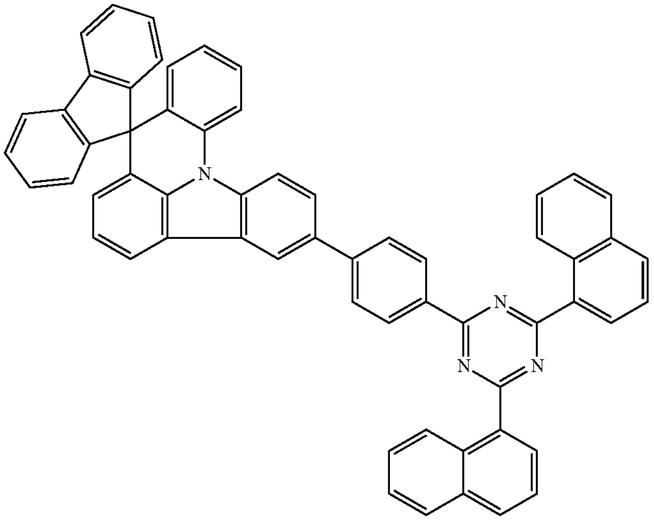
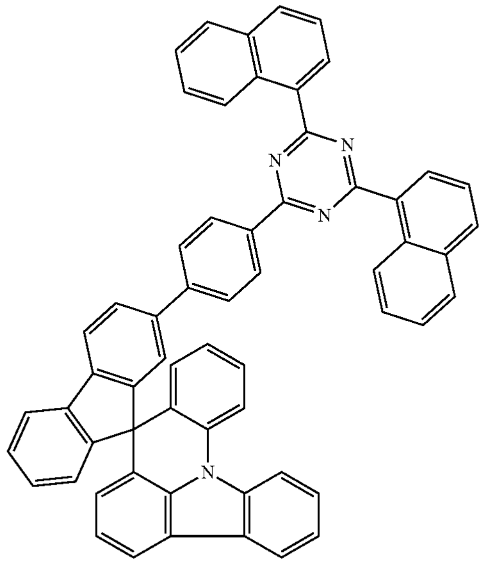
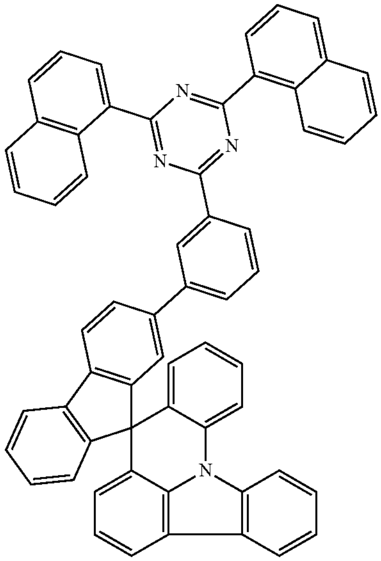
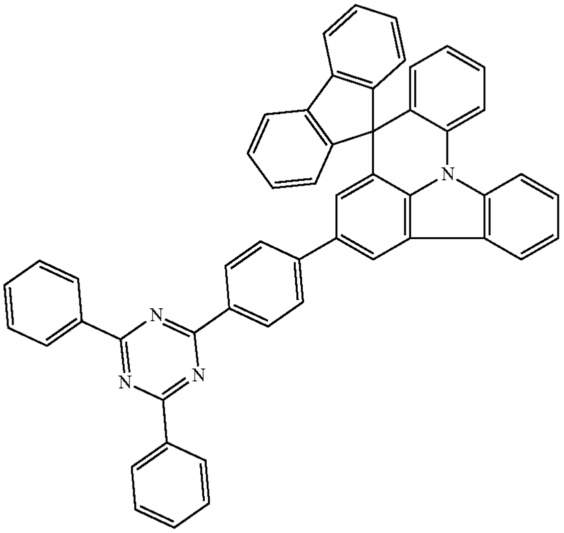
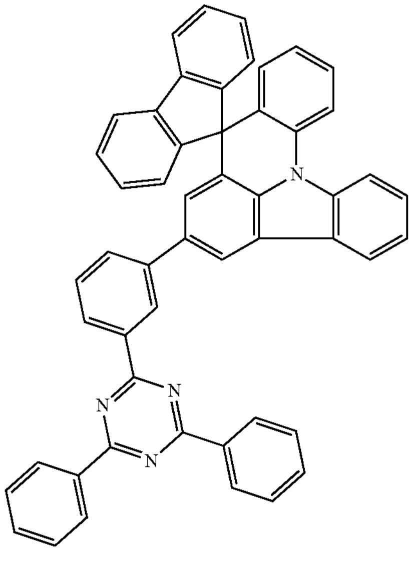
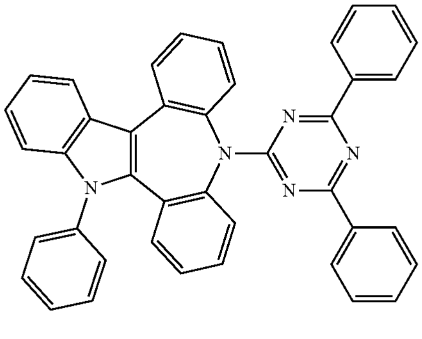

-continued
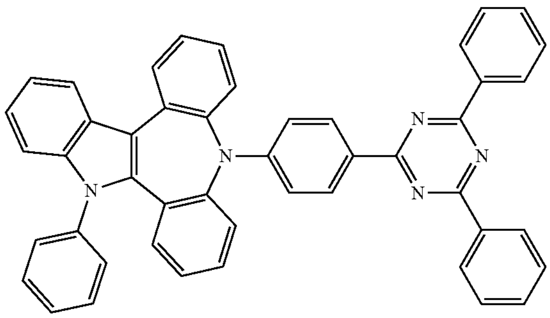
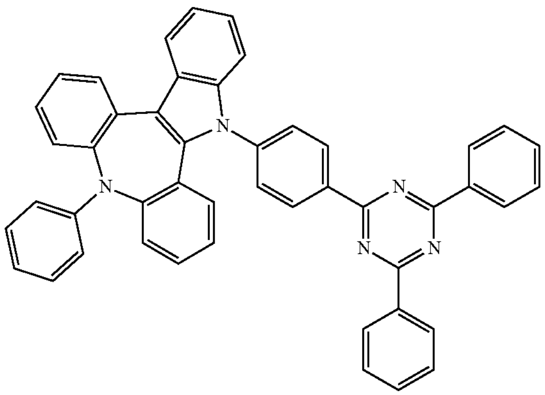
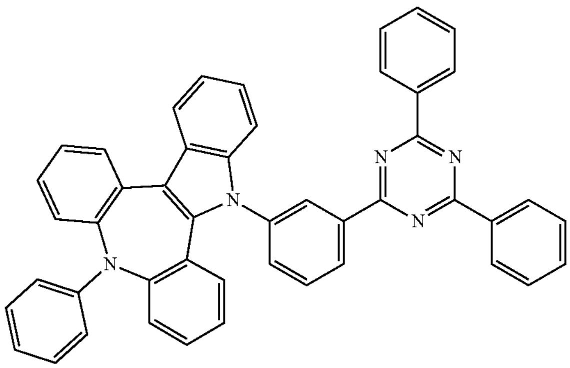
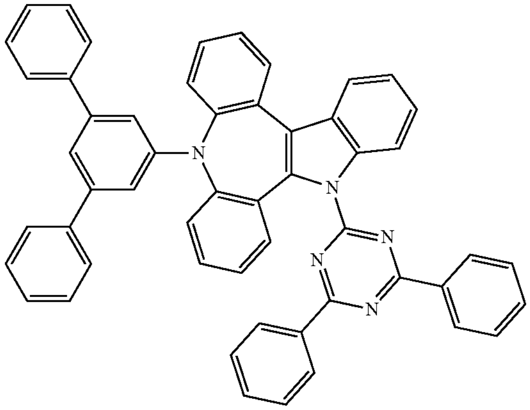
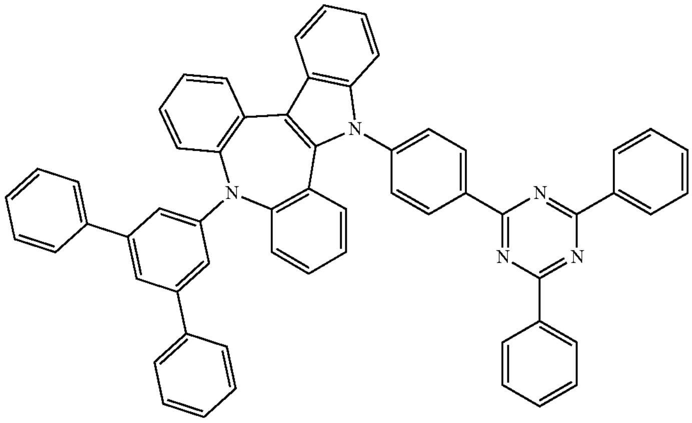
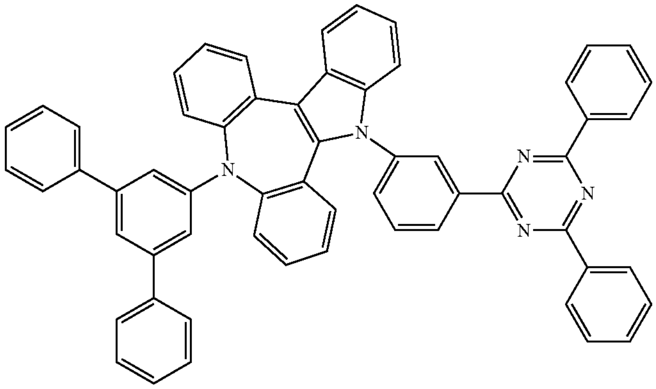

-continued
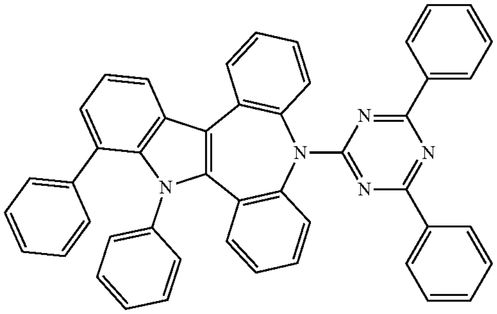
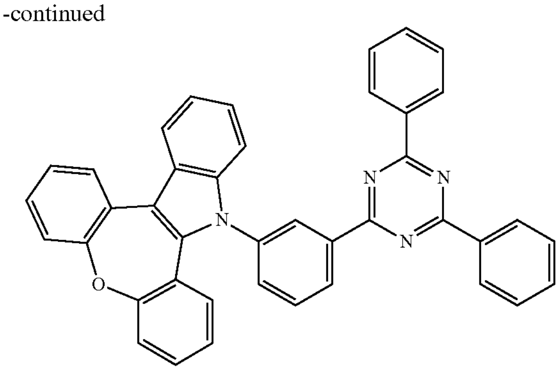
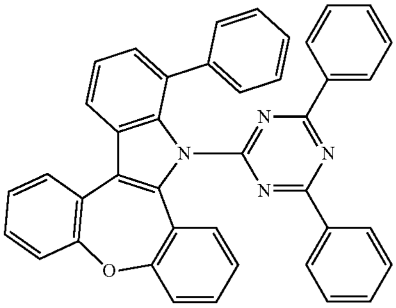
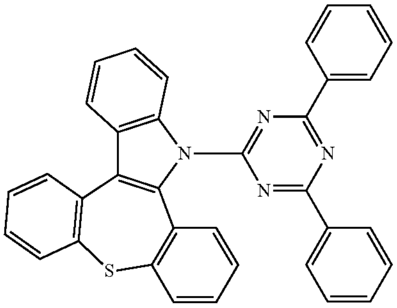
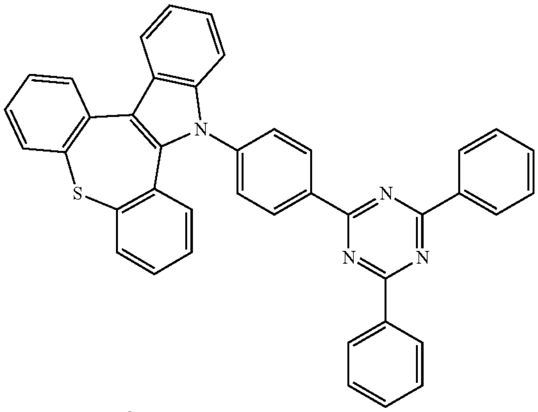
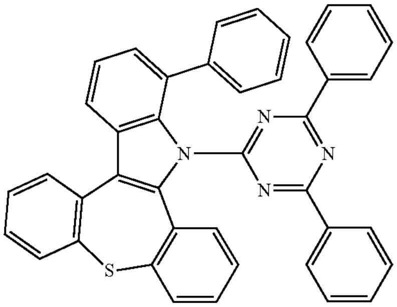
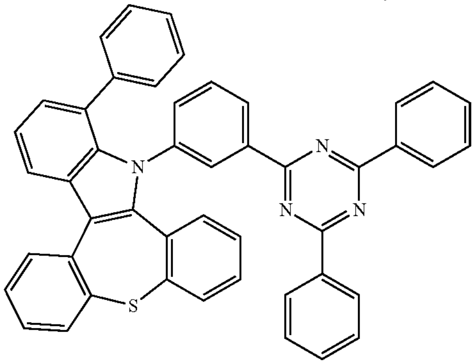
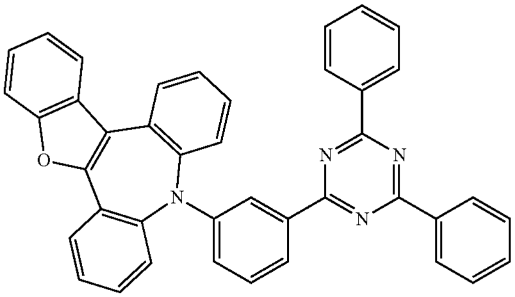
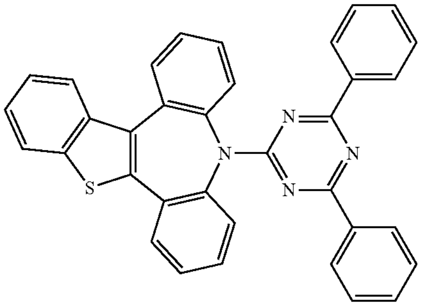
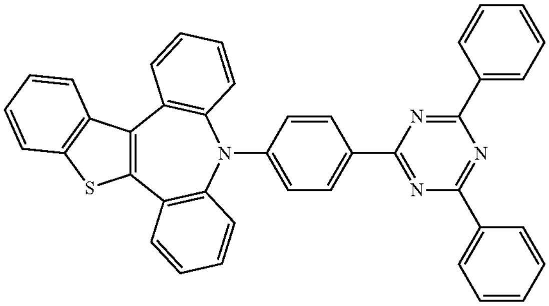

-continued
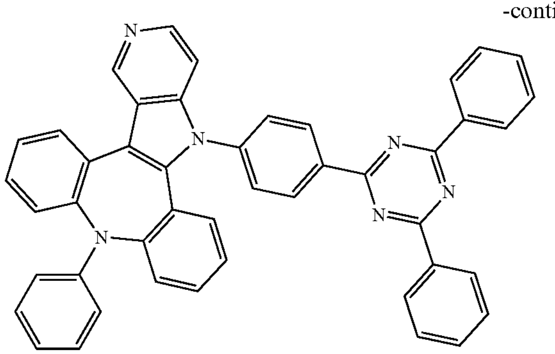
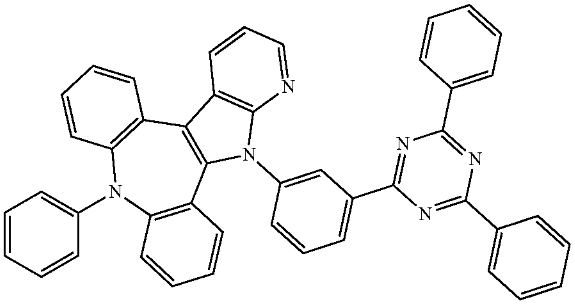
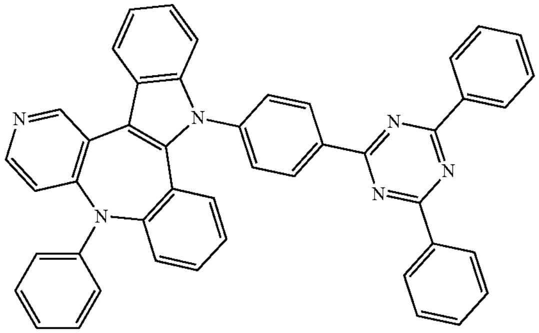
-continued
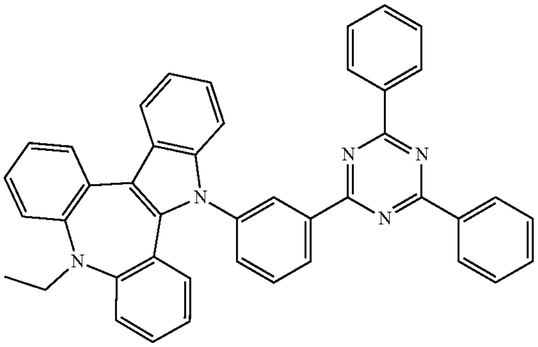
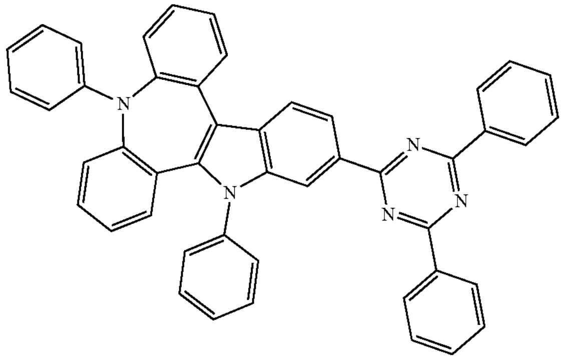
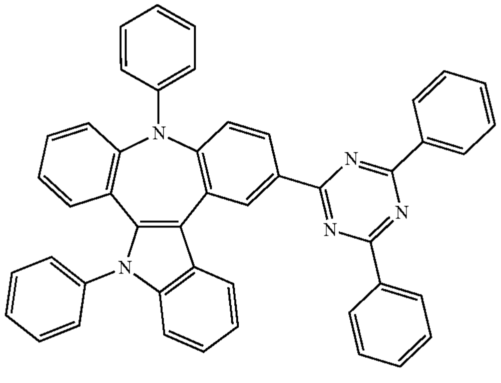
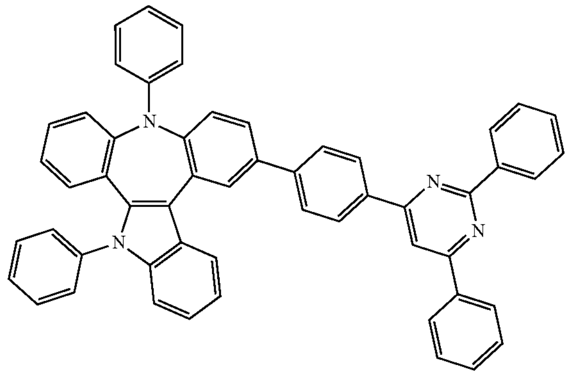

-continued
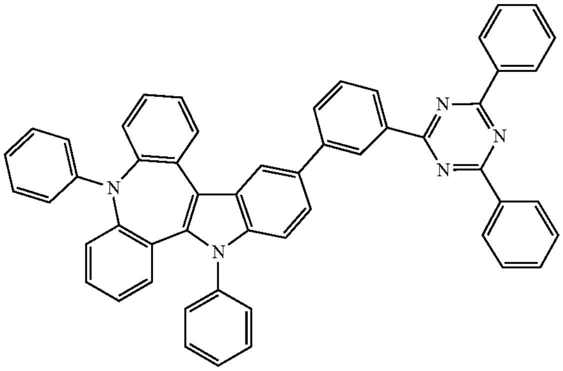
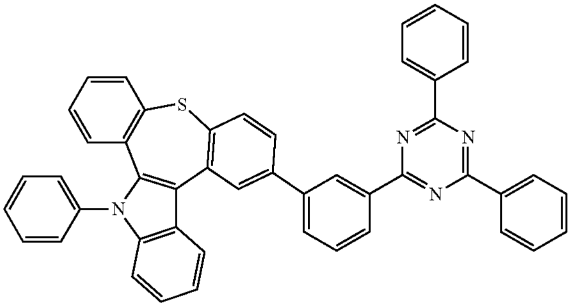
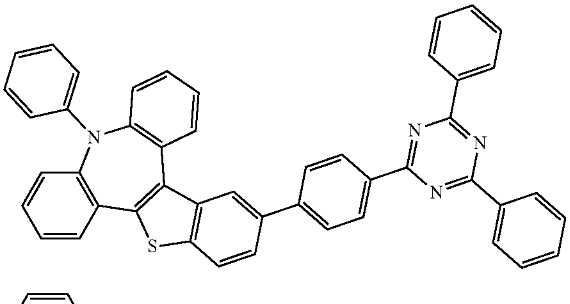
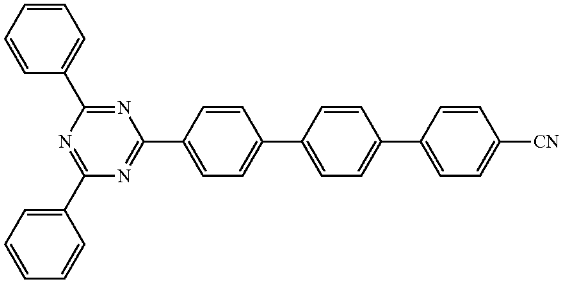
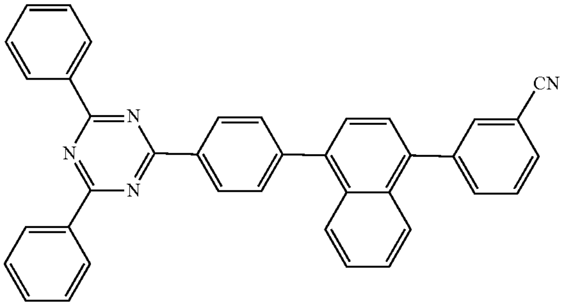
-continued
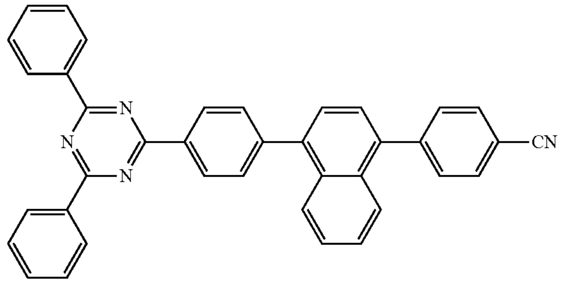
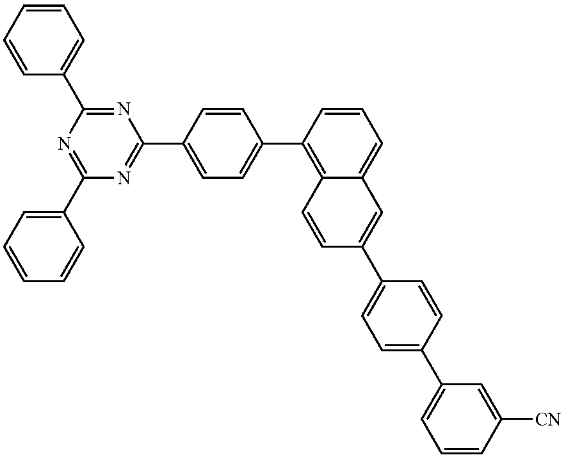
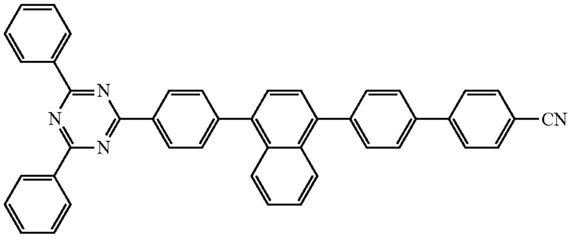
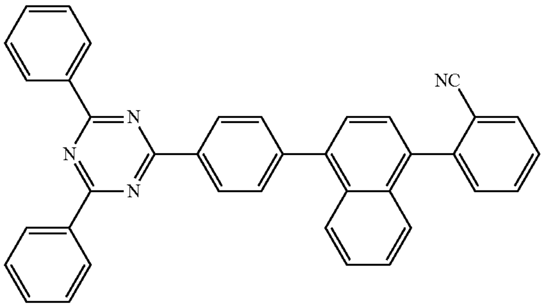
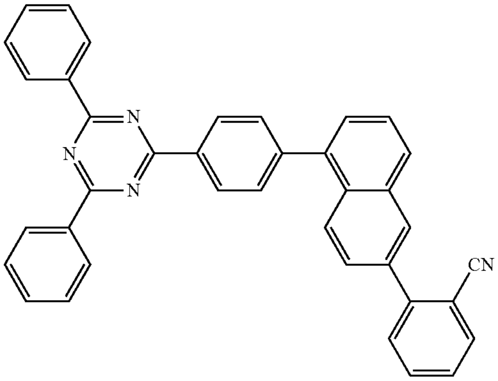

-continued
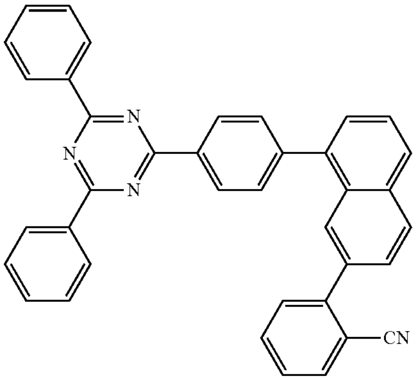
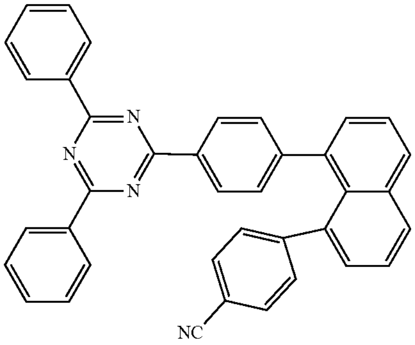
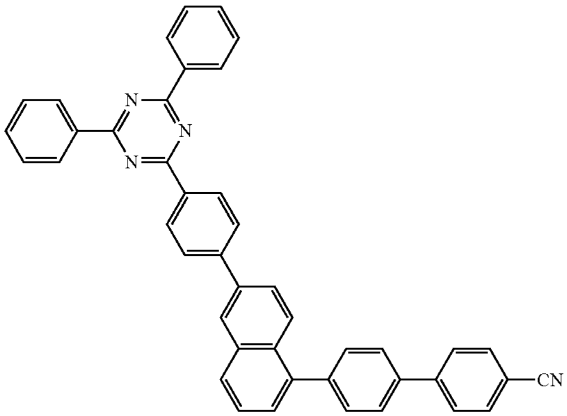
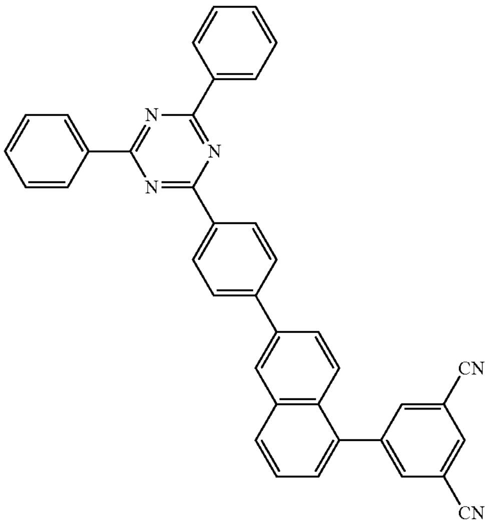
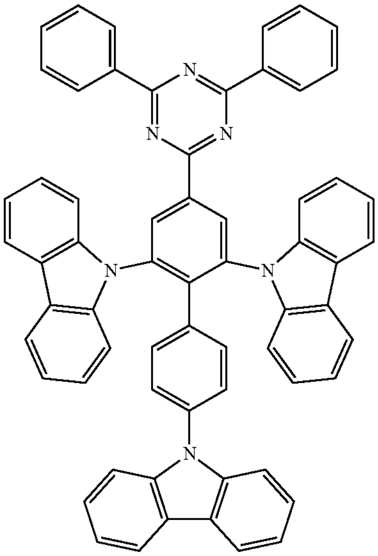
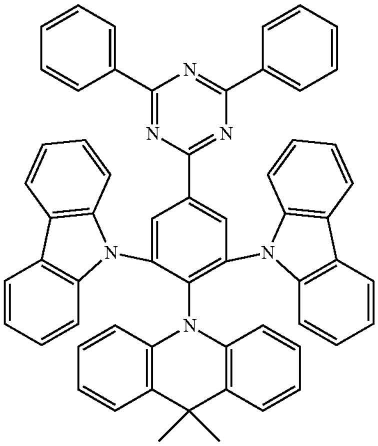
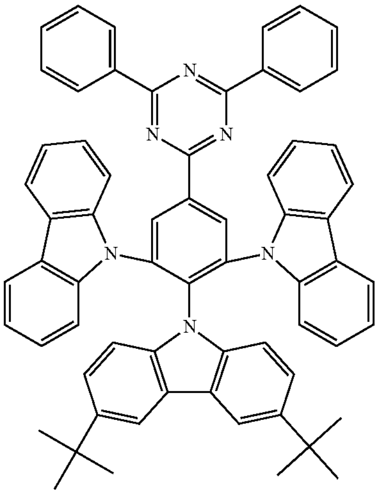

-continued
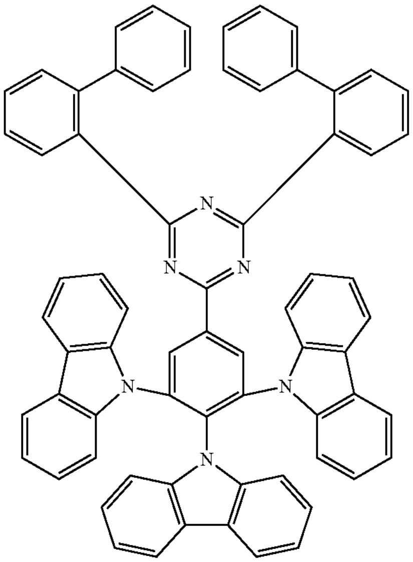
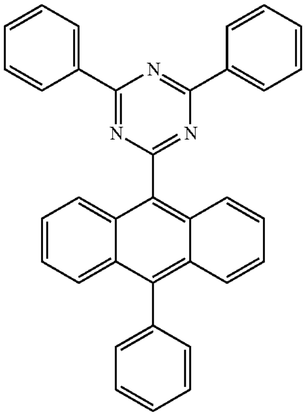
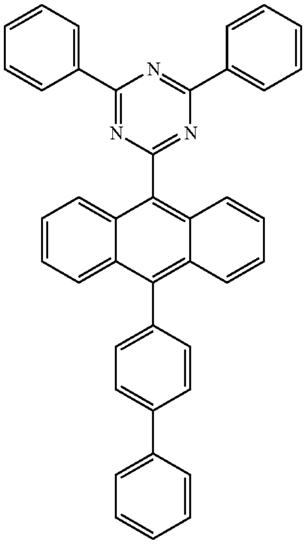
-continued
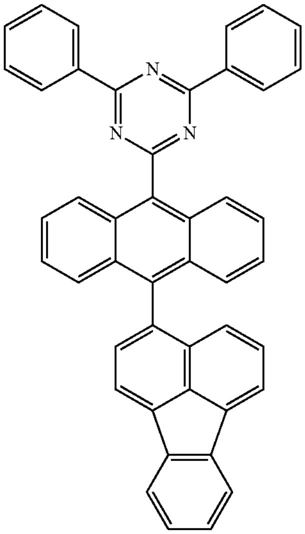
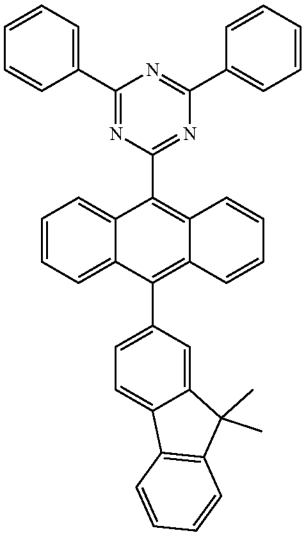
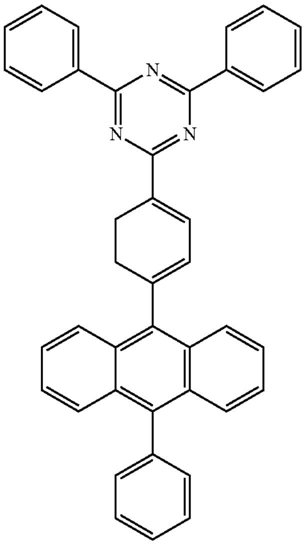

-continued
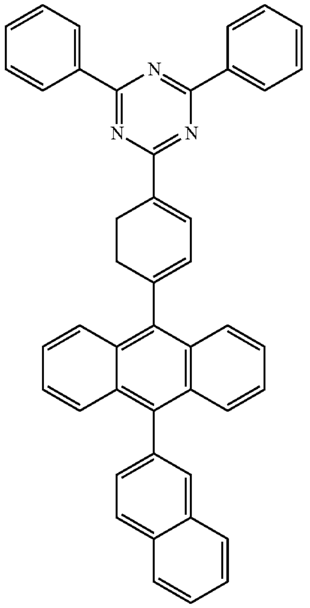
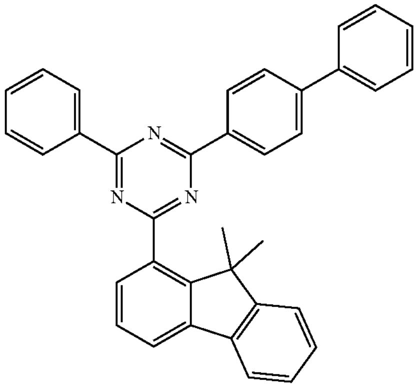
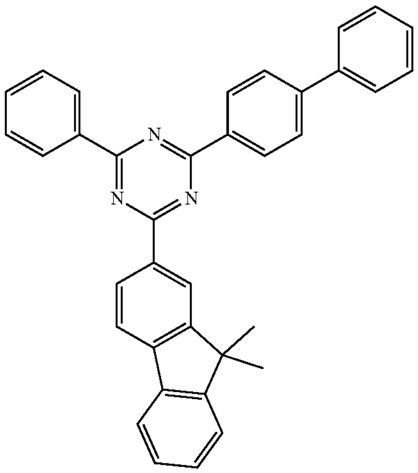
-continued
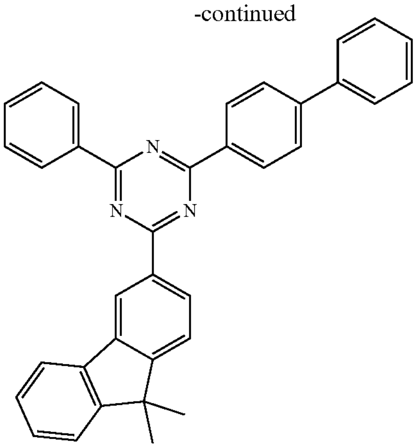
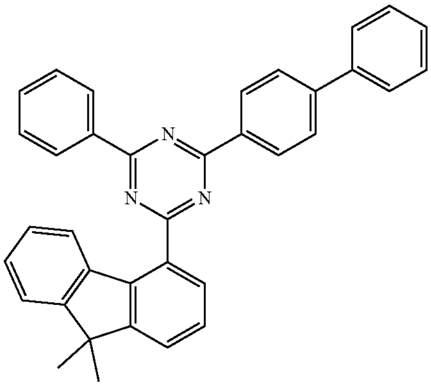
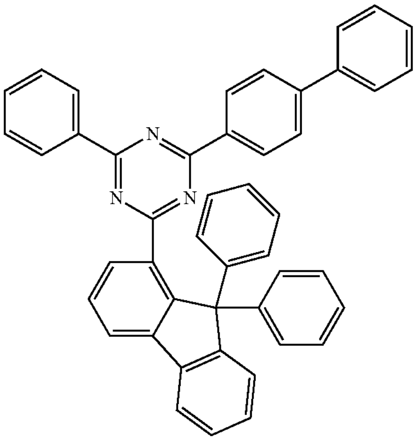
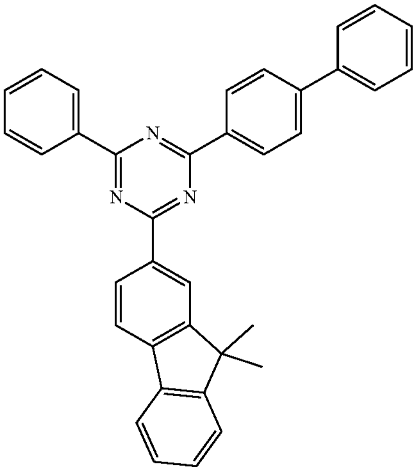

-continued
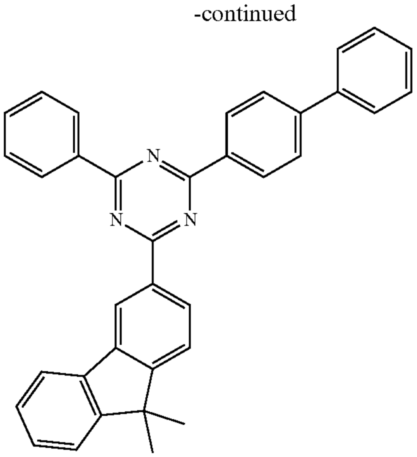
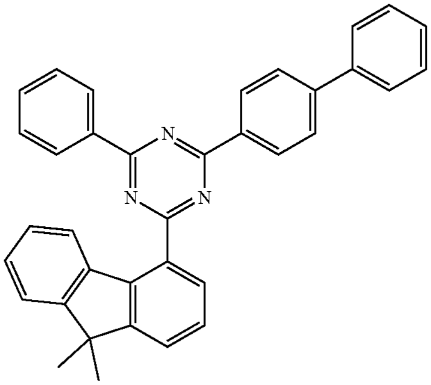
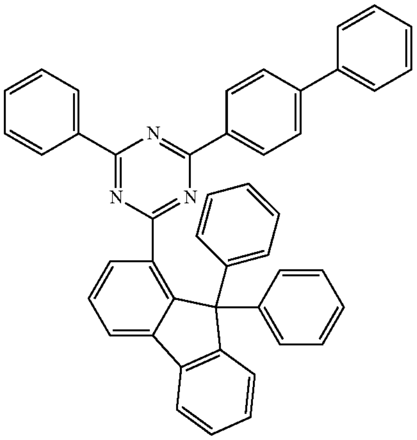
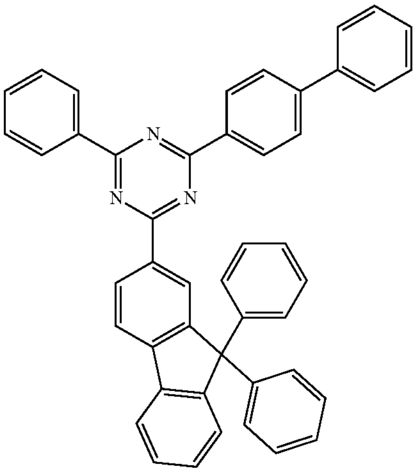
-continued
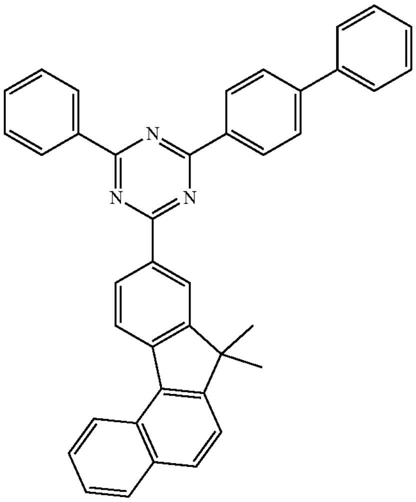
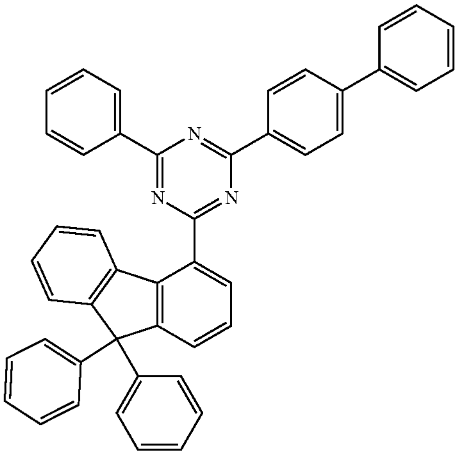
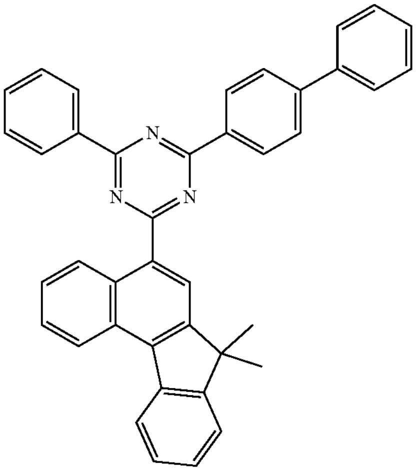

-continued
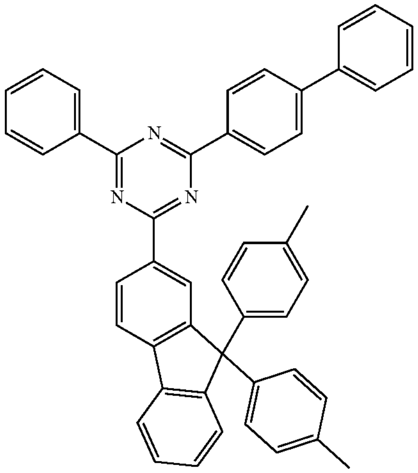
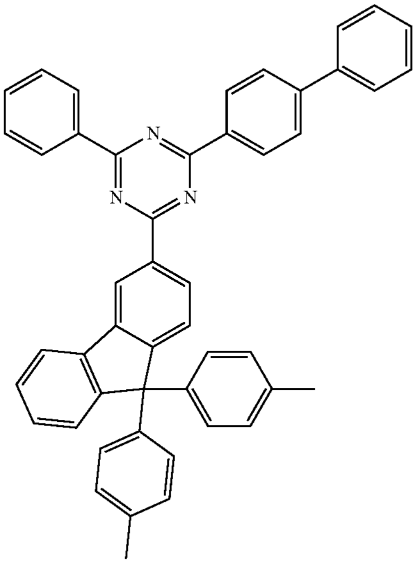
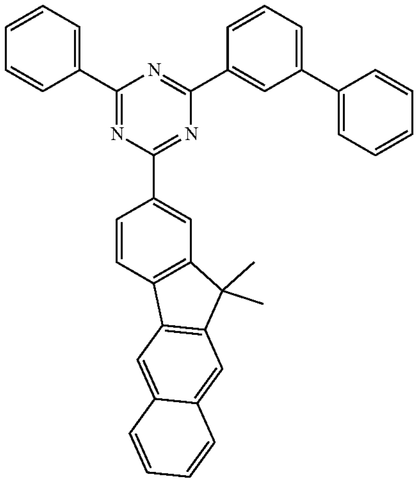
-continued
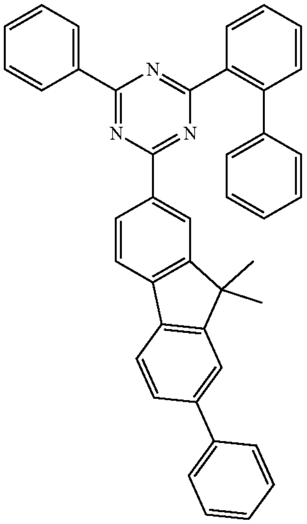
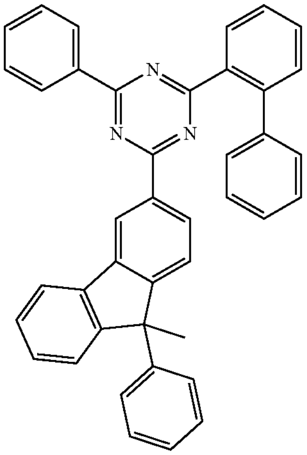
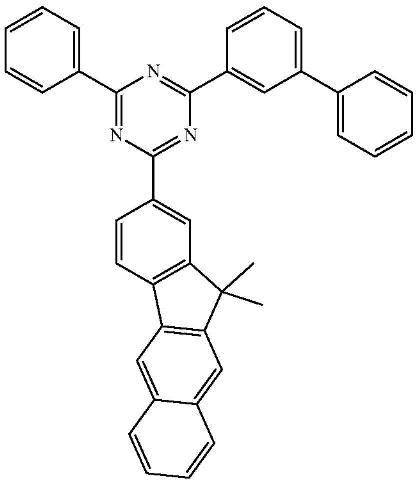

-continued
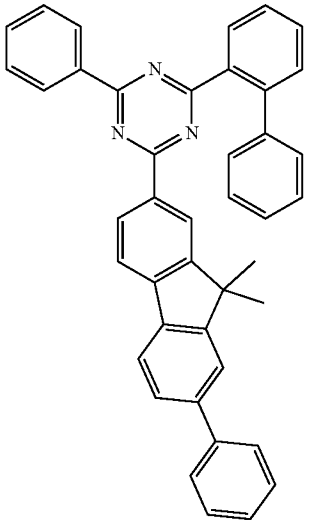
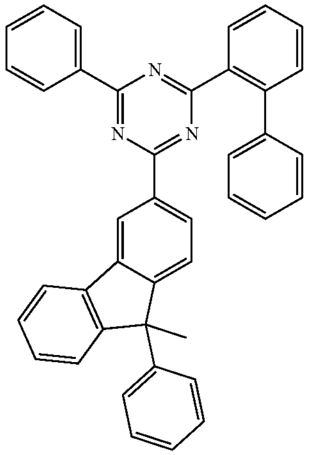
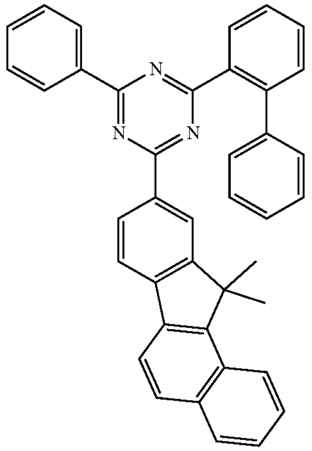
-continued
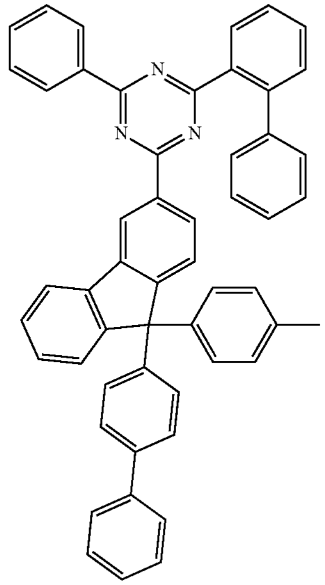
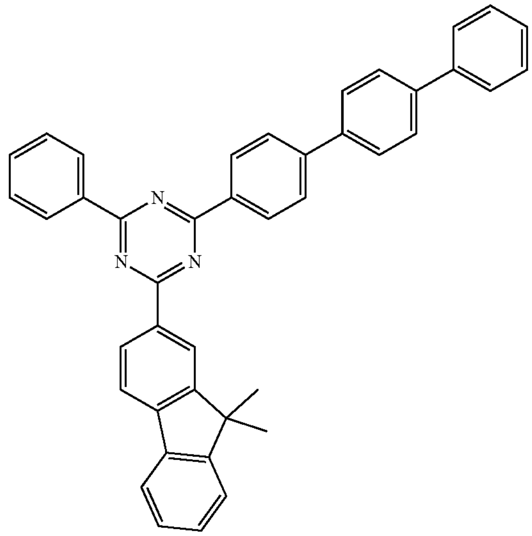
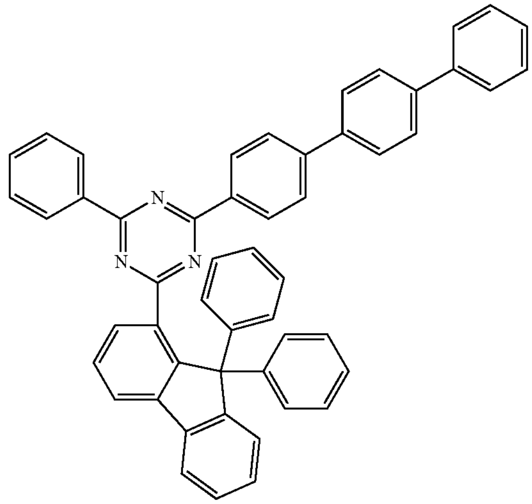

-continued
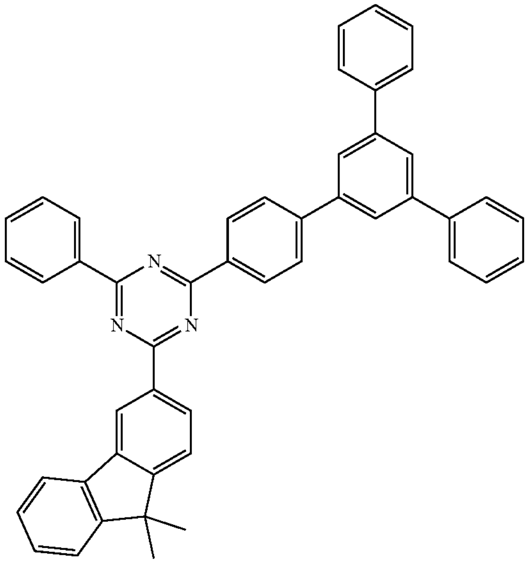
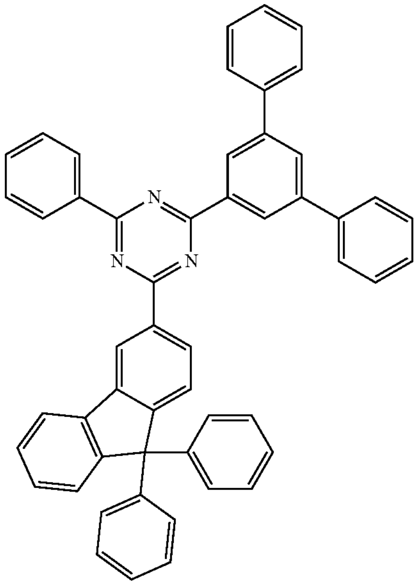
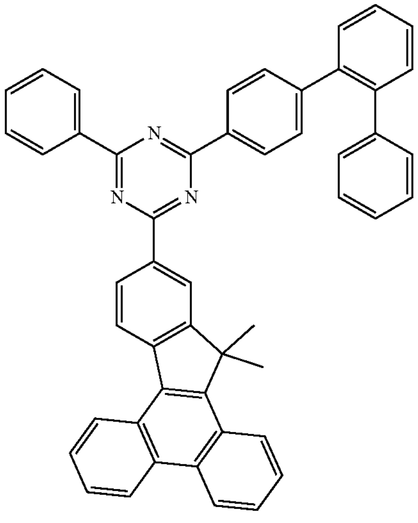
-continued
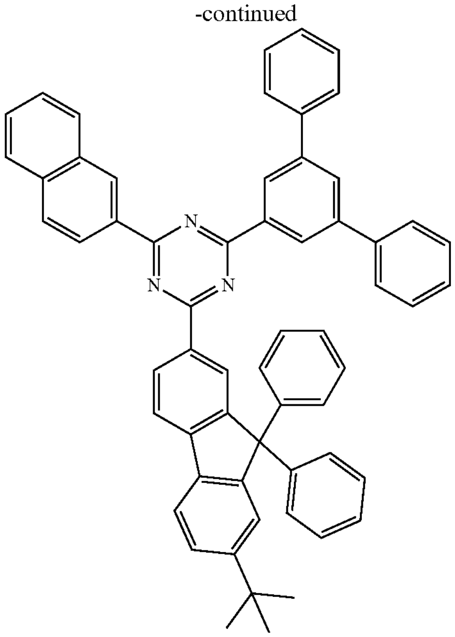
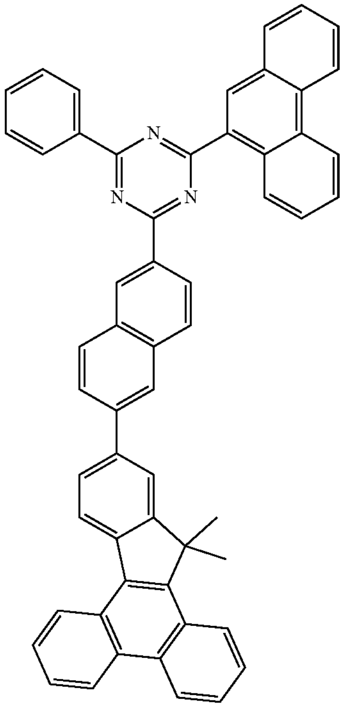

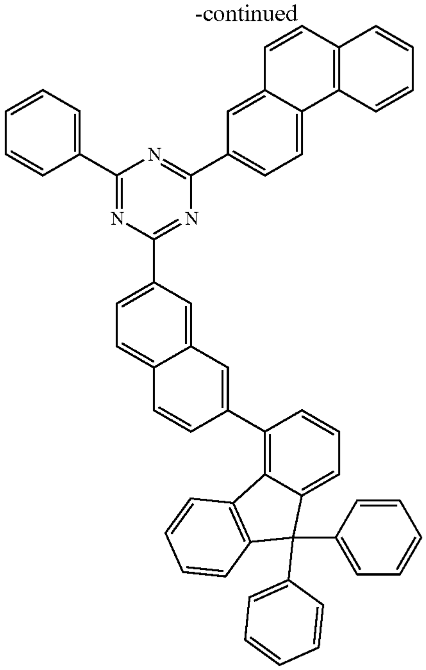
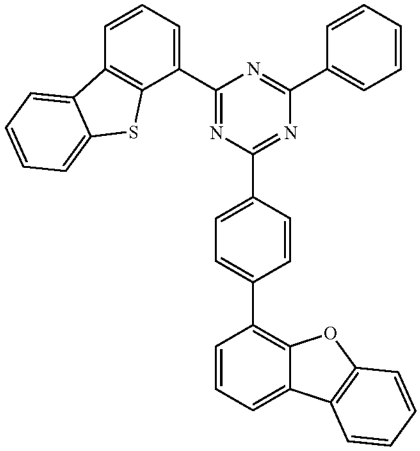
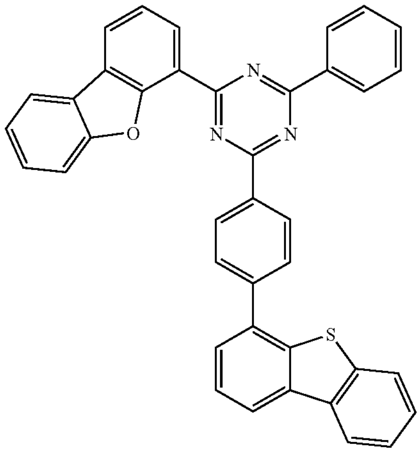
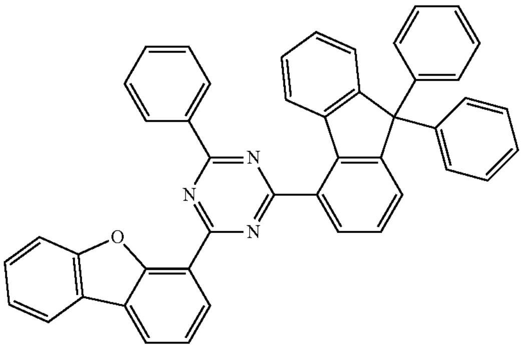
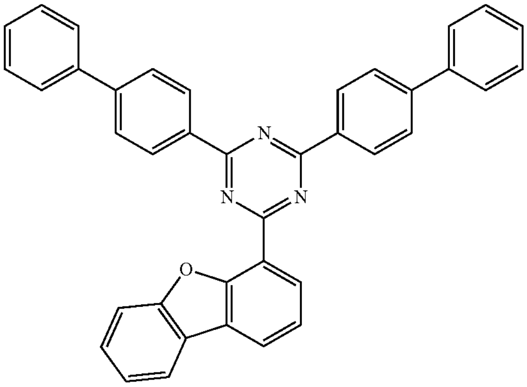
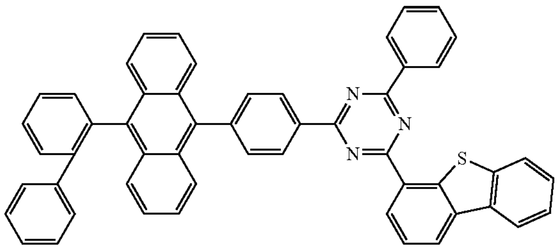
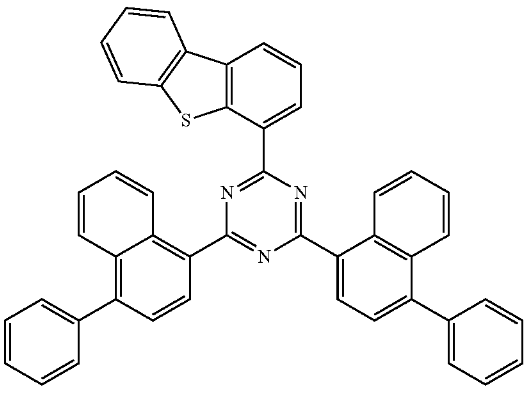

-continued

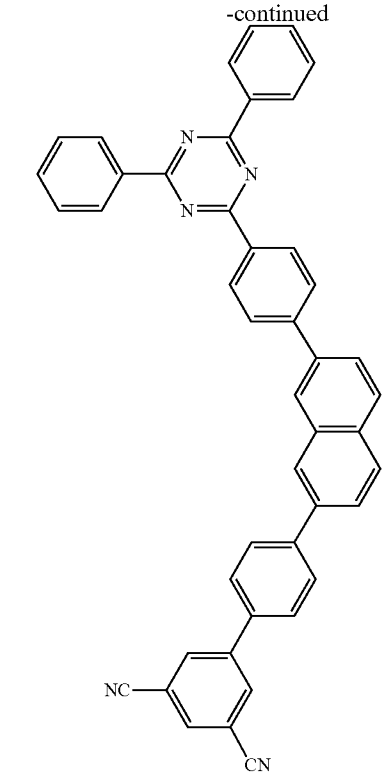

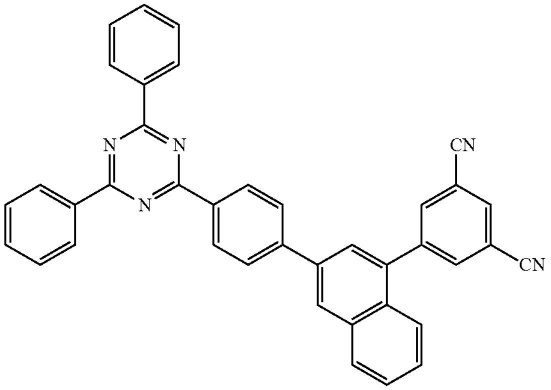

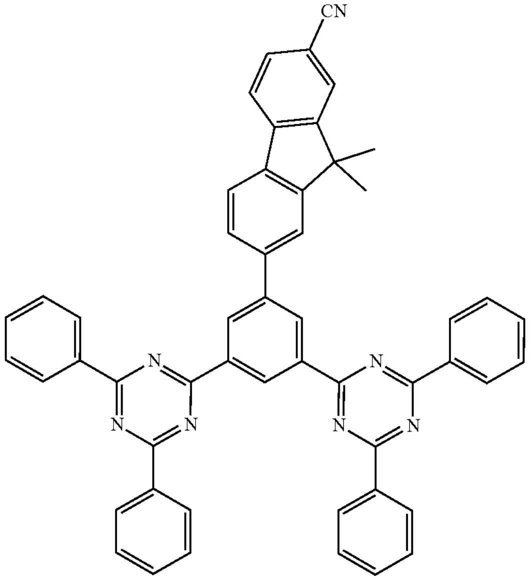

-continued

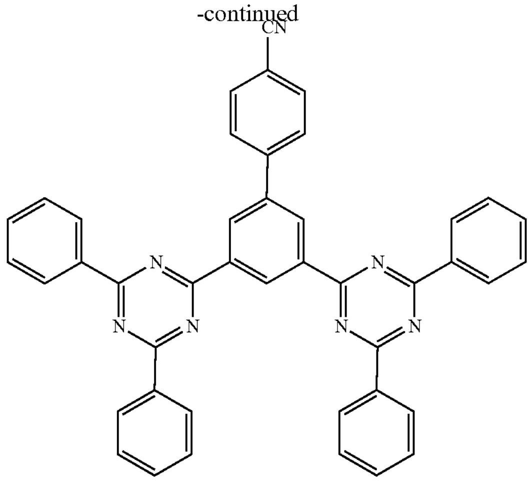

(Third Compound)

In one embodiment, the organic layer further includes a hole-transporting layer, the hole-transporting layer is disposed between the anode and the emitting layer and directly adjacent to the emitting layer, and the hole-transporting layer contains a third compound. The third compound will be described.

In one embodiment, the third compound is a compound which satisfies the following expression (M1).

$$Ip(HT) \geq 5.67 \text{ eV} \quad \text{(M1)}$$

In the expression (M1), Ip(HT) is the ionization potential of the second compound.

The arithmetic symbol "≥" in the expression (M1) means that the ionization potential of the third compound is 5.67 eV or higher.

In one embodiment, the ionization potential of the third compound is preferably 5.70 eV or higher (i.e., $Ip(HT) \geq 5.70$ eV), more preferably higher than 5.7 eV (i.e., $Ip(HT) > 5.7$ eV).

In the invention, the ionization potential is measured in air using a photoelectron spectrometer. Specifically, it can be measured by the method described in Examples.

In one embodiment, the compound which satisfies the expression (M1) may be a compound represented by the formula (C1) or (A).

In one embodiment, the third compound is a compound represented by the formula (C1) or (A).

(Compound Represented by the Formula (C1))

A compound represented by the formula (C1) will be described.

(C1)

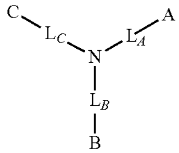

In the formula (C1), $L_A$, $L_B$, and $L_C$ are independently a single bond, a substituted or unsubstituted arylene group including 6 to 18 ring carbon atoms, or a substituted or unsubstituted divalent heterocyclic group including 5 to 13 ring atoms.

A, B, and C are independently a substituted or unsubstituted aryl group including 6 to 30 ring carbon atoms, a substituted or unsubstituted monovalent heterocyclic group including 5 to 30 ring atoms, or —Si($R_{908}$)($R_{909}$)($R_{910}$).

$R_{908}$ to $R_{910}$ are independently a substituted or unsubstituted aryl group including 6 to 30 ring carbon atoms.

When one or more of $R_{908}$ to $R_{910}$ are present in two or more, each of the two or more $R_{908}$ to $R_{910}$ are the same or different.

Provided that when a 4-dibenzofuranyl structure is contained in the molecule of the compound represented by the formula (C1), the number of the 4-dibenzofuranyl structure is one.

The 4-dibenzofuranyl structure is a structure represented by the following formula. In the formula, * is a single bond, and the positions capable of being substitution on the ring (excluding *) may have any arbitrary substituent.

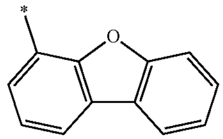 [SMILES: *c1cccc2c1oc1ccccc12]

In one embodiment, when the compound represented by the formula (C1) is the compound which satisfies the expression (M1), the number of the 4-dibenzofuranyl structures that can be contained in the molecule of the compound represented by the formula (C1) is not limited.

In one embodiment, when a dibenzofuranyl structure is contained in the molecule of the compound represented by the formula (C1), the number of the dibenzofuranyl structure is one.

In one embodiment, the compound represented by the formula (C1) is a compound represented by the following formula (C11).

(C11)

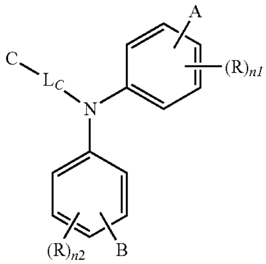

In the formula (C11)

A, B, C, and $L_C$ are as defined in the formula (C1).

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{501}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

when one or more of $R_{901}$ to $R_{904}$ are present in two or more, each of the two or more $R_{901}$ to $R_{904}$ are the same or different;

n1 and n2 are independently an integer of 0 to 4; and when a plurality of R's are present, the plurality of R's may be the same as or different from each other.

In the compound represented by the formula (C1) or (C11), it is preferable that $L_A$, $L_B$, and $L_C$ are independently an aromatic hydrocarbon ring group represented by the following formula (L1) or (L2).

(L1)

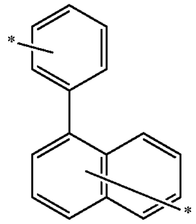

(L2)

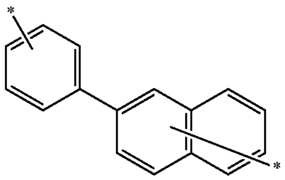

In the formula (L1) or (L2), one of two *'s is bonded with the nitrogen atom in the formula (C1) and the other is bonded with any one of A to C in the formula (C1).

In the compound represented by the formula (C1) or (C11), it is preferable that $L_A$, $L_B$, and $L_C$ are independently a single bond, or a substituted or unsubstituted arylene group including 6 to 12 ring carbon atoms.

In one embodiment, in the compound represented by the formula (C1) or (C11), two of A to C are groups represented by the following formula (D). In this case, the two groups represented by the formula (D) may be the same or different.

(D)

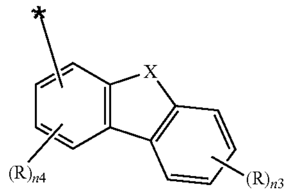

In the formula (D), X is $CR_1R_2$, $NR_3$, an oxygen atom, or a sulfur atom.

When X is $CR_1R_2$, $R_1$ and $R_2$ form a substituted or unsubstituted, saturated or unsaturated ring by bonding with each other, or do not form a substituted or unsubstituted, saturated or unsaturated ring.

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R, $R_1$, and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, —$Si(R_{901})(R_{902})(R_{903})$,

—O—$(R_{904})$, a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n3 is an integer of 0 to 4, and n4 is an integer of 0 to 3.

When a plurality of R's are present, the plurality of R's may be the same as or different from each other.

* is a single bond.

In one embodiment, the compound represented by the formula (C1) is a compound represented by the following formula (C12A) or (C13A):

(C12A)

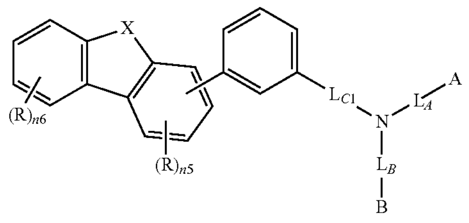

-continued (C13A)

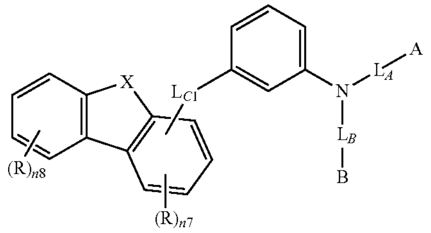

In the formulas (C12A) and (C13A), $L_A$ and $L_B$ are independently a single bond, a substituted or unsubstituted arylene group including 6 to 18 ring carbon atoms or substituted or unsubstituted divalent heterocyclic group including 5 to 13 ring atoms.

A and B are independently a substituted or unsubstituted aryl group including 6 to 30 ring carbon atoms, a substituted or unsubstituted monovalent heterocyclic group including 5 to 30 ring atoms, or —$Si(R_{908})(R_{909})(R_{910})$.

$R_{908}$ to $R_{910}$ are independently a substituted or unsubstituted aryl group including 6 to 30 ring carbon atoms.

When one or more of $R_{908}$ to $R_{910}$ are present in two or more, each of the two or more $R_{908}$ to $R_{910}$ are the same or different.

$L_{c1}$ is a substituted or unsubstituted arylene group including 6 to 12 ring carbon atoms.

X is $CR_1R_2$, $NR_3$, an oxygen atom, or a sulfur atom.

When X is $CR_1R_2$, $R_1$ and $R_2$ form a substituted or unsubstituted, saturated or unsaturated ring by bonding with each other, or do not form a substituted or unsubstituted, saturated or unsaturated ring.

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R, $R_1$, and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, —$Si(R_{901})(R_{902})(R_{903})$,

—O—$(R_{904})$, a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n5 and n7 are independently an integer of 0 to 3, and n6 and n8 are independently an integer of 0 to 4.

When a plurality of R's are present, the plurality of R's may be the same as or different from each other.

In one embodiment, the compound represented by the formula (C1) is a compound represented by the following formula (C12) or (C13):

(C12)

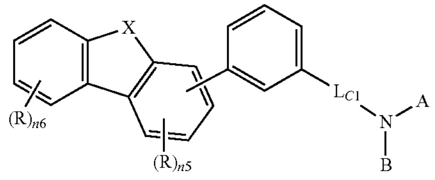

(C13)

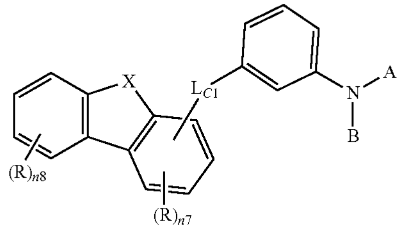

In the formulas (C12) and (C13),

A and B are as defined in the formula (C1).

$L_{c1}$ is a substituted or unsubstituted arylene group including 6 to 12 ring carbon atoms.

X is $CR_1R_2$, $NR_3$, an oxygen atom, or a sulfur atom.

When X is $CR_1R_2$, $R_1$ and $R_2$ form a substituted or unsubstituted, saturated or unsaturated ring by bonding with each other, or do not form a substituted or unsubstituted, saturated or unsaturated ring.

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R, $R_1$, and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, —$Si(R_{901})(R_{902})(R_{903})$,

—O—$(R_{904})$, a substituted or unsubstituted aryl group including 6 to 50 ring carbon atoms, or a substituted or unsubstituted monovalent heterocyclic group including 5 to 50 ring atoms.

$R_{501}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n5 and n7 are independently an integer of 0 to 3, and n6 and n8 are independently an integer of 0 to 4.

When a plurality of R's are present, the plurality of R's may be the same as or different from each other.

In one embodiment, the compound represented by the formula (C1) is a compound represented by the following formula (C14A) or (C15A).

(C14A)

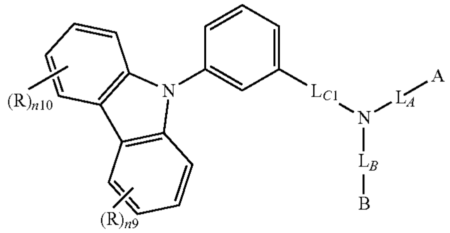

(C15A)

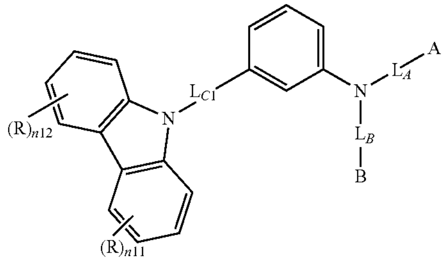

In the formulas (C14A) and (C15A), $L_A$ and $L_B$ are independently a single bond, a substituted or unsubstituted arylene group including 6 to 18 ring carbon atoms or substituted or unsubstituted divalent heterocyclic group including 5 to 13 ring atoms.

A and B are independently a substituted or unsubstituted aryl group including 6 to 30 ring carbon atoms, a substituted or unsubstituted monovalent heterocyclic group including 5 to 30 ring atoms.

, or

—$Si(R_{908})(R_{909})(R_{910})$.

$R_{908}$ to $R_{910}$ are independently a substituted or unsubstituted aryl group including 6 to 30 ring carbon atoms.

When one or more of $R_{908}$ to $R_{910}$ are present in two or more, each of the two or more $R_{908}$ to $R_{910}$ are the same or different.

$L_{c1}$ is a substituted or unsubstituted arylene group including 6 to 12 ring carbon atoms.

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —$Si(R_{901})(R_{902})(R_{903})$,

—O—$(R_{904})$, a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n9 to n12 are independently an integer of 0 to 4.

When a plurality of R's are present, the plurality of R's may be the same as or different from each other.

In one embodiment, the compound represented by the formula (C1) is a compound represented by the following formula (C14) or (C15).

(C14)

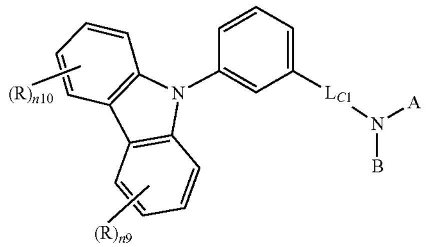

(C15)

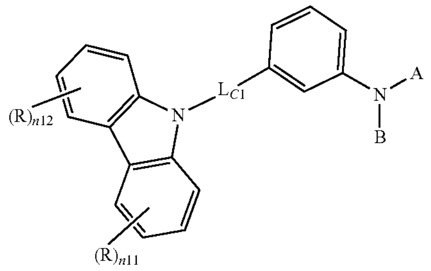

In the formulas (C14) and (C15),

A and B are as defined in the formula (C1).

$L_{c1}$ is a substituted or unsubstituted arylene group including 6 to 12 ring carbon atoms.

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —$Si(R_{901})(R_{902})(R_{903})$,

—O—$(R_{904})$, a substituted or unsubstituted aryl group including 6 to 50 ring carbon atoms, or a substituted or unsubstituted monovalent heterocyclic group including 5 to 50 ring atoms.

$R_{501}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n9 to n12 are independently an integer of 0 to 4.

When a plurality of R's are present, the plurality of R's may be the same as or different from each other.

In one embodiment, the compound represented by the formula (C1) is a compound represented by the following formula (C16A) or (C17A).

(C16A)

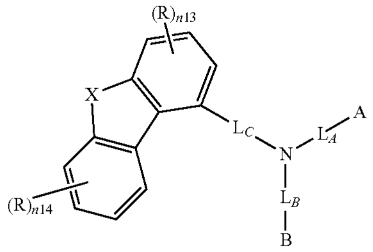

(C17A)

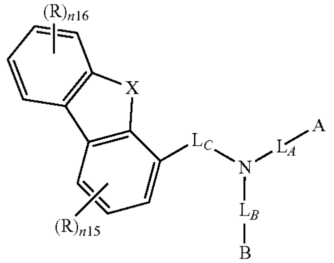

In the formulas (C16A) and (C17A), $L_A$ and $L_B$ are independently a single bond, a substituted or unsubstituted arylene group including 6 to 18 ring carbon atoms or substituted or unsubstituted divalent heterocyclic group including 5 to 13 ring atoms.

$L_C$ is a single bond, a substituted or unsubstituted arylene group including 6 to 18 ring carbon atoms, or a substituted or unsubstituted divalent heterocyclic group including 5 to 13 ring atoms.

A and B are independently a substituted or unsubstituted aryl group including 6 to 30 ring carbon atoms, a substituted or unsubstituted monovalent heterocyclic group including 5 to 30 ring atoms, or —$Si(R_{908})(R_{909})(R_{910})$.

$R_{908}$ to $R_{910}$ are independently a substituted or unsubstituted aryl group including 6 to 30 ring carbon atoms.

When one or more of $R_{908}$ to $R_{910}$ are present in two or more, each of the two or more $R_{908}$ to $R_{910}$ are the same or different.

X is $CR_1R_2$, $NR_3$, an oxygen atom, or a sulfur atom.

When X is $CR_1R_2$, $R_1$ and $R_2$ form a substituted or unsubstituted, saturated or unsaturated ring by bonding with each other, or do not form a substituted or unsubstituted, saturated or unsaturated ring.

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R, $R_1$, and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, —$Si(R_{901})(R_{902})(R_{903})$,

—O—$(R_{904})$, a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different;

n13 and n15 are independently an integer of 0 to 3, and n14 and n16 are independently an integer of 0 to 4.

When a plurality of R's are present, the plurality of R's may be the same as or different from each other.

In one embodiment, the compound represented by the formula (C1) is a compound represented by the following formula (C16) or (C17).

(C16)

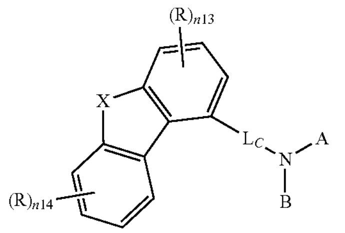

(C17)

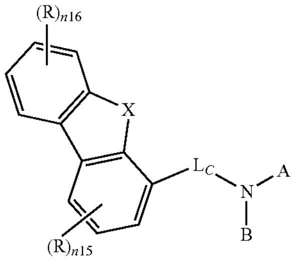

In the formulas (C16) and (C17),

A, B, and $L_C$ are as defined in the formula (C1).

X is $CR_1R_2$, $NR_3$, an oxygen atom, or a sulfur atom.

When X is $CR_1R_2$, $R_1$ and $R_2$ form a substituted or unsubstituted, saturated or unsaturated ring by bonding with each other, or do not form a substituted or unsubstituted, saturated or unsaturated ring.

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R, $R_1$, and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, —$Si(R_{901})(R_{902})(R_{903})$,

—O—$(R_{904})$, a substituted or unsubstituted aryl group including 6 to 50 ring carbon atoms, or a substituted or unsubstituted monovalent heterocyclic group including 5 to 50 ring atoms.

$R_{501}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

n13 and n15 are independently an integer of 0 to 3, and n14 and n16 are independently an integer of 0 to 4.

When a plurality of R's are present, the plurality of R's may be the same as or different from each other.

In the compounds represented by the formulas (C12) to (C17), it is preferable that $L_{C1}$ be a single bond.

In the compounds represented by the formulas (C16) to (C17), it is preferable that $L_{C1}$ be a phenylene group.

In one embodiment, the compound represented by the formula (C1) is a compound represented by the following formula (C18A).

(C18A)

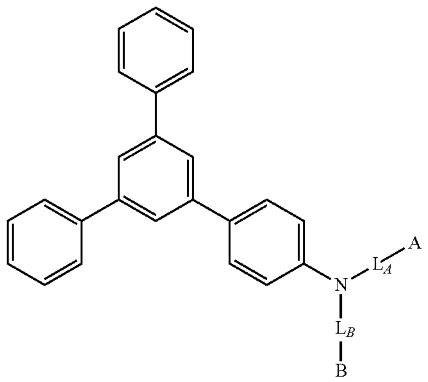

In the formula (C18A), $L_A$ and $L_B$ are independently a single bond, a substituted or unsubstituted arylene group including 6 to 18 ring carbon atoms or substituted or unsubstituted divalent heterocyclic group including 5 to 13 ring atoms.

A and B are independently a substituted or unsubstituted aryl group including 6 to 30 ring carbon atoms, a substituted or unsubstituted monovalent heterocyclic group including 5 to 30 ring atoms, or —Si($R_{908}$)($R_{909}$)($R_{910}$).

$R_{908}$ to $R_{910}$ are independently a substituted or unsubstituted aryl group including 6 to 30 ring carbon atoms.

When one or more of $R_{908}$ to $R_{910}$ are present in two or more, each of the two or more $R_{908}$ to $R_{910}$ are the same or different.

In one embodiment, the compound represented by the formula (C1) is a compound represented by the following formula (C18).

(C18)

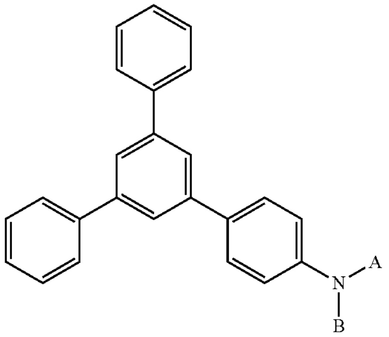

In the formula (C18),

A and B are as defined in the formula (C1).

In one embodiment, the compound represented by the formula (C1) is a compound represented by the following formula (C19A).

(C19A)

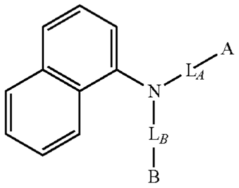

In the formula (C19A), $L_A$ and $L_B$ are independently a single bond, a substituted or unsubstituted arylene group including 6 to 18 ring carbon atoms or substituted or unsubstituted divalent heterocyclic group including 5 to 13 ring atoms.

A and B are independently a substituted or unsubstituted aryl group including 6 to 30 ring carbon atoms, a substituted or unsubstituted monovalent heterocyclic group including 5 to 30 ring atoms, or —Si($R_{908}$)($R_{909}$)($R_{910}$).

$R_{908}$ to $R_{910}$ are independently a substituted or unsubstituted aryl group including 6 to 30 ring carbon atoms.

When one or more of $R_{908}$ to $R_{910}$ are present in two or more, each of the two or more $R_{908}$ to $R_{910}$ are the same or different.

In one embodiment, the compound represented by the formula (C1) is a compound represented by the following formula (C19).

(C19)

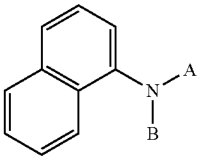

In the formula (C19),

A and B are as defined in the formula (C1).

In the compounds represented by the formulas (C1) and (C11) to (C19) and the compounds represented by the formulas (C12A) to (C19A), A is preferably a substituted or unsubstituted aryl group including 6 to 12 ring carbon atoms.

In the compounds represented by the formulas (C1) and (C11) to (C19) and the compounds represented by the formulas (C12A) to (C19A), A is preferably a substituted or unsubstituted phenyl group, a substituted or unsubstituted biphenyl group, or a substituted or unsubstituted naphthyl group.

In the compounds represented by the formulas (C1) and (C11) to (C19) and the compounds represented by the formulas (C12A) to (C19A), A is preferably a phenyl group, a biphenyl group, or a naphthyl group.

In the compounds represented by the formulas (C1) and (C11) to (C19) and the compounds represented by the formulas (C12A) to (C19A), B is preferably a substituted or unsubstituted aryl group including 6 to 12 ring carbon atoms.

In the compounds represented by the formulas (C1) and (C11) to (C19) and the compounds represented by the formulas (C12A) to (C19A), B is preferably a substituted or unsubstituted phenyl group, a substituted or unsubstituted biphenyl group, or a substituted or unsubstituted naphthyl group.

In the compounds represented by the formulas (C1) and (C11) to (C19) and the compounds represented by the formulas (C12A) to (C19A), B is preferably a phenyl group, a biphenyl group, or a naphthyl group.

In the compound represented by the formulas (C1) and (C12A) to (C19A), it is preferable that $L_A$, $L_B$, and $L_C$ be independently a single bond, an unsubstituted arylene group including 6 to 18 ring carbon atoms, or an unsubstituted divalent heterocyclic group including 5 to 13 ring atoms.

In the compounds represented by the formulas (C1), (C11) to (C19), and (C12A) to (C19A), it is preferable that all of the "substituted or unsubstituted" groups and rings be "unsubstituted" groups and rings.

Specific examples of the compound represented by the formula (C1) include the following compounds. In the following specific examples, "Ph" means a phenyl group.

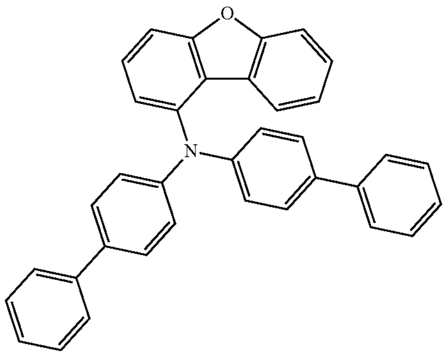
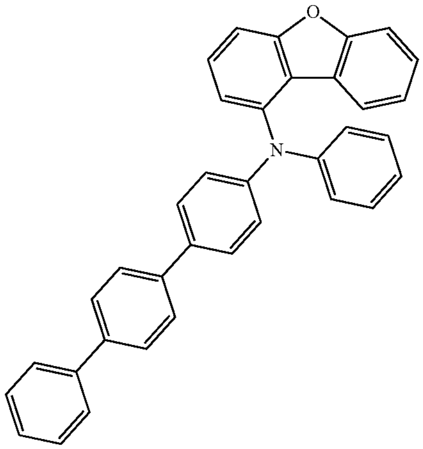
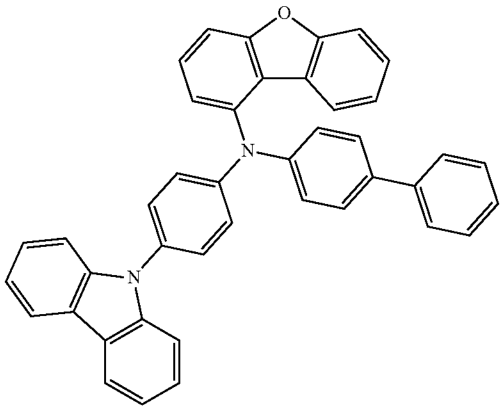
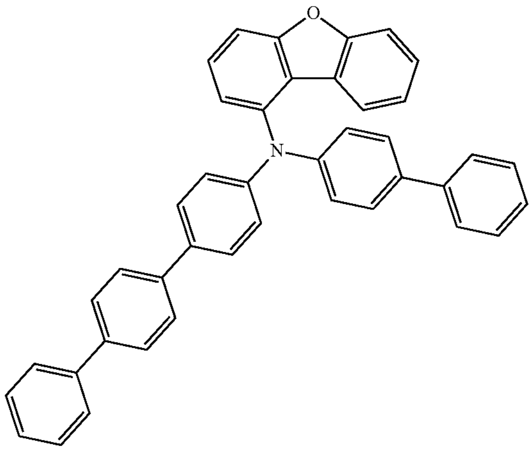
-continued
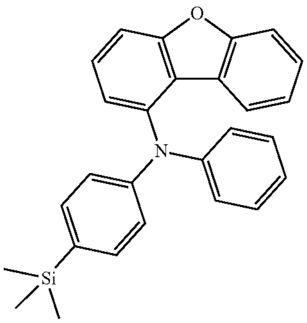
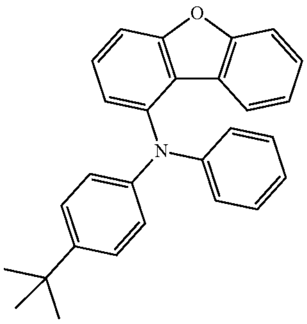
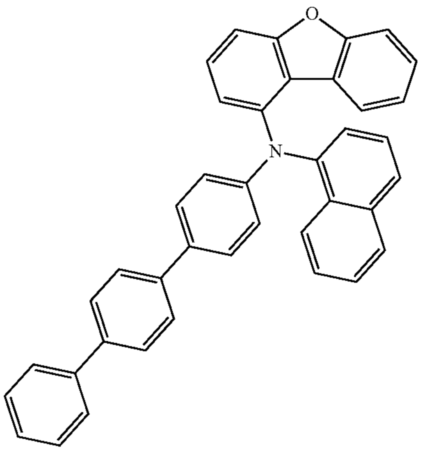
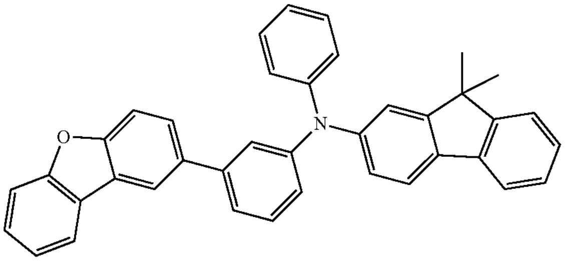

-continued
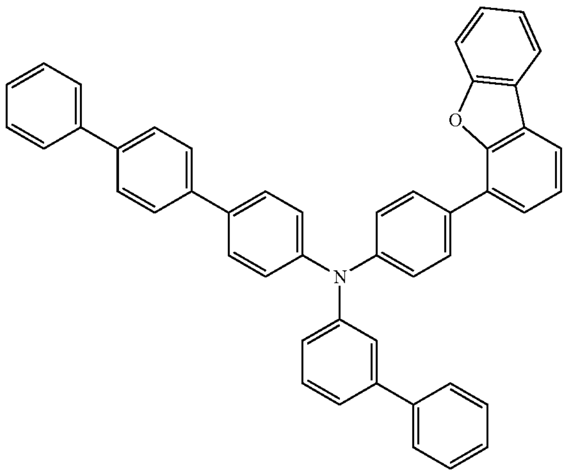
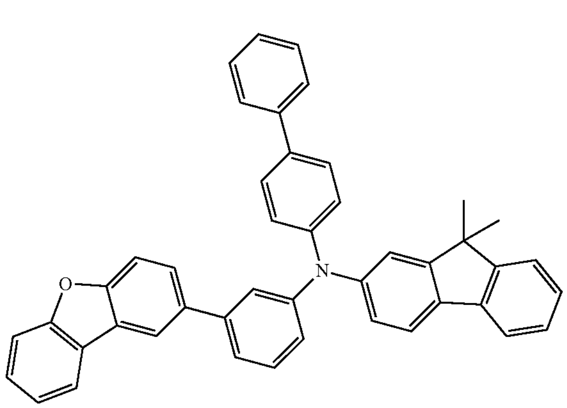
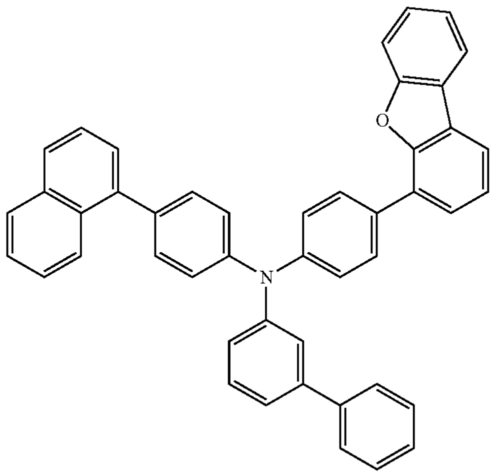
-continued
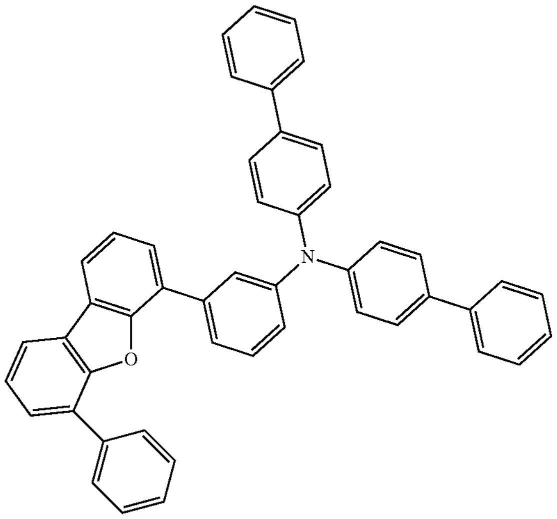
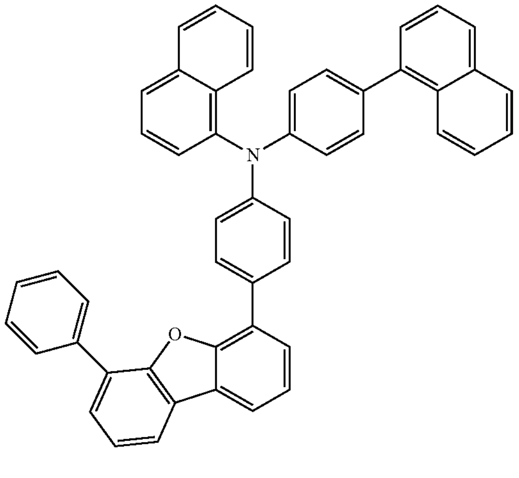
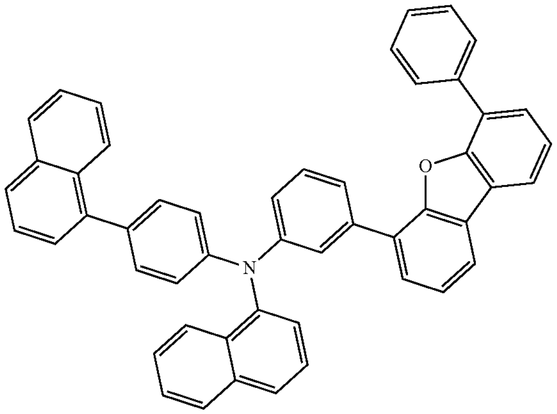

-continued
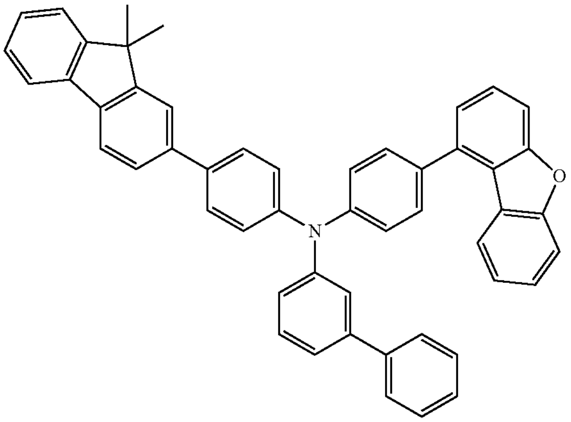
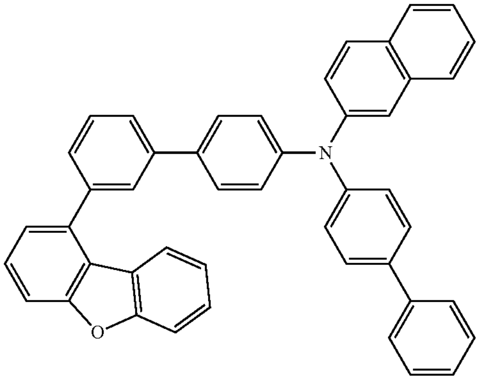
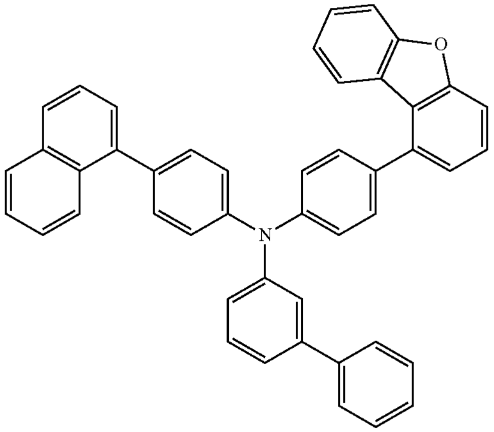
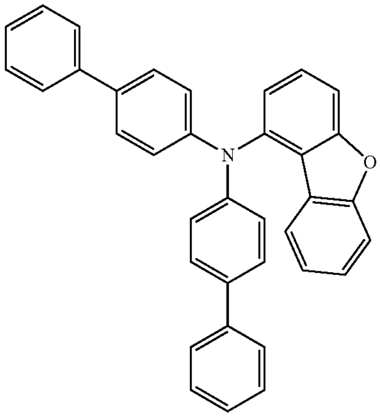
-continued
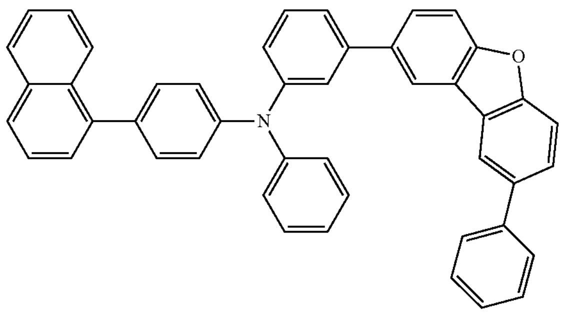
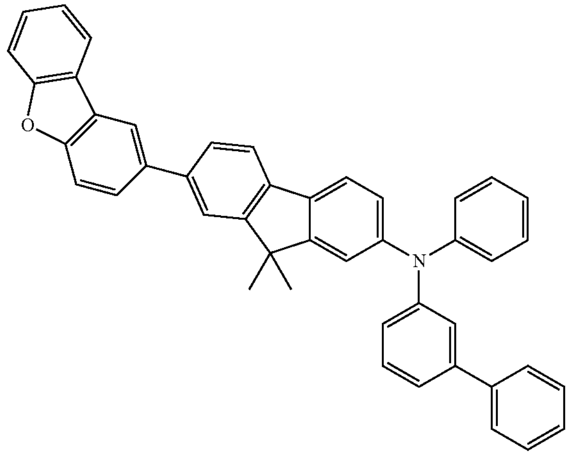
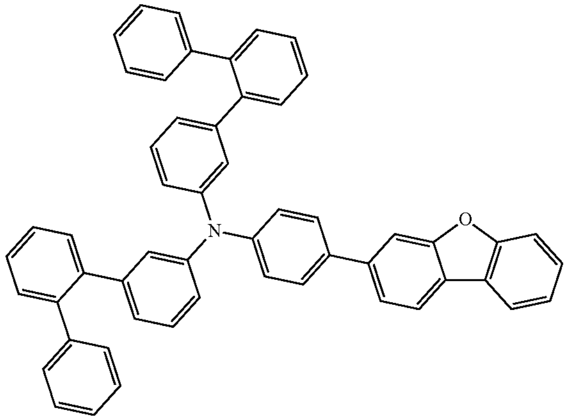
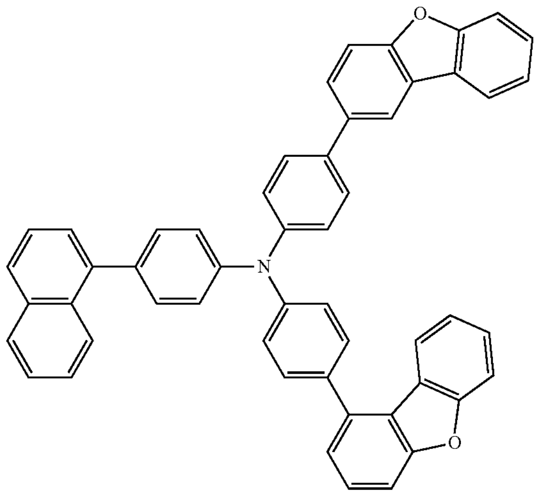

-continued
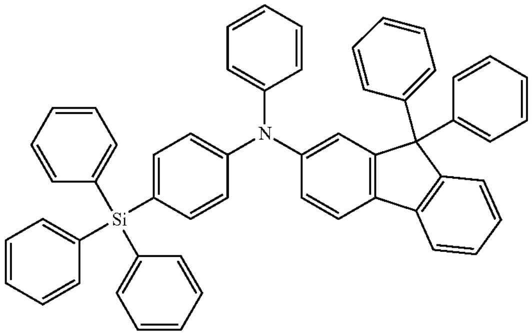
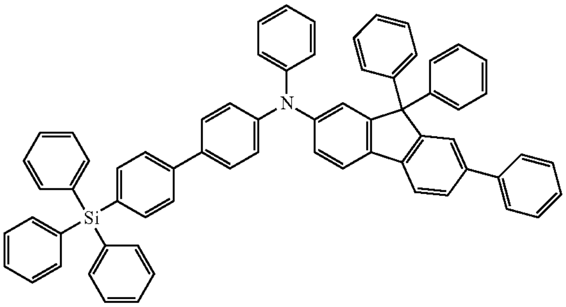
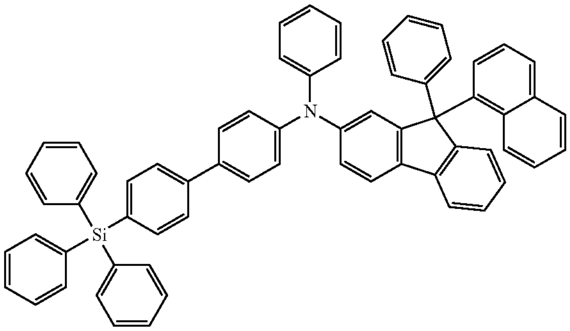
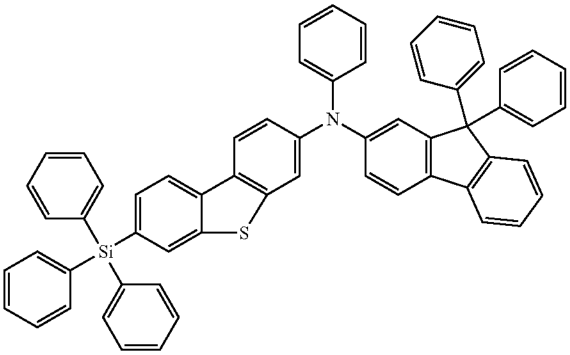
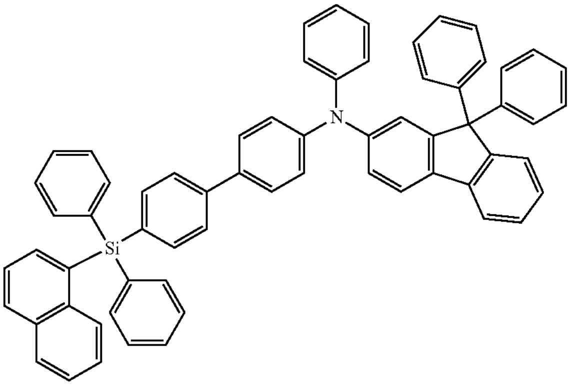
-continued
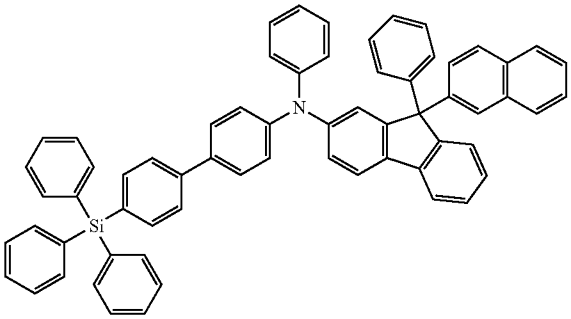
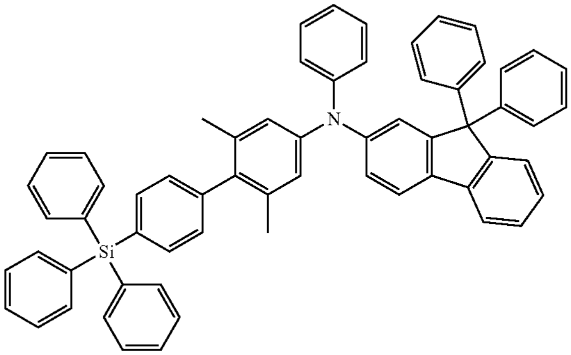
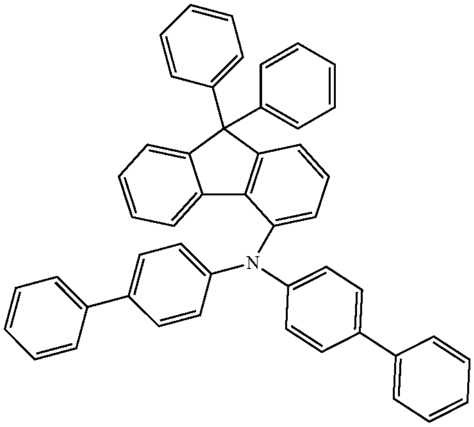
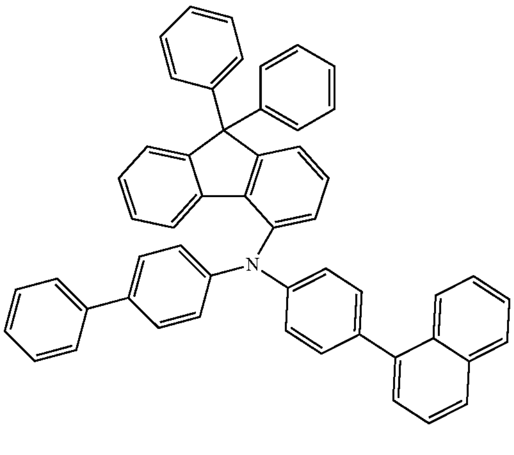

-continued
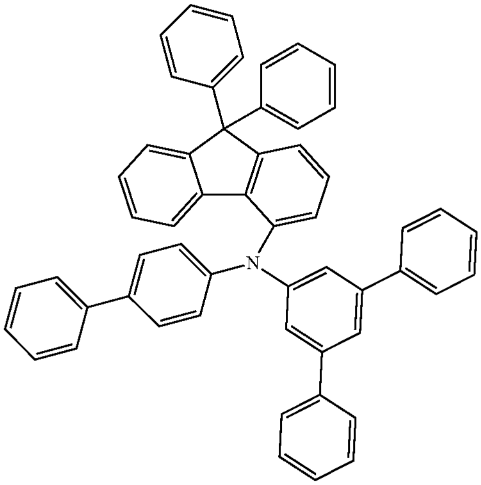
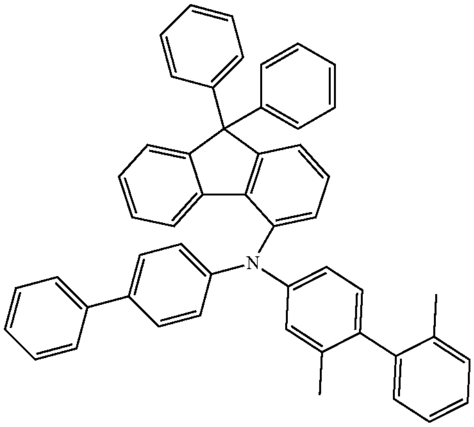
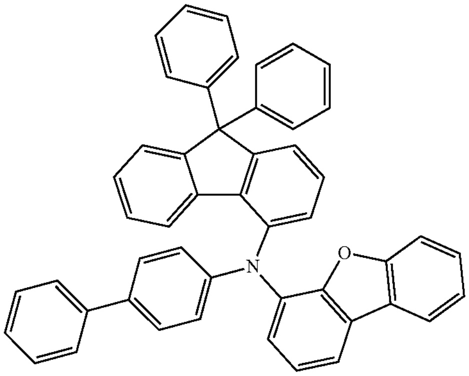
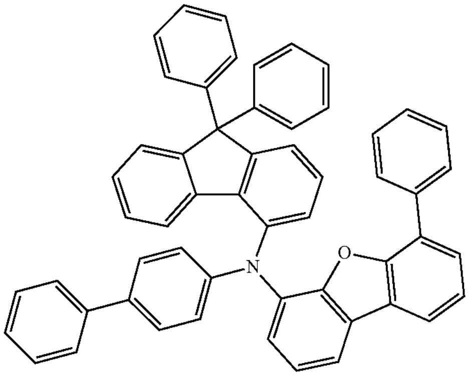
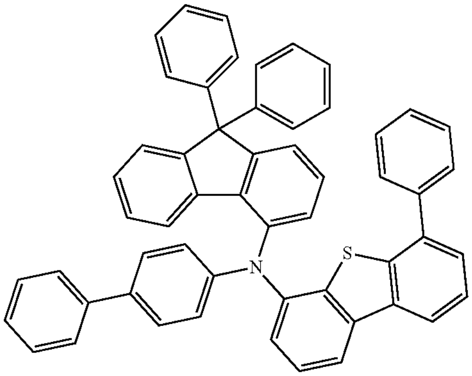
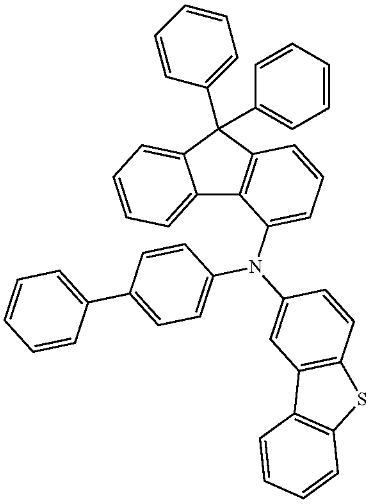
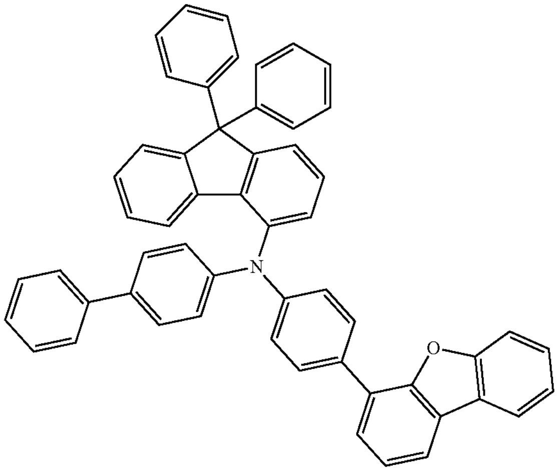

-continued
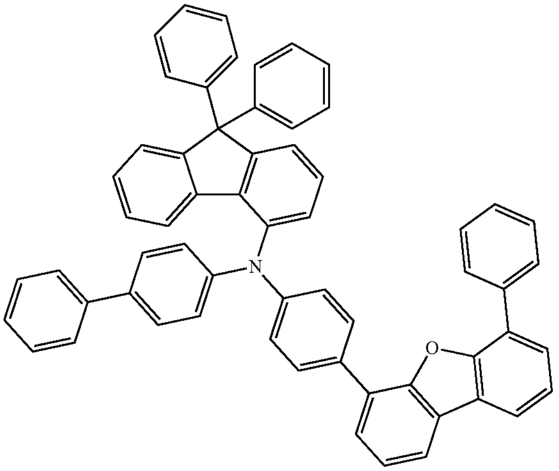
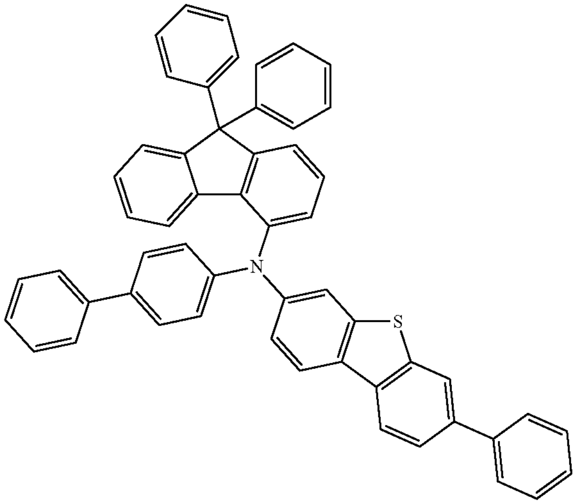
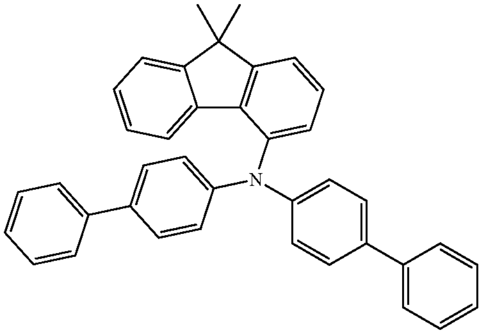
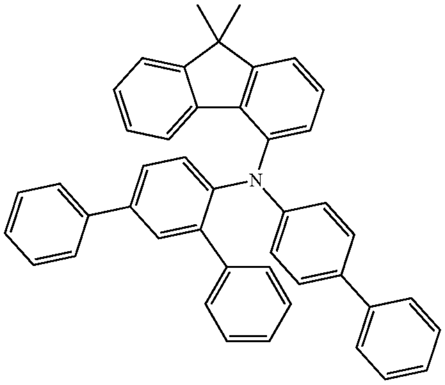
-continued
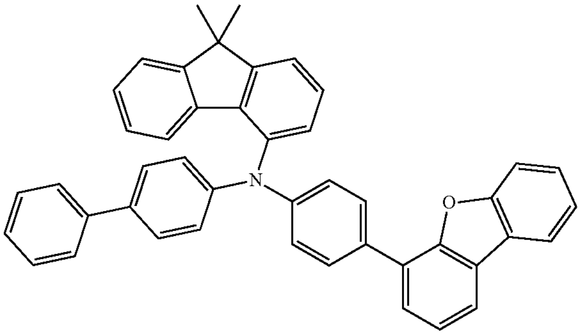
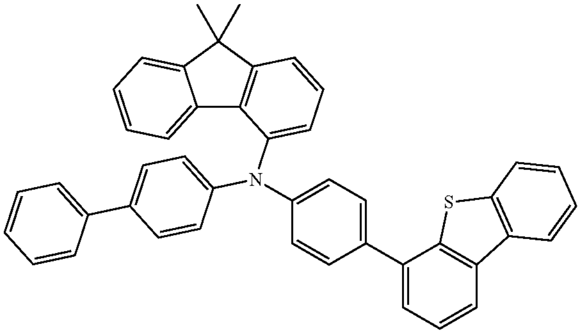
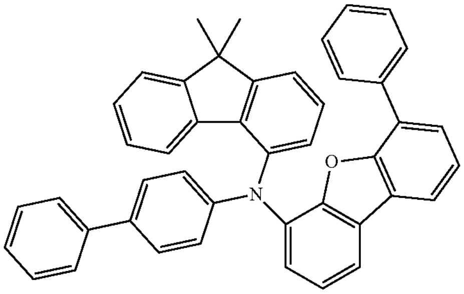
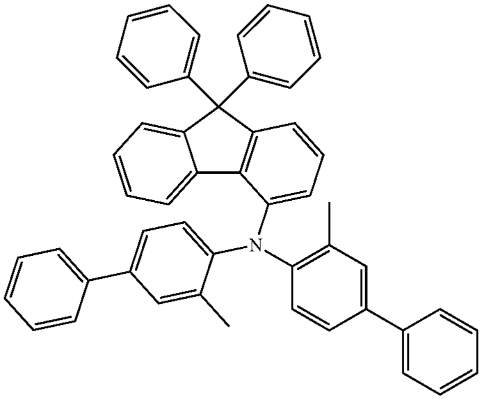
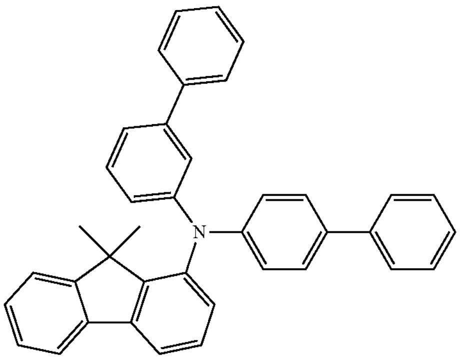

-continued
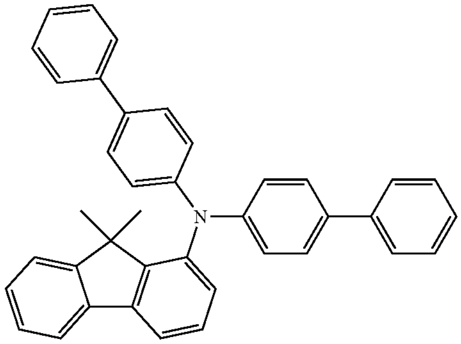
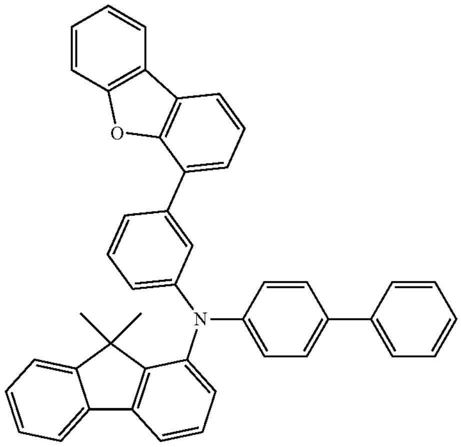
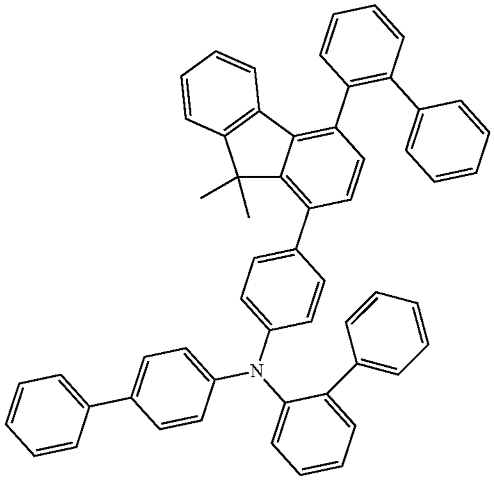
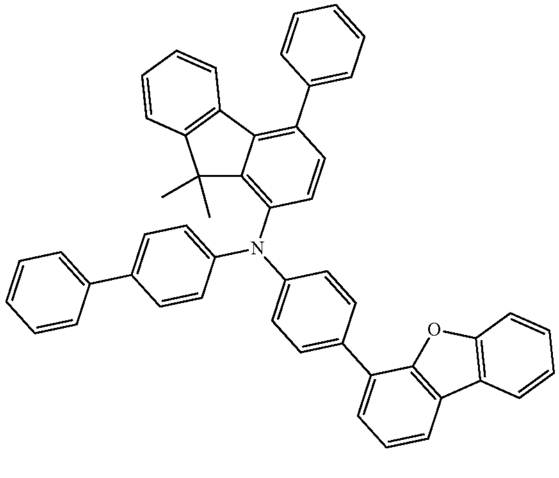
-continued
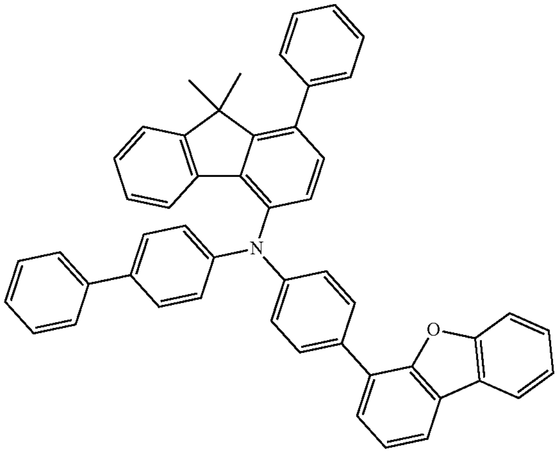
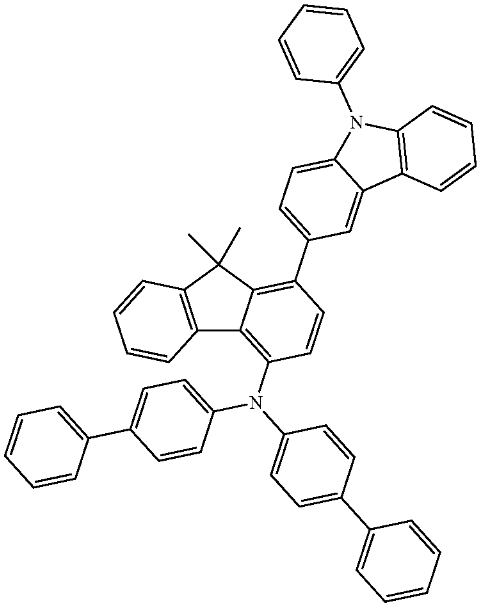
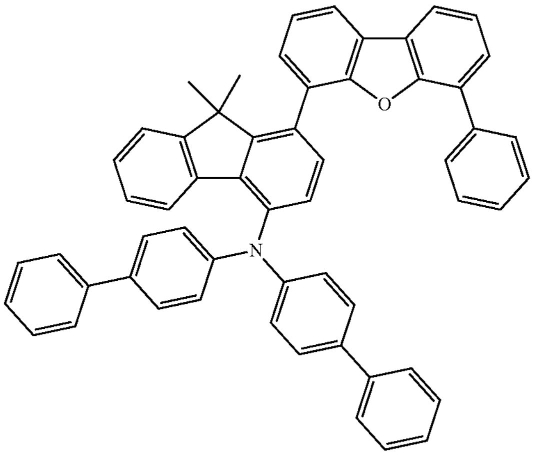

-continued
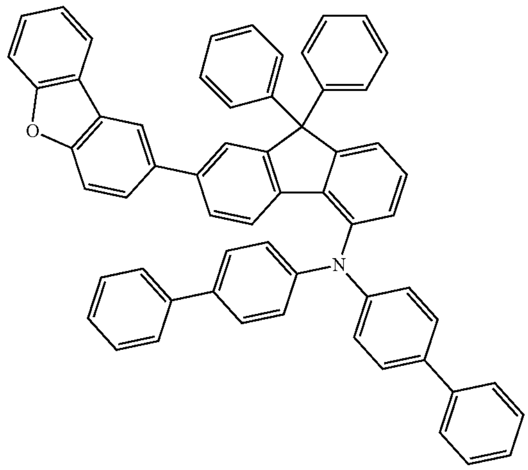
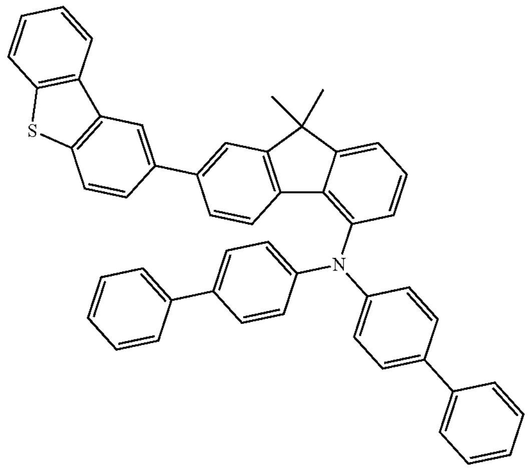
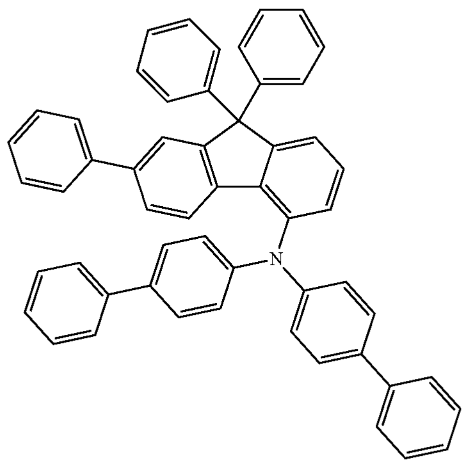
-continued
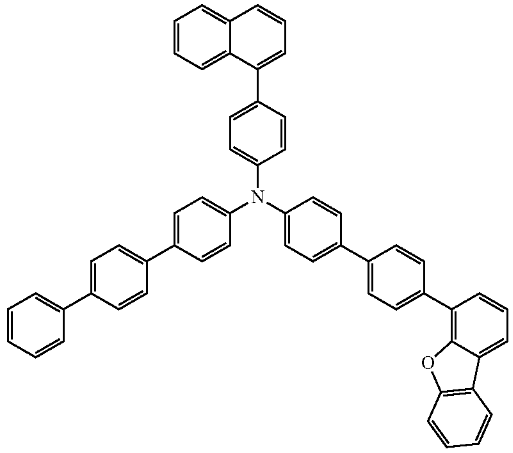
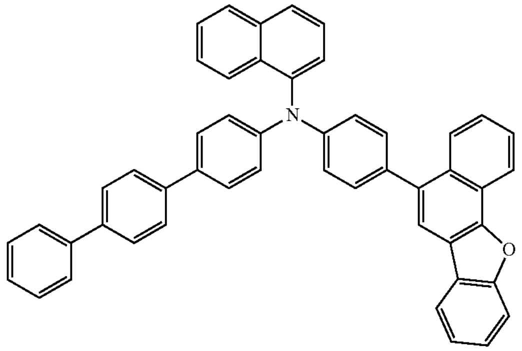
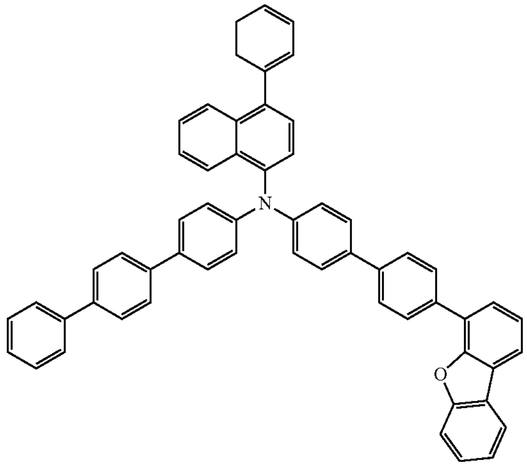

-continued
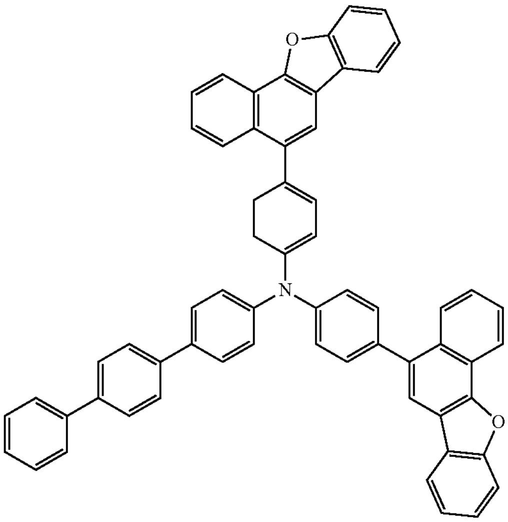
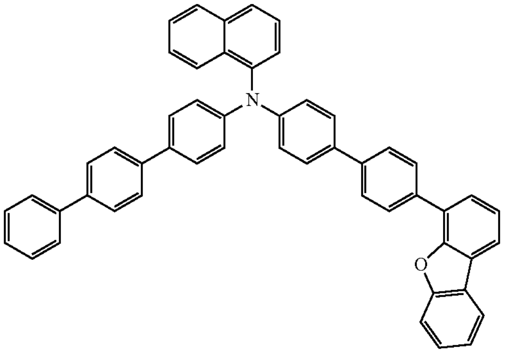
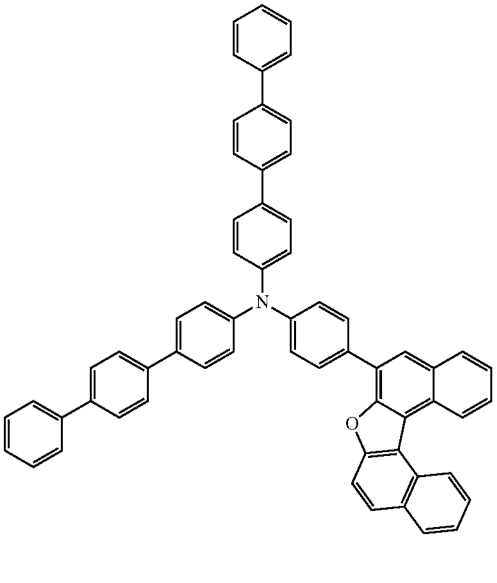
-continued
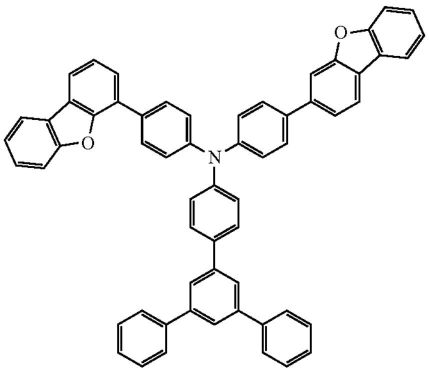
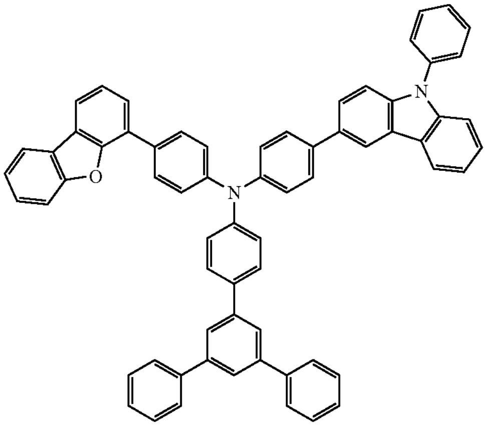
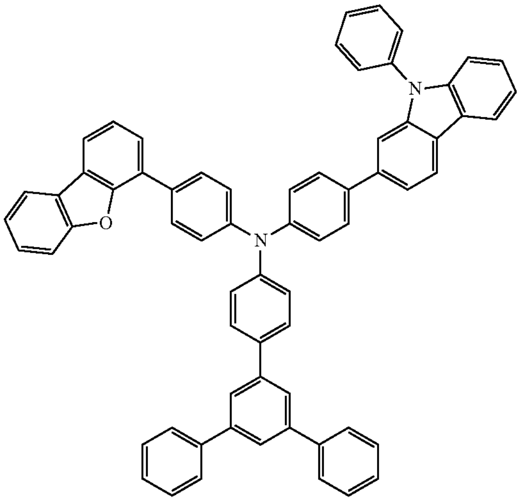
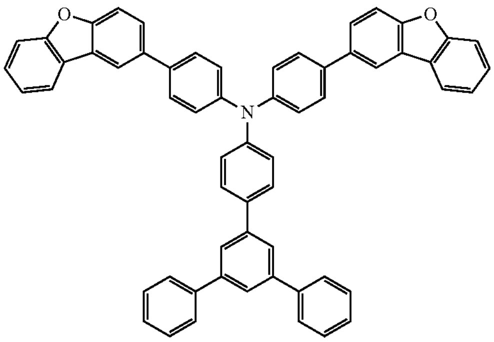

-continued
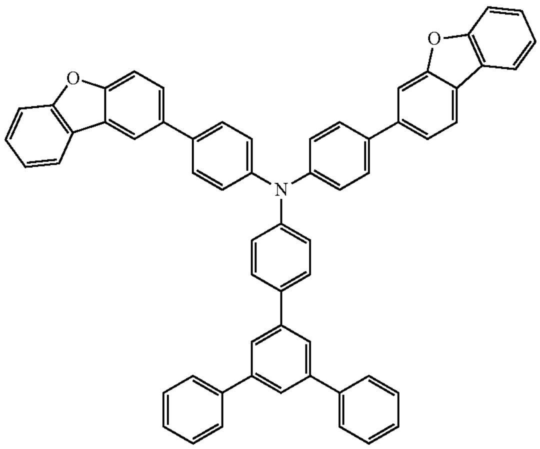
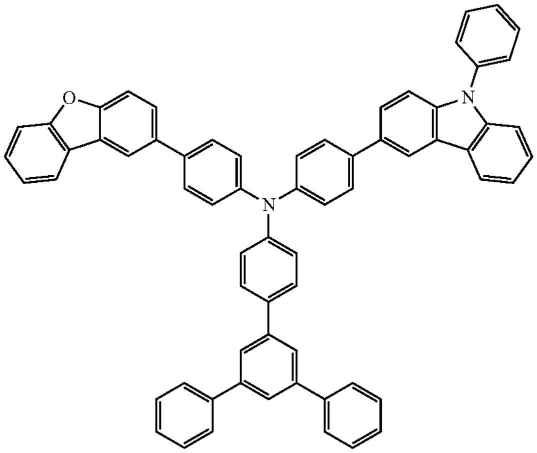
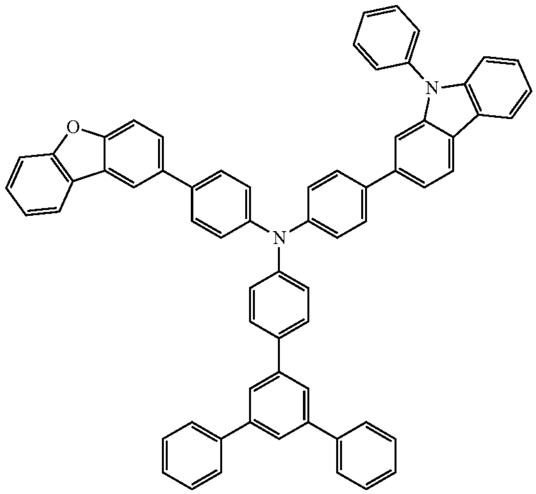
-continued
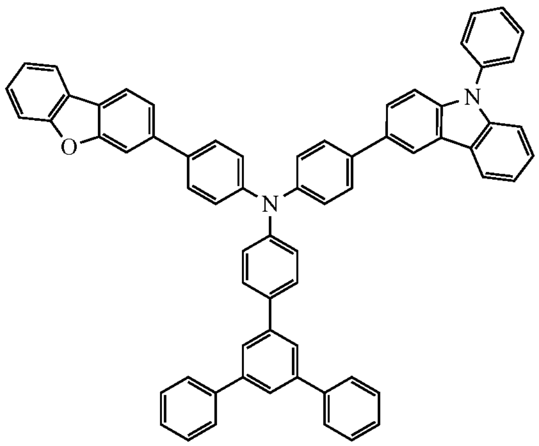
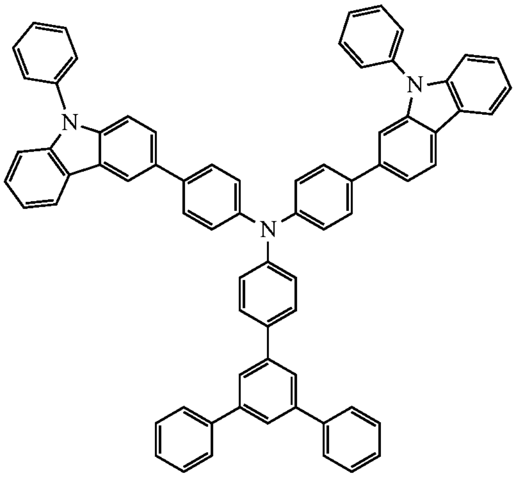
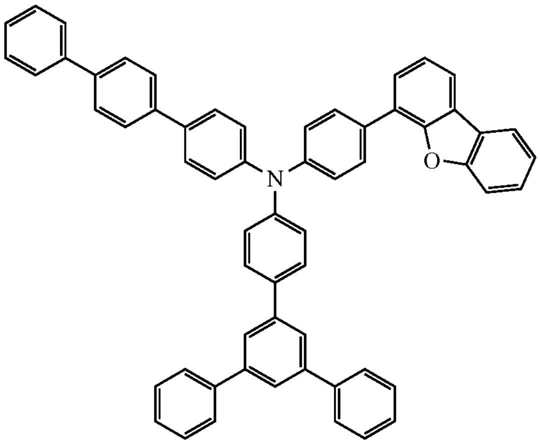

-continued
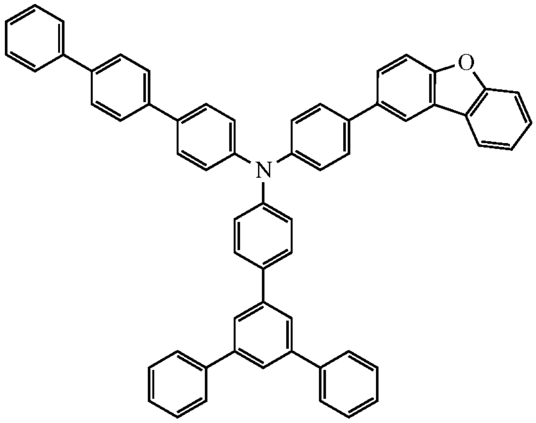
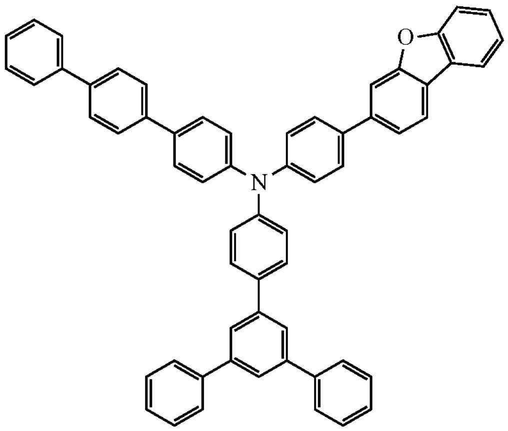
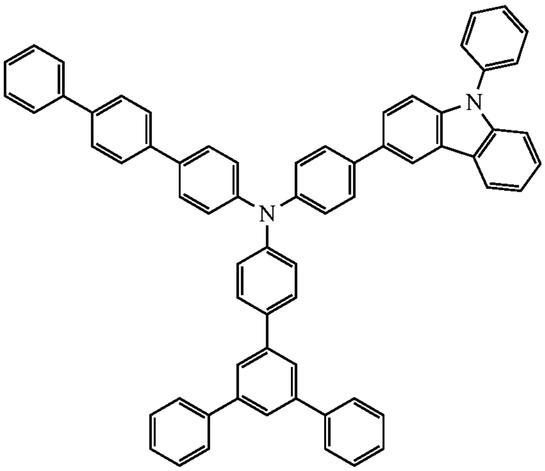
-continued
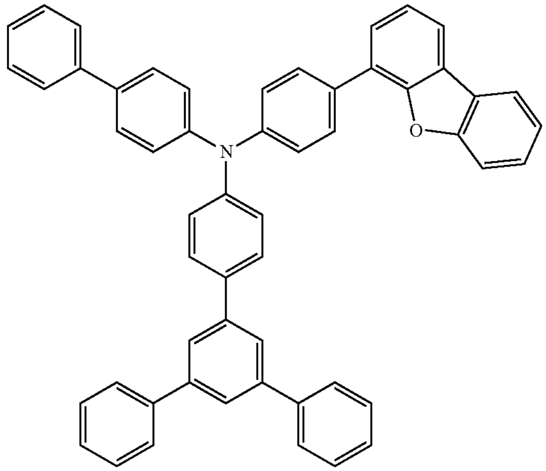
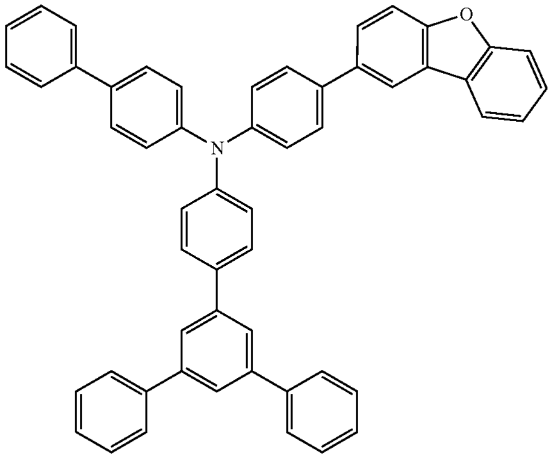
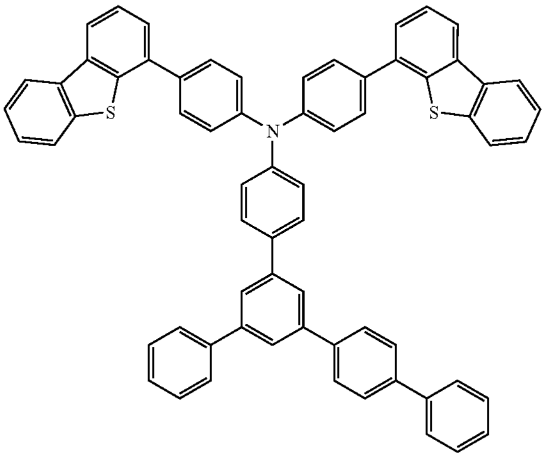

-continued
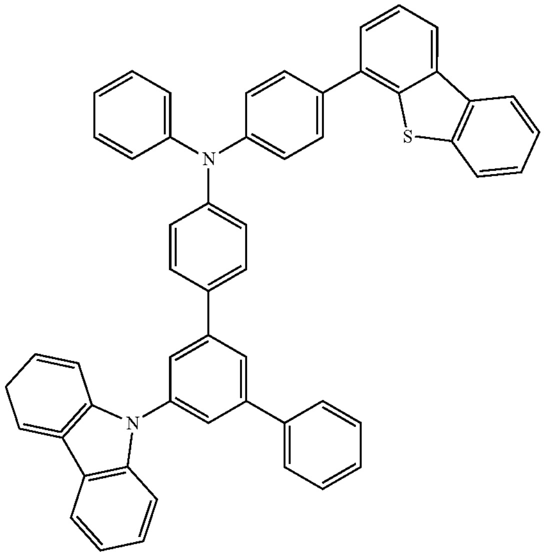
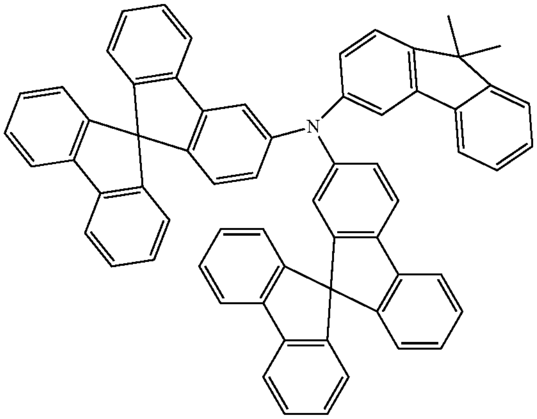
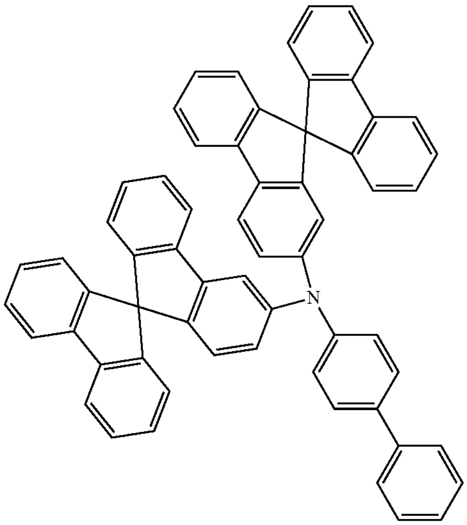
-continued
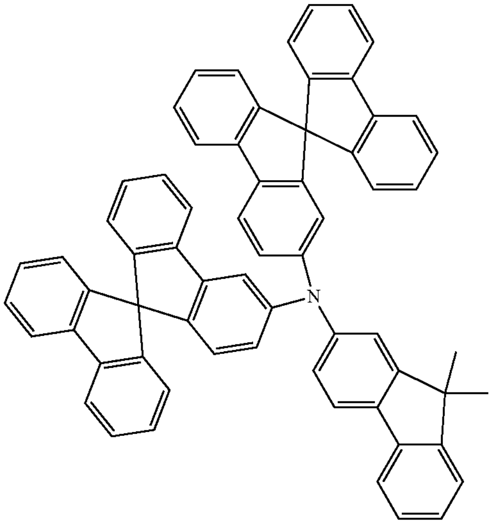
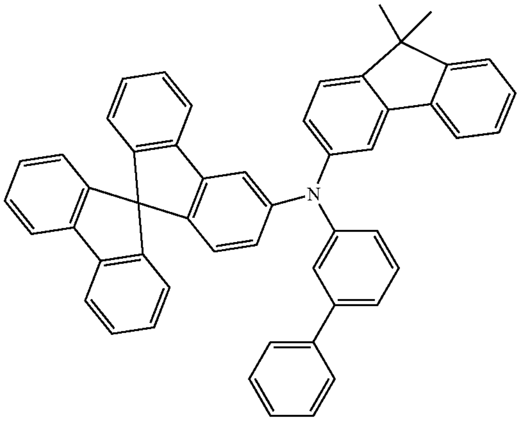
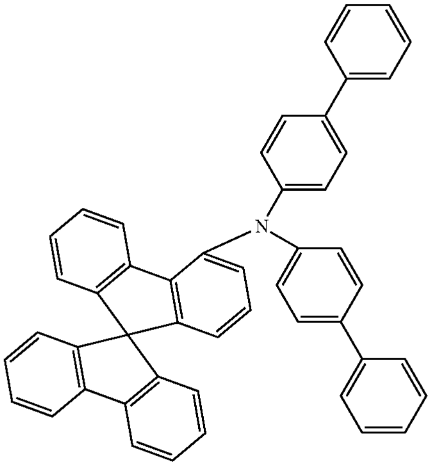

-continued
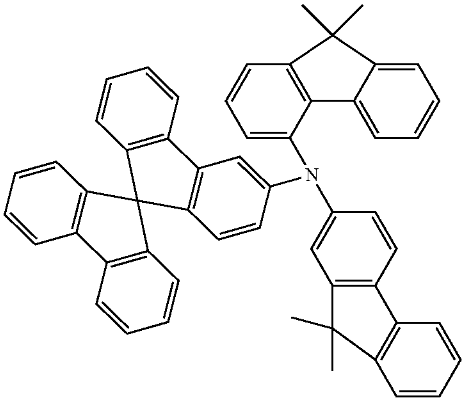
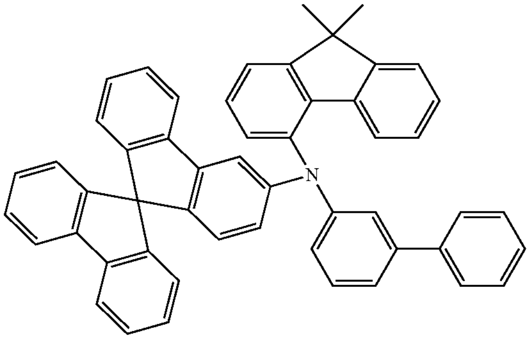
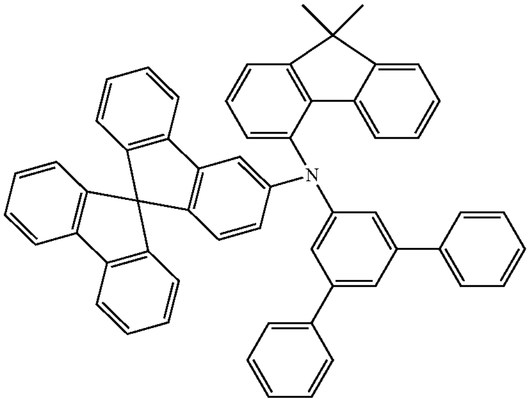
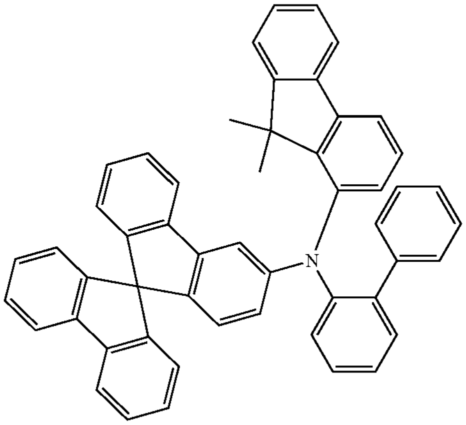
-continued
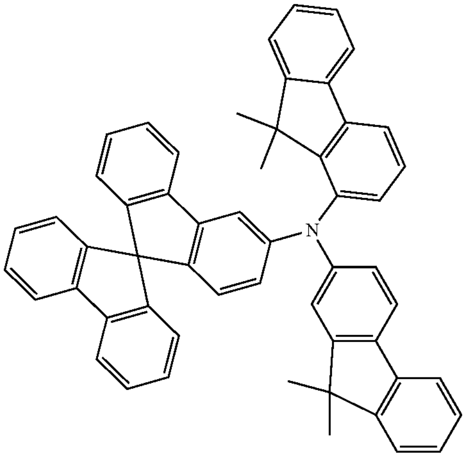
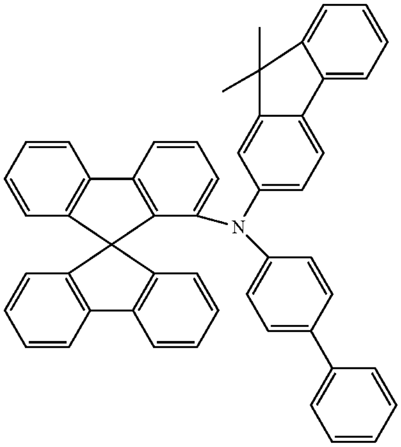
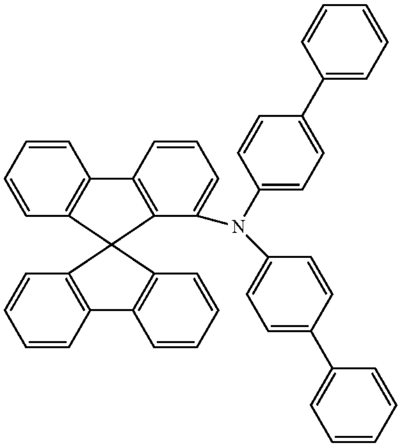

-continued
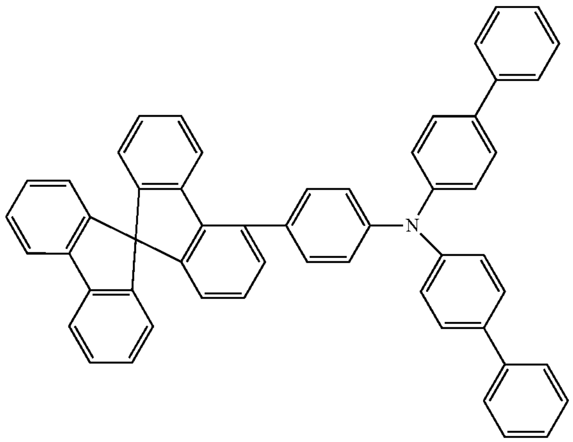
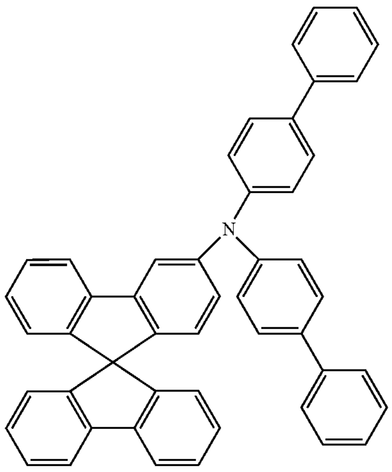
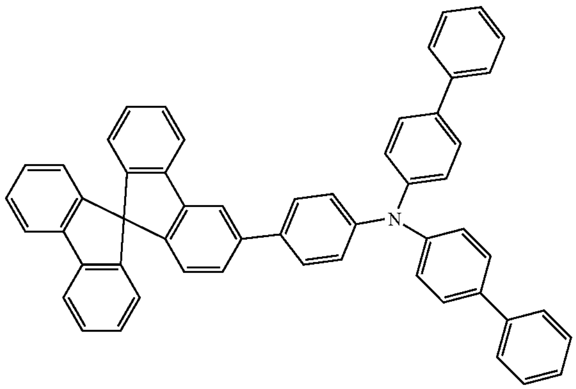
-continued
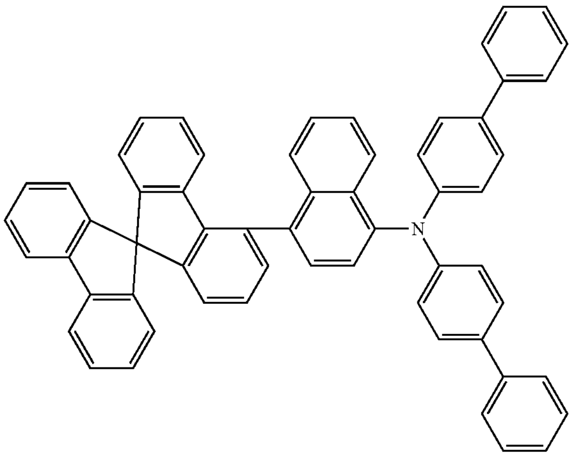
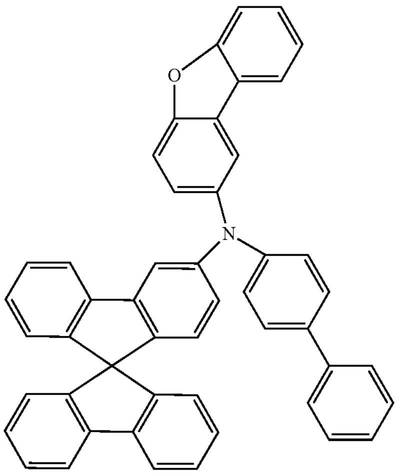
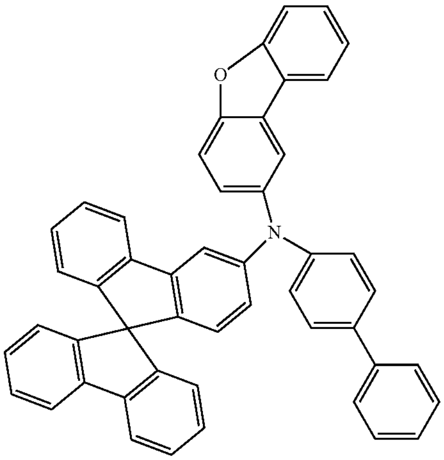

-continued
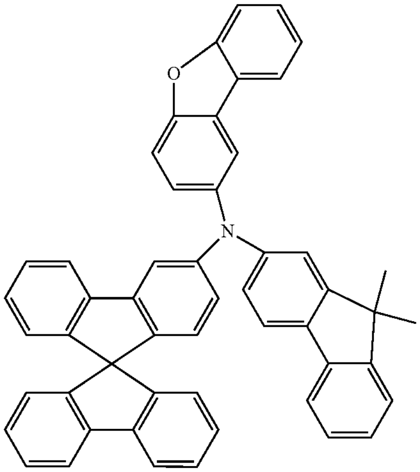
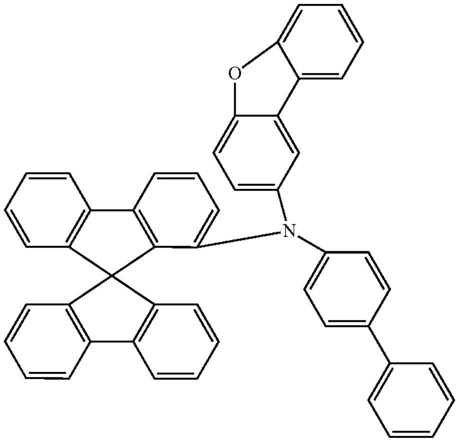
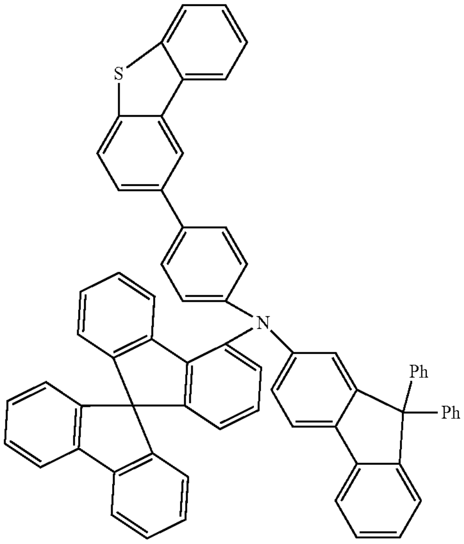
-continued
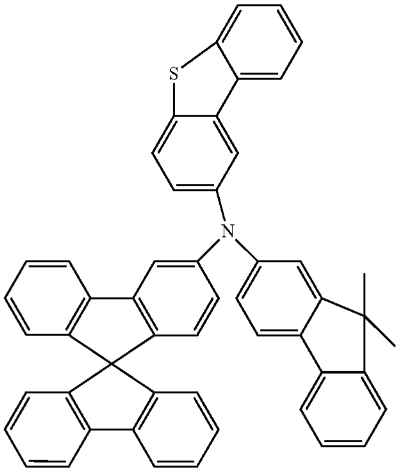
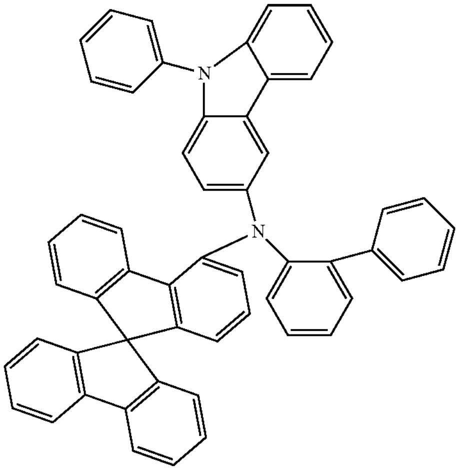
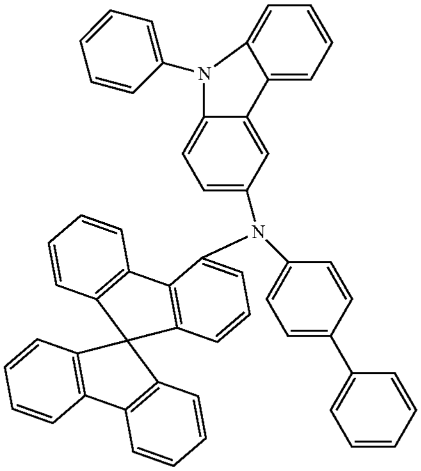

-continued
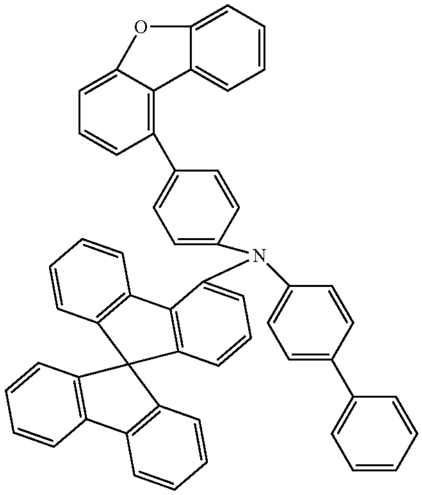
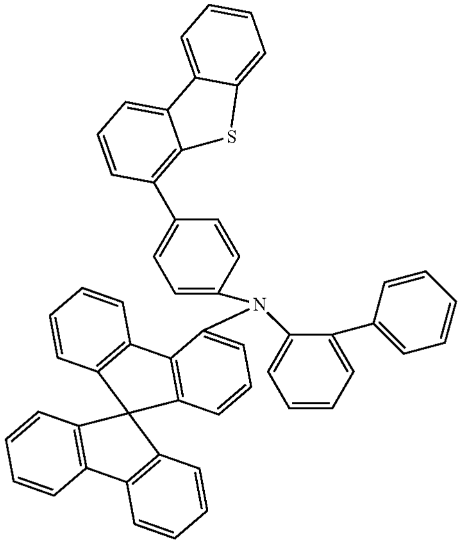
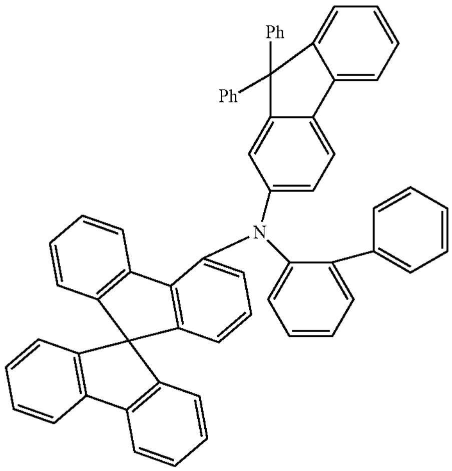
-continued
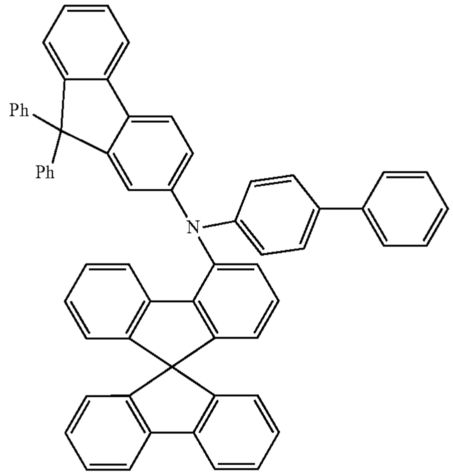
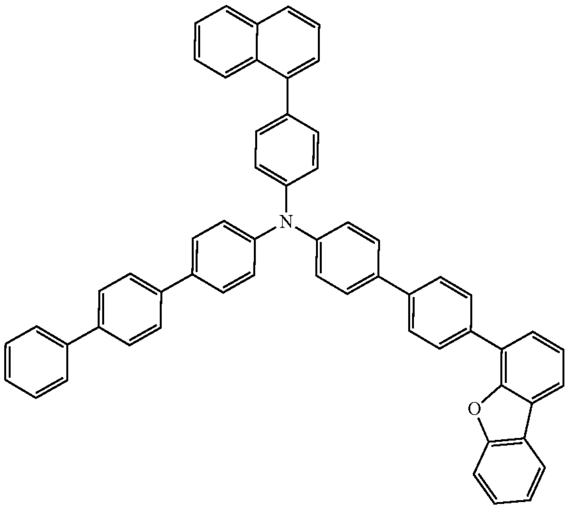
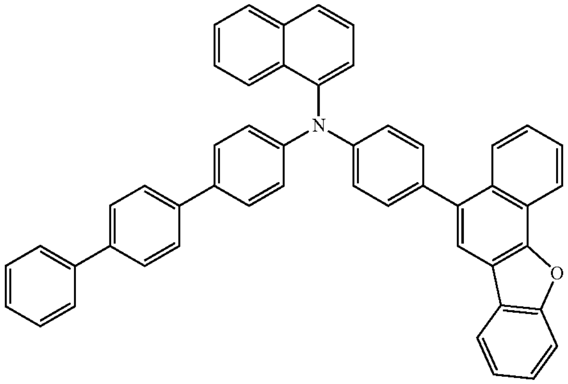

-continued
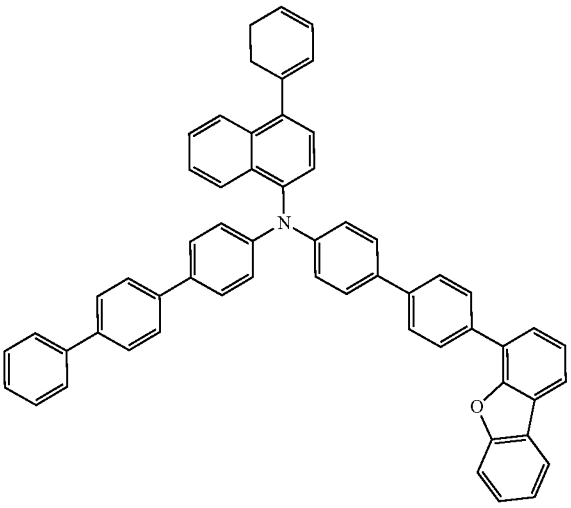
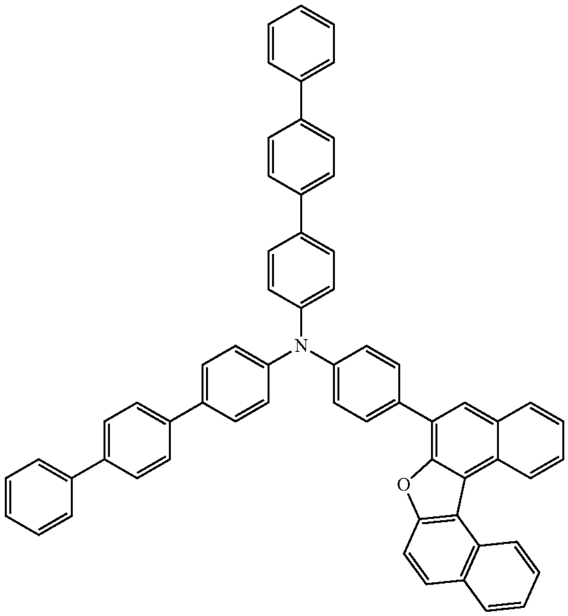
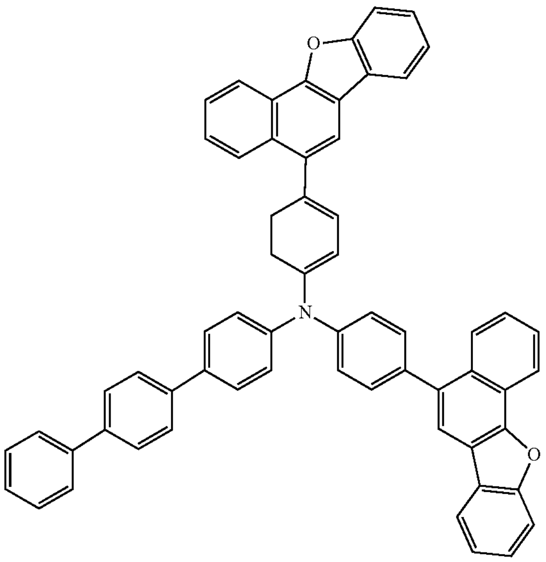
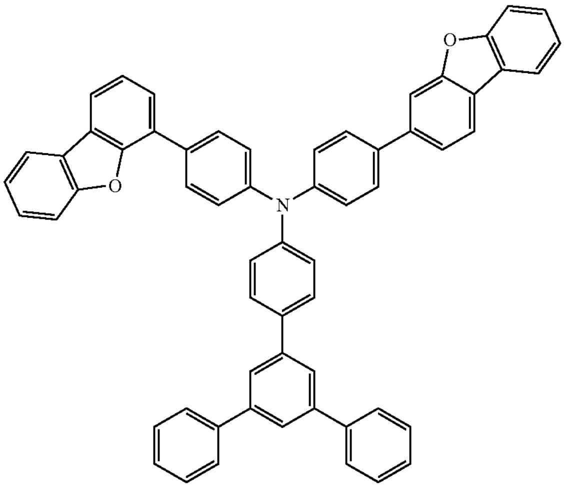
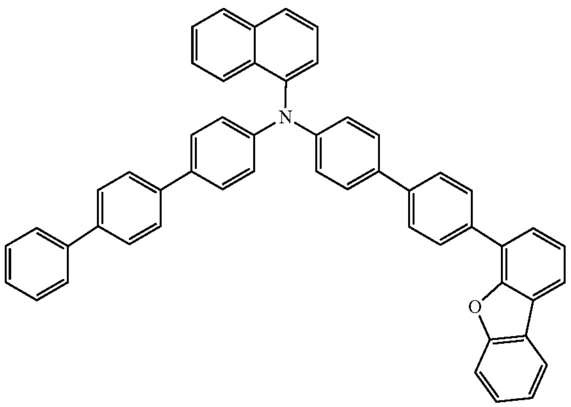
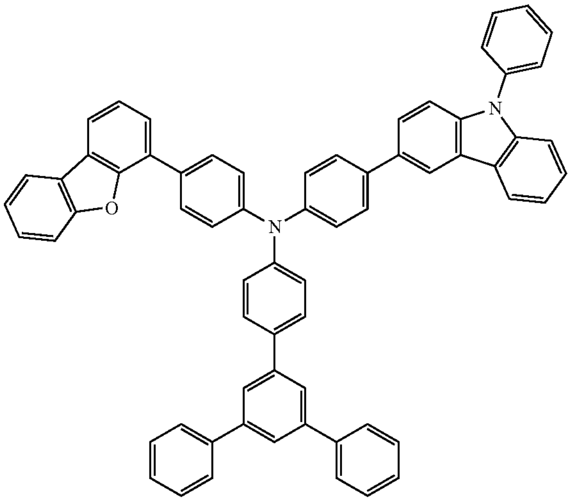
-continued -continued
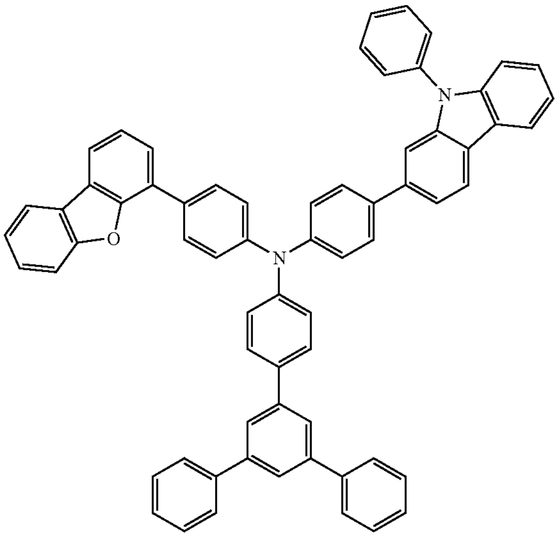
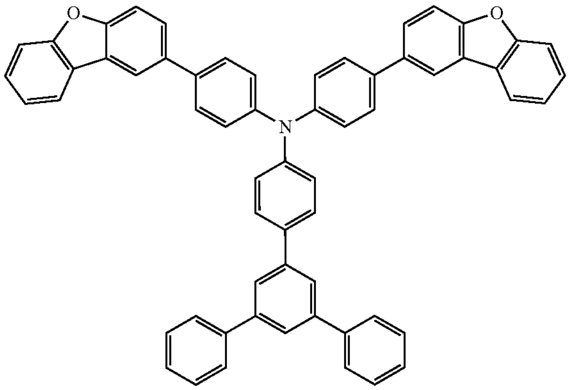
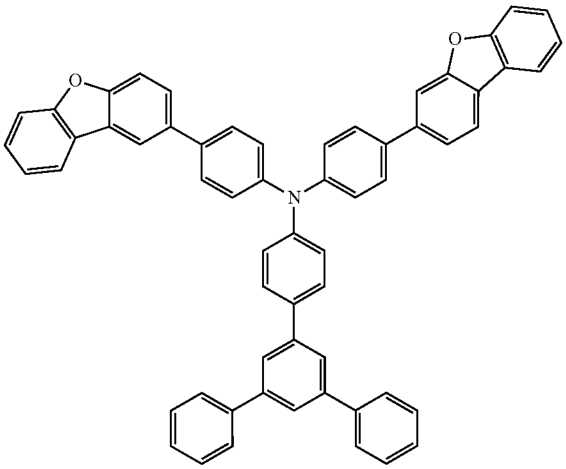
-continued
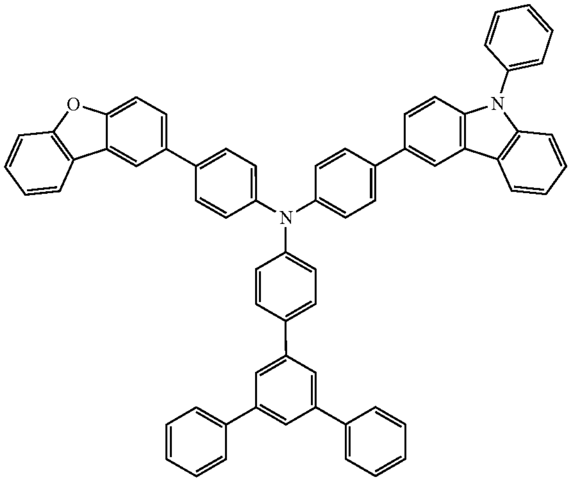
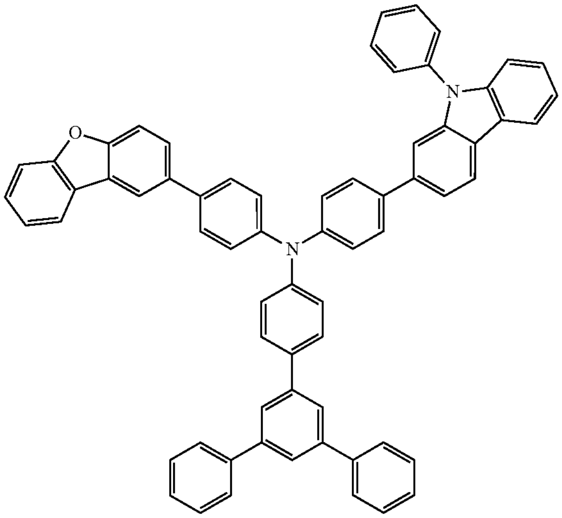
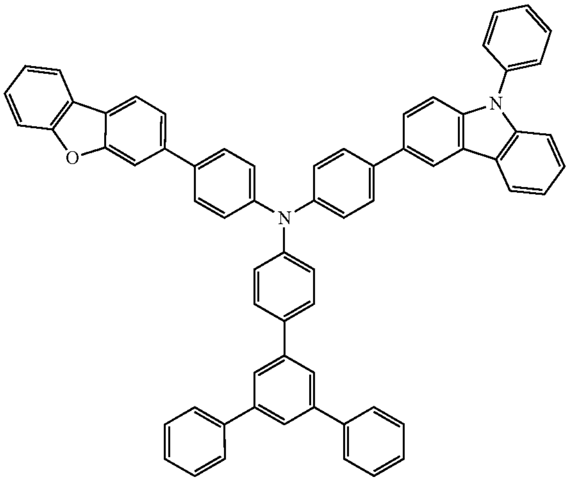

-continued
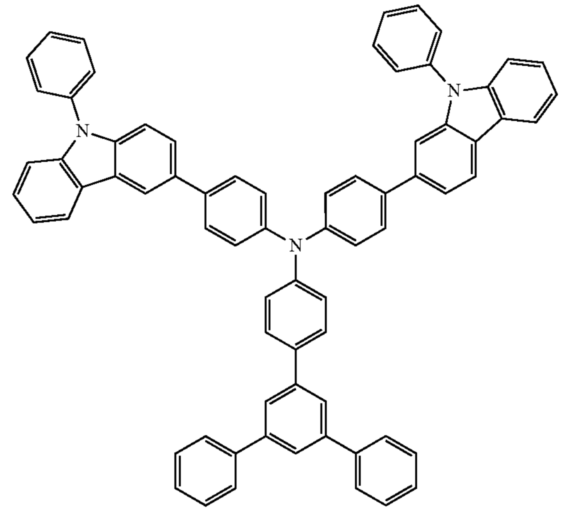
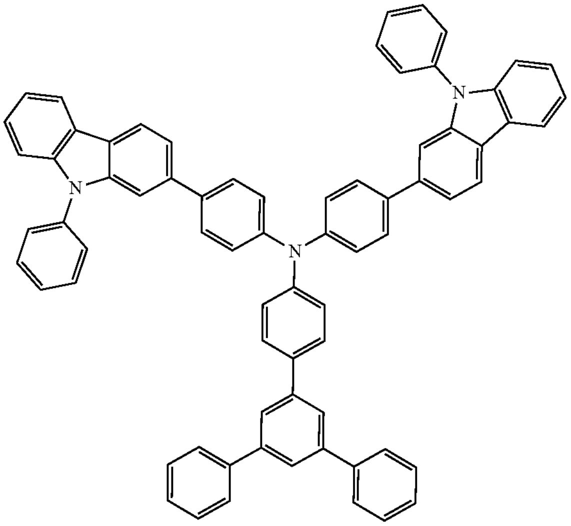
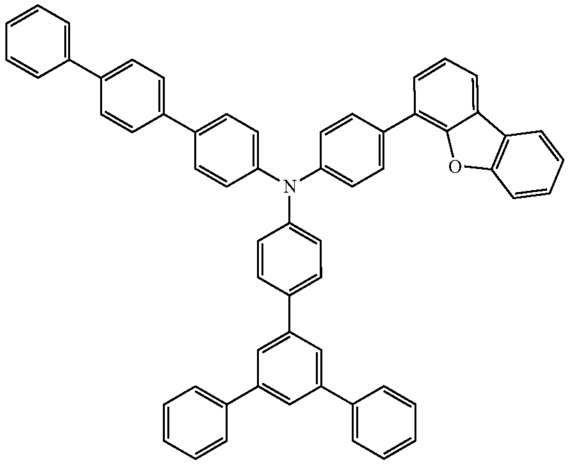
-continued
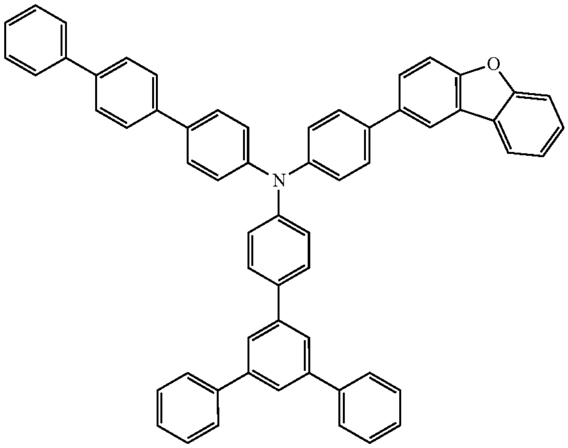
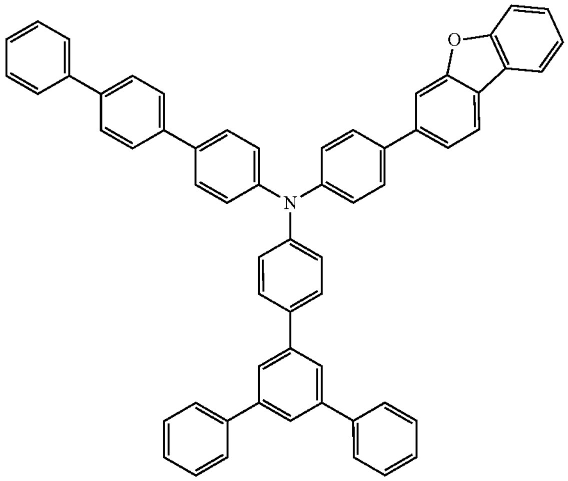
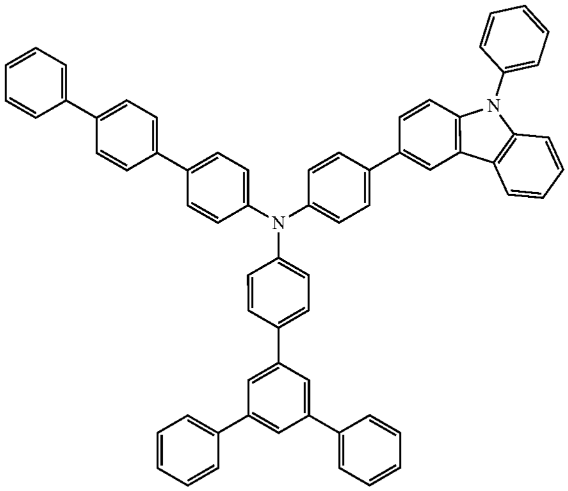

-continued

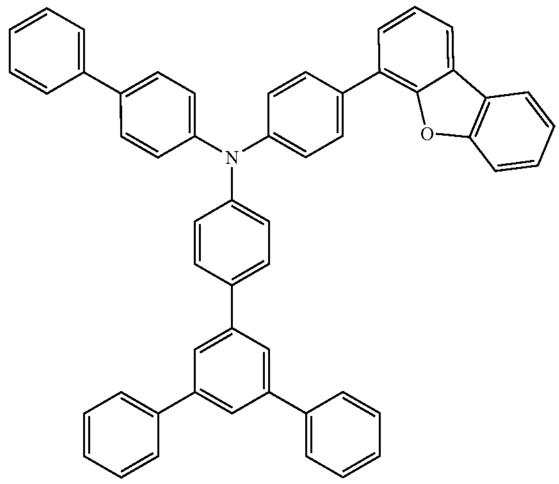

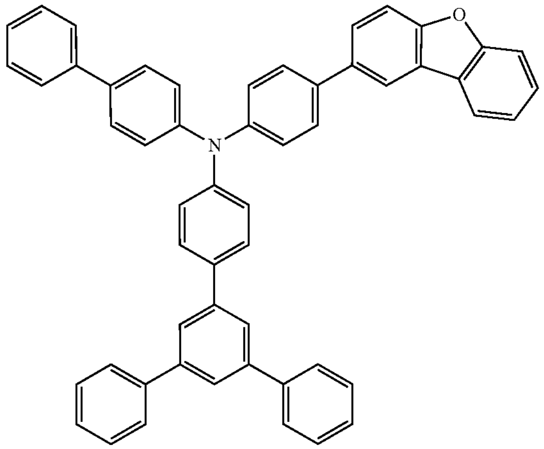

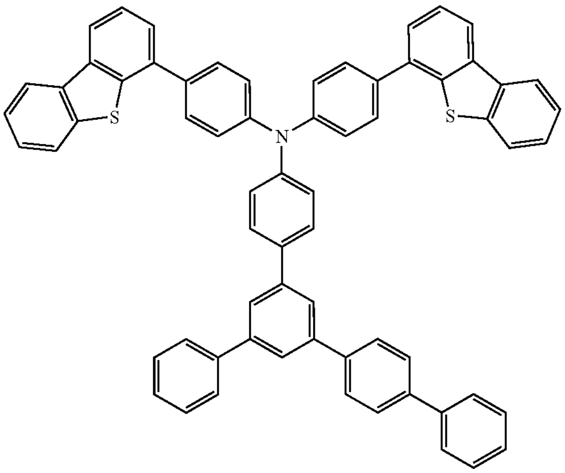

-continued

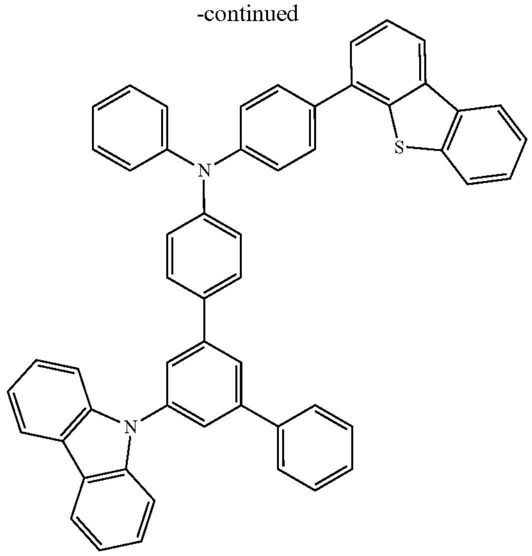

(Compound Represented by Formula (A))

A compound represented by the formula (A) will be described.

(A)

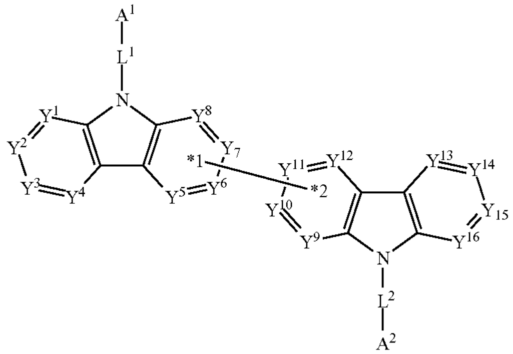

In the formula (A), $A^1$ and $A^2$ are independently a substituted or unsubstituted aryl group including 6 to 30 ring carbon atoms, or a substituted or unsubstituted monovalent heterocyclic group including 5 to 30 ring atoms.

One of $Y^5$ to $Y^8$ is a carbon atom which bonds with *1;

One of $Y^9$ to $Y^{12}$ is a carbon atom which bonds with *2;

$Y^1$ to $Y^4$, $Y^{13}$ to $Y^{16}$, $Y^5$ to $Y^8$ which are not a carbon atom which bonds with *1, and $Y^9$ to $Y^{12}$ which are not a carbon atom which bonds with *2 are independently CR;

When a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, a halogen atom, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When one or more of $R_{901}$ to $R_{904}$ are present in two or more, each of the two or more $R_{901}$ to $R_{904}$ are the same or different.

When a plurality of R's are present, the plurality of R's may be the same as or different from each other.

$L^1$ and $L^2$ are independently a single bond, a substituted or unsubstituted arylene group including 6 to 30 ring carbon atoms, or a substituted or unsubstituted divalent heterocyclic group including 5 to 30 ring atoms.

In one embodiment, the compound represented by the formula (A) is a compound represented by the following formula (A-a), (A-b), or (A-c).

(A-a)

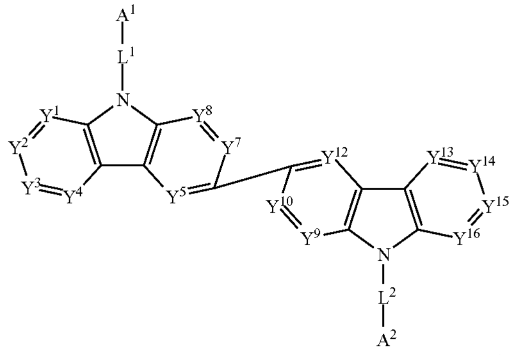

(A-b)

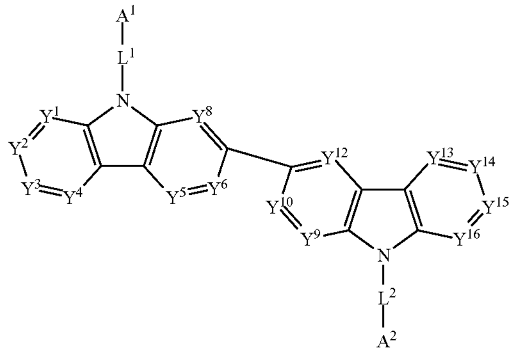

-continued (A-c)

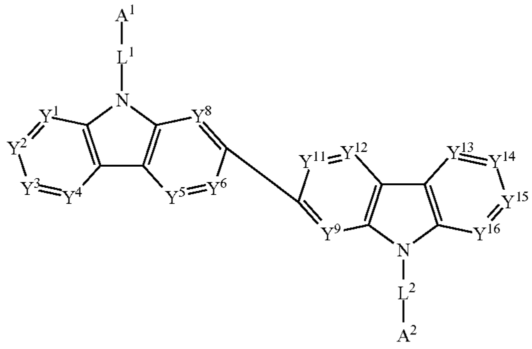

In the formulas (A-a), (A-b), and (A-c), $Y^1$ to $Y^{16}$, $A^1$, $A^2$, $L^1$, and $L^2$ are as defined in the formula (A).

In the formula (A), (A-a), (A-b), or (A-c), it is preferable that one of $A^1$ and $A^2$ be a substituted or unsubstituted aryl group including 6 to 30 ring carbon atoms; and the other of $A^1$ and $A^2$ be a substituted or unsubstituted phenyl group, a substituted or unsubstituted biphenyl group, a substituted or unsubstituted terphenyl group, a substituted or unsubstituted naphthyl group, a naphthylphenyl group, a triphenylenyl group, or a 9,9-biphenylfluorenyl group.

In the formula (A), (A-a), (A-b), or (A-c), it is preferable that one of $A^1$ and $A^2$ be a substituted or unsubstituted aryl group including 6 to 30 ring carbon atoms; and the other of $A^1$ and $A^2$ be a substituted or unsubstituted phenyl group, a substituted or unsubstituted p-biphenyl group, a substituted or unsubstituted m-biphenyl group, a substituted or unsubstituted o-biphenyl group, a substituted or unsubstituted 3-naphthylphenyl group, a triphenylenyl group. or a 9,9-biphenylfluorenyl group.

Specific examples of the compound represented by the formula (A) include the following compounds.

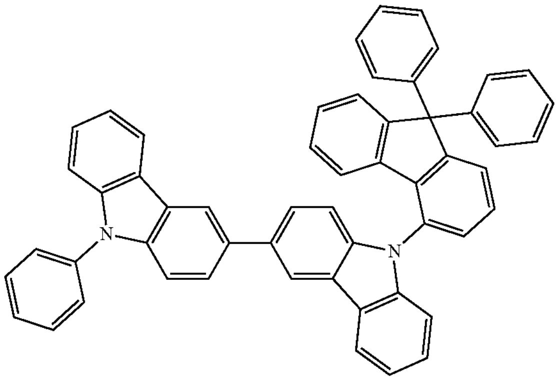

-continued

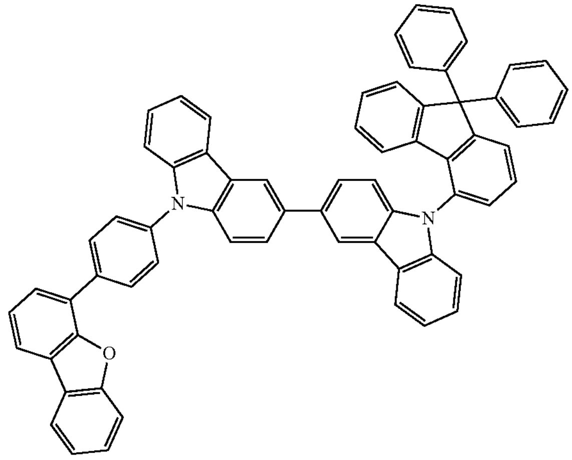

-continued

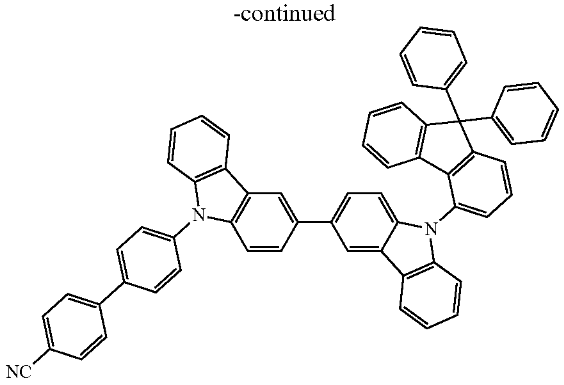

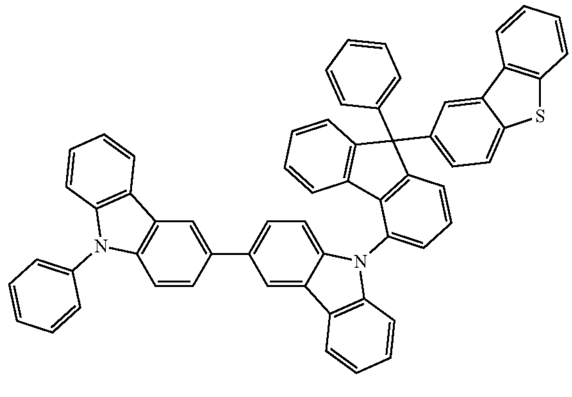

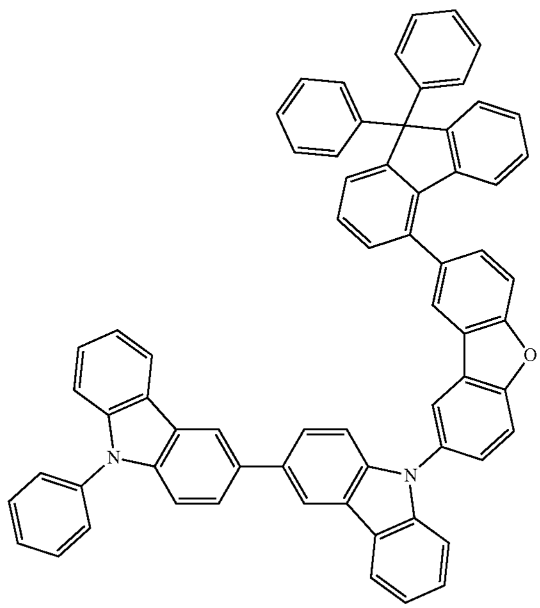

As described above, known materials and device configurations may be applied to the organic EL device according to an aspect of the invention, as long as the device includes a cathode, a anode, and an organic layer disposed between the cathode and the anode, wherein the organic layer includes an emitting layer and an electron-transporting layer, the electron-transporting layer is disposed between the cathode and the emitting layer, the emitting layer contains a first compound represented by any one of formulas (21), (41), and (51), and the electron-transporting layer contains a second compound represented by the formula (B31), and the effect of the invention is not impaired.

Parts which can be used in the organic EL device according to an aspect of the invention, materials for forming respective layers, other than the above-mentioned compounds, and the like, will be described later.

(Substrate)

A substrate is used as a support of an emitting device. As the substrate, glass, quartz, plastic or the like can be used, for example. Further, a flexible substrate maybe used. The “flexible substrate” means a bendable (flexible) substrate, and specific examples thereof include a plastic substrate formed of polycarbonate, polyvinyl chloride, or the like.

(Anode)

For the anode formed on the substrate, metals, alloys, electrically conductive compounds, mixtures thereof, and the like, which have a large work function (specifically 4.0 eV or higher) are preferably used. Specific examples include indium oxide-tin oxide (ITO: Indium Tin Oxide), indium oxide-tin oxide containing silicon or silicon oxide, indium oxide-zinc oxide, tungsten oxide, indium oxide containing zinc oxide, graphene, and the like. In addition thereto, specific examples thereof include gold (Au), platinum (Pt), a nitride of a metallic material (for example, titanium nitride), and the like.

(Hole-Injecting Layer)

The hole-injecting layer is a layer containing a substance having a high hole-injecting property. As such a substance having high hole-injecting property, molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, or a polymer compound (oligomers, dendrimers, polymers, etc.) can be given.

(Hole-Transporting Layer)

The hole-transporting layer is a layer containing a substance having a high hole-transporting property. For the hole-transporting layer, an aromatic amine compound, a carbazole derivative, an anthracene derivative, or the like can be used. A polymer compound such as poly(N-vinylcarbazole) (abbreviation: PVK) and poly(4-vinyltriphenylamine) (abbreviation: PVTPA) can also be used. However, a substance other than the above-described substances may be used as long as the substance has a higher hole-transporting property in comparison with an electron-transporting property. It should be noted that the layer containing the substance having high hole-transporting property may be not only a single layer, but also a layer in which two or more layers formed of the above-described substances are stacked.

(Guest Material for Emitting Layer)

The emitting layer is a layer containing a substance having a high emitting property, and various materials can be used for forming it. For example, as the substance having a high emitting property, a fluorescent compound which emits fluorescence or a phosphorescent compound which emits phosphorescence can be used. The fluorescent compound is a compound which can emit from a singlet excited state, and the phosphorescent compound is a compound which can emit from a triplet excited state.

As a blue fluorescent emitting material which can be used for an emitting layer, pyrene derivatives, styrylamine derivatives, chrysene derivatives, fluoranthene derivatives, fluorene derivatives, diamine derivatives, triarylamine derivatives, and the like can be used. As a green fluorescent emitting material which can be used for an emitting layer, aromatic amine derivatives and the like can be used. Asa red fluorescent emitting material which can be used for an emitting layer, tetracene derivatives, diamine derivatives and the like can be used.

As a blue phosphorescent emitting material which can be used for an emitting layer, metal complexes such as iridium complexes, osmium complexes, platinum complexes and the like are used. As a green phosphorescent emitting material which can be used for an emitting layer, iridium complexes and the like are used. As a red phosphorescent emitting material which can be used for an emitting layer, metal complexes such as iridium complexes, platinum complexes, terbium complexes, europium complexes and the like are used.

(Host Material for Emitting Layer)

The emitting layer may have a constitution in which the substance having a high emitting property (guest material) is dispersed in another substance (host material). Asa substance for dispersing the substance having a high emitting property, a variety of substances can be used, and it is preferable to use a substance having a higher lowest unoccupied orbital level (LUMO level) and a lower highest occupied orbital level (HOMO level) than the substance having a high emitting property.

As a substance for dispersing the substance having a high emitting property (host material), 1) metal complexes such as aluminum complexes, beryllium complexes, zinc complexes, or the like; 2) heterocyclic compounds such as oxadiazole derivatives, benzimidazole derivatives, phenanthroline derivatives, or the like; 3) fused aromatic compounds such as carbazole derivatives, anthracene derivatives, phenanthrene derivatives, pyrene derivatives, chrysene derivatives, or the like; and 4) aromatic amine compound such as triarylamine derivatives, fused polycyclic aromatic amine derivatives, or the like are used.

(Electron-Transporting Layer)

An electron-transporting layer is a layer which contains a substance having a high electron-transporting property. For the electron-transporting layer, 1) metal complexes such as aluminum complexes, beryllium complexes, zinc complexes, or the like; 2) heteroaromatic complexes such as imidazole derivatives, benzimidazole derivatives, azine derivatives, carbazole derivatives, phenanthroline derivatives, or the like; and 3) polymer compounds can be used.

(Electron-Injecting Layer)

An electron-injecting layer is a layer which contains a substance having a high electron-injecting property. For the electron-injecting layer, lithium (Li), ytterbium (Yb), lithium fluoride (LiF), cesium fluoride (CsF), calcium fluoride ($CaF_2$), metal complex compounds such as 8-hydroxyquinolinolato-lithium (Liq), alkali metals oxides such as lithium oxide ($LiO_x$); alkaline earth metals oxides; compounds of an alkali metal; or compounds of an alkaline earth metal can be used.

(Cathode)

For the cathode, metals, alloys, electrically conductive compounds, mixtures thereof, and the like having a small work function (specifically, 3.8 eV or lower) are preferably used. Specific examples of such a cathode material include elements belonging to Group 1 or Group 2 of the Periodic Table of the Elements, i.e., alkali metals such as lithium (Li) and cesium (Cs), alkaline earth metals such as magnesium (Mg), calcium (Ca) and strontium (Sr), and alloys containing these metals (e.g., MgAg and AlLi); rare earth metals such as europium (Eu) and ytterbium (Yb), and alloys containing these metals.

In the organic EL device according to an aspect of the invention, the methods for forming the respective layers are not particularly limited. A conventionally-known method for forming each layer according to a vacuum deposition process, a spin coating processor the like can be used. Each layer such as the emitting layer can be formed by a known method such as a vacuum deposition process, a molecular beam deposition process (MBE process), or an application process such as a dipping process, a spin coating process, a casting process, a bar coating process and a roll coating process, using a solution prepared by dissolving the material in a solvent.

In the organic EL device according to an aspect of the invention, the thickness of each layer is not particularly limited, but is generally preferable that the thickness be in the range of several nm to 1 μm in order to suppress defects such as pinholes, to suppress applied voltages to be low, and to improve luminous efficiency.

[Electronic Apparatus]

The electronic apparatus according to an aspect of the invention is characterized in that the organic EL device according to an aspect of the invention is equipped with.

Specific examples of the electronic apparatus include a display component such as an organic EL panel module, and the like; a display device such as a television, a cellular phone, a personal computer, and the like; and an emitting device such as a light, a vehicular lamp, and the like.

EXAMPLES

Next, the invention will be described in more detail with reference to Examples and Comparative Examples, but the invention is not limited to the description of these Examples in any way.

Compounds used in the following Examples and Comparative Examples are as follows:

ET-1
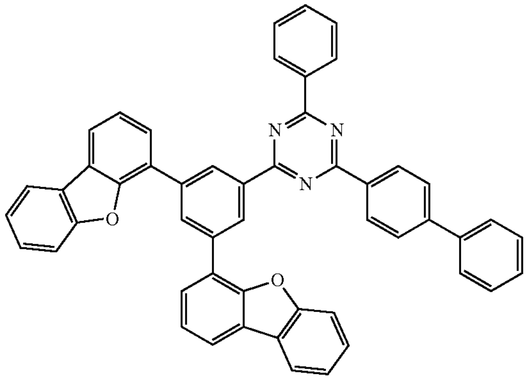
ET-2
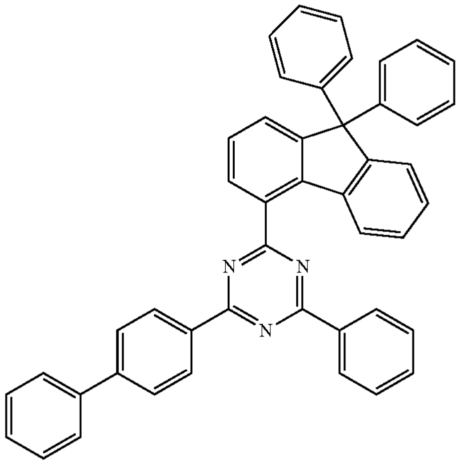
ET-3
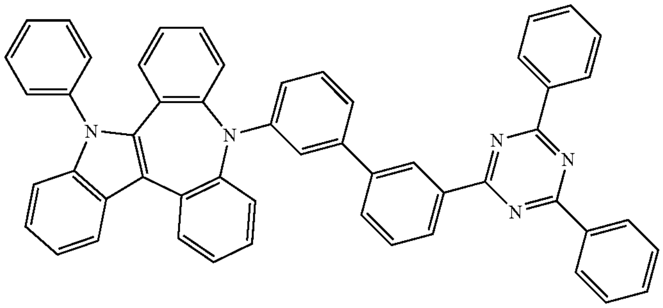
ET-4
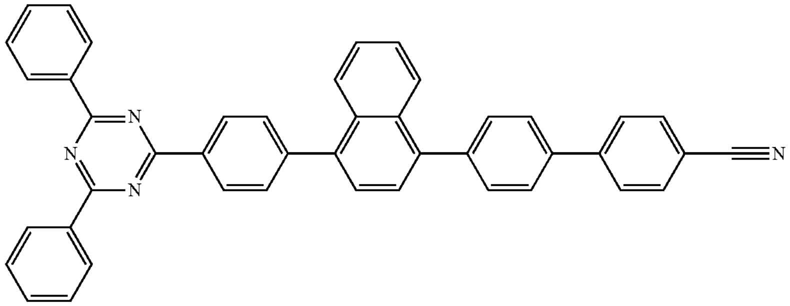
ET-5
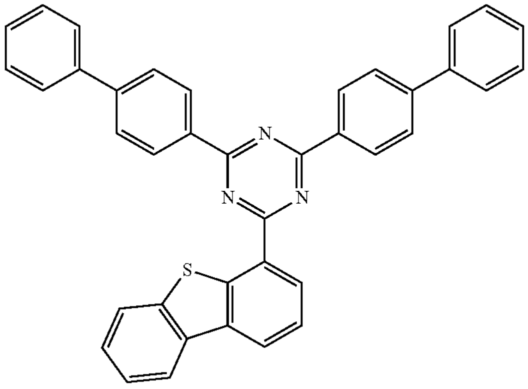
ET-6
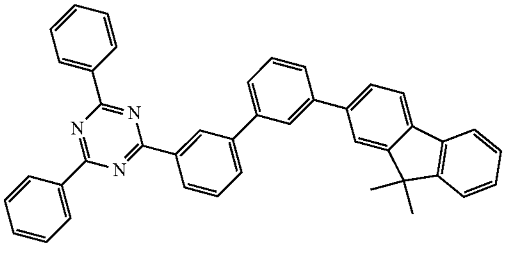

-continued
ET-7
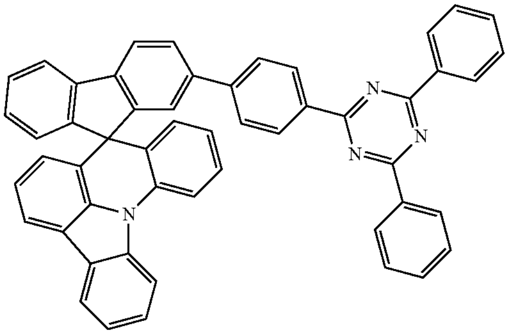
ET-8
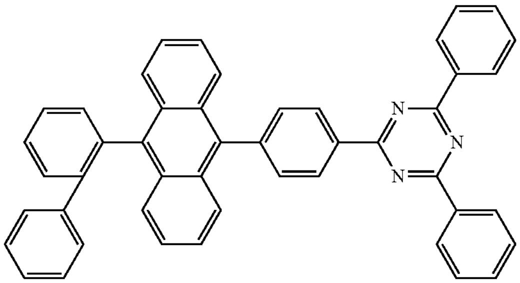
ET-9
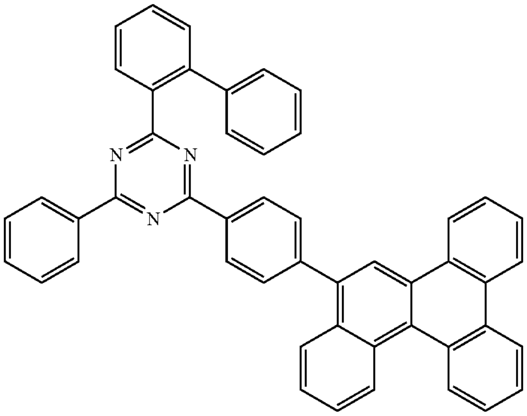
ET-10
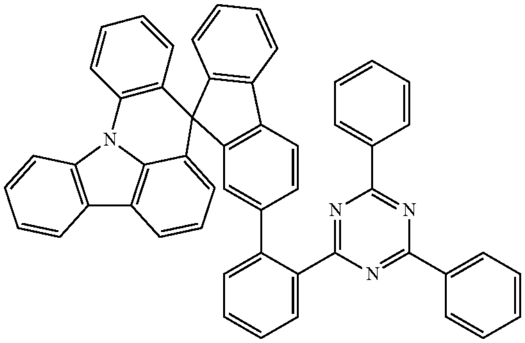
ET-11
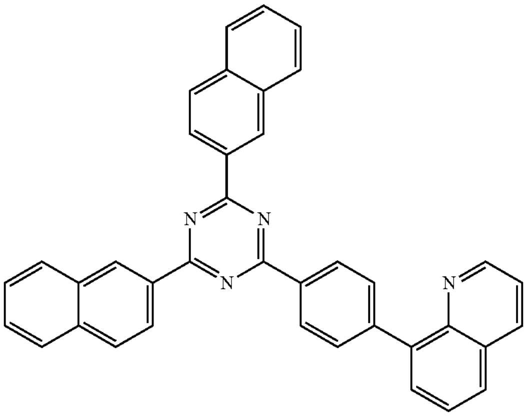
ET-12
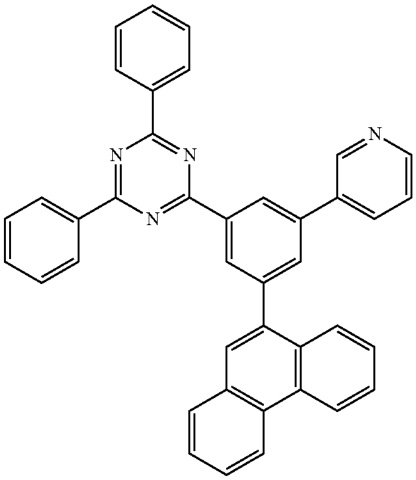
ET-13
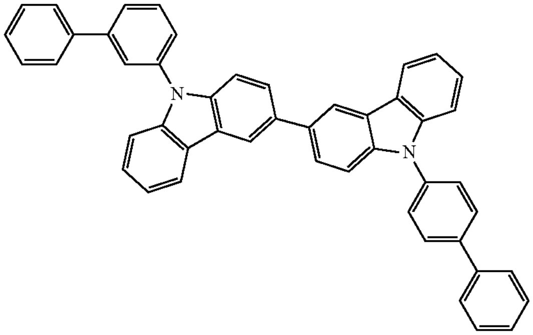
ET-14
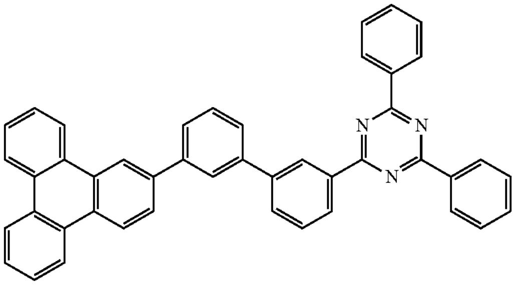

-continued
ET-15
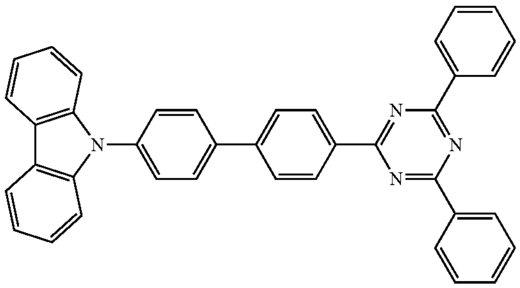
ET-16
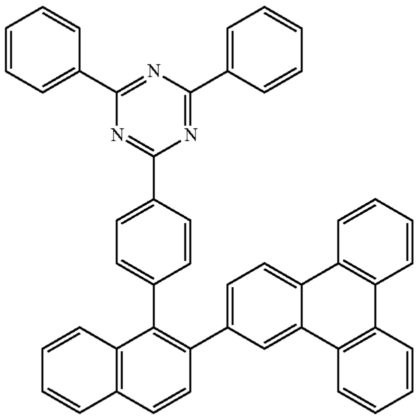
ET-17
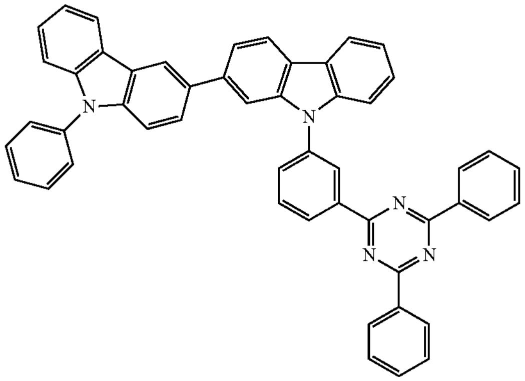
ET-18
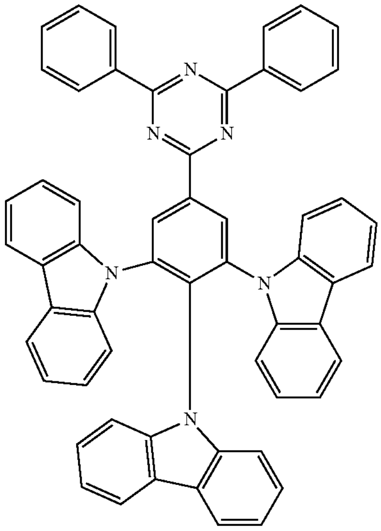
ET-19
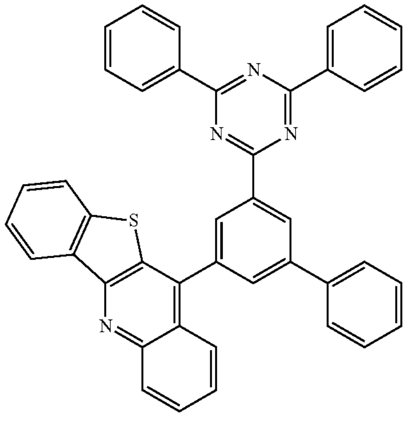
HT-1
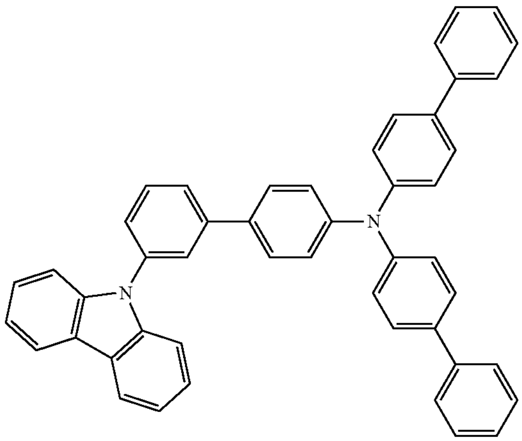

-continued
HT-2
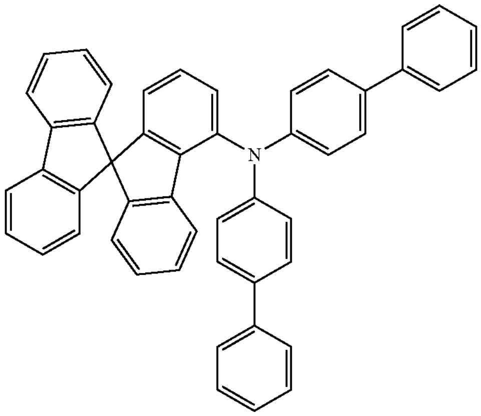
HT-3
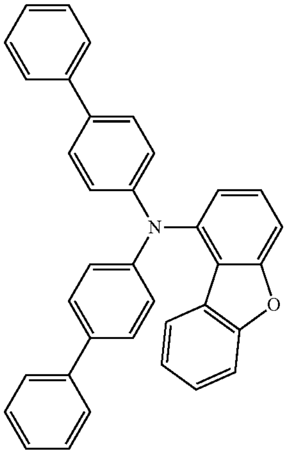
HT-4
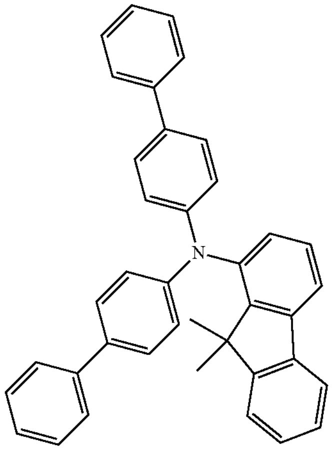
HT-5
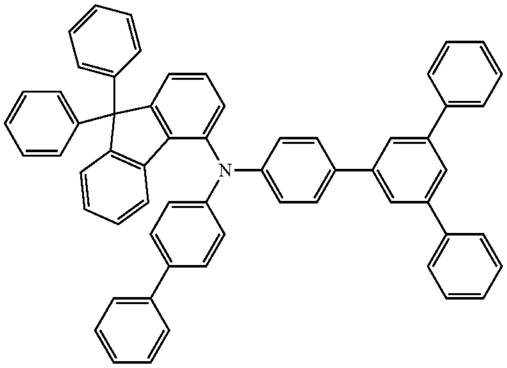
HT-6
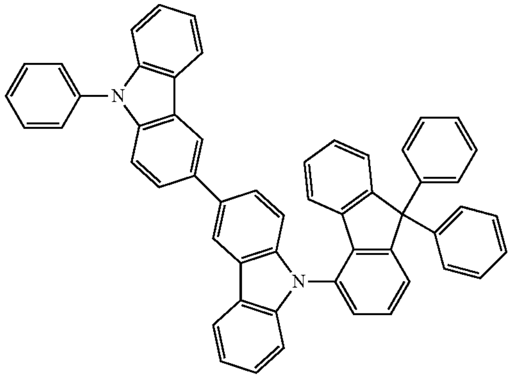
HT-7
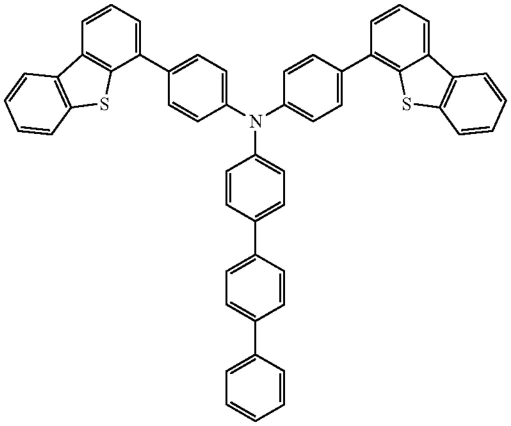
BH2
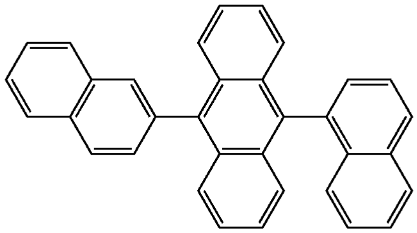

-continued
BD-3
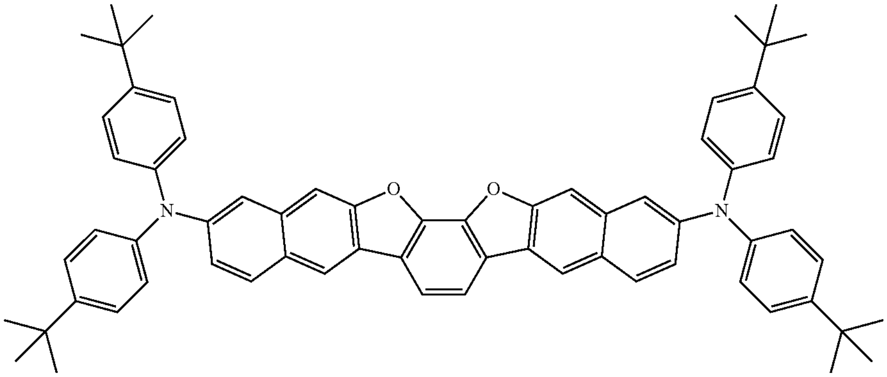
ET-D
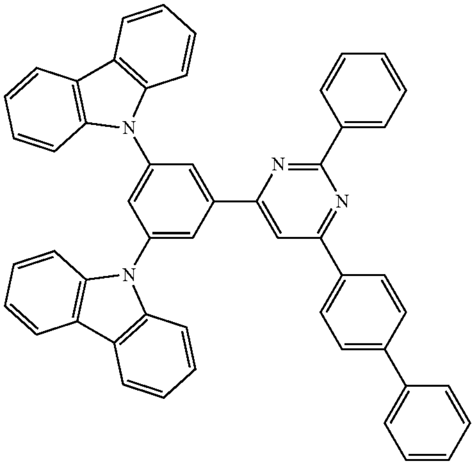
HT-B
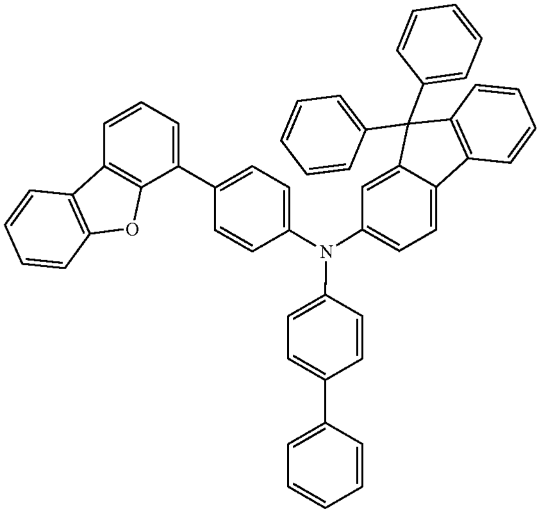
-continued
HT-C
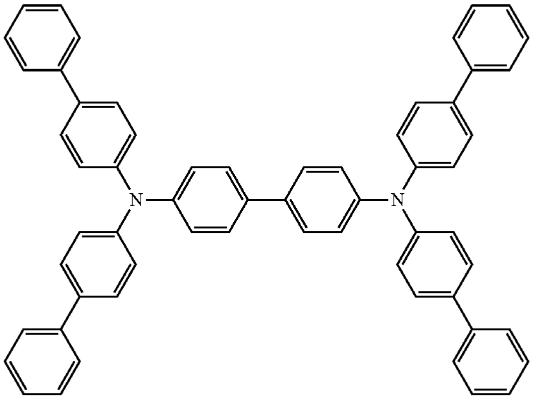

-continued

HT

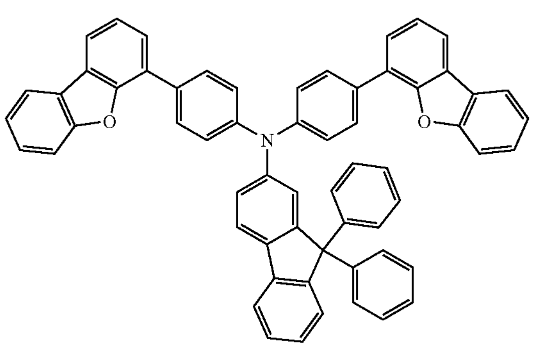

BH

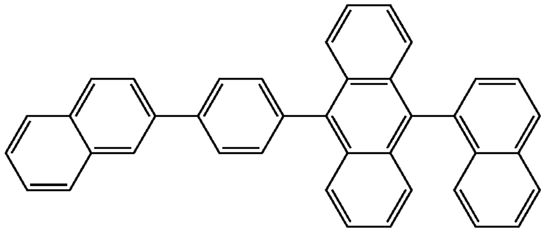

BD-1

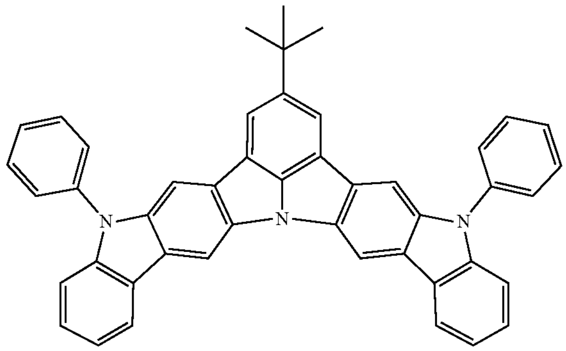

BD-2

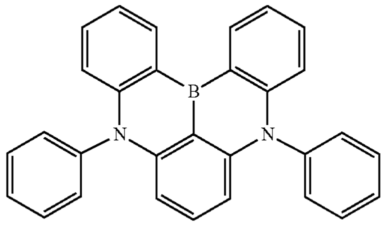

ET-A

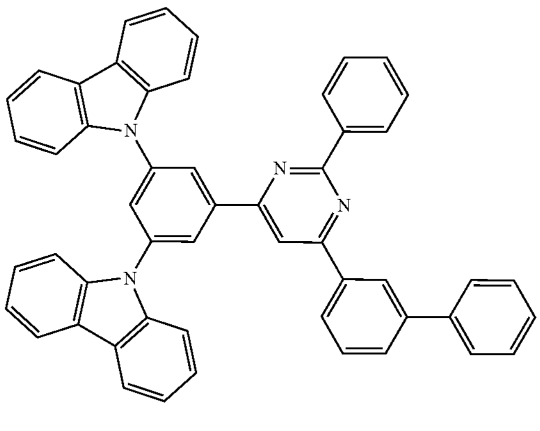

-continued

ET-B

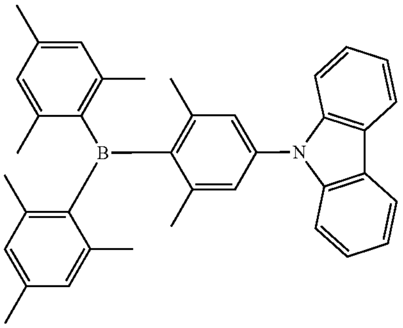

ET-C

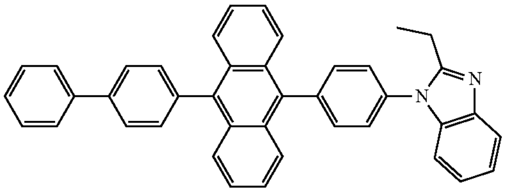

Example 1

(Fabrication of Organic EL Device)

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI was deposited on a surface on the side on which the transparent electrode was formed so as to cover the transparent electrode to form an HI film having a thickness of 5 nm. This HI film functions as a hole-injecting layer.

A compound HT was deposited on the HI film to form an HT film having a thickness of 90 nm. This HT film functions as a hole-transporting layer (hereinafter, also referred to as an HT layer).

On this HT film, a compound BH (host material) and a compound BD-2 (dopant material) were co-deposited so that the proportion of the compound BD-2 became 4% by mass to form a BH:BD-2 film having a film thickness of 25 nm. This BH:BD-2 film functions as an emitting layer.

On this emitting layer, a compound ET-1 was deposited to form an ET-1 film having a thickness of 10 nm. This ET-1 film functions as a first electron-transporting layer.

On this ET-1 film, a compound ET-C was deposited to form an ET-C film having a film thickness of 15 nm. This ET-C film functions as a second electron-transporting layer.

On this ET-C film, LiF was deposited to form a LiF film having a thickness of 1 nm.

Al metal was deposited on this LiF film to form a metal cathode having a thickness of 80 nm to obtain an organic EL device.

The layer structure of the obtained organic EL device is as follows.

ITO(130)/HI(5)/HT(90)/BH:BD-2(25:4% by mass)/ET-1 (10)/ET-C(15)/LiF(1)/Al(80)

Numerical values in parentheses indicate film thickness (unit: nm).

(Evaluation of Organic EL Device)

A voltage was applied to the obtained organic EL device so that the current density became 50 mA/$cm^2$, and the time until the luminance became 95% of the initial luminance (LT95 (unit: hours)) was measured. The results are shown in Table 1.

Examples 2 to 18 and Comparative Example 2

The organic EL devices were fabricated and evaluated in the same manner as in Example except that the compounds shown in Table 1 where used as materials of the first electron-transporting layer. In the same manner as in Example 1, the emitting layer thereof was formed by co-depositing a compound BH (host material) and a compound BD-2 (dopant material) so that the proportion of the compound BD-2 became 4% by mass.

In Example 13, the first electron-transporting layer was formed by co-deposing a compound ET-14 and a compound ET-13 so that the proportion of the compound ET-13 became 50% by mass.

The results are shown in Table 1.

TABLE 1

| | Emitting layer | First electron-transporting layer | Second electron-transporting layer | LT95 (hr) |
|---|---|---|---|---|
| Example 1 | BH: | ET-1 | ET-C | 33 |
| Example 2 | BD-2 | ET-2 | | 17 |
| Example 3 | | ET-3 | | 24 |
| Example 4 | | ET-4 | | 49 |
| Example 5 | | ET-5 | | 77 |
| Example 6 | | ET-6 | | 35 |
| Example 7 | | ET-7 | | 30 |
| Example 8 | | ET-8 | | 18 |
| Example 9 | | ET-9 | | 15 |
| Example 10 | | ET-10 | | 19 |
| Example 11 | | ET-11 | | 28 |
| Example 12 | | ET-12 | | 68 |
| Example 13 | | ET-14: ET-13 | | 50 |
| Example 14 | | ET-14 | | 16 |
| Example 15 | | ET-15 | | 29 |
| Example 16 | | ET-16 | | 16 |
| Example 17 | | ET-17 | | 55 |
| Example 18 | | ET-18 | | 80 |
| Comp. Ex. 1 | | ET-B | | 4 |

Examples 19 to 36 and Comparative Example 2

The organic EL devices were fabricated and evaluated in the same manner as in Example 1 except that the compounds shown in Table 2 were used as materials of the emitting layer and the first electron-transporting layer. The emitting layer thereof was formed by co-depositing a compound BH (host material) and a compound BD-1 (dopant material) so that the proportion of the compound BD-1 became 4% by mass.

In Example 31, the first electron-transporting layer was formed by co-depositing a compound ET-14 and a compound ET-13 so that the proportion of the compound ET-13 became 50% by mass.

The results are shown in Table 2.

TABLE 2

| | Emitting layer | First electron-transporting layer | Second electron-transporting layer | LT95 (hr) |
|---|---|---|---|---|
| Example 19 | BH: | ET-1 | ET-C | 70 |
| Example 20 | BD-1 | ET-2 | | 91 |
| Example 21 | | ET-3 | | 65 |
| Example 22 | | ET-4 | | 134 |
| Example 23 | | ET-5 | | 230 |
| Example 24 | | ET-6 | | 72 |
| Example 25 | | ET-7 | | 83 |
| Example 26 | | ET-8 | | 68 |
| Example 27 | | ET-9 | | 43 |
| Example 28 | | ET-10 | | 55 |
| Example 29 | | ET-11 | | 76 |
| Example 30 | | ET-12 | | 310 |
| Example 31 | | ET-14: ET-13 | | 149 |
| Example 32 | | ET-14 | | 35 |
| Example 33 | | ET-15 | | 98 |
| Example 34 | | ET-16 | | 51 |
| Example 35 | | ET-17 | | 270 |
| Example 36 | | ET-18 | | 330 |
| Comp. Ex. 2 | | ET-A | | 13 |

Example 37

The organic EL device was fabricated and evaluated in the same manner as in Example 1 except that the compounds shown in Table 3 were used as materials of the emitting layer, the first electron-transporting layer, and the second electron-transporting layer.

The second electron-transporting layer was formed by co-depositing a compound ET-2 and compound (8-quinolinolato)lithium (hereinafter, also referred to as Liq) so that the proportion of the compound Liq became 50% by mass to form an ET-2:Liq film having a thickness of 15 nm.

The layer structure of the obtained organic EL device is as follows.

ITO(130)/HI(5)/HT(90)/BH:BD-1(25:4% by weight)/ET-A (10)/ET-2:Liq(15:50% by mass)/LiF(1)/Al(80)

Numerical values in parentheses indicate film thickness (unit: nm).

LT95 (unit: hours) of the obtained organic EL device was measured. Results are shown in Table 3.

Examples 38 to 41 and Comparative Example 3

The organic EL devices were fabricated and evaluated in the same manner as in Example 37 except that the compounds shown in Table 3 were used as materials of the second electron-transporting layer. In the same manner as in Example 37, the emitting layer thereof was formed by co-depositing a compound BH (host material) and a compound BD-1 (dopant material) so that the proportion of the compound BD-1 became 4% by mass.

Results are shown in Table 3.

TABLE 3

| | Emitting layer | First electron-transporting layer | Second electron-transporting layer | LT95 (hr) |
|---|---|---|---|---|
| Example 37 | BH: | ET-A | ET-2: Liq | 120 |
| Example 38 | BD-1 | | ET-4: Liq | 180 |
| Example 39 | | | ET-5: Liq | 190 |
| Example 40 | | | ET-12 :Liq | 135 |
| Example 41 | | | ET-19: Liq | 115 |
| Comp. Ex. 3 | | | ET-C: Liq | 80 |

The results in Tables 1 to 3 show that the organic EL devices of Examples 1 to 41, which contain the specified dopant material in the emitting layer and contain the specified material in the electron-transporting layer, have a long lifetime.

Example 42

(Fabrication of Organic EL Device)

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI was deposited on a surface on the side on which the transparent electrode was formed so as to cover the transparent electrode to form an HI film having a thickness of 5 nm. This HI film functions as a hole-injecting layer.

On this HI film, a compound HT was deposited to form an HT film having a thickness of 80 nm. This HT film functions as a hole-transporting layer (hereinafter, also referred to as an HT layer).

On this HT film, a compound HT-1 was deposited to form an HT-1 film having a thickness of 10 nm. This HT-1 film functions as an electron barrier layer (hereinafter also referred to as an EB layer).

On this HT-1 film, a compound BH (host material) and a compound BD-2 (dopant material) were co-deposited so that the proportion of the compound BD-2 became 4% by mass to form a BH:BD-2 film having a film thickness of 25 nm. This BH:BD-2 film functions as an emitting layer.

On this emitting layer, a compound ET-2 was deposited to form an ET-2 film having a thickness of 10 nm. This ET-2 film functions as a first electron-transporting layer.

On this ET-2 film, a compound ET-C was deposited to form an ET-C film having a film thickness of 15 nm. This ET-C film functions as a second electron-transporting layer.

On this ET-C film, LiF was deposited to form a LiF film having a thickness of 1 nm.

Al metal was deposited on this LiF film to form a metal cathode having a thickness of 80 nm to obtain an organic EL device.

The layer structure of the obtained organic EL device is as follows:

ITO(130)/HI(5)/HT(80)/HT-1(10)/BH:BD-2(25: 4% by mass)/ET-2(10)/ET-C(15)/LiF(1)/Al(80) Numerical values in parentheses indicate film thickness (unit: nm).

(Evaluation of Organic EL Device)

A voltage was applied to the obtained organic EL device to be 10 mA/cm$^2$ in current density, thereby measuring an EL emission spectrum by using Spectroradiometer CS-1000 (manufactured by Konica Minolta, Inc.). External quantum efficiency (EQE (unit:%)) was calculated from the resulting spectral radiance spectrum. The results are shown in Table 4.

Further, a voltage was applied to the obtained organic EL device so that the current density became 50 mA/cm$^2$, and the time until the luminance became 95% of the initial luminance (LT95 (unit: hours)) was measured. The results are shown in Table 4.

Examples 43 to 48 and Comparative Example 4

The organic EL devices were fabricated and evaluated in the same manner as in Example 42 except that the compounds shown in Table 4 were used as materials of the EB layer and the first electron-transporting layer. The results are shown in Table 4.

In Examples 43 to 48 and Comparative Example 4, the emitting layer was formed by co-depositing a compound BH (host material) and a compound BD-2 (dopant material) so that the proportion of the compound BD-2 became 4% by mass in the same manner as in Example 42.

In Example 46, the first electron-transporting layer was formed by co-depositing a compound ET-14 and a compound ET-13 so that the proportion of the compound ET-13 became 50% by mass.

Comparative Example 4 is the same organic EL device as in Comparative Example 1 described above. Therefore, although the layer having a thickness of 10 nm which corresponds to the EB layer in the organic EL device of Example 42 or the like is not present, an "EB layer" of Comparative Example 4 is described as "HT" in Table 4 for comparison (because in Comparative Example 4, an HT layer having a thickness of 90 nm is directly adjacent to the emitting layer on the anode side).

TABLE 4

| | EB layer | Emitting layer | First electron-transporting layer | Second electron-transporting layer | EQE (%) | LT95 (hr) |
|---|---|---|---|---|---|---|
| Example 42 | HT-1 | BH: | ET-2 | ET-C | 6.6 | 68 |
| Example 43 | HT-2 | BD-2 | ET-4 | | 6.7 | 65 |
| Example 44 | HT-3 | | ET-5 | | 6.5 | 85 |
| Example 45 | HT-4 | | ET-12 | | 6.5 | 75 |
| Example 46 | HT-5 | | ET-14: ET-13 | | 6.7 | 67 |
| Example 47 | HT-6 | | ET-14 | | 6.6 | 35 |
| Example 48 | HT-7 | | ET-17 | | 6.5 | 64 |
| Comp. Ex. 4 | HT | | ET-B | | 6.5 | 4 |

Examples 49 to 55 and Comparative Example 5

The organic EL devices were fabricated and evaluated in the same manner as in Example 42 except that the compounds shown in Table 5 were used as materials of the EB layer, the emitting layer, and the first electron-transporting layer. The results are shown in Table 5.

The emitting layer was formed by co-depositing a compound BH (host material) and a compound BD-1 (dopant material) so that the proportion of the compound BD-1 became 4% by mass.

Comparative Example 5 is the same organic EL device as in Comparative Example 2 described above. Therefore, although the layer having a thickness of 10 nm which corresponds to the EB layer in the organic EL device of Example 49 or the like is not present, an "EB layer" of Comparative Example 5 is described as "HT" in Table 5 for comparison (because in Comparative Example 5, an HT layer having a thickness of 90 nm is directly adjacent to the emitting layer on the anode side).

TABLE 5

| | EB layer | Emitting layer | First electron-transporting layer | Second electron-transporting layer | EQE (%) | LT95 (hr) |
|---|---|---|---|---|---|---|
| Example 49 | HT-7 | BH: | ET-2 | ET-C | 6.3 | 121 |
| Example 50 | HT-6 | BD-1 | ET-4 | | 6.5 | 154 |
| Example 51 | HT-5 | | ET-5 | | 6.4 | 255 |
| Example 52 | HT-4 | | ET-12 | | 6.5 | 332 |
| Example 53 | HT-3 | | ET-14: ET-13 | | 6.4 | 165 |
| Example 54 | HT-2 | | ET-14 | | 6.4 | 65 |
| Example 55 | HT-1 | | ET-17 | | 6.3 | 383 |
| Comp. Ex. 5 | HT | | ET-A | | 6.3 | 13 |

Example 56

(Fabrication of Organic EL Device)

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm. The glass substrate with the transparent electrode after being cleaned was mounted onto a substrate holder in a vacuum vapor deposition apparatus. First, a compound HI was deposited on a surface on the side on which the transparent electrode was formed so as to cover the transparent electrode to form an HI film having a thickness of 5 nm. This HI film functions as a hole-injecting layer.

On this HI film, a compound HT was deposited to form an HT film having a thickness of 80 nm. This HT film functions as a hole-transporting layer (hereinafter, also referred to as an HT layer).

On this HT film, a compound HT-1 was deposited to form an HT-1 film having a thickness of 10 nm. This HT-1 film functions as an electron barrier layer (hereinafter also referred to as an EB layer).

On this HT-1 film, a compound BH (host material) and a compound BD-1 (dopant material) were co-deposited so that the proportion of the compound BD-1 became 4% by mass to form a BH:BD-1 film having a film thickness of 25 nm. This BH:BD-1 film functions as an emitting layer.

On this emitting layer, a compound ET-A was deposited to form an ET-A film having a thickness of 10 nm. This ET-A film functions as a first electron-transporting layer.

On this ET-A film, a compound ET-2 and a compound Liq were co-deposited so that the proportion of the compound Liq became 50% by mass to form an ET-2:Liq film having a thickness of 15 nm. This ET-2:Liq film functions as a second electron-transporting layer.

On this ET-2:Liq film, LiF was deposited to form a LiF film having a thickness of 1 nm.

Al metal was deposited on this LiF film to form a metal cathode having a thickness of 80 nm to obtain an organic EL device.

The layer structure of the obtained organic EL device is as follows:

ITO(130)/HI(5)/HT(80)/HT-1(10)/BH:BD-1(25: 4% by mass)/ET-A(10)/ET-2:Liq(15: 50% by mass)/LiF(1)/Al(80)

Numerical values in parentheses indicate film thickness (unit: nm).

The obtained organic EL device was evaluated in the same manner as in Example 49. The results are shown in Table 6.

Examples 57 to 59 and Comparative Example 6

The organic EL devices were fabricated and evaluated in the same manner as in Example 56 except that the materials shown in Table 6 were used as materials of the EB layer and the second electron-transporting layer. The results are shown in Table 6.

In the same manner as in Example 56, the emitting layer was formed by co-depositing a compound BH (host material) and a compound BD-1 (dopant material) so that the proportion of the compound BD-1 became 4% by mass.

Comparative Example 6 is the same organic EL device as Comparative Example 3 described above. Therefore, although the layer having a thickness of 10 nm which corresponds to the EB layer in the organic EL device of Example 56 or the like is not present, "EB layer" of Comparative Example 6 is described as an "HT" in Table 6 for comparison (because in Comparative Example 6, an HT layer having a thickness of 90 nm is directly adjacent to the emitting layer on the anode side).

TABLE 6

| | EB layer | Emitting layer | First electron-transporting | Second electron-transporting | EQE (%) | LT95 (hr) |
|---|---|---|---|---|---|---|
| Example 56 | HT-1 | BH: | layer | layer | 6.0 | 138 |
| Example 57 | HT-3 | BD-1 | | ET-4: Liq | 6.0 | 206 |
| Example 58 | HT-5 | | | ET-5: Liq | 6.1 | 198 |
| Example 59 | HT-6 | | | ET-12: Liq | 6.3 | 152 |
| Comp. Ex. 6 | HT | | | ET-C: Liq | 6.0 | 80 |

The ionization potentials Ip(HT) of compounds HT-1 to HT-7 and a compound HT are shown in Table A below.

The ionization potential was measured in air using a photoelectron spectrometer (manufactured by RIKEN KEIKI Co., Ltd., "AC-3"). Specifically, a material was irradiated with light, and the quantity of electrons generated by charge-separation was measured.

TABLE A

| Compound | Ip(HT)(eV) |
|---|---|
| HT-1 | 5.72 |
| HT-2 | 5.82 |
| HT-3 | 5.79 |
| HT-4 | 5.77 |
| HT-5 | 5.77 |
| HT-6 | 5.74 |
| HT-7 | 5.72 |
| HT | 5.62 |

Example 60

The organic EL device was fabricated and evaluated in the same manner as in Example 1 except that the compounds shown in Table 7 were used as materials of the emitting layer, the first electron-transporting layer, and the second electron-transporting layer.

The emitting layer was formed by co-depositing a compound BH2 (host material) and a compound BD-3 (dopant material) so that the proportion of the compound BD-3 became 4% by mass.

As the second electron-transporting layer, a compound ET-3 and a compound Liq were co-deposited so that the proportion of the compound Liq became 50% by mass to form an ET-3:Liq film having a thickness of 15 nm.

The layer structure of the obtained organic EL device is as follows:

ITO(130)/HI(5)/HT(90)/BH2:BD-3(25: 4% by mass)/ET-D (10)/ET-3:Liq(15: 50% by mass)/LiF(1)/Al(80) Numerical values in parentheses indicate film thickness (unit: nm).

The results are shown in Table 7.

Examples 61 to 64 and Comparative Example 7

The organic EL devices were fabricated and evaluated in the same manner as in Example 60 except that the compounds shown in Table 7 were used as materials of the emitting layer, the first electron-transporting layer, and the second electron-transporting layer. The emitting layer thereof was formed by co-depositing a compound BH2 (host material) and a compound BD-3 (dopant material) so that the proportion of compound BD-3 was 4% by mass.

The results are shown in Table 7.

TABLE 7

| | Emitting layer | First electron-transporting layer | Second electron-transporting layer | LT95 (hr) |
|---|---|---|---|---|
| Example 60 | BH2: | ET-D | ET-3: Liq | 180 |
| Example 61 | BD-3 | | ET-6: Liq | 195 |
| Example 62 | | | ET-10: Liq | 188 |
| Example 63 | | | ET-11: Liq | 173 |
| Example 64 | | | ET-17: Liq | 202 |
| Comparative Example 7 | | | ET-C: Liq | 165 |

Example 65

(Fabrication of Organic EL Device)

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI was deposited on a surface on the side on which the transparent electrode was formed so as to cover the transparent electrode to form an HI film having a thickness of 5 nm. This HI film functions as a hole-injecting layer.

On this HI film, a compound HT-C was deposited to form an HT-C film having a thickness of 80 nm. This HT-C film functions as a hole-transporting layer (hereinafter, also referred to as an HT layer).

On this HT-C film, a compound HT-B was deposited to form an HT-B film having a thickness of 10 nm. This HT-B film functions as an electron barrier layer (hereinafter also referred to as an EB layer).

On this HT-B film, a compound BH2 (host material) and a compound BD-1 (dopant material) were co-deposited so that the proportion of the compound BD-1 became 4% by mass to form a BH2:BD-1 film having a film thickness of 25 nm. This BH2:BD-1 film functions as an emitting layer.

On this emitting layer, a compound ET-18 was deposited to form an ET-18 film having a thickness of 10 nm. This ET-18 film functions as a first electron-transporting layer.

On this ET-18 film, a compound ET-C was deposited to form an ET-C film having a film thickness of 15 nm. This ET-C film functions as a second electron-transporting layer.

On this ET-C film, LiF was deposited to form a LiF film having a thickness of 1 nm.

Al metal was deposited on this LiF film to form a metal cathode having a thickness of 80 nm to obtain an organic EL device.

The layer structure of the obtained organic EL device is as follows:

ITO(130)/HI(5)/HT-C(80)/HT-B(10)/BH2:BD-1(25: 4% by mass)/ET-18(10)/ET-C(15)/LiF(1)/Al(80)

Numerical values in parentheses indicate film thickness (unit: nm).

LT95 (unit: hours) of the obtained organic EL devices were measured in the same manner as in Example 1. The results are shown in Table 8.

Comparative Example 8

The organic EL device was fabricated and evaluated in the same manner as in Example 65 except that the compounds shown in Table 8 were used as materials of the EB layer, the emitting layer, the first electron-transporting layer, and the second electron-transporting layer. The emitting layer thereof was formed by co-depositing a compound BH2 (host material) and a compound BD-1 (dopant material) so that the proportion of the compound BD-3 became 4% by mass.

The results are shown in Table 8.

TABLE 8

| | EB layer | Emitting layer | First electron-transporting layer | Second electron-transporting layer | LT95 (hr) |
|---|---|---|---|---|---|
| Example 65 | HT-B | BH2: | ET-18 | ET-C | 131 |
| Comparative Example 8 | HT | BD-1 | ET-A | | 58 |

The results in Tables 4 to 8 show that the organic EL devices of Examples 42 to 65, which contain the specific dopant material in the emitting layer and contain the specific material in the electron-transporting layer, have a long lifetime.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The invention claimed is:

1. An organic electroluminescence device comprising:

a cathode, an anode, and an organic layer disposed between the cathode and the anode, wherein the organic layer comprises an emitting layer and an electron-transporting layer, the electron-transporting layer is disposed between the cathode and the emitting layer, the emitting layer comprises a first compound represented by the following formula (41), the electron-transporting layer comprises a second compound represented by the following formula (B12):

the organic layer further comprises a hole-transporting layer, the hole-transporting layer is disposed between the anode and the emitting layer and directly adjacent to the emitting layer, and the hole-transporting layer comprises a third compound represented by the following formula (C12A), the third compound satisfies the following expression (M1):

$$Ip(HT) \geq 5.67 \text{ eV} \quad (M1),$$

wherein in the expression (M1), Ip(HT) is the ionization potential of the third compound, (41)

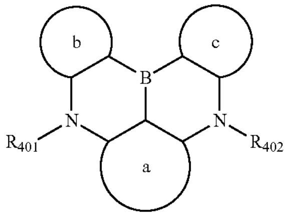

wherein in the formula (41), a ring a, a ring b, and a ring c are independently a substituted or unsubstituted aromatic hydrocarbon ring including 6 to 50 ring carbon atoms, or a substituted or unsubstituted heterocyclic ring including 5 to 50 ring atoms;

$R_{401}$ and $R_{402}$ independently form a substituted or unsubstituted heterocyclic ring by bonding with the ring a, the ring b, or the ring c, or do not form a substituted or unsubstituted heterocyclic ring; and $R_{401}$ and $R_{402}$ which do not form the substituted or unsubstituted heterocyclic ring are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

(B12)

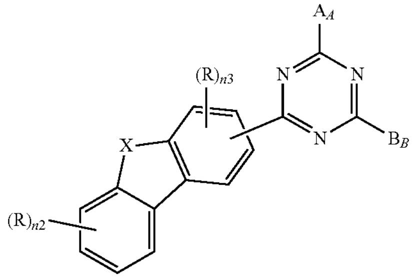

wherein in the formula (B12), $A_A$ is a substituted or unsubstituted aryl group including 6 to 18 ring carbon atoms, or a substituted or unsubstituted monovalent heterocyclic group including 5 to 13 ring atoms;

$B_B$ is a substituted or unsubstituted aryl group including 6 to 18 ring carbon atoms, or a substituted or unsubstituted monovalent heterocyclic group including 5 to 13 ring atoms;

X is $CR_1R_2$, $NR_3$, an oxygen atom, or a sulfur atom;

when X is $CR_1R_2$, $R_1$ and $R_2$ form a substituted or unsubstituted, saturated or unsaturated ring by bonding with each other, or do not form a substituted or unsubstituted, saturated or unsaturated ring;

when a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring;

R, $R_1$, and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, $-Si(R_{901})(R_{902})(R_{903})$, $-O-(R_{904})$, a substituted or unsubstituted aryl group including 6 to 50 ring carbon atoms, or a substituted or unsubstituted monovalent heterocyclic group including 5 to 50 ring atoms;

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when one or more of $R_{901}$ to $R_{904}$ are present in two or more, each of the two or more $R_{901}$ to $R_{904}$ are the same or different;

n2 is an integer of 0 to 4, and n3 is an integer of 0 to 3; and when a plurality of R's are present, the plurality of R's may be the same as or different from each other;

(C12A)

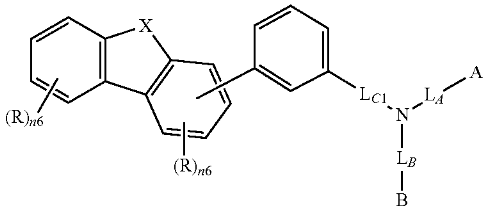

wherein in the formula (C12A), $L_A$ and $L_B$ are independently a single bond, a substituted or unsubstituted arylene group including 6 to 18 ring carbon atoms or substituted or unsubstituted divalent heterocyclic group including 5 to 13 ring atoms;

A and B are independently a substituted or unsubstituted aryl group including 6 to 30 ring carbon atoms, a substituted or unsubstituted monovalent heterocyclic group including 5 to 30 ring atoms, or —$Si(R_{908})(R_{909})(R_{910})$;

$R_{908}$ to $R_{910}$ are independently a substituted or unsubstituted aryl group including 6 to 30 ring carbon atoms;

when one or more of $R_{908}$ to $R_{910}$ are present in two or more, each of the two or more $R_{908}$ to $R_{910}$ are the same or different;

$L_{c1}$ is a substituted or unsubstituted arylene group including 6 to 12 ring carbon atoms;

X is $CR_1R_2$, $NR_3$, an oxygen atom, or a sulfur atom;

when X is $CR_1R_2$, $R_1$ and $R_2$ form a substituted or unsubstituted, saturated or unsaturated ring by bonding with each other, or do not form a substituted or unsubstituted, saturated or unsaturated ring;

when a plurality of R's are present, one or more sets of adjacent two or more among the plurality of R's form a substituted or unsubstituted, saturated or unsaturated ring by bonding with each other, or do not form a substituted or unsubstituted, saturated or unsaturated ring;

R, $R_1$, and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, —$Si(R_{901})(R_{902})(R_{903})$,

—O—$(R_{904})$, a substituted or unsubstituted aryl group including 6 to 50 ring carbon atoms, or a substituted or unsubstituted monovalent heterocyclic group including 5 to 50 ring atoms;

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when one or more of $R_{901}$ to $R_{904}$ are present in two or more, each of the two or more $R_{901}$ to $R_{904}$ are the same or different;

n5 is an integer of 0 to 3, and n6 is an integer of 0 to 4; and when a plurality of R's are present, the plurality of R's may be the same as or different from each other.

2. The organic electroluminescence device according to claim 1, wherein the second compound is a compound represented by the following formula (B12-1):

(B12-1)

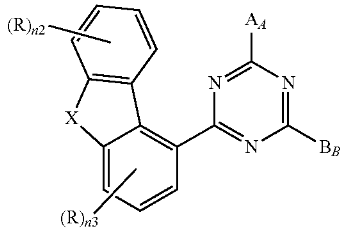

wherein in the formula (B12-1), $A_A$, $B_B$, X, R, $R_1$, $R_2$, $R_3$, n2, and n3 are as defined in the formula (B12).

3. The organic electroluminescence device according to claim 1, wherein in the formula (C12A), $L_A$ and $L_B$ are independently a single bond, an unsubstituted arylene group including 6 to 18 ring carbon atoms, or an unsubstituted divalent heterocyclic group including 5 to 13 ring atoms.

4. The organic electroluminescence device according to claim 1, wherein in the formula (B12), $A_A$ is a substituted or unsubstituted aryl group including 6 to 12 ring carbon atoms.

5. The organic electroluminescence device according to claim 1, wherein in the formula (B12), $A_A$ is a substituted or unsubstituted phenyl group, a substituted or unsubstituted biphenyl group, or a substituted or unsubstituted naphthyl group.

6. The organic electroluminescence device according to claim 1, wherein in the formula (B12), $A_A$ is a phenyl group, a biphenyl group, or a naphthyl group.

7. The organic electroluminescence device according to claim 1, wherein in the formula (B12), $B_B$ is a substituted or unsubstituted aryl group including 6 to 12 ring carbon atoms.

8. The organic electroluminescence device according to claim 1, wherein in the formula (B12), $B_B$ is a substituted or unsubstituted phenyl group, a substituted or unsubstituted biphenyl group, or a substituted or unsubstituted naphthyl group.

9. The organic electroluminescence device according to claim 1, wherein in the formula (B12), $B_B$ is a phenyl group, a biphenyl group, or a naphthyl group.

10. The organic electroluminescence device according to claim 1, wherein all of the "substituted or unsubstituted" groups or rings are "unsubstituted" groups or rings.

11. An electronic apparatus, equipped with the organic electroluminescence device according to claim 1.

* * * * *